US008294142B2

(12) United States Patent
Nishimura et al.

(10) Patent No.: US 8,294,142 B2
(45) Date of Patent: Oct. 23, 2012

(54) ORGANIC EL DEVICE

(75) Inventors: Kazuki Nishimura, Sodegaura (JP); Toshihiro Iwakuma, Sodegaura (JP); Masahiro Kawamura, Sodegaura (JP); Kenichi Fukuoka, Sodegaura (JP); Chishio Hosokawa, Sodegaura (JP); Masakazu Funahashi, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 262 days.

(21) Appl. No.: 12/667,939

(22) PCT Filed: Jul. 4, 2008

(86) PCT No.: PCT/JP2008/062131

§ 371 (c)(1),
(2), (4) Date: Jan. 6, 2010

(87) PCT Pub. No.: WO2009/008344

PCT Pub. Date: Jan. 15, 2009

(65) Prior Publication Data

US 2010/0187517 A1 Jul. 29, 2010

(30) Foreign Application Priority Data

Jul. 7, 2007 (JP) ................................ 2007-179110

(51) Int. Cl.
*H01L 29/08* (2006.01)
*H01J 1/62* (2006.01)

(52) U.S. Cl. .......... 257/40; 257/144; 257/431; 313/504

(58) Field of Classification Search ........................ None
See application file for complete search history.

(56) References Cited

U.S. PATENT DOCUMENTS 6,392,250 B1 * 5/2002 Aziz et al. ...................... 257/40
2002/0182441 A1 12/2002 Lamansky et al.
2003/0134146 A1 * 7/2003 Aziz et al. .................... 428/690
2003/0201415 A1 10/2003 Hoag et al.
2004/0048101 A1 * 3/2004 Thompson et al. .......... 428/690
2004/0155238 A1 * 8/2004 Thompson et al. ............ 257/40
2005/0077817 A1 4/2005 Yamazaki et al.
2006/0043859 A1 3/2006 Fukuoka et al.

(Continued)

FOREIGN PATENT DOCUMENTS

EP 1 533 290 A1 5/2005

(Continued)

OTHER PUBLICATIONS

Extended European Search Report issued Apr. 5, 2011, in Application no. / Patent No. 08790862.0-1226 / 2166588 PCT/JP2008062131.

(Continued)

*Primary Examiner* — Alonzo Chambliss
(74) *Attorney, Agent, or Firm* — Oblon, Spivak, McClelland, Maier & Neustadt, L.L.P.

(57) ABSTRACT

An organic EL device includes: an anode; a cathode and an organic thin-film layer provided between the anode and the cathode. The organic thin-film layer includes: a fluorescent-emitting layer containing a fluorescent host and a fluorescent dopant; and a phosphorescent-emitting layer containing a first phosphorescent host and a first phosphorescent dopant. The first phosphorescent dopant emits light by receiving exited triplet energy transferred from the fluorescent host. The fluorescent host has a substituted or unsubstituted polycyclic fused aromatic skeleton and has an exited triplet energy gap of 2.10 eV to 3.00 eV.

23 Claims, 1 Drawing Sheet

U.S. PATENT DOCUMENTS

| | | | | |
|---|---|---|---|---|
| 2006/0134456 | A1 | 6/2006 | Ikeda et al. | |
| 2006/0134460 | A1 * | 6/2006 | Kondakova et al. .......... | 428/690 |
| 2006/0164006 | A1 | 7/2006 | Yamazaki et al. | |
| 2007/0069638 | A1 | 3/2007 | Matsuura et al. | |
| 2007/0194701 | A1 | 8/2007 | Ito et al. | |
| 2007/0228938 | A1 * | 10/2007 | Hatwar et al. ................ | 313/504 |
| 2009/0009073 | A1 | 1/2009 | Ikeda et al. | |
| 2009/0009074 | A1 | 1/2009 | Ikeda et al. | |
| 2009/0174308 | A1 | 7/2009 | Yamazaki et al. | |

FOREIGN PATENT DOCUMENTS

| | | |
|---|---|---|
| EP | 1 578 172 A1 | 9/2005 |
| EP | 1 727 396 A1 | 11/2006 |
| JP | 9 241629 | 9/1997 |
| JP | 2001 250690 | 9/2001 |
| JP | 2003 257670 | 9/2003 |
| JP | 2003 317946 | 11/2003 |
| JP | 2004 506305 | 2/2004 |
| JP | 2004 221045 | 8/2004 |
| JP | 2005 19413 | 1/2005 |
| JP | 2005 123205 | 5/2005 |
| JP | 2005 235787 | 9/2005 |
| JP | 2006 120689 | 5/2006 |
| JP | 2006 120821 | 5/2006 |
| JP | 2006 172762 | 6/2006 |
| JP | 2006 190759 | 7/2006 |
| JP | 2007 19070 | 1/2007 |
| JP | 2007 27620 | 2/2007 |
| JP | 2007 59310 | 3/2007 |
| JP | 2007 73814 | 3/2007 |
| JP | 2007 509502 | 4/2007 |
| JP | 2007 173827 | 7/2007 |
| WO | 2004 016575 | 2/2004 |
| WO | 2004 018588 | 3/2004 |
| WO | 2004 060026 | 7/2004 |
| WO | 2005 079118 | 8/2005 |
| WO | 2005 117500 | 12/2005 |
| WO | 2006 038020 | 4/2006 |
| WO | 2006 062078 | 6/2006 |
| WO | 2007 029426 | 3/2007 |
| WO | 2007 029806 | 3/2007 |
| WO | 2007 032162 | 3/2007 |

OTHER PUBLICATIONS

Sun, Y. et al., “Management of Singlet and Triplet Excitons for Efficient White Organic Light-Emitting Devices”, Nature, vol. 440, pp. 908-912 (Apr. 13, 2006).

* cited by examiner

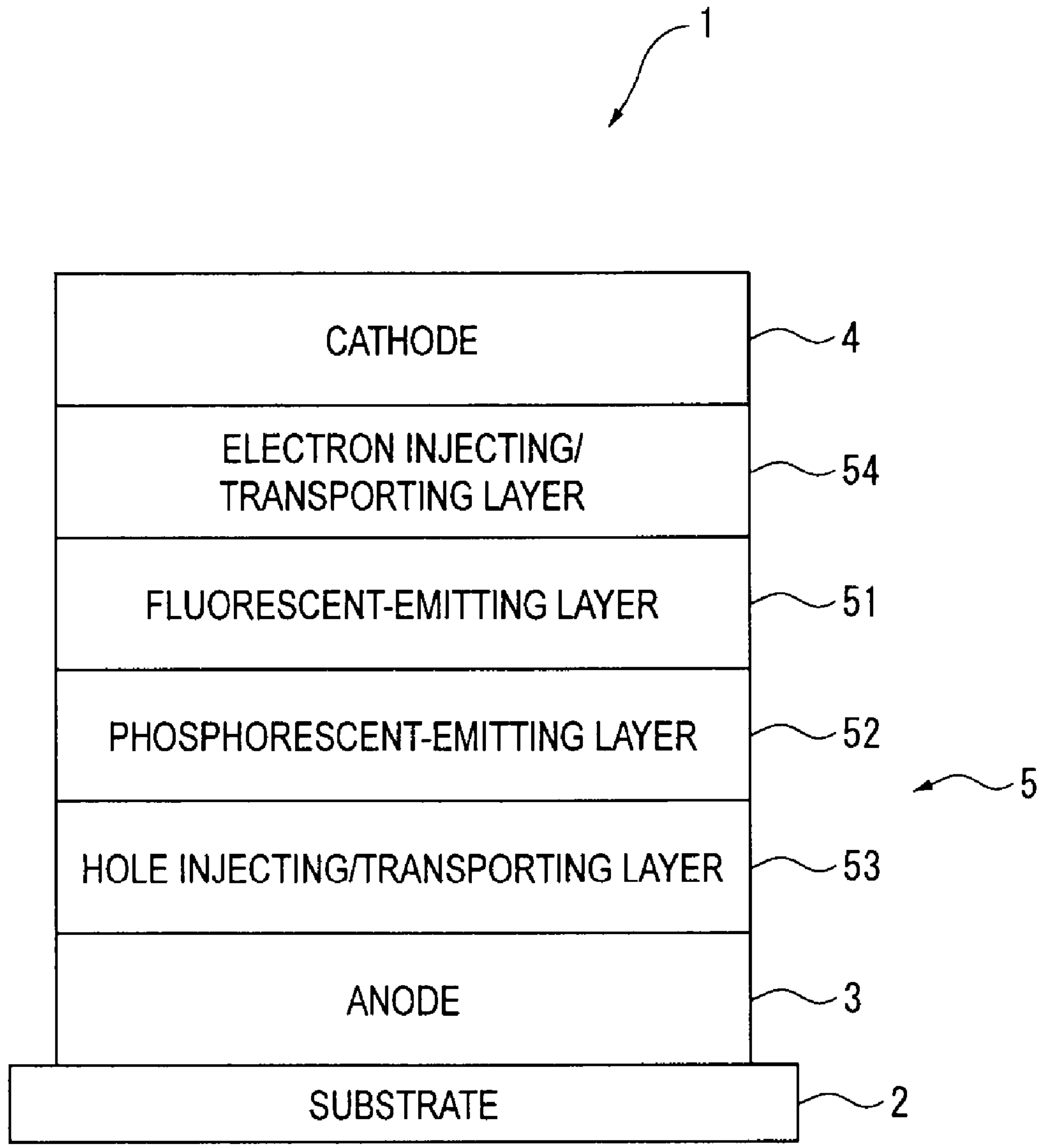
1
CATHODE
4
ELECTRON INJECTING/
TRANSPORTING LAYER
54
FLUORESCENT-EMITTING LAYER
51
PHOSPHORESCENT-EMITTING LAYER
52
5
HOLE INJECTING/TRANSPORTING LAYER
53
ANODE
3
SUBSTRATE
2

ORGANIC EL DEVICE

TECHNICAL FIELD

The present invention relates to an organic EL device. More specifically, the invention relates to an organic EL device including a fluorescent-emitting layer and a phosphorescent-emitting layer.

BACKGROUND ART

To date, organic EL devices including a plurality of emitting layers each of which emits light of a different wavelength are known. Such organic EL devices are also known to provide mixed-color light in which the lights emitted by the emitting layers are mixed together.

An example of such organic EL devices includes a layered red emitting layer, green emitting layer and blue emitting layer, and provides white light in which the light emitted by the emitting layers are mixed together.

Excited states of organic compounds encompass a singlet state and a triplet state.

Emission from the singlet state is called fluorescence while emission from the triplet state is called phosphorescence. Singlet state and triplet state typically occur in a ratio of 1:3.

In typical organic EL devices, fluorescent materials for emitting fluorescence have been mainly used. According to organic EL devices that use such fluorescence emission, only the singlet (i.e., 25% of the excitation generated in emitting layers) contributes to the emission, so that triplet (i.e., the remaining 75%) is deactivated without emitting.

In order to enhance luminous efficiency of organic EL devices, developments are being made on phosphorescent materials for emitting phosphorescence, i.e., emission from triplet (e.g., Patent Document 1).

Reports have been made on, for instance, red-emitting phosphorescent materials and green-emitting phosphorescent material.

It should be noted that no practically-applicable blue-emitting phosphorescent material has been obtained.

With application of the above phosphorescent materials, organic EL devices for mixed-color emission are capable of enhancing luminous efficiency.

For instance, a known organic EL device provides white emission with use of blue-emitting fluorescent materials and red-to-green-emitting phosphorescent materials.

According to such a device, enhancement of quantum efficiency in emission of red to green color contributes to enhancement of luminous efficiency of the entire organic EL device.

In such an organic EL device of mixed-color emission, however, while emission is obtained from triplet in the red to green emitting layers, triplet in the blue emitting layer is deactivated without contributing to emission.

Accordingly, proposals have been made on an organic EL device in which triplet in the blue emitting layer is diffused in the red and green emitting layers so that red and green phosphorescence is obtained therefrom (e.g., Patent Documents 2 and 3 and Non-Patent Document 1).

According to such an organic EL device, the energy of triplet in the blue emitting layer, which has been typically to be deactivated without contributing to emission, can be utilized for obtaining red and green phosphorescence. Thus, luminous efficiency of the entire organic EL device can be enhanced.

The organic EL device disclosed in Non-Patent Document 1 includes a blue fluorescent-emitting layer, blocking layer, red phosphorescent-emitting layer, green phosphorescent-emitting layer, blocking layer and blue fluorescent-emitting layer in this order.

According to the document, blue fluorescence is obtained from the singlet in the blue fluorescent-emitting layers, and the triplet in the blue fluorescent-emitting layers is diffused in the red and green phosphorescent-emitting layers via the blocking layers.

Then, triplet in the red and green phosphorescent-emitting layers is generated, from which red and green phosphorescence is obtained.

According to the report, the blue fluorescence and the red and green phosphorescence are mixed together, thereby providing white emission as a whole.

Patent Document 1: US 2002/182441

Patent Document 2: WO2006/038020

Patent Document 3: WO2004/060026

Non-Patent Document 1: nature vol 440 p. 908

DISCLOSURE OF THE INVENTION

Problems to Be Solved by the Invention

In typical organic EL device as described in Non-Patent Document 1, triplet in the blue fluorescent-emitting layers is diffused in the red and green phosphorescent-emitting layers. Accordingly, a host of the blue fluorescent-emitting layers is required to be made of a material having a large triplet energy gap.

As such a host material, CBP (4,4'-bis(N-carbazolyl)biphenyl) is exemplarily usable.

However, CBP may exhibit short lifetime depending on a layer arrangement of the organic EL device, and thus may not be practically applicable for the device.

A triplet energy gap of CBP is large, and a singlet energy gap thereof is further larger. In the blue fluorescent-emitting layer, singlet energy of the host is transferred to the dopant for emission. When CBP is used as the fluorescent host, energy is not efficiently transferred to the dopant since a difference in singlet energy gap between CBP and the fluorescent material as the dopant is excessively large.

Consequently, luminous efficiency is reduced.

Moreover, in order for the dopant to sufficiently emit, extra load (e.g., increasing voltage) is required to be applied on the device, resulting in shortening emission lifetime.

On the other hand, an anthracene derivative is well known as a host material of the fluorescent-emitting layer.

However, the anthracene derivative exhibits too small a triplet energy gap for the energy to be transferred to the phosphorescent-emitting layer although exhibiting a singlet energy gap of a suitable size.

For use in a device including a combination of a fluorescent-emitting layer and a phosphorescent-emitting layer, no such material has been obtained that exhibits both of a suitable energy gap as the host material of the fluorescent-emitting layer and practical lifetime. Therefore, there has been a demand for realization of practical luminous efficiency and practical emission lifetime in a device including a combination of a fluorescent-emitting layer and a phosphorescent-emitting layer.

An object of the invention is to provide an organic EL device including the fluorescent-emitting layer and the phosphorescent-emitting layer and exhibiting high luminous efficiency and long lifetime.

Means for Solving the Problems

An organic EL device includes: an anode; a cathode; and an organic thin-film layer provided between the anode and the cathode, in which the organic thin-film layer includes: a fluorescent-emitting layer containing a fluorescent host and a fluorescent dopant; and a first phosphorescent-emitting layer containing a first phosphorescent host and a first phosphorescent dopant, a triplet energy gap $Eg_H$ of the fluorescent host being larger than a triplet energy gap $Eg_{pD}$ of the first phosphorescent dopant, the fluorescent host being a compound having a substituted or unsubstituted polycyclic fused aromatic skeleton, the fluorescent host having a triplet of 2.10 eV to 3.00 eV.

An emission wavelength of the fluorescent dopant is preferably in a range of 410 nm to 560 nm. An emission wavelength of the first phosphorescent dopant is preferably in a range of 500 nm to 700 nm.

In the organic EL device with this arrangement, voltage is applied between the anode and the cathode to inject charges to the organic thin-film layer.

Consequently, injected charges (the electrons and the holes) are recombined in the fluorescent host of the fluorescent-emitting layer to generate exciton.

At this time, singlet exciton and triplet exciton are generated.

In the fluorescent-emitting layer, singlet energy is transferred to the fluorescent dopant, from which fluorescent emission is obtained.

On the other hand, triplet energy generated by recombination of the charges in the fluorescent host of the fluorescent-emitting layer is transferred to the first phosphorescent dopant, from which phosphorescent emission is obtained.

As a result, a mixed color of the fluorescent dopant and the first phosphorescent dopant is obtained as a whole.

According to the aspect of the invention, among excitons generated in the fluorescent host of the fluorescent-emitting layer, singlet exciton is used for emission of the fluorescent dopant, and, in addition, triplet exciton of the fluorescent host is transferred to the first phosphorescent dopant to be used for emission.

Accordingly, the aspect of the invention can provide such an innovatively efficient device since all the generated excited energy are consumable in theory.

Further, the mixed-color emission is obtained from the fluorescent dopant and the first phosphorescent dopant. Thus, a device capable of providing mixed-color emission (e.g., white emission) at considerably high efficiency can be realized.

Moreover, in the aspect of the invention, use of a polycyclic fused aromatic series as the host material can enhance molecular stability against charges and heat, and prolong the lifetime of the device.

Typically, when only fluorescent emission is used, only 25% of the generated excited energy could be used for light.

Although use of the phosphorescent material enables a 100% utilization of excited energy, there has been no practical phosphorescent material capable of providing an emission color having a short wavelength.

For use as the host material for the first phosphorescent dopant, CBP is representatively known as a material having a large triplet energy gap. However, lifetime of CBP may be short depending on the device structure.

In this respect, the aspect of the invention can enhance efficiency by use of not only the singlet exciton but the triplet exciton of the excited energy generated in the host of the fluorescent-emitting layer, as compared to a device that uses the fluorescent dopant only.

Further, use of a highly molecularly stable compound having a polycyclic fused aromatic skeleton as the host material of the fluorescent-emitting layer can prolong device lifetime.

Accordingly, the aspect of the invention can realize an organic EL device having long lifetime and capable of providing mixed-color emission at high efficiency.

Herein, all the injected energy can be used for emission by generating exciton only in the fluorescent-emitting layer.

Accordingly, in order to trap the injected charges and enhance the probability of the recombination of the charges, a hole blocking layer and an electron blocking layer are preferably provided adjacent to the fluorescent-emitting layer.

Since triplet energy can be diffused for a long distance, such a charge blocking layer may be provided between the first phosphorescent-emitting layer and the fluorescent-emitting layer.

As a matter of course, the first phosphorescent-emitting layer may be provided adjacent to the fluorescent-emitting layer without interposition of such a blocking layer.

When the first phosphorescent-emitting layer is located closer to the anode than the fluorescent-emitting layer, the first phosphorescent host preferably exhibits large hole mobility. With this arrangement, the injection of holes into the fluorescent-emitting layer (i.e., exciton generating layer) through the first phosphorescent-emitting layer can be facilitated, and a probability of the charge recombination can be increased. At this time, the hole mobility of the first phosphorescent host is preferably $1\times10^{-5}$ $cm^2/Vs$ or more in an electric field intensity of $1.0\times10^4$ to $1.0\times10^6$V/cm. Particularly, the hole mobility is more preferably $1\times10^{-4}$ $cm^2/Vs$ or more, much more preferably $1\times10^{-3}$ $cm^2/Vs$.

When the first phosphorescent-emitting layer is located closer to the cathode than the fluorescent-emitting layer, the first phosphorescent host preferably exhibits large electron mobility. With this arrangement, the injection of electrons into the fluorescent-emitting layer (i.e., exciton generating layer) through the first phosphorescent-emitting layer can be facilitated, and a probability of the charge recombination can be increased. At this time, the electron mobility of the first phosphorescent host is preferably $1\times10^{-5}$ $cm^2/Vs$ or more in an electric field intensity of $1.0\times10^4$ to $1.0\times10^6$V/cm. Particularly, the electron mobility is more preferably $1\times10^{-4}$ $cm^2/Vs$ or more, much more preferably $1\times10^{-3}$ $cm^2/Vs$.

In the aspect of the invention, since a fluorescent host having a large energy gap is used, Ip (ionization potential) of the fluorescent host is increased, and injection of the holes into the fluorescent host may become more difficult than in a typical device. Therefore, when a hole transporting layer is provided adjacent to the fluorescent-emitting layer, it is preferable that Ip of the hole transporting layer is increased and a difference in Ip between the fluorescent host and the hole transporting layer is decreased. With this arrangement, driving voltage can be reduced.

When injection of the holes into the fluorescent host is difficult, carriers are apt to accumulate in an anode-side region of the fluorescent-emitting layer, so that the anode-side region may serve as the recombination region. Accordingly, by arranging the fluorescent-emitting layer at a position closer to the anode and arranging the first phosphorescent-emitting layer at a position closer to the cathode, the generation of exciton can be dedicated to the fluorescent host. With this arrangement, the device can exhibit high efficiency in energy utilization, and can well balance the emission from the fluorescent-emitting layer with the emission from the first phosphorescent-emitting layer.

A thickness of the fluorescent-emitting layer is preferably smaller than a thickness of the first phosphorescent-emitting layer.

The fluorescent-emitting layer is preferably thin so that the exited triplet energy generated in the host of the fluorescent-emitting layer is transferred to the first phosphorescent layer. On the other hand, the first phosphorescent layer is preferably somewhat thick so that the triplet energy diffused from the fluorescent-emitting layer can be received therein.

In order to prevent the first phosphorescent-emitting layer from trapping the charges and also to prevent decrease in a volume of the charges injected into the fluorescent-emitting layer, the first phosphorescent dopant is preferably contained at a content of 10% or less of the first phosphorescent host by mass ratio, more preferably 5% or less.

In the aspect of the invention, the first and second phosphorescent hosts are preferably a compound having a polycyclic fused aromatic skeleton, the fluorescent hosts having a triplet energy gap of 2.10 eV to 3.00 eV.

When such a compound is used as the first and the second phosphorescent hosts, lifetime of the device as a whole can be further prolonged.

In addition, the compound as the fluorescent host has a larger triplet energy gap than the first and second phosphorescent dopants. Thus, the transfer of the energy from the fluorescent host to the first and second phosphorescent dopants is not hindered. Accordingly, the triplet energy of the fluorescent host can be efficiently used for the emission of the first and second phosphorescent dopants.

At this time, the fluorescent host and the first phosphorescent host may be the same material. Such use of the same material can simplify a manufacturing process.

When the fluorescent host and the first phosphorescent host are different from each other, the fluorescent host preferably has a larger triplet energy gap than the other.

Energy can be efficiently transferred from the fluorescent host to the first phosphorescent host and the first phosphorescent dopant of the first phosphorescent-emitting layer, and the luminous efficiency is resultantly enhanced.

The triplet energy gap Eg(T) of the material may be exemplarily defined based on the phosphorescence spectrum. For instance, in the aspect of the invention, the triplet energy gap Eg(T) may be defined as follows.

Specifically, each material is dissolved in an EPA solvent (diethylether: isopentane:ethanol=5:5:2 in volume ratio) at a concentration of 10 μmol/L, thereby forming a sample for phosphorescence measurement.

Then, the sample for phosphorescence measurement is put into a quartz cell, cooled to 77K and irradiated with exciting light, so that a wavelength of phosphorescence radiated therefrom is measured.

A tangent line is drawn to be tangent to a rising section adjacent to short-wavelength of the obtained phosphorescence spectrum, a wavelength value at an intersection of the tangent line and a base line is converted into energy value, and the converted energy value is defined as the triplet energy gap Eg(T).

For the measurement, a commercially-available measuring machine F-4500 (manufactured by Hitachi) is usable.

However, the triplet energy gap does not need to be defined by the above method, but may be defined by any other suitable method as long as such a method is compatible with the invention.

It is sufficient that the compound having a substituted or unsubstituted polycyclic fused aromatic skeleton has the triplet energy gap of 2.10 eV to 3.00 eV, preferably 2.1 eV to 2.7 eV.

The organic thin-film layer may include an intermediate layer between the fluorescent-emitting layer and the first phosphorescent-emitting layer.

The triplet energy gap $Eg_M$ of the intermediate layer, the triplet energy gap $Eg_{FH}$ of the fluorescent host and the triplet energy gap $Eg_{pD}$ of the first phosphorescent dopant preferably satisfy a relationship of $Eg_{pD}<Eg_{gM}\leqq Eg_{FH}$.

Under this condition, the triplet energy of the fluorescent host is transferred to the first phosphorescent dopant via the intermediate layer. However, the triplet energy of the first phosphorescent dopant cannot be transferred to the intermediate layer or to the fluorescent host. Accordingly, the triplet energy, which has been generated in the fluorescent host and transferred to the first phosphorescent dopant, can be prevented from being transferred back to the fluorescent host and deactivated.

The organic thin-film layer may include a plurality of fluorescent-emitting layers or a plurality of phosphorescent-emitting layers. The fluorescent-emitting layer may include a plurality of fluorescent dopants. The first phosphorescent-emitting layer may include a plurality of phosphorescent dopants.

Preferably in the aspect of the invention, the polycyclic fused aromatic skeleton is present in a chemical structure formula as a divalent or multivalent group.

Examples of the substituent for the polycyclic fused aromatic skeleton are halogen atom, hydroxyl group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group, and carboxyl group. When the polycyclic fused aromatic skeleton includes a plurality of substituents, two or more of the substituents may form a ring.

Examples of the halogen atom are fluorine, chlorine, bromine and iodine.

The substituted or unsubstituted amino group is represented by $—NX^1X^2$. $X^1$ and $X^2$ each independently and exemplarily represent hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenyl)-1 group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenailthrolin-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Examples of the substituted or unsubstituted alkyl group are methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diamino isopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or unsubstituted alkenyl group are vinyl group, allyl group, 1-butenyl group, 2-butenyl group, 3-butenyl group, 1,3-butanedienyl group, 1-methylvinyl group, styryl group, 4-diphenylaminostyryl group, 4-di-p-tolylaminostyryl group, 4-di-m-tolylaminostyryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group, and 3-phenyl-1-butenyl group.

Examples of the substituted or unsubstituted cycloalkyl group are cyclopropyl group, cyclobutyl group, cyclopentyl group, cyclohexyl group, and 4-methylcyclohexyl group.

The substituted or unsubstituted alkoxy group is represented by —OY. Examples of Y are methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or unsubstituted aromatic hydrocarbon group are phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, and 4"-t-butyl-p-terphenyl-4-yl group.

Examples of the substituted or unsubstituted aromatic heterocyclic group are 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthirolin-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Examples of the substituted or unsubstituted aralkyl group include a benzyl group, a 1-phenylethyl group, a 2-phenylethyl group, a 1-phenylisopropyl group, a 2-phenylisopropyl group, a phenyl-t-butyl group, a α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-βnaphthylethyl group, a 1-β-naphthylisopropyl group, a 2-β-naphthylisopropyl group, a 1-pyrrolylmethyl group, a 2-(1-pyrrolyl)ethyl group, a p-methylbenzyl group, an m-methylbenzyl group, an o-methylbenzyl group, a p-chlorobenzyl group, an m-chlorobenzyl group, an o-chlorobenzyl group, a p-bromobenzyl group, an m-bromobenzyl group, an o-bromobenzyl group, a p-iodobenzyl group, an m-iodobenzyl group, an o-iodobenzyl group, a p-hydroxybenzyl group, an m-hydroxybenzyl group, an o-hydroxybenzyl group, a p-aminobenzyl group, an m-aminobenzyl group, an o-aminobenzyl group, a p-nitrobenzyl group, an m-nitrobenzyl group, an o-nitrobenzyl group, a p-cyanobenzyl group, an m-cyanobenzyl group, an o-cyanobenzyl group, a 1-hydroxy-2-phenylisopropyl group, and a 1-chloro-2-phenylisopropyl group.

The substituted or unsubstituted aryloxy group is represented by —OZ. Examples of Z and Q include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-prenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-group, an m-terphenyl- 3-yl group, an m-terphenyl-2-group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group 4"-t-butyl-p-terphenyl-4-yl group, a 2-pyrrolyl group, a 3-pyrrolyl group, a pyrazinyl group, a 2-pyrizinyl group, a 3-pyrizinyl group, a 4-pyrizinyl group, a 2-indolyl group, a 3-indolyl group, a 4-indolyl group, a 5-indolyl group, a 6-indolyl group, a 7-indolyl group, a 1-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 2-quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a -1-phenoxazinyl group, a 2-phenoxazinyl group, a 3-phenoxazinyl group, a 4-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl 1-indolyl group, a 2-t-butyl-3-indolyl group, and a 4-t-butyl-3-indolyl group.

The substituted or unsubstituted alkoxycarbonyl group is represented by —COOY. Examples of Y are methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Preferably in the aspect of the invention, the polycyclic fused aromatic skeleton has a substituent, and the substituent is a substituted or unsubstituted aryl group or a heteroaryl group.

By introducing an aryl group or a heteroaryl group as the substituent, the energy gap can be adjusted and molecular associate can be prevented. Thus, the lifetime can be prolonged.

Preferably in the aspect of the invention, the polycyclic fused aromatic skeleton is selected from the group consisting of substituted or unsubstituted naphthalene-diyl, phenanthrene-diyl, chrysene-diyl, fluoranthene-diyl and triphenylene-diyl.

Also preferably in the aspect of the invention, the polycyclic fused aromatic skeleton is substituted by a group containing naphthalene, phenanthrene, chrysene, fluoranthene or triphenylene.

Preferably in the aspect of the invention, the polycyclic fused aromatic skeleton is represented by any one of formulae (1) to (4) as follows.

[Chemical Formula 1]

(1)

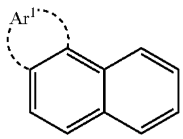

(2)

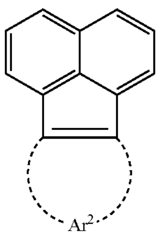

(3)

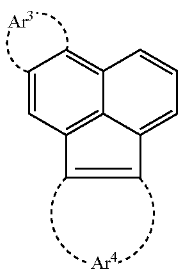

(4)

$Ar^5$—Np—$Ar^6$

In the formulae (1) to (3), $Ar^1$ to $Ar^4$ each represent a substituted or unsubstituted fused ring structure having 4 to 10 ring-forming carbon atoms.

In the formula (4), Np represents substituted or unsubstituted naphthalene, and $Ar^5$ and $Ar^6$ each independently represent a substituent formed solely of a substituted or unsubstituted aryl group having 5 to 14 carbon atoms or a substituent formed of a combination of a plurality thereof. However, $Ar^5$ or $Ar^6$ is not anthracene.

Examples of the compound represented by the formula (1) are substituted or unsubstituted phenanthrene and chrysene.

Examples of the compound represented by the formula (2) are substituted or unsubstituted acenaphthylene, acenaphthene and fluoranthene.

An example of the compound represented by the formula (3) is substituted or unsubstituted benzofluoranthene.

In the aspect of the invention, the polycyclic fused aromatic skeleton is preferably the elementary substance of phenanthrene represented by the following formula (10) or its derivative.

[Chemical Formula 2]

(10)

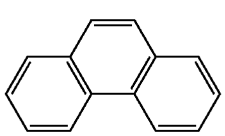

Examples of the substituent for the phenanthrene derivative are an alkyl group, cycloalkyl group, aralkyl group, alkenyl group, cycloalkenyl group, alkynyl group, hydroxyl group, mercapto group, alkoxy group, alkylthio group, arylether group, arylthioether group, aryl group, heterocyclic group, halogen, haloalkane, haloalkene, haloalkyne, cyano group, aldehyde group, carbonyl group, carboxyl group, ester group, amino group, nitro group, silyl group and siloxanyl group.

Examples of the phenanthrene derivative are those represented by the following formulae.

[Chemical Formula 3]

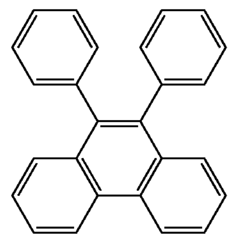

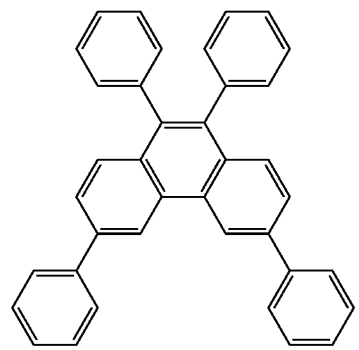

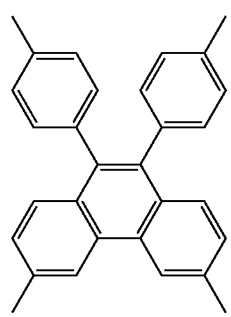

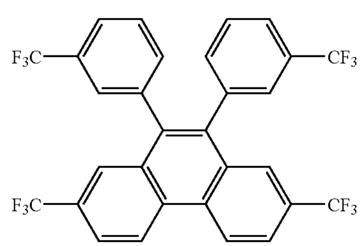

-continued
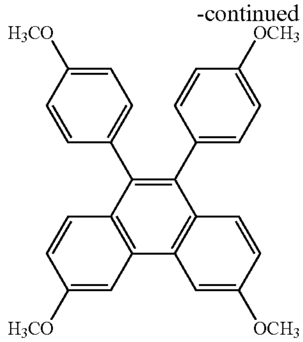
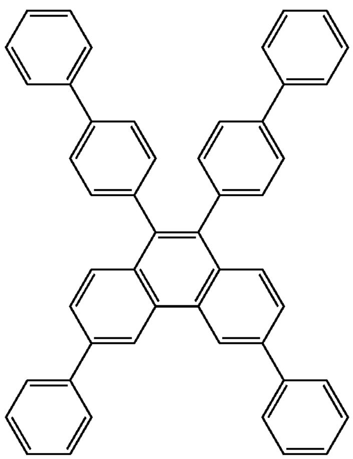
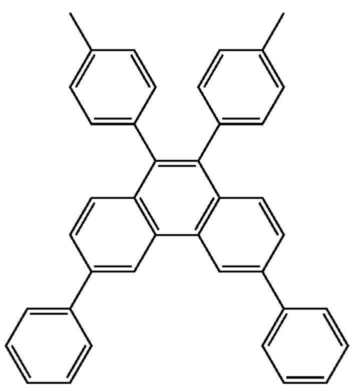
[Chemical Formula 4]
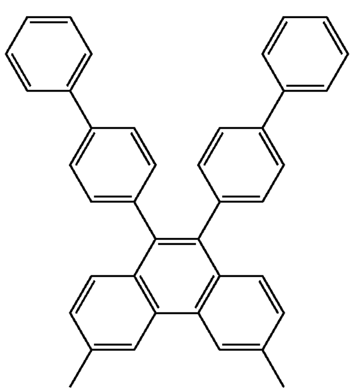
-continued
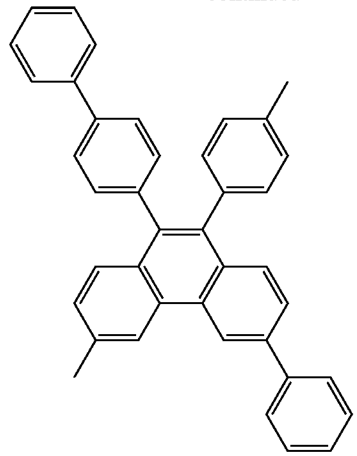
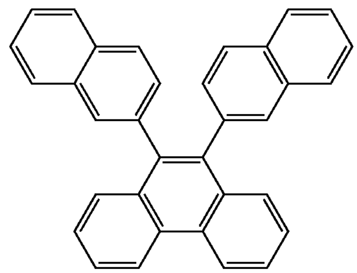
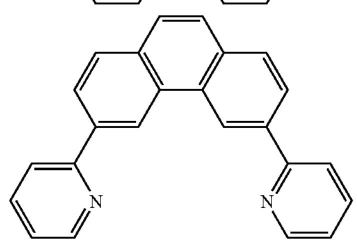
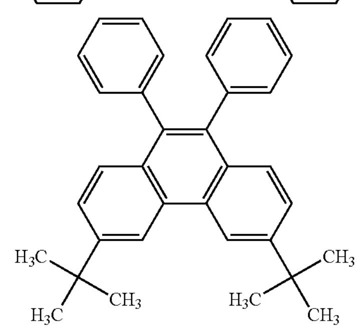
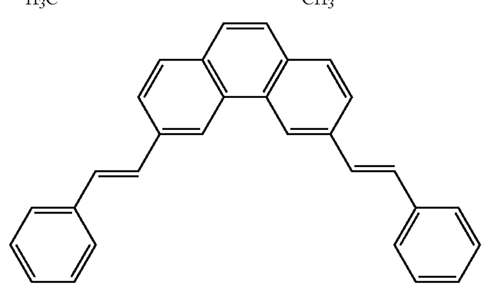
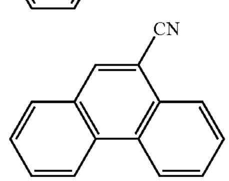

-continued
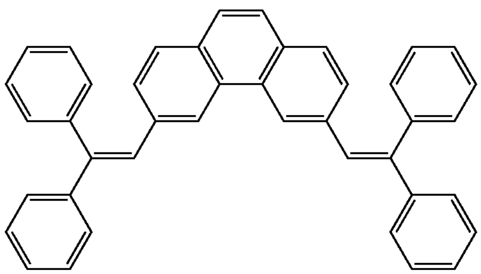
[Chemical Formula 5]
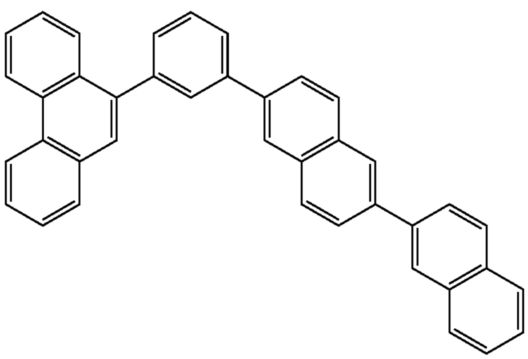
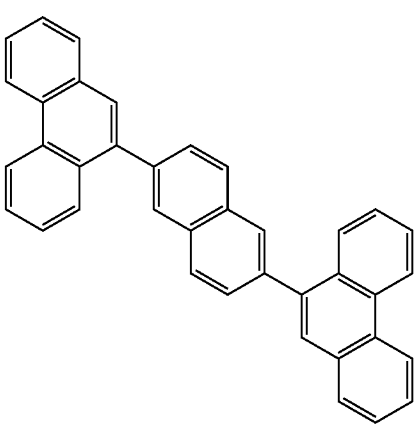
-continued
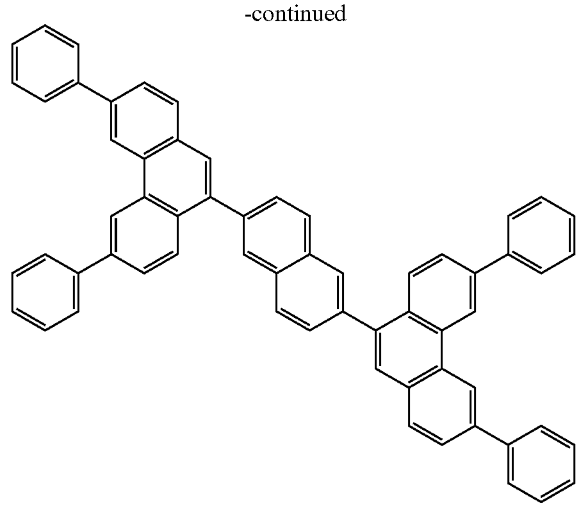
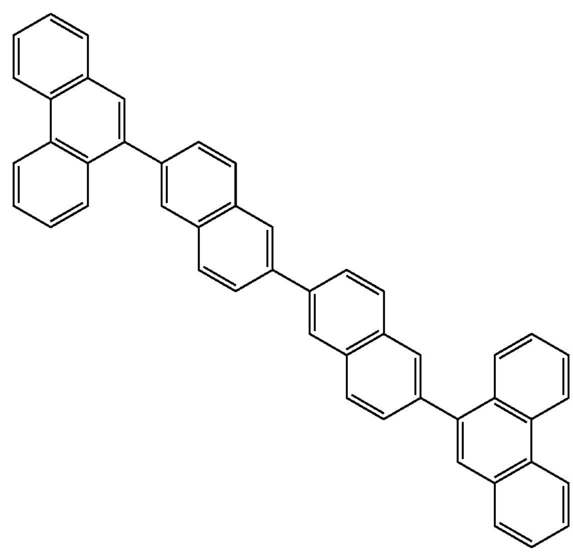
In the aspect of the invention, the polycyclic fused aromatic skeleton is preferably the elementary substance of chrysene represented by the following formula (11) or its derivative.
[Chemical Formula 6]
(11)
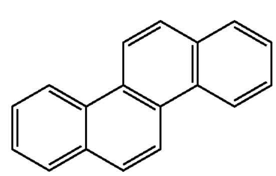

Examples of the chrysene derivative are those represented by the following formulae.
[Chemical Formula 7]
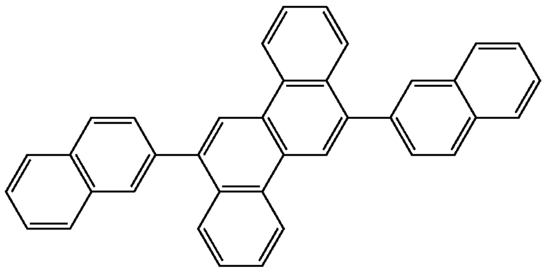
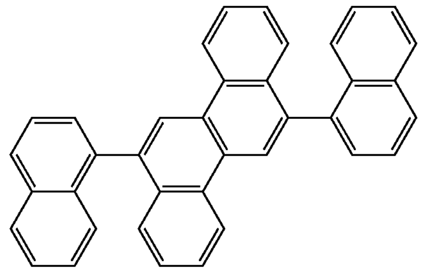
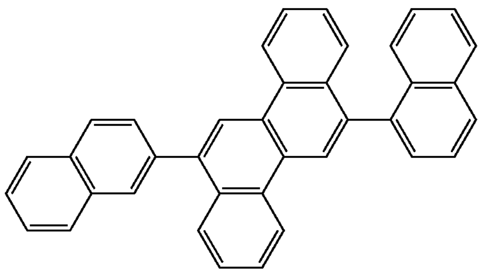
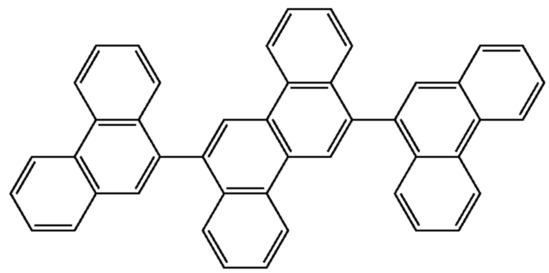
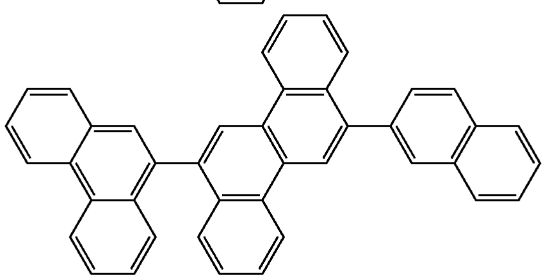
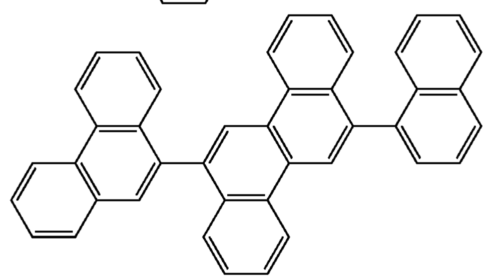
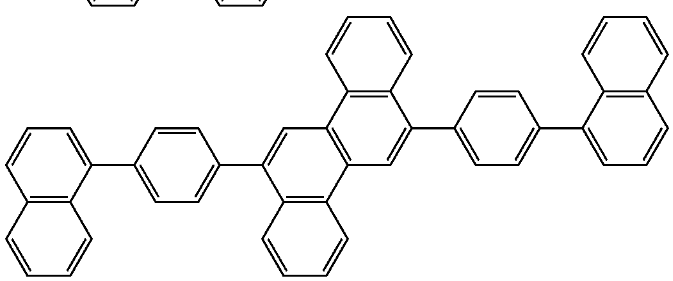
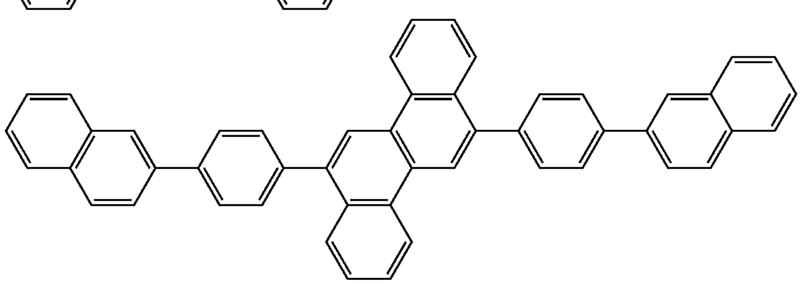
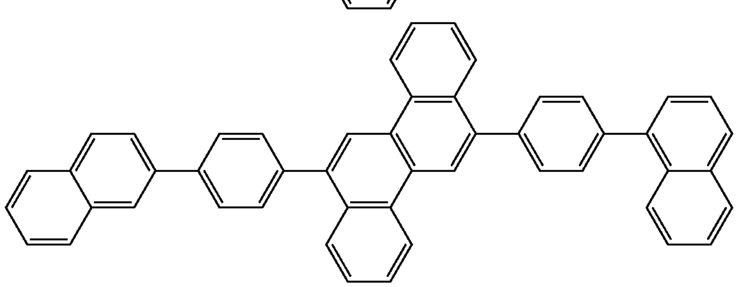

-continued
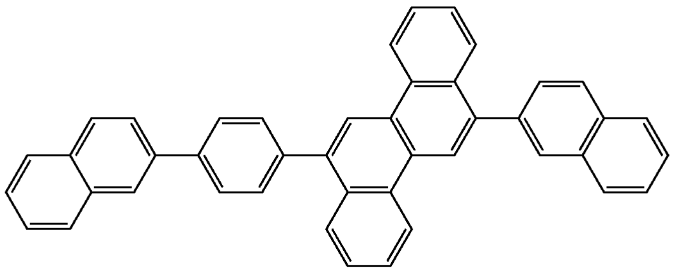
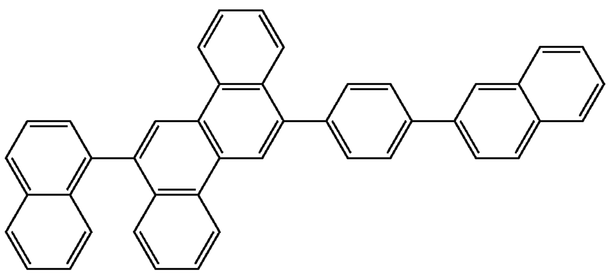
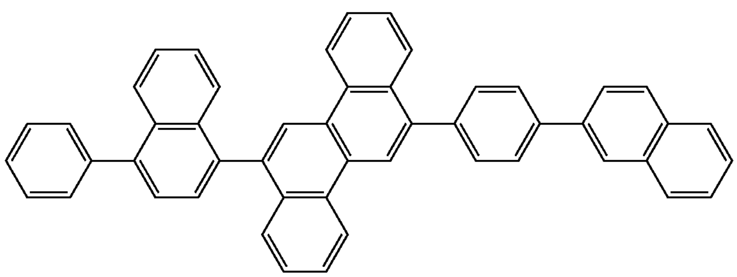
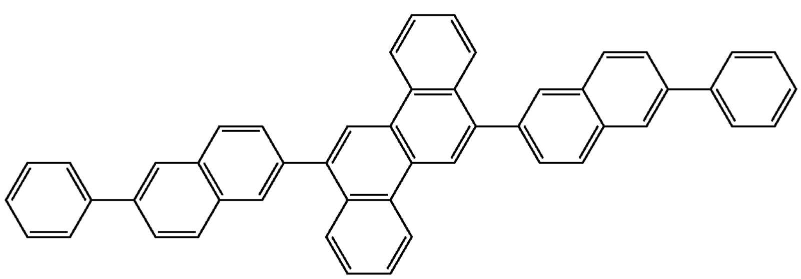
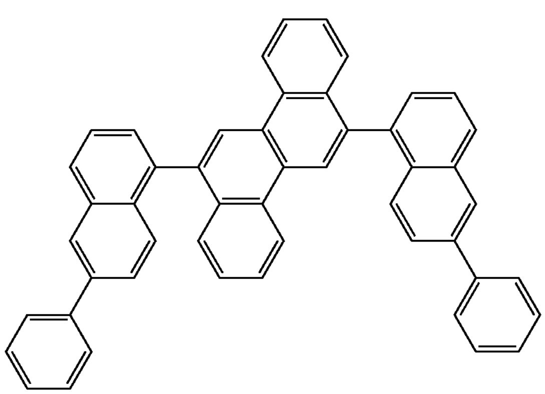

-continued
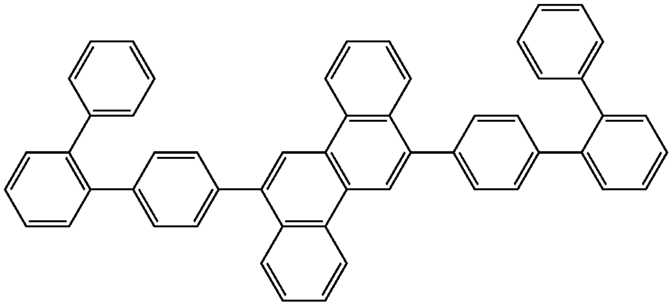
[Chemical Formula 8]
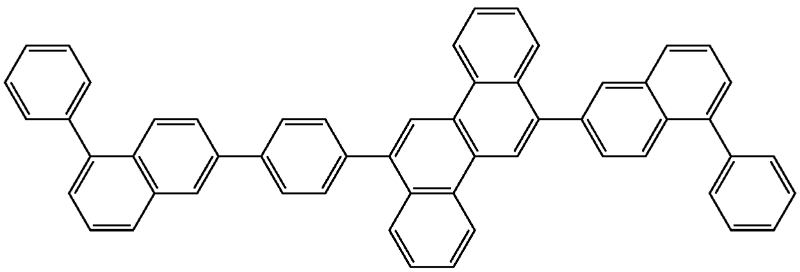
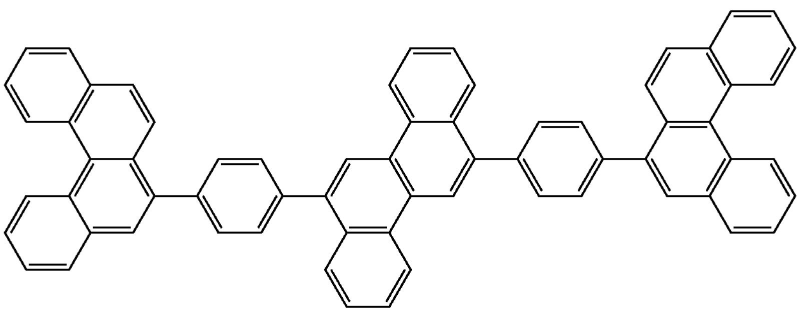
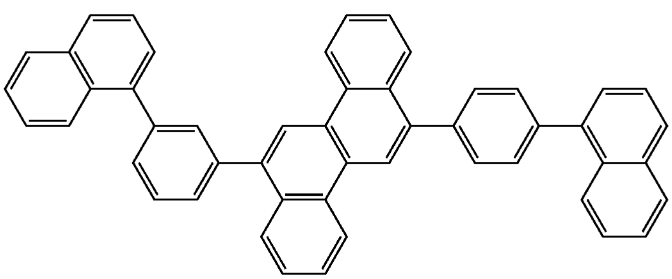
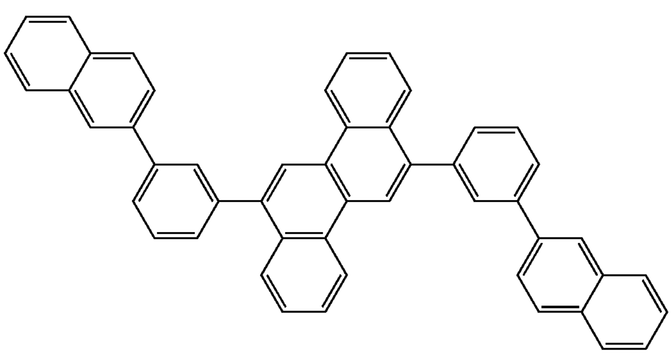

-continued
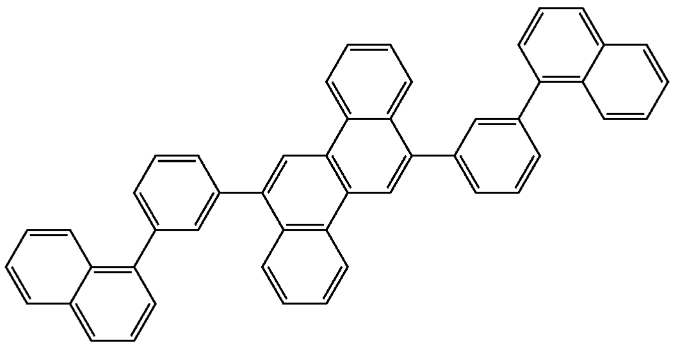
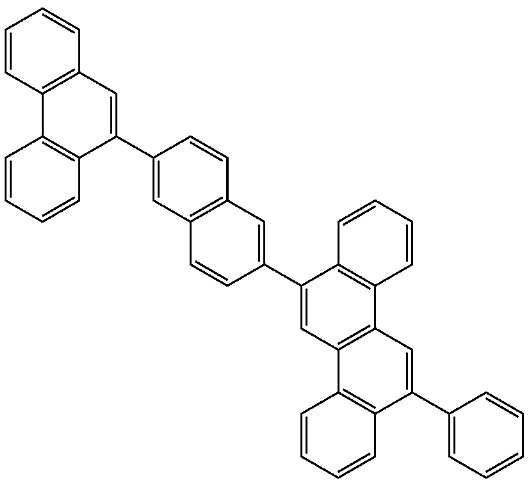
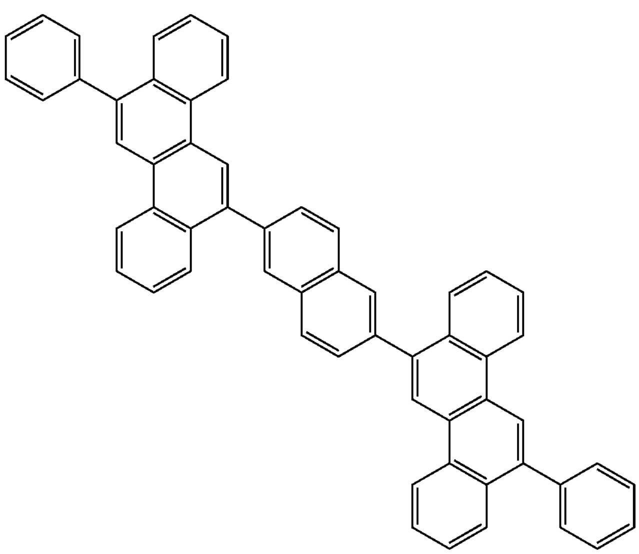
[Chemical Formula 9]
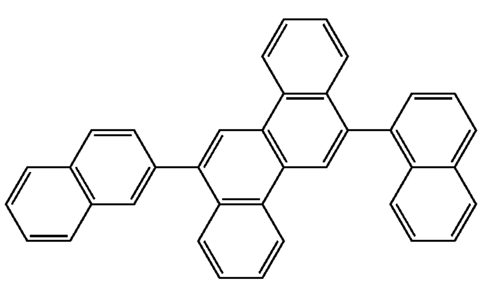
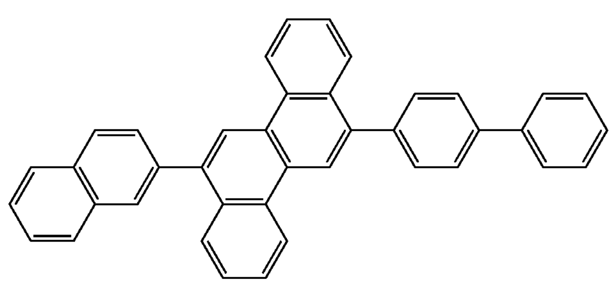

-continued
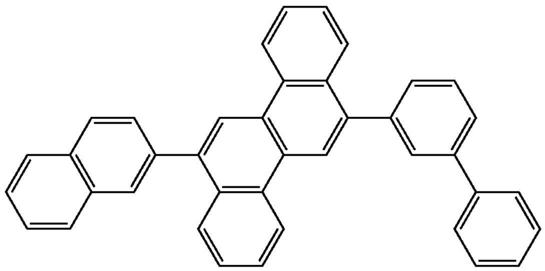
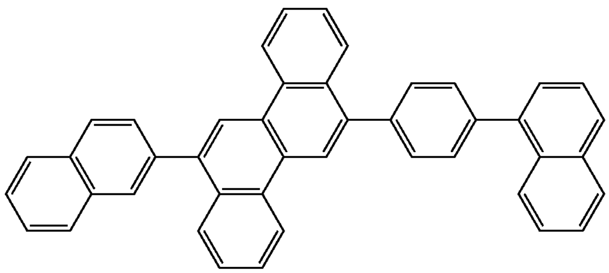
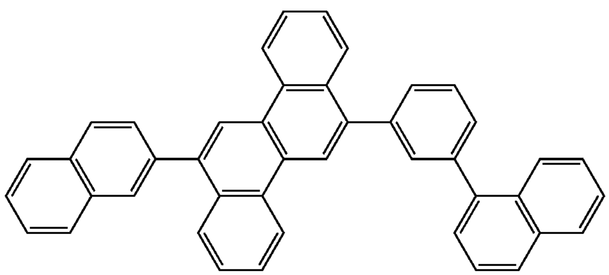
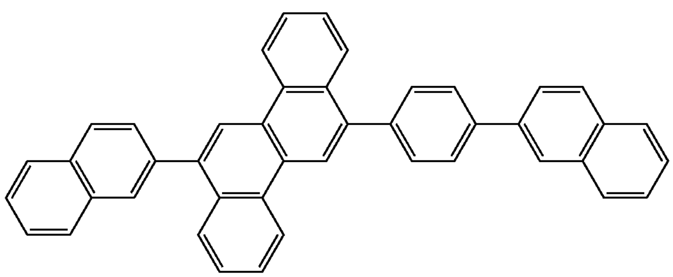
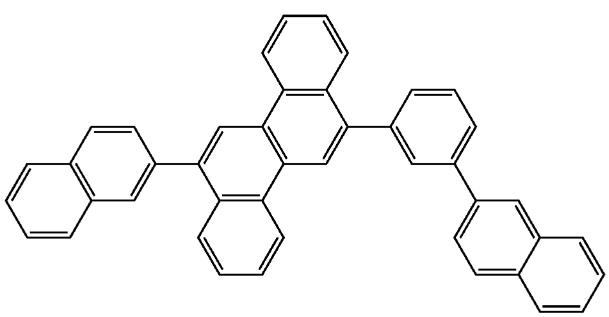
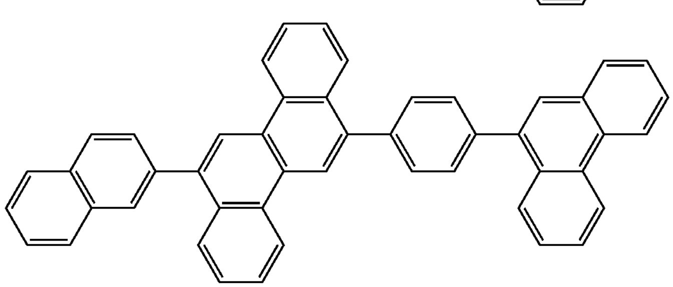
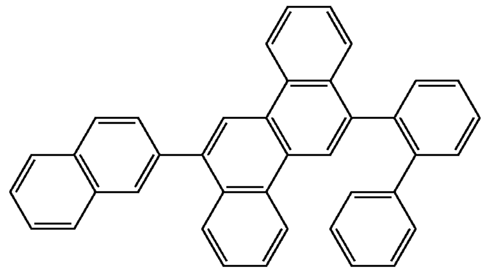

-continued
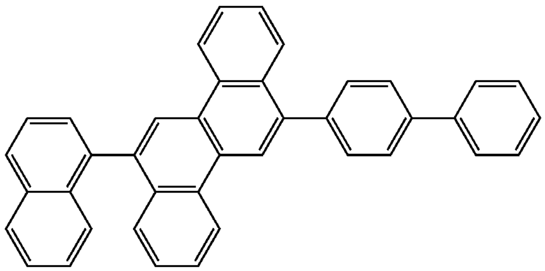
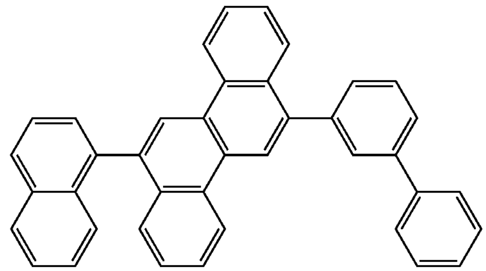
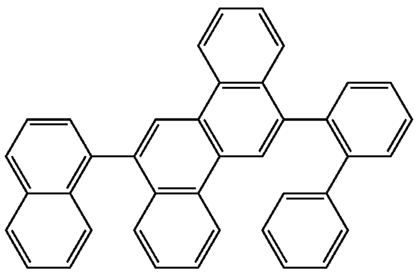
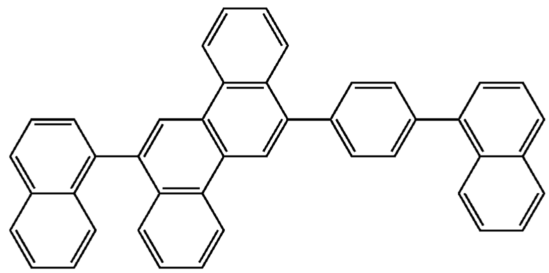
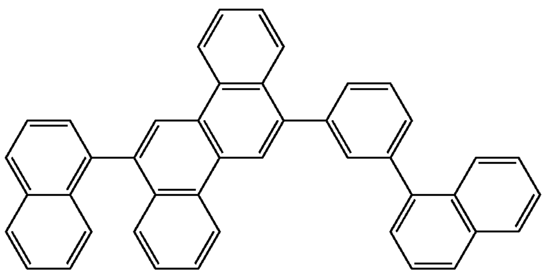
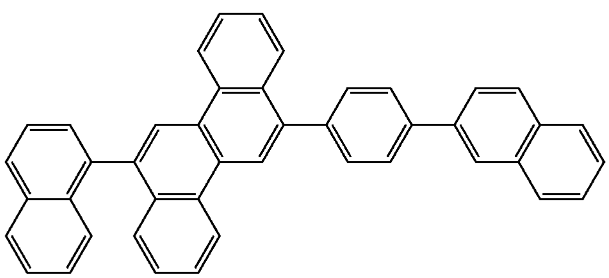
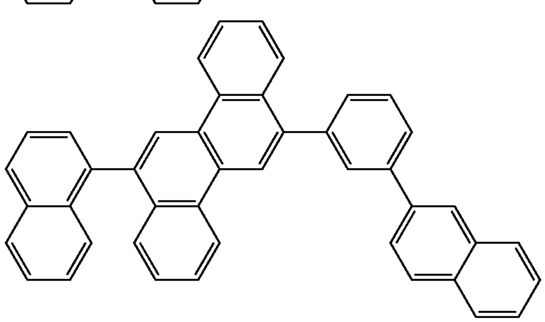
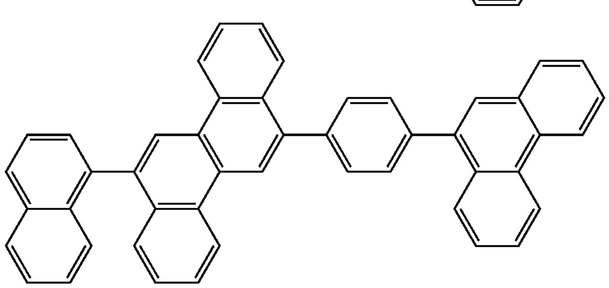

-continued
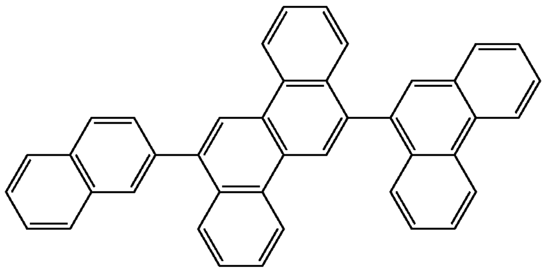
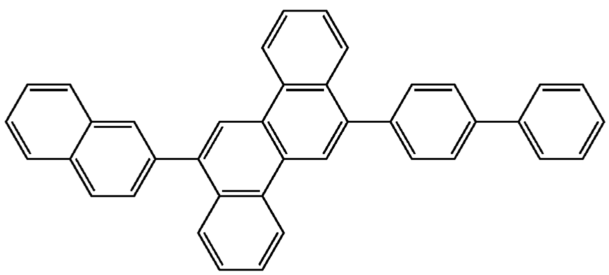
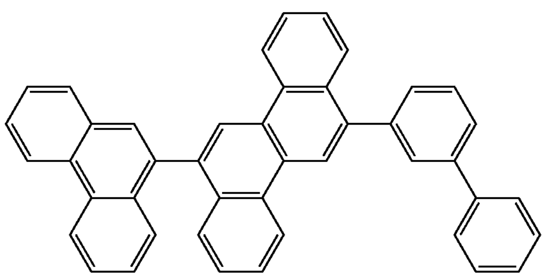
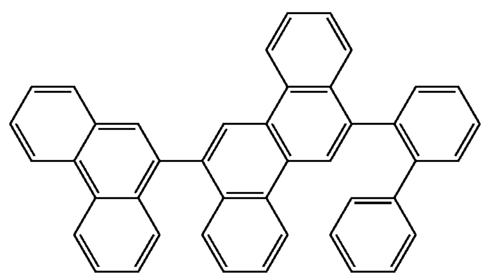
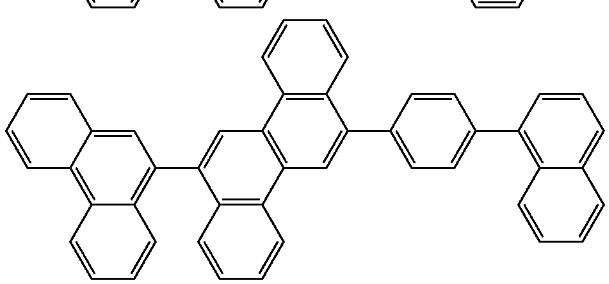
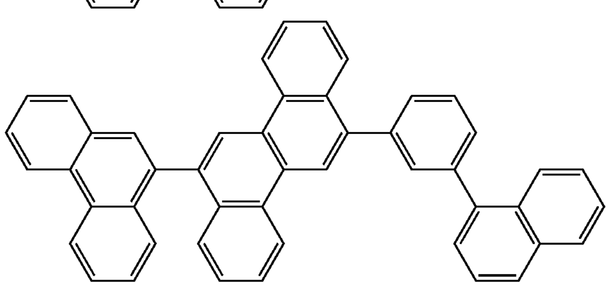
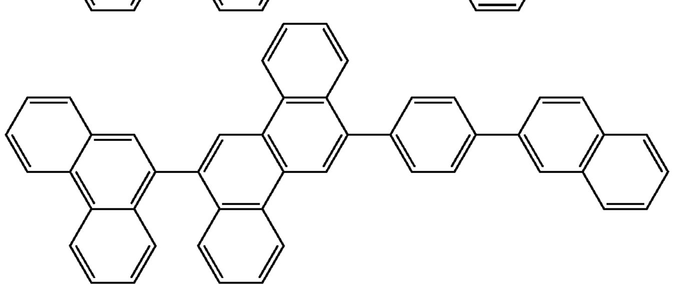

-continued
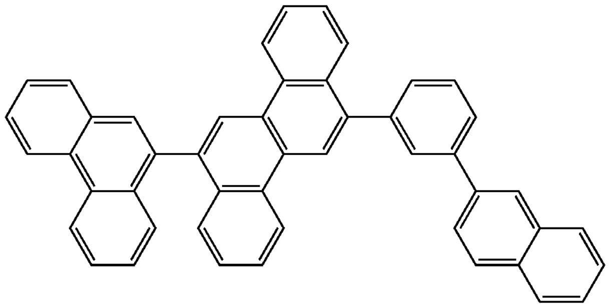
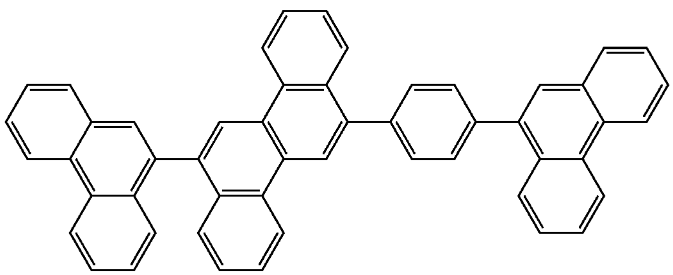
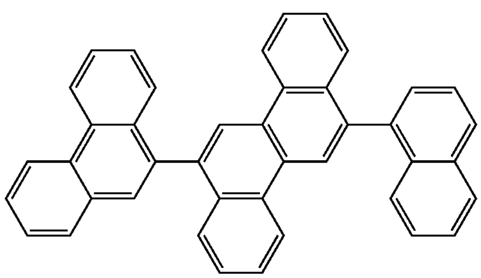
[Chemical Formula 10]
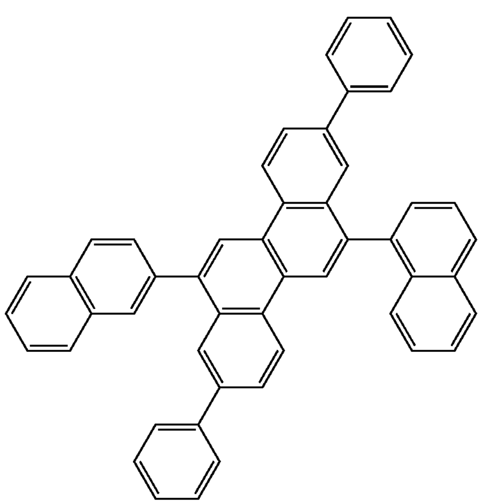
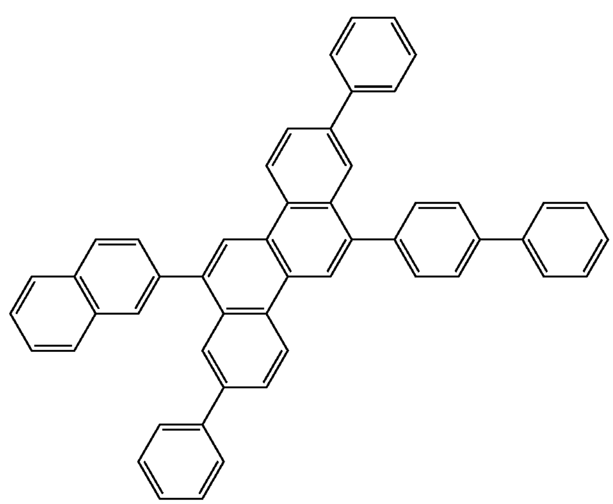

-continued
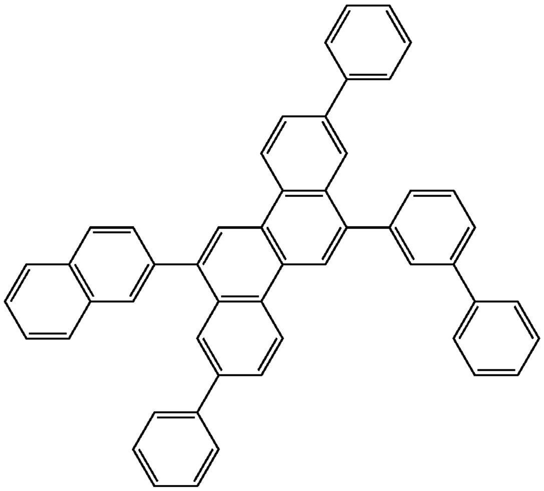
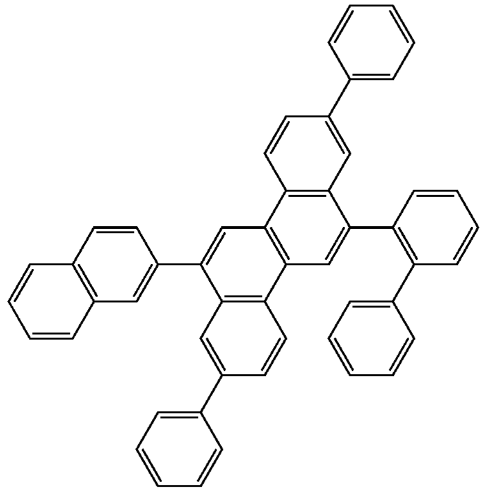
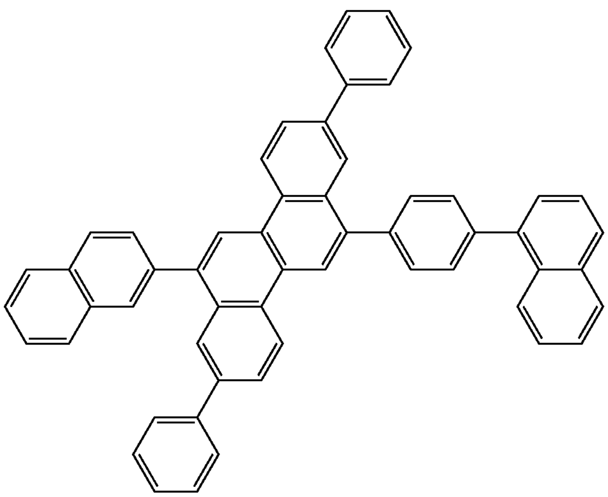
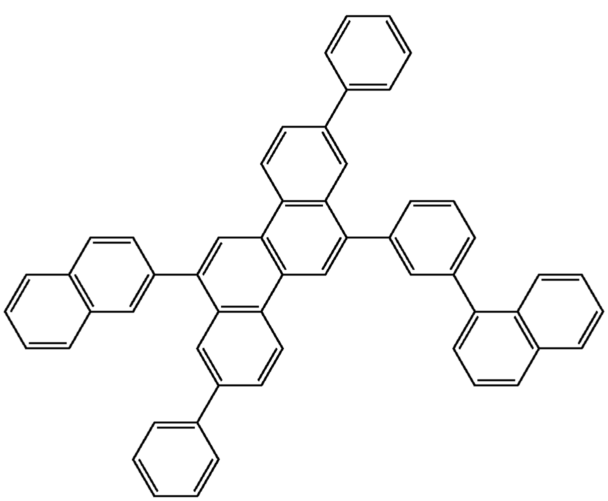

-continued
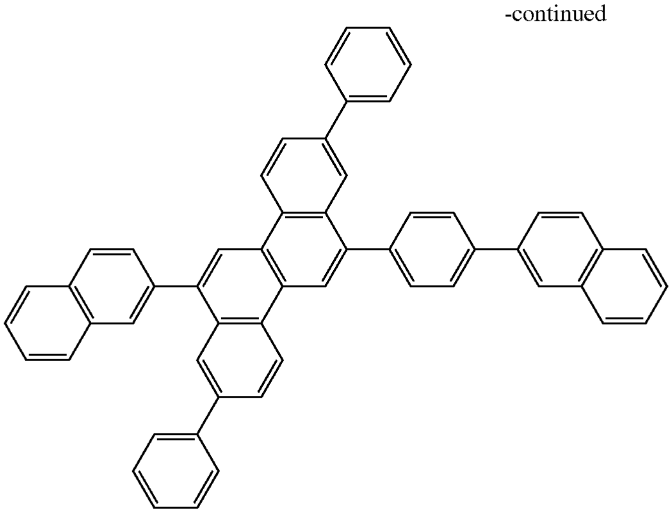
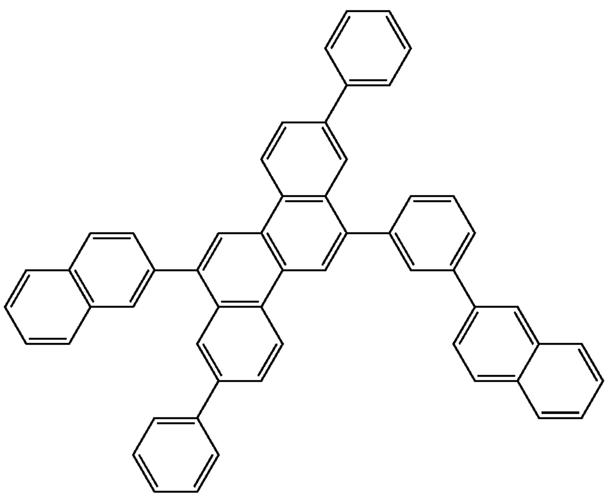
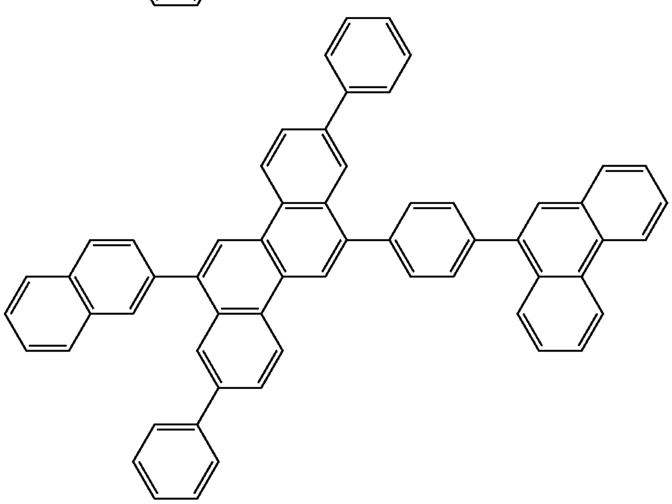
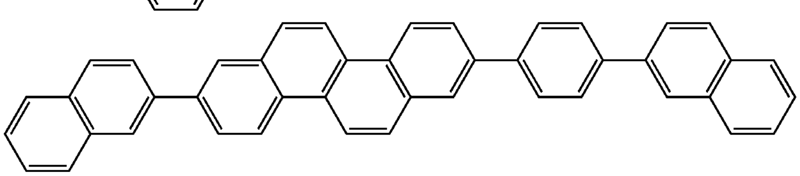

-continued
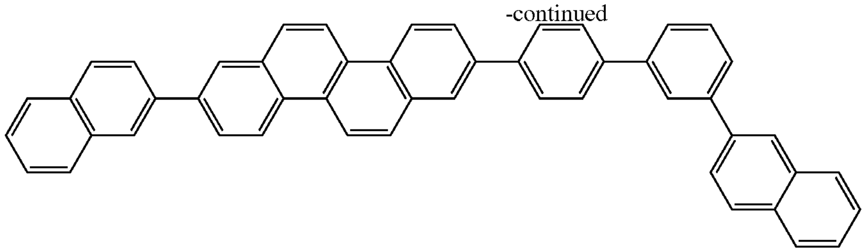
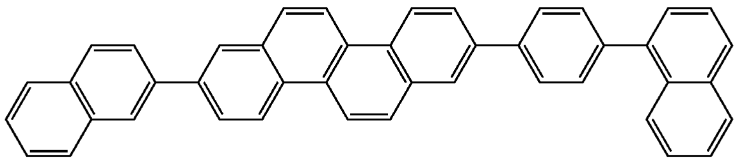
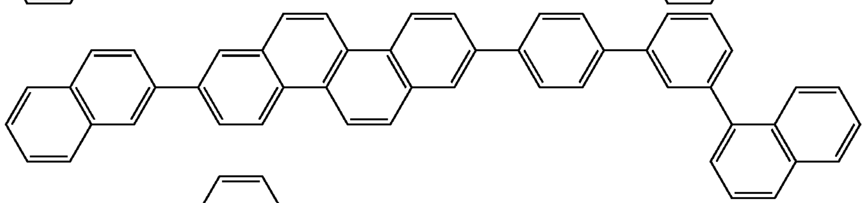
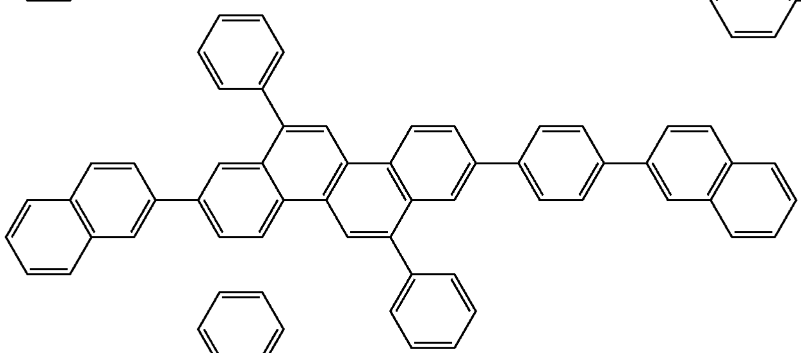
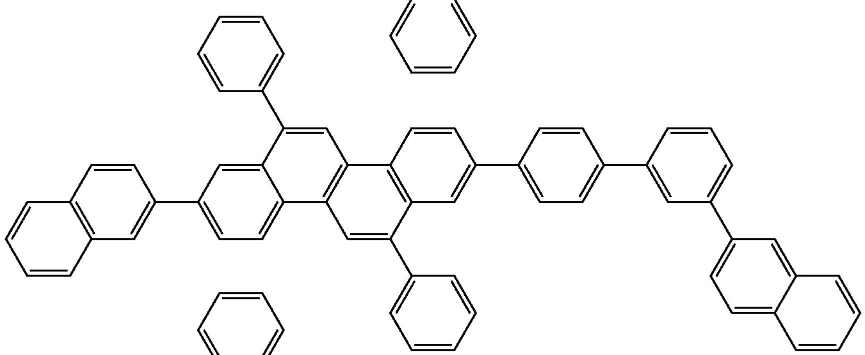
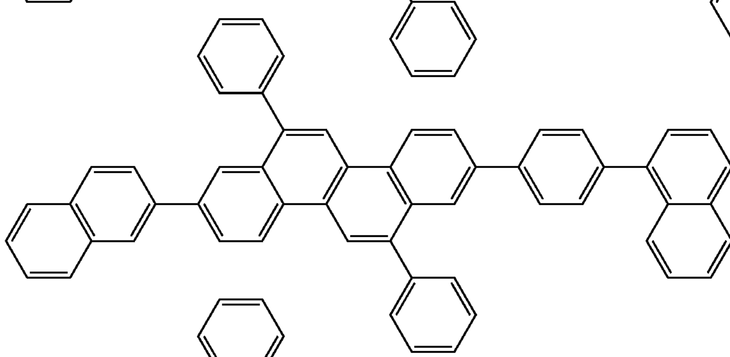
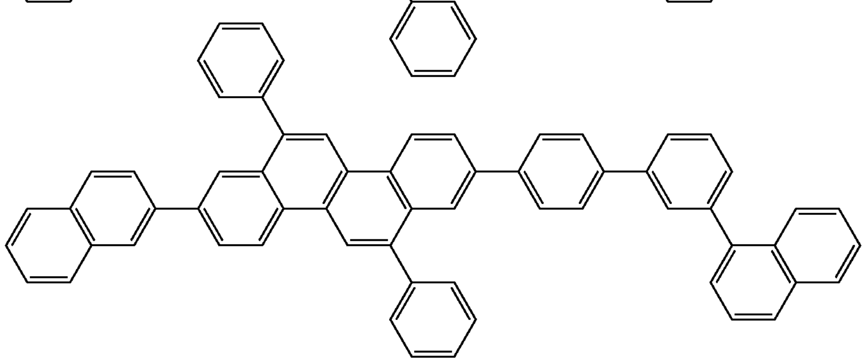

In the aspect of the invention, the polycyclic fused aromatic skeleton is preferably the elementary substance of a compound represented by the following formula (12) (benzo[c] phenanthrene) or its derivative.
[Chemical Formual 11]
(12)
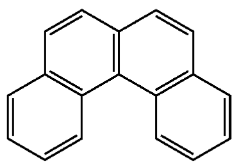
Examples of the derivative of such a compound are as follows.
[Chemical Formula 12]
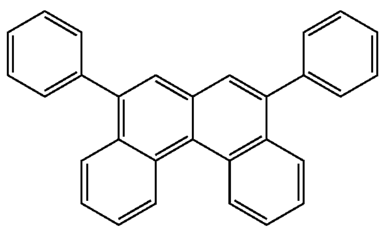
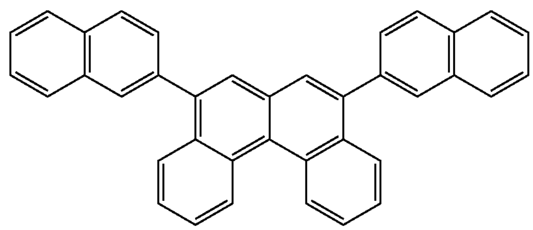
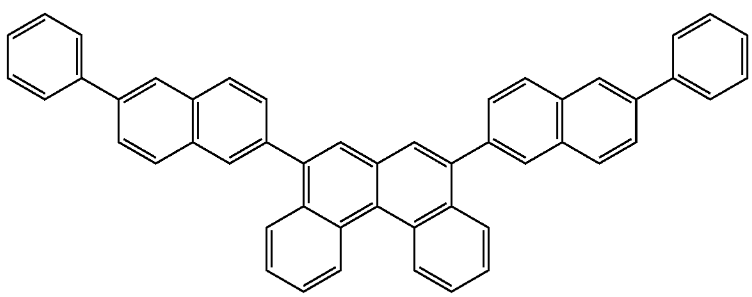
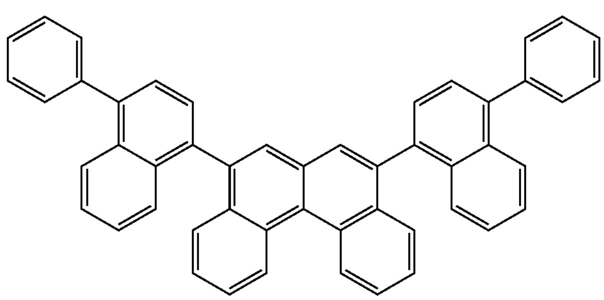
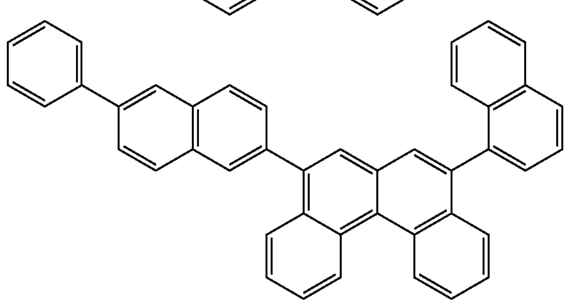
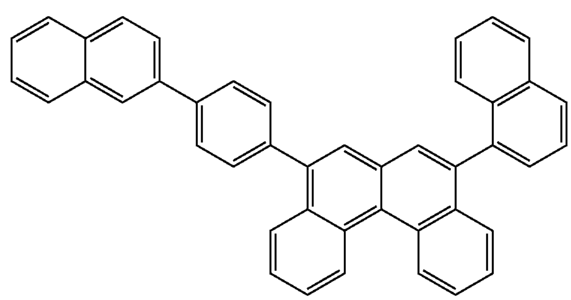

-continued
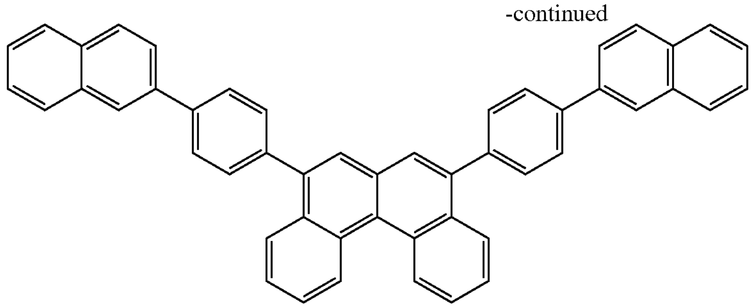
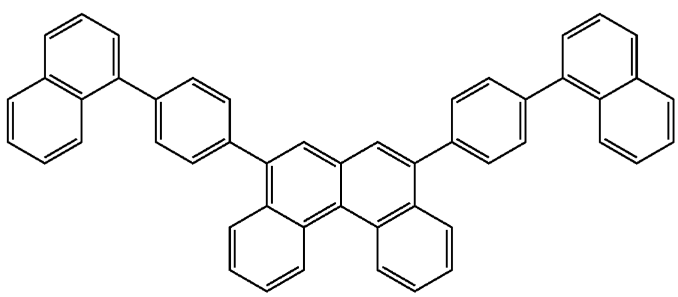
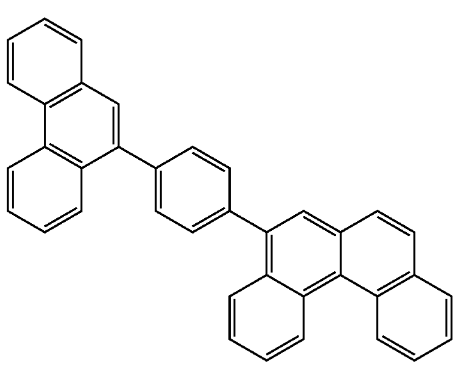
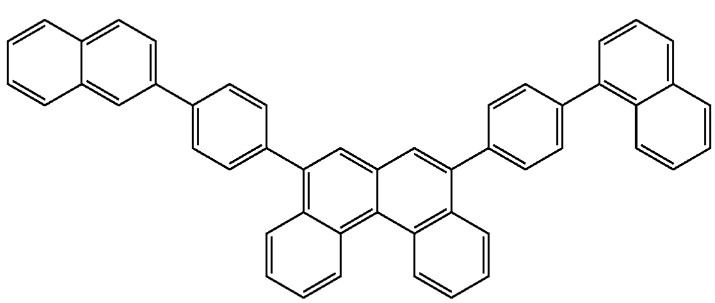

In the aspect of the invention, the polycyclic fused aromatic skeleton is preferably the elementary substance of a compound represented by the following formula (13) (benzo[c] chrysene) or its derivative.
[Chemical Formual 13]
(13)
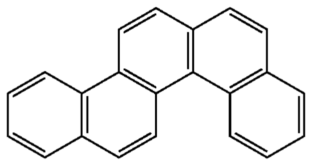
Examples of the derivative of such a compound are as follows.
[Chemical Formula 14]
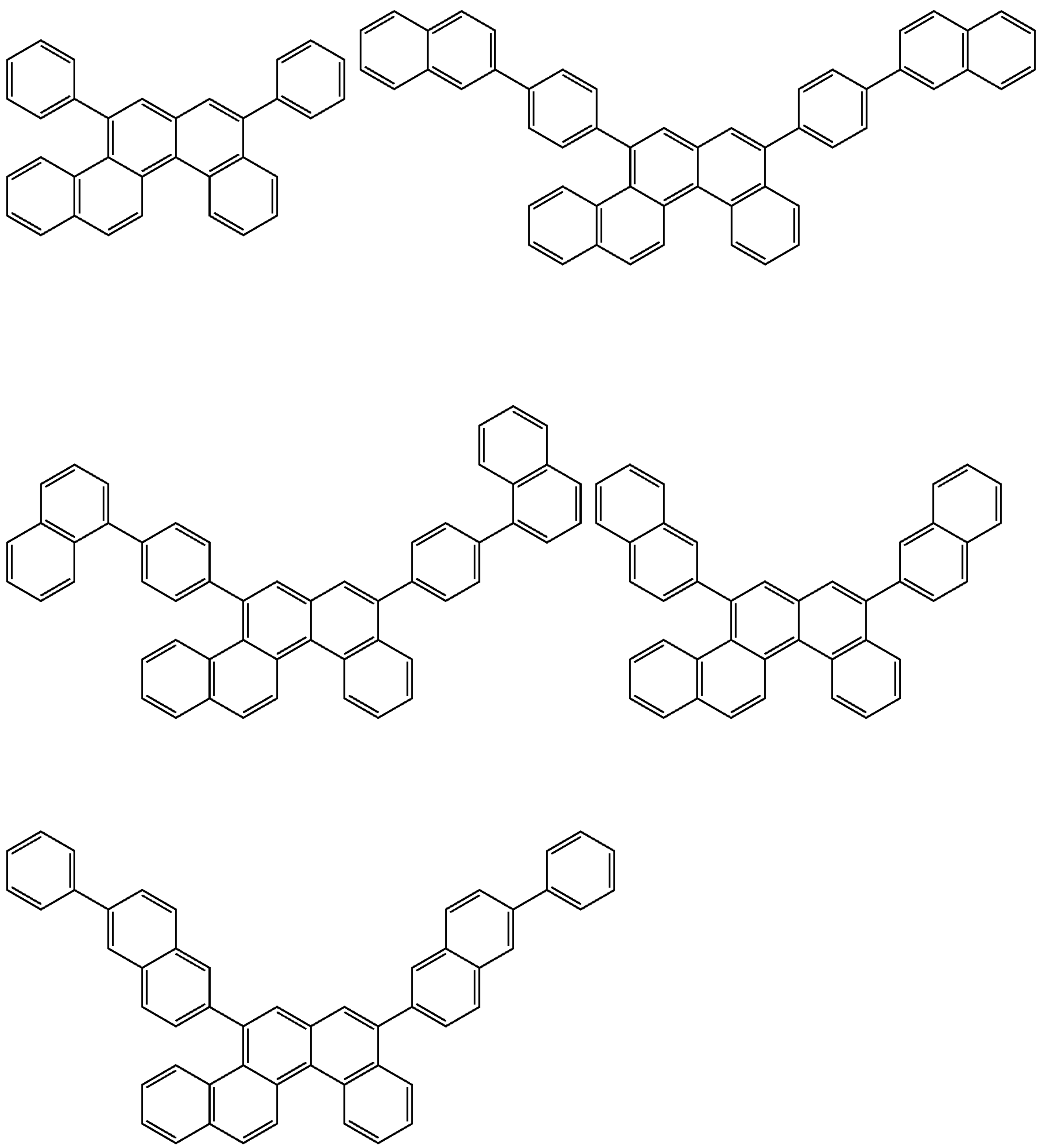

In the aspect of the invention, the polycyclic fused aromatic skeleton is preferably the elementary substance of a compound represented by the following formula (14) (benzo[c,g] phenanthrene) or its derivative.

[Chemical Formula 15]

(14)

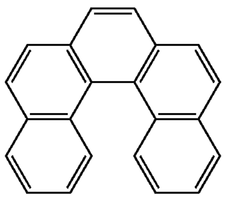

Examples of the derivative of such a compound are as follows.

[Chemical Formula 16]

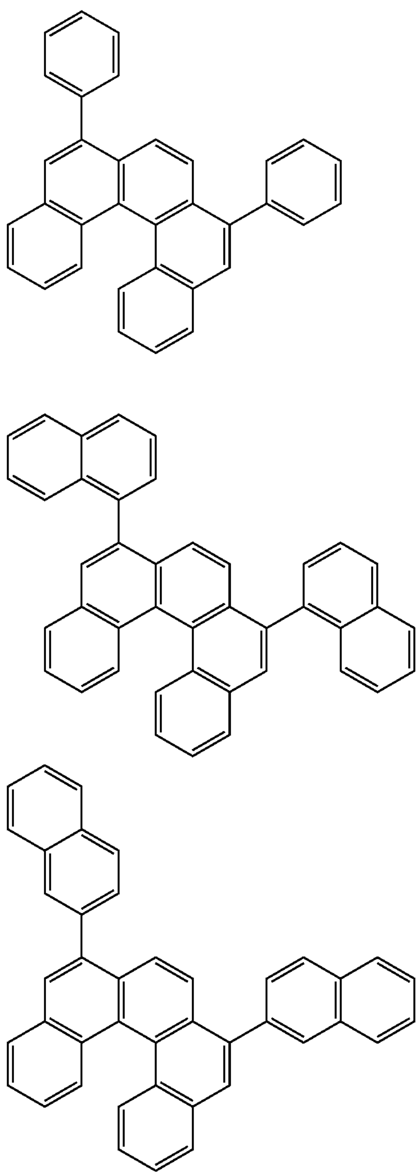

In the aspect of the invention, the polycyclic fused aromatic skeleton is preferably the elementary substance of fluoranthene represented by the following formula (15) or its derivative.

[Chemical Formula 17]

(15)

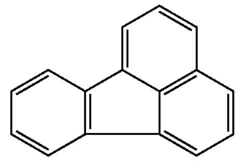

Examples of the fluoranthene derivative are those represented by the following formulae.

[Chemical Formula 18]

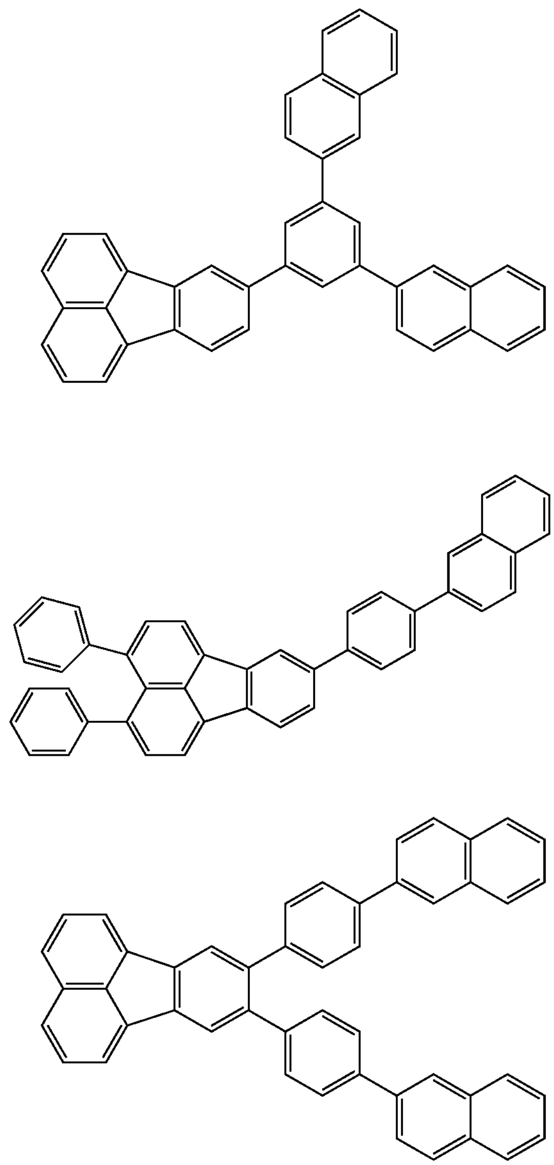

-continued
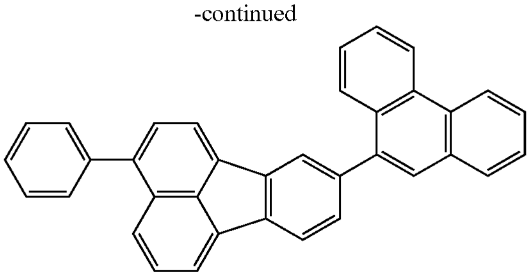
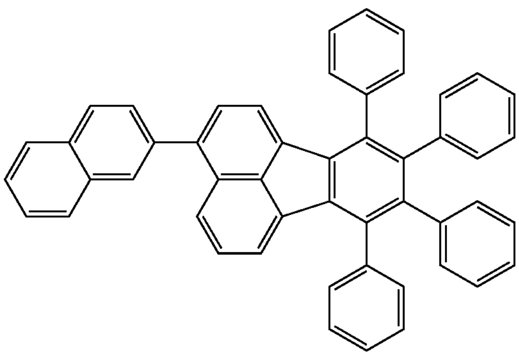
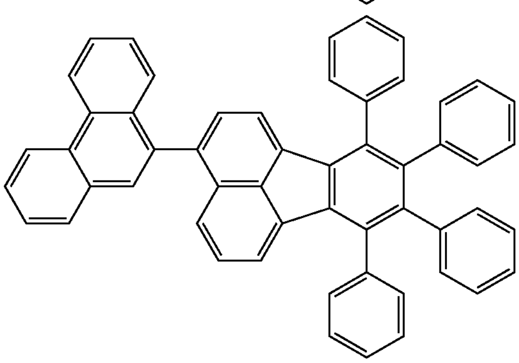
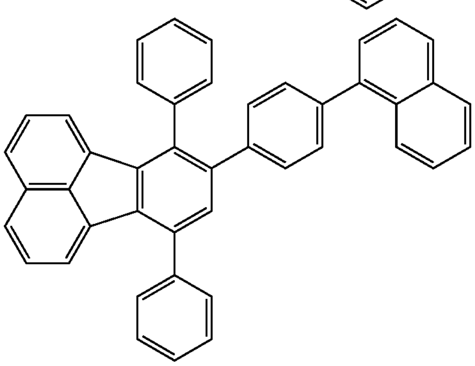
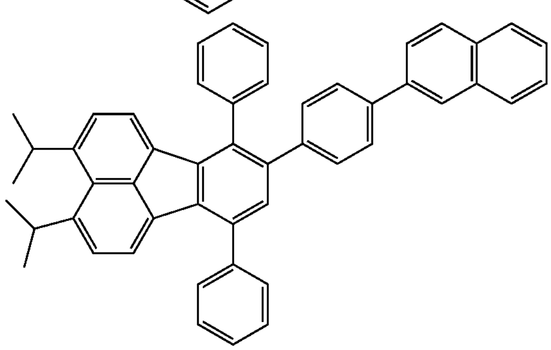
-continued
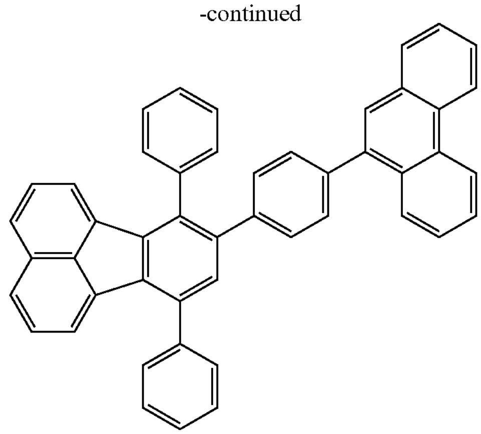
[Chemical Formula 19]
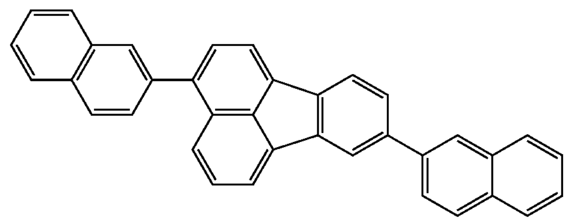
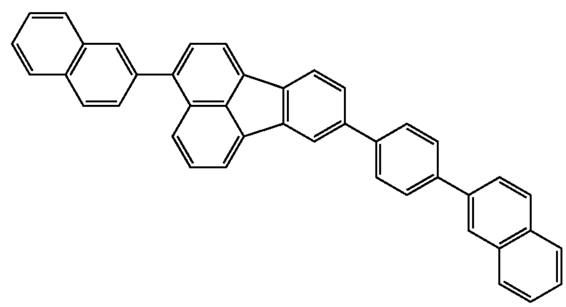
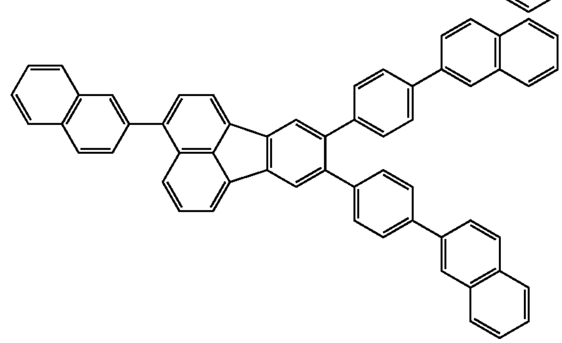
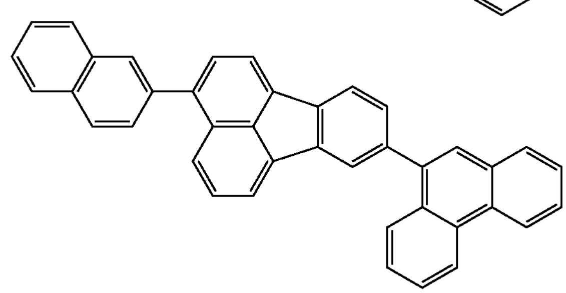

-continued
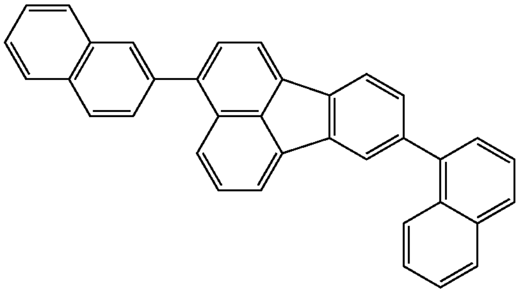
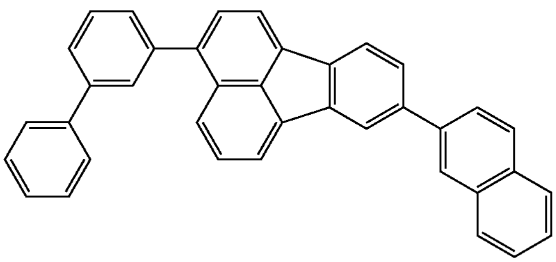
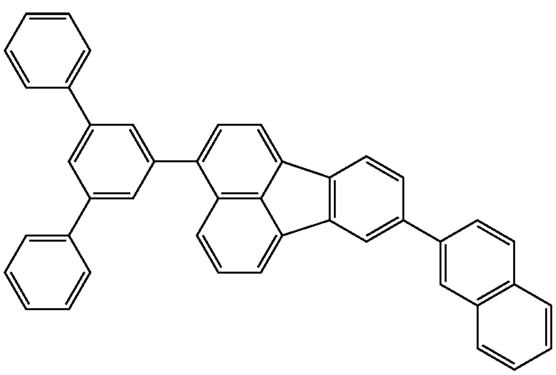
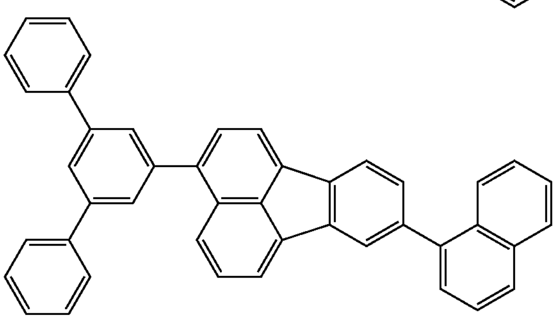
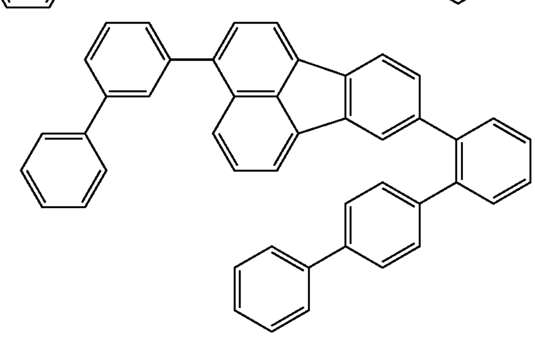
-continued
[Chemical Formula 22]
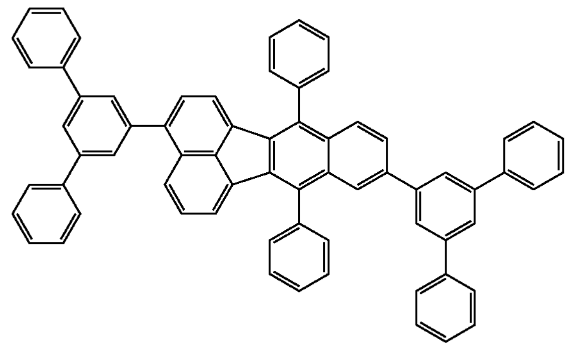
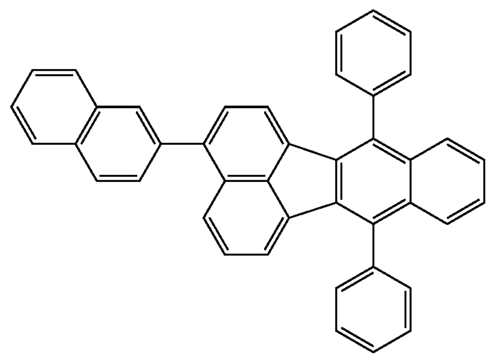
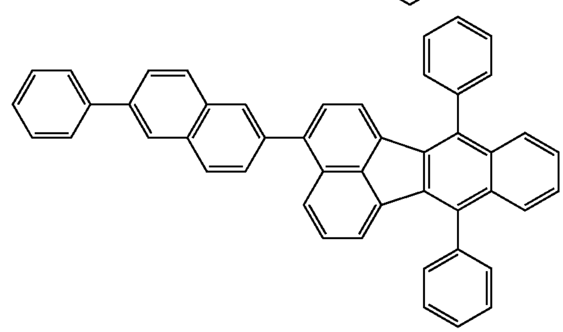
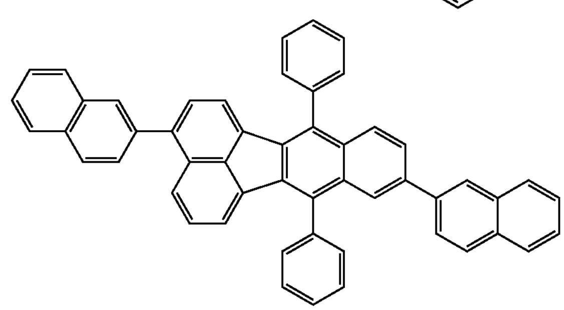
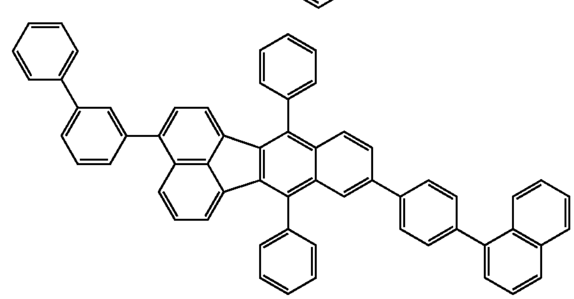

-continued

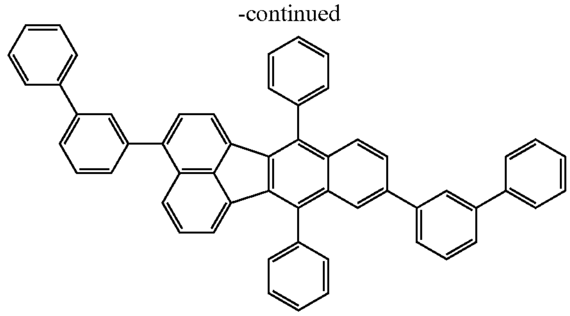

Examples of the substituted or unsubstituted benzofluoranthene are a benzo[b]fluoranthene derivative represented by the following formula (151) and a benzo[k]fluoranthene derivative represented by a formula (152).

[Chemical Formula 20]

(151)

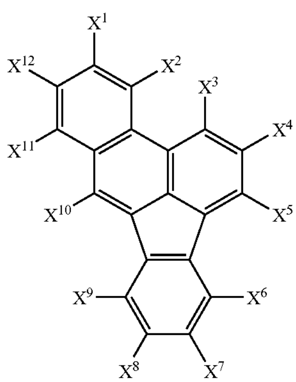

(152)

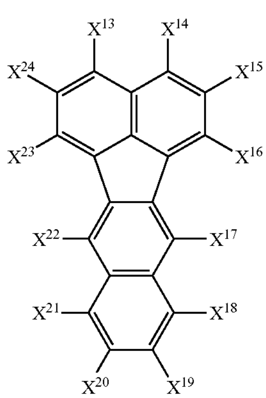

In the formulae (151) and (152), $X^1$ to $X^{24}$ each represent a hydrogen atom, a halogen atom, a linear, branched or cyclic alkyl group, a linear, branched or cyclic alkoxy group, or a substituted or unsubstituted aryl group.

The aryl group represents a carbocyclic aromatic group such as a phenyl group and naphthyl group, or a heterocyclic aromatic group such as a furyl group, thienyl group and pyridyl group.

$X^1$ to $X^{24}$ each preferably represent hydrogen atom, halogen atom (such as fluorine atom, chlorine atom, or bromine atom), linear, branched or cyclic alkyl group having 1 to 16 carbon atoms (such as methyl group, ethyl group, n-propyl group, isopropyl group, n-butyl group, isobutyl group, sec-butyl group, tert-butyl group, n-pentyl group, isopentyl group, neopentyl group, tert-pentyl group, cyclopentyl group, n-hexyl group, 3,3-dimethylbutyl group, cyclohexyl group, n-heptyl group, cyclohexylmethyl group, n-octyl group, tert-octyl group, 2-ethylhexyl group, n-nonyl group, n-decyl group, n-dodecyl group, n-tetradecyl group, or n-hexadecyl group), linear, branched or cyclic alkoxy group having 1 to 16 carbon atoms (such as methoxy group, ethoxy group, n-propoxy group, isopropoxy group, n-butoxy group, isobutoxy group, sec-butoxy group, n-pentyloxy group, neopentyloxy group, cyclopentyloxy group, n-hexyloxy group, 3,3-dimethylbutyloxy group, cyclohexyloxy group, n-heptyloxy group, n-octyloxy group, 2-ethylhexyloxy group, n-nonyloxy group, n-decyloxy group, n-dodecyloxy group, n-tetradecyloxy group, or n-hexadecyloxy group), or substituted or unsubstituted aryl group having 4 to 16 carbon atoms (such as phenyl group, 2-methylphenyl group, 3-methylphenyl group, 4-methylphenyl group, 4-ethylphenyl group, 4-n-propylphenyl group, 4-isopropylphenyl group, 4-n-butylphenyl group, 4-tert-butylphenyl group, 4-isopentylphenyl group, 4-tert-pentylphenyl group, 4-n-hexylphenyl group, 4-cyclohexylphenyl group, 4-n-octylphenyl group, 4-n-decylphenyl group, 2,3-dimethylphenyl group, 2,4-dimethylphenyl group, 2,5-dimethylphenyl group, 3,4-dimethylphenyl group, 5-indanyl group, 1,2,3,4-tetrahydro-5-naphthyl group, 1,2,3,4-tetrahydro-6-naphthyl group, 2-methoxyphenyl group, 3-methoxyphenyl group, 4-methoxyphenyl group, 3-ethoxyphenyl group, 4-ethoxyphenyl group, 4-n-propoxyphenyl group, 4-isopropoxyphenyl group, 4-n-butoxyphenyl group, 4-n-pentyloxyphenyl group, 4-n-hexyloxyphenyl group, 4-cyclohexyloxyphenyl group, 4-n-heptyloxyphenyl group, 4-n-octyloxyphenyl group, 4-n-decyloxyphenyl group, 2,3-dimethoxyphenyl group, 2,5-dimethoxyphenyl group, 3,4-dimethoxyphenyl group, 2-methoxy-5-methylphenyl group, 3-methyl-4-methoxyphenyl group, 2-fluorophenyl group, 3-fluorophenyl group, 4-fluorophenyl group, 2-chlorophenyl group, 3-chlorophenyl group, 4-chlorophenyl group, 4-bromophenyl group, 4-trifluoromethylphenyl group, 3,4-dichlorophenyl group, 2-methyl-4-chlorophenyl group, 2-chloro-4-methylphenyl group, 3-chloro-4-methylphenyl group, 2-chloro-4-methoxyphenyl group, 4-phenylphenyl group, 3-phenylphenyl group, 4-(4'-methylphenyl)phenyl group, 4-(4'-methoxyphenyl)phenyl group, 1-naphthyl group, 2-naphthyl group, 4-ethoxy-1-naphthyl group, 6-methoxy-2-naphthyl group, 7-ethoxy-2-naphthyl group, 2-furyl group, 2-thienyl group, 3-thienyl group, 2-pyridyl group, 3-pyridyl group, or 4-pyridyl group), more preferably hydrogen atom, fluorine atom, chlorine atom, alkyl group having 1 to 10 carbon atoms, alkoxy group having 1 to 10 carbon atoms or aryl group having 6 to 12 carbon atoms, further more preferably hydrogen atom, fluorine atom, chlorine atom, alkyl group having 1 to 6 carbon atoms, alkoxy group having 1 to 6 carbon atoms or carbocyclic aromatic group having 6 to 10 carbon atoms.

Examples of the benzo[b]fluoranthene derivative represented by the formula (151) are as follows.
[Chemical Formula 21]
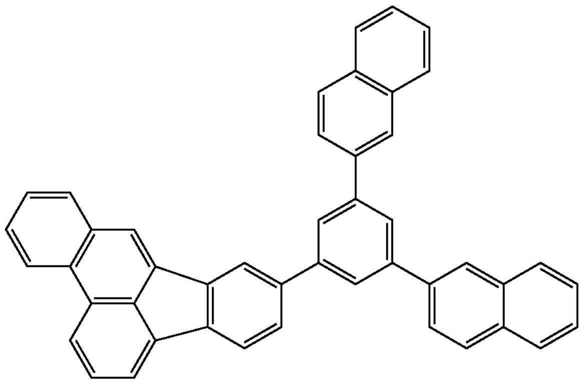
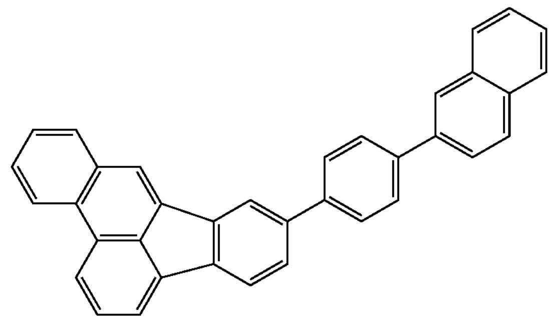
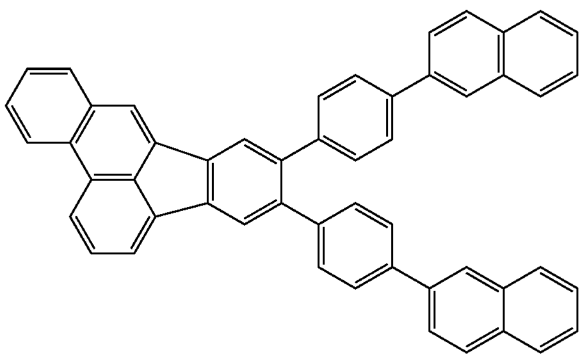
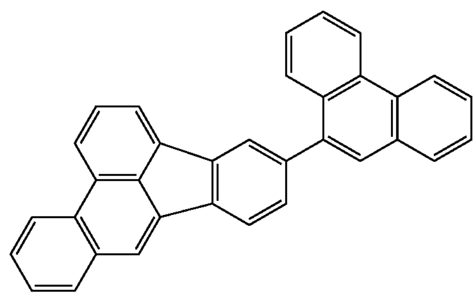
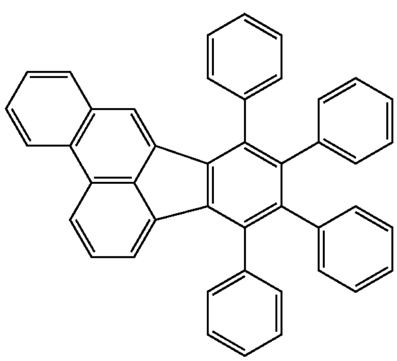
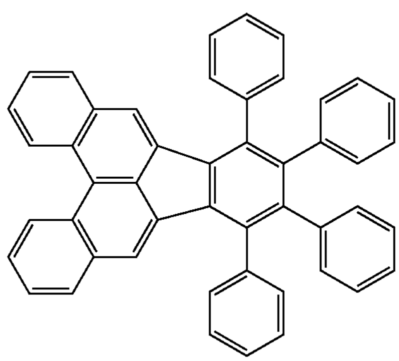
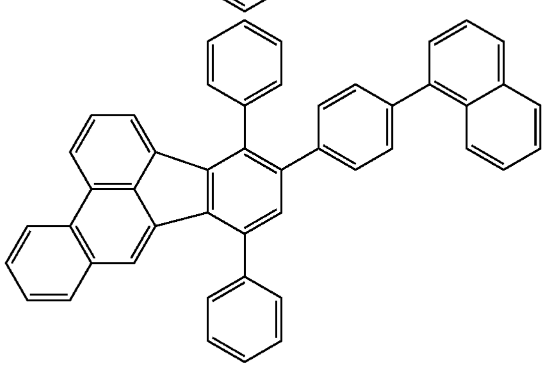
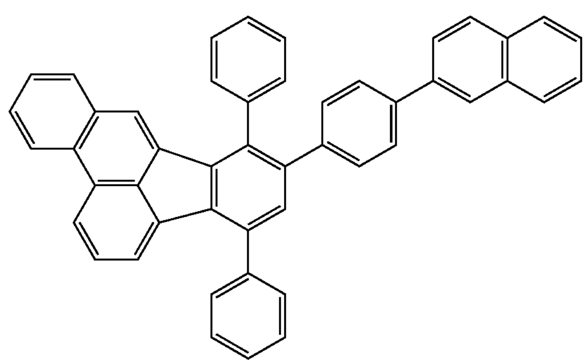

-continued
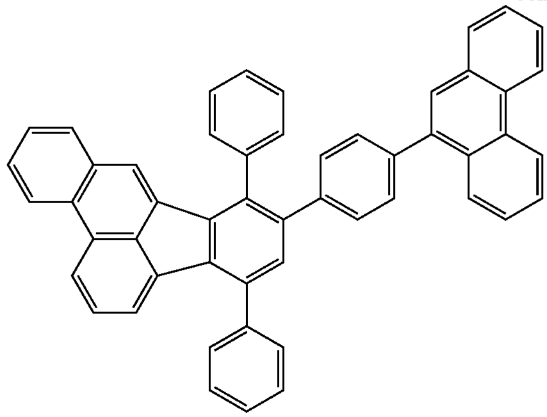
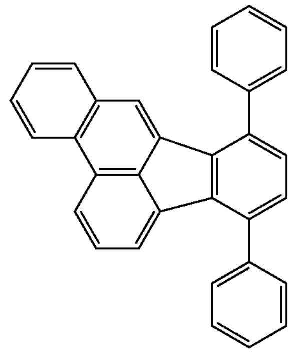
Examples of the benzo[k]fluoranthene derivative represented by the formula (152) are as follows.
[Chemical Formula 22]
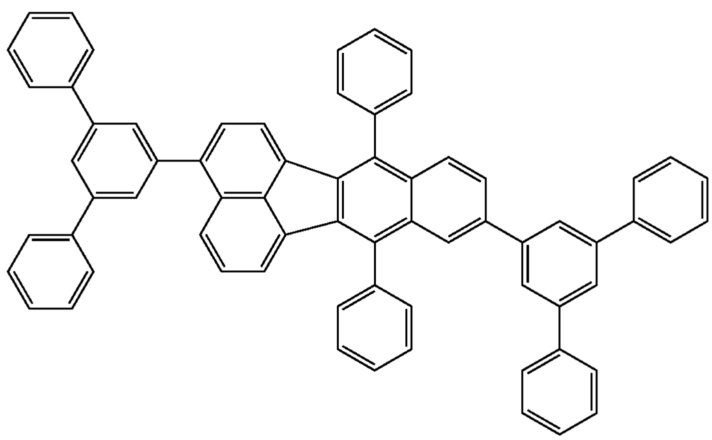
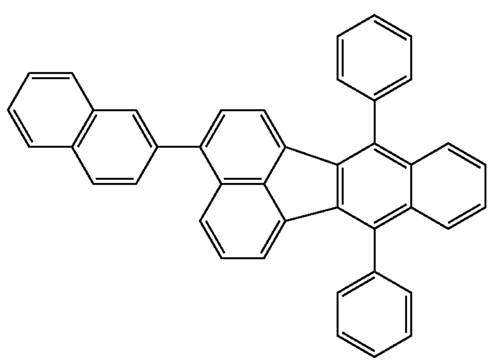
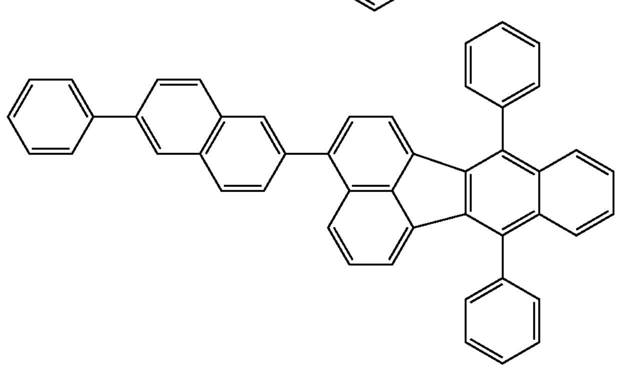

-continued
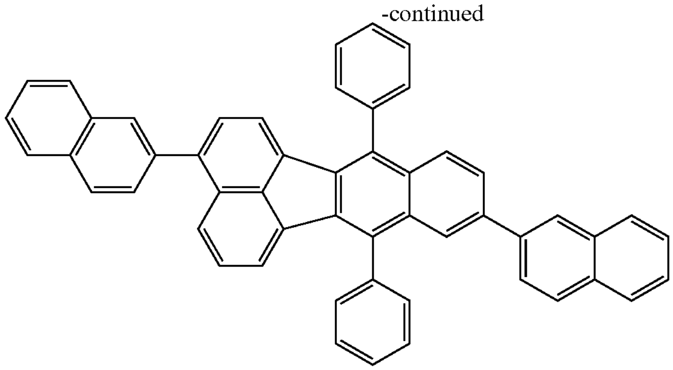
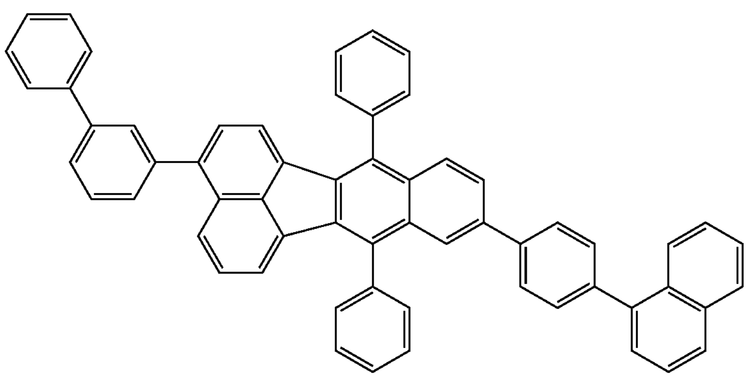
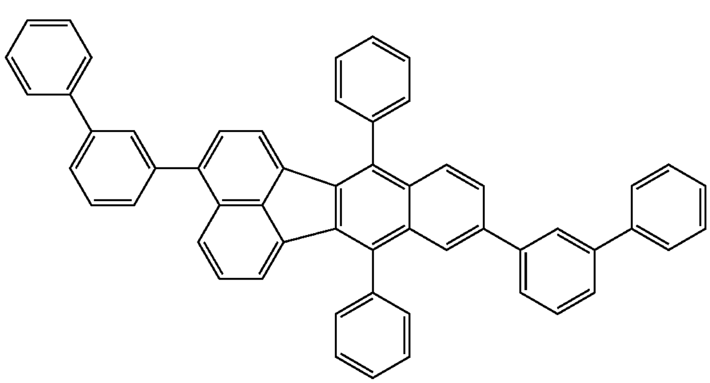

In the aspect of the invention, the polycyclic fused aromatic skeleton is preferably the elementary substance of triphenylene represented by the following formula (16) or its derivative. Carbon atoms of the skeleton may be partly replaced by nitrogen atom(s).

[Chemical Formula 23]

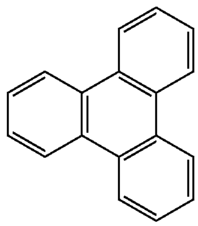

(16)

Examples of the triphenylene derivative are those represented by the following formulae.

[Chemical Formula 24]

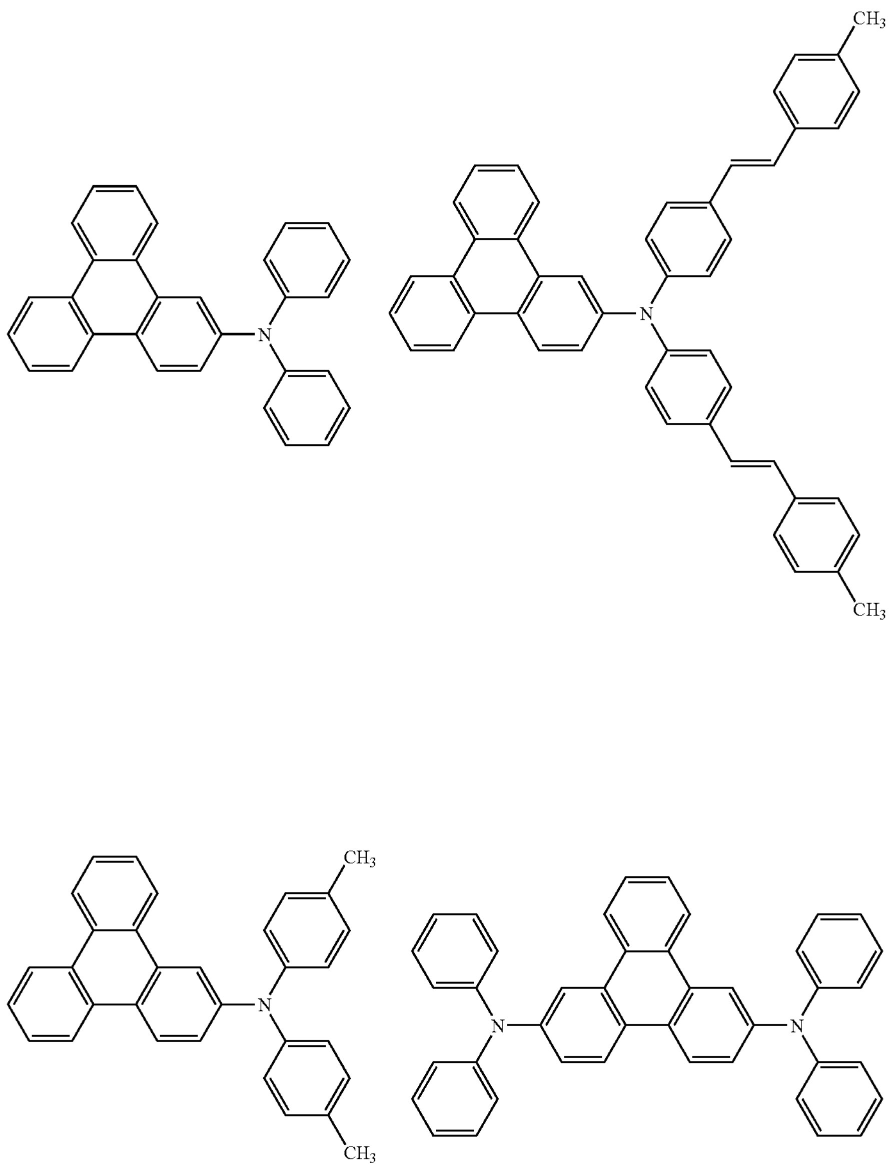

-continued
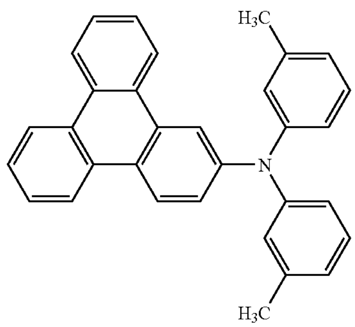
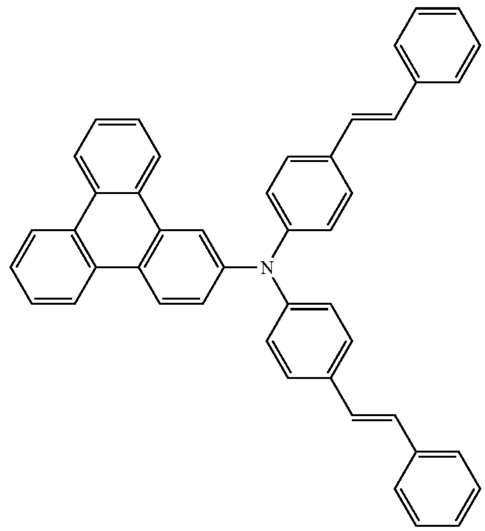
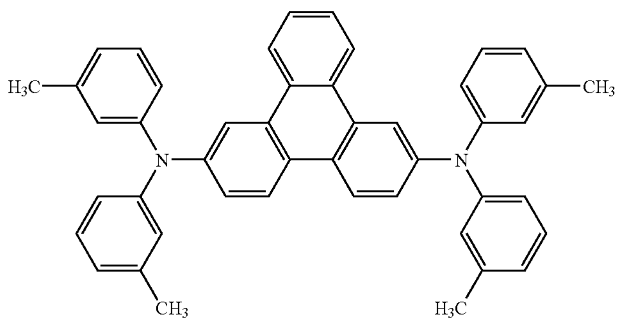
[Chemical Formula 25]
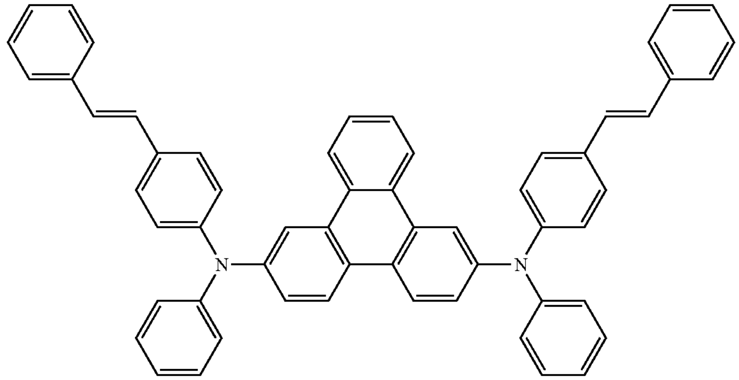

-continued
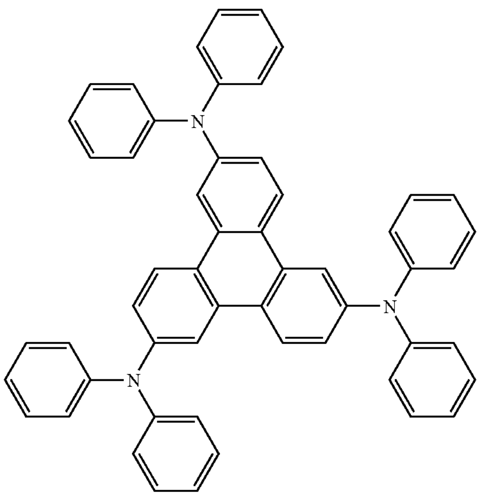
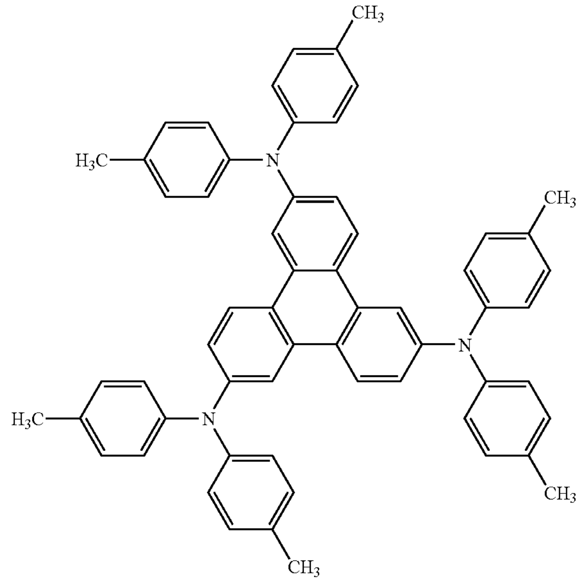
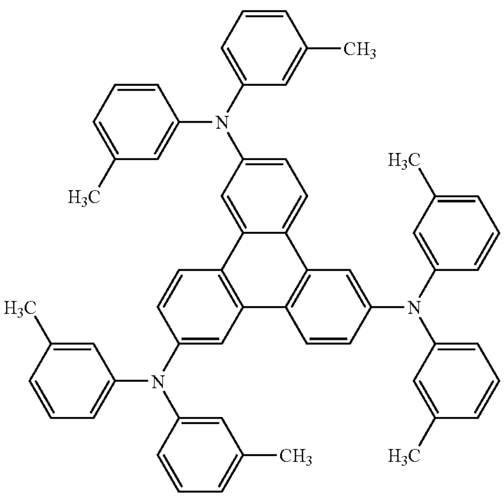
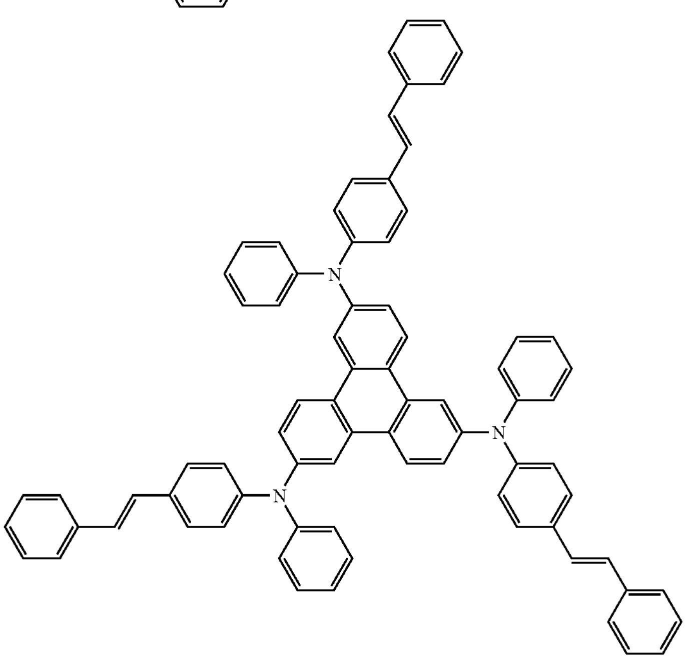

-continued
[Chemical Formula 26]
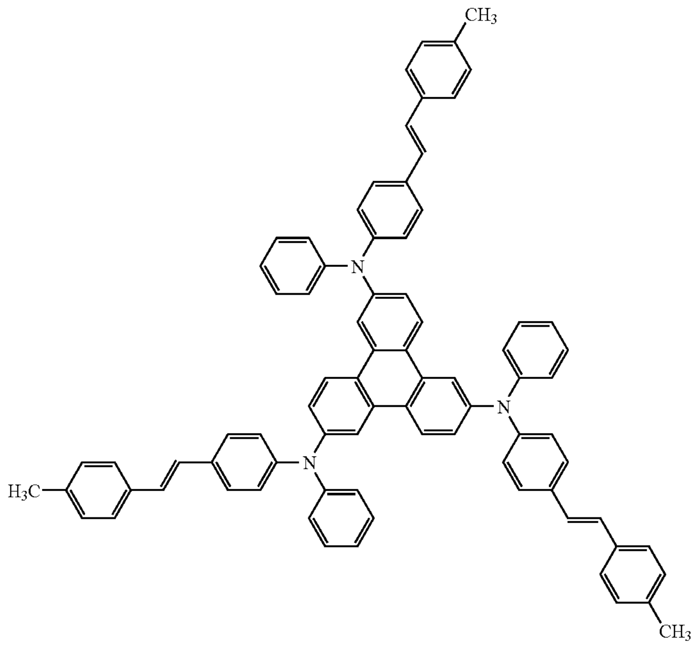
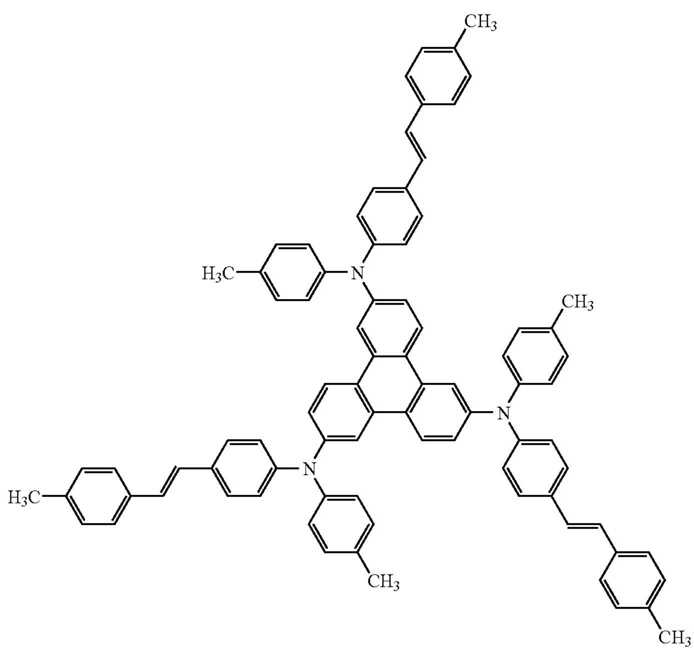
[Chemical Formula 27]
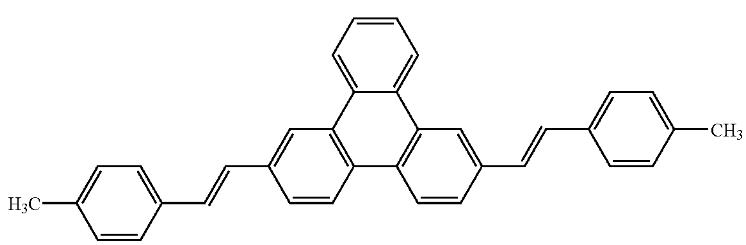

-continued
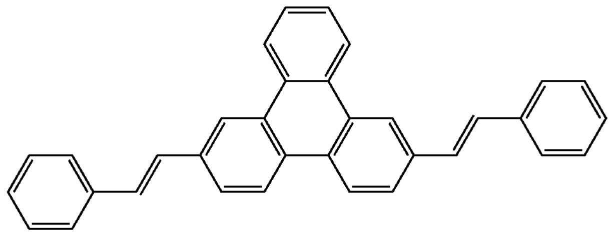
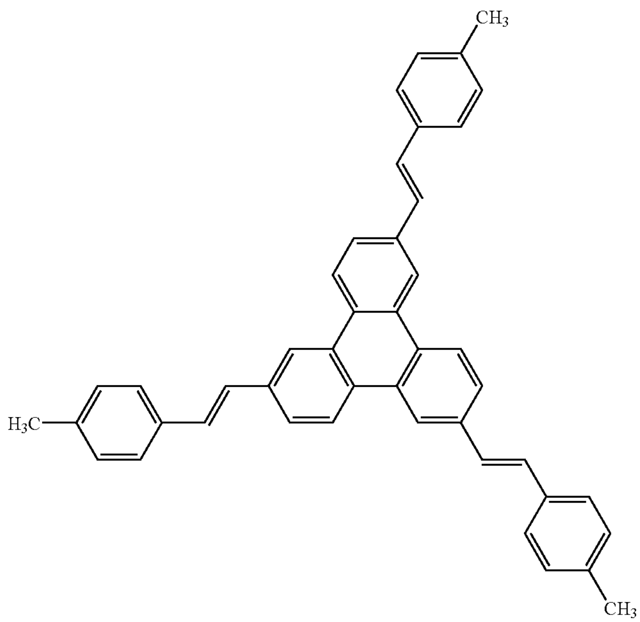
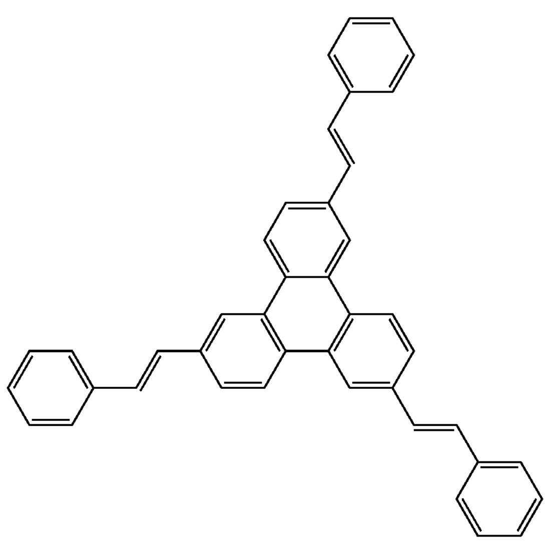

-continued
[Chemical Formula 28]
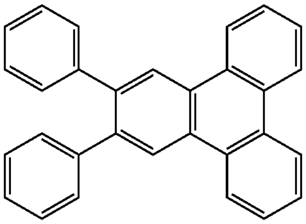
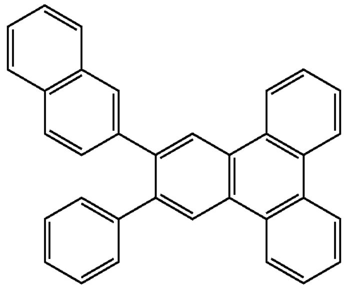
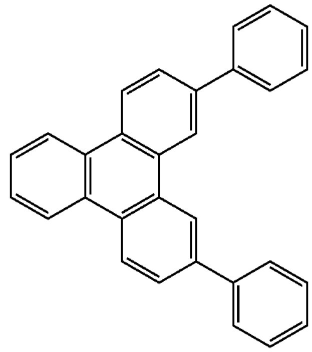
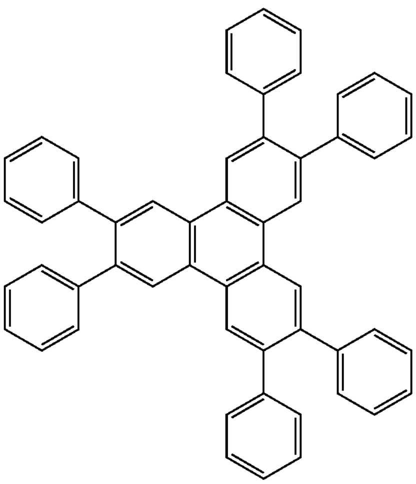
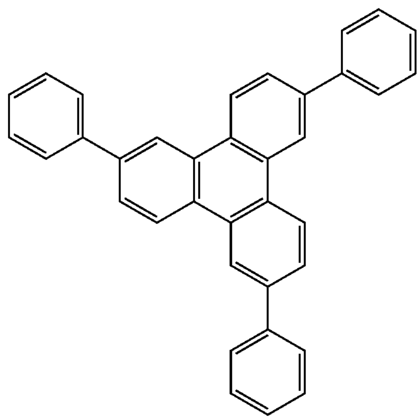
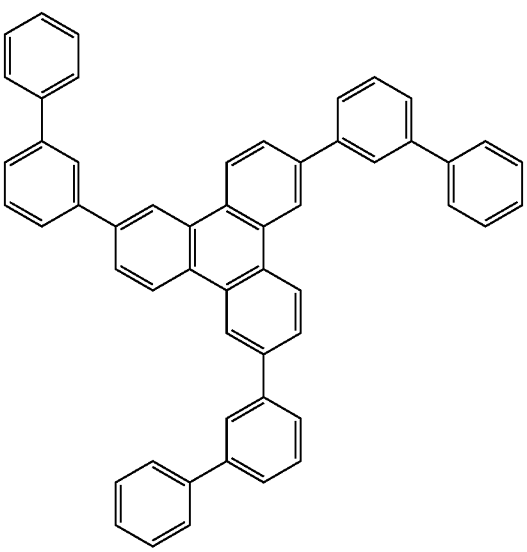
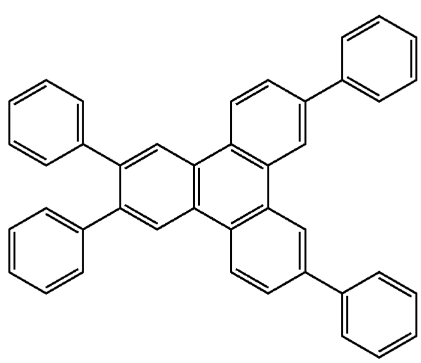

The polycyclic fused aromatic skeleton may contain a nitrogen atom, examples of which are shown below.

[Chemical Formula 29]

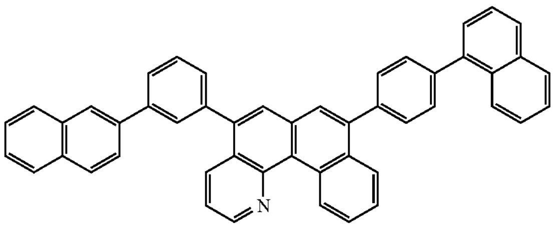

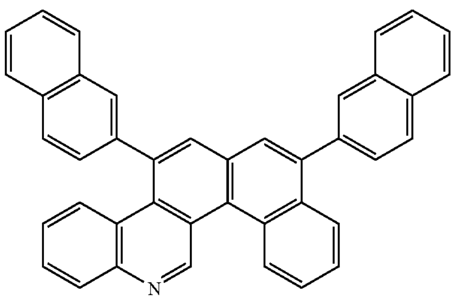

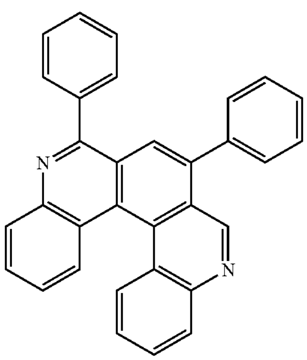

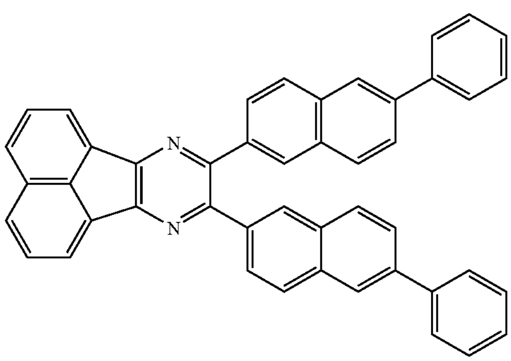

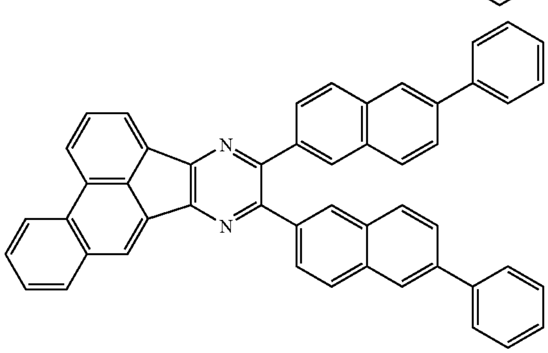

-continued

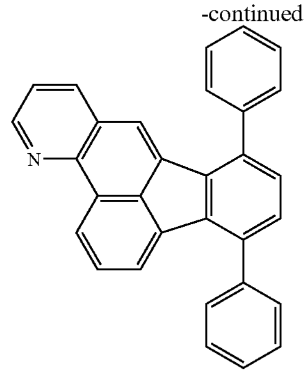

Examples of the compound represented by the formula (4) are compounds represented by the following formulae (41) to (48).

[Chemical Formula 30]

$$Np\text{-}(Np)_n\text{-}Np \tag{41}$$

In the formula (41), Np represents substituted or unsubstituted naphthalene, and n represents an integer of 0 to 3.

[Chemical Formula 31]

(42)

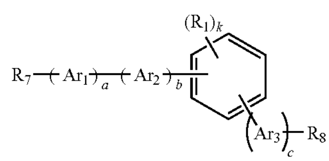

In the formula (42), $Ar_1$ and $Ar_2$ each independently represent substituted or unsubstituted naphthalene or substituted or unsubstituted phenanthrene. $Ar_3$ represents a substituted or unsubstituted aryl group having 6 to 30 ring carbon atoms.

However, at least one of $Ar_1$, $Ar_2$ and $Ar_3$ is naphthalene. $R_1$, $R_7$ and $R_8$ each represent a hydrogen atom or a substituent. a, b and c each represent an integer of 1 to 3.

k represents an integer of 1 to 4. When k is 2 or more, $R_1$ may be mutually the same or different.

[Chemical Formual 32]

(43)

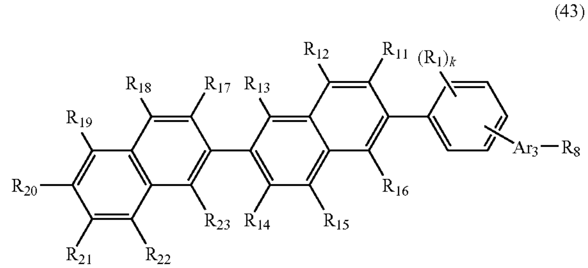

In the formula (43), $Ar_3$ represents an aryl group having 6 to 30 ring carbon atoms, and $R_1$, $R_8$, $R_{11}$ to $R_{23}$ each represent a hydrogen atom or a substituent.

k represents an integer of 1 to 4. When k is 2 or more, $R_1$ may be mutually the same or different.

[Chemical Formula 33]

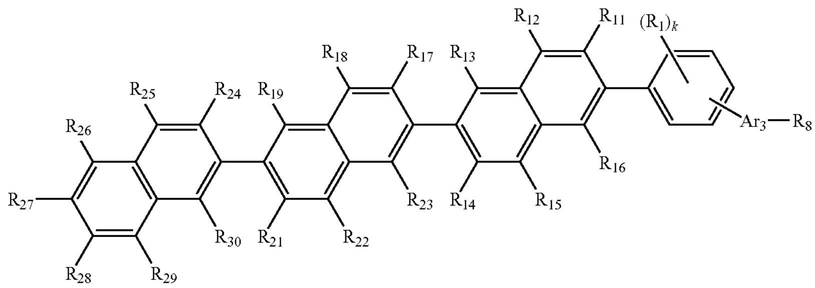

(44)

In the formula (44), $Ar_3$ represents an aryl group having 6 to 30 ring carbon atoms, and $R_1$, $R_8$, $R_{11}$ to $R_{19}$ and $R_{21}$ to $R_{30}$ each represent a hydrogen atom or a substituent.

k represents an integer of 1 to 4. When k is 2 or more, $R_1$ may be mutually the same or different.

[Chemical Formula 34]

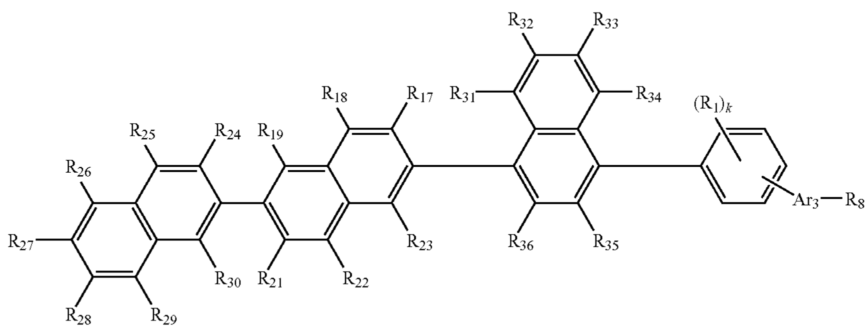

(45)

In the formula (45), $Ar_3$ represents an aryl group having 6 to 30 ring carbon atoms, and $R_1$, $R_8$, $R_{17}$ to $R_{19}$ and $R_{21}$ to $R_{36}$ each represent a hydrogen atom or a substituent.

k represents an integer of 1 to 4. When k is 2 or more, $R_1$ may be mutually the same or different.

[Chemical Formula 35]

(46)

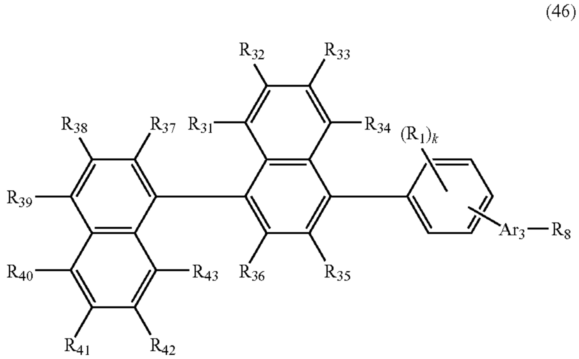

In the formula (46), $Ar_3$ represents an aryl group having 6 to 30 ring carbon atoms, and $R_1$, $R_5$, $R_{31}$ to $R_{43}$ each represent a hydrogen atom or a substituent.

k represents an integer of 1 to 4. When k is 2 or more, $R_1$ may be mutually the same or different.

[Chemical Formula 36]

(47)

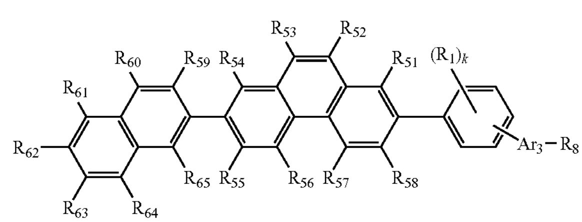

In the formula (47), $Ar_3$ represents an aryl group having 6 to 30 ring carbon atoms, and $R_1$, $R_8$, $R_{51}$ to $R_{65}$ each represent a hydrogen atom or a substituent.

k represents an integer of 1 to 4. When k is 2 or more, $R_1$ may be mutually the same or different.

[Chemical Formula 37]
(48)
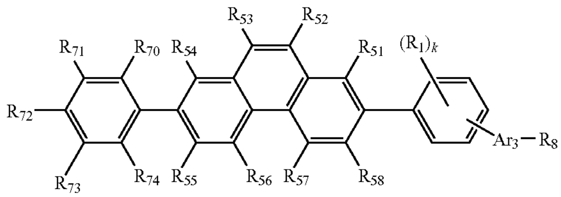
In the formula (48), $Ar_3$ represents an aryl group having 6 to 30 ring carbon atoms, and $R_1$, $R_8$, $R_{51}$ to $R_{58}$ and $R_{70}$ to $R_{74}$ each represent a hydrogen atom or a substituent.
k represents an integer of 1 to 4. When k is 2 or more, $R_1$ may be mutually the same or different.
Examples of the compounds are as follows.
[Chemical Formula 38]
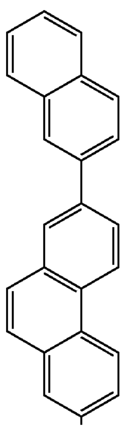
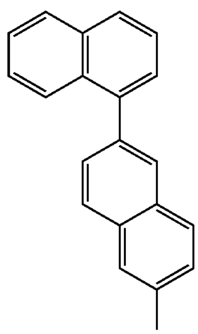
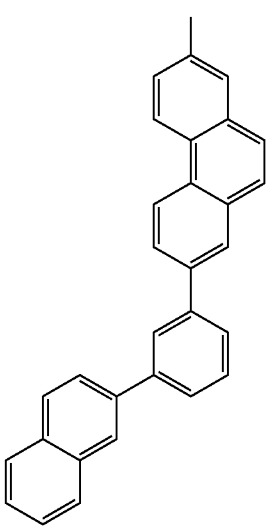
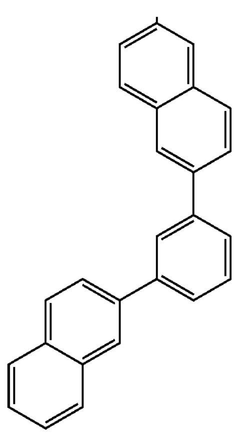
-continued
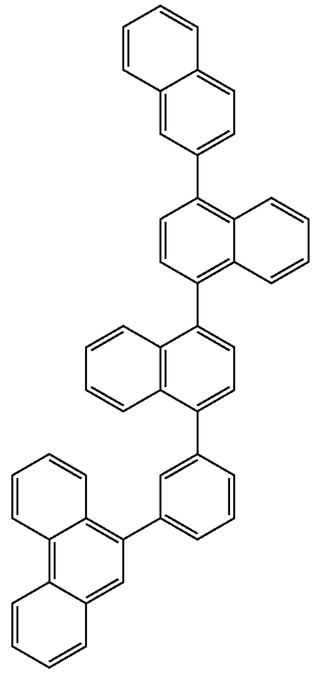
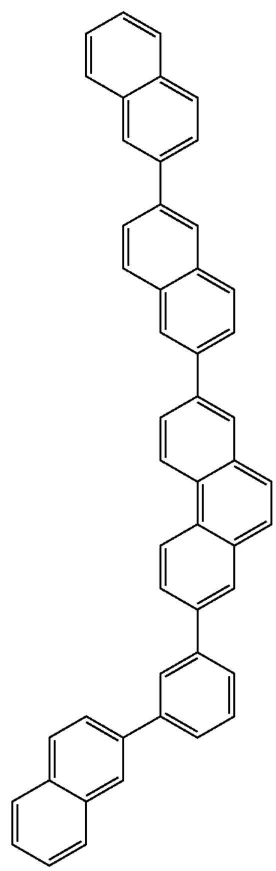

-continued
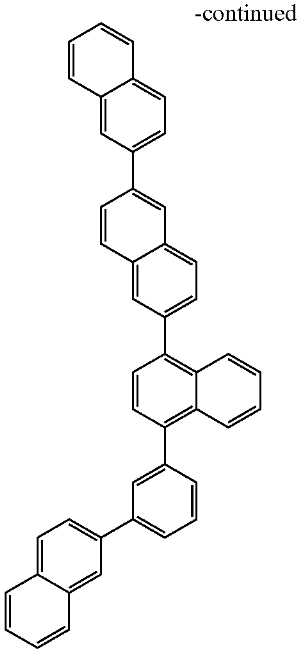
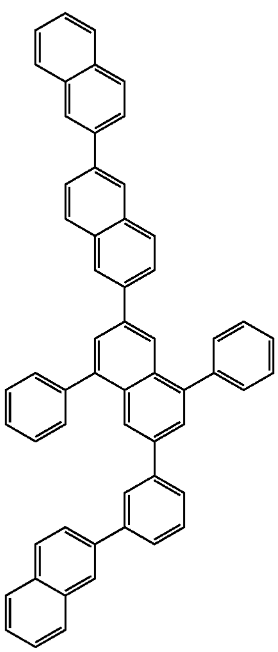
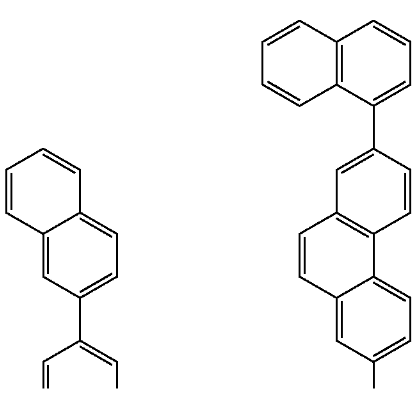
-continued
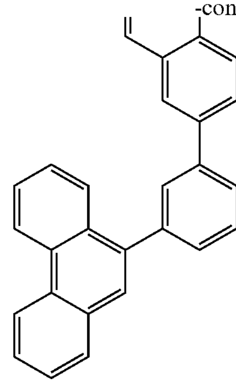
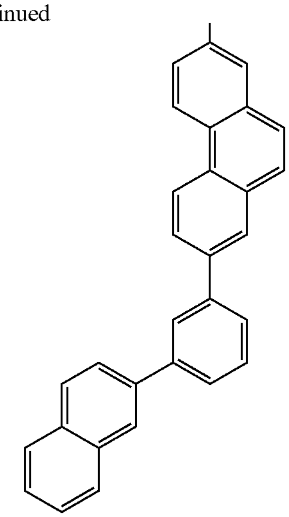
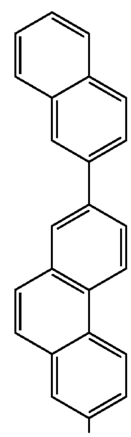
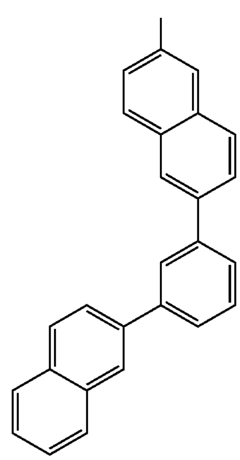

-continued
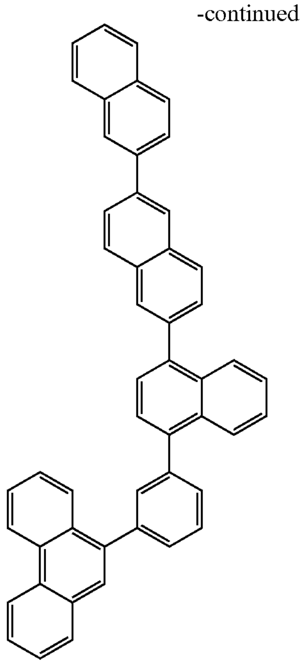
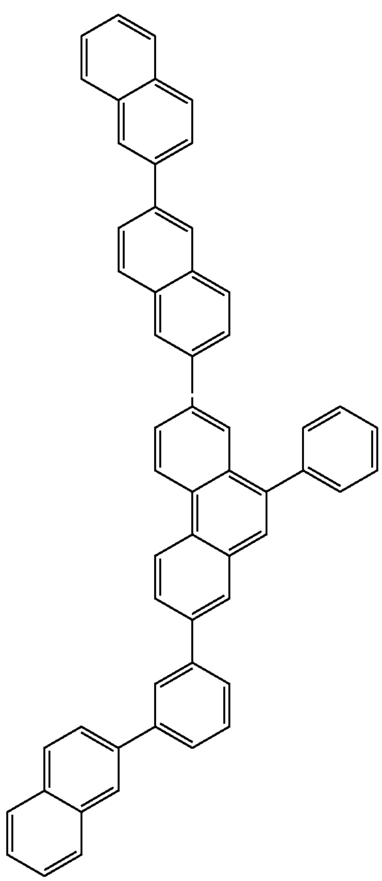
-continued
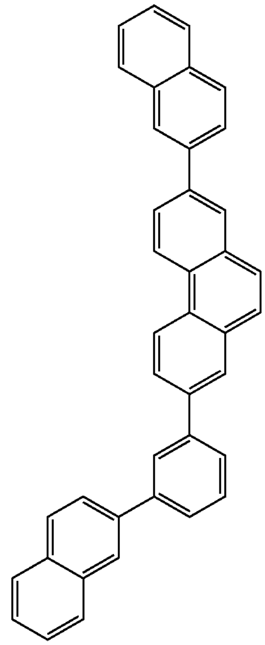
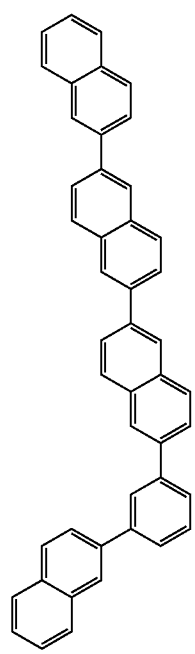
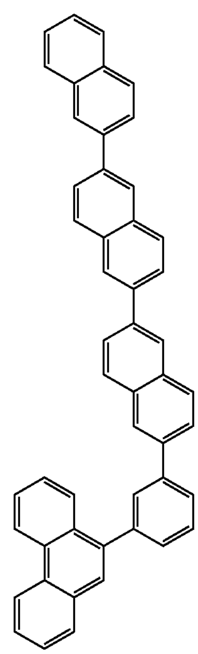

-continued
-continued
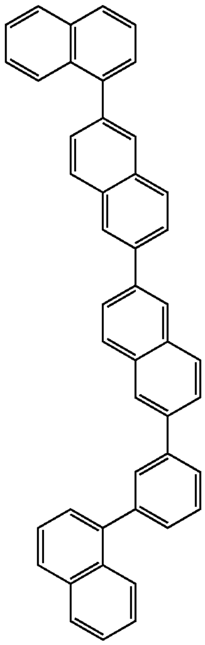
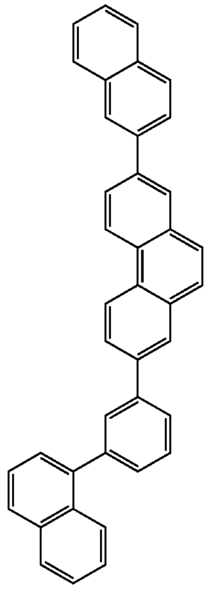
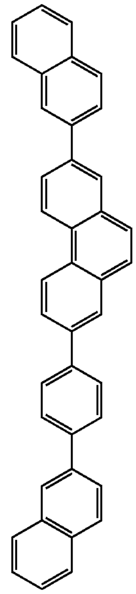
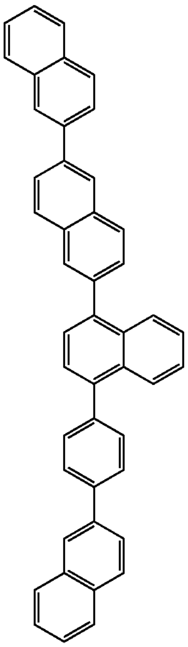
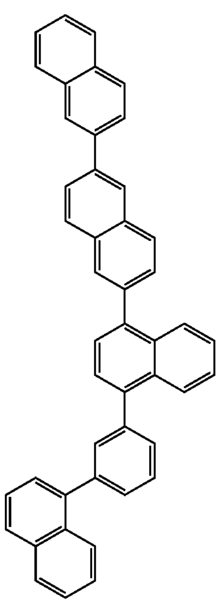
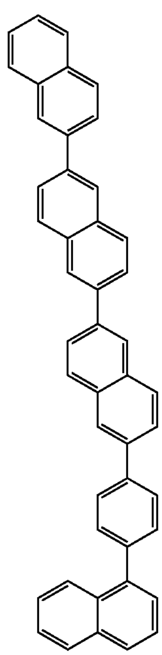
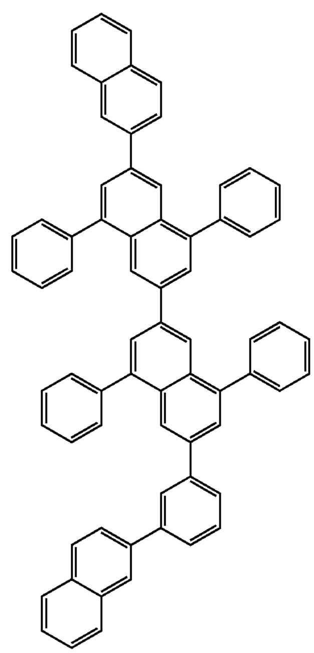

-continued
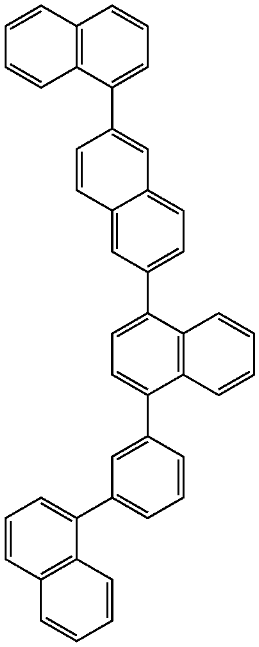
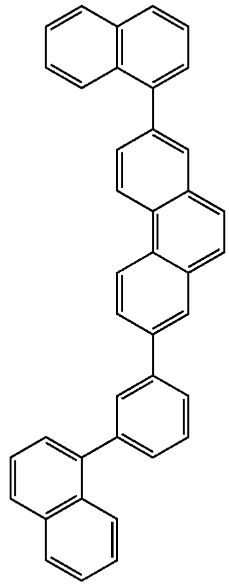
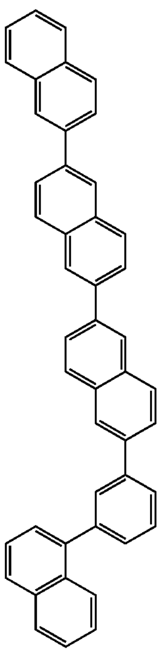
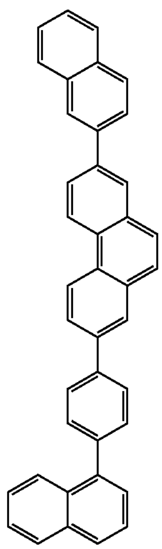
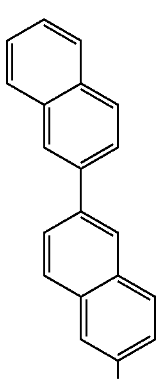
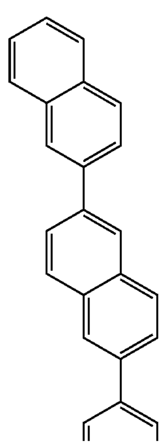
-continued
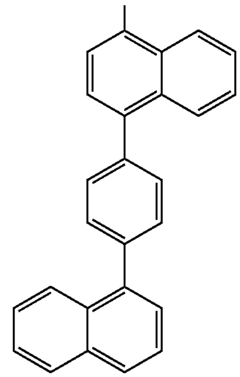
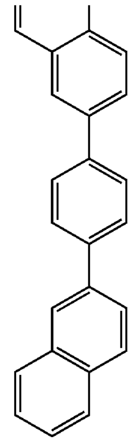
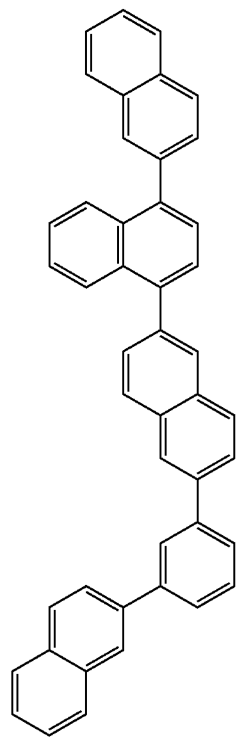
An example of the host material is an oligonaphthalene derivative represented by the following formula (49).
[Chemical Formula 39]
$$Ar^1 \!-\!\!\left( Ar^2 \right)_n\!\!-\! Ar^3 \quad (49)$$
(50)
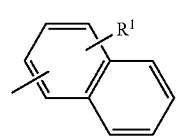
(51)
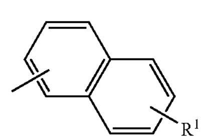

-continued (52)

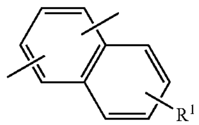

(53)

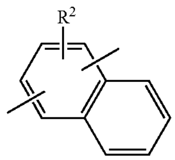

(54)

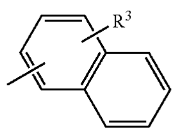

(55)

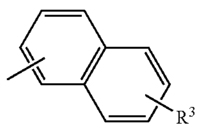

In the formula: n is 1 or 2; $Ar^1$ is a substituent represented by the general formula (50) or (51); $Ar^2$ is a substituent represented by the general formula (52) or (53); $Ar^3$ is a substituent represented by the general formula (54) or (55); $R^1$ to $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

The oligonaphthalene derivative may have the structure represented by the general formula (56).

[Chemical Formula 40]

$$Ar^1 - (Ar^2)_n - Ar^3 \quad (56)$$

(57)

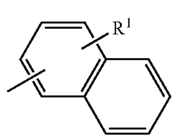

(58)

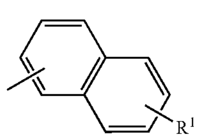

(59)

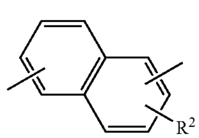

(60)

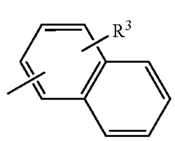

-continued (61)

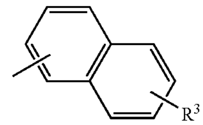

In the formula: n is 1 or 2; $Ar^1$ is a substituent represented by the general formula (57) or (58); $Ar^2$ is a substituent represented by the general formula (59); $Ar^3$ is a substituent represented by the general formula (60) or (61); and $R^1$ to $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

More specifically, the oligonaphthalene derivative exemplarily has the structure represented by the general formula (62).

[Chemical Formula 41]

(62)

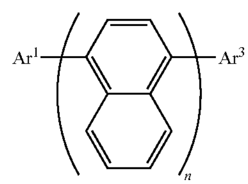

(63)

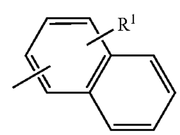

(64)

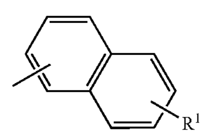

(65)

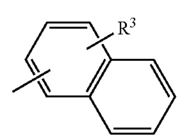

(66)

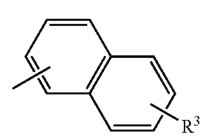

In the formula: n is 1 or 2; $Ar^1$ is a substituent represented by the general formula (63) or (64); $Ar^3$ is a substituent represented by the general formula (65) or (66); and $R^1$ and $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

The oligonaphthalene derivative may have the structure represented by the general formula (67).

[Chemical Formula 42]

(67)

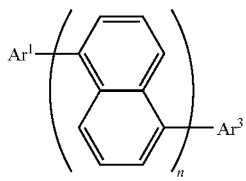

(68)

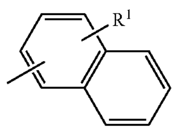

(69)

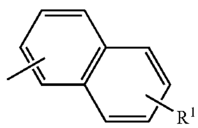

(70)

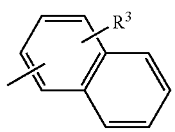

(71)

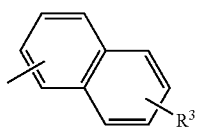

In the formula: n is 1 or 2; $Ar^1$ is a substituent represented by the general formula (68) or (69); $Ar^3$ is a substituent represented by the general formula (70) or (71); and $R^1$ and $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

Particularly, the structure represented by the general formula (72) is preferable.

[Chemical Formula 43]

(72)

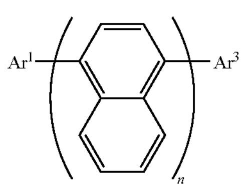

(73)

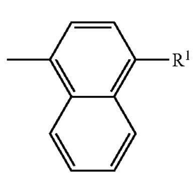

-continued (74)

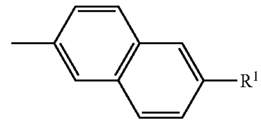

(75)

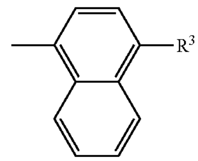

(76)

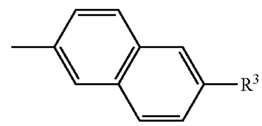

In the formula: n is 1 or 2; $Ar^1$ is a substituent represented by the general formula (73) or (74); $Ar^3$ is a substituent represented by the general formula (75) or (76); and $R^1$ and $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

Further, the structure represented by the general formula (77) is preferable.

[Chemical Formula 44]

(77)

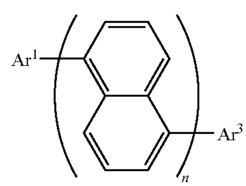

(78)

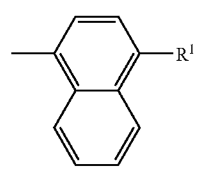

(79)

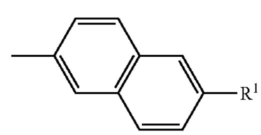

(80)

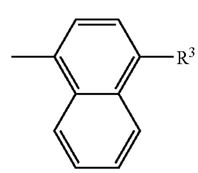

(81)

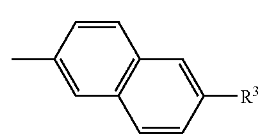

In the formula: n is 1 or 2; $Ar^1$ is a substituent represented by the general formula (78) or (79); $Ar^3$ is a substituent represented by the general formula (80) or (81); and $R^1$ and $R^3$ each independently represent a hydrogen atom, linear or branched alkyl group having 6 or less carbon atoms, alicyclic alkyl group, substituted or unsubstituted aromatic ring, substituted or unsubstituted heteroaromatic ring, alkoxy group, amino group, cyano group, silyl group, ester group, carbonyl group or halogen.

Examples of the alkyl group having 6 or less carbon atoms are a methyl group, ethyl group, n-propyl group, i-propyl group, n-butyl group, i-butyl group, sec-butyl group, t-butyl group, n-pentyl group, i-pentyl group and n-hexyl group.

Examples of the alicyclic alkyl group are a cyclopropyl group, cyclobutyl group, cyclopentyl group and cyclohexyl group.

Examples of the substituted or unsubstituted aromatic ring are a phenyl group, naphthyl group, anthranil group, pyrenyl group and spirofluorenyl group.

Examples of the substituted or unsubstituted heteroaromatic ring are a pyridyl group, indolyl group, carbazolyl group, thienyl group and furyl group.

Examples of the oligonaphthalene derivative represented by the general formula (49) are oligonaphthalene derivatives represented by the following structural formulae.

However, the invention is not limited to these compounds.

[Chemical Formula 45]

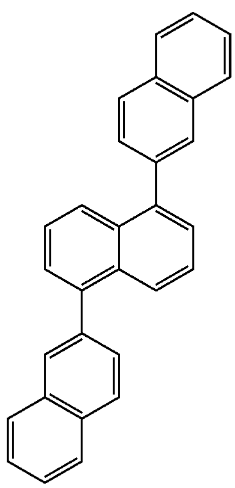

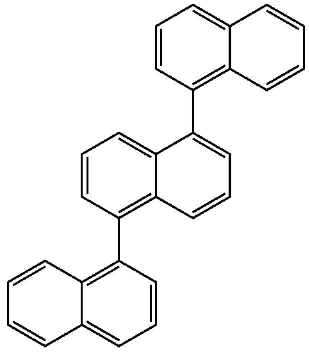

-continued

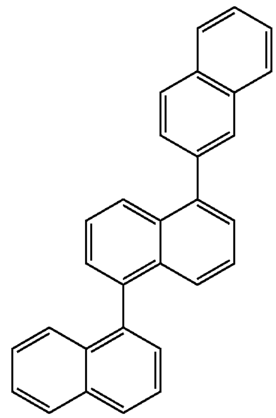

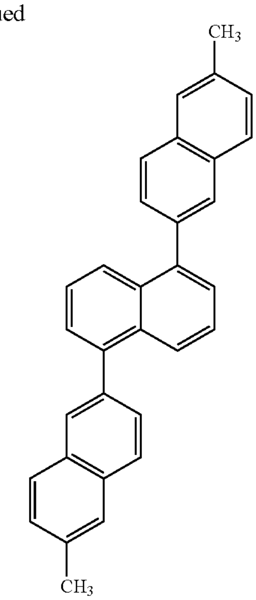

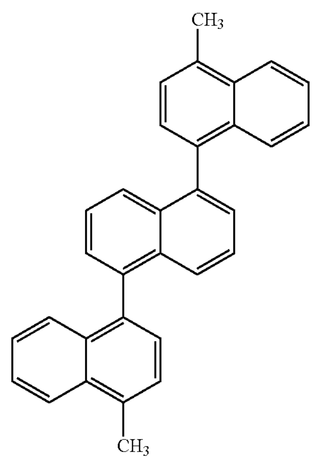

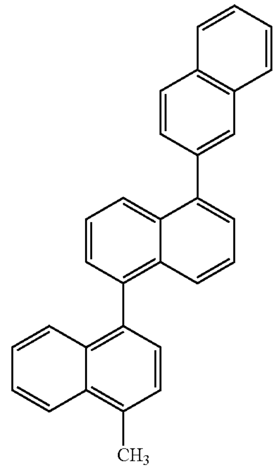

-continued
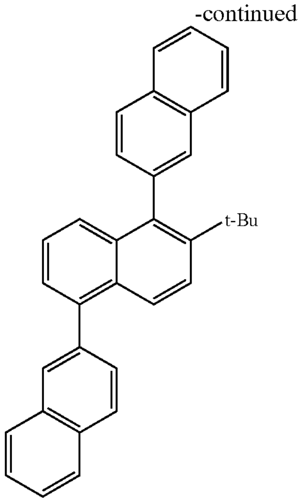
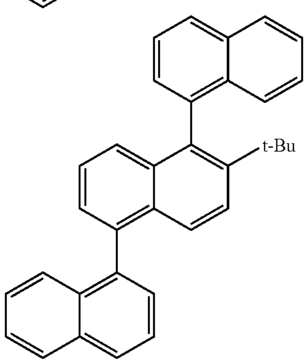
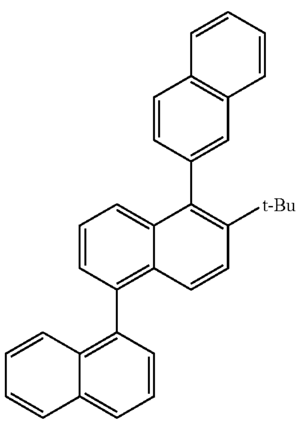
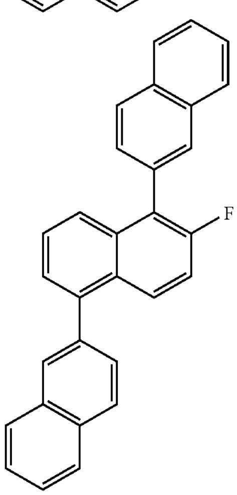
-continued
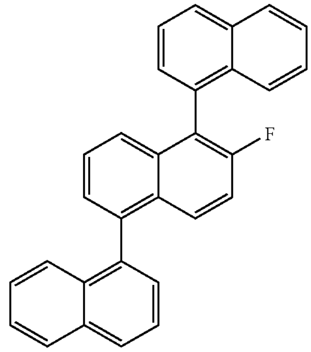
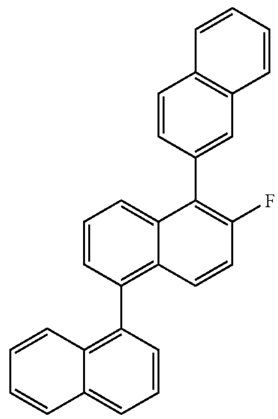
[Chemical Formula 46]
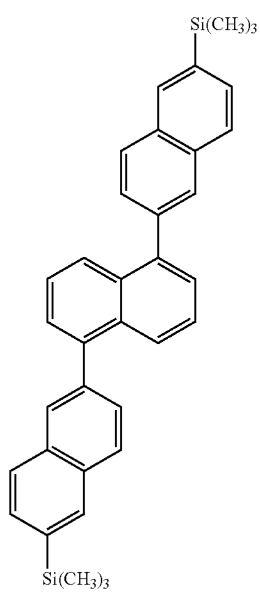

-continued
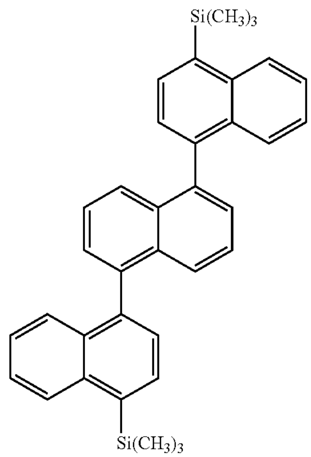
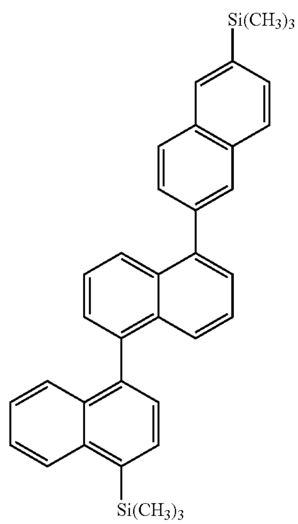
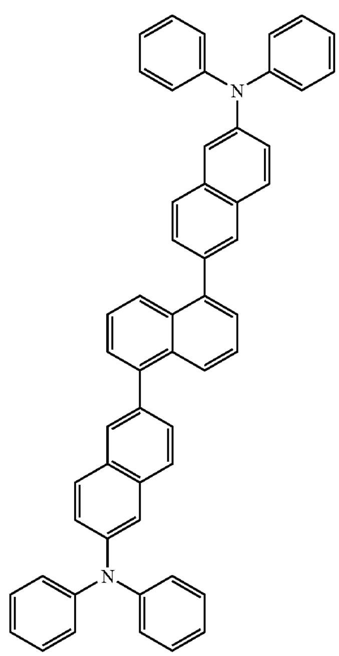
-continued
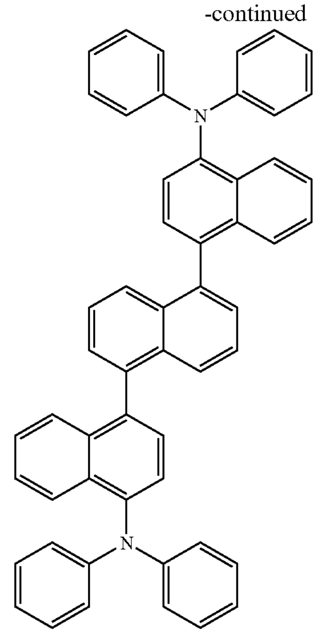
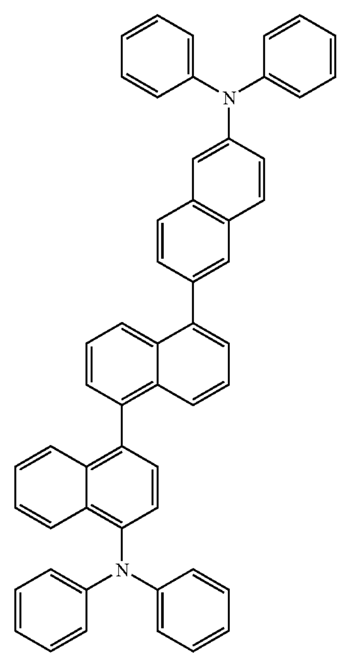

-continued
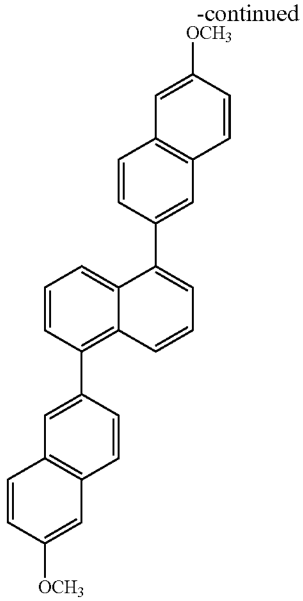
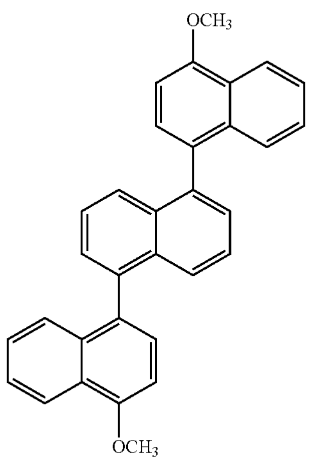
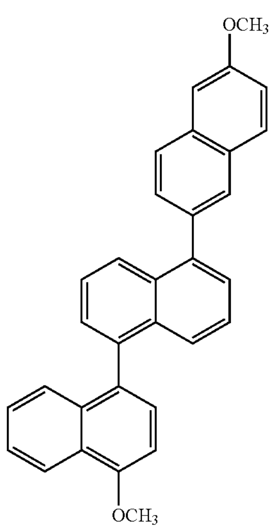
-continued
[Chemical Formula 47]
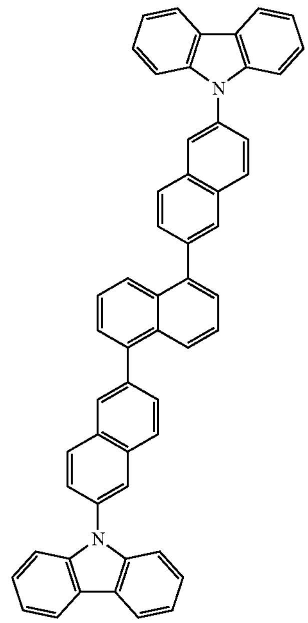
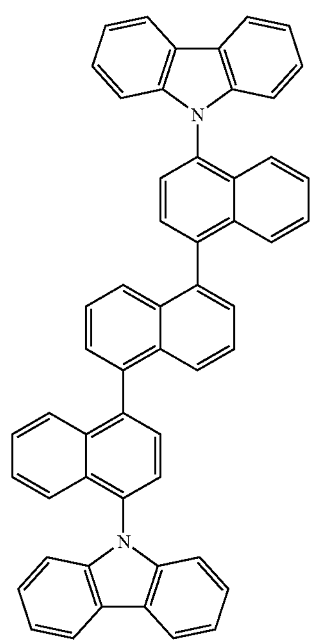

-continued
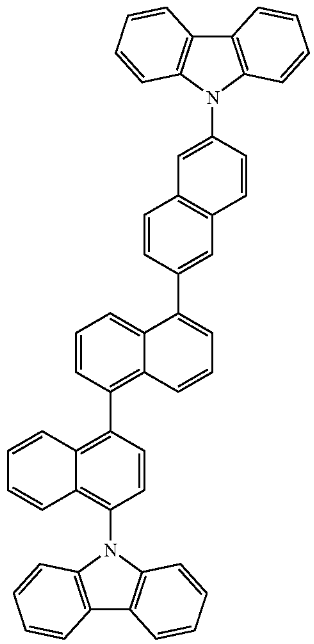
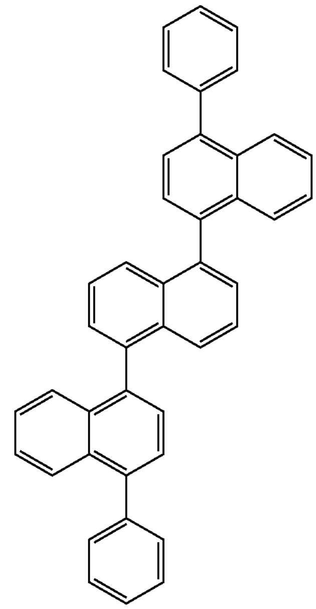
-continued
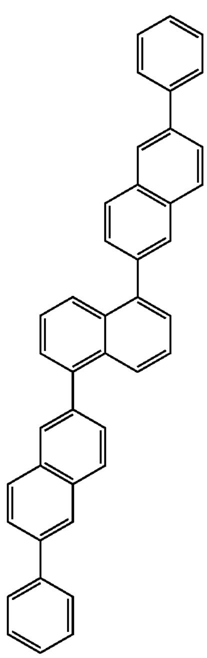
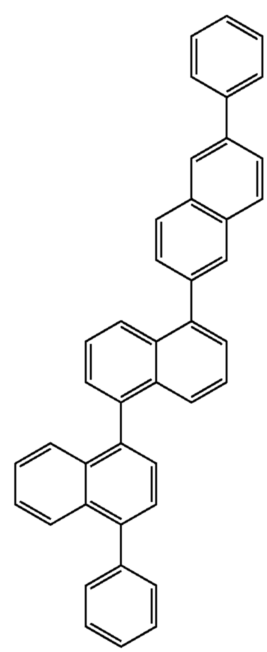

-continued
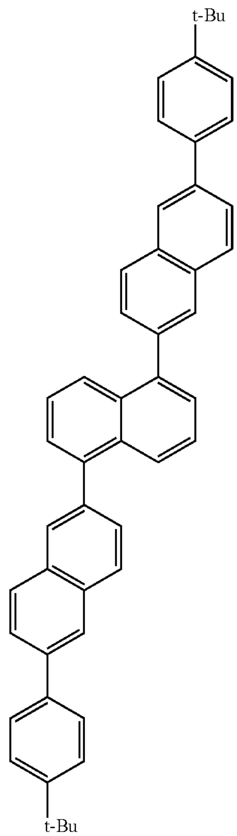
-continued
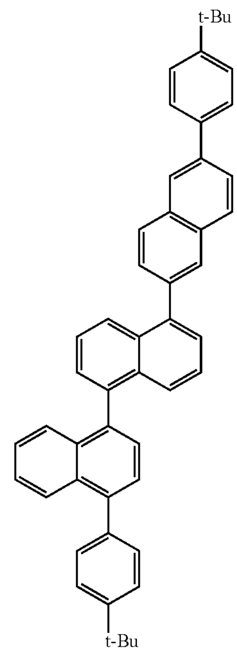
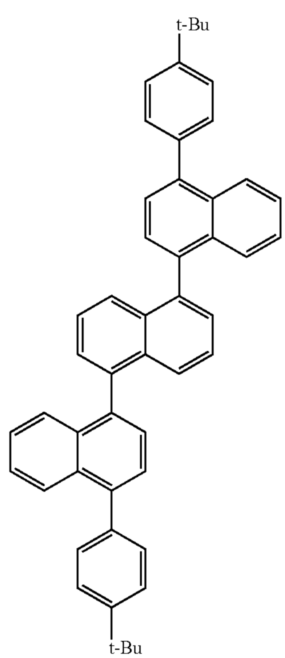
[Chemical Formula 48]
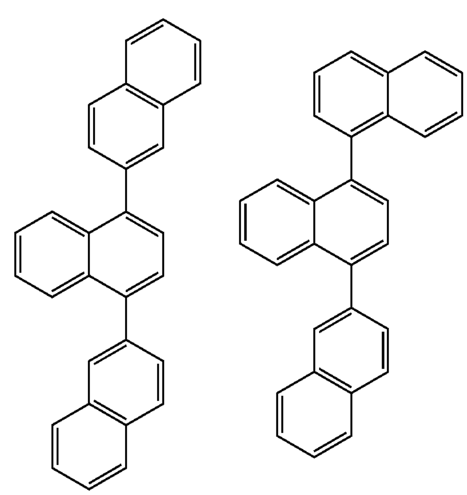

-continued
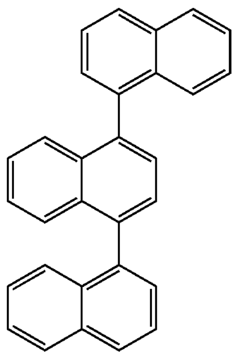
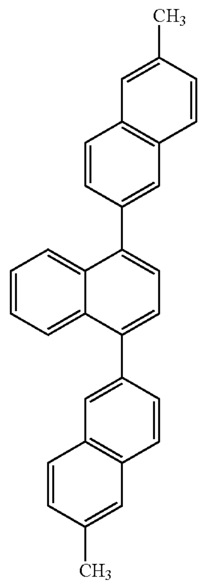
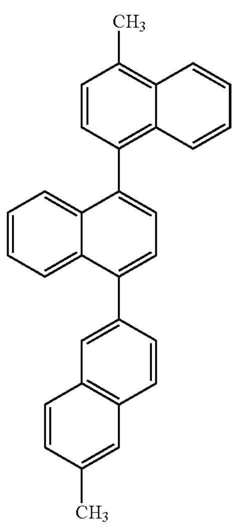
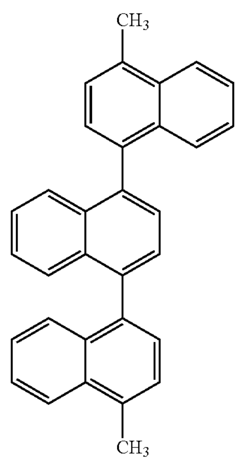
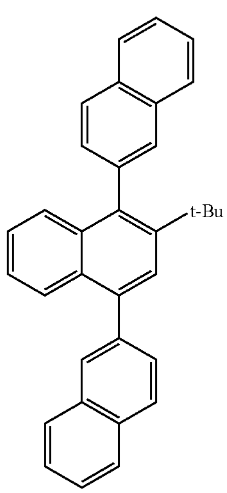
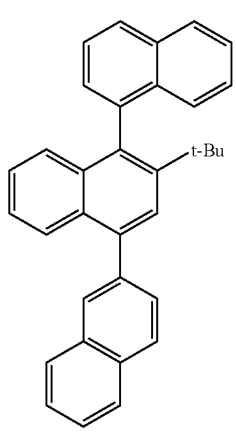
-continued
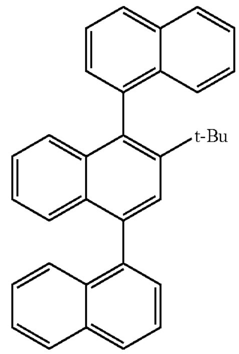
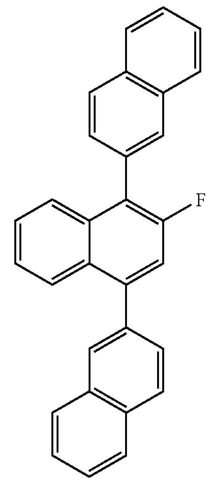
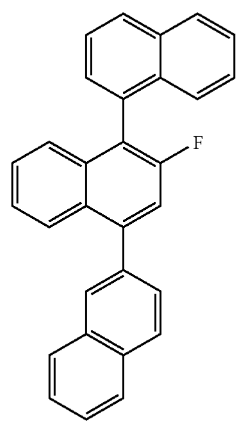
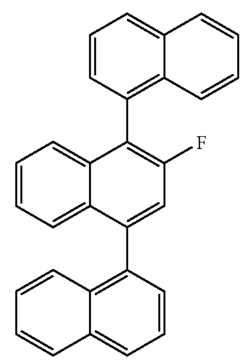
[Chemical Formula 49]
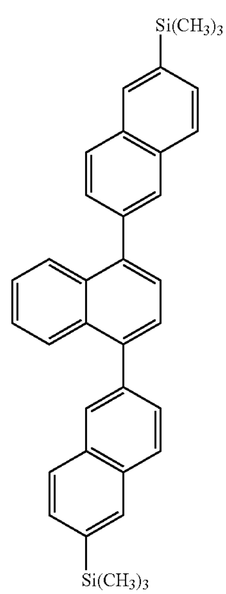
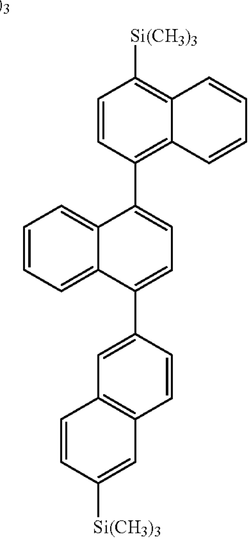

-continued
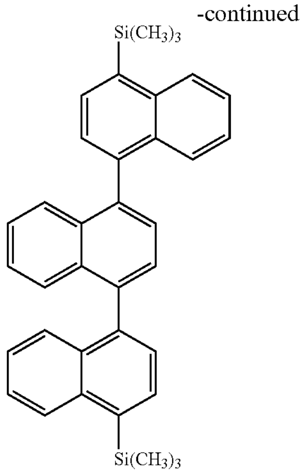
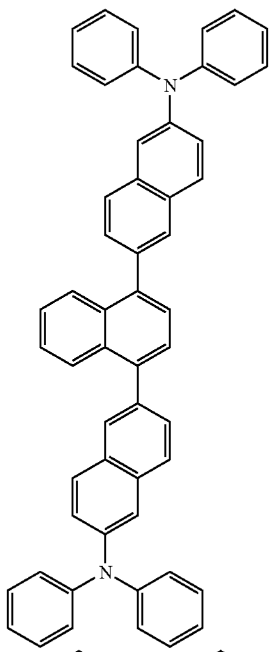
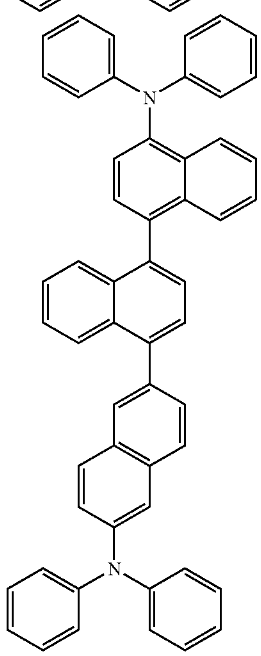
-continued
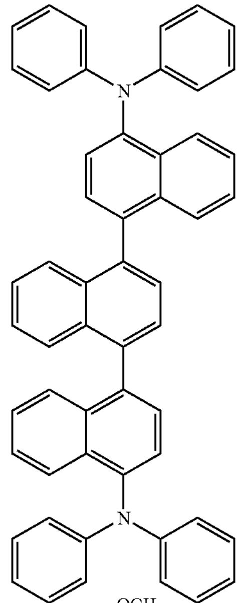
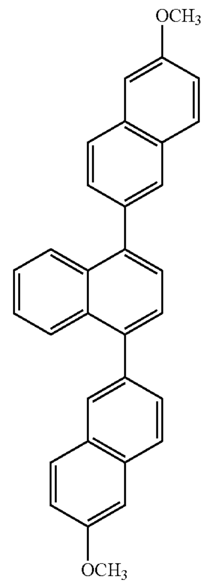
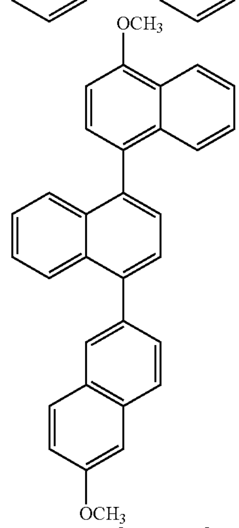
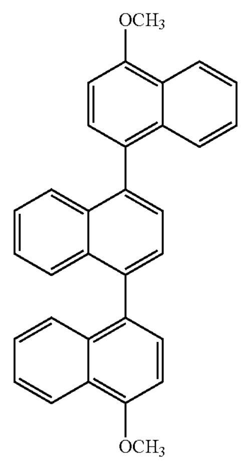
[Chemical Formula 50]
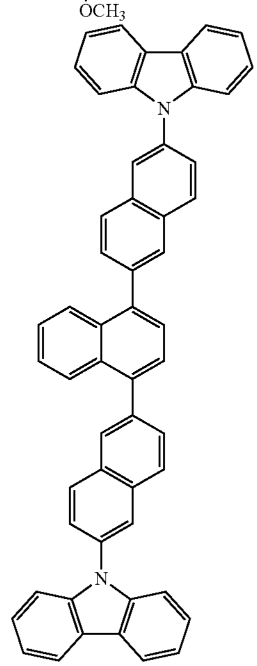

-continued
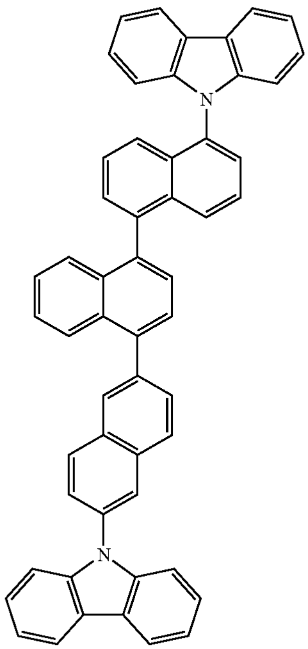
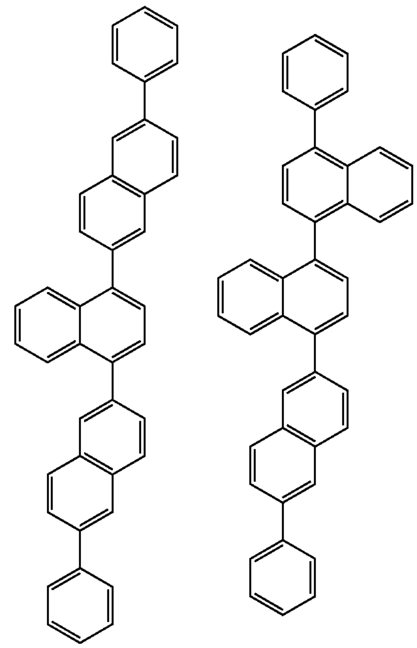
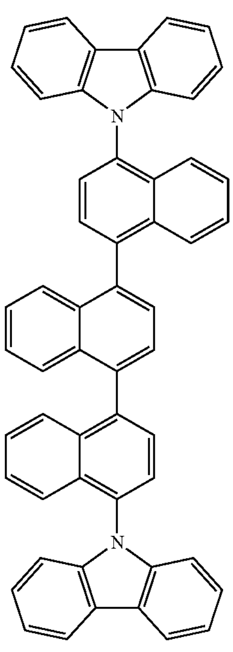
-continued
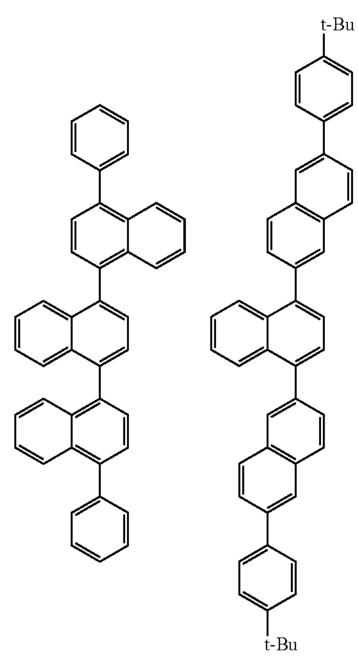

-continued
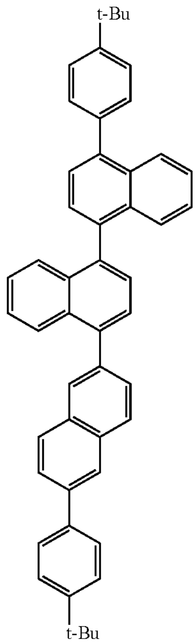
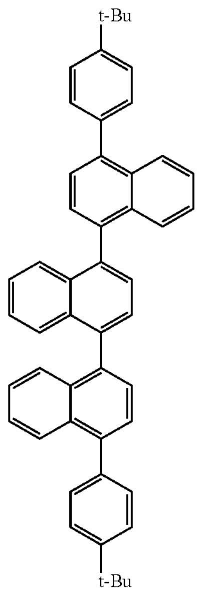
-continued
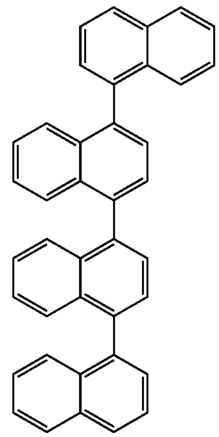
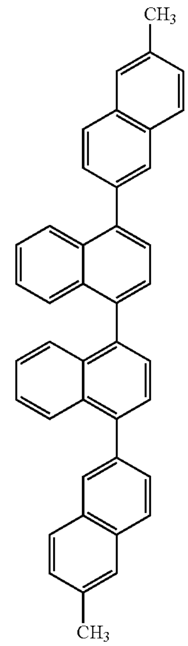
[Chemical Formula 51]
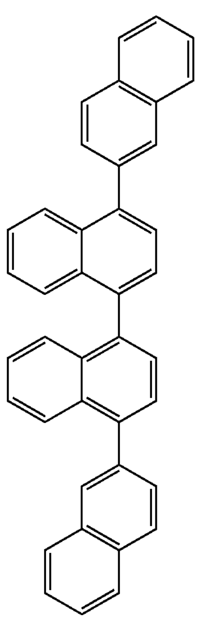
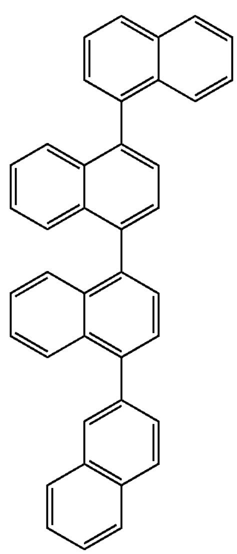
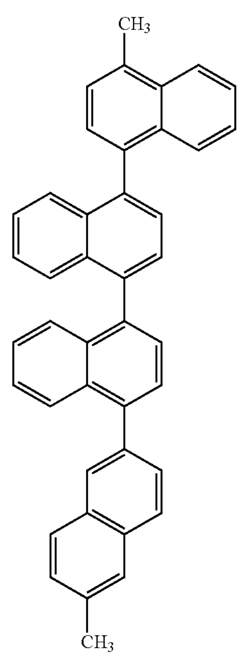
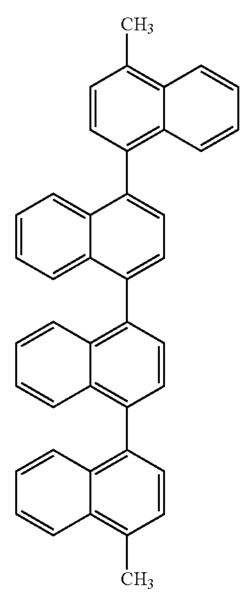

-continued
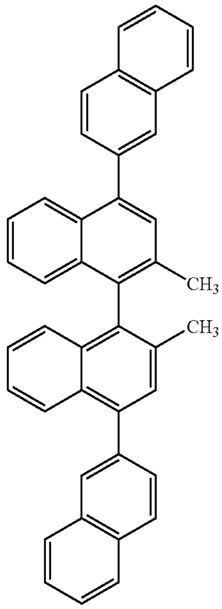
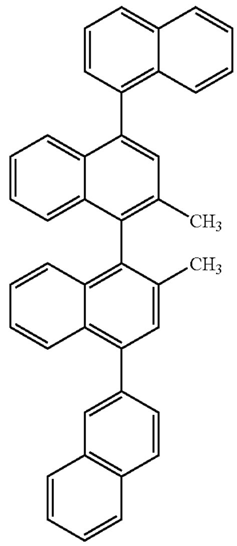
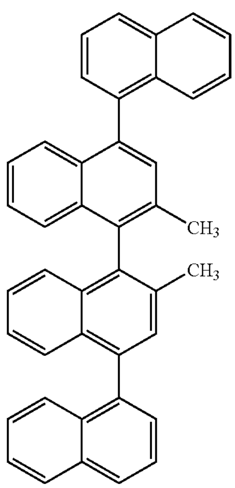
[Chemical Formula 52]
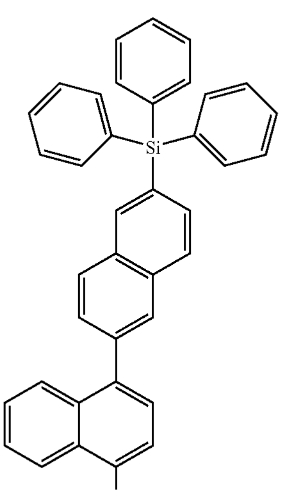
-continued
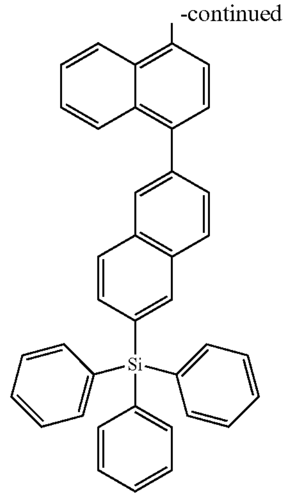
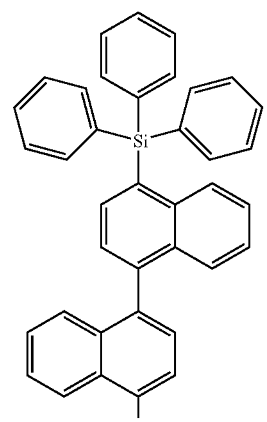
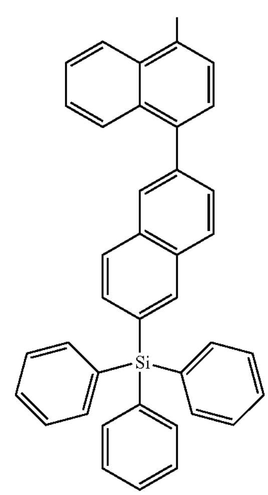

-continued
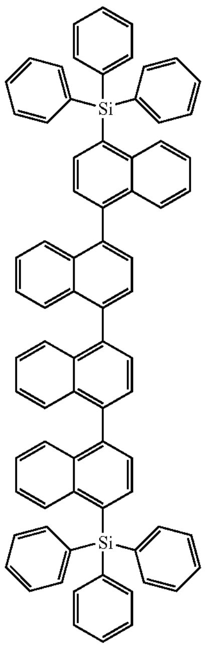
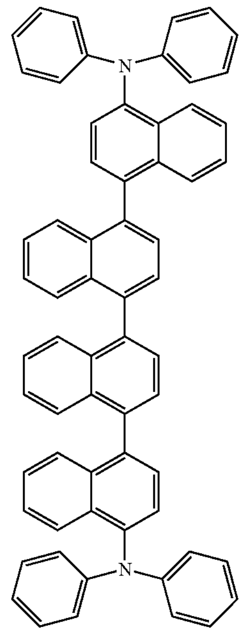
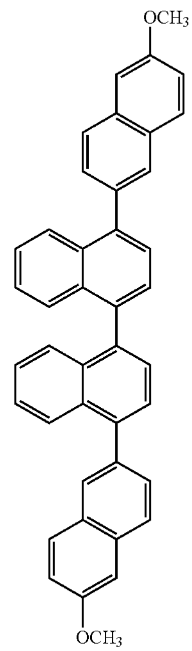
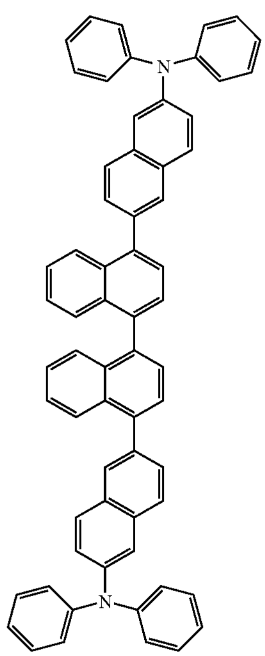
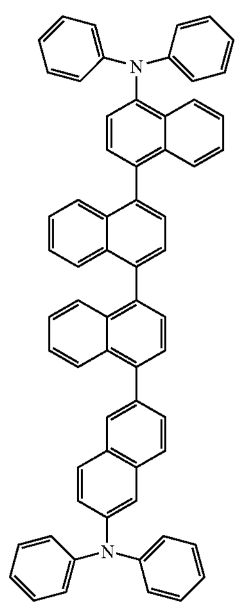
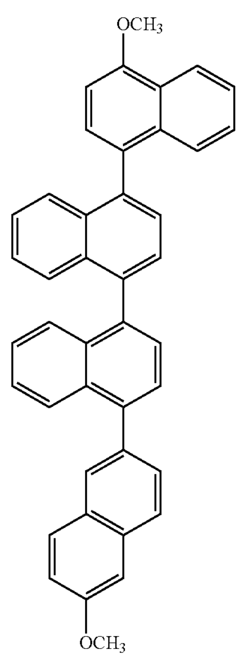
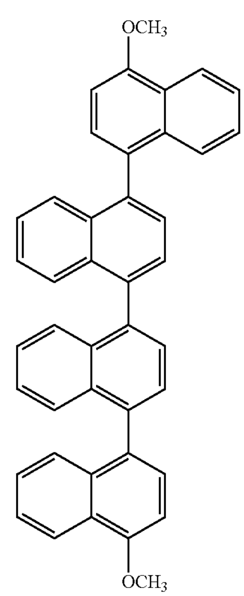

-continued
[Chemical Formula 53]
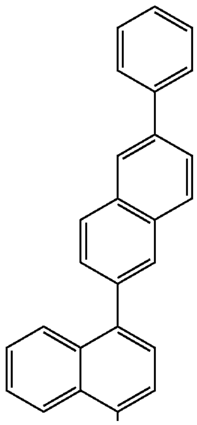
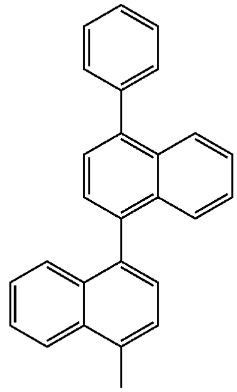
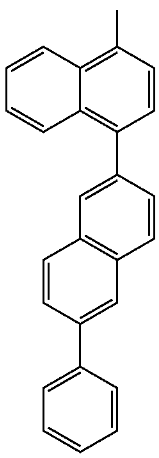
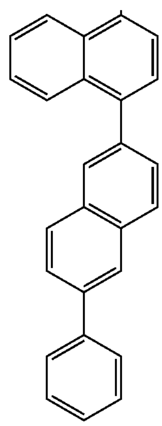
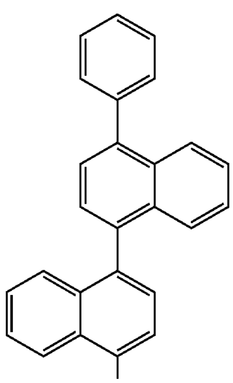
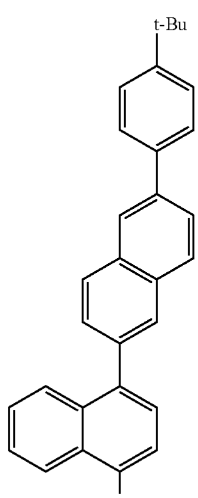
-continued
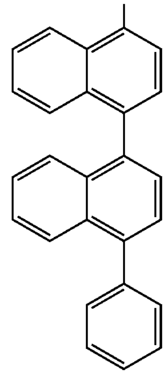
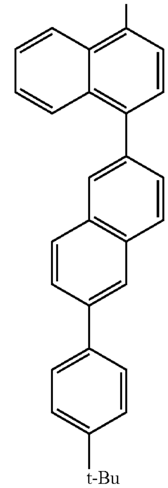
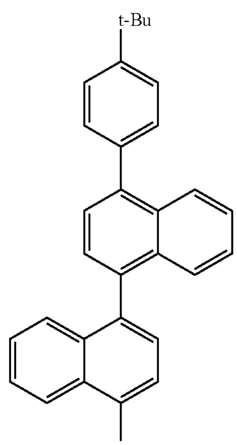
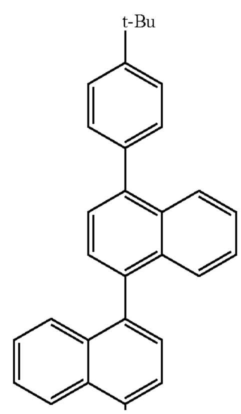
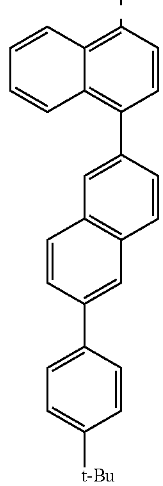
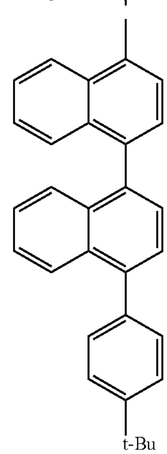

-continued
[Chemical Formula 54]
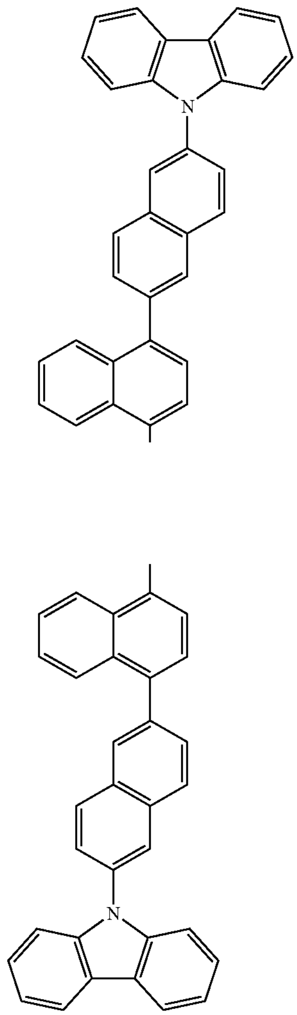
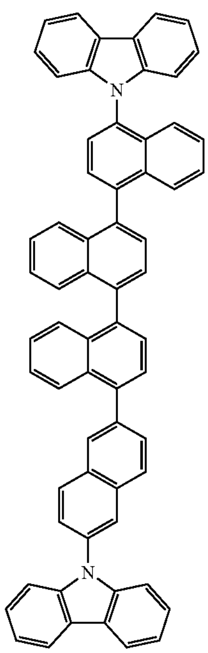
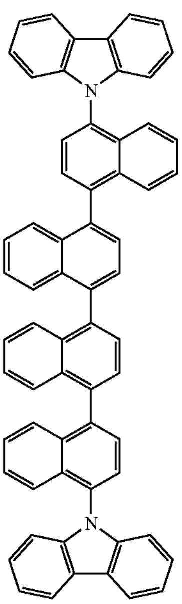
-continued
[Chemical Formula 55]
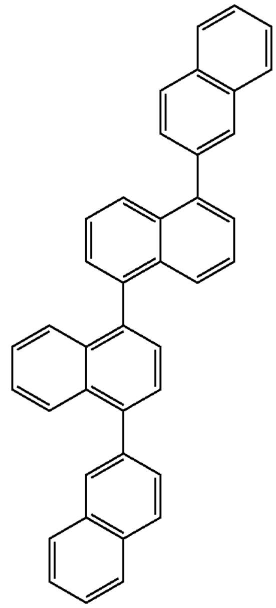
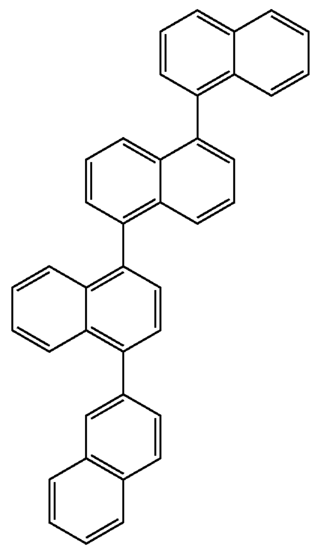
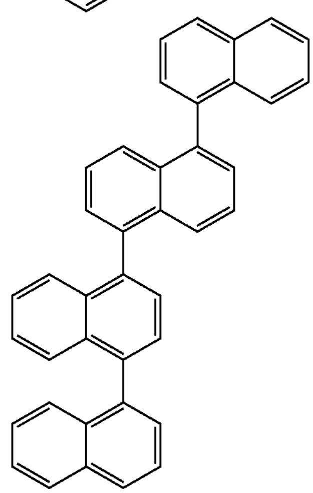

-continued
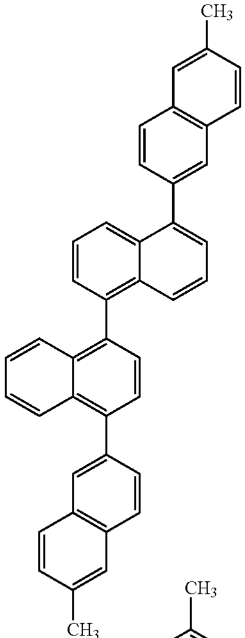
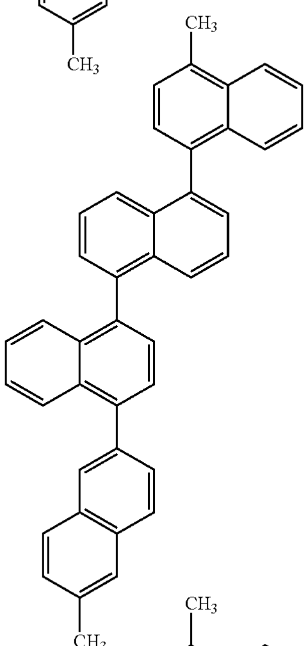
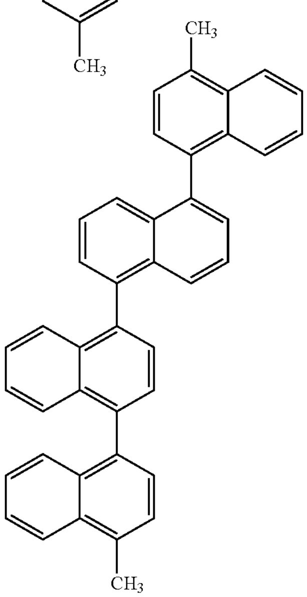
-continued
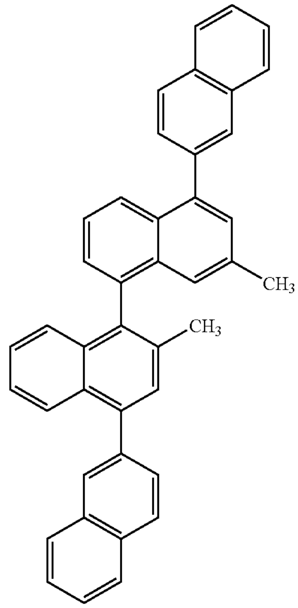
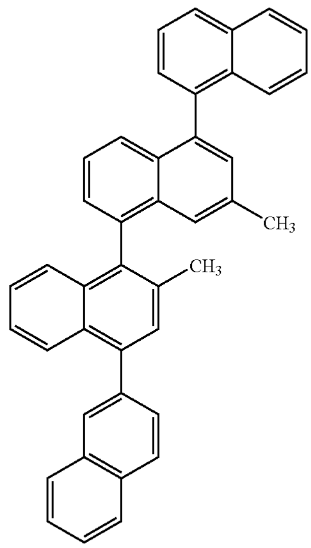
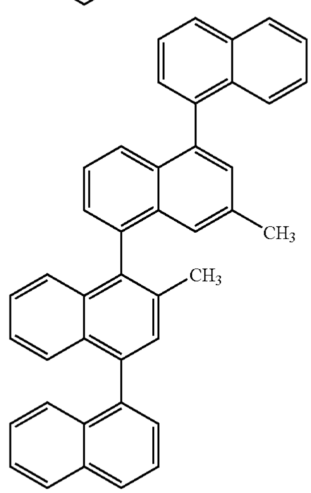

-continued
[Chemical Formula 56]
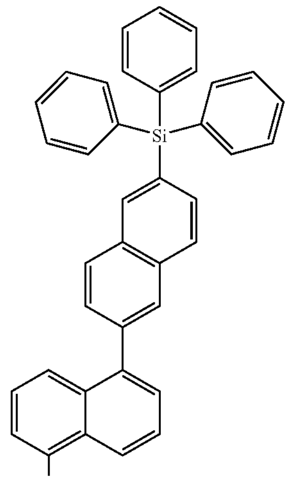
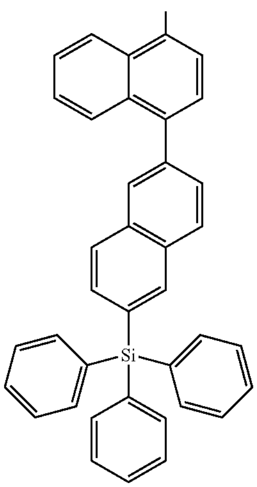
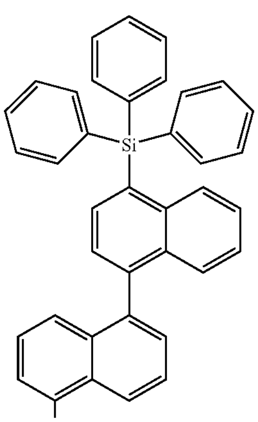
-continued
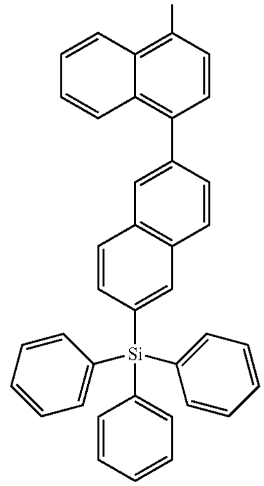
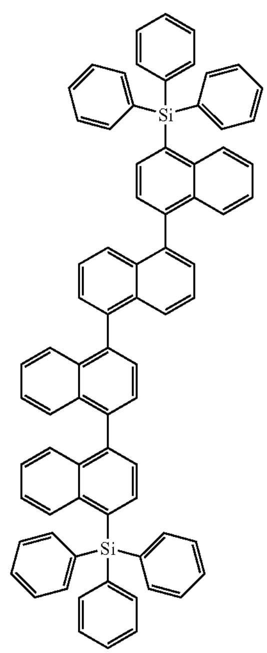

-continued
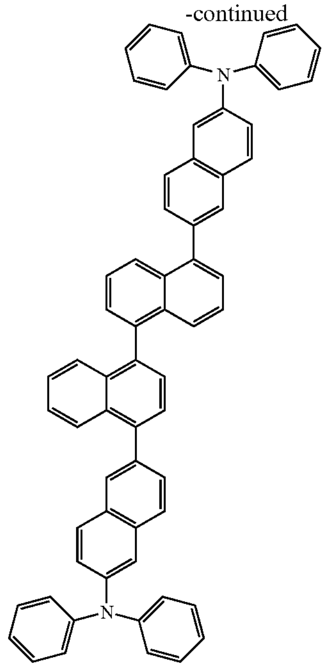
-continued
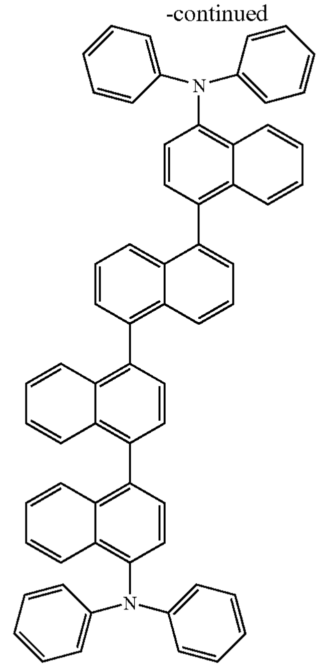
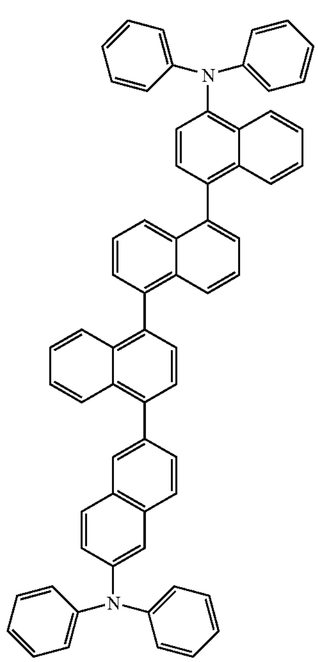
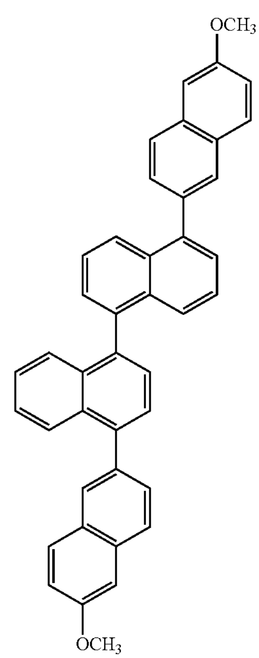

-continued
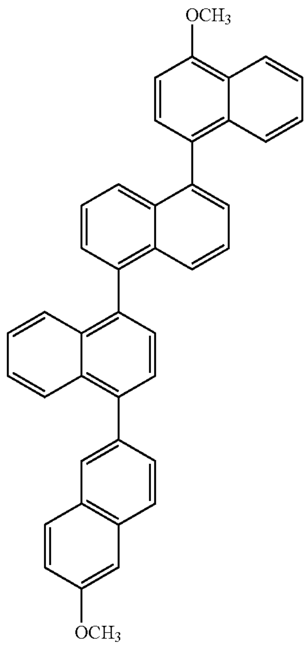
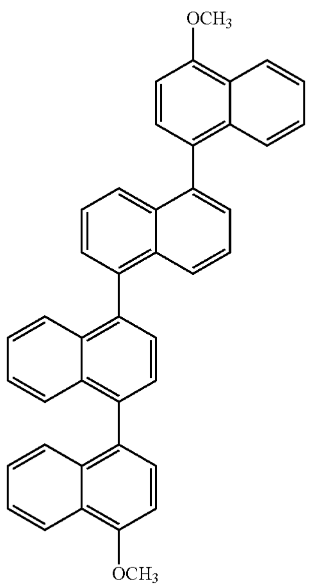
[Chemical Formula 57]
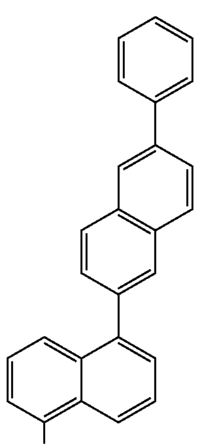
-continued
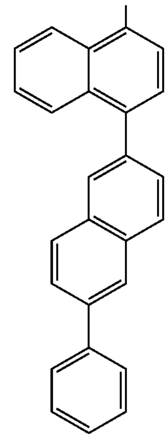
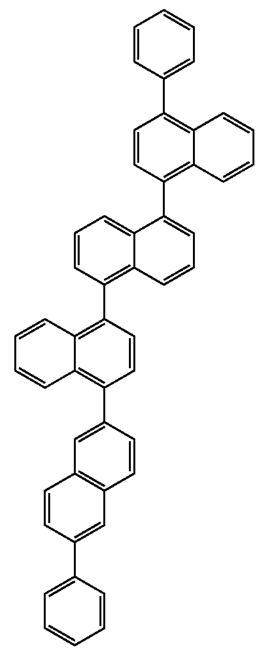
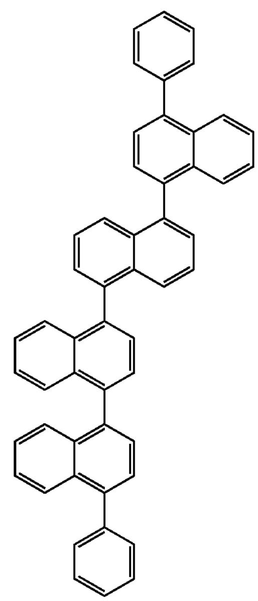
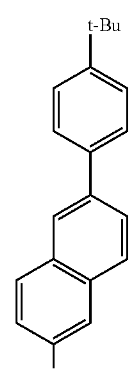

-continued

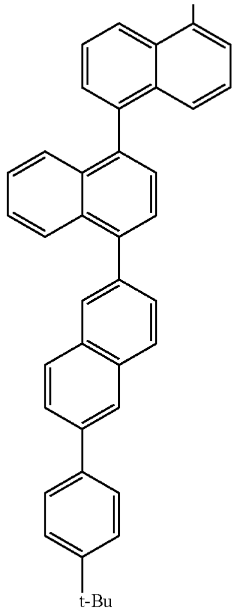

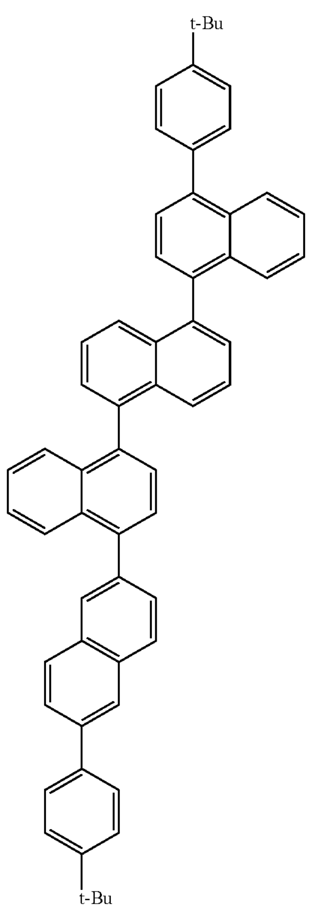

-continued

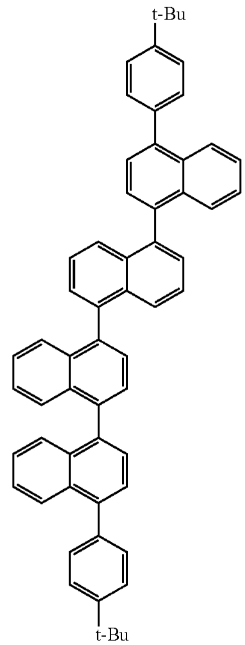

The oligonaphthalene derivative may be represented by the following formula (82).

[Chemical Formula 58]

(82)

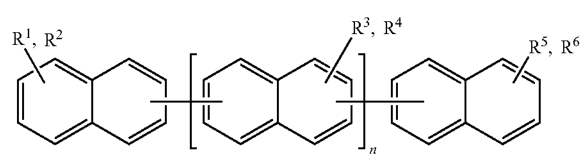

In the formula, $R^1$ to $R^6$ each are an independent group suitably selected from the group consisting of hydrogen, alkoxy group having 1 to 4 carbon atoms, alkyl group having 1 to 4 carbon atoms and substituted or unsubstituted amino group. n is an integer of 2 to 4.

Examples of such an oligonaphthalene compound are those represented by the following formulae.
[Chemical Formula 59]
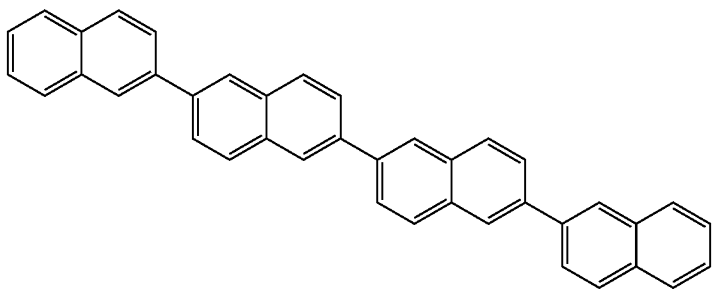
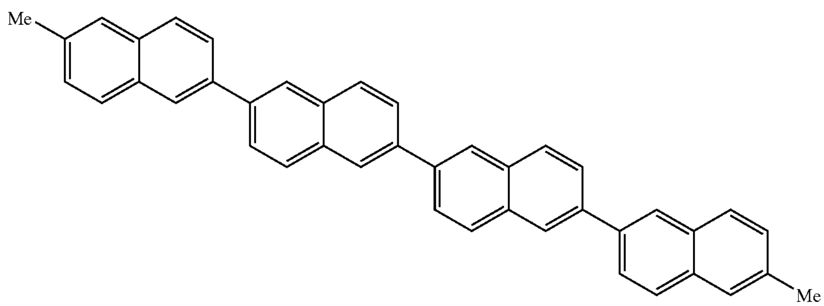
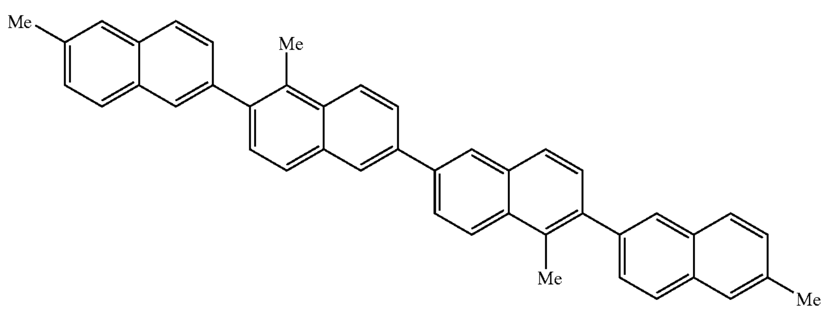
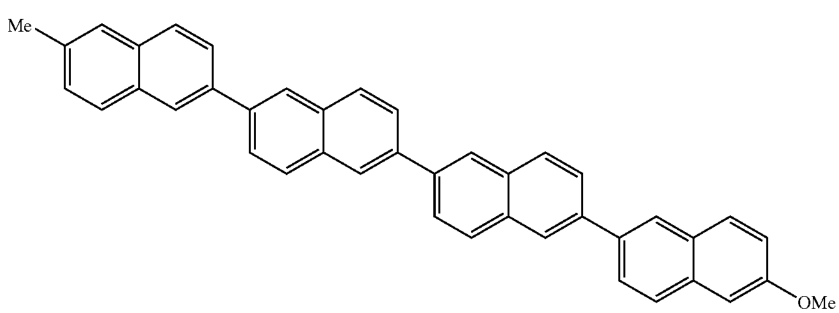

-continued

[Chemical Formula 60]

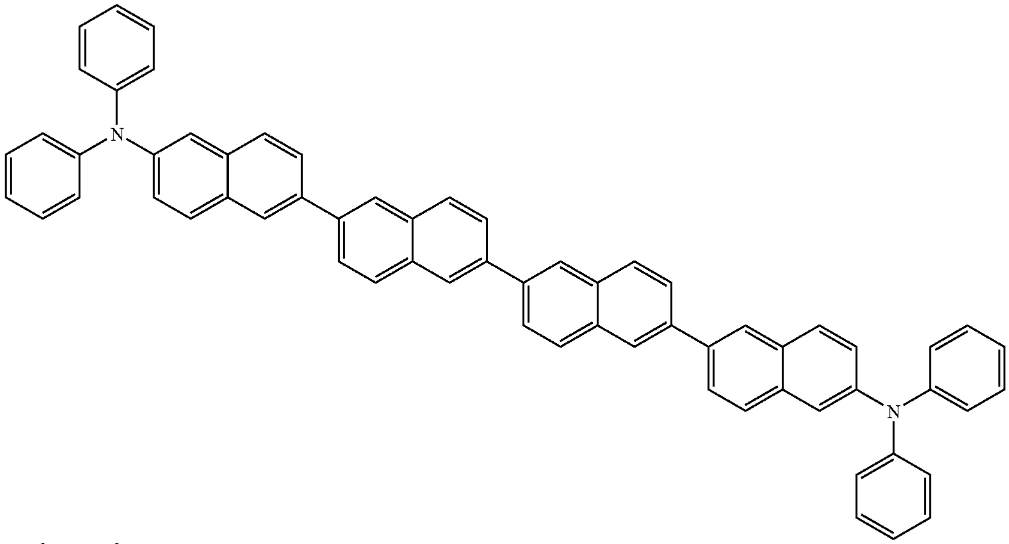

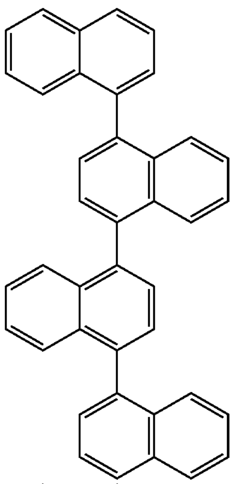

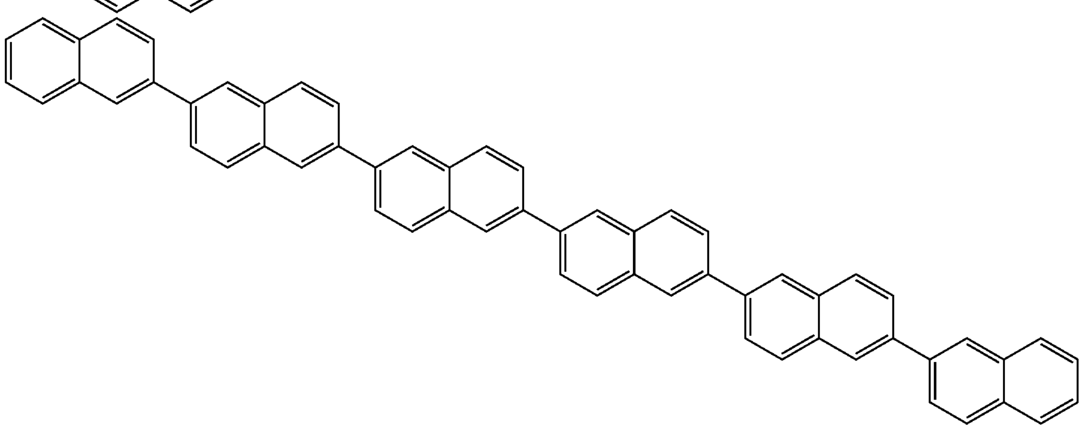

Examples of the compounds having the polycyclic fused aromatic skeleton are shown below.

$$R^{1a}—Ar^{11}—Ar^{12}—Ar^{13}—R^{1b} \quad (21)$$

In the formula (21), $R^{1a}$, $R^{1b}$, $Ar^{11}$, $Ar^{12}$ and $Ar^{13}$ each represent a substituted or unsubstituted benzene ring or a substituted or unsubstituted fused aromatic hydrocarbon group selected from the group consisting of naphthalene ring, chrysene ring, fluoranthene ring, triphenylene ring, phenanthrene ring, benzophenanthrene ring, dibenzophenanthrene ring, benzotriphenylene ring, benzo[b]fluoranthene ring, benzochrysene ring, and picene ring.

When $Ar^{12}$ is a substituted or unsubstituted benzene ring or a substituted or unsubstituted 2,7-phenanthrene-diyl group or triphenylene ring, [$R^{1a}$—$Ar^{11}$—] and [$R^{1b}$—$Ar^{13}$—] are differently structured groups.

$$R^{2a}—Ar^{21}—Ar^{22}—R^{2b} \quad (22)$$

In the formula (22), $R^{2a}$ and $Ar^{21}$ each represent a substituted or unsubstituted naphthalene ring.

$R^{2b}$ represents a substituted or unsubstituted fused aromatic hydrocarbon group selected from the group consisting of a phenanthrene ring, a triphenylene ring, a benzophenanthrene ring, a dibenzophenanthrene ring, a benzotriphenylene ring, a fluoranthene ring, a benzochrysene ring and a picene ring.

$Ar^{22}$ represents a substituted or unsubstituted fused aromatic hydrocarbon group selected from the group consisting of a benzene ring, a naphthalene ring, a chrysene ring, a fluoranthene ring, a triphenylene ring, a benzophenanthrene ring, a dibenzophenanthrene ring, a benzotriphenylene ring, a benzochrysene ring, a benzo[b]fluoranthene ring and a picene ring.

Substituents for $R^{2a}$ and $R^{2b}$ are not aryl groups. Substituents for $Ar^{21}$ and $Ar^{22}$ are not aryl groups when $Ar^{21}$ or $Ar^{22}$ represents a naphthalene ring.

[Chemical Formula 61]

(22-1)

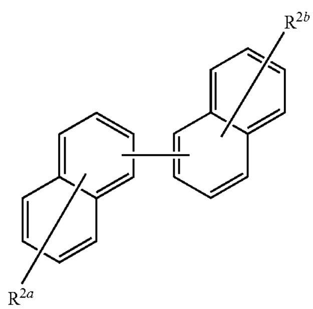

In the formula (22-1), $R^{2a}$ and $R^{2b}$ each represents a substituted or unsubstituted fused aromatic hydrocarbon group selected from the group consisting of a phenanthrene ring, a triphenylene ring, a benzophenanthrene ring, a dibenzophenanthrene ring, a benzotriphenylene ring, a benzo[b] fluoranthene ring, a fluoranthene ring, a benzochrysene ring and a picene ring.

Substituents for $R^{2a}$, $R^{2b}$, $Ar^{21}$ and $Ar^{22}$ are not aryl groups.

[Chemical Formula 62]

(23)

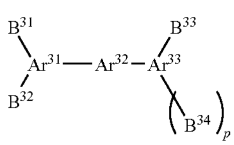

In the formula (23), when one or more of $Ar^{31}$, $Ar^{32}$, $Ar^{33}$, $B^{31}$, $B^{32}$, $B^{33}$ and $B^{34}$ has a single or plural substituent(s), the substituent(s) is preferably an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom. A substituent for $Ar^{32}$ may also be an aryl group having 6 to 22 carbon atoms.

Since the substituent(s) contains no nitrogen atom, the stability of the host material can be further enhanced, and the lifetime of the device can be prolonged.

The number of plural aryl substituents for $Ar^{32}$ is preferably 2 or less, more preferably 1 or less.

Examples of the alkyl group having 1 to 20 carbon atoms are a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neo-pentyl group, a 1-methylpentyl group, 2-methylpentyl group, a 1-pentylhexyl group, a 1-butylpentyl group, a 1-heptyloctyl group and 3-methylpentyl group.

Examples of the haloalkyl group having 1 to 20 carbon atoms are chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group and 1,2,3-triiodopropyl group.

Examples of the cycloalkyl group having 5 to 18 carbon atoms are cyclopentyl group, cyclohexyl group, cyclooctyl group, and 3,5-tetramethylcyclohexyl group, among which cyclohexyl group, cyclooctyl group and 3,5-tetramethylcyclohexyl group are preferable.

The silyl group having 3 to 20 carbon atoms is preferably an alkylsilyl group, an arylsilyl group or an aralkylsilyl group, examples of which are trimethylsilyl group, triethylsilyl group, tributylsilyl group, trioctylsilyl group, triisobutylsilyl group, dimethylethylsilyl group, dimethylisopropylsilyl group, dimethylpropylsilyl group, dimethylbutylsilyl group, dimethyltertiarybutylsilyl group, diethylisopropylsilyl group, phenyldimethylsilyl group, diphenylmethylsilyl group, diphenyltertiarybutylsilyl group and triphenylsilyl group.

Examples of the halogen atom are a fluorine atom, a chlorine atom, a bromine atom and an iodine atom.

The aryl substitute having 6 to 22 carbon atoms is preferably phenyl group, biphenyl group, terphenyl group, naphthyl group, chrysenyl group, fluoranthenyl group, 9,10-dialkylfluorenyl group, 9,10-diarylfluorenyl group, triphenylenyl group, phenanthrenyl group, benzophenanthrenyl group, dibenzophenanthrenyl group, benzotriphenylenyl group, benzochrysenyl group or dibenzofuranyl group, more preferably phenyl group having 6 to 18 carbon atoms, biphenyl group, terphenyl group, naphthyl group, chrysenyl group, fluoranthenyl group, 9,10-dimethylfluorenyl group, triphenylenyl group, phenanthrenyl group, benzophenanthrenyl group or dibenzofuranyl group, much more preferably a phenyl group having 6 to 14 carbon atoms, biphenyl group, naphthyl group, phenanthrenyl group or dibenzofuranyl group.

$$R^{4a}—Ar^{41}—R^{4b} \quad (24)$$

When $R^{4a}$, $R^{4b}$ and $Ar^{41}$ in the formula (24) have a single or plural substituent(s), the substituent(s) is preferably an alkyl group having 1 to 20 carbon atoms, a haloalkyl group having 1 to 20 carbon atoms, a cycloalkyl group having 5 to 18 carbon atoms, a silyl group having 3 to 20 carbon atoms, a cyano group or a halogen atom. A substituent for $Ar^{41}$ may also be an aryl group having 6 to 22 carbon atoms.

Since the substituent(s) contains no nitrogen atom, the stability of the host material can be further enhanced, and the lifetime of the device can be prolonged.

The number of plural aryl substituents for $Ar^{41}$ is preferably 2 or less, more preferably 1 or less.

Examples of the alkyl group having 1 to 20 carbon atoms are a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neo-pentyl group, a 1-methylpentyl group, 2-methylpentyl group, a 1-pentylhexyl group, a 1-butylpentyl group, a 1-heptyloctyl group and 3-methylpentyl group.

Examples of the haloalkyl group having 1 to 20 carbon atoms are chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group and 1,2,3-triiodopropyl group.

Examples of the cycloalkyl group having 5 to 18 carbon atoms are cyclopentyl group, cyclohexyl group, cyclooctyl group, and 3,5-tetramethylcyclohexyl group, among which cyclohexyl group, cyclooctyl group and 3,5-tetramethylcyclohexyl group are preferable.

The silyl group having 3 to 20 carbon atoms is preferably an alkylsilyl group, an arylsilyl group or an aralkylsilyl group, examples of which are trimethylsilyl group, triethylsilyl group, tributylsilyl group, trioctylsilyl group, triisobutylsilyl group, dimethylethylsilyl group, dimethylisopropylsilyl group, dimethylpropylsilyl group, dimethylbutylsilyl group, dimethyltertiarybutylsilyl group, diethylisopropylsilyl group, phenyldimethylsilyl group, diphenylmethylsilyl group, diphenyltertiarybutylsilyl group and triphenylsilyl group.

Examples of the halogen atom are a fluorine atom, a chlorine atom, a bromine atom and an iodine atom.

The aryl substitute having 6 to 22 carbon atoms is preferably phenyl group, biphenyl group, terphenyl group, naphthyl group, chrysenyl group, fluoranthenyl group, 9,10-dialkylfluorenyl group, 9,10-diarylfluorenyl group, triphenylenyl group, phenanthrenyl group, benzophenanthrenyl group, dibenzophenanthrenyl group, benzotriphenylenyl group, benzochrysenyl group or dibenzofuranyl group, more preferably phenyl group having 6 to 18 carbon atoms, biphenyl group, terphenyl group, naphthyl group, chrysenyl group, fluoranthenyl group, 9,10-dimethylfluorenyl group, triphenylenyl group, phenanthrenyl group, benzophenanthrenyl group or dibenzofuranyl group, much more preferably a phenyl group having 6 to 14 carbon atoms, biphenyl group, naphthyl group, phenanthrenyl group or dibenzofuranyl group.

In the aspect of the invention, the fluorescent host preferably has a triplet energy gap of 2.10 eV to 2.70 eV, and the polycyclic fused aromatic skeleton preferably has 14 to 30 ring atoms.

According to the above structure, the fluorescent host has high stability, so that the singlet energy and triplet energy can be transferred smoothly. Thus, the luminous efficiency can be enhanced and the long lifetime can be obtained.

The molecular stability is not sufficiently enhanced when the number of the ring-forming atoms in the skeleton is too small, and thus the number of the ring-forming atoms is set at 14 or more. On the other hand, since a HOMO-LUMO gap is so much narrowed that the triplet energy gap becomes insufficient for a useful emission wavelength when the number of the rings in the polycyclic fused aromatic ring is too large, the number of the ring-forming atoms is set at 30 or less.

Accordingly, it is possible to obtain a favorable material for exciting the first phosphorescent dopant material that exhibits useful emission wavelength.

By using a polycyclic fused aromatic series having a triplet energy gap of a predetermined level or more, the first phosphorescent dopant can provide emission of a useful wavelength.

The use of the polycyclic fused aromatic ring host restricts the upper limit of the triplet energy, and it is thus unsuitable for transferring energy to the first phosphorescent dopant for emission of a short wavelength. However, the polycyclic fused aromatic ring host is also favorably applicable as a host for a fluorescent dopant, and thus the use of the polycyclic fused aromatic ring host in the fluorescent material can provide emission of a short wavelength.

Accordingly, the aspect of the invention can realize an organic EL device having long lifetime and capable of providing mixed-color emission at high efficiency.

In the aspect of the invention, the polycyclic fused aromatic skeleton preferably has no substituent having a carbazole skeleton.

When a group having a carbazole skeleton is introduced, a triplet energy gap is widened due to increase in ionization potential, and thus such a material becomes applicable as a host for a phosphorescent dopant for emission of a shorter wavelength. However, introduction of a carbazole group, which is typically vulnerable to oxidation, may unfavorably lead to shorter lifetime. Accordingly, introduction of the carbazole skeleton needs consideration in a structure of a device and manufacturing thereof.

In this respect, in the fluorescent host contained in the fluorescent-emitting layer of the organic EL device according to the aspect of the invention, by excluding a carbazole group from candidates for the substituent, the lifetime can be prolonged although the triplet energy gap is narrowed.

According to the aspect of the invention, the fluorescent-emitting layer may also preferably contain an assistance material for assisting injection of charges.

When the fluorescent-emitting layer is formed of such a host material having an energy gap as described above, a difference in ionization potential (Ip) between the host material and the hole injecting/transporting layer etc. becomes so large that the holes can hardly be injected into the fluorescent-emitting layer and that a driving voltage required for providing sufficient luminance may be raised.

In the above instance, introducing a hole-injectable or hole-transportable assistance substance for assisting injection of charges in the fluorescent-emitting layer can contribute to facilitation of the injection of the holes into the fluorescent-emitting layer and to reduction of the driving voltage.

As the assistance material for assisting the injection of charges, for instance, a typical hole injecting/transporting material or the like can be used.

The examples are a triazole derivative (see, for instance, the specification of U.S. Pat. No. 3,112,197), an oxadiazole derivative (see, for instance, the specification of U.S. Pat. No. 3,189,447), an imidazole derivative (see, for instance, JP-B-37-16096), a polyarylalkane derivative (see, for instance, the specifications of U.S. Pat. No. 3,615,402, No. 3,820,989 and No. 3,542,544, JP-B-45-555, JP-B-51-10983, JP-A-51-93224, JP-A-55-17105, JP-A-56-4148, JP-A-55-108667, JP-A-55-156953, and JP-A-56-36656), a pyrazoline derivative and a pyrazolone derivative (see, for instance, the specifications of U.S. Pat. No. 3,180,729 and No. 4,278,746, JP-A-55-88064, JP-A-55-88065, JP-49-105537, JP-A-55-51086, JP-A-56-80051, JP-A-56-88141, JP-A-57-45545, JP-A-54-112637 and JP-A-55-74546), a phenylenediamine derivative (see, for instance, the specification of U.S. Pat. No. 3,615,404, JP-B-51-10105, JP-B-46-3712, JP-B-47-25336, JP-A-54-53435, JP-A-54-110536 and JP-A-54-119925), an arylamine derivative (see, for instance, the specifications of U.S. Pat. No. 3,567,450, No. 3,180,703, No. 3,240,597, No. 3,658,520, No. 4,232,103, No. 4,175,961 and No. 4,012,376, JP-B-49-35702, JP-B-39-27577, JP-A-55-144250, JP-A-56-119132 and JP-A-56-22437 and the specification of West Germany Patent No. 1,110,518), an amino-substituted chalcone derivative (see, for instance, the specification of U.S. Pat. No. 3,526,501), an oxazole derivative (disclosed in, for instance, the specification of U.S. Pat. No. 3,257,203), a styrylanthracene derivative (see, for instance, JP-A-56-46234), a fluorenone derivative (see, for instance, JP-A-54-110837), a hydrazone derivative (see, for instance, the specification of U.S. Pat. No. 3,717,462 and JP-A-54-59143, JP-A-55-52063, JP-A-55-52064, JP-A-55-46760, JP-A-55-85495, JP-A-57-11350, JP-A-57-148749 and JP-A-02-311591), a stilbene derivative (see, for instance, JP-A-61-210363, JP-A-61-228451, JP-A-61-14642, JP-A-61-72255, JP-A-62-47646, JP-A-62-36674, JP-A-62-10652, JP-A-62-30255, JP-A-60-93455, JP-A-60-94462, JP-A-60-174749 and JP-A-60-175052), a silazane derivative (see the specification of U.S. Pat. No. 4,950,950), a polysilane type (see JP-A-02-204996), an aniline-based copolymer (see JP-A-02-282263), and a conductive polymer oligomer (particularly, thiophene oligomer) disclosed in JP-A-01-211399.

The hole-injectable material, examples of which are as listed above, is preferably a porphyrin compound (disclosed in JP-A-63-295695 etc.), an aromatic tertiary amine compound or a styrylamine compound (see, for instance, the specification of U.S. Pat. No. 4,127,412, JP-A-53-27033, JP-A-54-58445, JP-A-54-149634, JP-A-54-64299, JP-A-55-79450, JP-A-55-144250, JP-A-56-119132, JP-A-61-295558, JP-A-61-98353 or JP-A-63-295695), particularly preferably an aromatic tertiary amine compound.

In addition, 4,4'-bis(N-(1-naphthyl)-N-phenylamino)biphenyl (hereinafter, abbreviated as NPD) having in the molecule two fused aromatic rings disclosed in U.S. Pat. No. 5,061,569, 4,4',4"-tris(N-(3-methylphenyl)-N-phenylamino) triphenylamine (hereinafter, abbreviated as MTDATA) in which three triphenylamine units disclosed in JP-A-04-308688 are bonded in a starbust form and the like may also be used.

Further, a hexaazartriphenylene derivative disclosed in Japanese Patent No. 3614405 and No. 3571977 and U.S. Pat. No. 4,780,536 may also preferably be used as the hole-injecting material.

Alternatively, inorganic compounds such as p-type Si and p-type SiC can also be used as the hole-injecting material.

The hole injecting layer and hole transporting layer help injection of the holes into the emitting layer and transport the holes into the emitting region, in which the hole mobility is large and the energy of ionization is typically small (5.5 eV or smaller). The hole injecting layer and hole transporting layer are preferably made of materials capable of transporting the holes into the emitting layer with a low field intensity, and are more preferably made of materials capable of transporting the holes with the hole mobility of, for example, $10^{-4}$ $cm^2/V/sec$ or more when the electrical field of $10^4$ to $10^6$ V/cm is applied.

The material used for the hole injecting layer and hole transporting layer are not specifically limited. Any material typically used for transporting charges of the holes in photoconducting materials or any material known to be applicable to the hole injecting layer and hole transporting layer of the organic EL device may be used.

For the hole injecting layer and the hole transporting layer, for instance, an aromatic amine derivative represented by the following formula is usable.

[Chemical Formula 63]

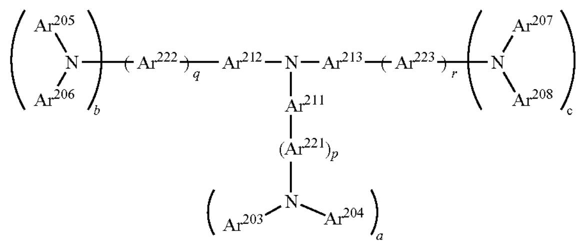

In the formula, $Ar^{211}$ to $Ar^{213}$ and $Ar^{221}$ to $Ar^{223}$ each represent a substituted or unsubstituted arylene group having 6 to 50 ring carbon atoms or a substituted or unsubstituted heteroarylene group having 5 to 50 ring atoms. $Ar^{203}$ to $Ar^{208}$ each represent a substituted or unsubstituted aryl group having 6 to 50 ring carbon atoms or a substituted or unsubstituted heteroaryl group having 5 to 50 ring atoms. a to c and p to r each represent an integer of 0 to 3. $Ar^{203}$ and $Ar^{204}$, $Ar^{205}$ and $Ar^{206}$, and $Ar^{207}$ and $Ar^{208}$ may be respectively linked together to form saturated or unsaturated rings.

Examples of the substituted or unsubstituted aryl group having 6 to 50 ring carbon atoms are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group and the like.

Examples of the substituted or unsubstituted arylene group having 6 to 50 ring carbon atoms include a group derived by removing 1 hydrogen atom from the aryl group.

Examples of the substituted or unsubstituted heteroaryl group having 5 to 50 ring atoms are a 1-pyroryl group, 2-pyroryl group, 3-pyroryl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group and the like.

Examples of the substituted or unsubstituted heteroarylene group having 6 to 50 ring carbon atoms are a group derived by removing 1 hydrogen atom from the heteroaryl group and the like.

Further, the hole injecting layer and the hole transporting layer may contain a compound represented by the following formula.

[Chemical Formula 64]

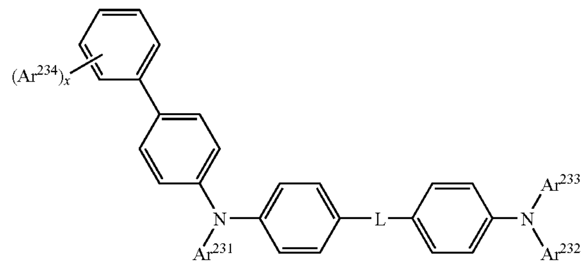

In the formula, $Ar^{231}$ to $Ar^{234}$ each represent a substituted or unsubstituted aryl group having 6 to 50 ring carbon atoms or a substituted or unsubstituted heteroaryl group having 5 to 50 ring atoms. L is a bonding group, and is a single bond, a substituted or unsubstituted arylene group having 6 to 50 ring carbon atoms or a substituted or unsubstituted heteroarylene group having 5 to 50 ring atoms. x is an integer of 0 to 5.

$Ar^{232}$ and $Ar^{233}$ may be bonded together to form a saturated or unsaturated ring. Examples of the substituted or unsubstituted aryl group and arylene group each having 6 to 50 ring carbon atoms, or the substituted or unsubstituted heteroaryl group and heteroarylene group each having 5 to 50 ring atoms are the same as described above.

Examples of the materials for the hole injecting layer and hole transporting layer are triazole derivative, oxadiazole derivative, imidazole derivative, polyarylalkane derivative, pyrazoline derivative, pyrazolone derivative, phenylenediamine derivative, arylamine derivative, amino-substituted chalcone derivative, oxazole derivative, styrylanthracene derivative, fluorenone derivative, hydrazone derivative, stilbene derivative, silazane derivative, aniline copolymer, conductive high-molecular oligomer (especially thiophene oligomer) and the like.

While the above materials are usable for the hole injecting layer and the hole transporting layer, porphyrin compounds, aromatic tertiary amine compounds and styrylamine compounds are preferable, among which aromatic tertiary amine compounds are particularly preferable.

In addition, the compound which contains two fused aromatic rings within the molecule, for example, NPD, 4,4',4"-tris(N-(3-methylphenyl)-N-phenylamino) triphenylamine (hereinafter, abbreviated as MTDATA) in which three triphenylamine units are bonded in a starbust form, may be preferably used.

In addition, a nitrogen-containing heterocyclic derivative represented by the following formula is also usable.

[Chemical Formula 65]

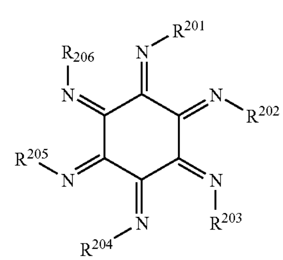

In the above formula, $R^{201}$ to $R^{206}$ each represent a substituted or unsubstituted alkyl group having 1 to 50 carbon atoms, a substituted or unsubstituted aryl group having 6 to 50 ring carbon atoms, a substituted or unsubstituted aralkyl group having 7 to 50 carbon atoms, or a substituted or unsubstituted heterocyclic group having 5 to 50 ring atoms. $R^{201}$ and $R^{202}$, $R^{203}$ and $R^{204}$, $R^{205}$ and $R^{206}$, $R^{201}$ and $R^{206}$, $R^{202}$ and $R^{203}$, or $R^{204}$ and $R^{205}$ may form a fused ring.

Further, the compound represented by the following formula is also usable.

[Chemical Formula 66]

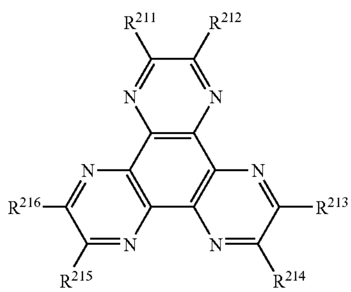

$R^{211}$ to $R^{216}$ each represent a substituent, a preferable example of which is an electron-attracting group such as a cyano group, a nitro group, a sulfonyl group, a carbonyl group, a trifluoromethyl group and halogen.

Alternatively, inorganic compounds such as p-type Si and p-type SiC can also be used as the materials for the hole injecting layer and hole transporting layer. The hole injecting layer and hole transporting layer can be formed by forming thin films from the compounds listed above by known methods such as vacuum deposition, spin coating, casting and LB method.

The thickness of the hole injecting layer and hole transporting layer is not particularly limited, but typically in the range of 5 nm to 5 μm. The hole injecting layer and the hole transporting layer may be a single-layered layer made of the single one of the above materials or a combinations of two or more of the above materials. Alternatively, the hole injecting layer and the hole transporting layer may be a multilayer layer in which a plurality of hole injecting layers and hole transporting layers made of different materials are layered.

Further, inorganic compounds such as p-type Si and p-type SiC can also be used as the materials for the hole injecting layer.

The compound represented by the following formula is also preferable for the hole injecting layer.

[Chemical Formula 67]

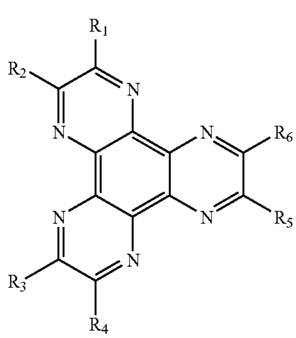

In the above formula, $R_1$ to $R_6$ each represent halogen, cyano group, nitro group, alkyl group or trifluoromethyl group, and may be mutually the same or different. Incidentally, $R_1$ to $R_6$ are preferably cyano group.

Examples of the material for the hole injecting layer and the hole transporting layer are as follows.

[Chemical Formula 68]

(HT)

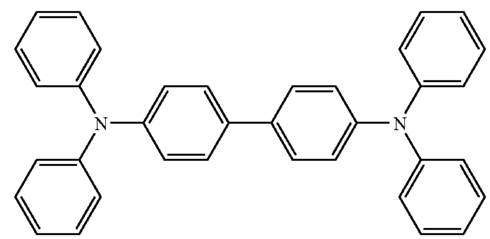

(HT2)

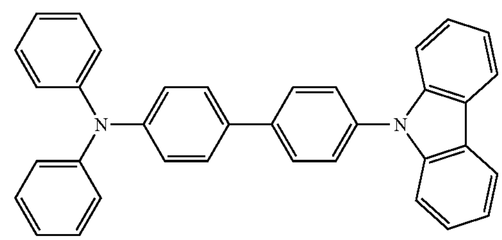

The hole injecting layer can be formed by forming thin films from the compounds listed above by known method such as vacuum deposition, spin coating, casting, and LB method.

The thickness of the hole injecting layer is not particularly limited, but typically in the range of 5 nm to 5 μm.

In the aspect of the invention, the organic thin-film layer preferably includes a second phosphorescent-emitting layer containing a second phosphorescent host and a second phosphorescent dopant.

In the above instance, an emission wavelength of the fluorescent dopant is preferably 410 nm to 490 nm (blue); an emission wavelength of the first phosphorescent dopant is preferably 580 nm to 700 nm (red); and an emission wavelength of the second phosphorescent dopant is preferably 490 nm to 580 nm (green).

With this arrangement, the layer structure of the organic EL device includes not only the fluorescent-emitting layer (blue) and the first phosphorescent-emitting layer (red) but also the second phosphorescent-emitting layer (green). Thus, three-wavelength white emission can be provided. Accordingly, the organic EL device according to the aspect of the invention can be a white light emitting device having improved color rendering property.

Examples of the layer structure of the fluorescent-emitting layer (blue), the first phosphorescent-emitting layer (red) and the second phosphorescent-emitting layer (green) are as follows.

(1) fluorescent-emitting layer (blue)/second phosphorescent-emitting layer (green)/first phosphorescent-emitting layer (red)

(2) fluorescent-emitting layer (blue)/first phosphorescent-emitting layer (red)/second phosphorescent-emitting layer (green)

(3) first phosphorescent-emitting layer (red)/fluorescent-emitting layer (blue)/second phosphorescent-emitting layer (green)

(4) second phosphorescent-emitting layer (green)/fluorescent-emitting layer (blue)/first phosphorescent-emitting layer (red)

(5) second phosphorescent-emitting layer (green)/first phosphorescent-emitting layer (red)/fluorescent-emitting layer (blue)

(6) first phosphorescent-emitting layer (red)/second phosphorescent-emitting layer (green)/fluorescent-emitting layer (blue)

Alternatively, the first phosphorescent dopant may emit green light and the second phosphorescent dopant may emit red light.

In the aspect of the invention, it is preferable that one of the first and second phosphorescent-emitting layers is layered on the fluorescent-emitting layer adjacently to the anode; and the other one of the first and second phosphorescent-emitting layers is layered on the fluorescent-emitting layer adjacently to the cathode.

Energy is not directionally transferred: energy is transferred toward the anode or the cathode. With this arrangement, the first and second phosphorescent-emitting layers are located on the both sides of the fluorescent-emitting layer (i.e., recombination region serving as energy source). Accordingly, triplet energy from the fluorescent-emitting layer can be efficiently obtained.

In the aspect of the invention, it is preferable that one of the first and second phosphorescent-emitting layers is a red emitting layer; and the other one of the first and second phosphorescent-emitting layers is a green emitting layer.

With this arrangement, singlet energy generated by recombination of the charges in the fluorescent host is transferred to the fluorescent dopant, whereby blue phosphorescent emission is obtained. Red and green phosphorescent emission can be obtained from the first and second phosphorescent-emitting layers. Thus, white emission can be obtained from the organic EL device as a whole.

In the aspect of the invention, it is preferable that one of the first and second phosphorescent-emitting layers is a red emitting layer; the other one of the first and second phosphorescent-emitting layers is a green emitting layer; and the fluorescent-emitting layer, the second phosphorescent-emitting layer and the first phosphorescent-emitting layer are layered in this order to provide the organic thin-film layer.

When a triplet energy gap of the second phosphorescent host is larger than a triplet energy gap of the first phosphorescent host, energy can be transferred from the blue emitting layer to the green emitting layer and then transferred from the green emitting layer to the red emitting layer. However, after transferred from the blue emitting layer to the red emitting layer, energy cannot be transferred to the green emitting layer. For instance, when the green emitting layer is layered adjacent to the blue emitting layer on the cathode side, and the red emitting layer is further layered thereto on the cathode side, triplet energy can be transformed into emission without loss.

In the direction from the fluorescent-emitting layer toward the anode, the second phosphorescent-emitting layer and the first phosphorescent-emitting layer may be sequentially layered.

Examples of the first and second phosphorescent hosts are as follows.

[Chemical Formula 69]

(I-1)

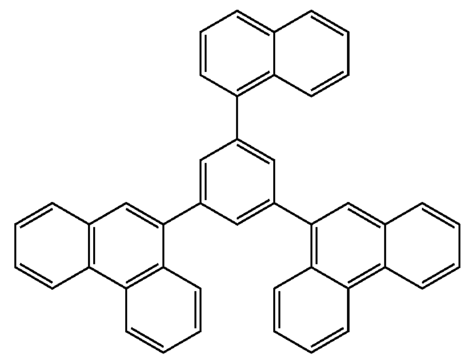

(I-2)

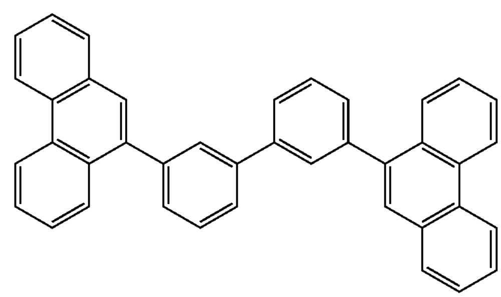

(I-3)

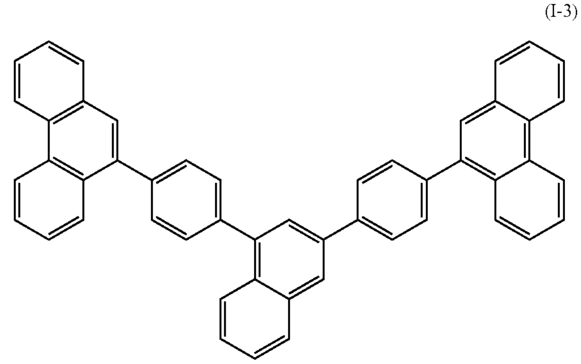

Examples of the first and second phosphorescent hosts are a phenanthrene derivative and a triphenylene derivative as follows.
[Chemical Formula 70]
A-1
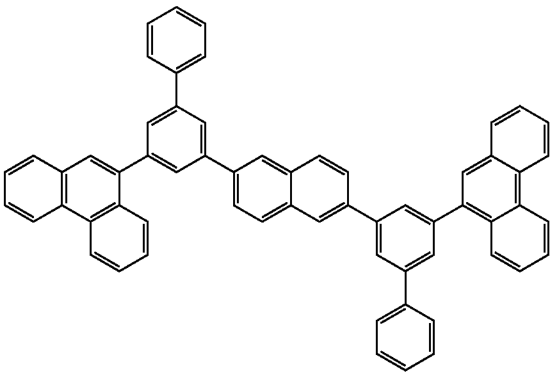
A-2
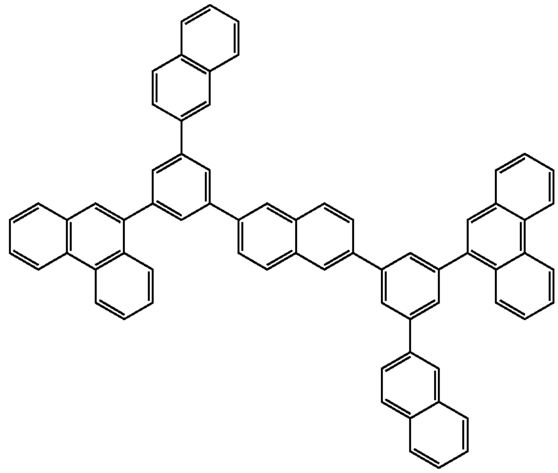
A-4
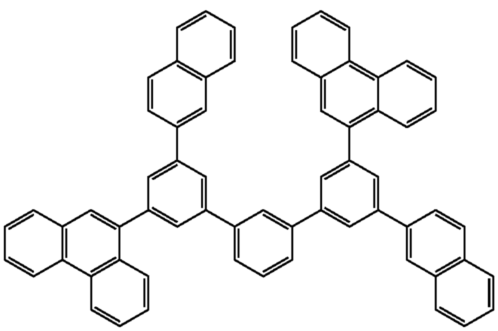
A-15
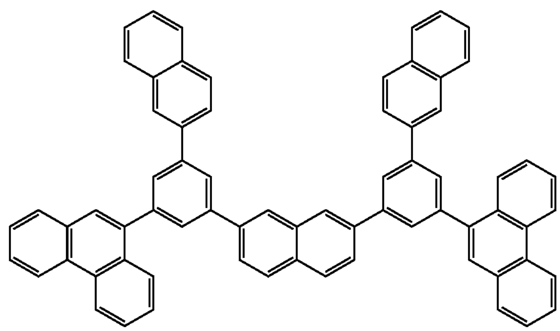
A-17
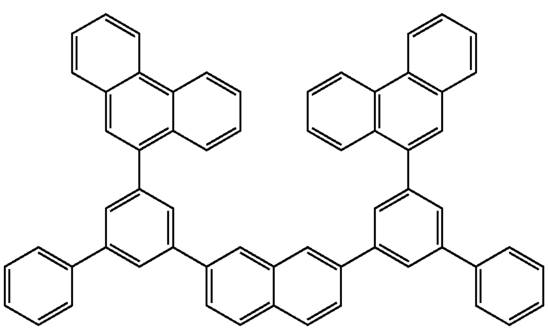
A-24
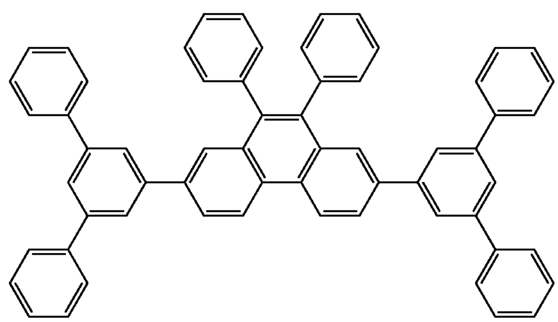

-continued
B-25
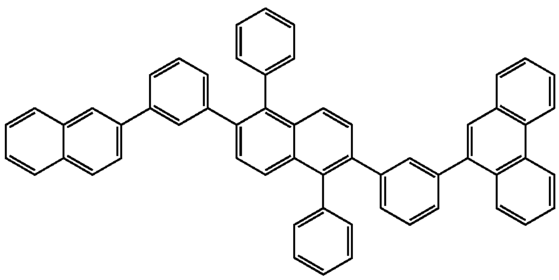
A-26
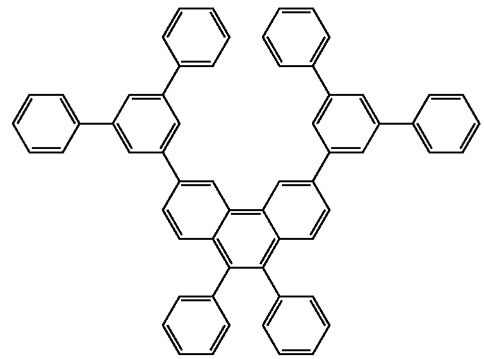
[Chemical Formula 71]
F-14
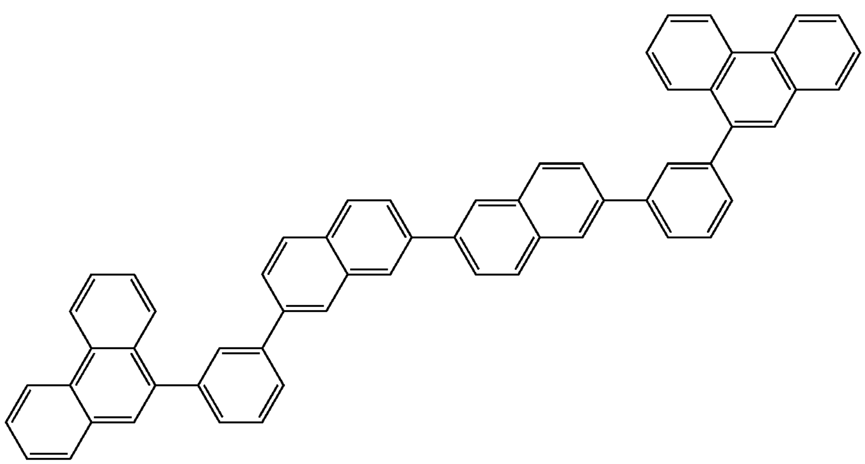
F-25
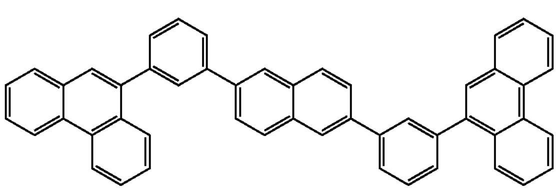
F-26
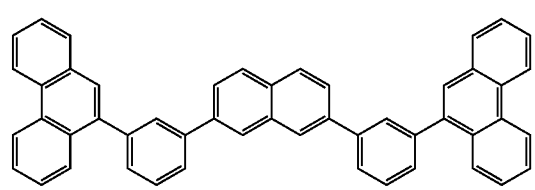
F-27
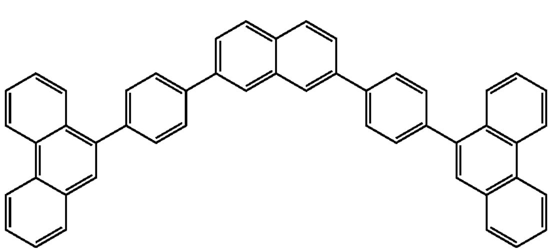
F-28
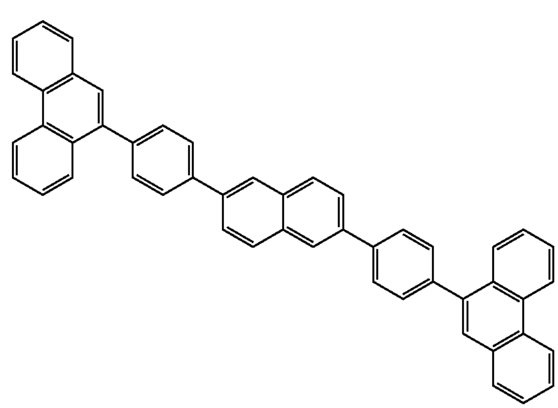

-continued
F-29
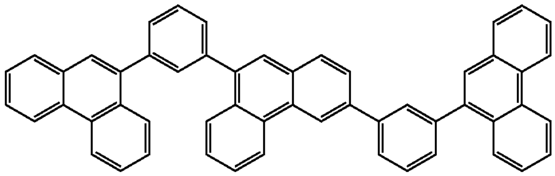
F-30
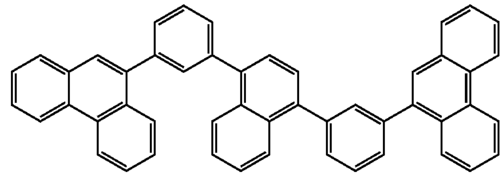
F-31
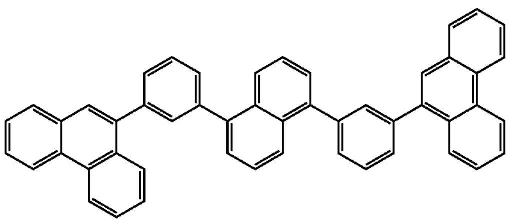
F-32
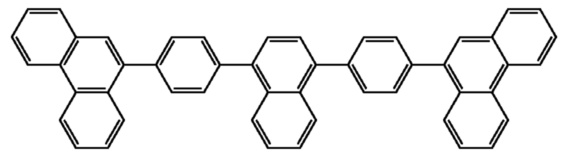
[Chemical Formula 72]
C-1
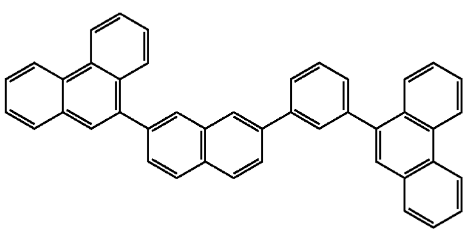
C-2
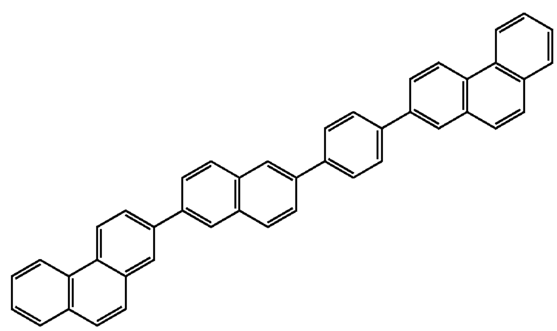
C-3
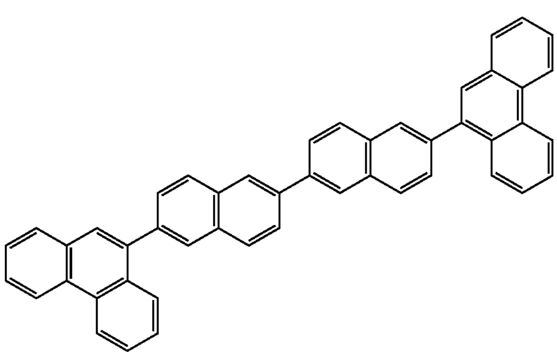
C-4
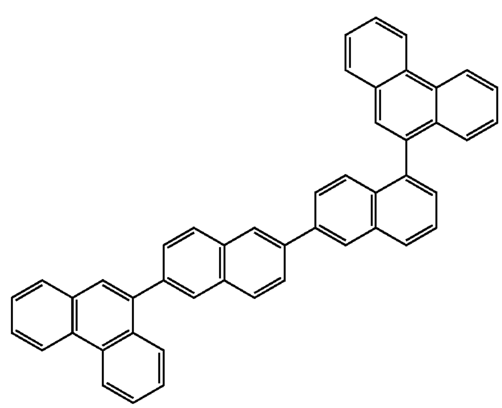

-continued
C-5
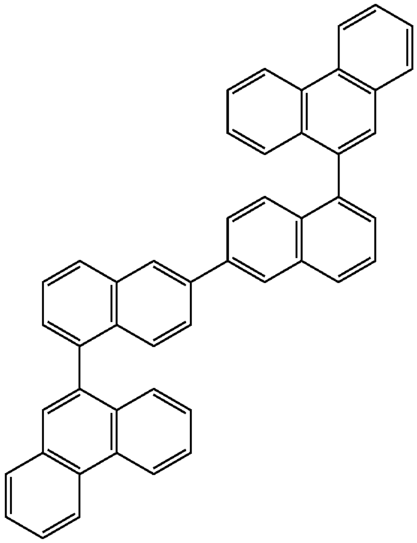
C-6
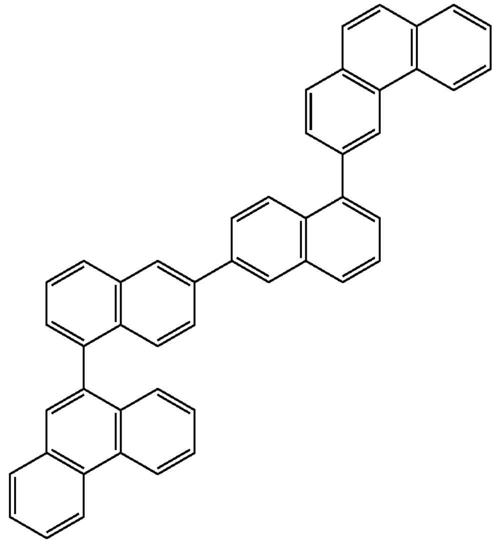
C-7
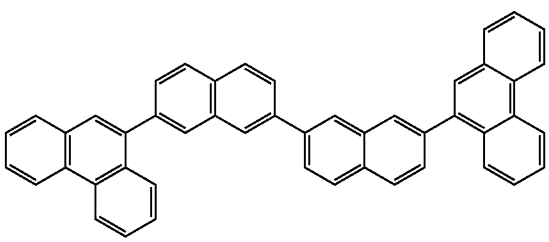
C-8
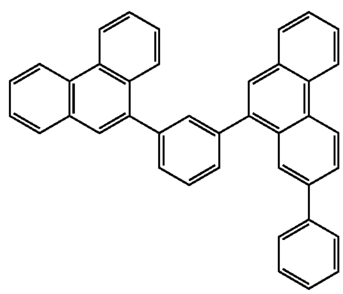
[Chemical Formula 73]
D-1
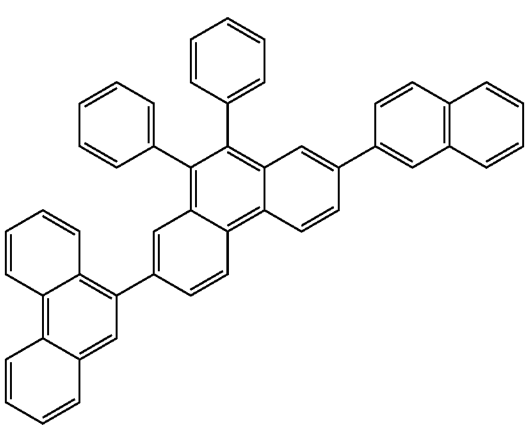
D-2
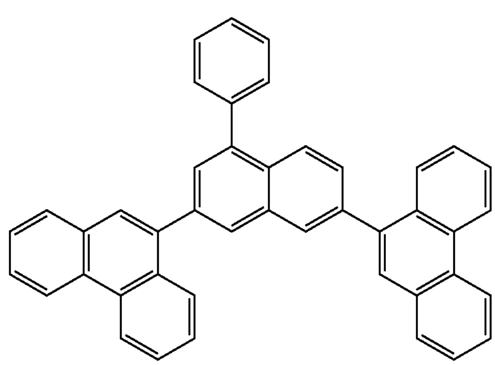

-continued
D-3
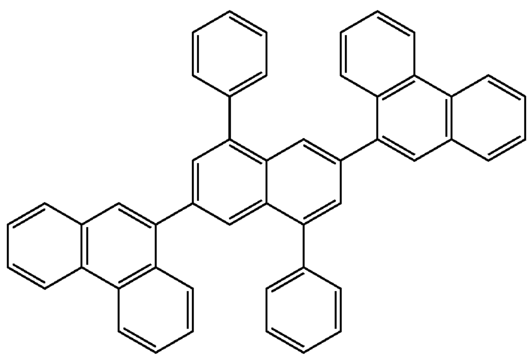
D-4
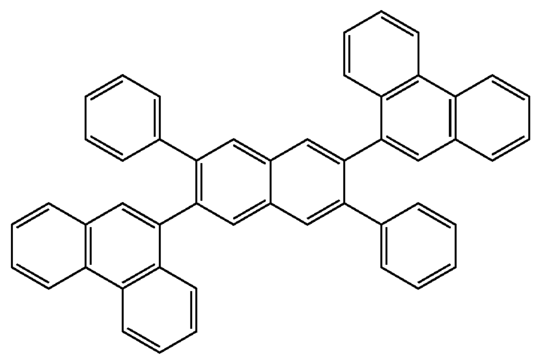
D-5
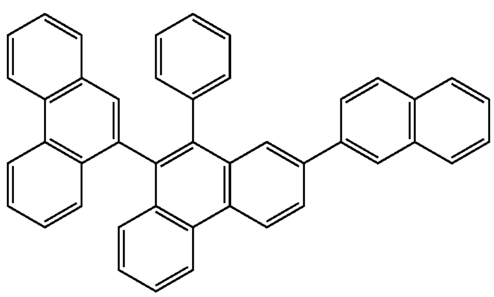
D-6
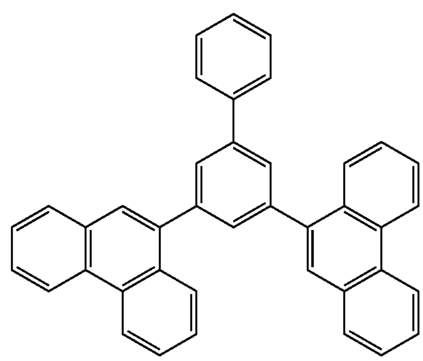
D-7
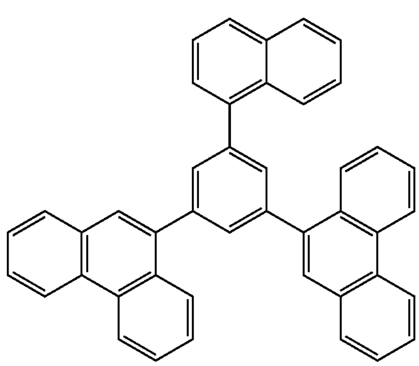
D-8
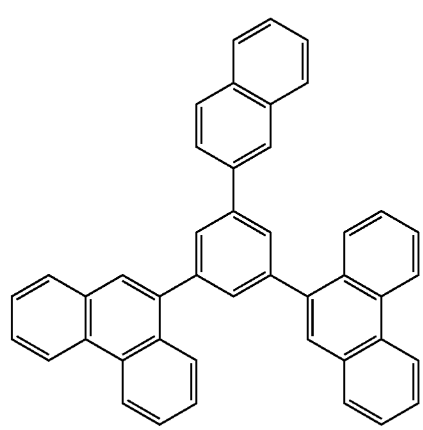

-continued
D-9
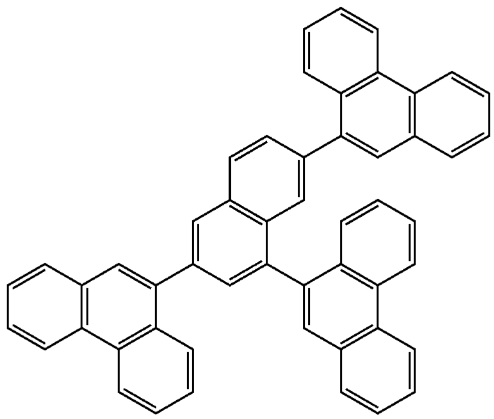
[Chemical Formula 74]
E-1
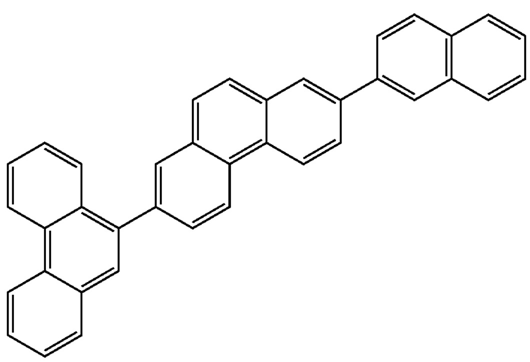
E-2
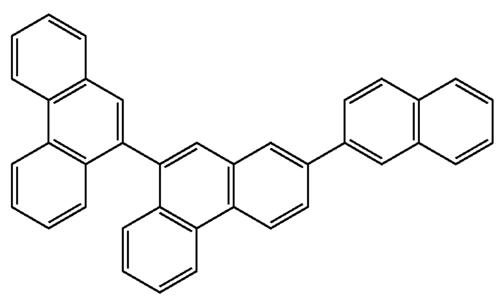
E-3
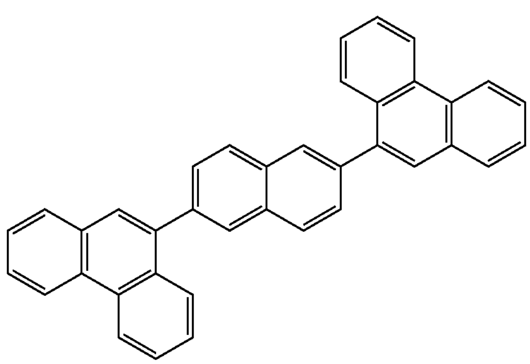
E-4
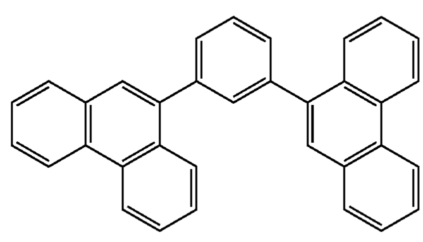

-continued
E-5
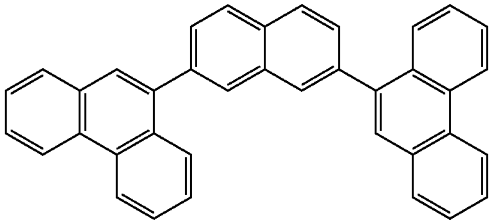
[Chemical Formula 75]
G-1
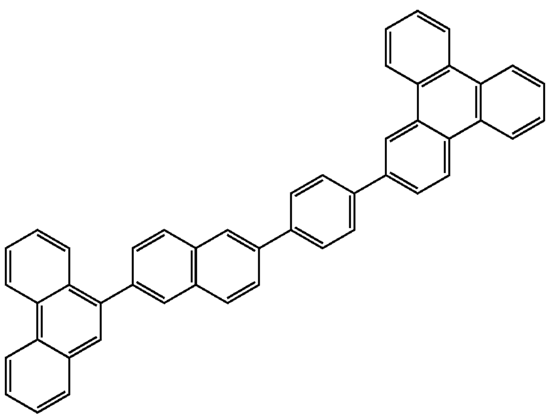
G-2
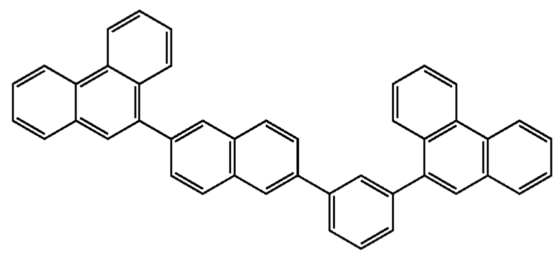
G-3
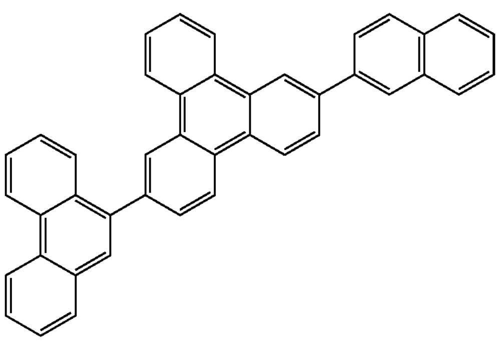
G-4
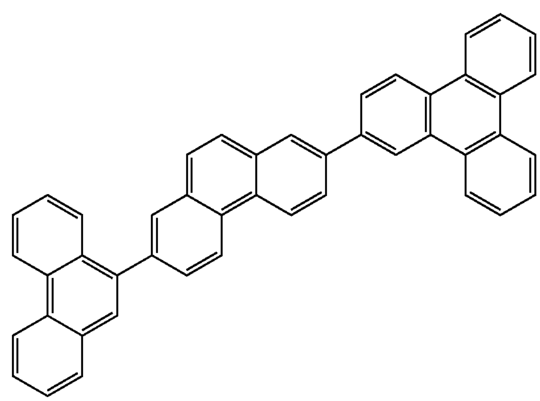
G-5
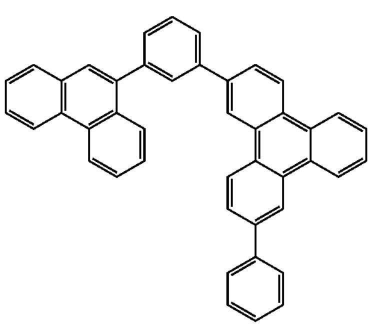
G-6
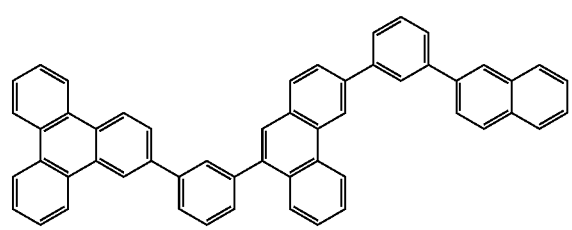

-continued
G-7
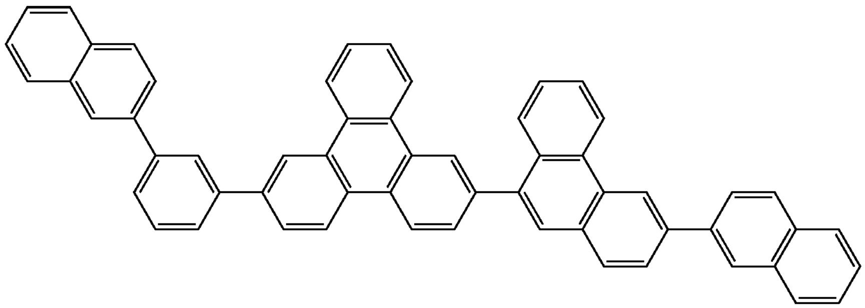
[Chemical Formuls 76]
H-1
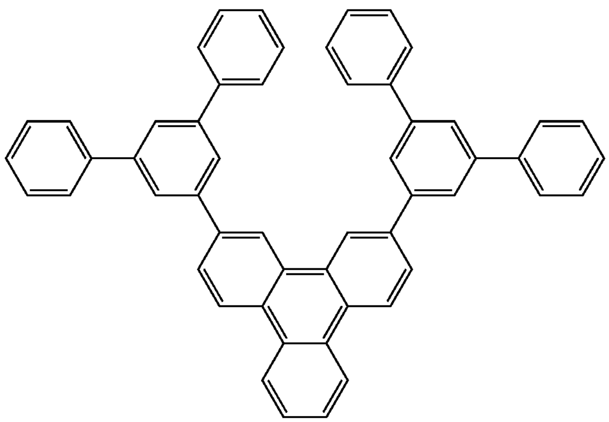
H-2
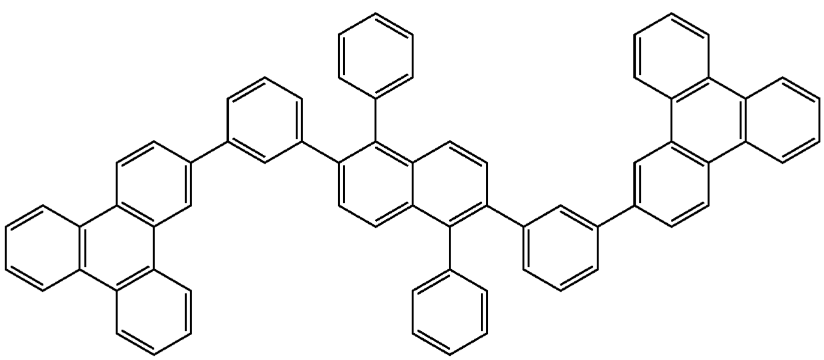
H-3
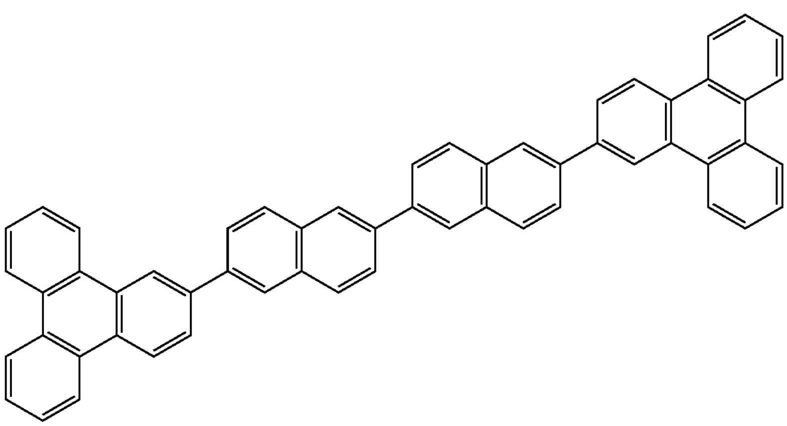

Examples of the first and second phosphorescent hosts are a carbazole derivative and the like represented by any one of the following formulae (101) to (105).

[Chemical Formula 77]

(101)

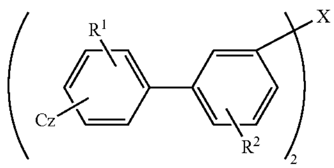

(102)

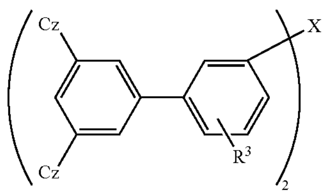

(103)

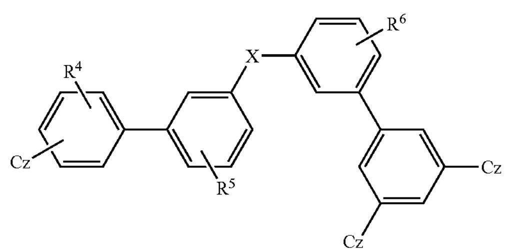

(104)

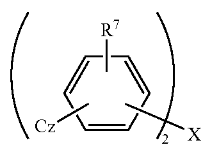

(105)

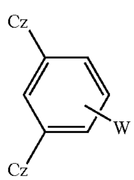

In particular, the compound represented by the formula (101) or (103) is favorably used as the first and second phosphorescent hosts.

The structure represented by the formula (101) is any one of the following structures.

[Chemical Formula 78]

(101′)

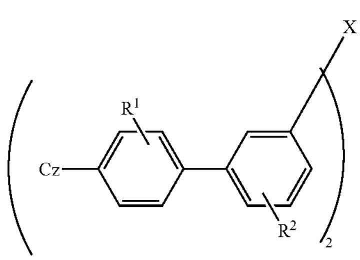

-continued (101″)

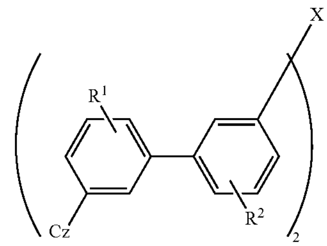

(101‴)

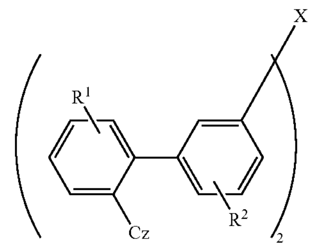

The structure represented by the formula (103) is any one of the following structures.

[Chemical Formula 79]

(103′)

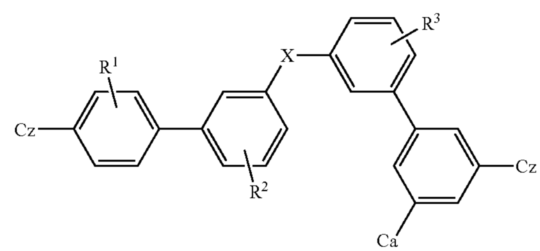

(103″)

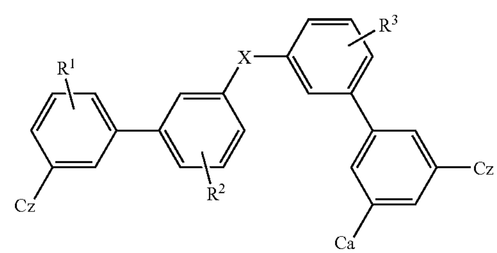

(103‴)

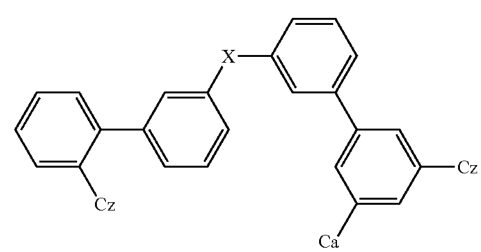

Among the above, the phosphorescent host is particularly preferably made of the compound represented by the general formula (101') or (103').

In the formulae (101) to (104), $R^1$ to $R^7$ each independently represent a hydrogen atom, halogen atom, substituted or unsubstituted alkyl group having 1 to 40 carbon atoms (preferably 1 to 30 carbon atoms), substituted or unsubstituted heterocyclic group having 3 to 30 carbon atoms (preferably 3 to 20 carbon atoms), substituted or unsubstituted alkoxy group having 1 to 40 carbon atoms (preferably 1 to 30 carbon atoms), substituted or unsubstituted aryl group having 6 to 40 carbon atoms (preferably 6 to 30 carbon atoms), substituted or unsubstituted aryloxy group having 6 to 40 carbon atoms (preferably 6 to 30 carbon atoms), substituted or unsubstituted aralkyl group having 7 to 40 carbon atoms (preferably 7 to 30 carbon atoms), substituted or unsubstituted alkenyl group having 2 to 40 carbon atoms (preferably 2 to 30 carbon atoms), substituted or unsubstituted alkylamino group having 1 to 80 carbon atoms (preferably 1 to 60 carbon atoms), substituted or unsubstituted arylamino group having 6 to 80 carbon atoms (preferably 6 to 60 carbon atoms), substituted or unsubstituted aralkylamino group having 7 to 80 carbon atoms (preferably 7 to 60 carbon atoms), substituted or unsubstituted alkylsilyl group having 3 to 10 carbon atoms (preferably 3 to 9 carbon atoms), substituted or unsubstituted arylsilyl group having 6 to 30 carbon atoms (preferably 8 to 20 carbon atoms) or cyano group. $R^1$ to $R^7$ each may be plural, and adjoining set thereof may form a saturated or unsaturated cyclic structure.

Examples of the halogen atom represented by $R^1$ to $R^7$ are fluorine, chlorine, bromine and iodine.

Examples of the substituted or unsubstituted alkyl group having 1 to 40 carbon atoms represented by $R^1$ to $R^7$ are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 2-methylpentyl group, 1-pentylhexyl group, 1-butylpentyl group, 1-heptyloctyl group, 3-methylpentyl group, hydroxymethyl group, 1-hydroxyethyl group, 2-hydroxyethyl group, 2-hydroxyisobutyl group, 1,2-dihydroroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 1,2-dinitroethyl group, 2,3-dinitro-t-butyl group, 1,2,3-trinitropropyl group, cyclopentyl group, cyclohexyl group, cyclooctyl group and 3,5-tetramethylcyclohexyl group.

Among the above, the alkyl group is preferably a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 1-pentylhexyl group, 1-butylpentyl group, 1-heptyloctyl group, cyclohexyl group, cyclooctyl group or 3,5-tetramethylcyclohexyl group.

Examples of the substituted or unsubstituted heterocyclic group having 3 to 30 carbon atoms represented by $R^1$ to $R^7$ are 1-pyrrolyl group, 2-pyrrolyl group, 3-pyrrolyl group, pyrazinyl group, 2-pyrizinyl group, 1-imidazolyl group, 2-imidazolyl group, 1-pyrazolyl group, 1-indolizinyl group, 2-indolizinyl group, 3-indolizinyl group, 5-indolizinyl group, 6-indolizinyl group, 7-indolizinyl group, 8-indolizinyl group, 2-imidazopyridinyl group, 3-imidazopyridinyl group, 5-imidazopyridinyl group, 6-imidazopyridinyl group, 7-imidazopyridinyl group, 8-imidazopyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, β-carboline-1-yl, β-carboline-3-yl, β-carboline-4-yl, β-carboline-5-yl, β-carboline-6-yl, β-carboline-7-yl, β-carboline-6-yl, β-carboline-9-yl, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenailthrolin-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Among the above, the preferable compounds are 2-pyrizinyl group, 1-indolizinyl group, 2-indolizinyl group, 3-indolizinyl group, 5-indolizinyl group, 6-indolizinyl group, 7-indolizinyl group, 8-indolizinyl group, 2-imidazopyridinyl group, 3-imidazopyridinyl group, 5-imidazopyridinyl group, 6-imidazopyridinyl group, 7-imidazopyridinyl group, 8-imidazopyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 1-carbazolyl group, 2-carbazolyl group, 3-carbazolyl group, 4-carbazolyl group and 9-carbazolyl group.

The substituted or unsubstituted alkoxy group having 1 to 40 carbon atoms represented by $R^1$ to $R^7$ is a group represented by —OY. Examples of Y are the same examples as described in relation to the alkyl group, and preferable examples are also the same.

Examples of the substituted or unsubstituted aryl group having 6 to 40 carbon atoms represented by $R^1$ to $R^7$ are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, o-cumenyl group, m-cumenyl group, p-cumenyl group, 2,3-xylyl group, 3,4-xylyl group, 2,5-xylyl group and mesityl group.

Among the above, preferable compounds are phenyl group, 1-naphthyl group, 2-naphthyl group, 9-phenanthryl group, 2-biphenylyl group, 3-biphenylyl group, 4-biphenylyl group, p-tolyl group and 3,4-xylyl group.

The substituted or unsubstituted aryloxy group having 6 to 40 carbon atoms represented by $R^1$ to $R^7$ is a group represented by —OAr. Examples of Ar are the same examples as described in relation to the aryl group, and preferable examples are also the same.

Examples of the substituted or unsubstituted aralkyl group having 7 to 40 carbon atoms represented by $R^1$ to $R^7$ are a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-α-naphthylisopropyl group, 1-pyrorylmethyl group, 2-(1-pyroryl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, 1-chloro-2-phenylisopropyl group and the like.

Among the above, a benzyl group, p-cyanobenzyl group, m-cyanobenzyl group, o-cyanobenzyl group, 1-phenylethyl group, 2-phenylethyl group, 1-phenylisopropyl group and 2-phenylisopropyl group are preferable.

Examples of the substituted or unsubstituted alkenyl group having 2 to 40 carbon atoms represented by $R^1$ to $R^7$ are a vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group, among which a styryl group, 2,2-phenylvinyl group and 1,2-diphenylvinyl group are preferable.

The substituted or unsubstituted alkylamino group having 1 to 80 carbon atoms, the substituted or unsubstituted arylamino group having 6 to 80 carbon atoms and the substituted or unsubstituted aralkylamino group having 7 to 80 carbon atoms, each of which is represented by $R^1$ to $R^7$, are represented by $—NQ^1Q^2$. Examples of $Q^1$ and $Q^2$ are each independently the same examples as described in relation to the alkyl group, aryl group and aralkyl group. The preferable examples thereof are also the same.

Examples of the substituted or unsubstituted alkylsilyl group having 3 to 10 carbon atoms represented by $R^1$ to $R^7$ are a trimethylsilyl group, triethylsilyl group, t-butyldimethylsilyl group, vinyldimethylsilyl group and propyldimethylsilyl group.

Examples of the substituted or unsubstituted arylsilyl group having 6 to 30 carbon atoms represented by $R^1$ to $R^7$ are a triphenylsilyl group, phenyldimethylsilyl group and t-butyldiphenylsilyl group.

Examples of the cyclic structure formed by $R^1$ to $R^7$ when $R^1$ to $R^7$ are each plural are, in addition to a unsaturated six-membered ring such as benzene ring, saturated or unsaturated five-membered ring or seven-membered ring.

In the formulae (101) to (104), X represents a group represented by any one of the following formulae (111) to (116).

[Chemical Formula 80]

(111)

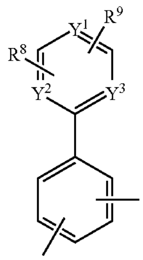

(112)

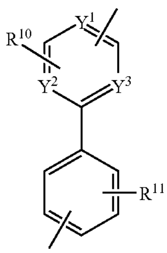

(113)

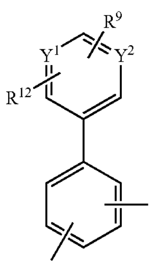

(114)

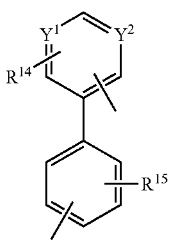

(115)

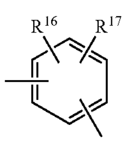

(116)

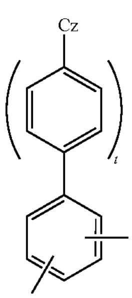

In the formulae (111) to (116), $R^8$ to $R^{17}$ each independently represent a hydrogen atom, halogen atom, substituted or unsubstituted alkyl group having 1 to 40 carbon atoms (preferably 1 to 30 carbon atoms), substituted or unsubstituted heterocyclic group having 3 to 30 carbon atoms (preferably 3 to 20 carbon atoms), substituted or unsubstituted alkoxy group having 1 to 40 carbon atoms (preferably 1 to 30 carbon atoms), substituted or unsubstituted aryl group having 6 to 40 carbon atoms (preferably 6 to 30 carbon atoms), substituted or unsubstituted aryloxy group having 6 to 40 carbon atoms (preferably 6 to 30 carbon atoms), substituted or unsubstituted aralkyl group having 7 to 40 carbon atoms (preferably 7 to 30 carbon atoms), substituted or unsubstituted alkenyl group having 2 to 40 carbon atoms (preferably 2 to 30 carbon atoms), substituted or unsubstituted alkylamino group having 1 to 80 carbon atoms (preferably 1 to 60 carbon atoms), substituted or unsubstituted arylamino group having 6 to 80 carbon atoms (preferably 6 to 60 carbon atoms), substituted or unsubstituted aralkylamino group having 7 to 80 carbon atoms (preferably 7 to 60 carbon atoms), substituted or unsubstituted alkylsilyl group having 3 to 10 carbon atoms (preferably 3 to 9 carbon atoms), substituted or unsubstituted arylsilyl group having 6 to 30 carbon atoms (preferably 8 to 20 carbon atoms) or cyano group. $R^8$ to $R^{17}$ may be each plural, and adjoining set thereof may form a saturated or unsaturated cyclic structure.

Examples of the group represented by each of $R^8$ to $R^{17}$ are the same examples as described in relation to $R^1$ to $R^7$ above, and the preferable examples are the same.

In the formulae (111) to (114), $Y^1$ to $Y^3$ each independently represent —CR (R represents a hydrogen atom, group bonded to X in the general formulae (101) to (104) or any one of $R^8$, $R^9$, $R^{10}$, $R^{12}$, $R^{13}$ and $R^{14}$) or a nitrogen atom. When $Y^1$ to $Y^3$ represent a nitrogen atom, the number thereof is at least 2 within the same ring. Cz is the same as the following.

In the formula (116), t represents an integer of 0 to 1.

The group represented by the formula (111) is preferably any one of the following structures.

[Chemical Formula 81]

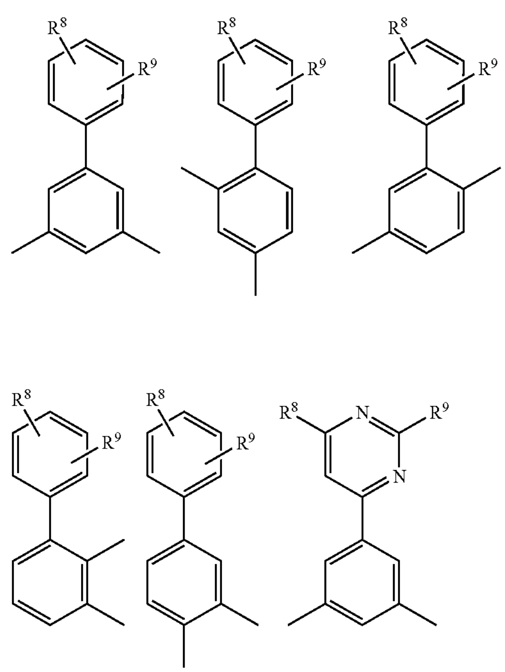

-continued
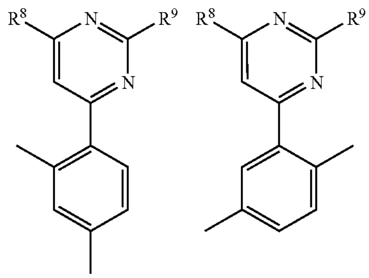
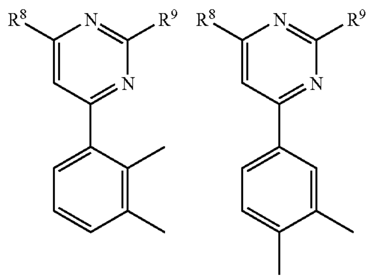
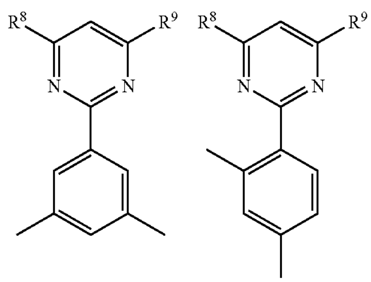
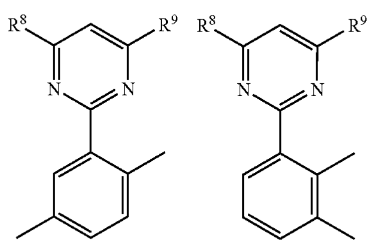
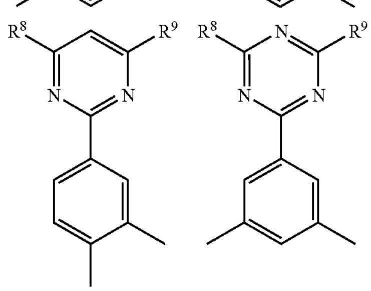
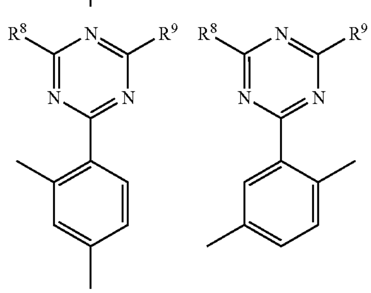
-continued
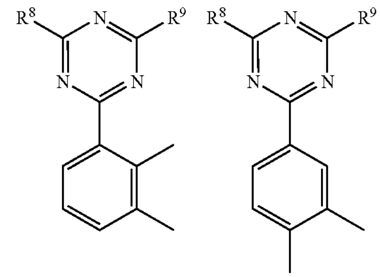
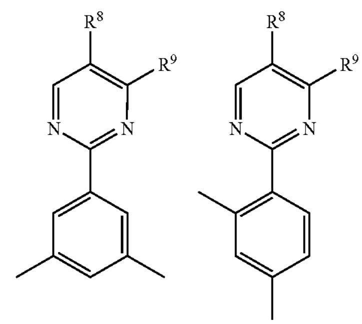
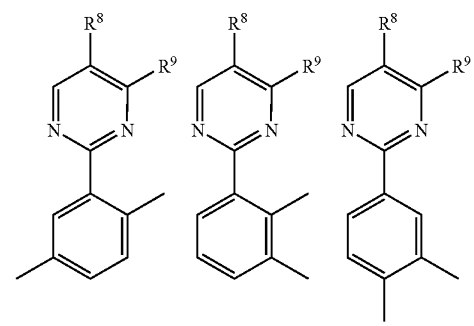
The group represented by the formula (112) is preferably any one of the following structures.
[Chemical Formula 82]
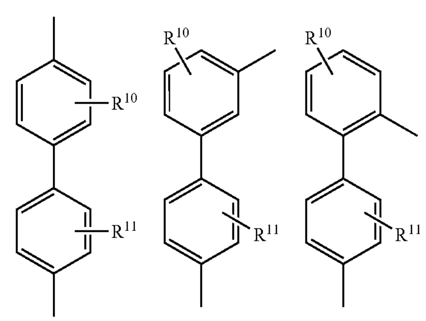
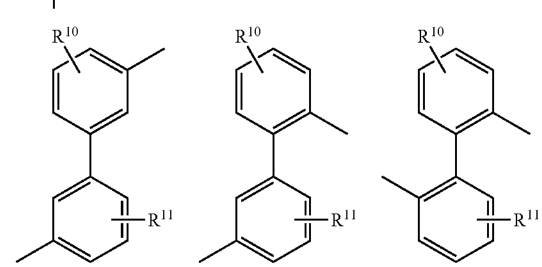

-continued
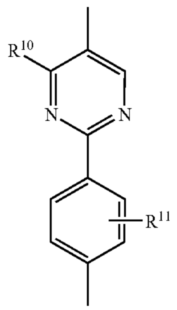
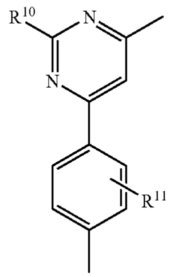
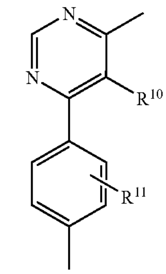
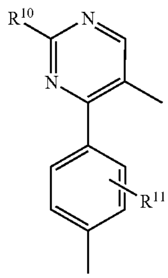
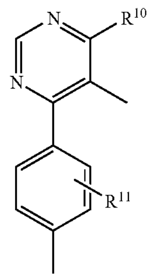
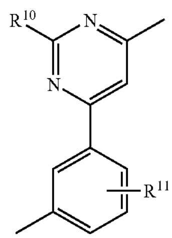
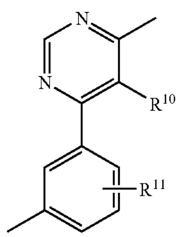
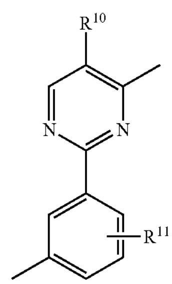
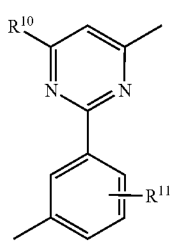
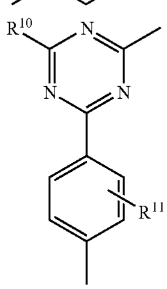
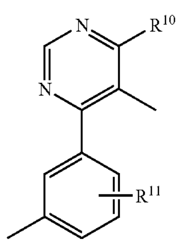
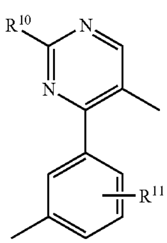
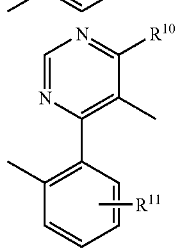
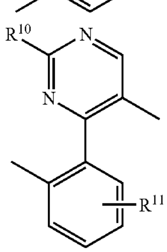
-continued
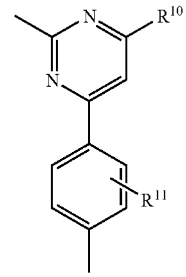
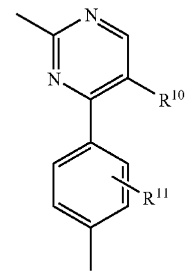
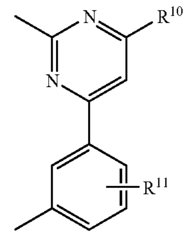
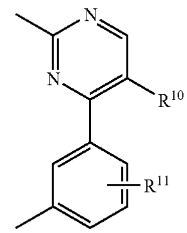
The group represented by the formula (113) is preferably any one of the following structures.
[Chemical Formula 83]
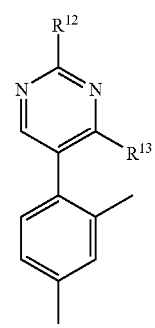
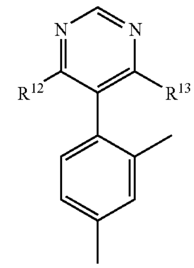
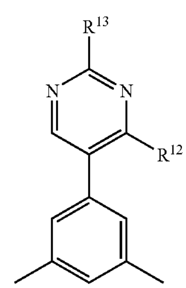
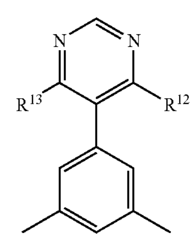
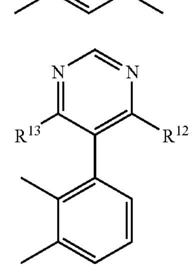
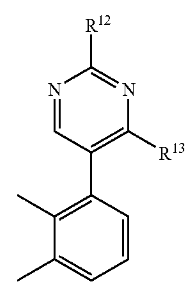

-continued
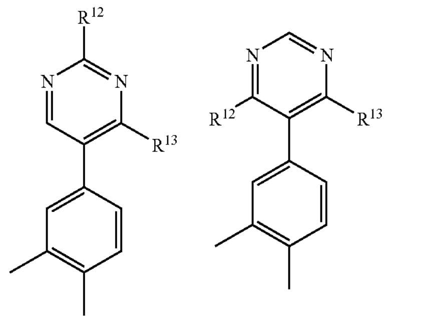
The group represented by the formula (114) is preferably any one of the following structures.
[Chemical Formula 84]
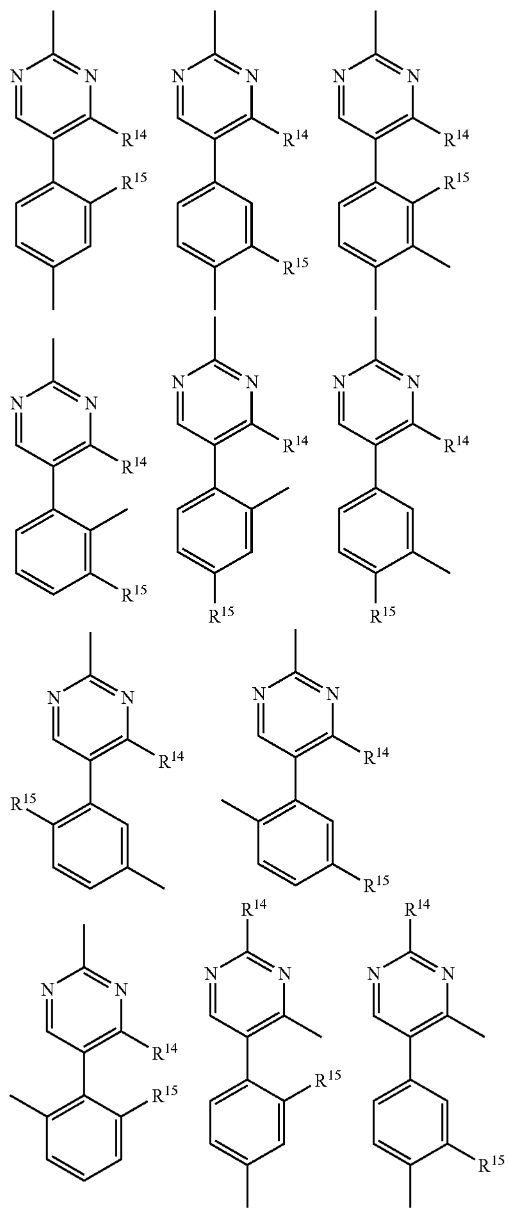
-continued
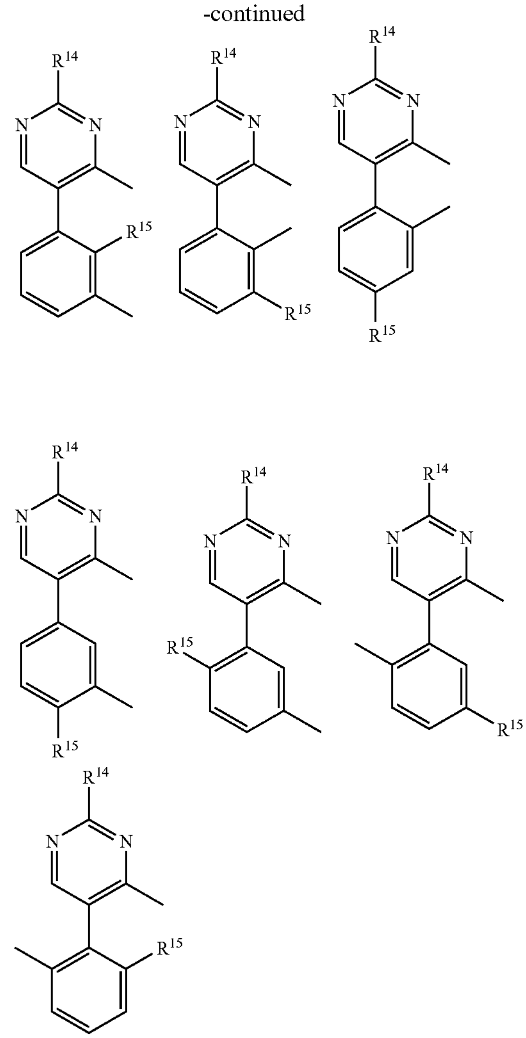
The group represented by the formula (115) is preferably any one of the following structures.
[Chemical Formula 85]
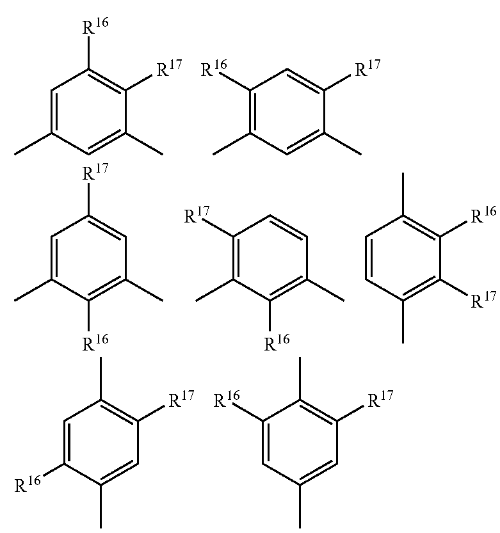

-continued

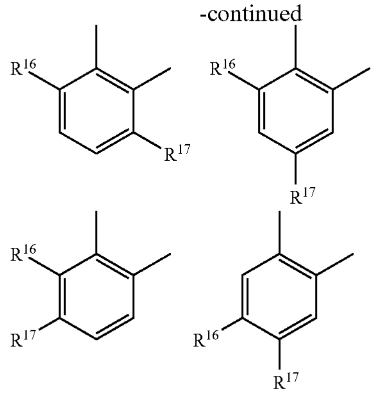

The group represented by the formula (116) is preferably any one of the following structures.

[Chemical Formula 86]

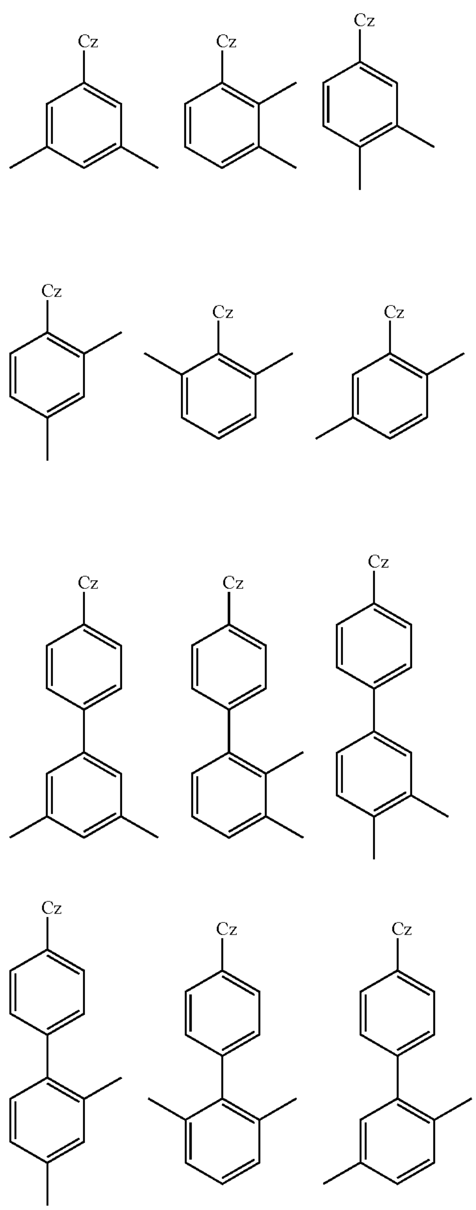

In the formula (105), W represents a group represented by any one of the following general formulae (121) to (125).

[Chemical Formula 87]

(121)

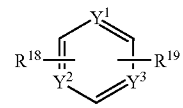

(122)

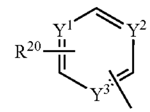

(123)

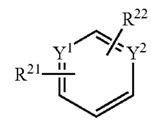

(124)

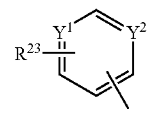

(125)

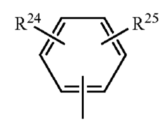

In the formulae (121) to (125), $R^{18}$ to $R^{25}$ are the same groups as $R^8$ to $R^{17}$. $Y^1$ to $Y^3$ are the same as $Y^1$ to $Y^3$ in the formulae (111) to (114).

Examples of the group represented by each of $R^{18}$ to $R^{25}$ are the same examples as described in relation to $R^1$ to $R^7$ above, and the preferable examples are the same.

In the formulae (101) to (105), Cz represents a group represented by the following general formula (131) or (132).

[Chemical Formula 88]

(131)

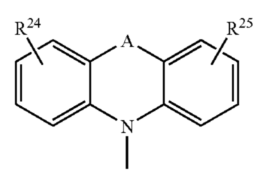

(132)

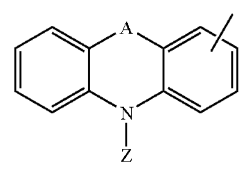

In the formulae (131) and (132), A represents a single bond, —$(CR^{26}R^{27})_n$— (n is an integer of 1 to 3), —$SiR^{28}R^{29}$—, $NR^{30}$—, —O— or —S—. $R^{26}$ and $R^{27}$, and $R^{28}$ and $R^{29}$ may be bonded together to form a saturated or unsaturated cyclic structure. $R^{24}$ to $R^{30}$ each independently represent a hydrogen atom, halogen atom, substituted or unsubstituted alkyl group having 1 to 40 carbon atoms, substituted or unsubstituted heterocyclic group having 3 to 30 carbon atoms, substituted or unsubstituted alkoxy group having 1 to 40 carbon atoms, substituted or unsubstituted aryl group having 6 to 40 carbon atoms, substituted or unsubstituted aryloxy group having 6 to 40 carbon atoms, substituted or unsubstituted aralkyl group having 7 to 40 carbon atoms, substituted or unsubstituted alkenyl group having 2 to 40 carbon atoms, substituted or unsubstituted alkylamino group having 1 to 80 carbon atoms, substituted or unsubstituted arylamino group having 6 to 80 carbon atoms, substituted or unsubstituted aralkylamino group having 7 to 80 carbon atoms, substituted or unsubstituted alkylsilyl group having 3 to 10 carbon atoms, substituted or unsubstituted arylsilyl group having 6 to 30 carbon atoms and cyano group. $R^{24}$ to $R^{25}$ each may be plural, and adjoining set thereof may form a saturated or unsaturated cyclic structure.

In the formula (132), Z represents a substituted or unsubstituted alkyl group having 1 to 20 carbon atoms, substituted or unsubstituted aryl group having 6 to 18 carbon atoms or a substituted or unsubstituted aralkyl group having 7 to 40 carbon groups.

Examples of the alkyl group having 1 to 20 carbon atoms represented by Z are a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, 1-methylpentyl group, 2-methylpentyl group, 1-pentylhexyl group, 1-butylpentyl group, 1-heptyloctyl group and 3-methyl pentyl group. A methyl group, ethyl group, propyl group, n-hexyl group and n-heptyl group are preferable.

Examples of the aryl group represented by Z are a phenyl group, naphthyl group, tolyl group, biphenyl group and terphenyl group. A phenyl group, biphenyl group and tolyl group are preferable.

Examples of the aralkyl group represented by Z are an α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylpropyl group, benzyl group, p-cyanobenzyl group, m-cyanobenzyl group, o-cyanobenzyl group, 1-phenylethyl group, 2-phenylethyl group, 1-phenylisopropyl group and 2-phenylisopropyl group. A benzyl group and p-cyanobenzyl group are preferable.

Cz is preferably any one of the following structures.

[Chemical Formula 89]

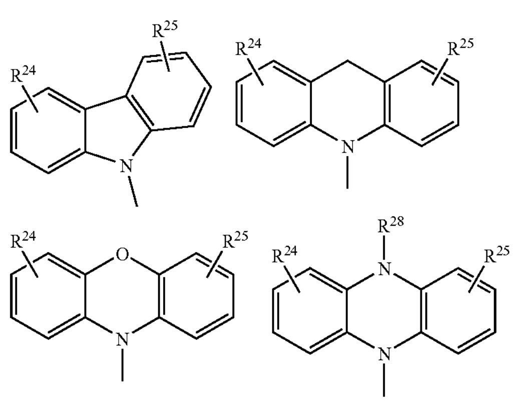

-continued

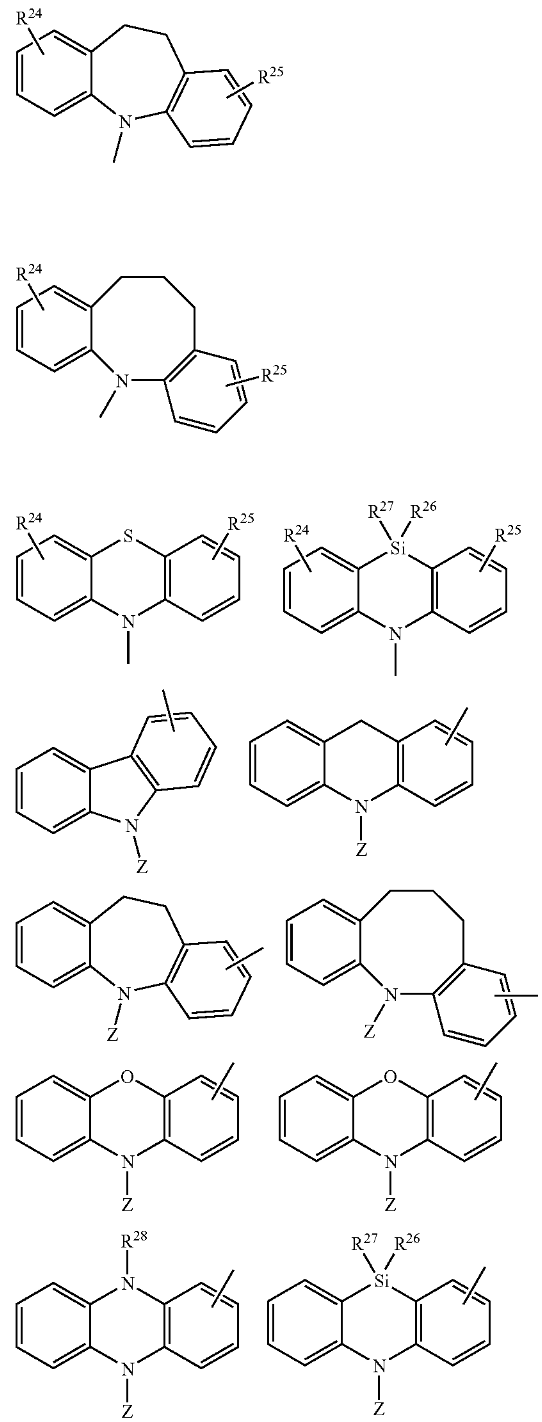

Cz more preferably has any one of the following structures.

[Chemical Formula 90]

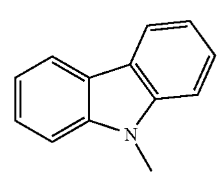

-continued

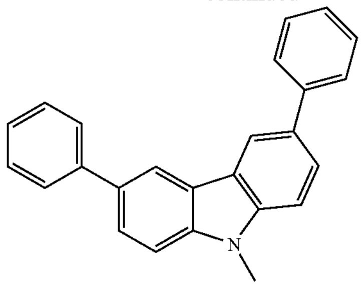

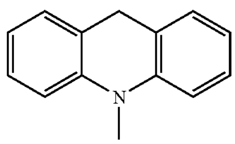

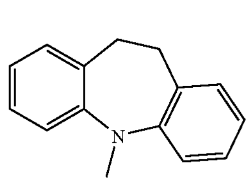

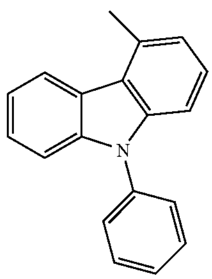

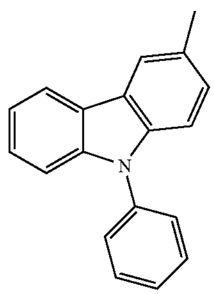

-continued

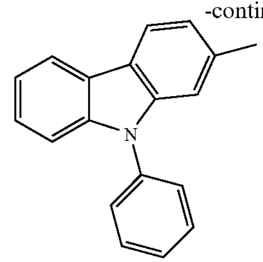

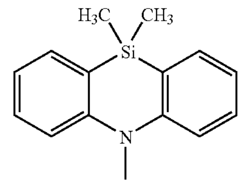

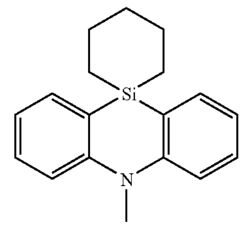

Further, Cz particularly preferably represents a substituted or unsubstituted carbazolyl group or a substituted or unsubstituted arylcarbazolyl group.

Examples of the substituents for the exemplified groups in the general formulae (101) to (105) are a halogen atom, hydroxyl group, amino group, nitro group, cyano group, alkyl group, alkenyl group, cycloalkyl group, alkoxy group, aromatic hydrocarbon group, aromatic heterocyclic group, aralkyl group, aryloxy group and alkoxycarbonyl group.

Examples of the material for the organic EL device according to the aspect of the invention, in which the compound represented by the any one of the following general formulae (101) to (105) is contained, will be shown below. However, the invention is not limited to these exemplified compounds.

[Chemical Formula 91]

(C1)

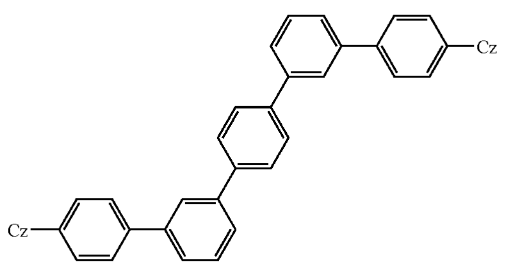

(C2)

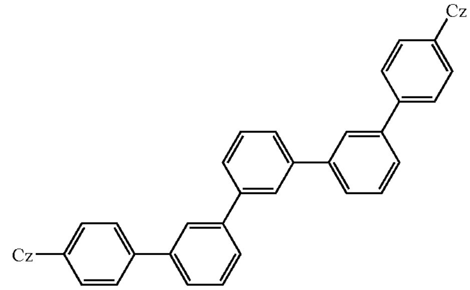

(C3)

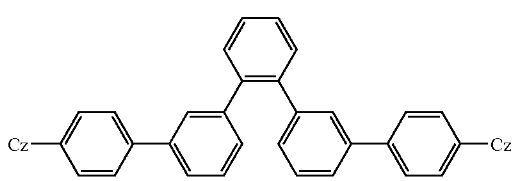

(C4)

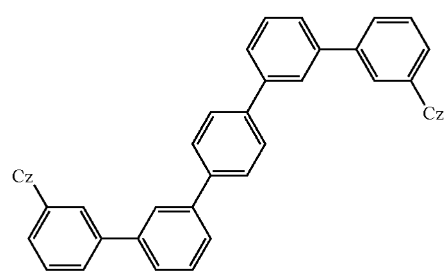

-continued
(C5)
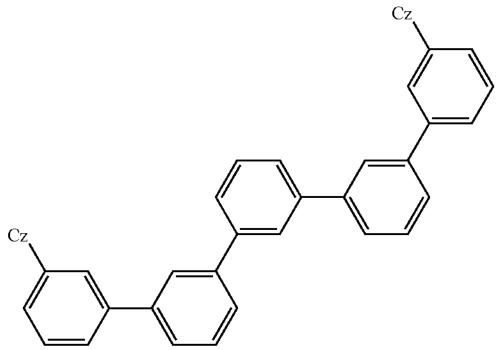
(C6)
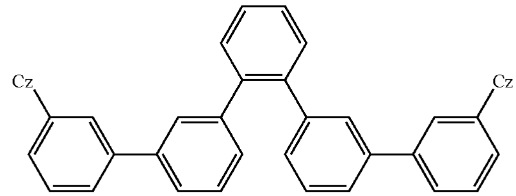
(C7)
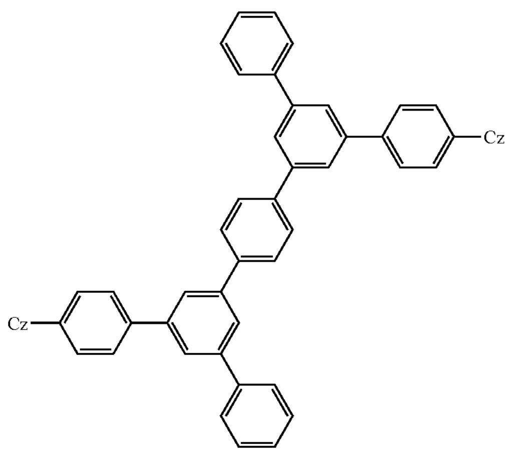
(C8)
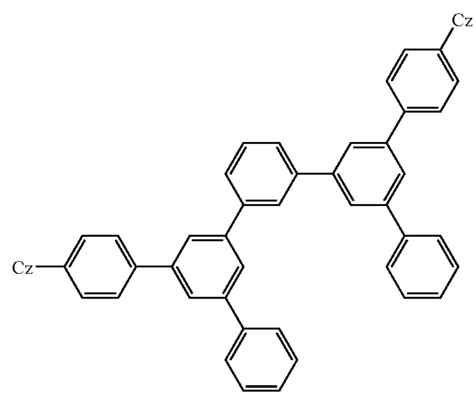
(C9)
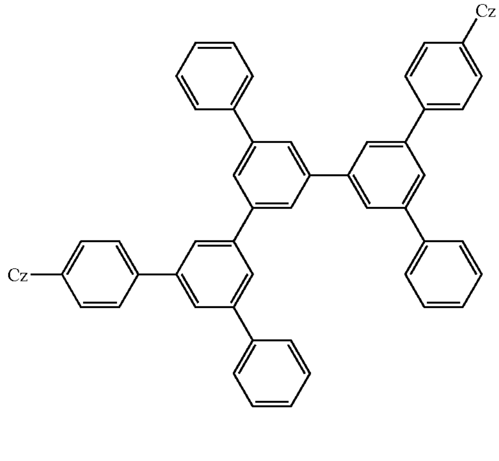
(C10)
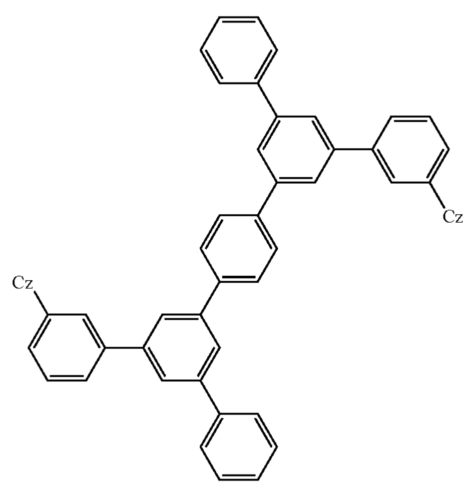

-continued
(C11)
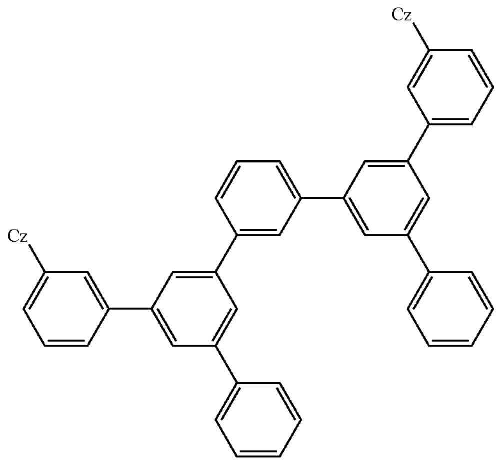
(C12)
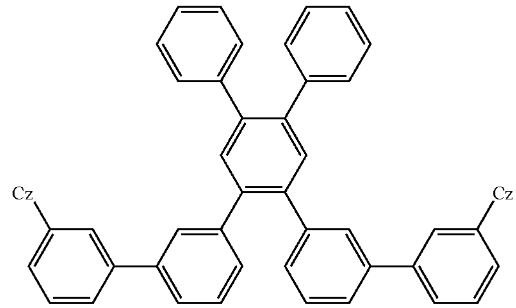
(C13)
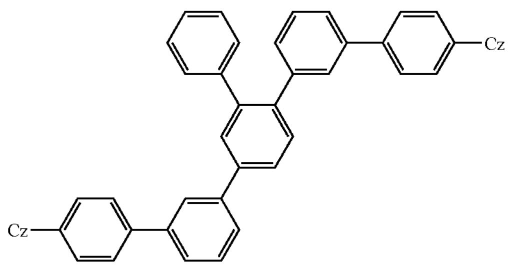
(C14)
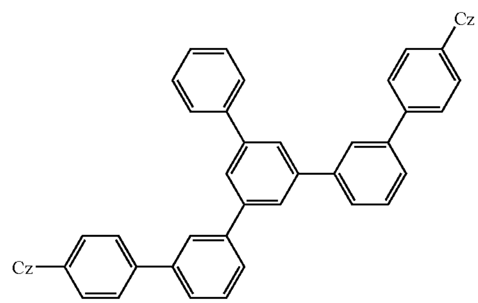
(C15)
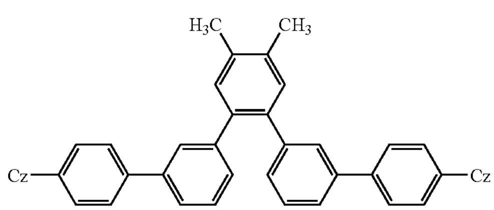
(C16)
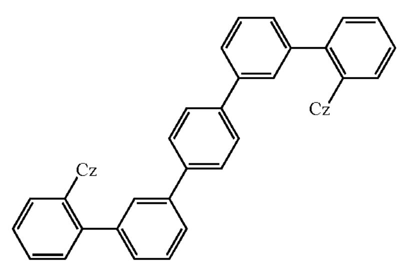
(C17)
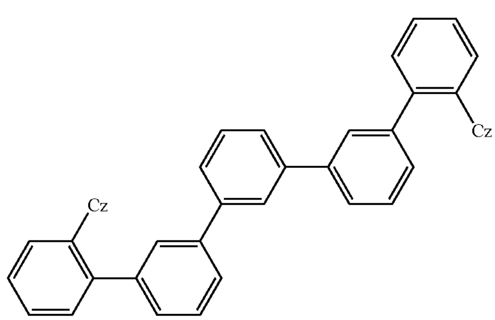
(C18)
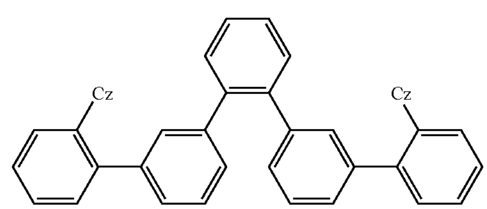

-continued
(C19)
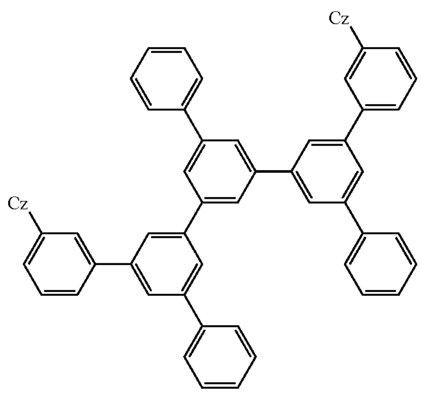
(C20)
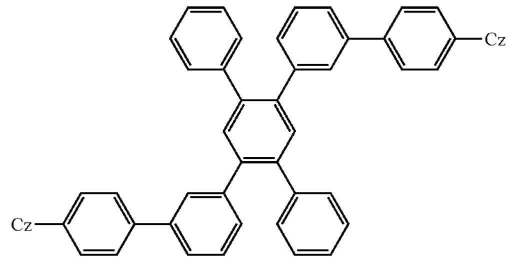
(C21)
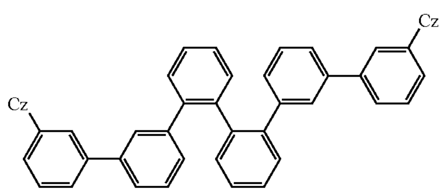
(C22)
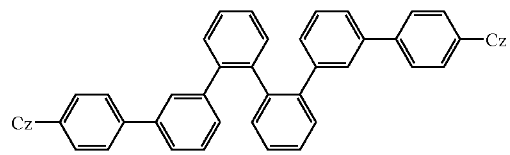
(C23)
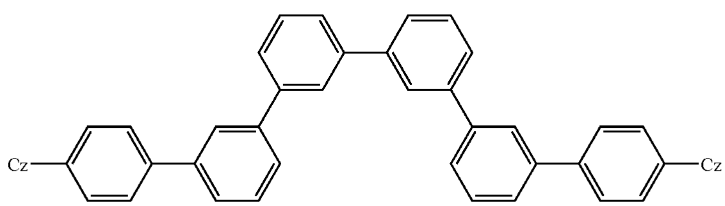
(C24)
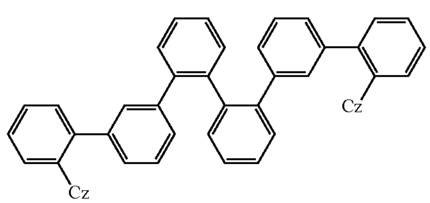
(C25)
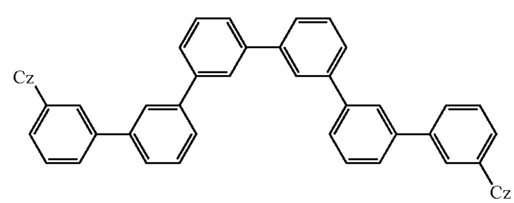
[Chemical Formula 92]
(C26)
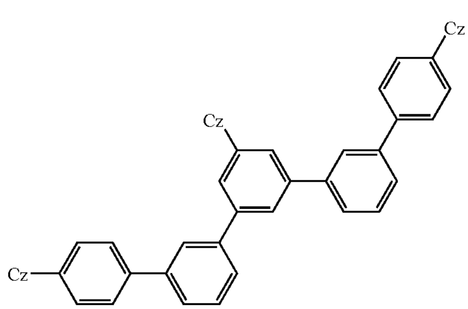
(C27)
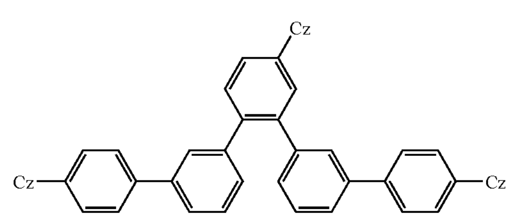

-continued
(C28)
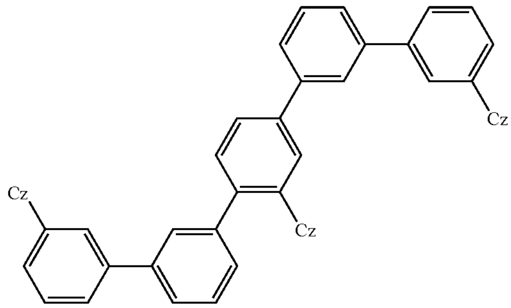
(C29)
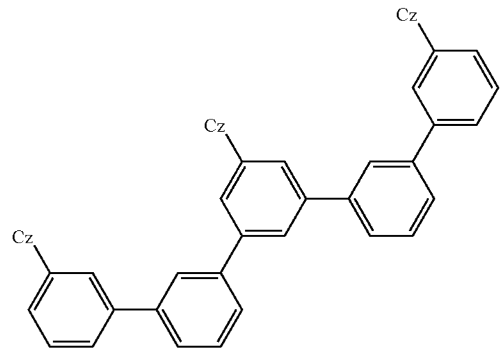
(C30)
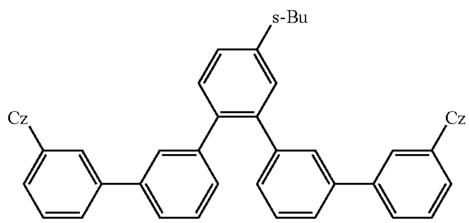
(C31)
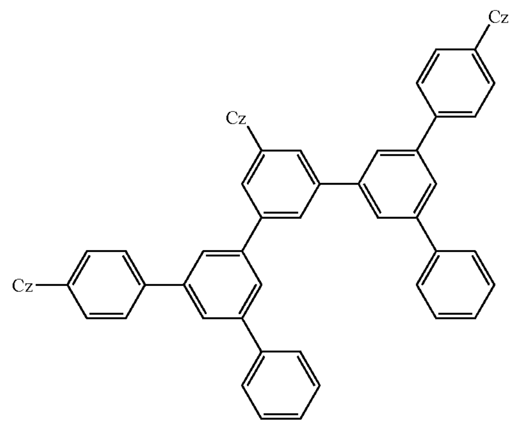
(C32)
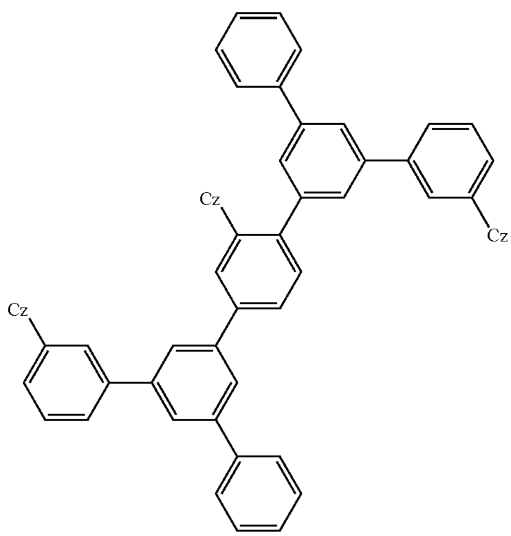
(C33)
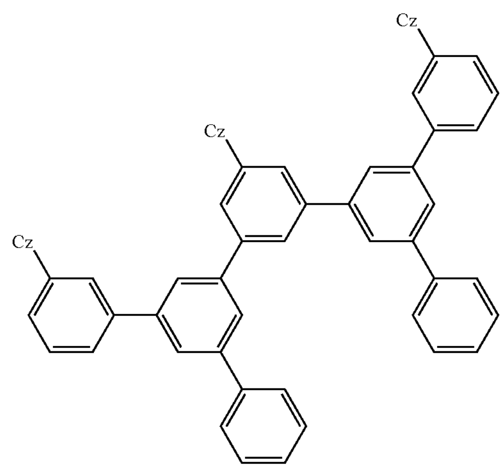
(C34)
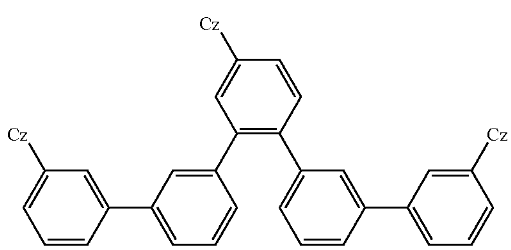
(C35)
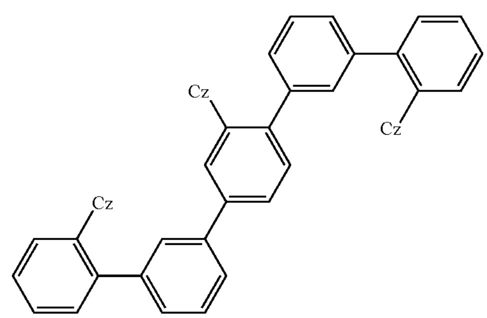

-continued
(C36)
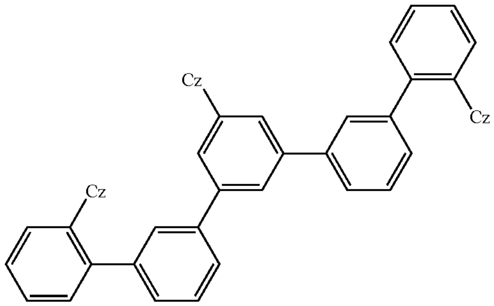
(C37)
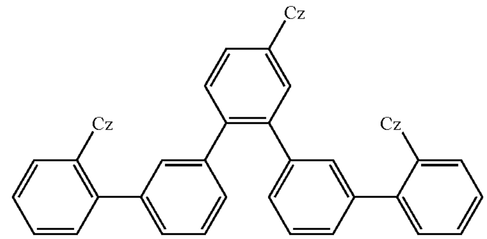
(C38)
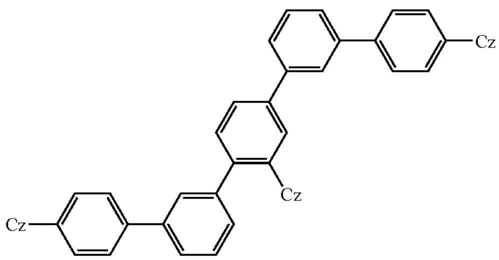
(C39)
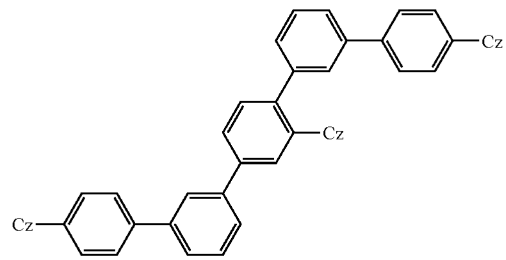
[Chemical Formula 93]
(C40)
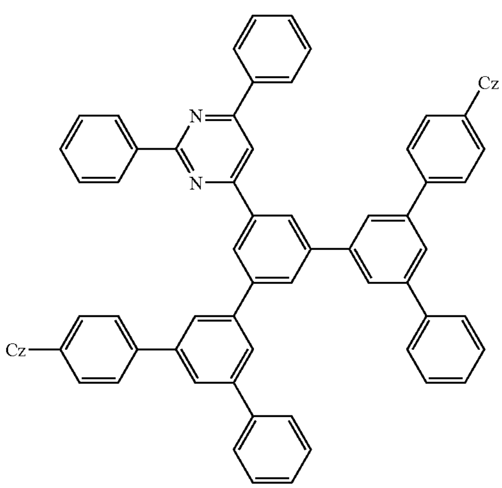
(C41)
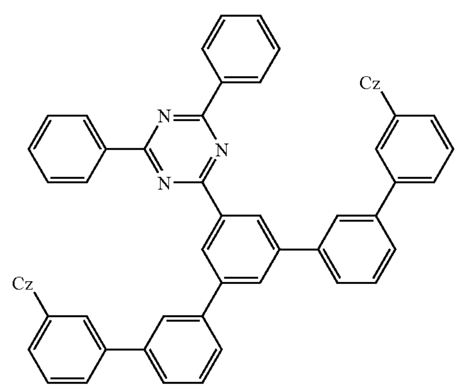
(C42)
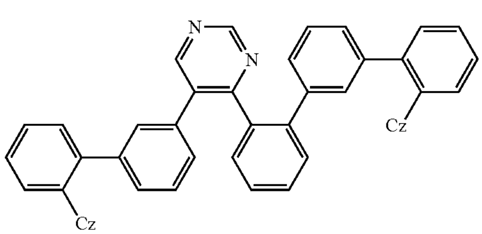
(C43)
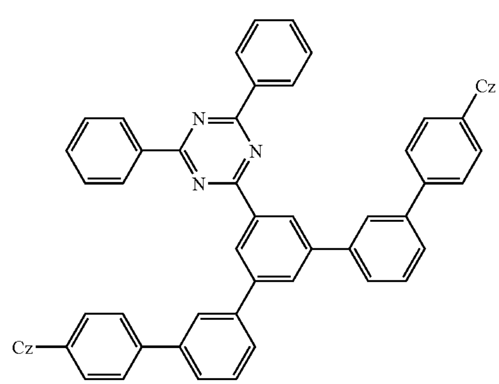

-continued
(C44)
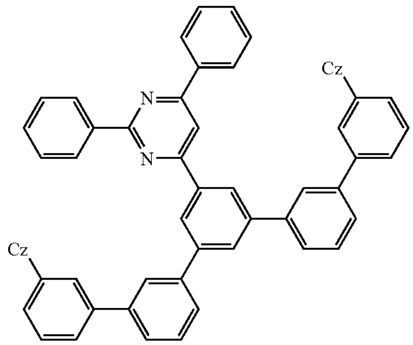
(C45)
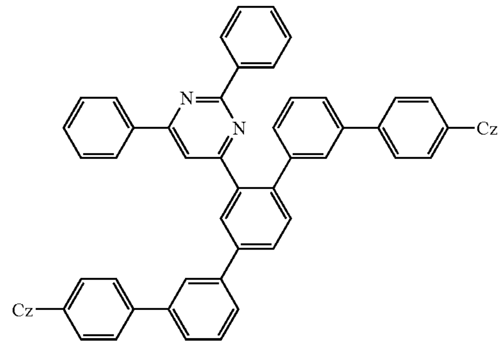
(C46)
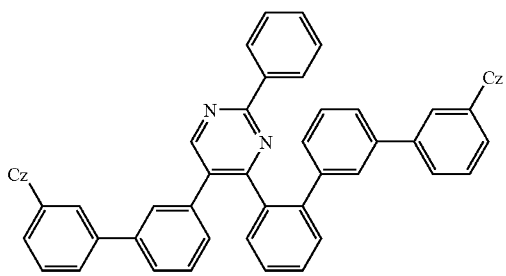
(C47)
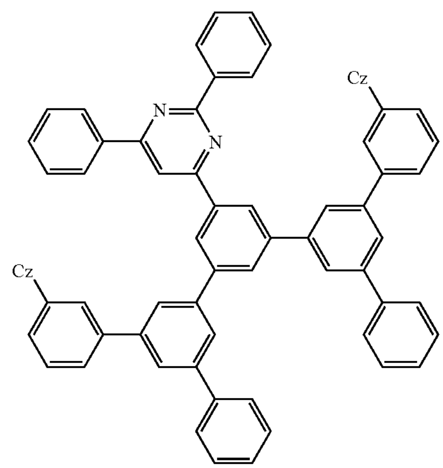
(C48)
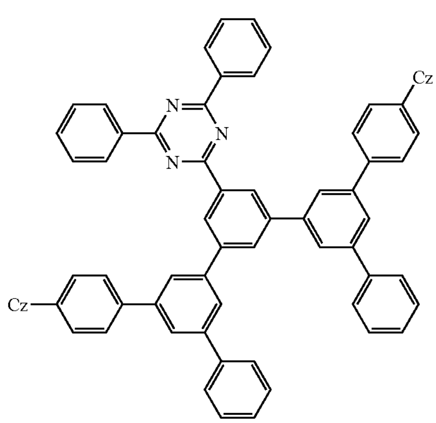
(C49)
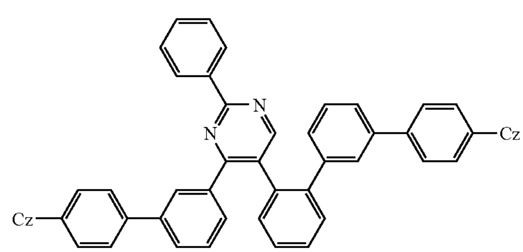

-continued
(C50)
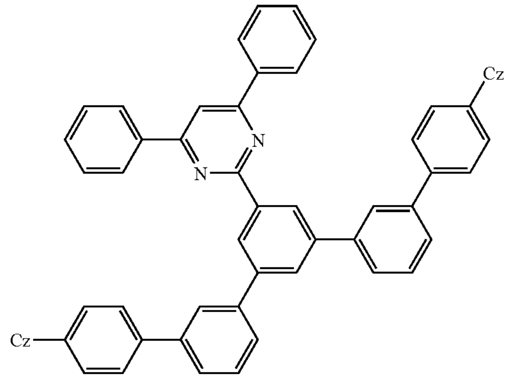
(C51)
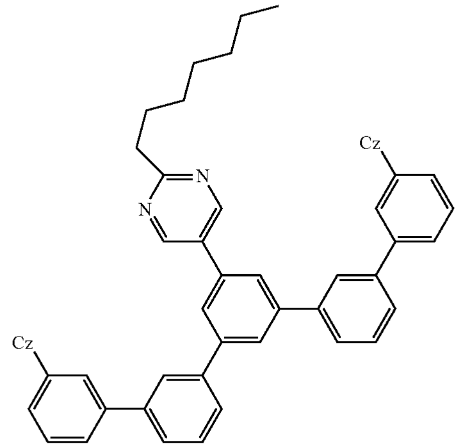
(C52)
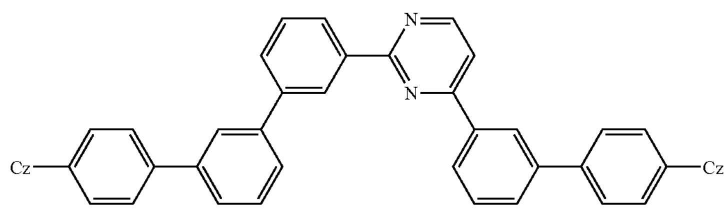
(C53)
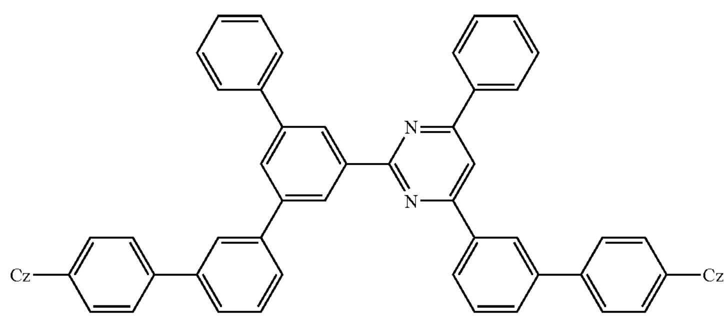
(C54)
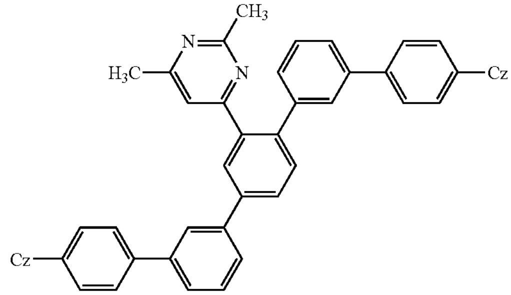
(C55)
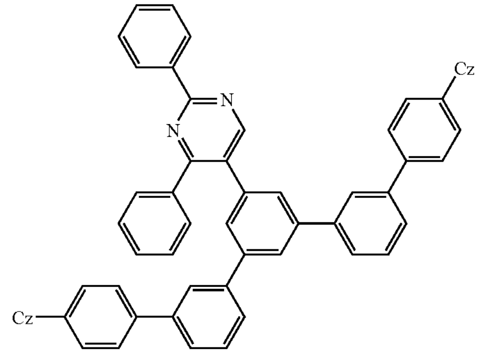

-continued
(C56)
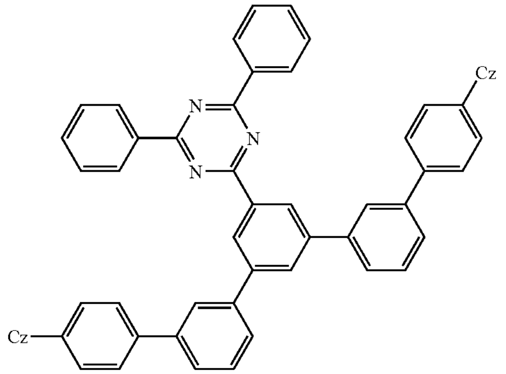
(C57)
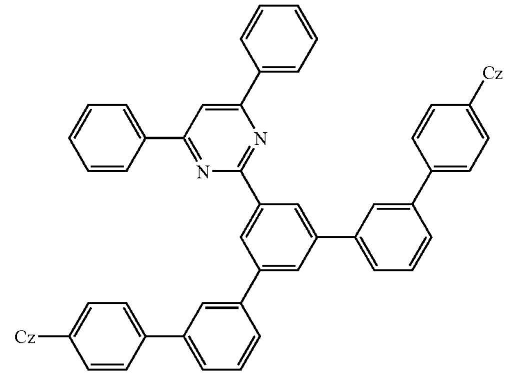
(C58)
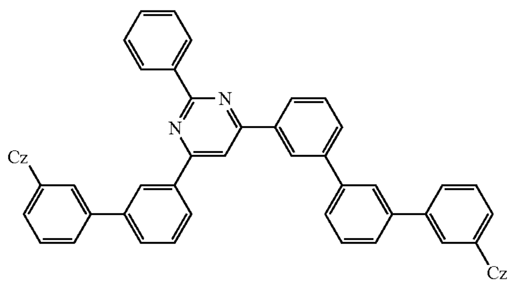
(C59)
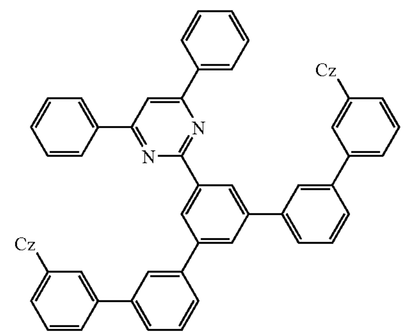
(C60)
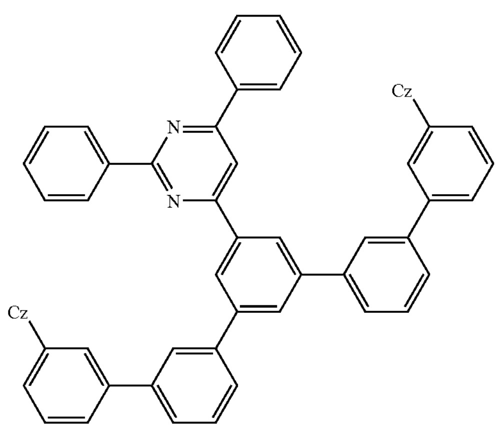
(C61)
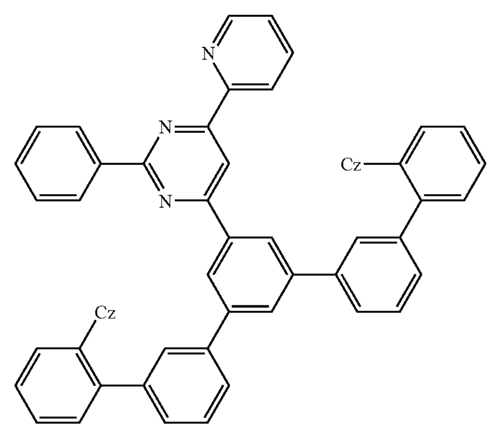
(C62)
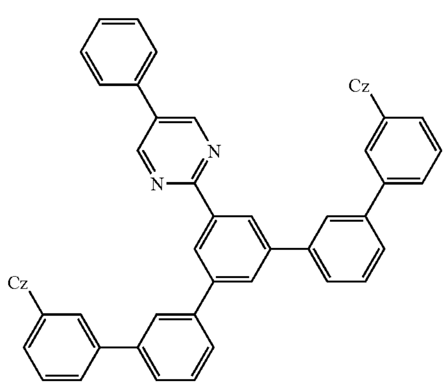
(C63)
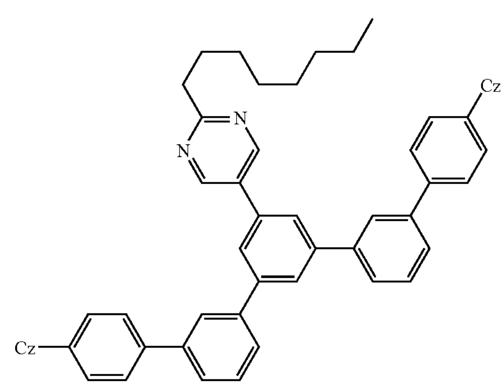

-continued
(C64)
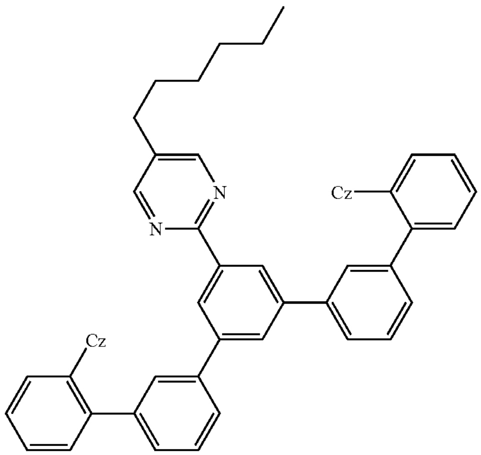
[Chemical Formula 94]
(C65)
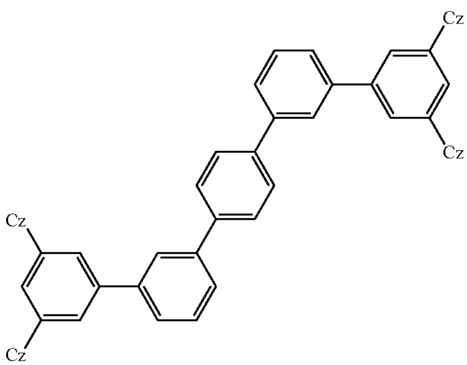
(C66)
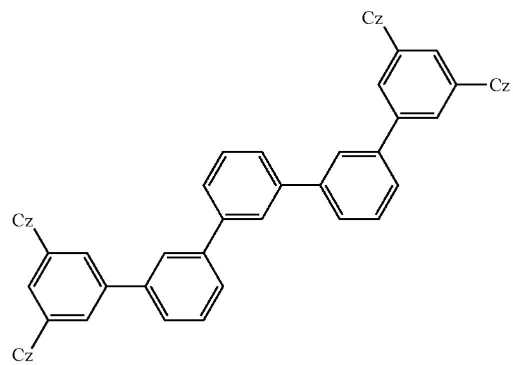
(C67)
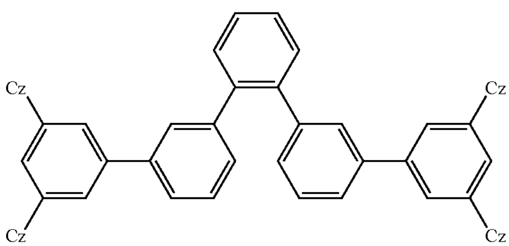
(C68)
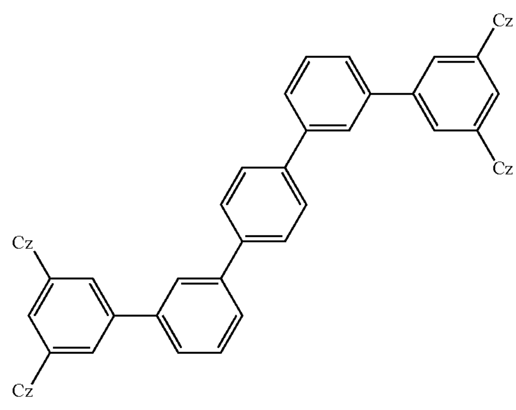
(C69)
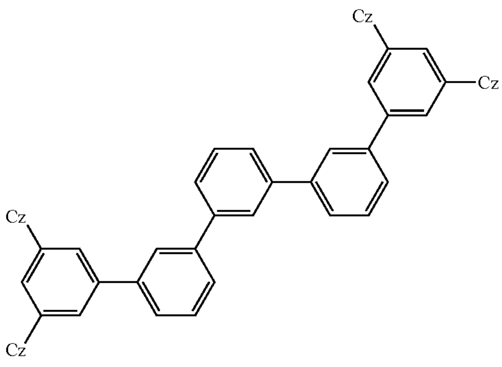
(C70)
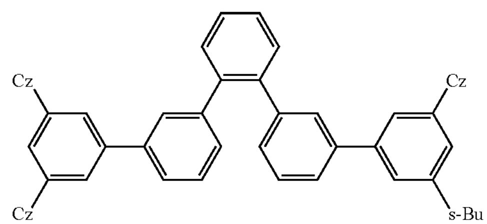

-continued
(C71)
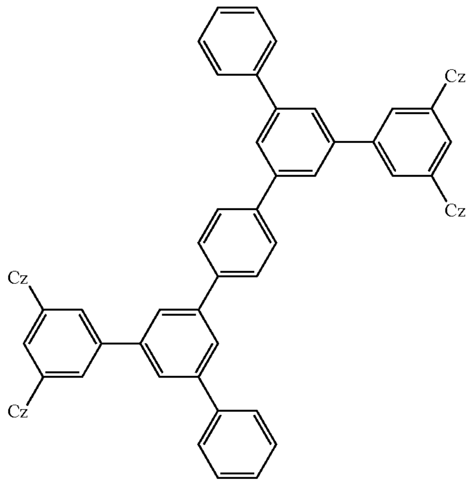
(C72)
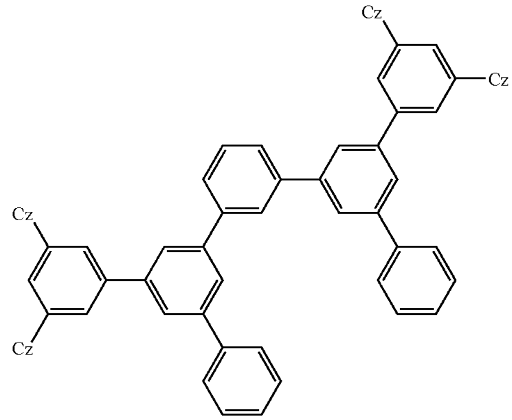
(C73)
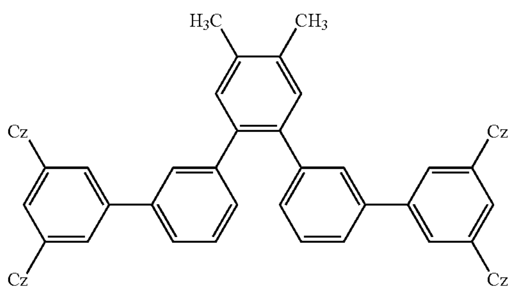
(C74)
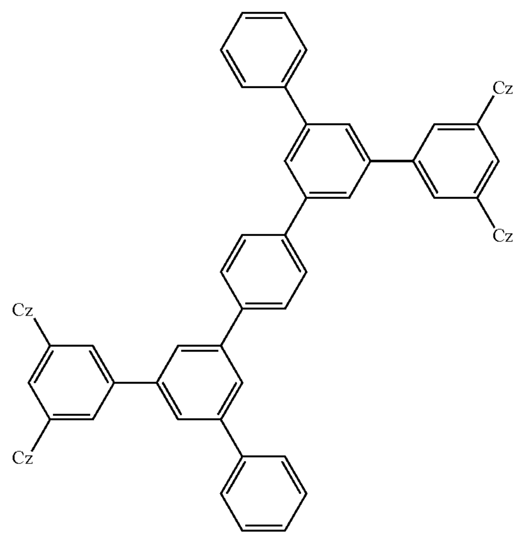
(C75)
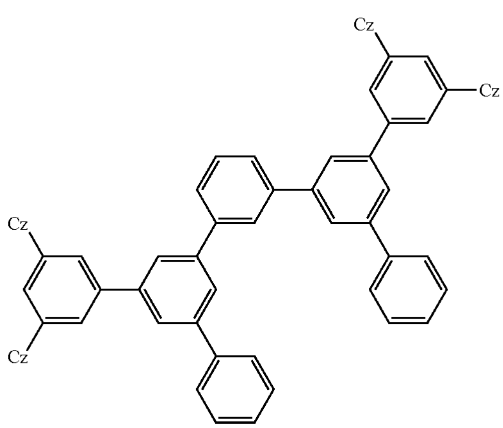
(C76)
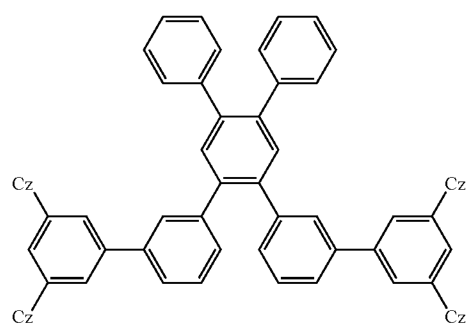

-continued
(C77)
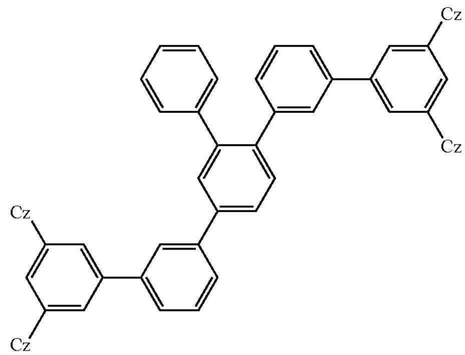
(C78)
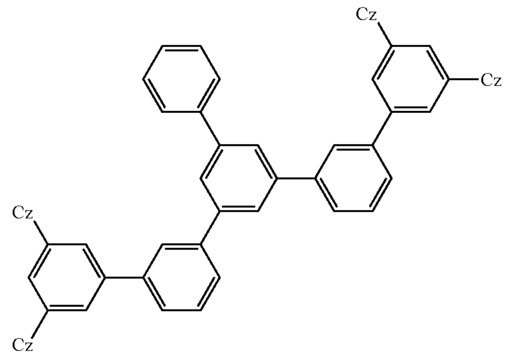
(C79)
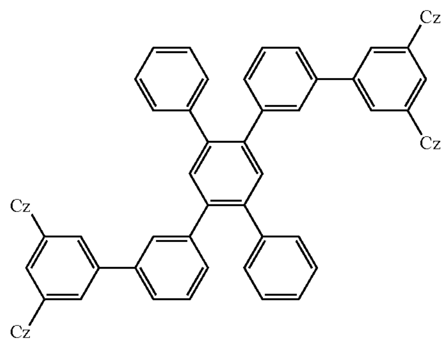
(C80)
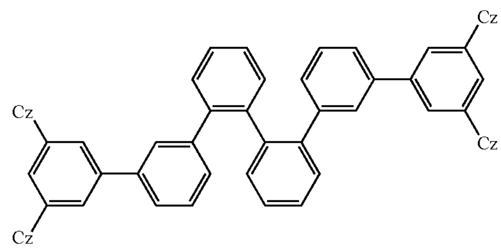
(C81)
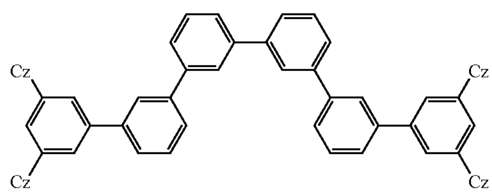
(C82)
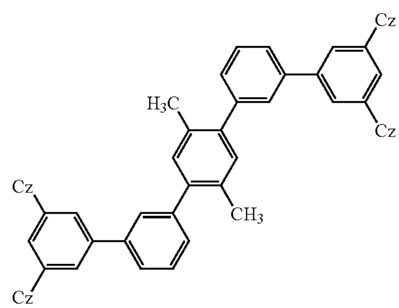
(C83)
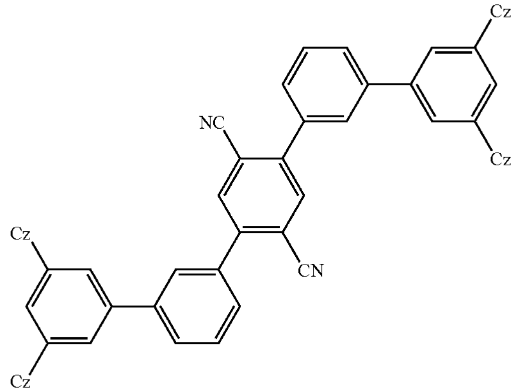
(C84)
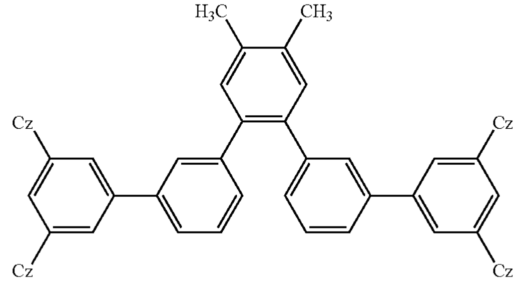

-continued
[Chemical Formula 95]
(C85)
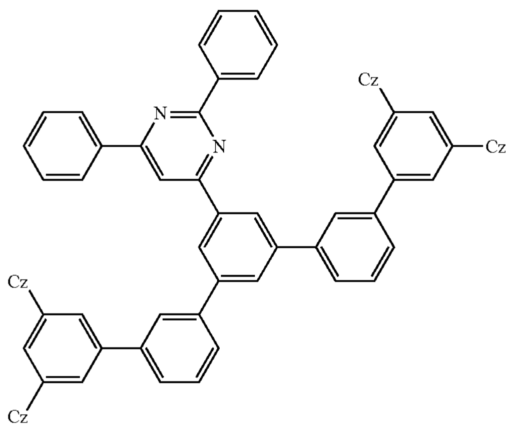
(C86)
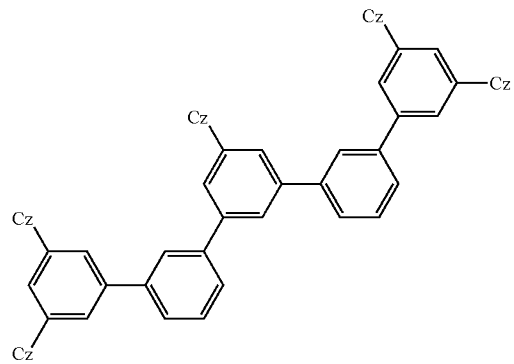
(C87)
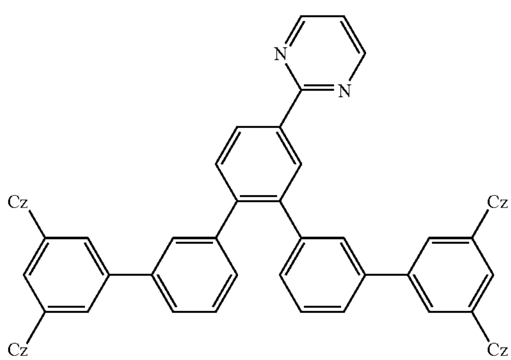
(C88)
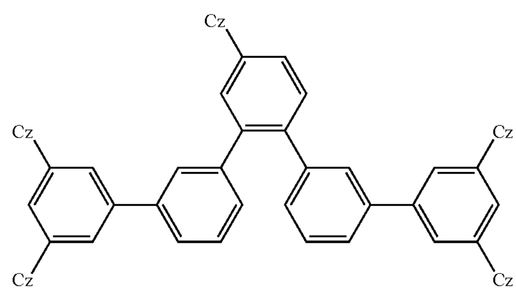
(C89)
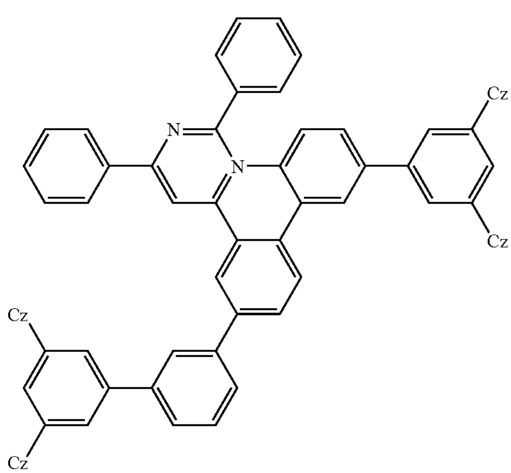
(C90)
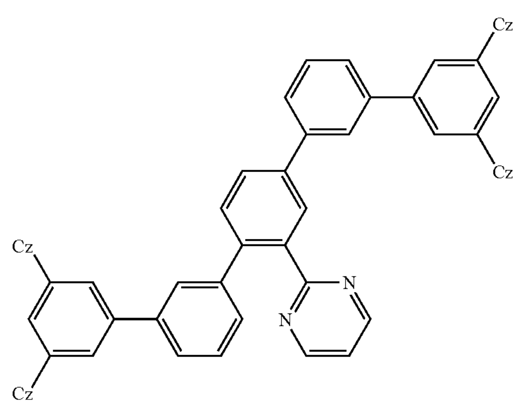

-continued
(C91)
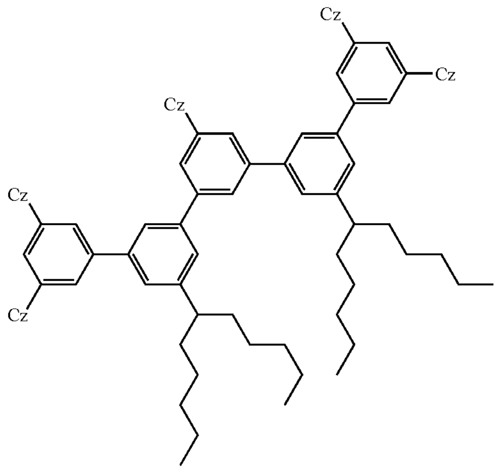
(C92)
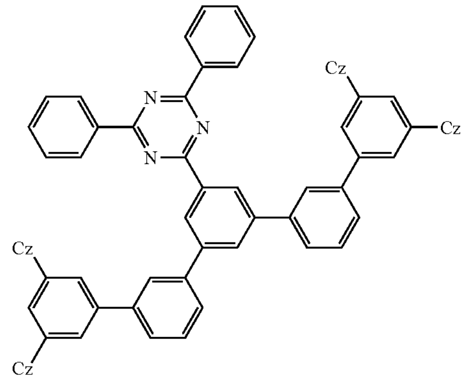
(C93)
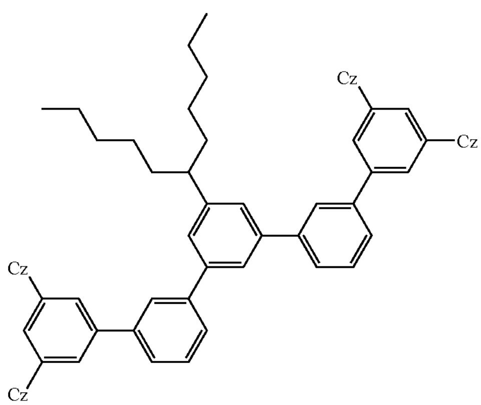
(C94)
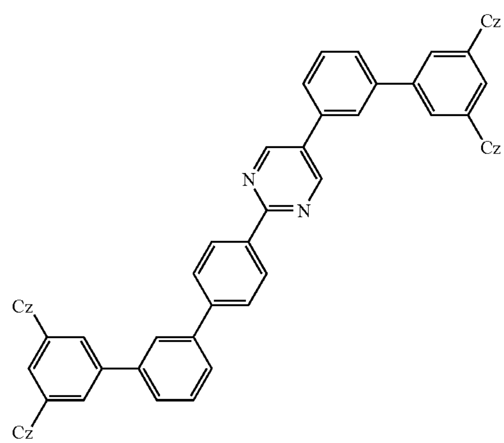
(C95)
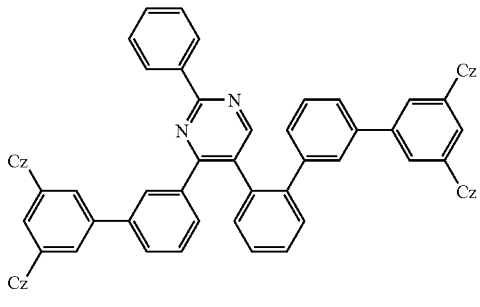
(C96)
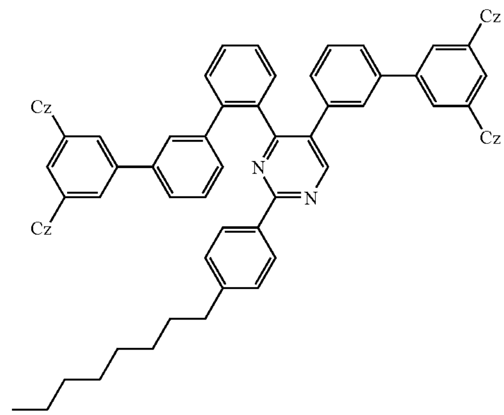

-continued
(C97)
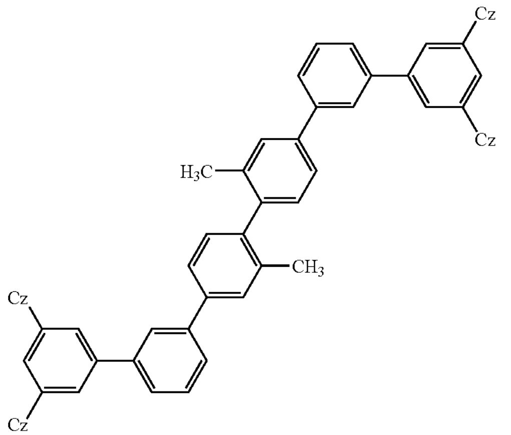
(C98)
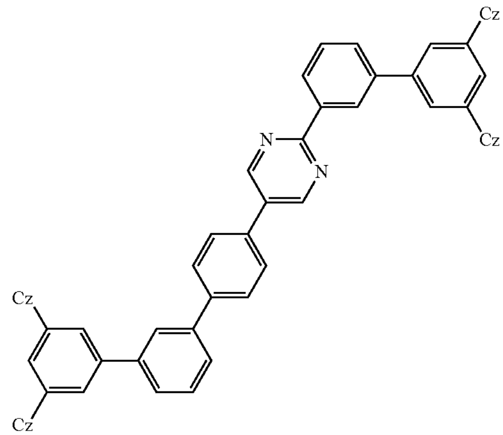
(C99)
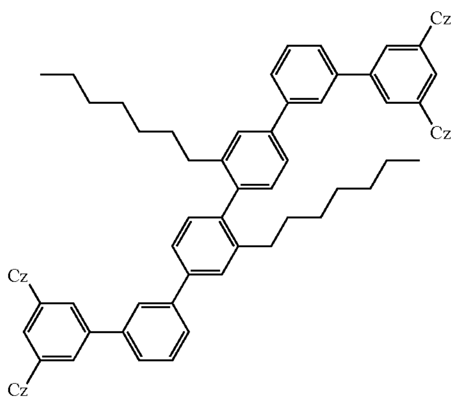
(C100)
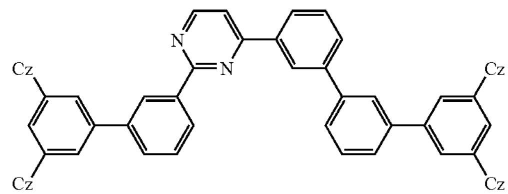
(C101)
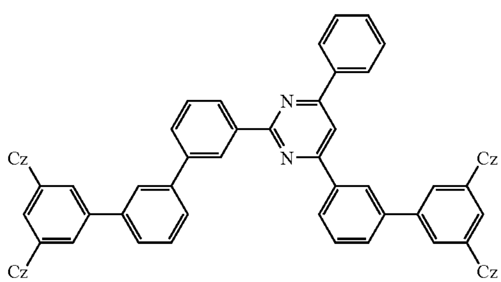
(C102)
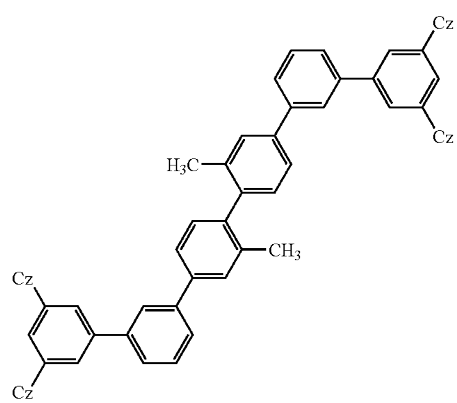
(C103)
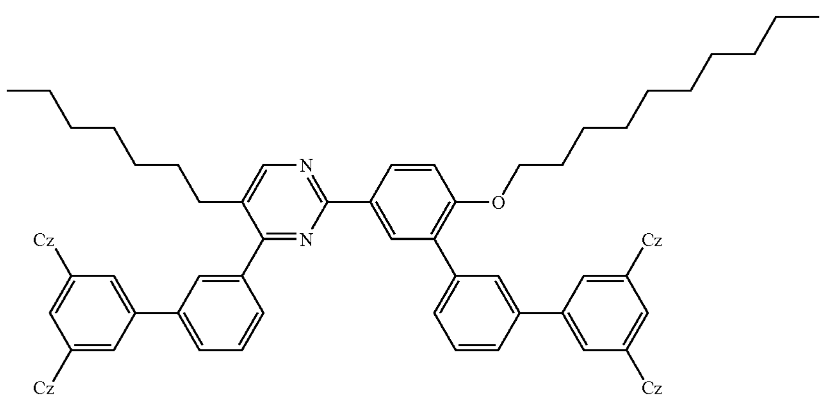

-continued
(C104)
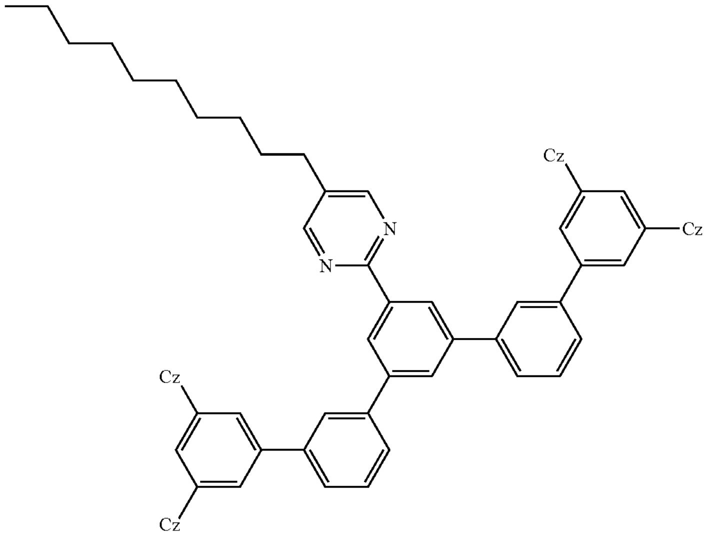
[Chemical Formula 96]
(C105)
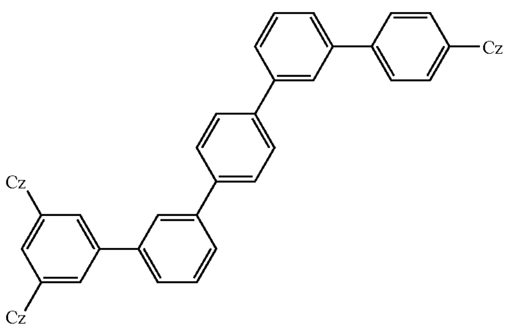
(C106)
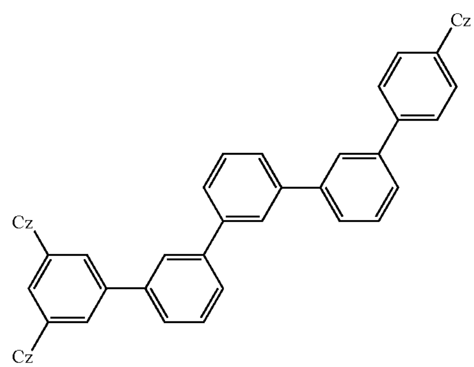
(C107)
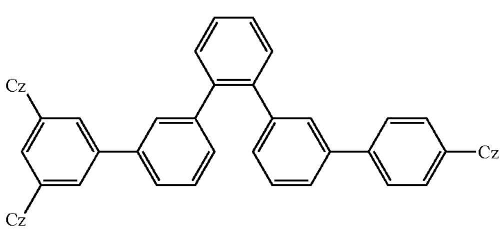
(C108)
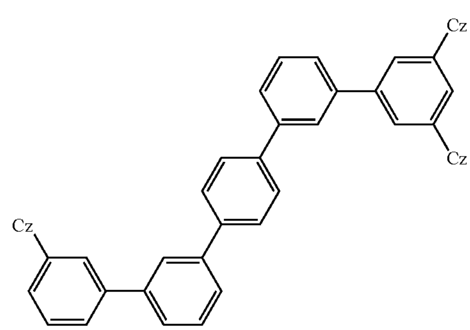
(C109)
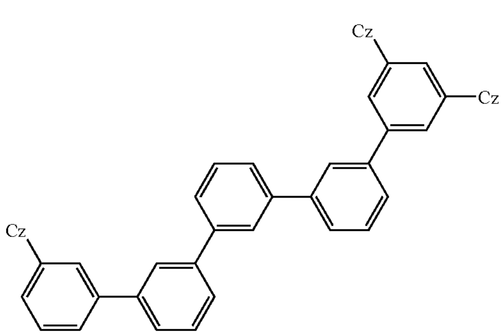
(C110)
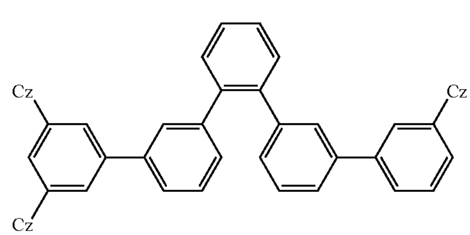

-continued
(C111)
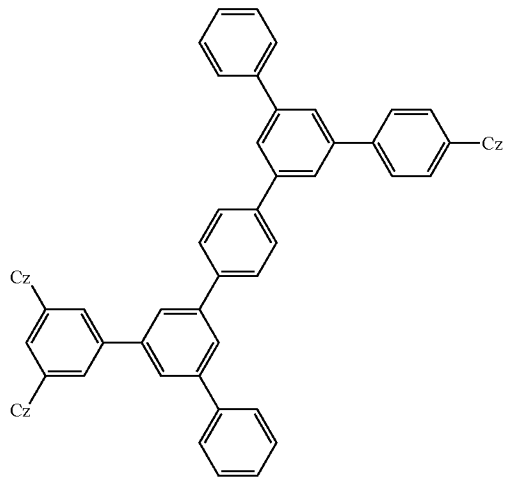
(C112)
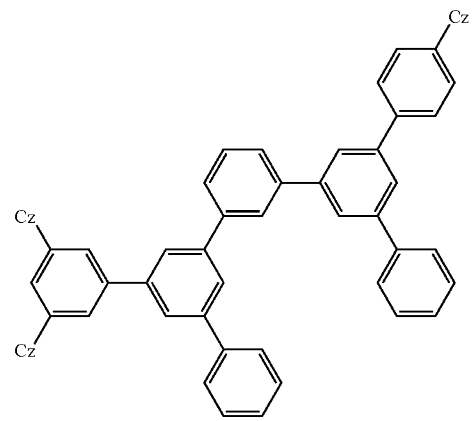
(C113)
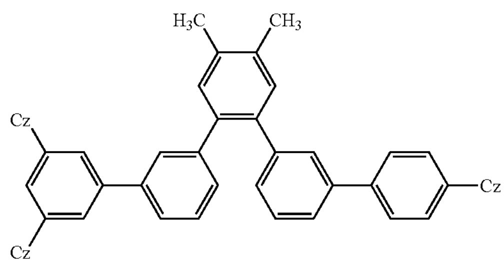
(C114)
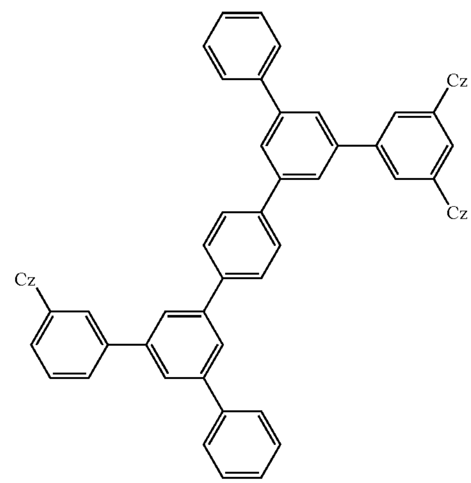
(C115)
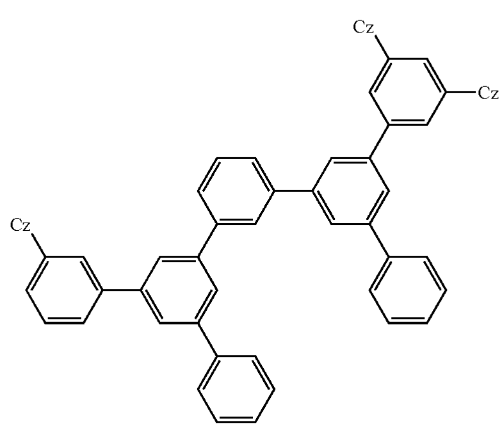
(C116)
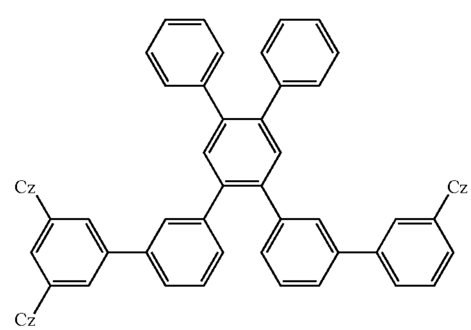

-continued
(C117)
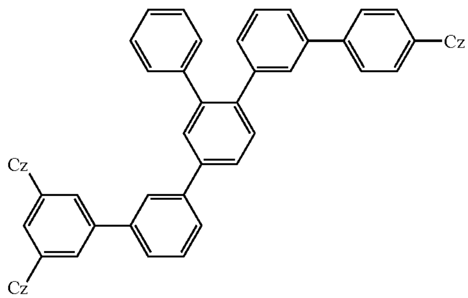
(C118)
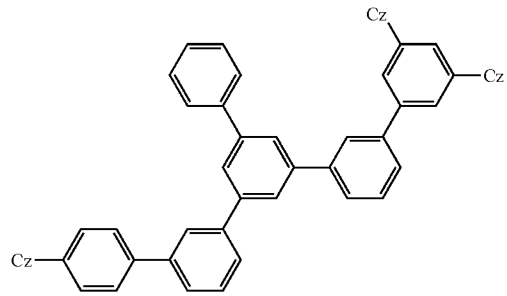
(C119)
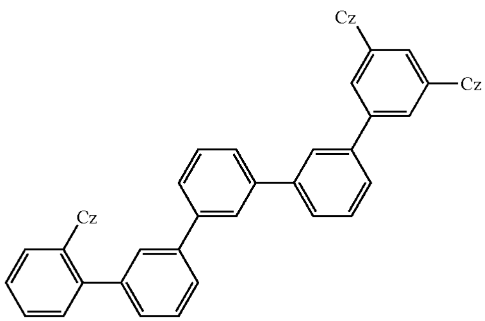
(C120)
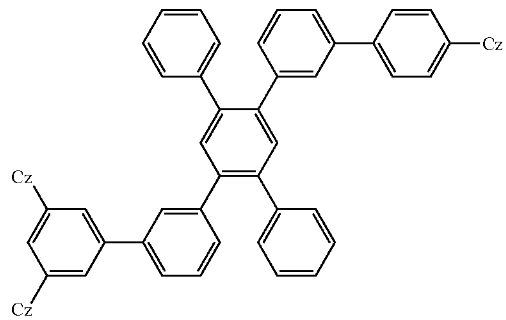
(C121)
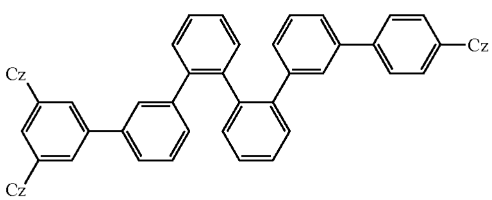
(C122)
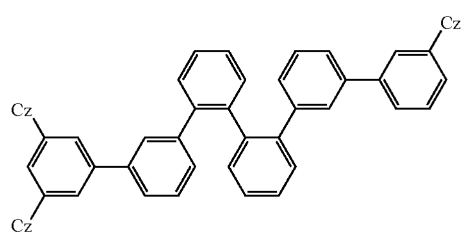
(C123)
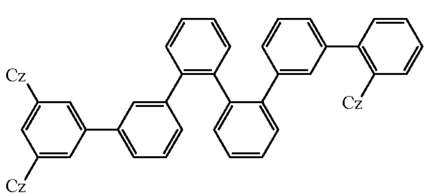
(C124)
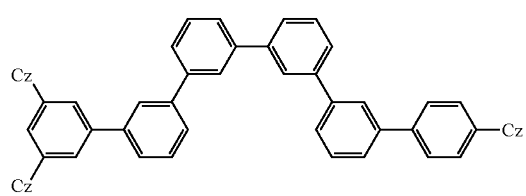
(C125)
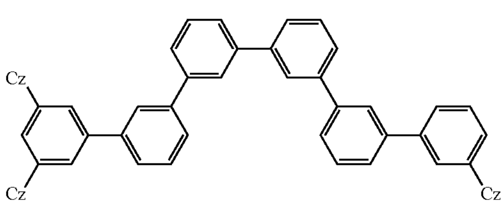
(C126)
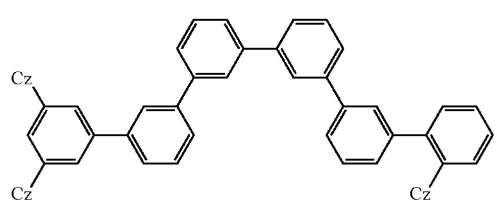

-continued
[Chemical Formula 97]
(C127)
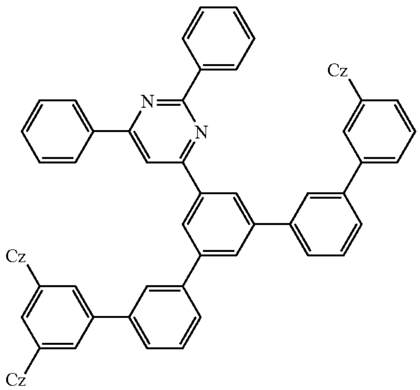
(C128)
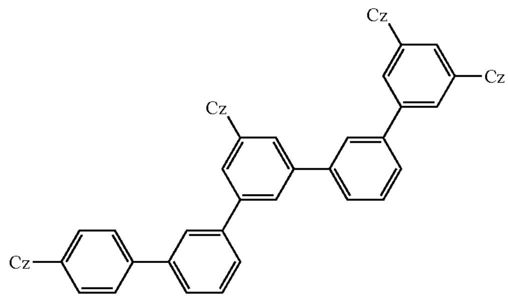
(C129)
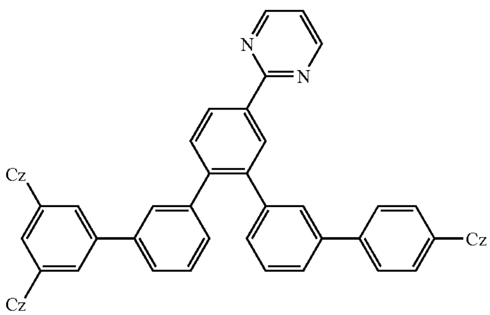
(C130)
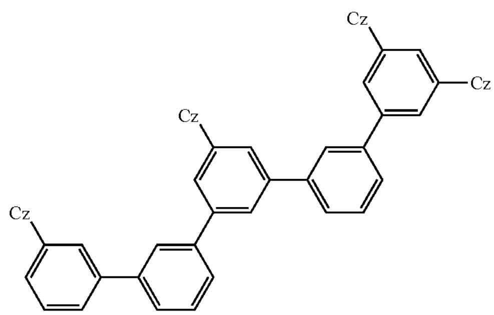
(C131)
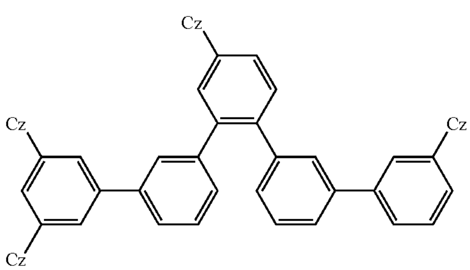
(C132)
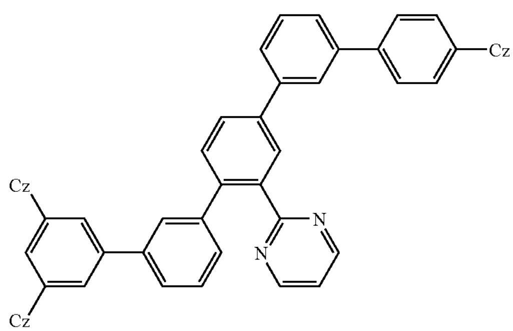
(C133)
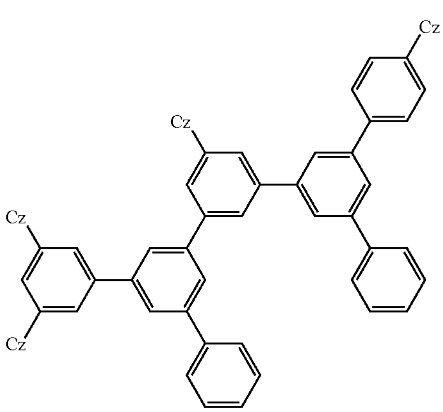
(C134)
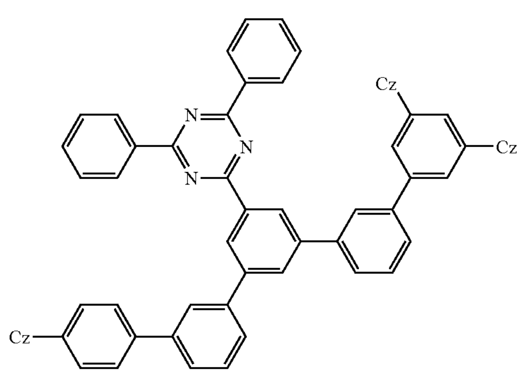

-continued
(C135)
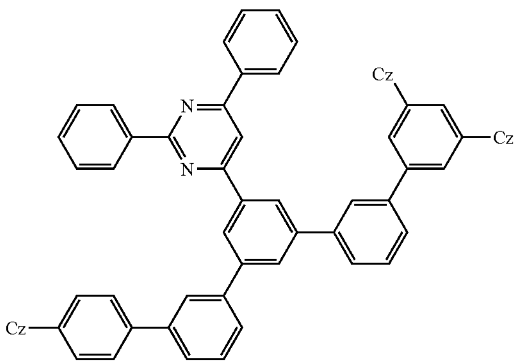
(C136)
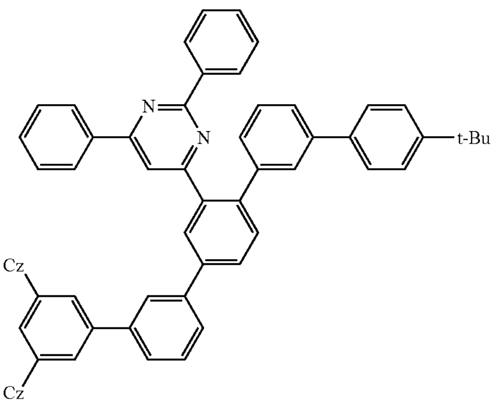
(C137)
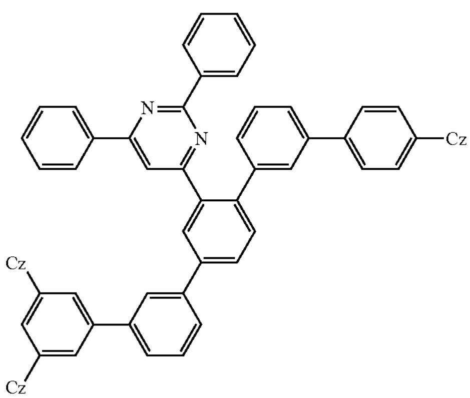
(C138)
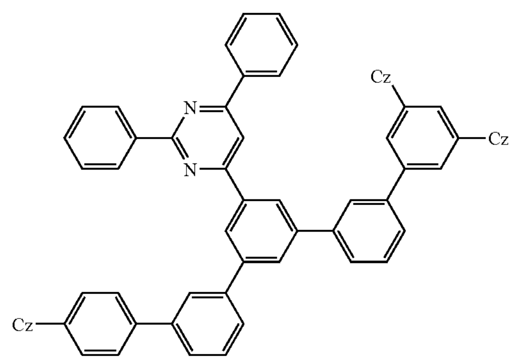
(C139)
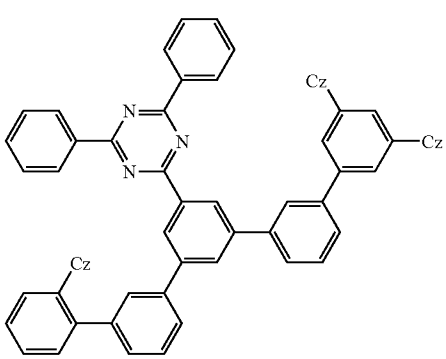
(C140)
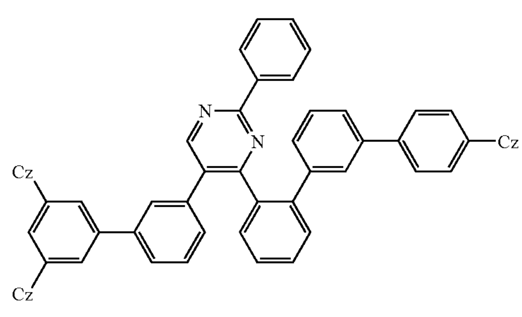
(C141)
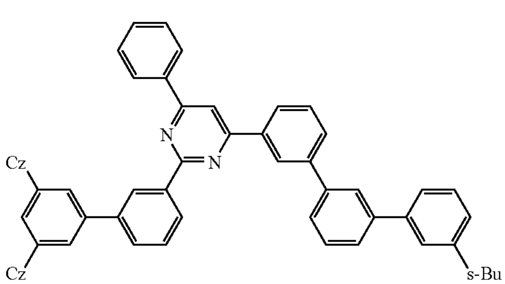
(C142)
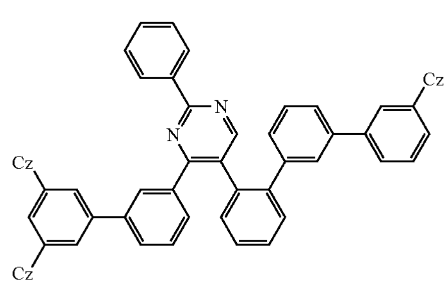

-continued
(C143)
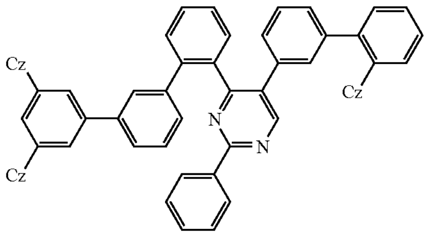
(C144)
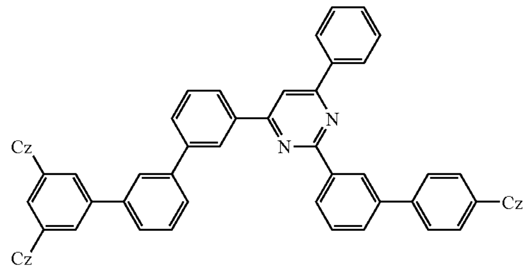
(C145)
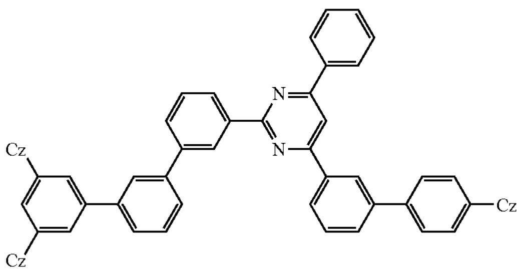
(C146)
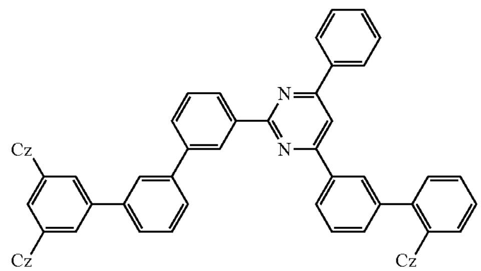
(C147)
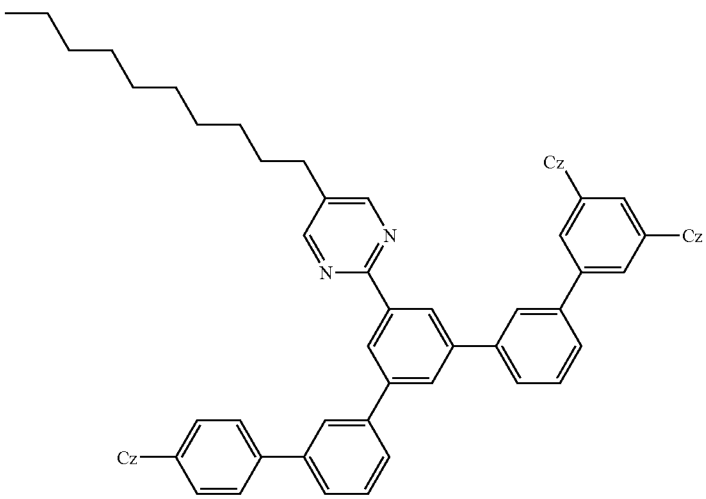
[Chemical Formula 98]
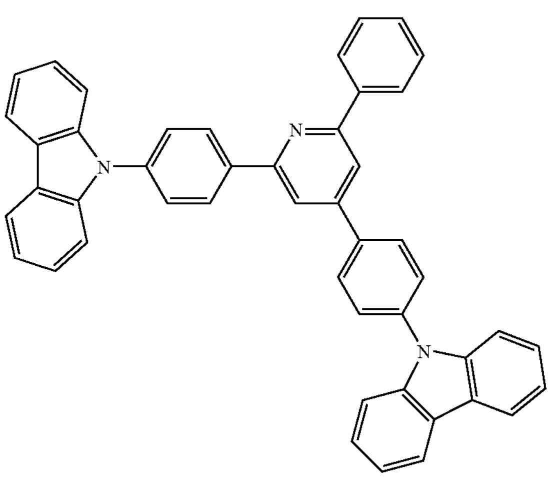

-continued
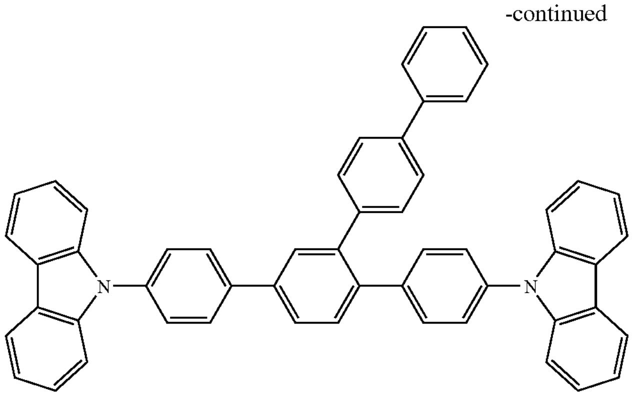
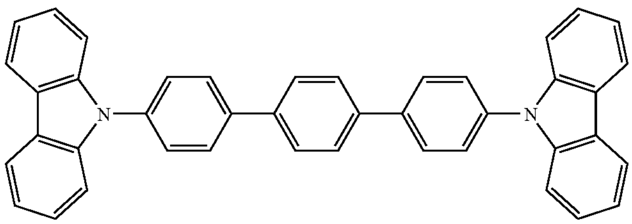
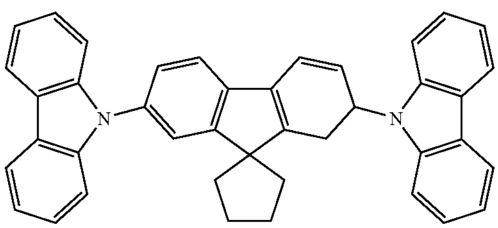
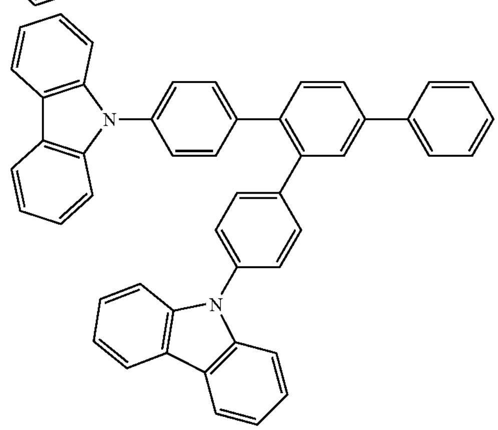
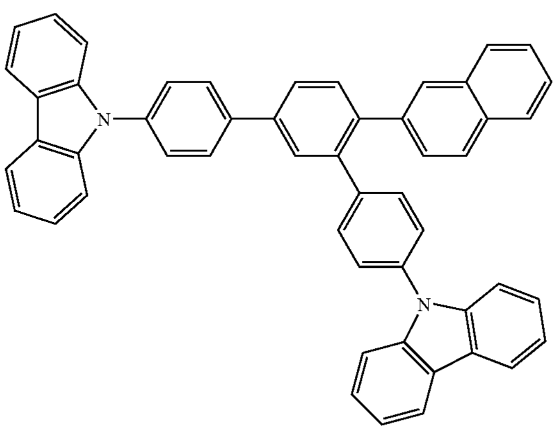
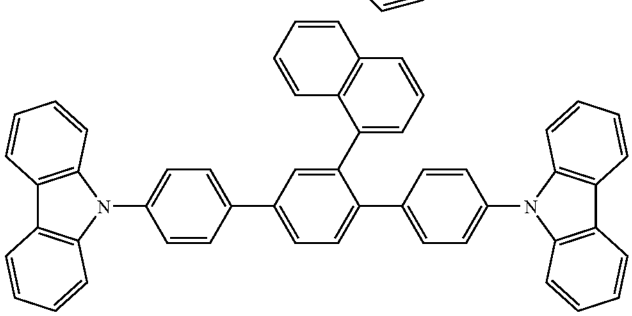

-continued
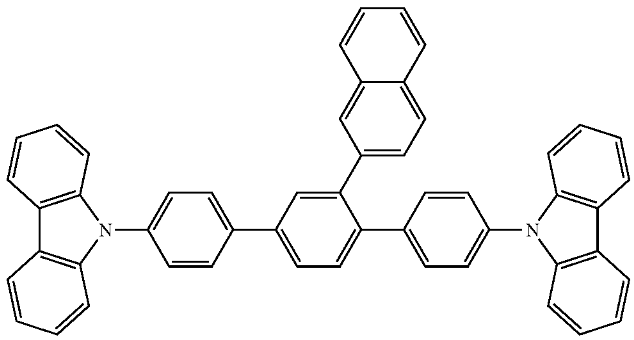
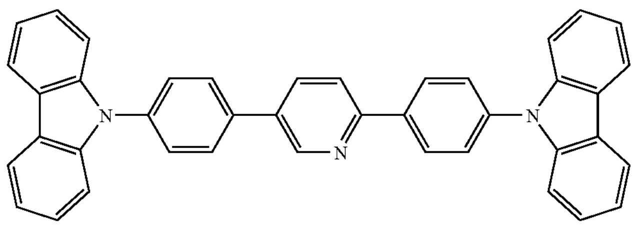
[Chemical Formula 99]
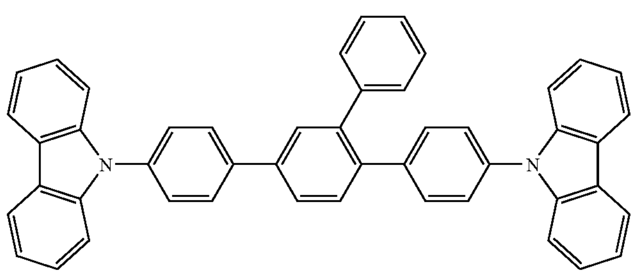
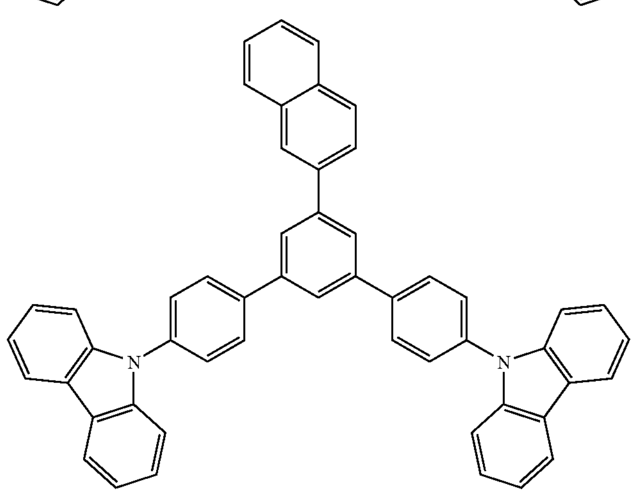

-continued
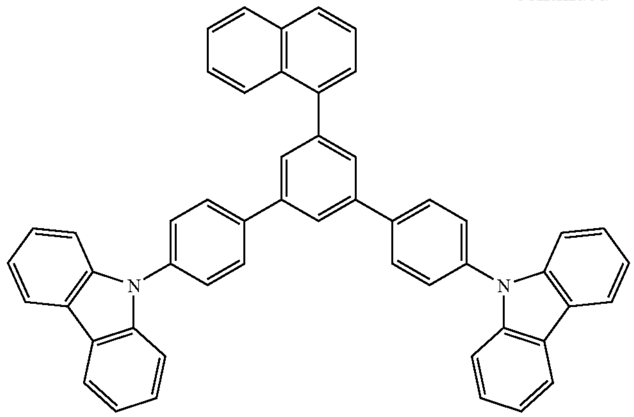
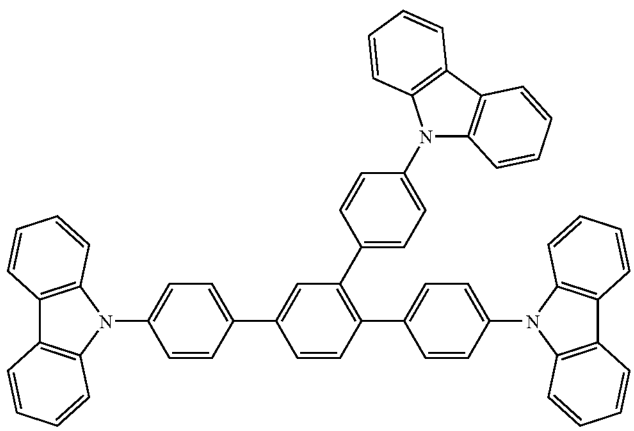
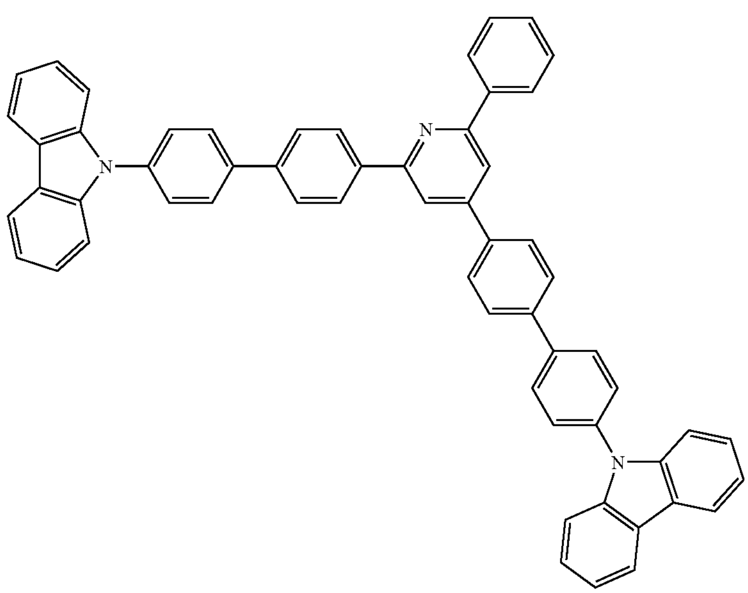

-continued
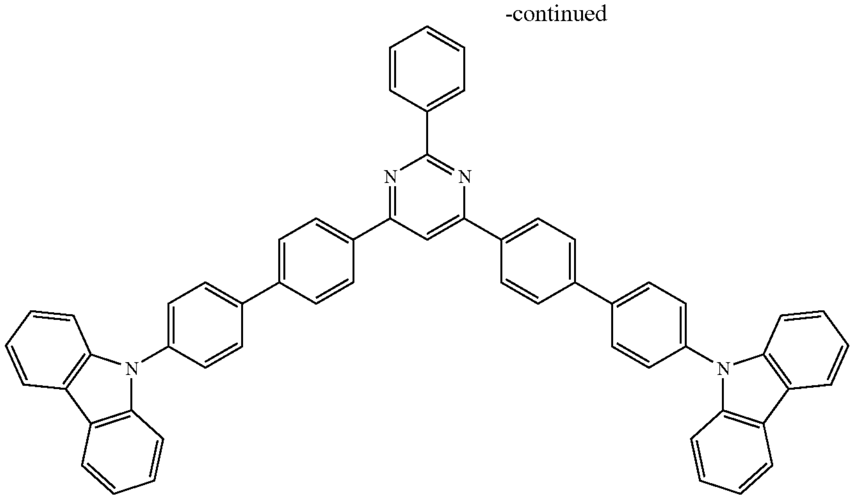
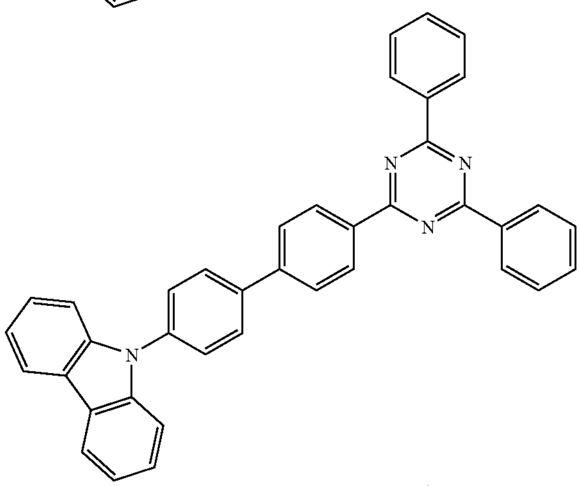
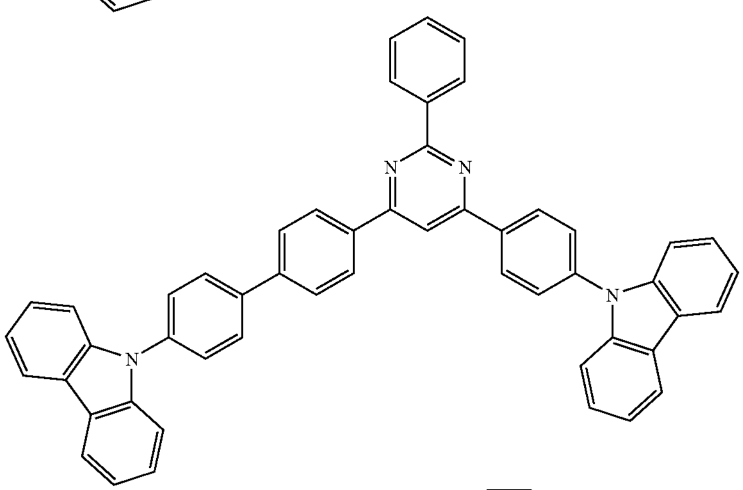
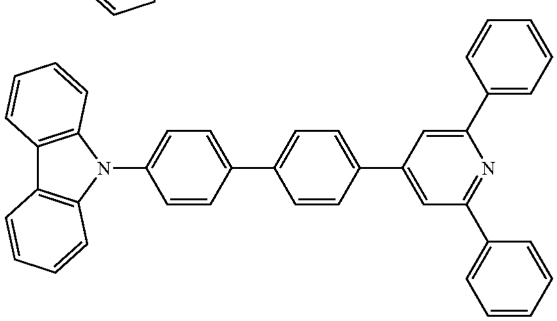

-continued
[Chemical Formula 100]
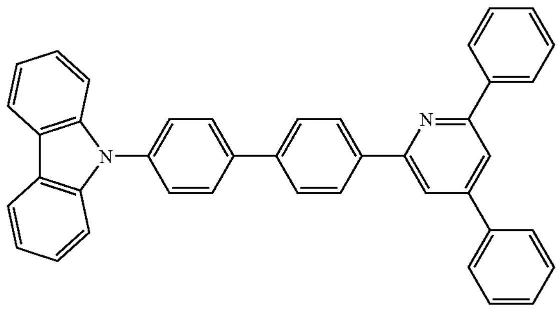
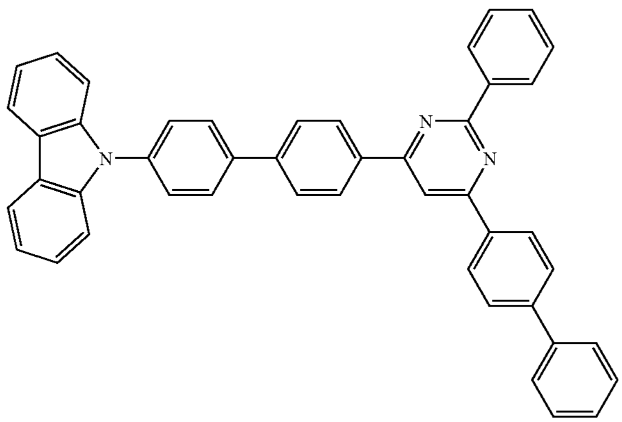
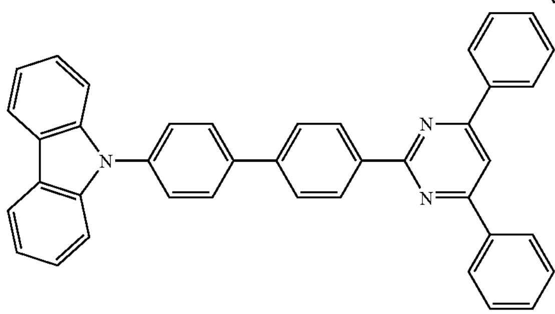
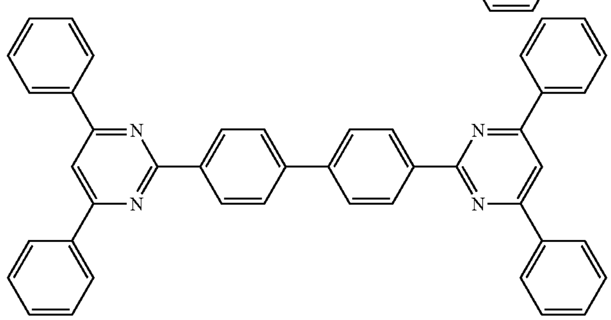
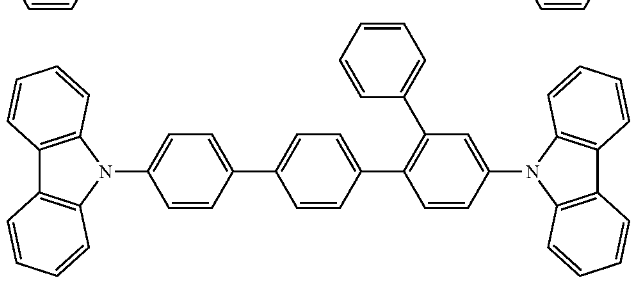

-continued
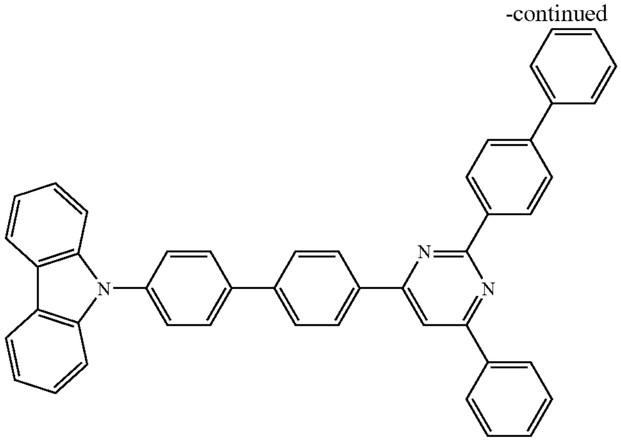
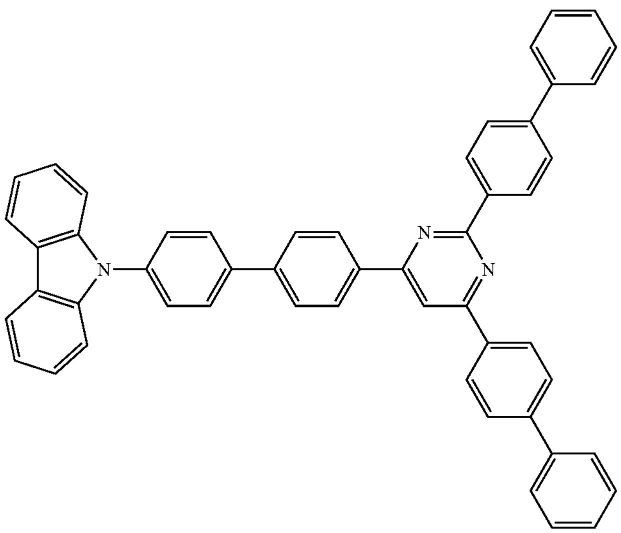
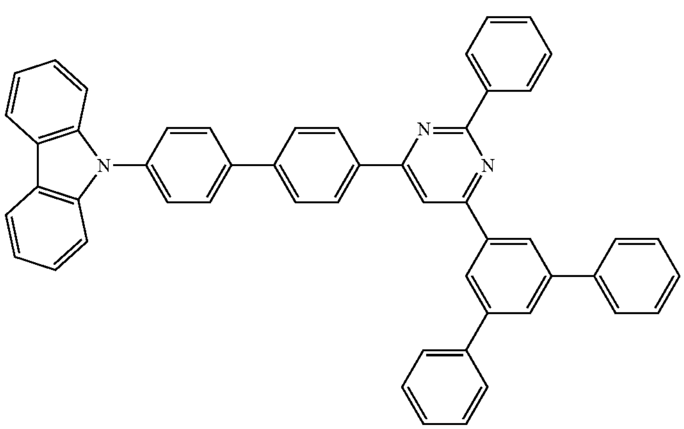

-continued
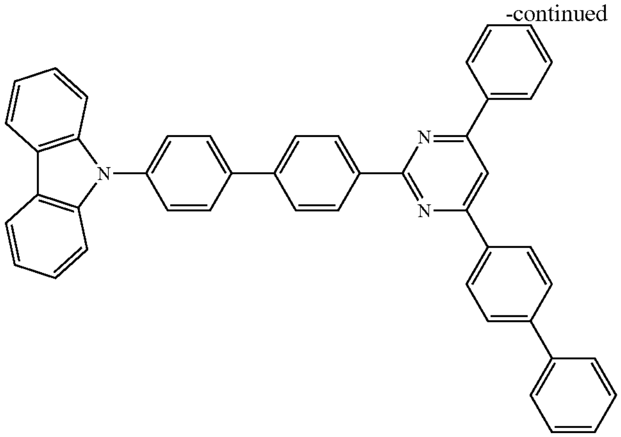
[Chemical Formula 101]
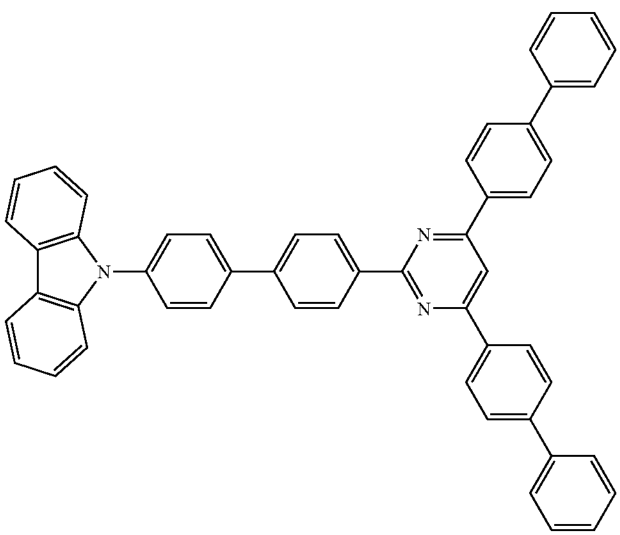
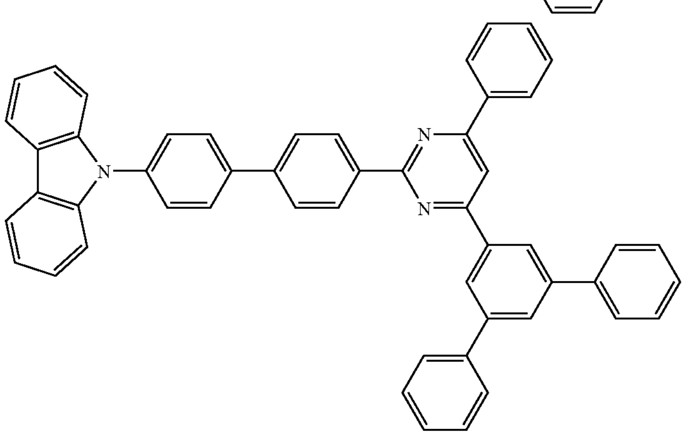

-continued
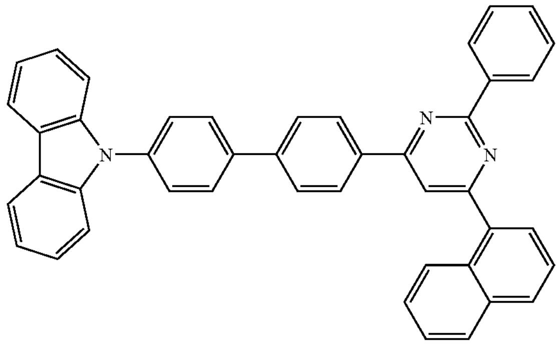
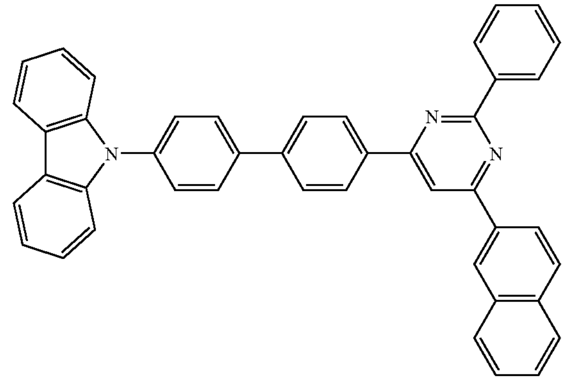
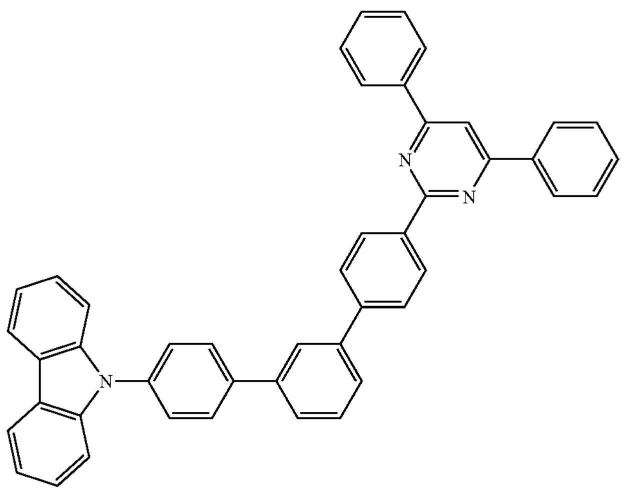
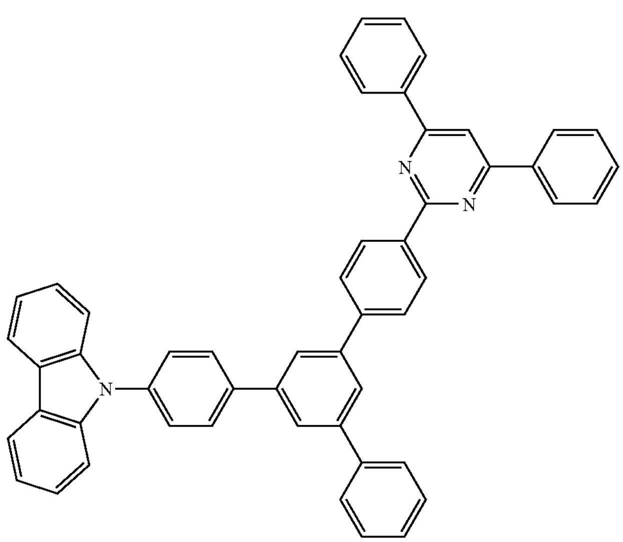

-continued
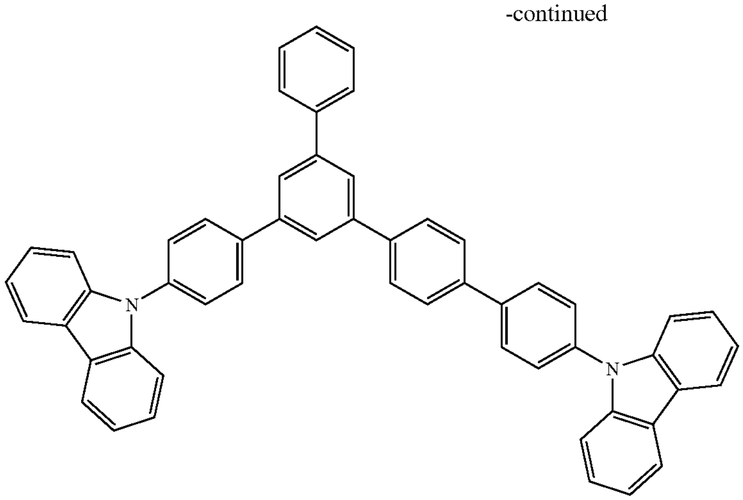
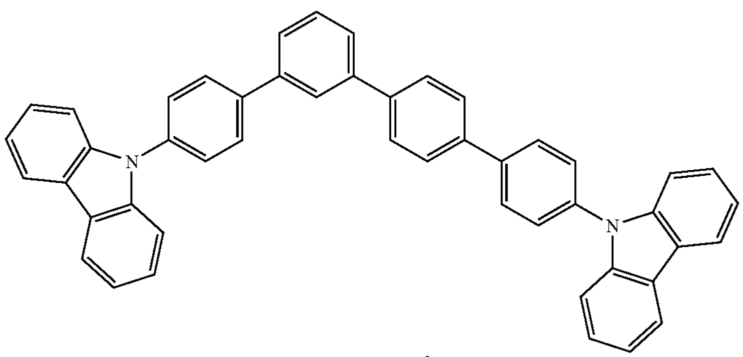
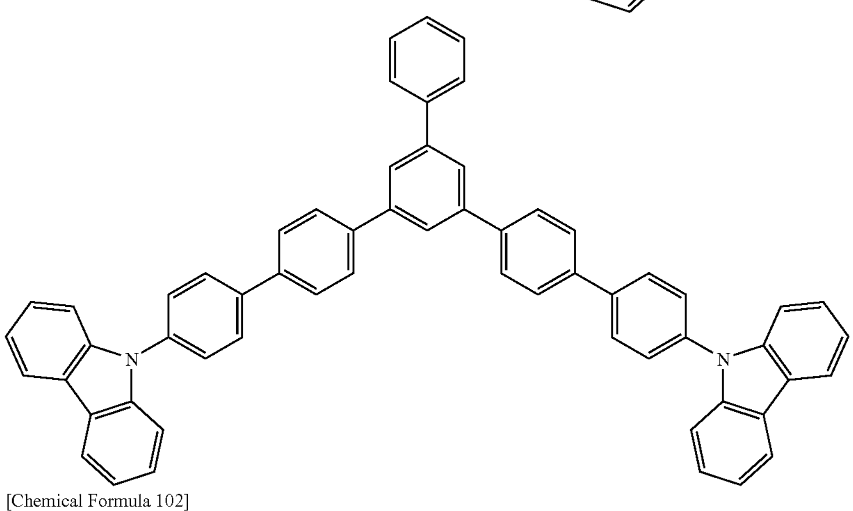
[Chemical Formula 102]
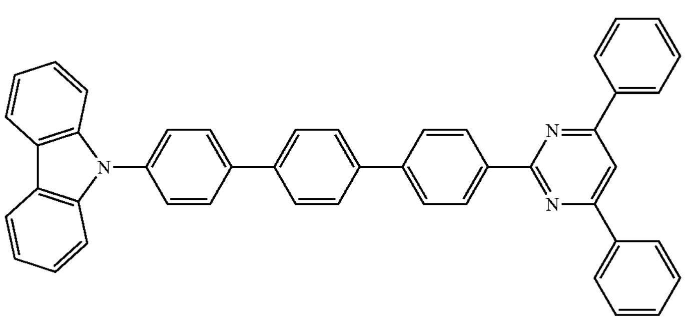

-continued
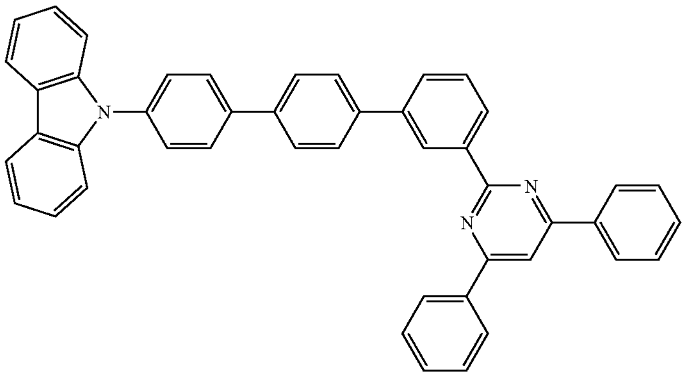
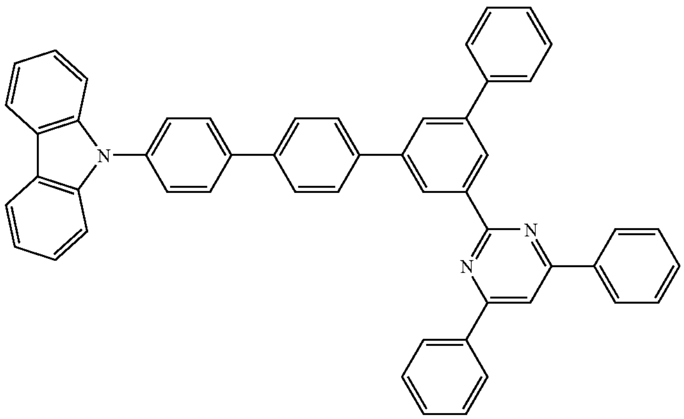
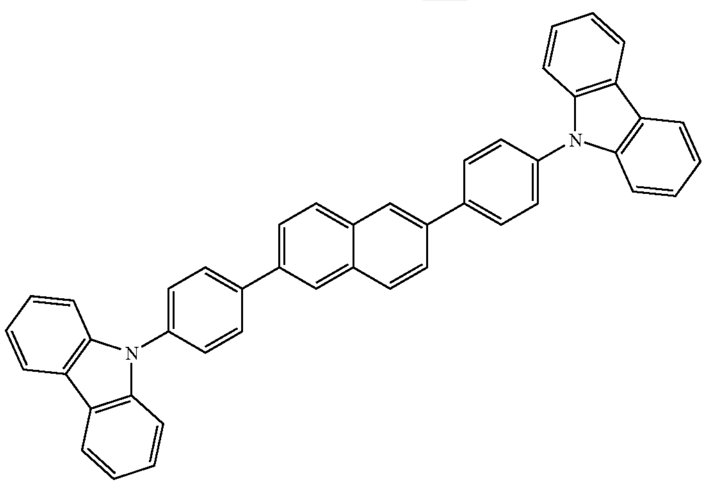
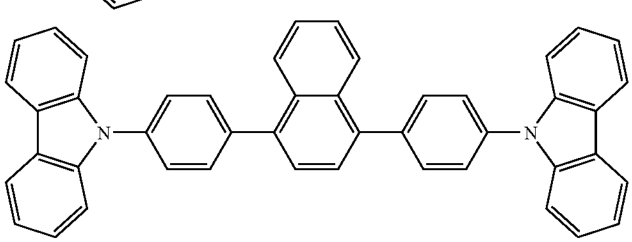
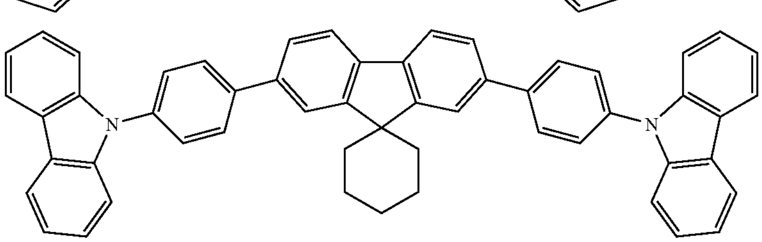

-continued
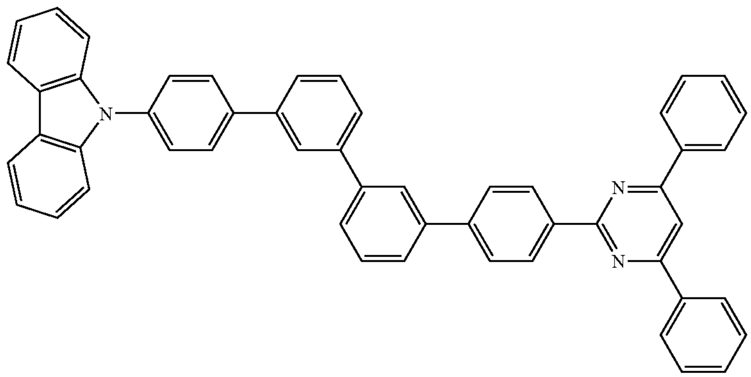
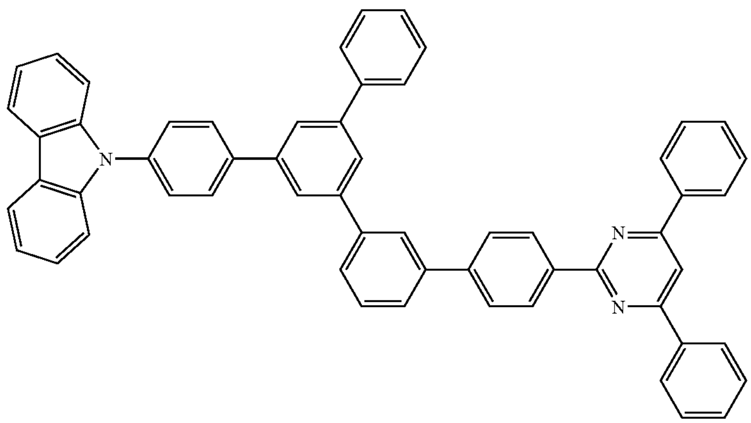
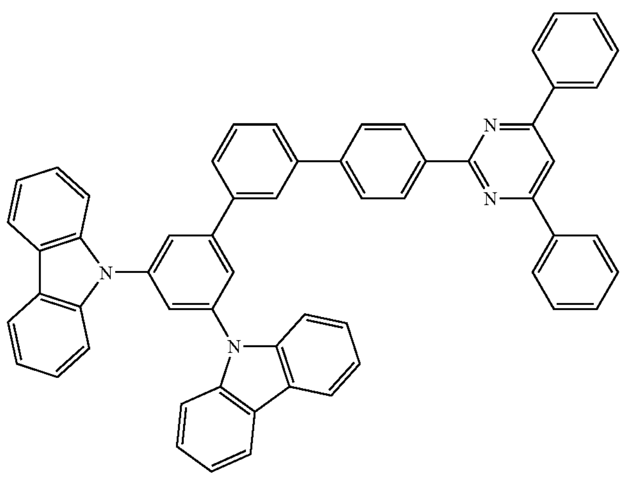
[Chemical Formula 103]
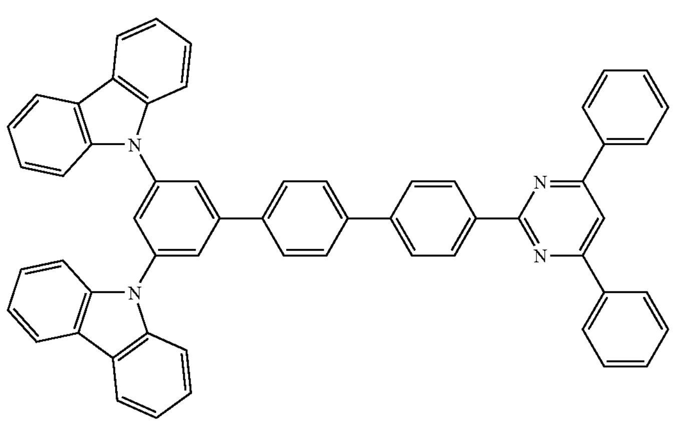

-continued
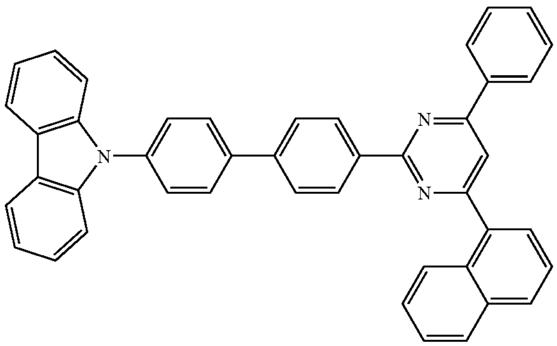
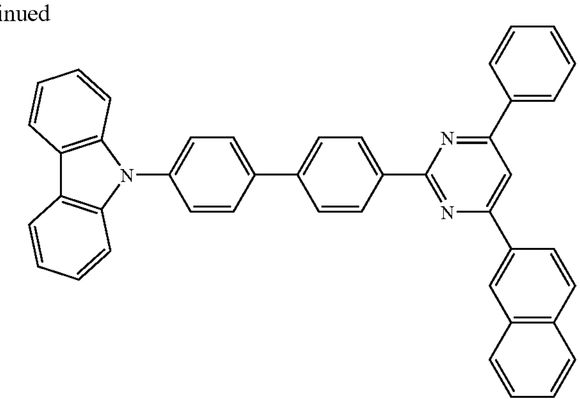
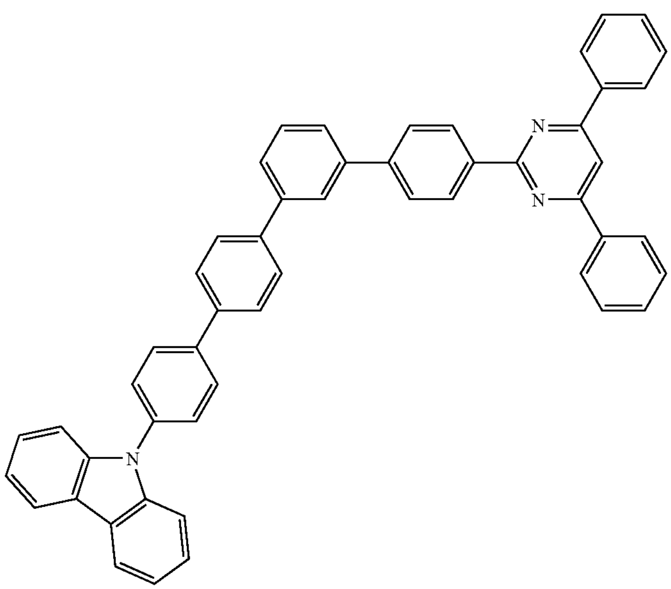
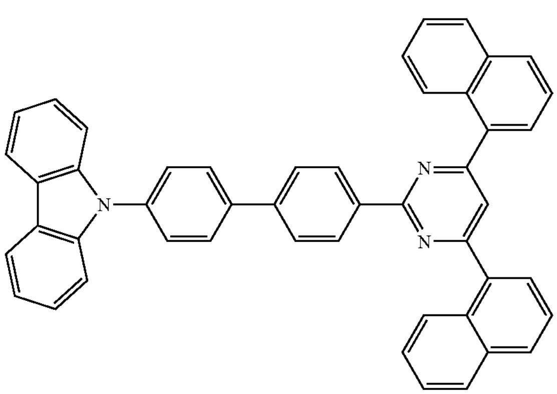
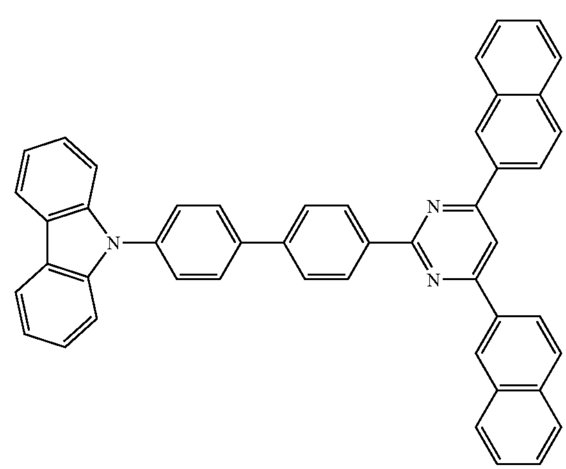

-continued
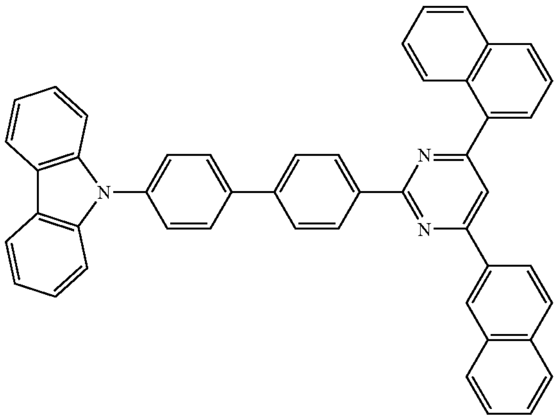
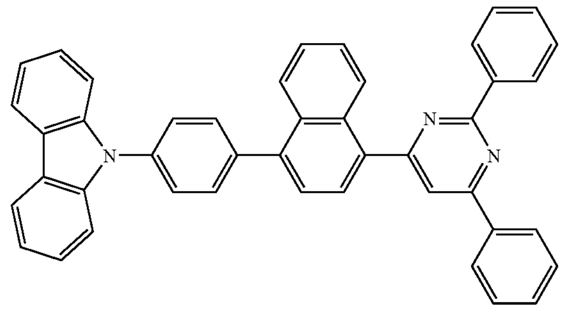
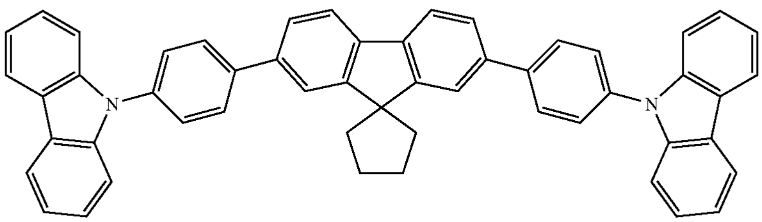
[Chemical Formula 104]
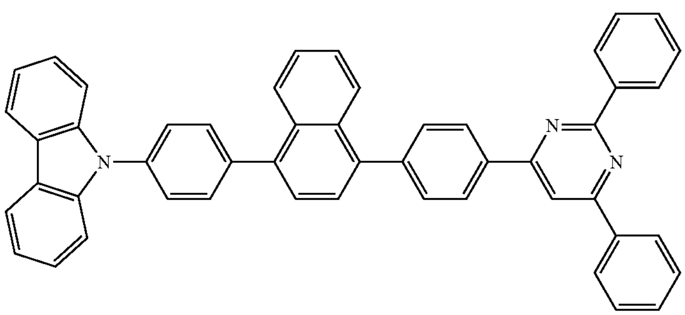
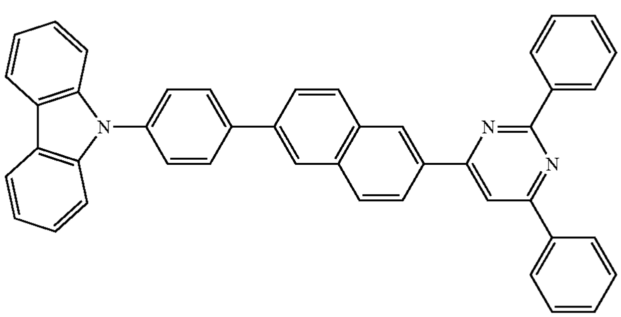
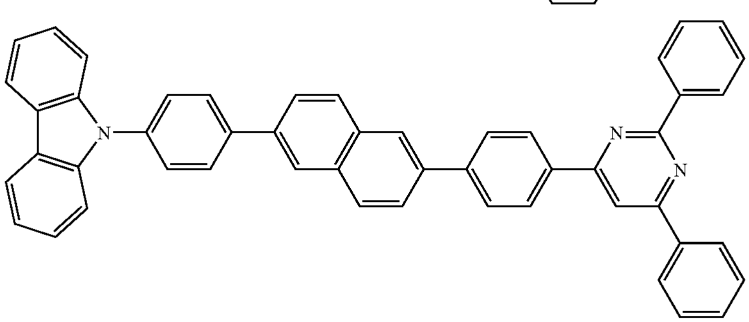

-continued
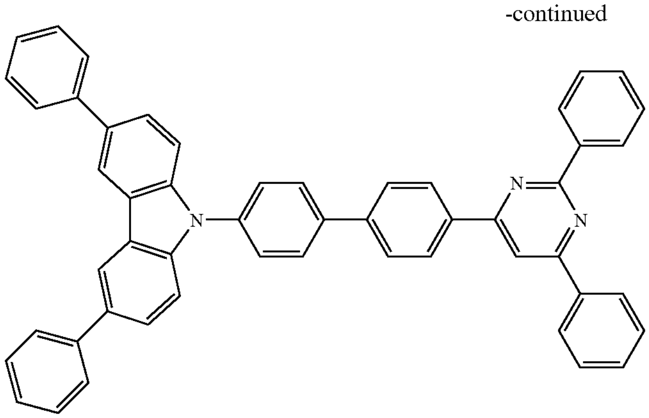
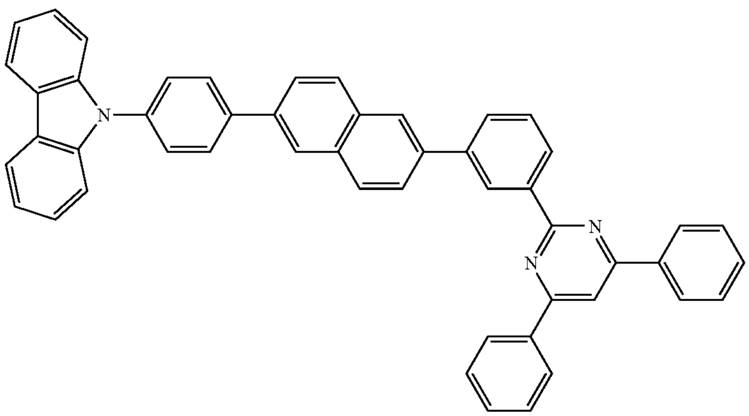
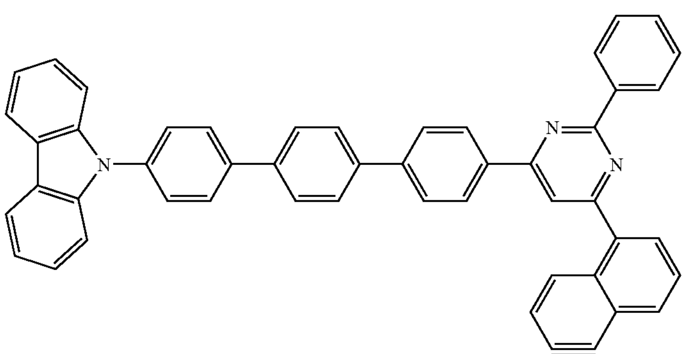
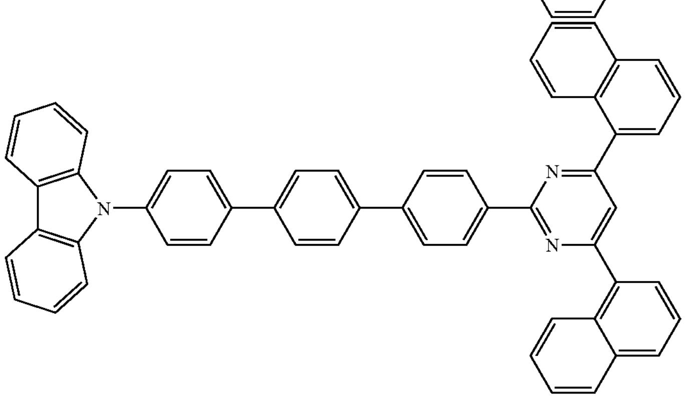

-continued
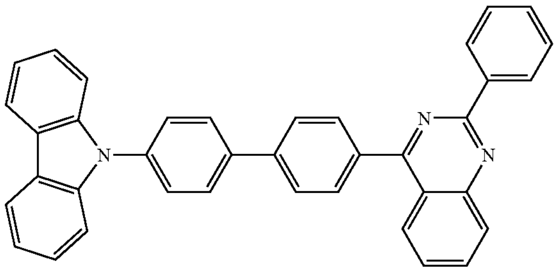
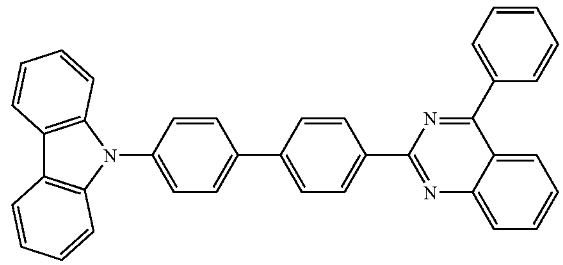
[Chemical Formula 105]
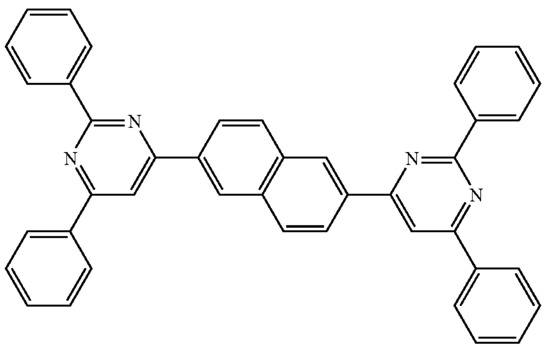
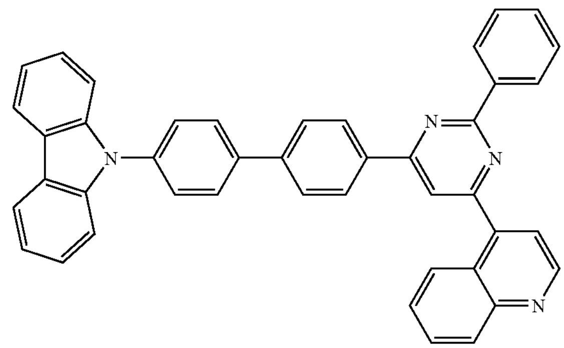
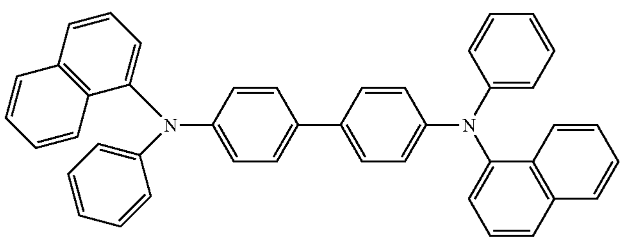
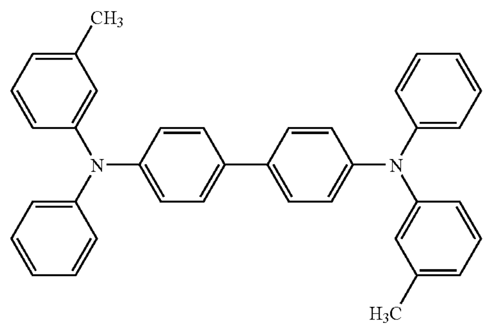
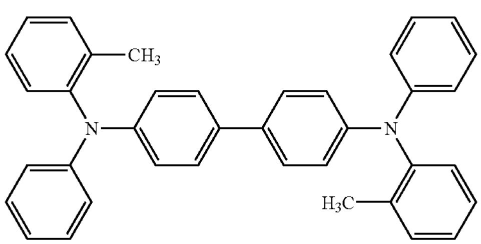
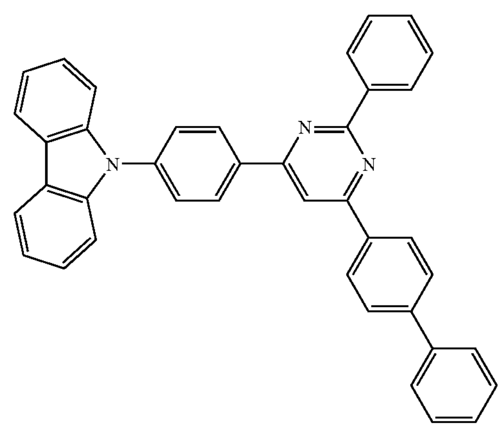
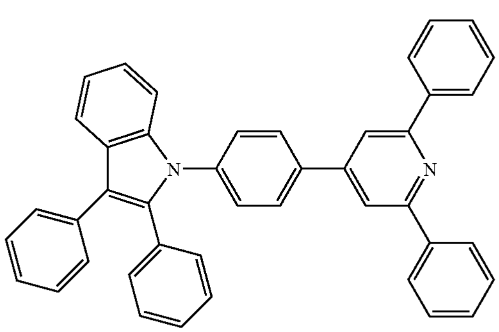
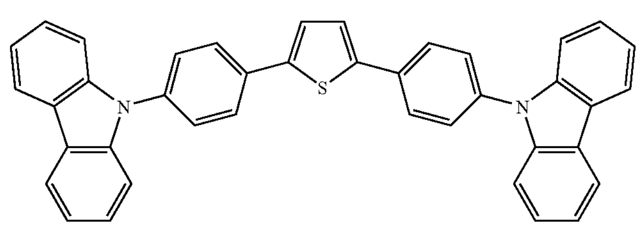

-continued
[Chemical Formula 106]
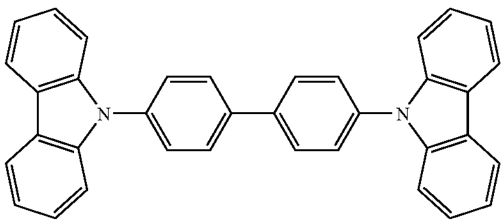
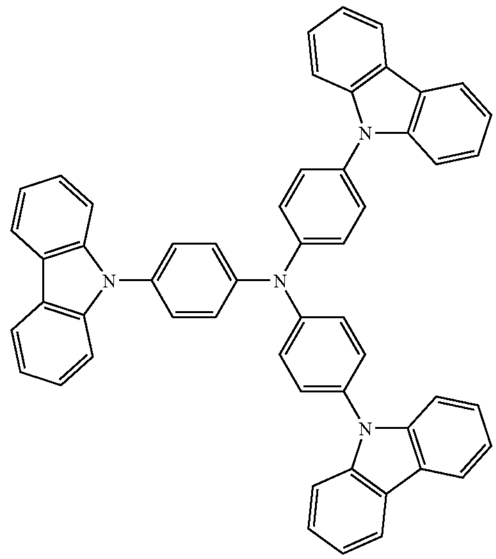
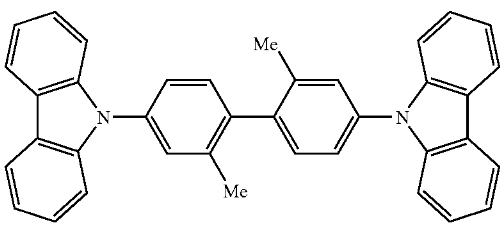
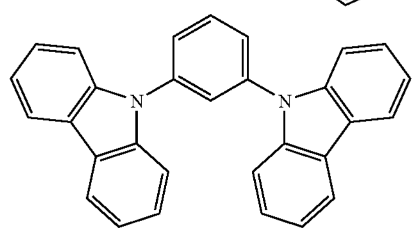
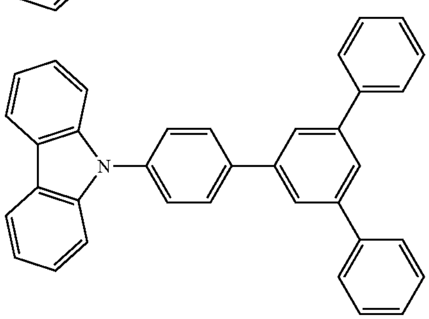
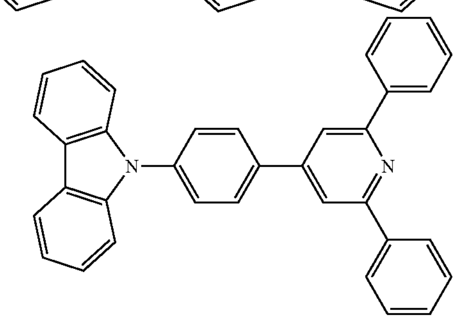
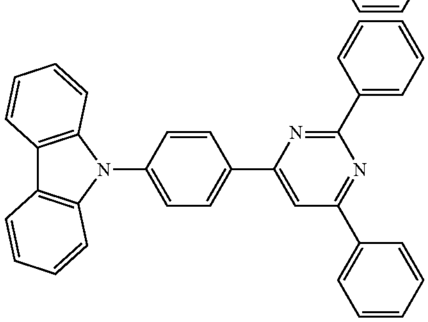
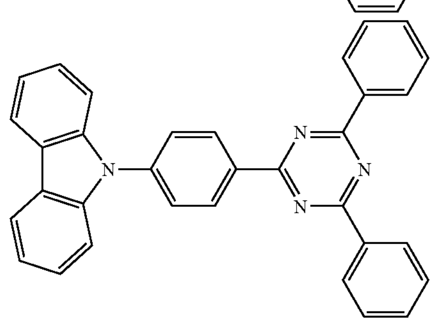
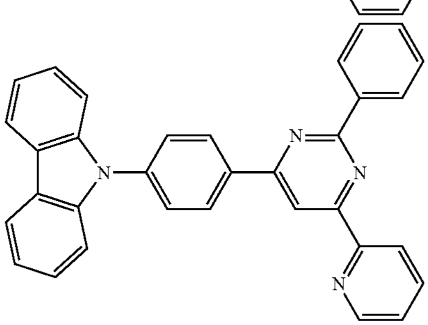

-continued
[Chemical Formula 107]
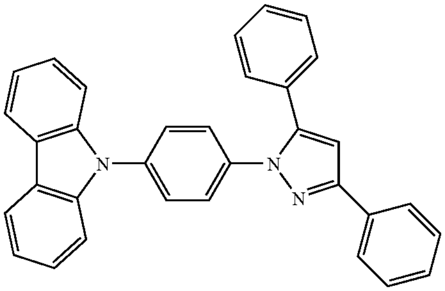
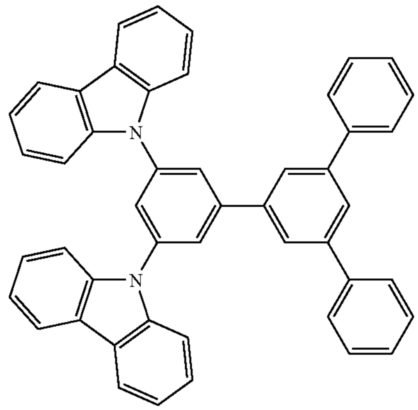
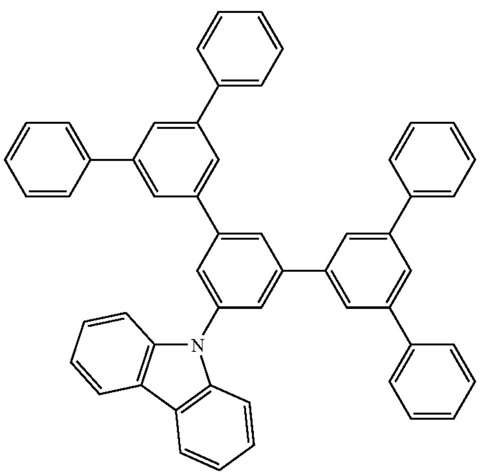
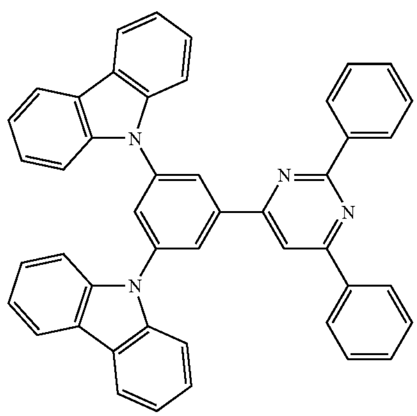
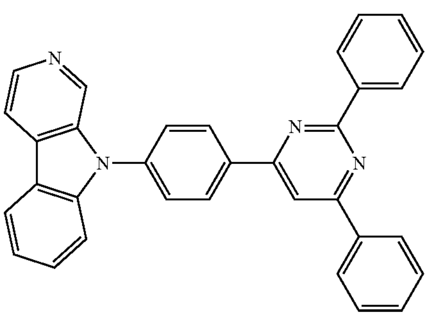
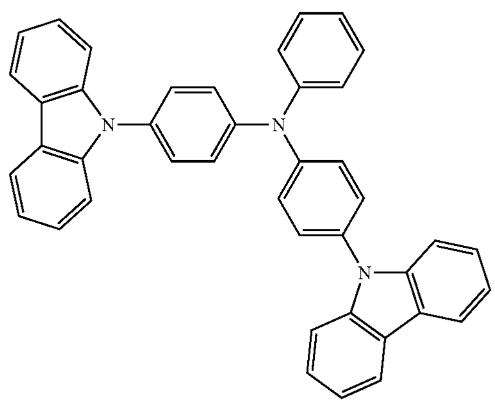

-continued
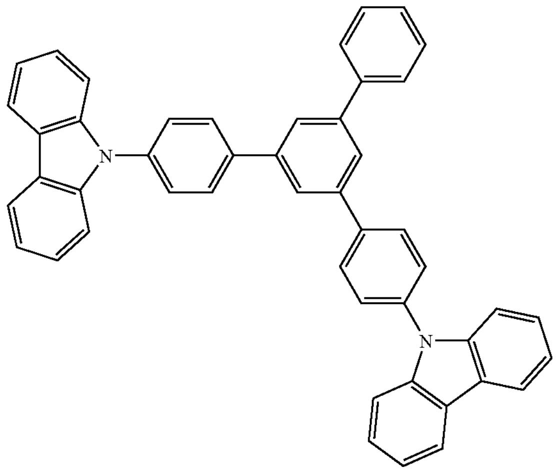
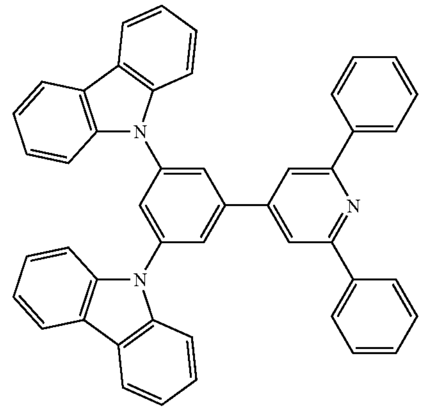
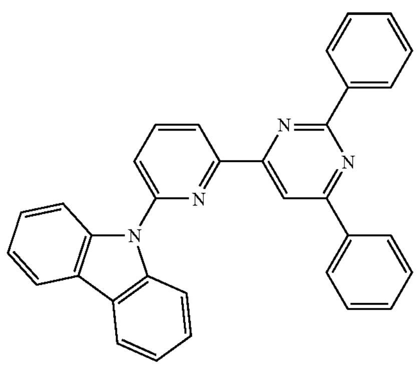
[Chemical Formula 108]
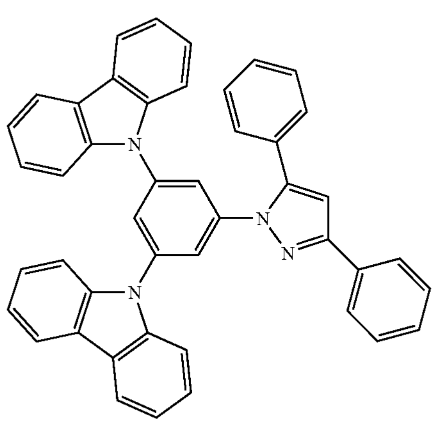
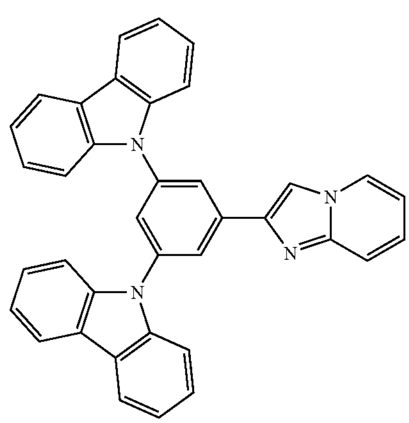

-continued
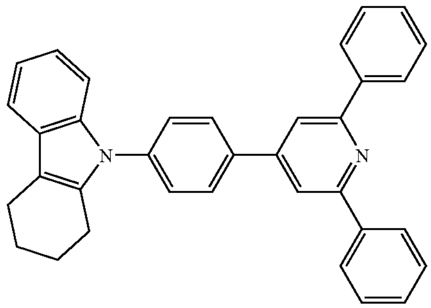
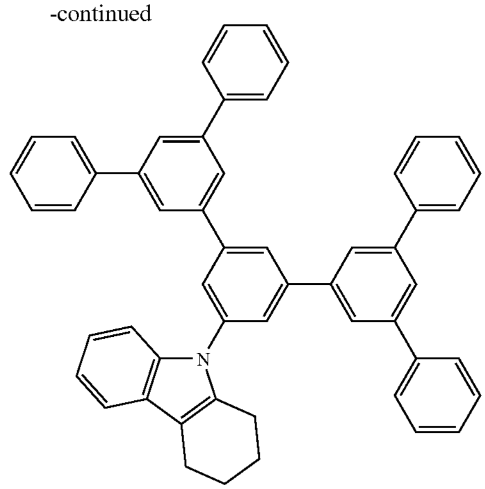
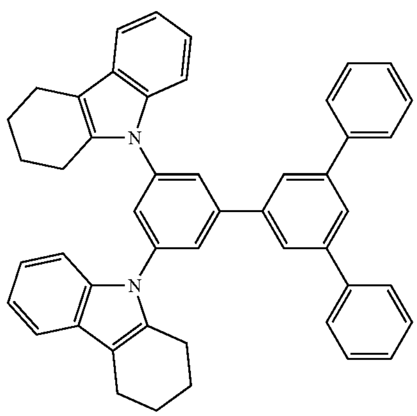
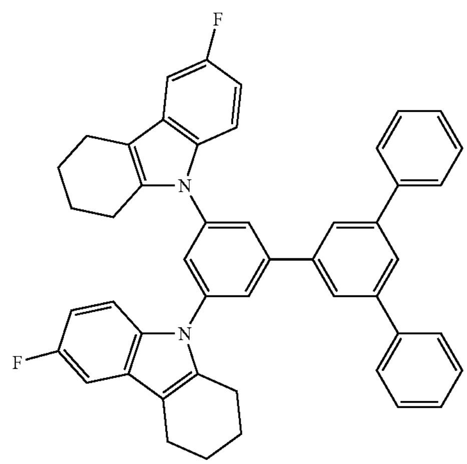
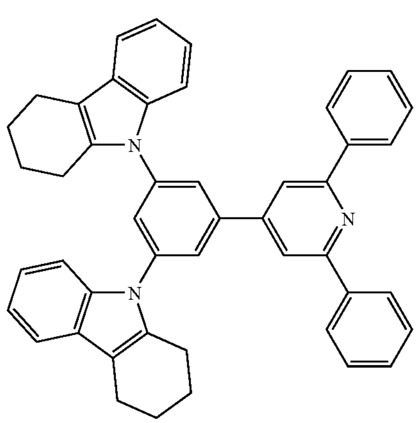
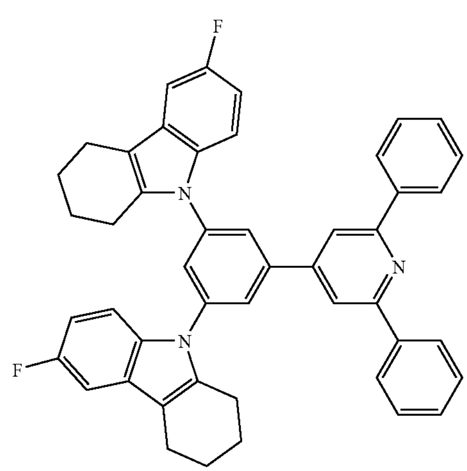

-continued
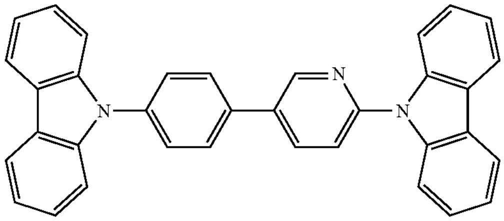
[Chemical Formula 109]
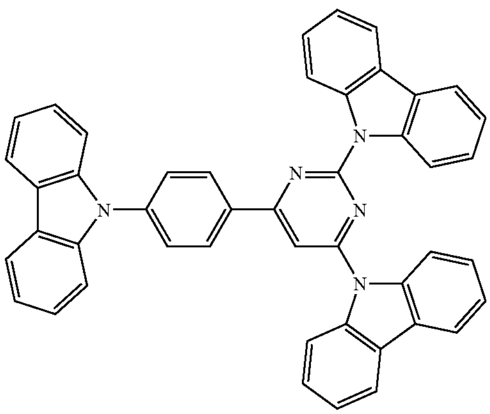
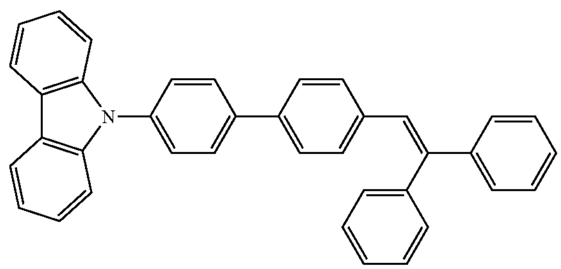
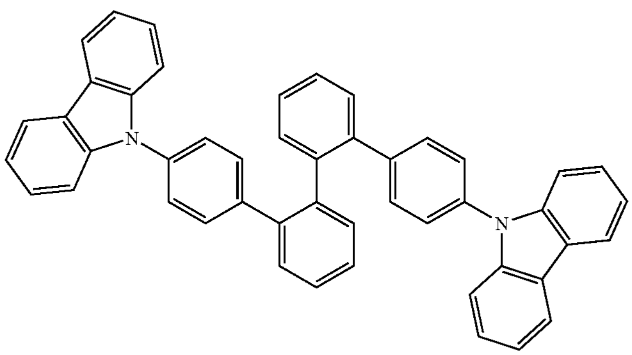
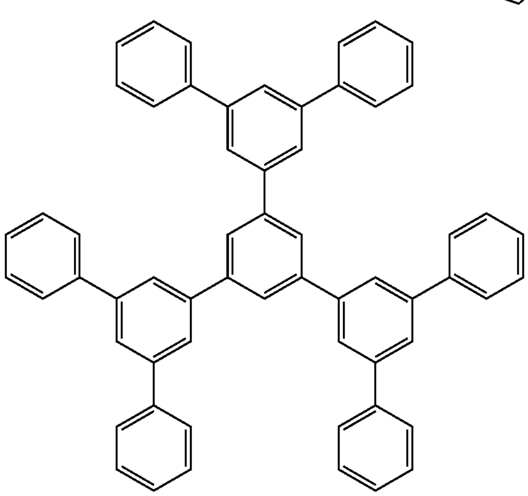
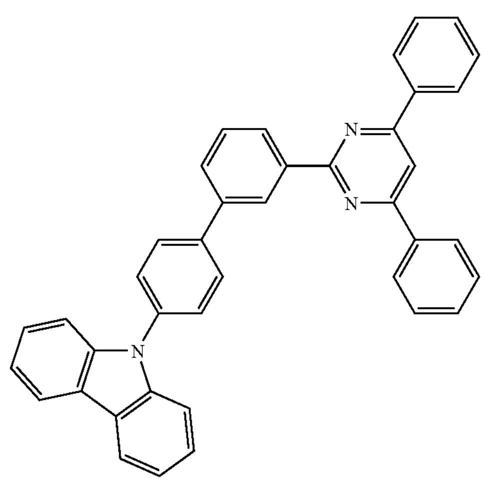

-continued

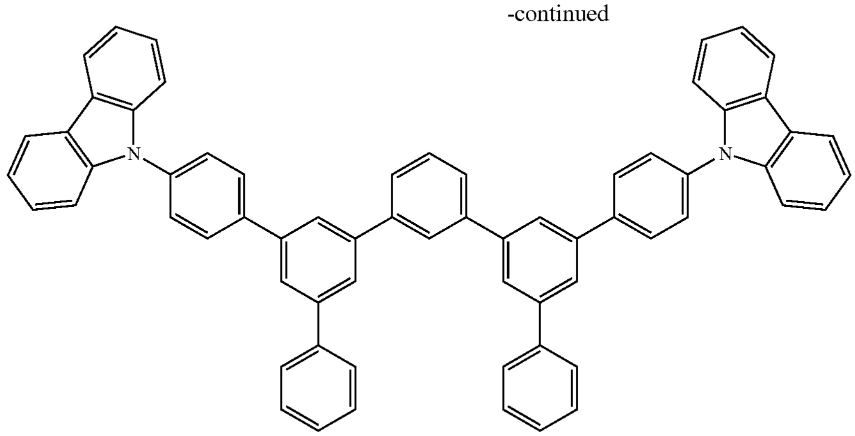

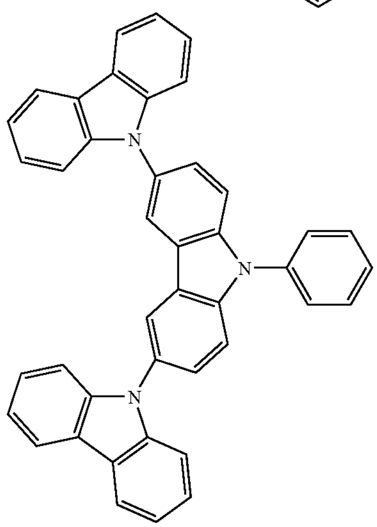

In the aspect of the invention, it is preferable that a triplet energy gap of the second phosphorescent host is different from a triplet energy gap of the first phosphorescent host.

In the aspect of the invention, a triplet energy gap of the fluorescent host is preferably larger than a triplet energy gap of the second phosphorescent host.

With this arrangement, the second phosphorescent host can efficiently receive triplet energy from the fluorescent host.

In the aspect of the invention, the first phosphorescent-emitting layer preferably contains the second phosphorescent dopant.

In such an arrangement for providing hybrid white light, T-diffusion, i.e., triplet energy diffusion is employed. However, a distance where triplet energy diffusion is possible is limited. Moreover, when a phosphorescent layer is double-layered, i.e., when a phosphorescent layer includes first and second phosphorescent-emitting layers, mobility of the triplet energy may be decreased. For this reason, a thickness of each of the first and second phosphorescent-emitting layers needs to be decreased, which may reduce productivity of the organic EL device.

However, in the arrangement of the aspect of the invention, the first phosphorescent-emitting layer is single-layered to include the first and second phosphorescent dopants. Accordingly, even when the thickness of the first phosphorescent-emitting layer is increased, decrease in mobility of triplet energy diffusion can be prevented. Consequently, productivity of the organic EL device is enhanced.

Moreover, in the above arrangement where the phosphorescent-emitting layer is double-layered to include the first and second phosphorescent-emitting layers, when the first phosphorescent dopant exemplarily emits red light and the second phosphorescent dopant exemplarily emits green light, luminous efficiency of red light may be decreased if the first phosphorescent host has a large triplet energy gap Eg(T).

However, in the aspect of the invention, energy is transferred from the first phosphorescent host to the second phosphorescent dopant and further transferred from the second phosphorescent dopant to the first phosphorescent dopant in the first phosphorescent-emitting layer. Accordingly, luminous efficiency of red light can be enhanced.

In the aspect of the invention, a triplet energy gap of the first or second phosphorescent dopant is preferably 2.65 eV or less.

In the aspect of the invention, a triplet energy gap of the fluorescent host is 2.70 eV or less.

With this arrangement, the phosphorescent host can efficiently receive energy from triplet level of the fluorescent host.

Preferably in the aspect of the invention, the first and second phosphorescent dopants contain a metal complex formed of: a metal selected from the group consisting of Ir, Pt, Os, Au, Cu, Re and Ru; and a ligand.

In the aspect of the invention, the first and second phosphorescent dopants preferably have maximum emission luminance of which wavelength is 480 nm to 700 nm, more preferably 500 nm to 680 nm, further preferably 500 nm to 650 nm.

Examples of the first and second phosphorescent dopants are the following compounds such as PQIr (iridium(III) bis (2-phenyl quinolyl-N,C2') acetylacetonate).
[Chemical Formula 110]
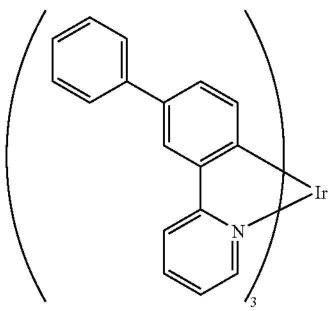
($Ir(Ph\text{-}ppy)_3$)
[Chemical Formula 111]
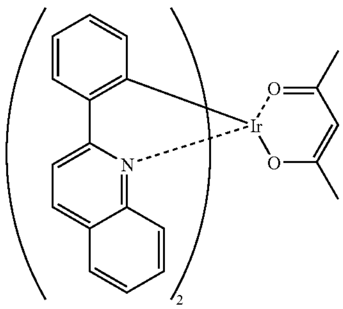
PQIr
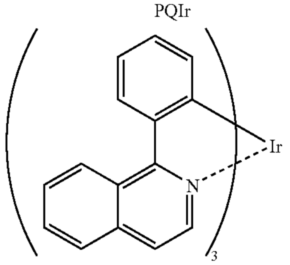
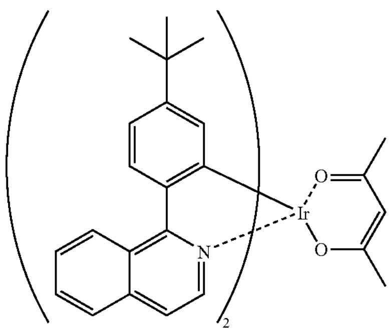
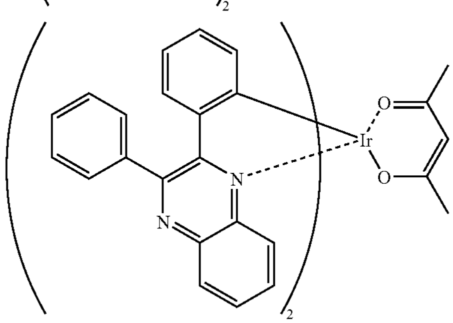
-continued
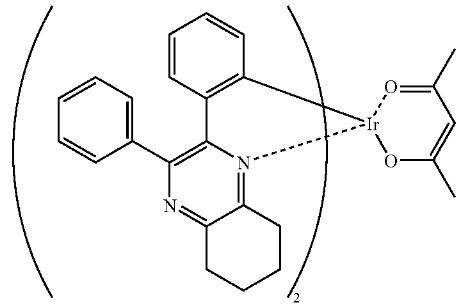
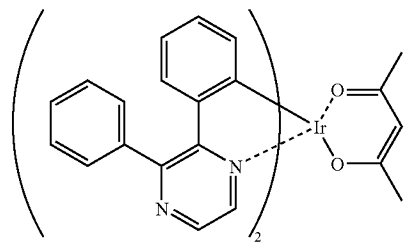
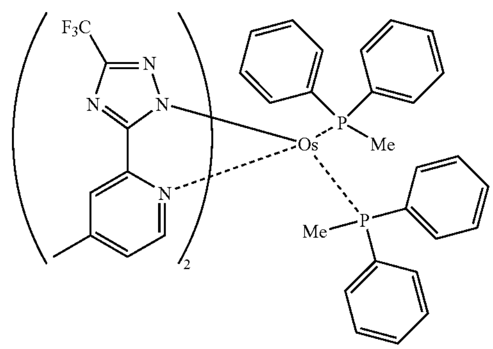
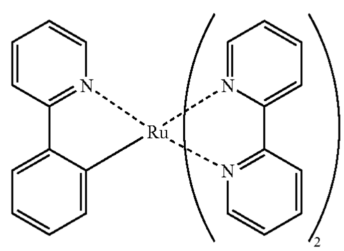
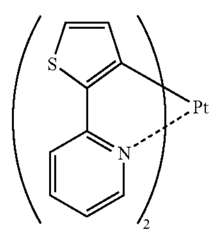
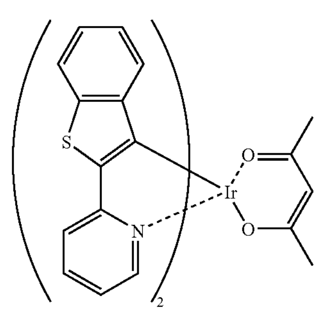

-continued
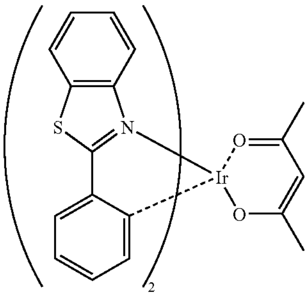
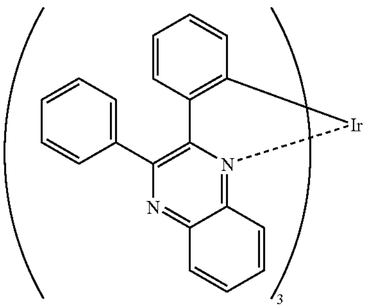
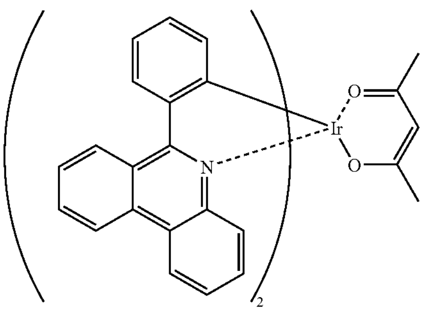
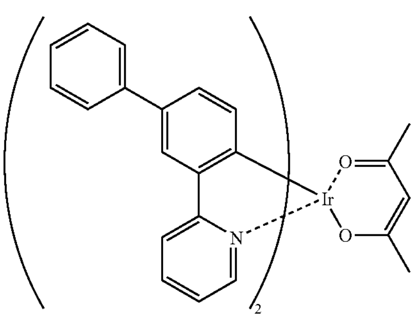
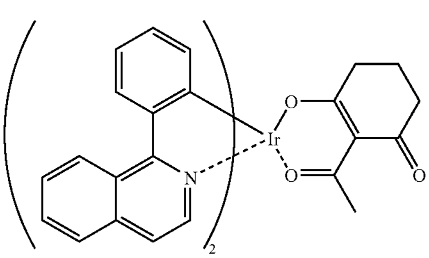
-continued
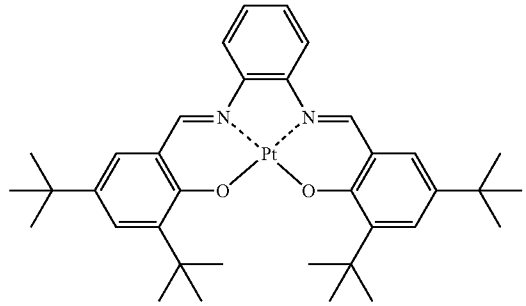
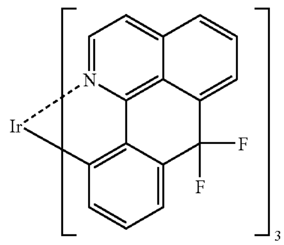
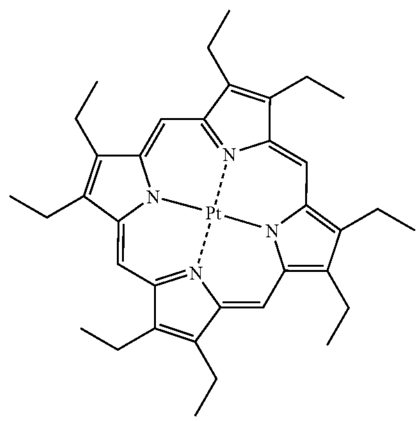
[Chemical Formula 112]
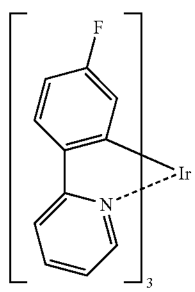
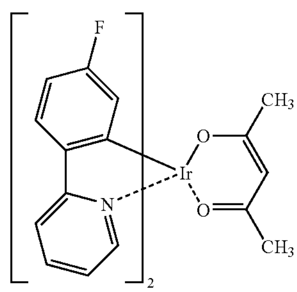
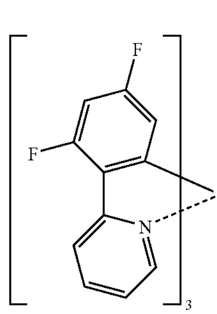
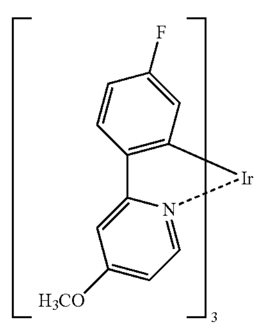

-continued
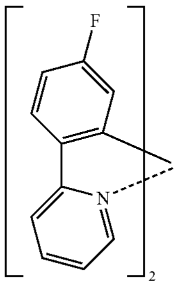
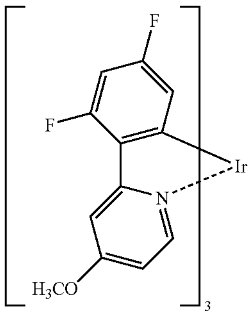
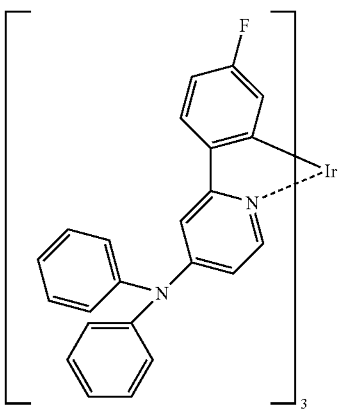
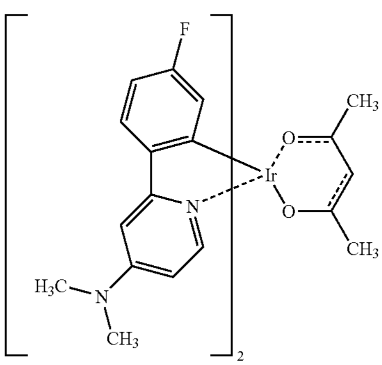
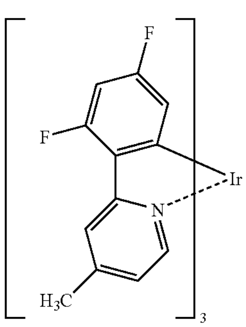
-continued
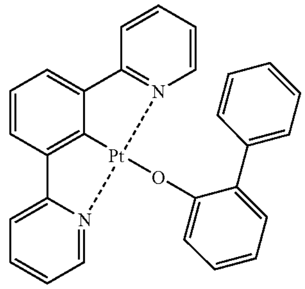
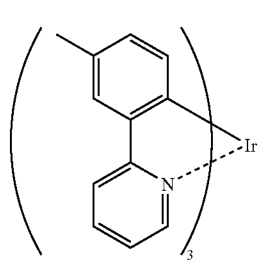
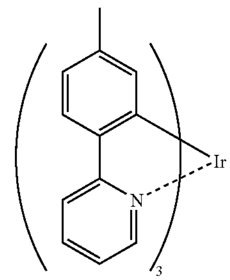
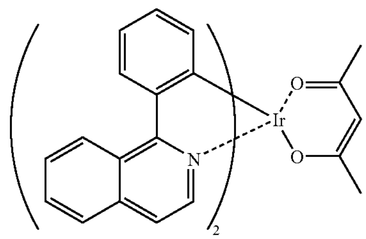
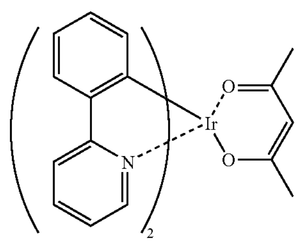
[Chemical Formula 113]
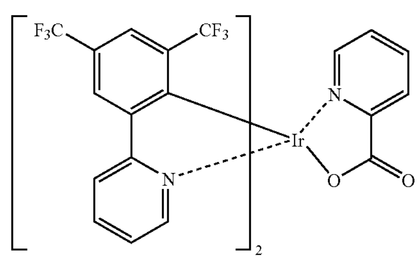
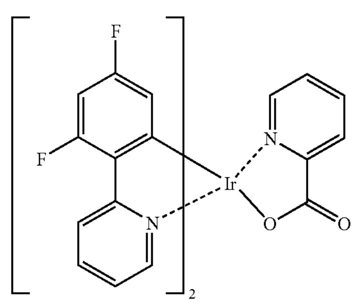

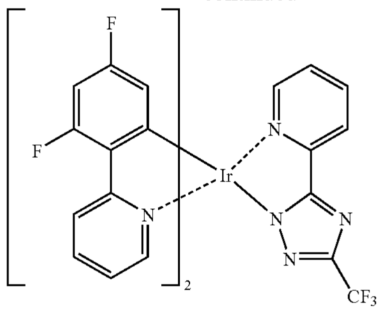
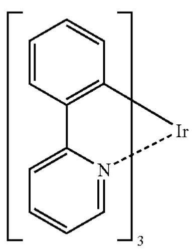
Ir(ppy)$_3$
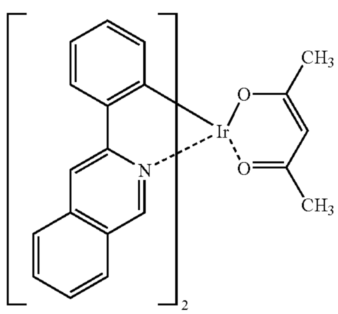
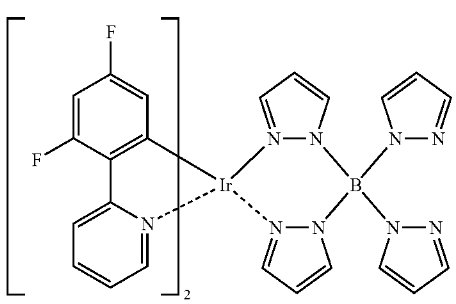
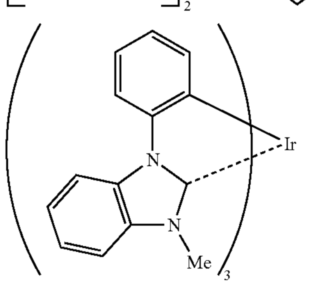
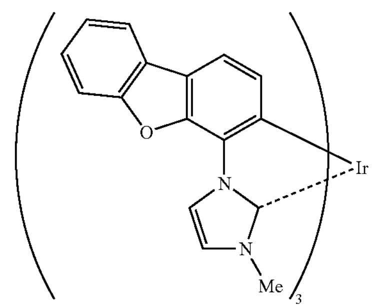
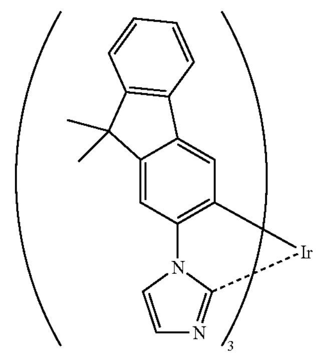
[Chemical Formula 114]
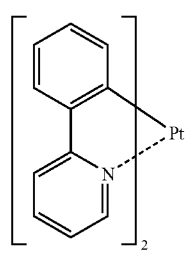
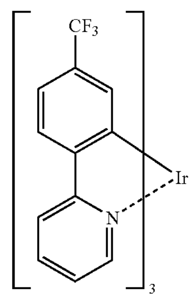
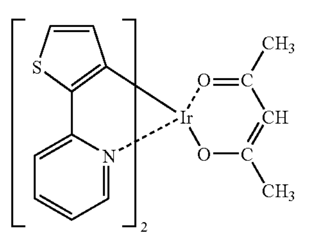
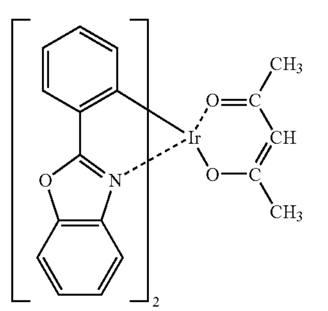

-continued

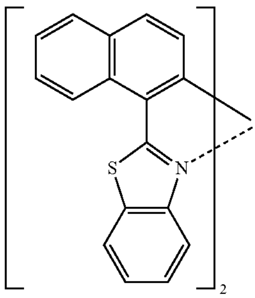

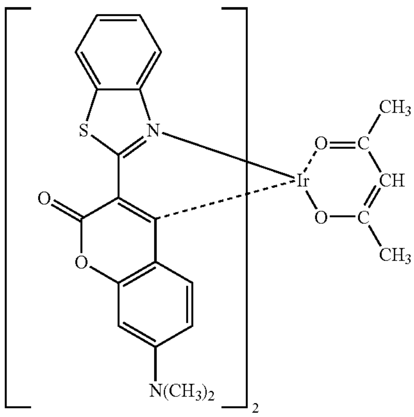

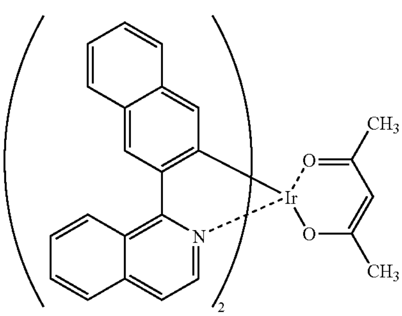

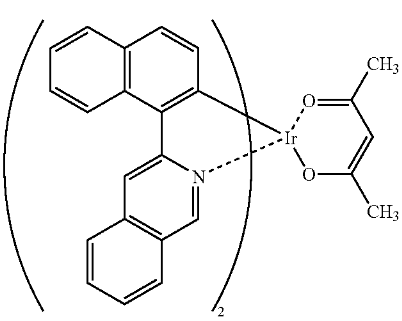

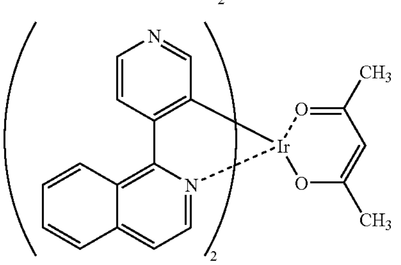

-continued

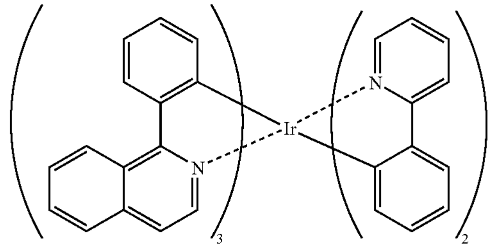

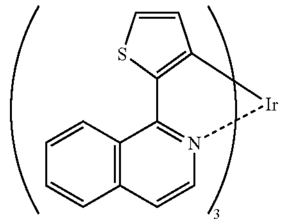

In the aspect of the invention, the fluorescent dopant is an amine compound represented by a formula (20) below.

[Chemical Formula 115]

(20)

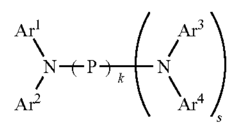

In the formula (20), P represents a substituted or unsubstituted aromatic hydrocarbon group having 6 to 40 ring carbon atoms, a substituted or unsubstituted heterocyclic group having 3 to 40 ring atoms, or a substituted or unsubstituted styryl group; k is an integer of 1 to 3;

$Ar^1$ to $Ar^4$ each independently represent a substituted or unsubstituted aromatic hydrocarbon group having 6 to 40 ring carbon atoms or a substituted or unsubstituted heterocyclic group having 3 to 40 ring atoms; s is an integer of 0 to 4;

an adjacent set of substituents for suitably-selected two of $Ar^1$, $Ar^2$ and P may be bonded together to form a ring; and when k is 2 or more, P may be mutually the same or different.

Examples of the aromatic hydrocarbon group and the heterocyclic group represented by P are respectively a substituted or unsubstituted aromatic hydrocarbon group having 6 to 40 ring carbon atoms and a substituted or unsubstituted heterocyclic group having 3 to 40 carbon atoms, such as residues of benzene, biphenyl group, terphenyl group, naphthalene, phenanthrene, fluoranthene, anthracene, pyrene, perylene, coronene, chrysene, picene, dinaphthyl, trinaphthyl, phenylanthracene, diphenylanthracene, florene, triphenylene, rubicene, benzanthracene, dibenzanthracene, acenaphthofluoranthene, tribenzopentaphene, fluoranthenofluoranthene, benzodifluoranthene, benzofluoranthene and diindenoperylene. In particular, residues of naphthalene, phenanthrene, fluoranthene, anthracene, pyrene, perylene, chrysene, phenylanthracene and diphenylanthracene, and residues of combination of two or more thereof are preferable.

In the formula (20), $Ar^1$ to $Ar^4$ each independently represent a substituted or unsubstituted aromatic hydrocarbon group having 6 to 40 ring carbon atoms or a substituted or unsubstituted heterocyclic group having 3 to 40 ring atoms. s is an integer of 0 to 4.

Examples of the aromatic hydrocarbon group represented by $Ar^1$ to $Ar^4$ are phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, and 4"-t-butyl-p-terphenyl-4-yl group.

Examples of the heteroaryl group represented by $Ar^1$ to $Ar^4$ include a 1-pyrrolyl group, a 2-pyrrolyl group, a 3-pyrrolyl group, a pyrazinyl group, a 2-pyrizinyl group, a 3-pyrizinyl group, a 4-pyrizinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthro line-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl 1-indolyl group, a 4-t-butyl 1-indolyl group, a 2-t-butyl 3-indolyl group, and a 4-t-butyl 3-indolyl group.

As examples of the amine compound represented by the formula (20), fused aromatic amine, styryl amine, benzidine and the like are shown below, but the invention is not limited thereto. Me represents a methyl group.

[Chemical Formula 116]

(A-1)

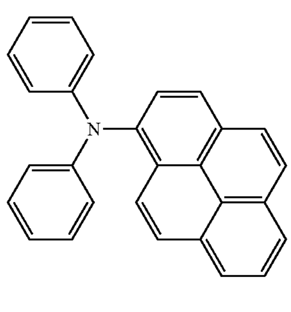

(A)-2

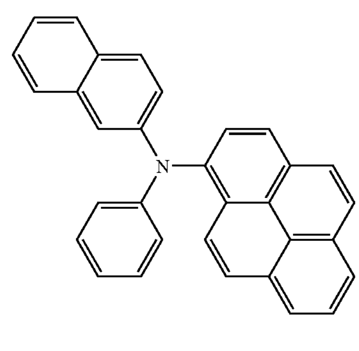

-continued
(A)-3
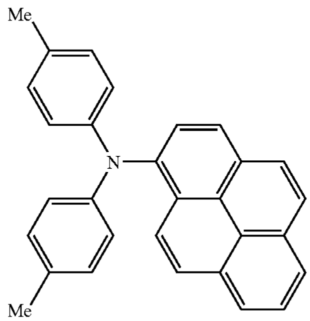
(A)-4
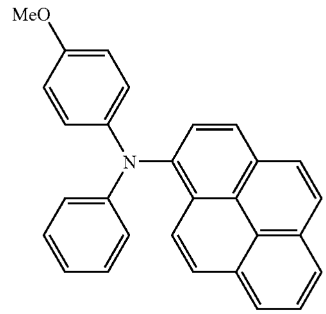
(A)-5
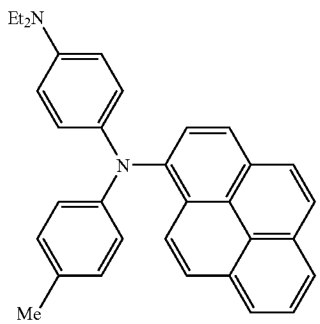
(A)-6
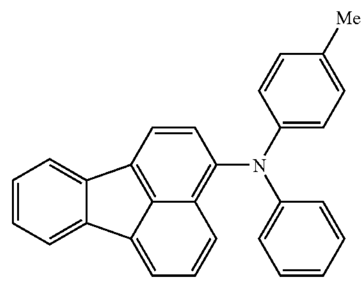
(A-7)
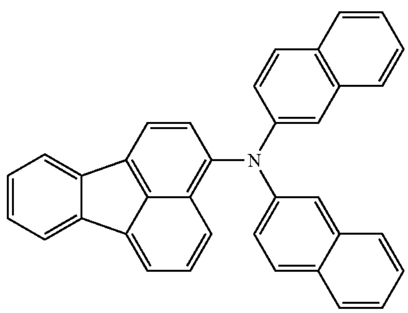
(A-8)
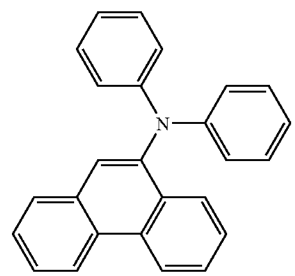
(A)-9
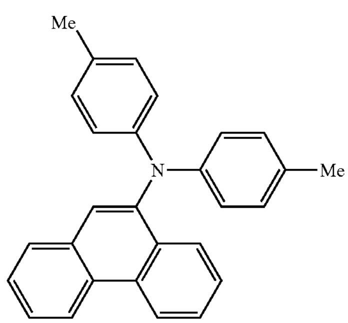
(A)-10
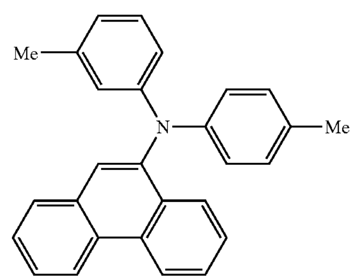
(A)-11
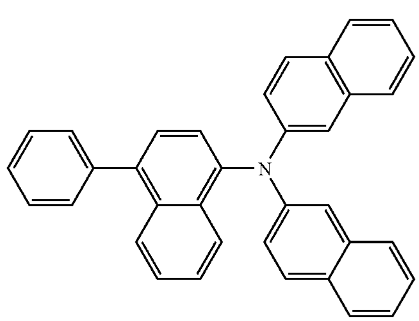
(A)-12
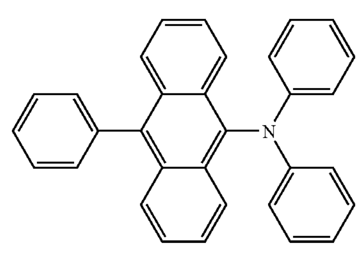

-continued
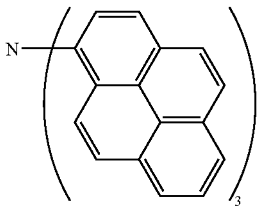
(A)-13
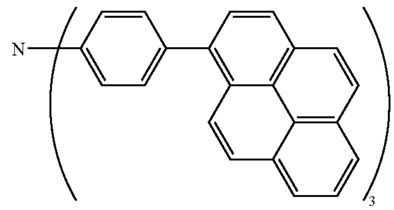
(A-14)
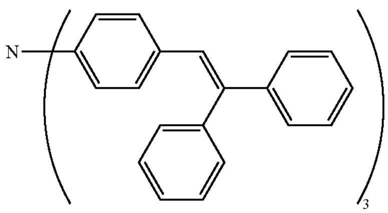
(A-15)
[Chemical Formula 117]
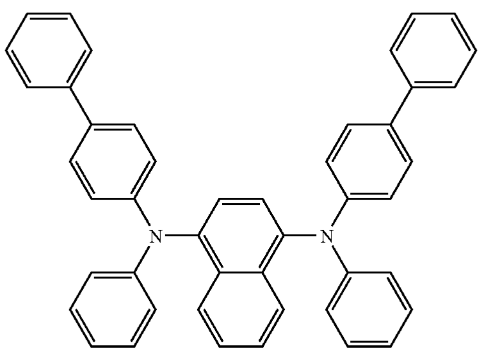
(A)-16
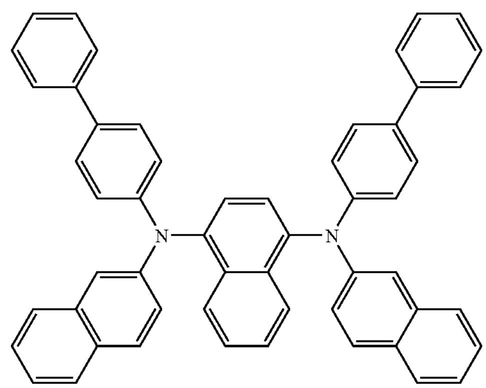
(A-17)
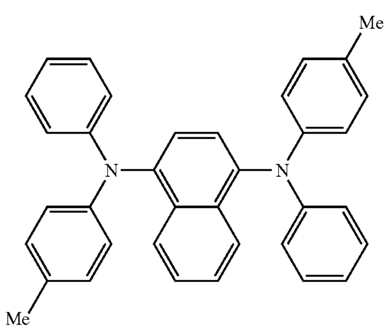
(A-18)
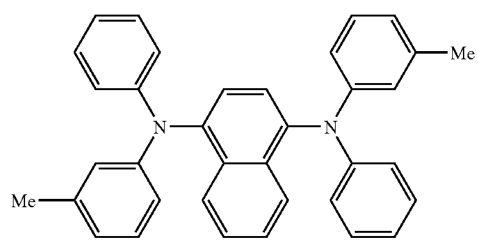
(A)-19
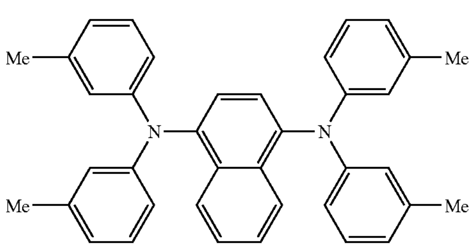
(A)-20
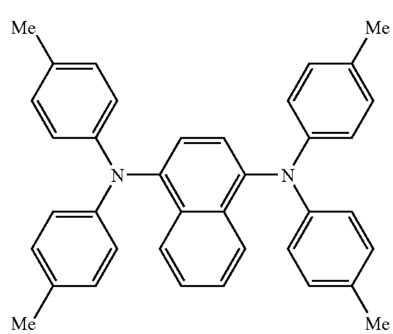
(A)-21

-continued
(A)-22
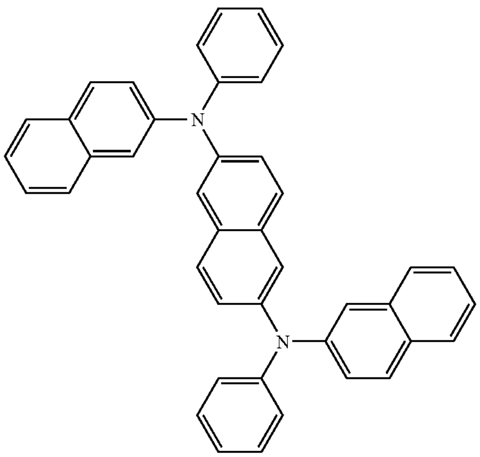
(A)-23
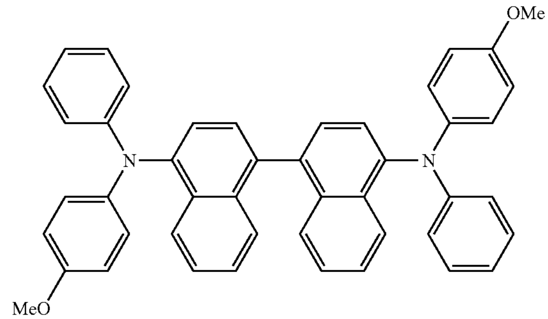
(A)-24
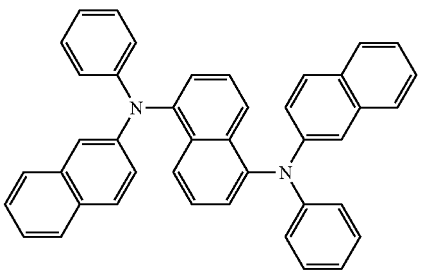
(A)-25
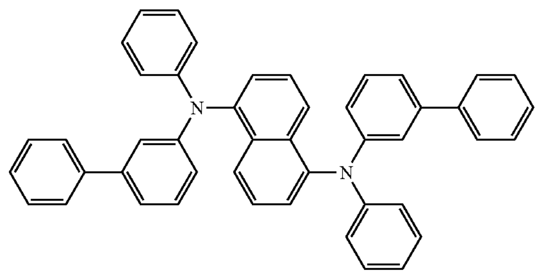
(A)-26
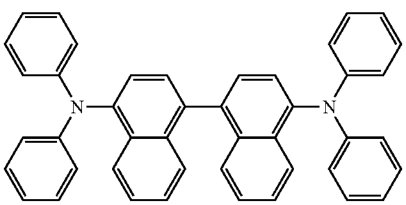
(A)-27
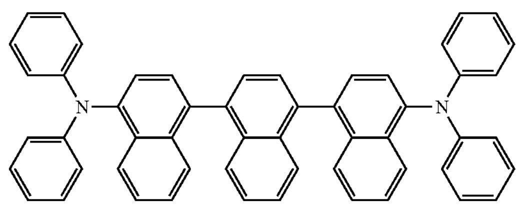
[Chemical Formula 118]
(A)-28
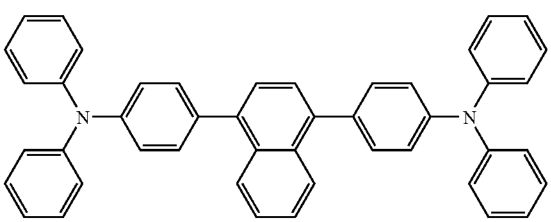
(A)-29
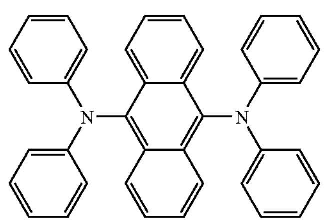
(A)-30
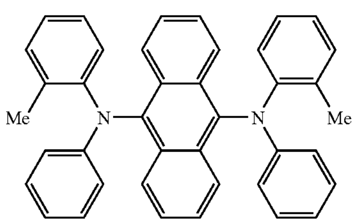
(A)-31
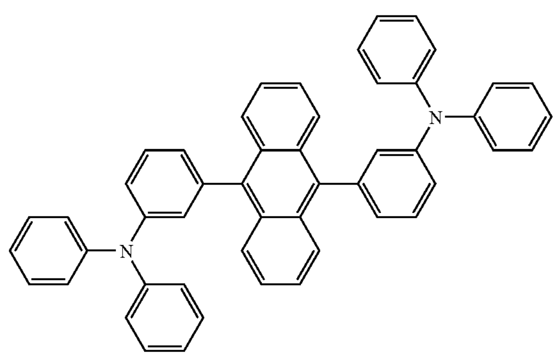

-continued
(A)-32
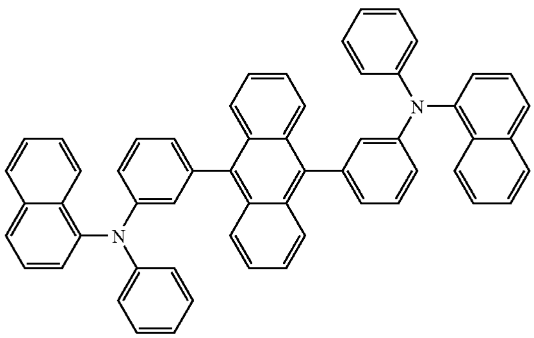
(A)-33
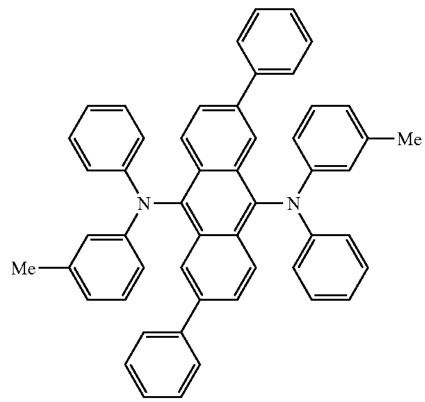
(A)-34
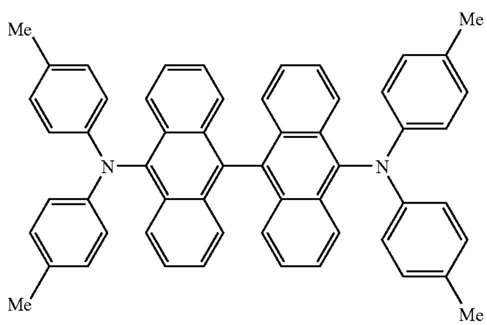
(A)-35
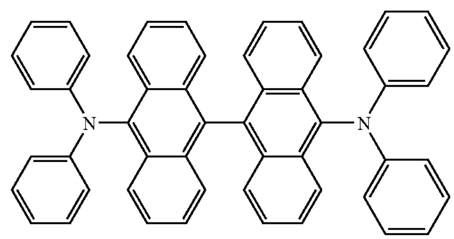
(A)-36
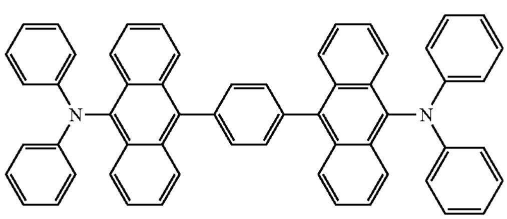
(A)-37
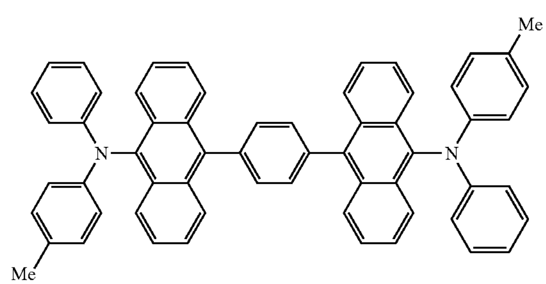
(A)-38
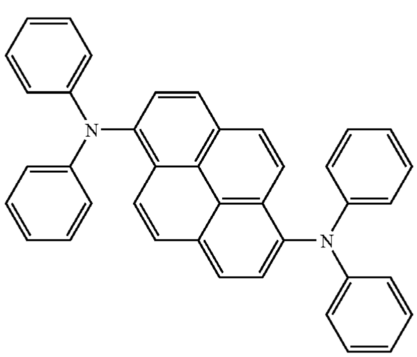
(A)-39
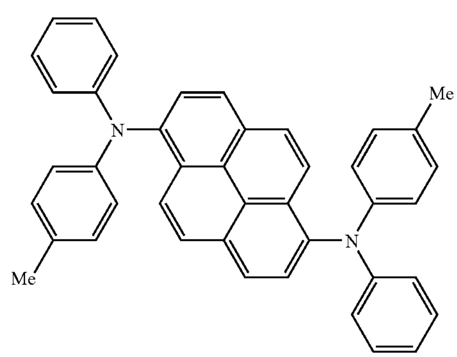

-continued
[Chemical Formula 119]
(A)-40
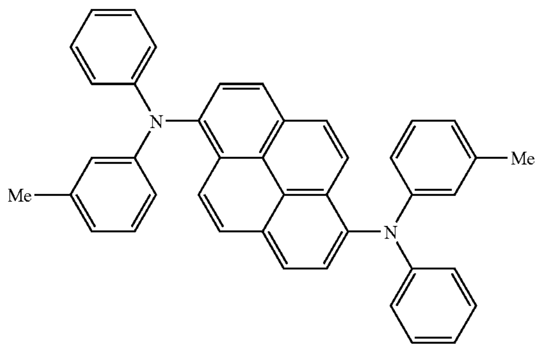
(A)-41
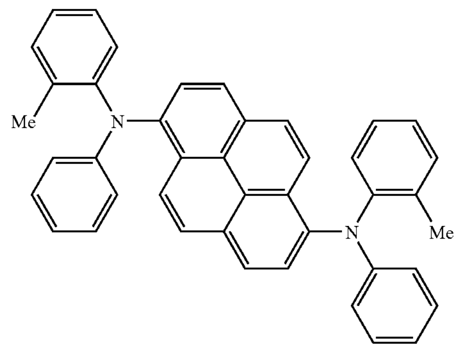
(A)-42
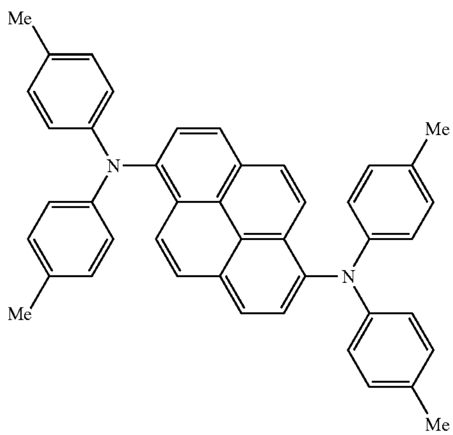
(A)-43
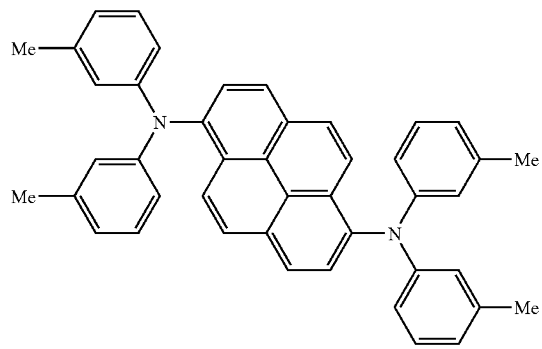
(A)-44
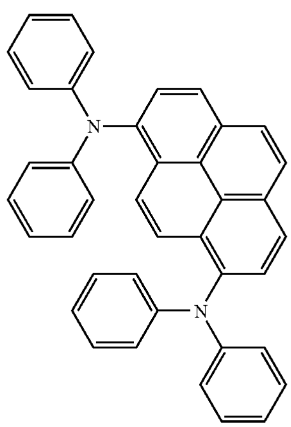
(A)-45
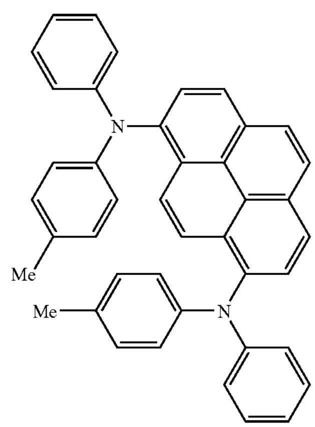
(A)-46
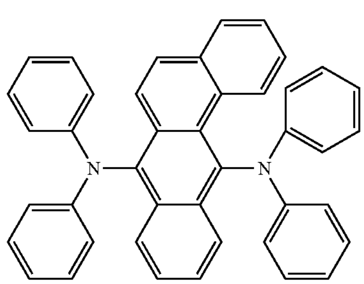
(A)-47
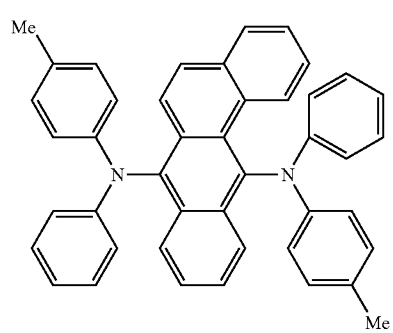

-continued
(A)-48
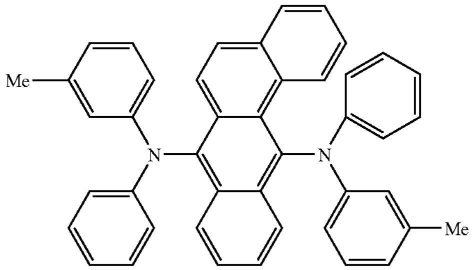
(A)-49
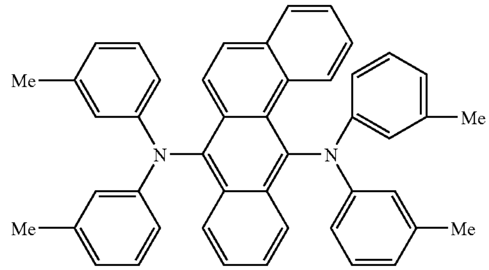
(A)-50
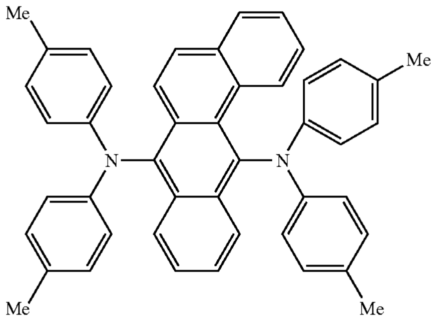
(A)-51
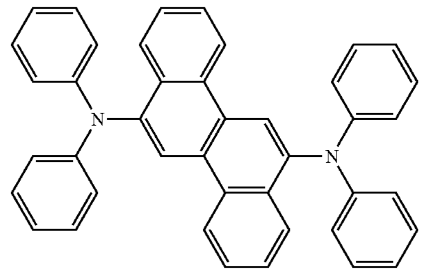
(A)-52
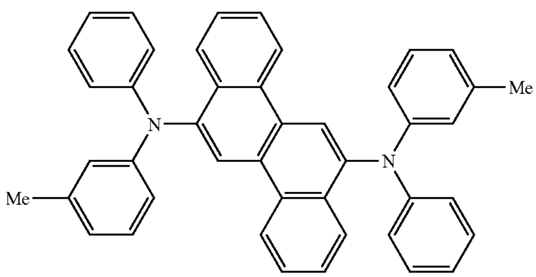
[Chemical Formula 120]
(A)-53
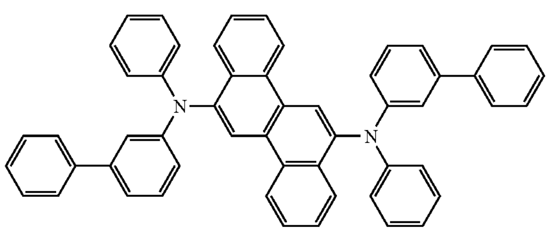
(A)-54
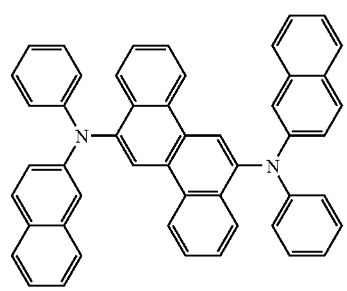
(A)-55
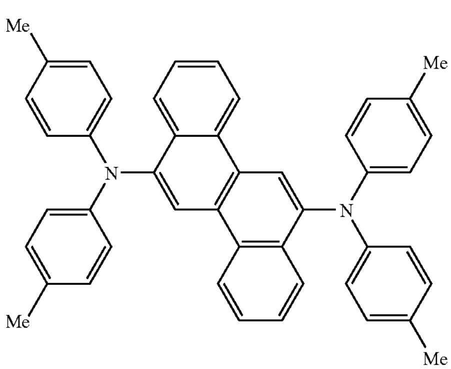
(A)-56
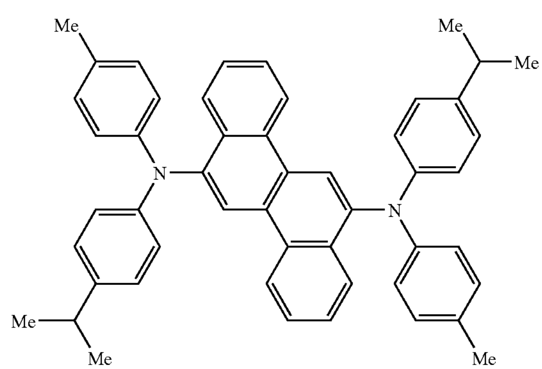

-continued
(A)-57
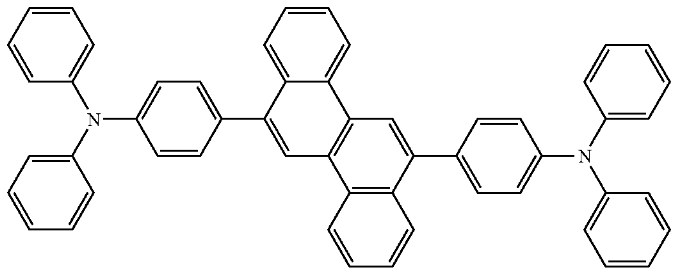
(A)-58
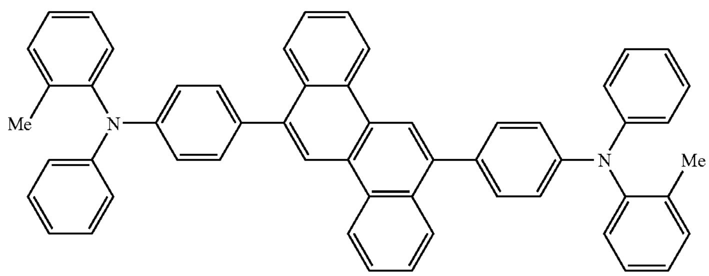
(A)-59
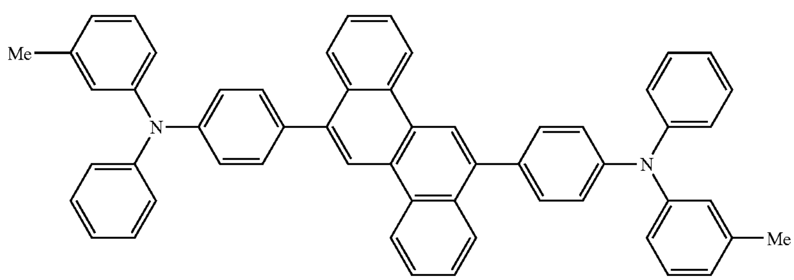
(A)-60
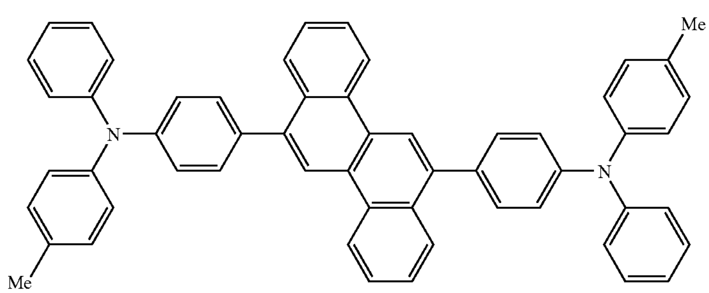
(A)-61
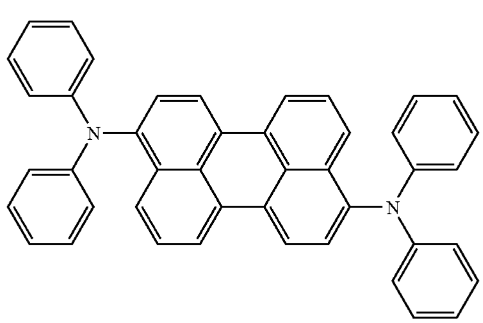

-continued
(A)-62
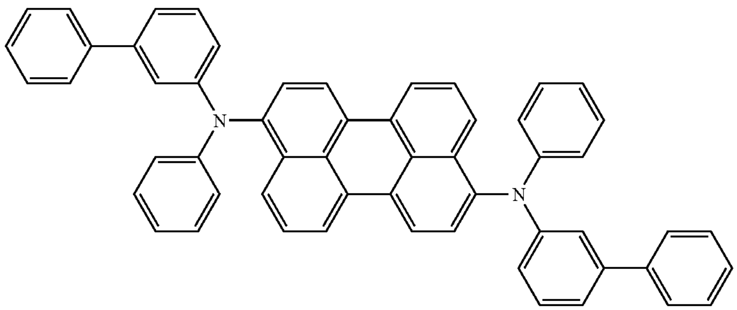
(A)-63
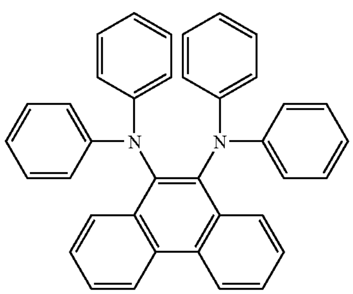
(A)-64
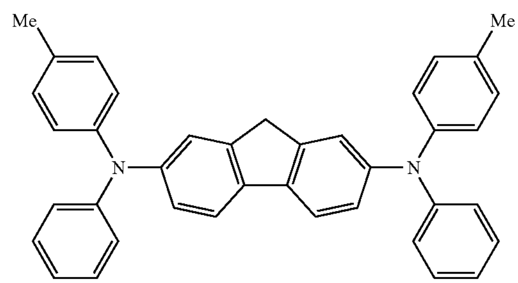
(A)-65
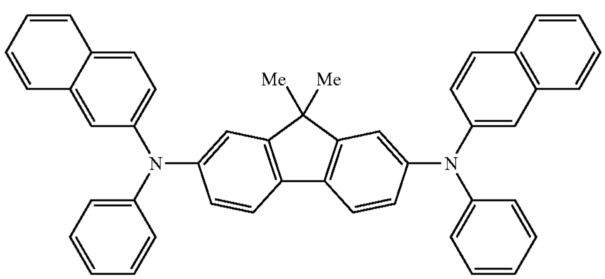
[Chemical Formula 121]
(A)-66
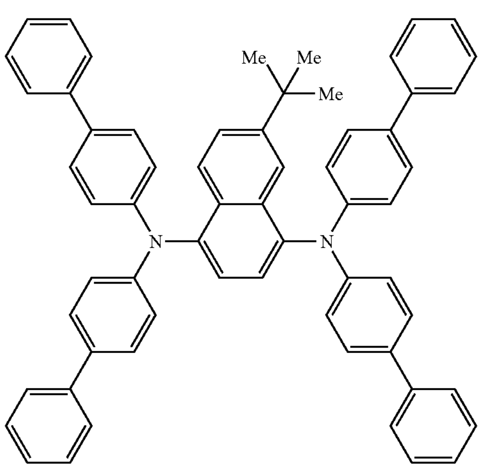
(A)-67
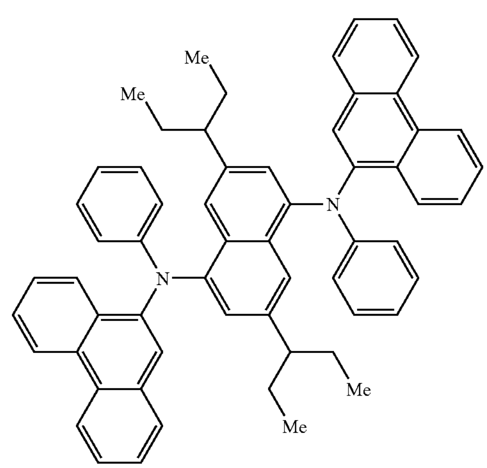

-continued
(A)-68
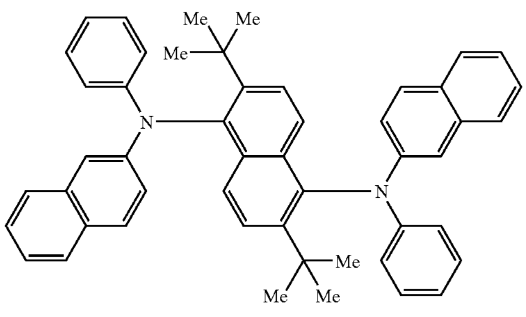
(A)-69
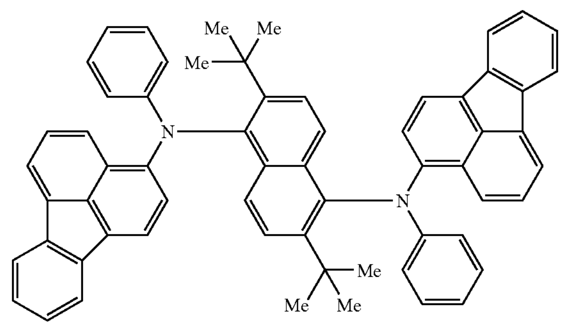
(A)-70
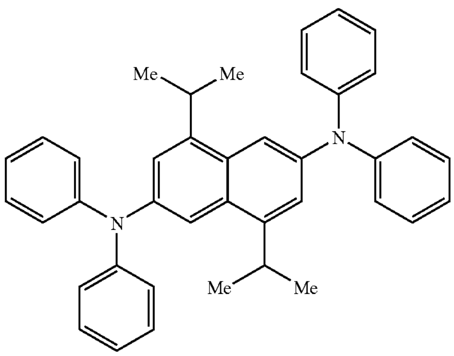
(A)-71
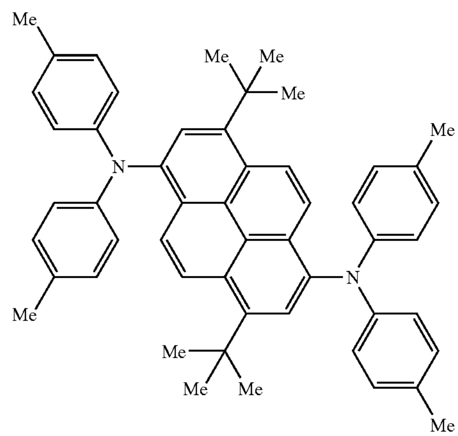
(A)-72
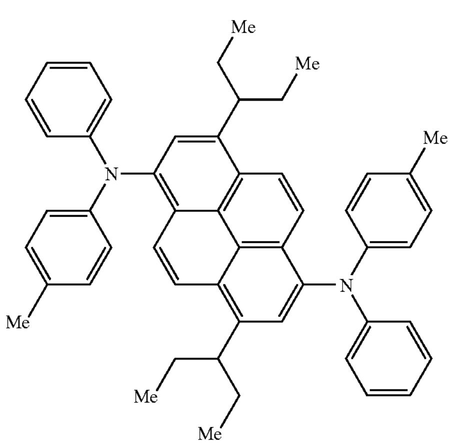
(A)-73
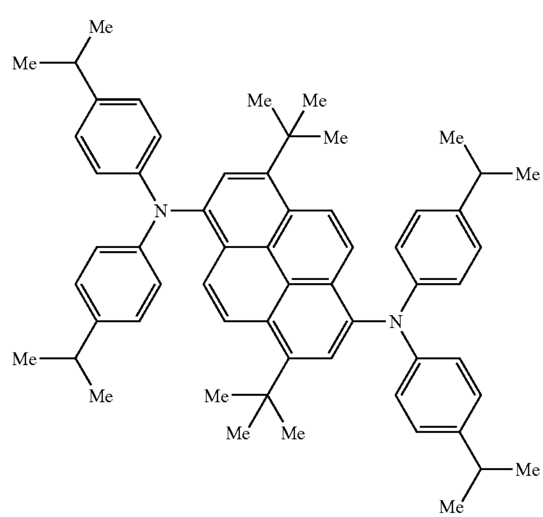

-continued
(A)-74
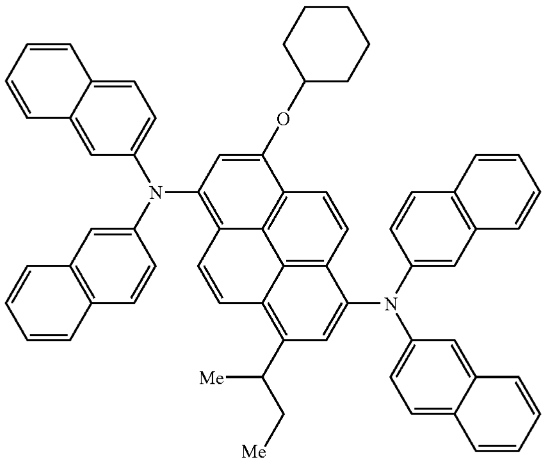
(A)-75
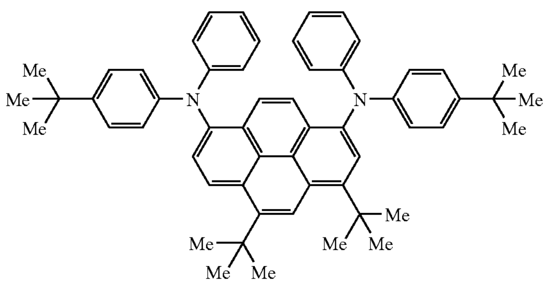
(A)-76
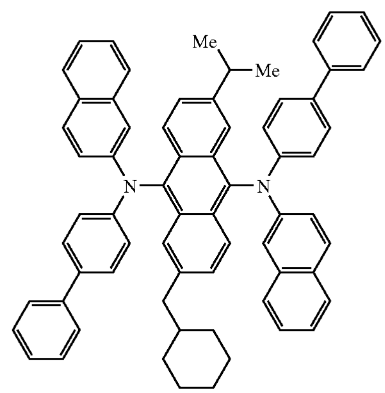
(A)-77
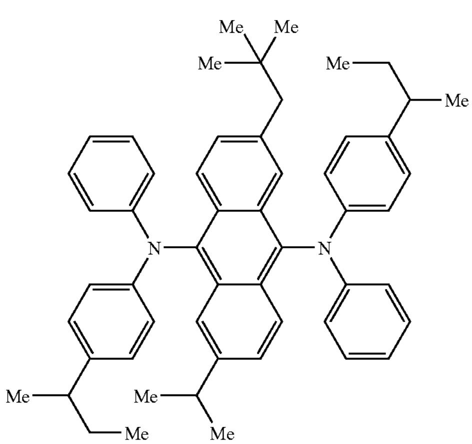

-continued
[Chemical Formula 122]
(A)-78
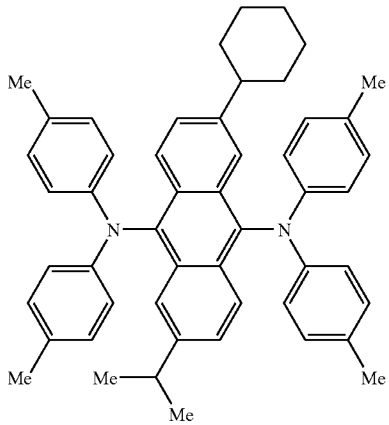
(A)-79
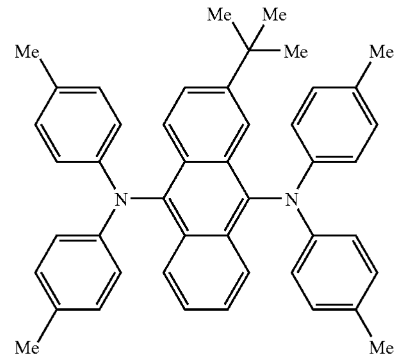
(A)-80
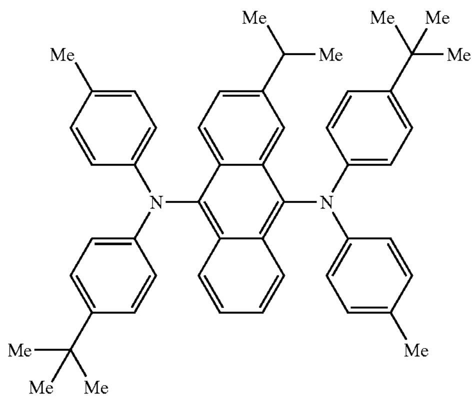
(A)-81
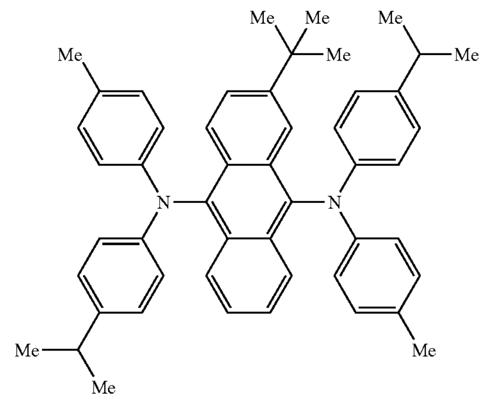
(A)-82
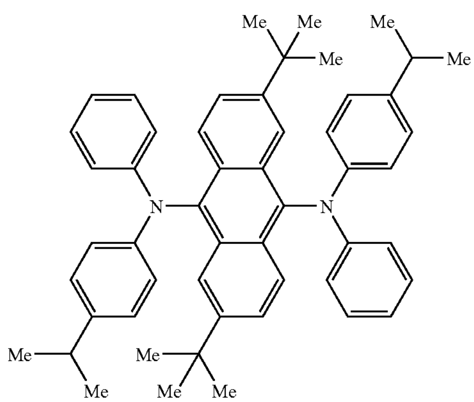
(A)-83
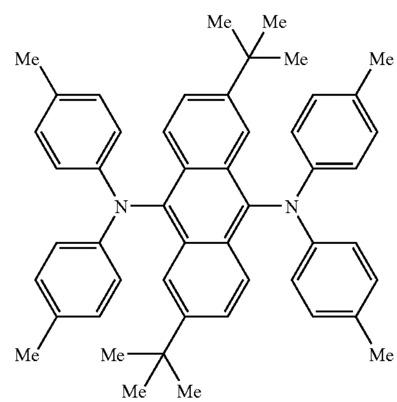
(A)-84
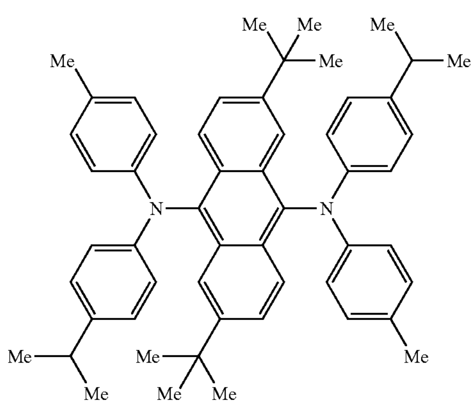
(A)-85
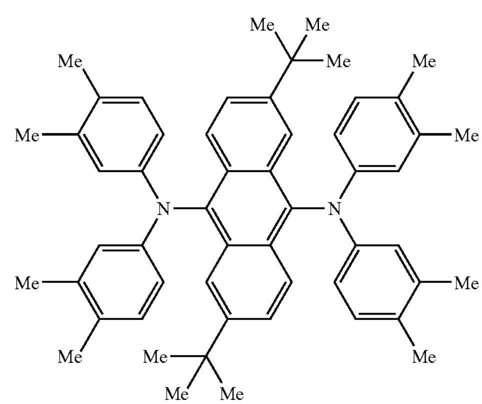

-continued
(A)-86
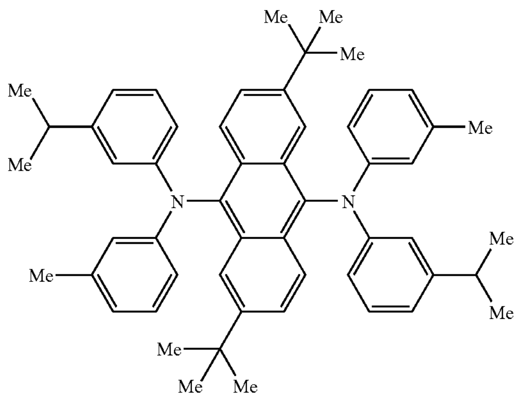
(A)-87
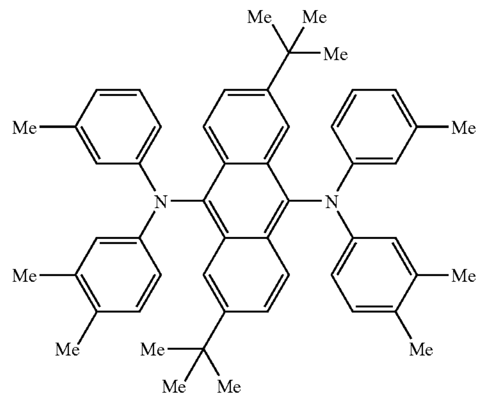
(A)-88
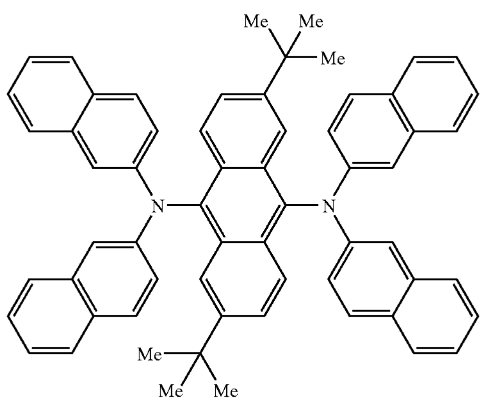
(A)-89
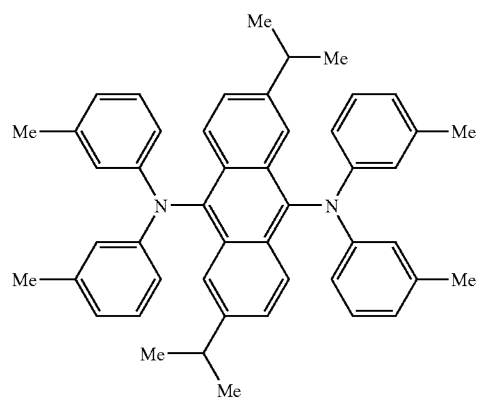
[Chemical Formula 123]
(A)-90
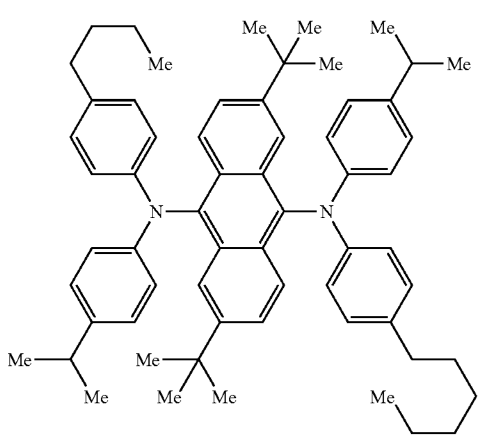
(A)-91
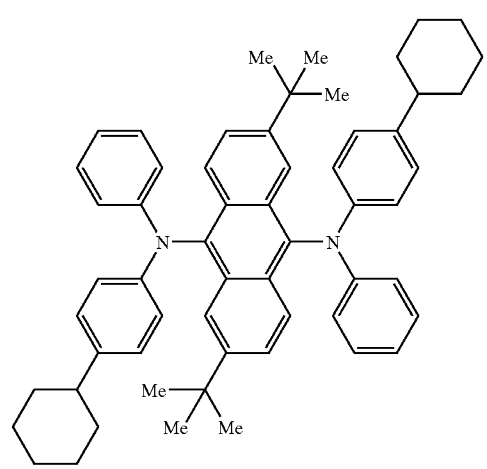

-continued
(A)-92
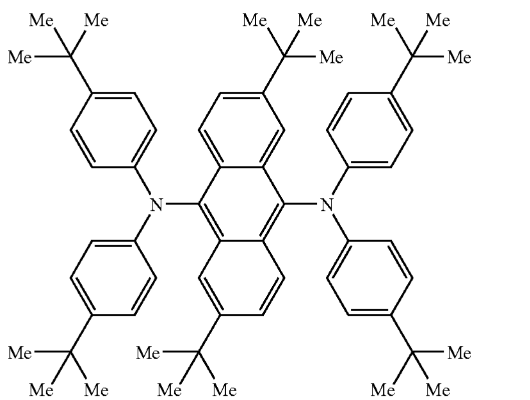
(A)-93
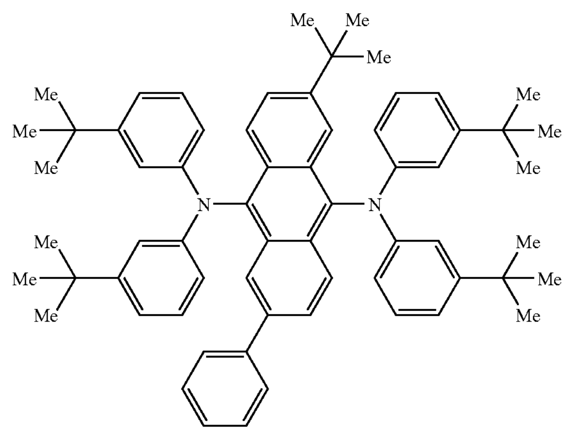
(A)-94
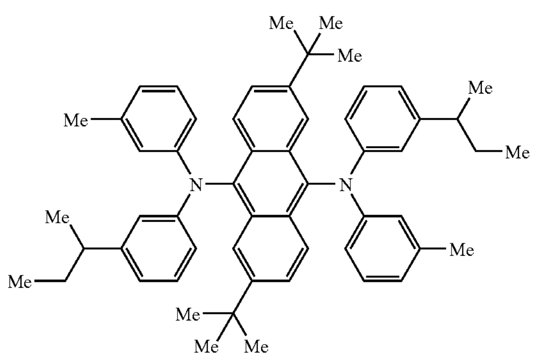
(A)-95
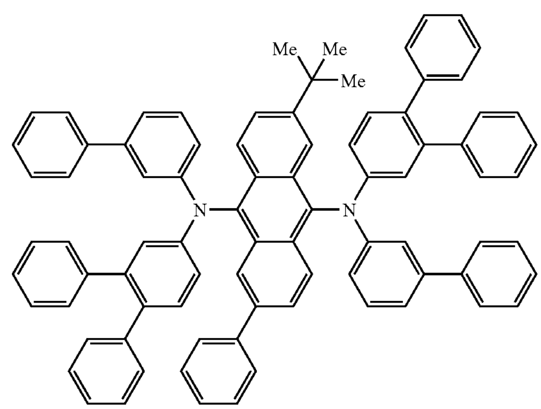
(A)-96
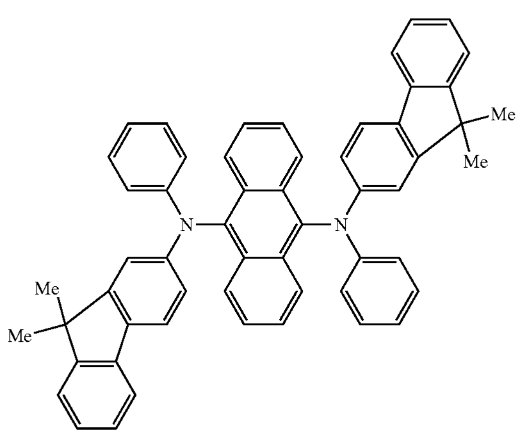
(A)-97
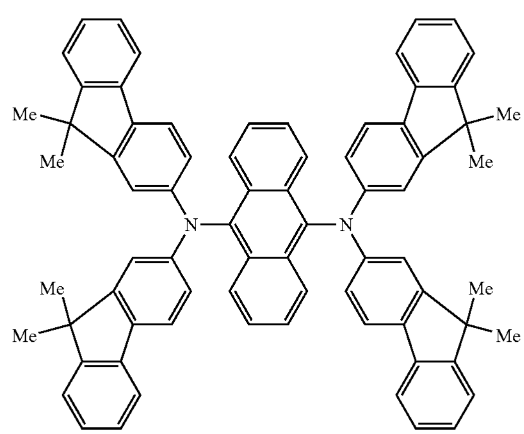

-continued
(A)-98
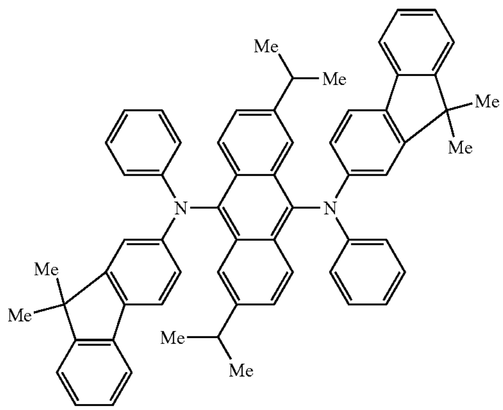
(A)-99
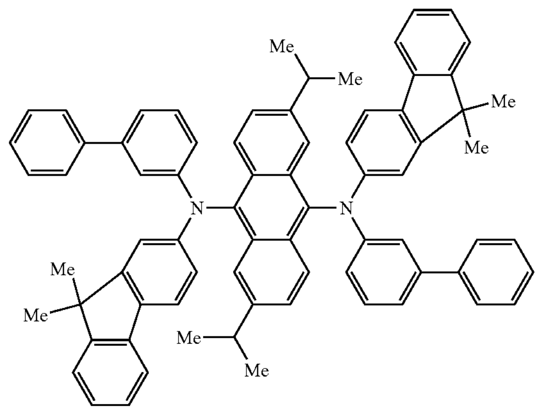
(A)-100
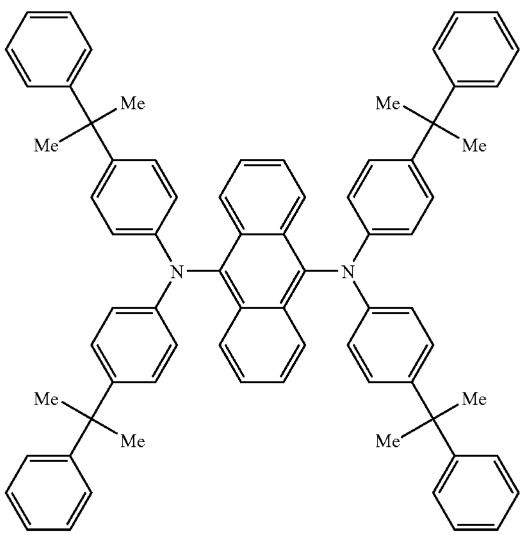
[Chemical Formula 124]
(A)-101
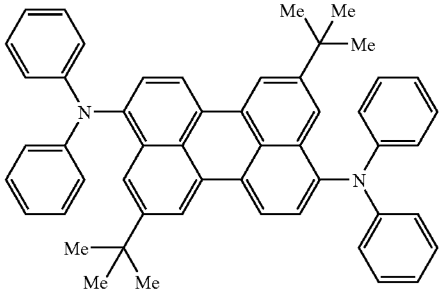
(A)-102
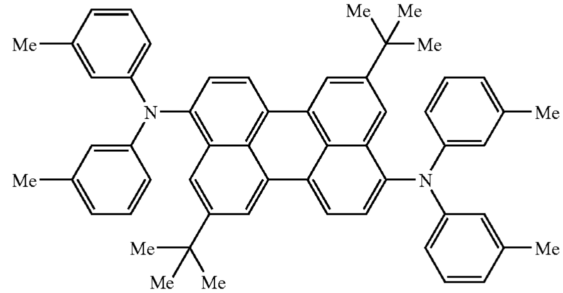

-continued
(A)-103
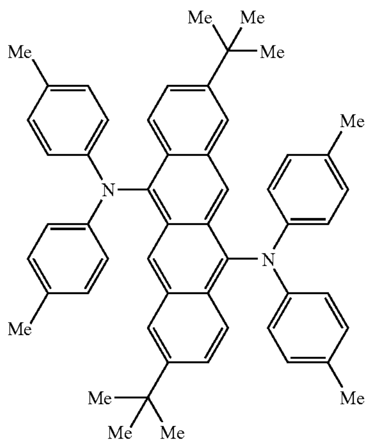
(A)-104
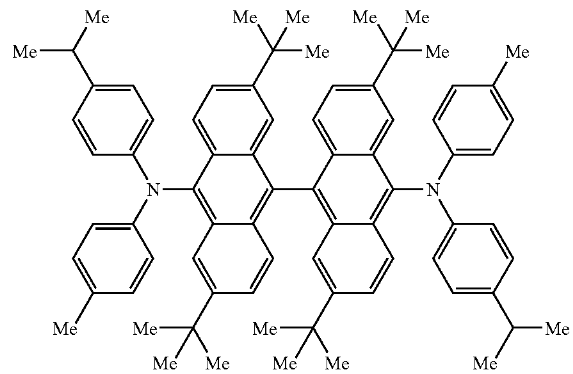
(A)-105
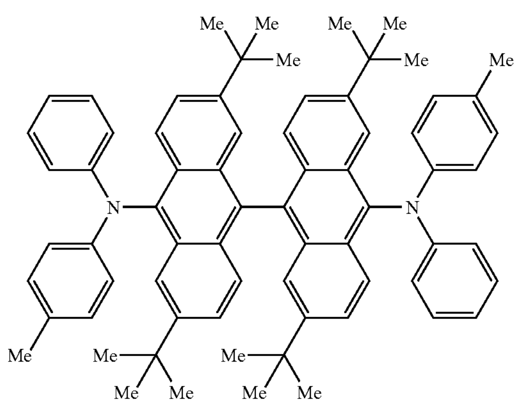
(A)-106
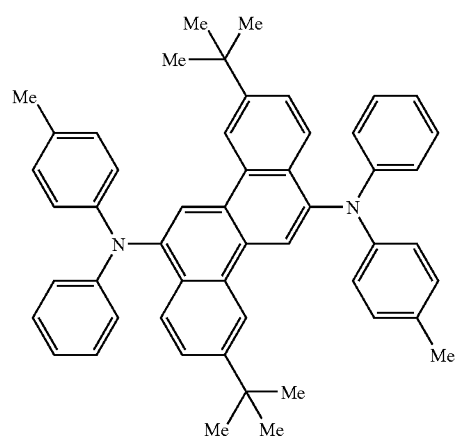
(A)-107
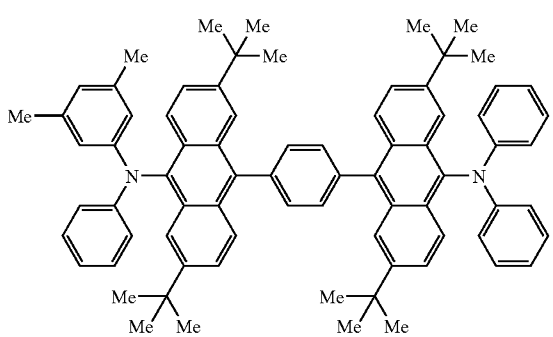
(A)-108
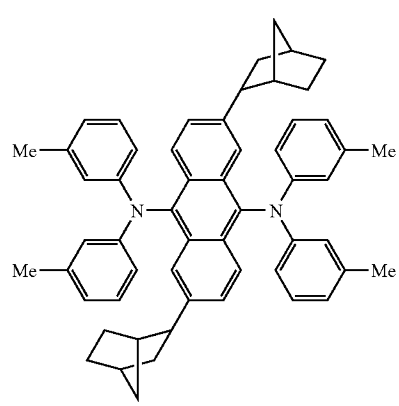

-continued
[Chemical Formula 125]
(A)-109
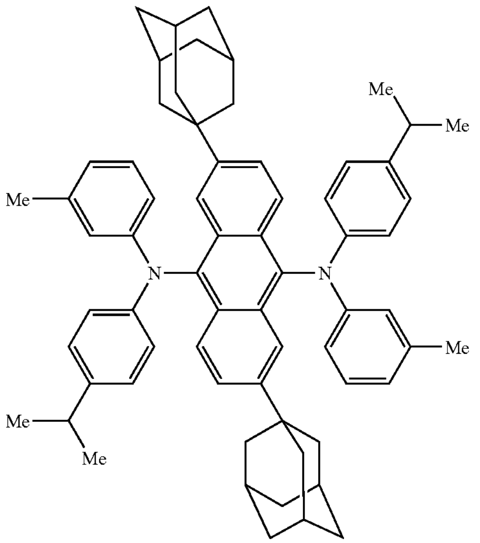
(A)-110
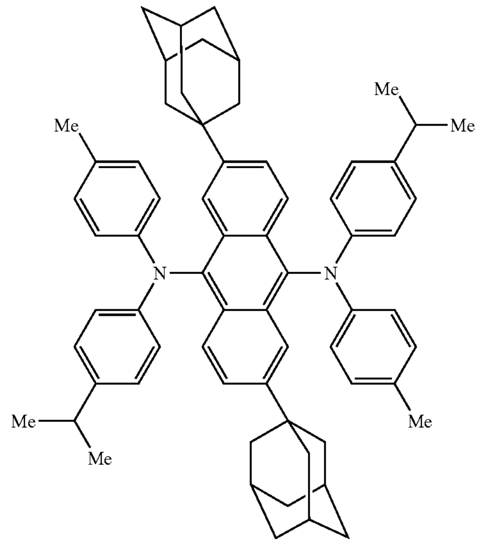
(A)-111
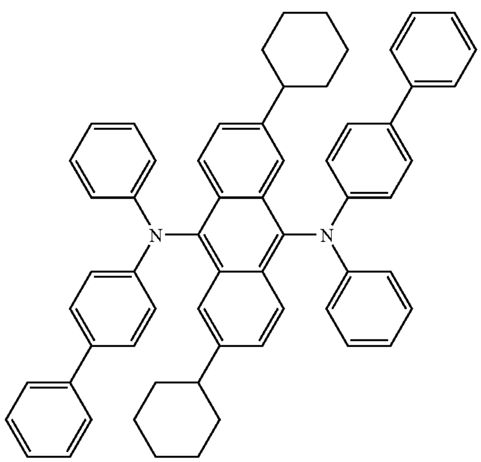
(A)-112
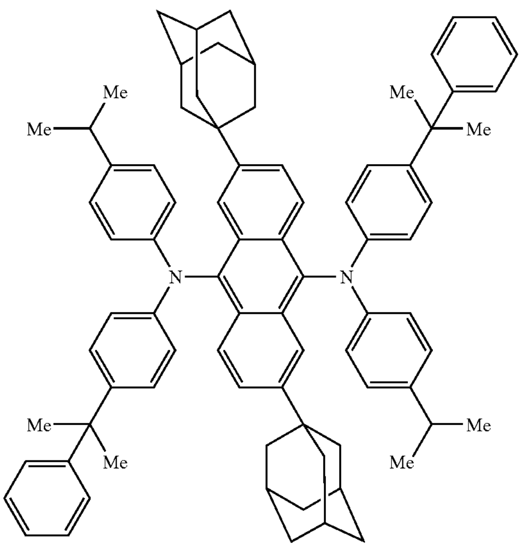
(A)-113
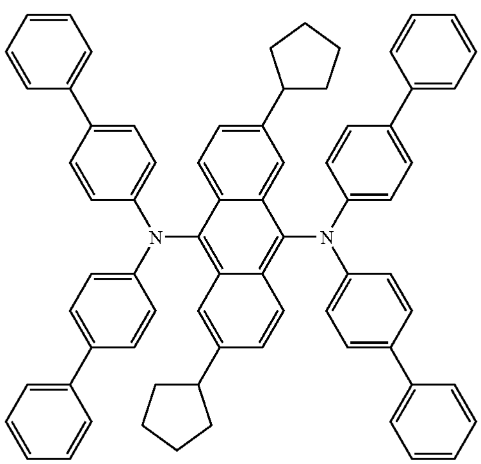
(A)-114
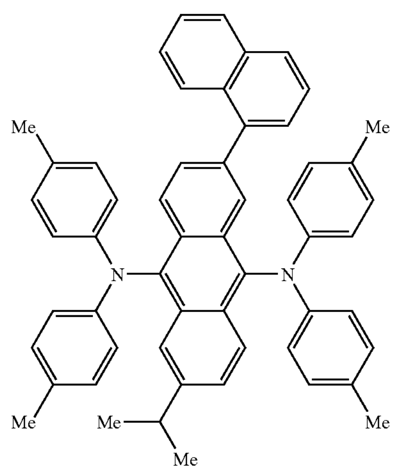

-continued
(A)-115
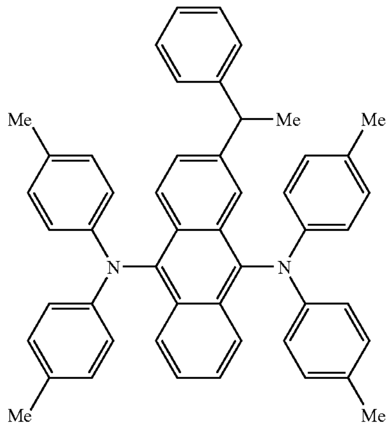
(A)-116
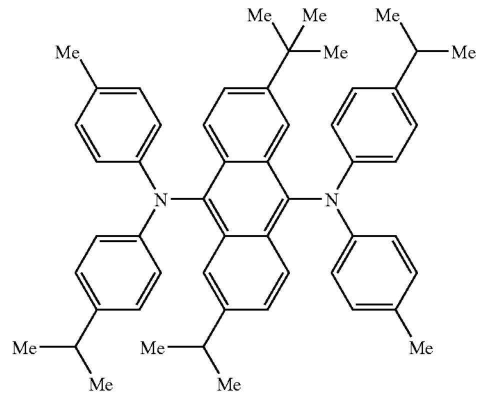
(A)-117
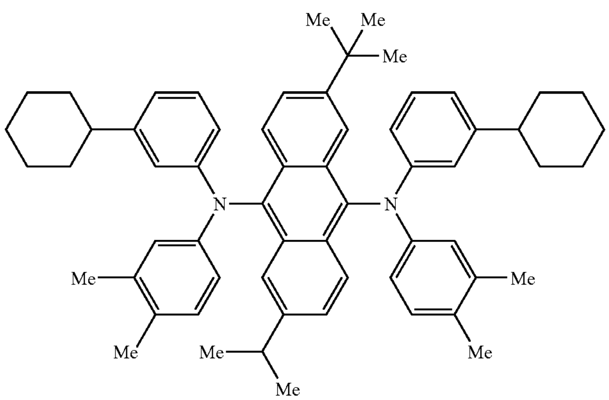
[Chemical Formula 126]
(A)-118
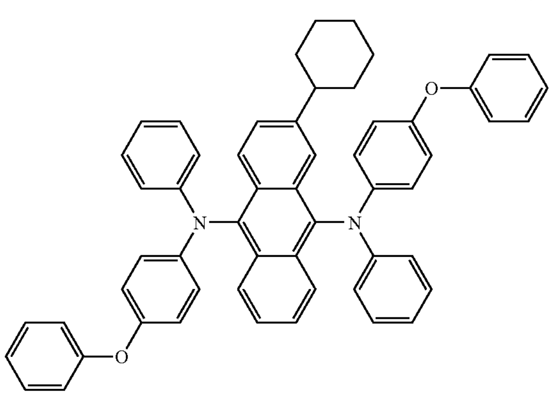
(A)-119
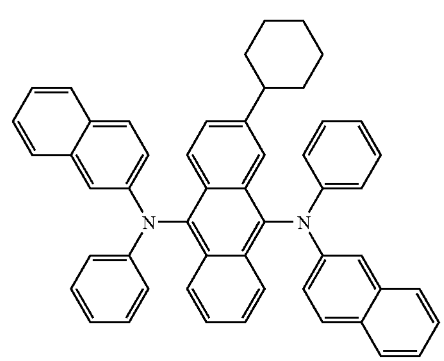

-continued
(A)-120
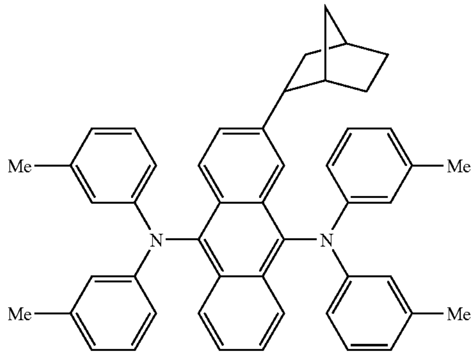
(A)-121
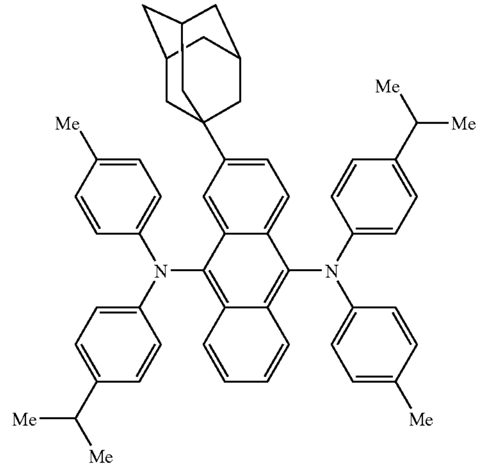
(A)-122
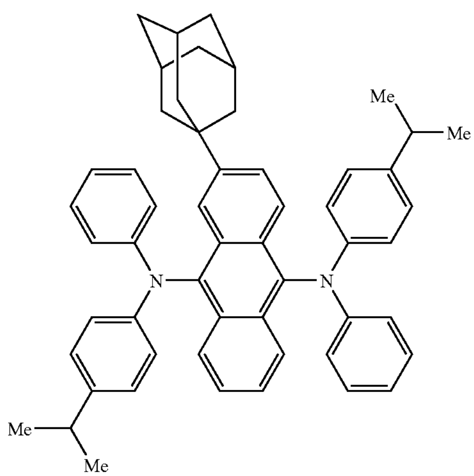
(A)-123
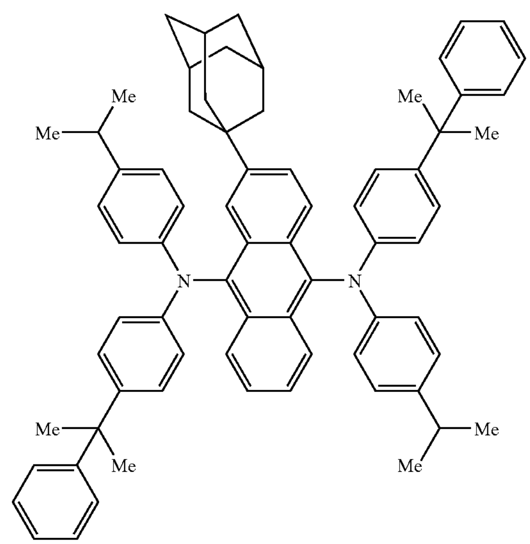
(A)-124
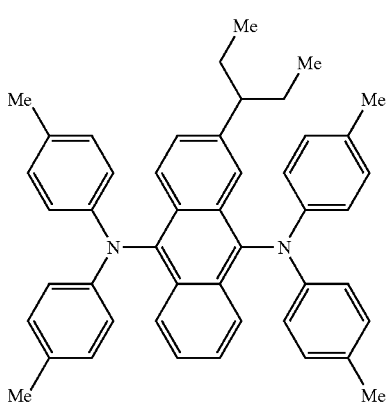
(A)-125
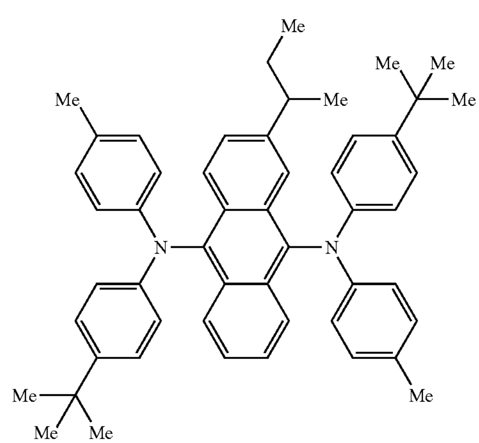

-continued
(A)-126
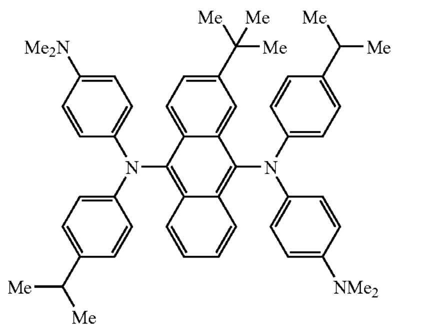
(A)-127
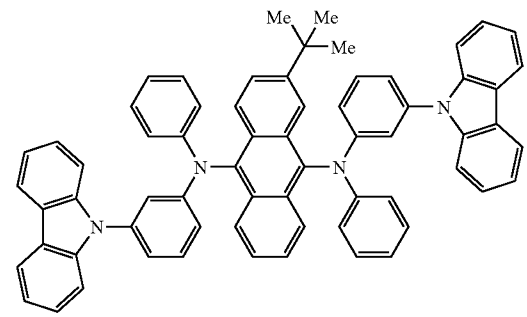
(A)-128
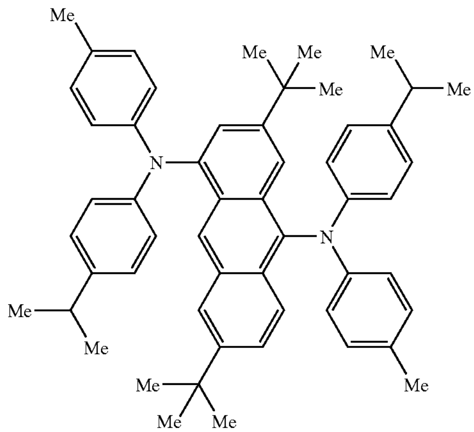
(A)-129
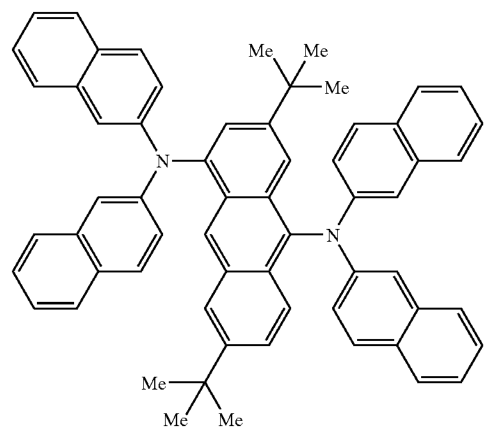
[Chemical Formula 127]
(A)-130
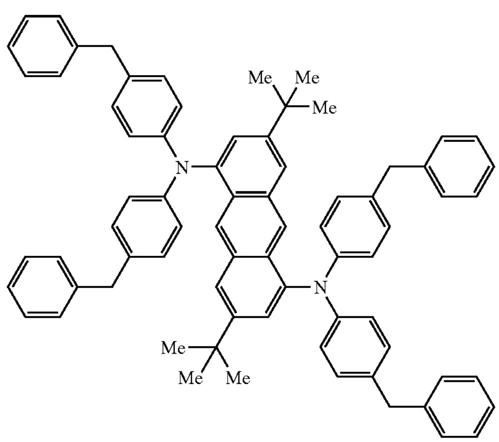
(A)-131
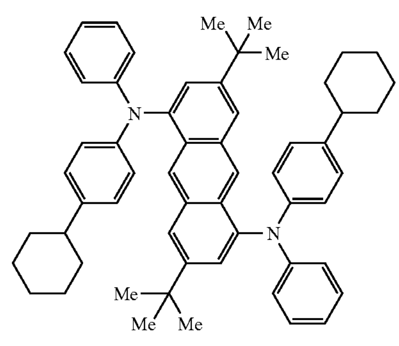
(A)-132
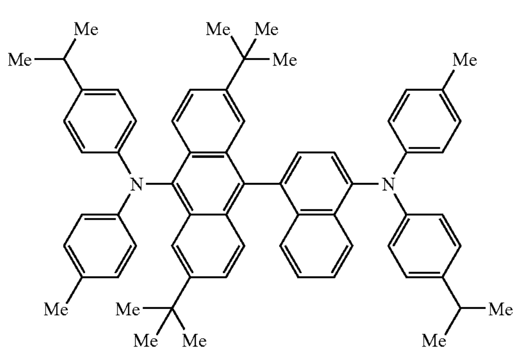
(A)-133
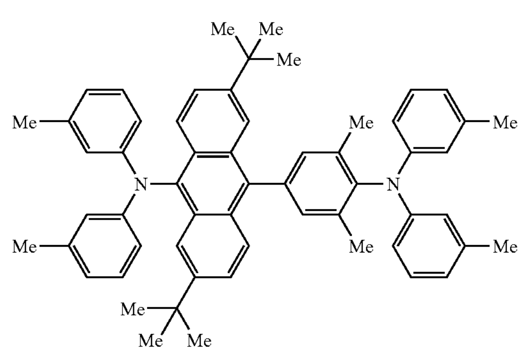

-continued
(A)-134
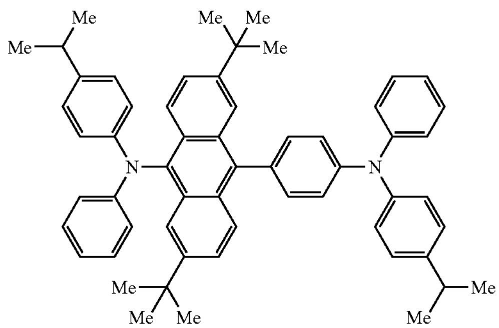
(A)-135
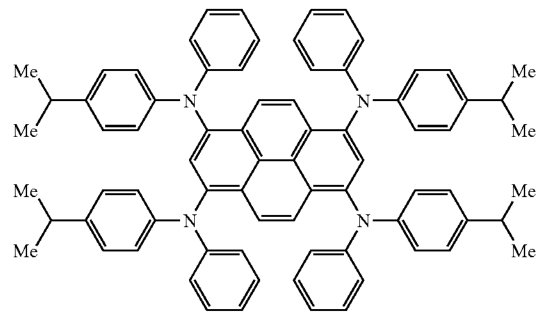
(A)-136
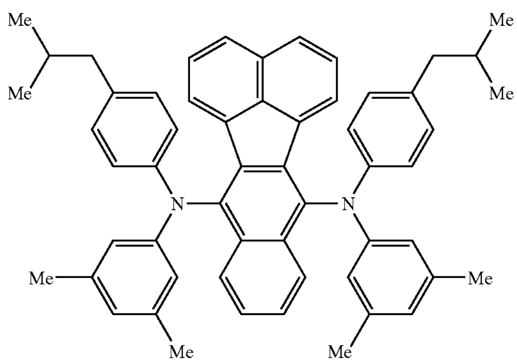
(A)-137
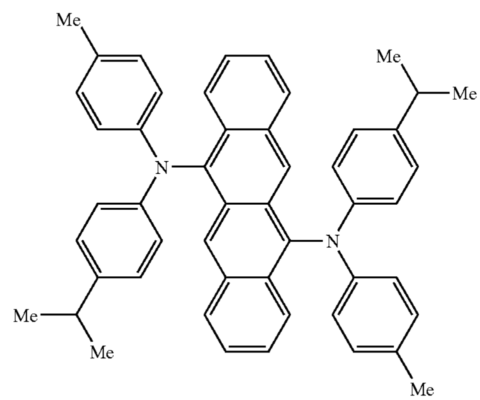
(A)-138
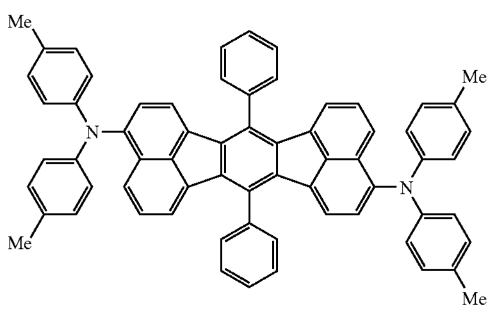
(A)-139
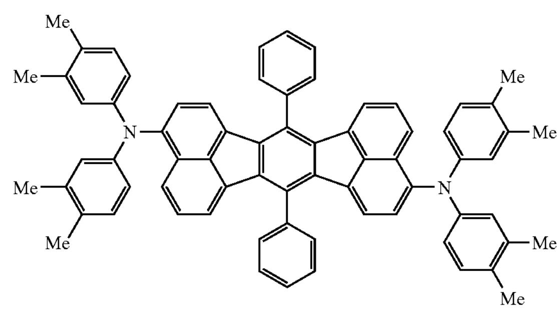
[Chemical Formula 128]
(A)-140
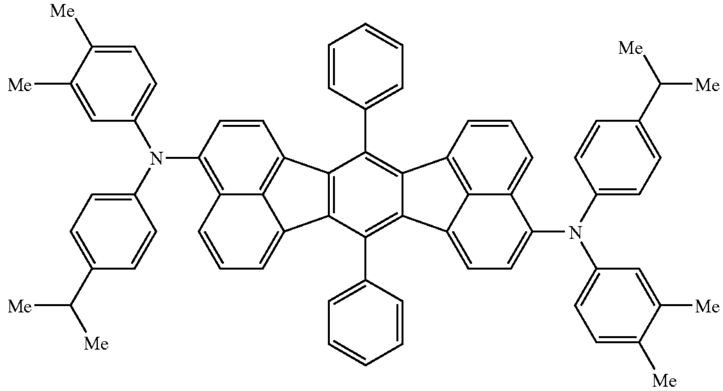

-continued
(A)-141
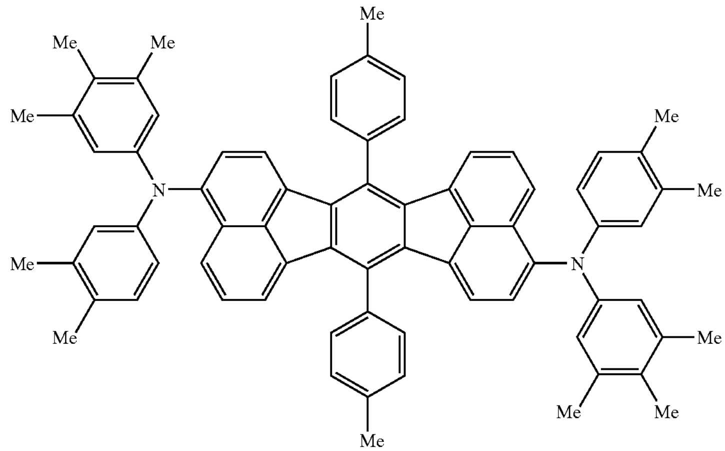
(A)-142
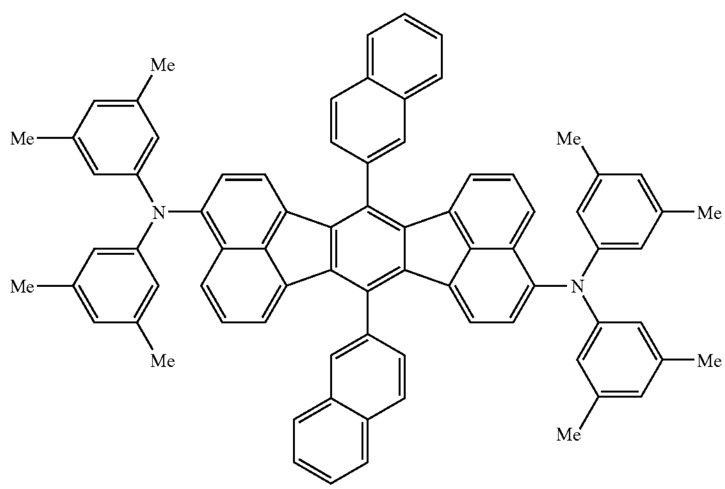
(A)-143
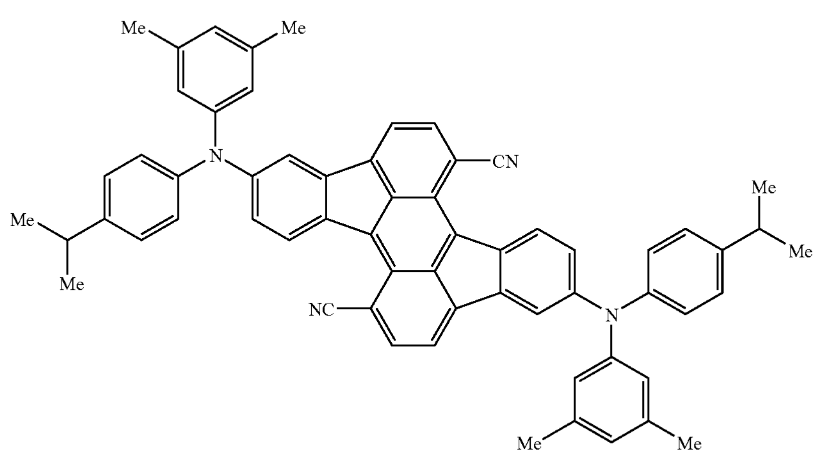

-continued
(A)-144
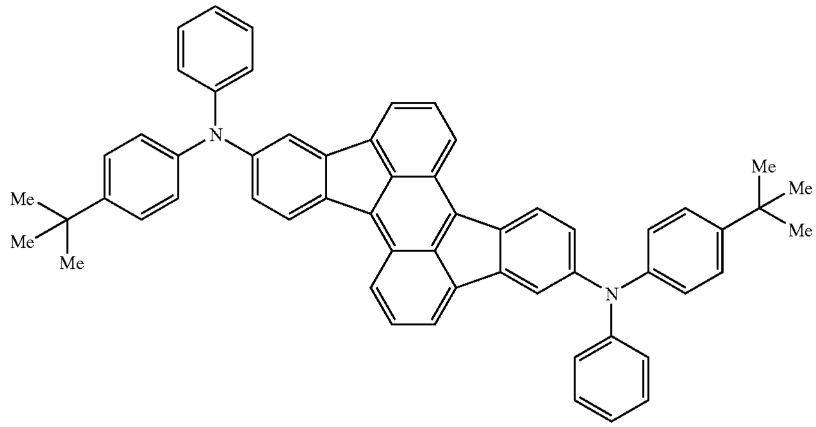
(A)-145
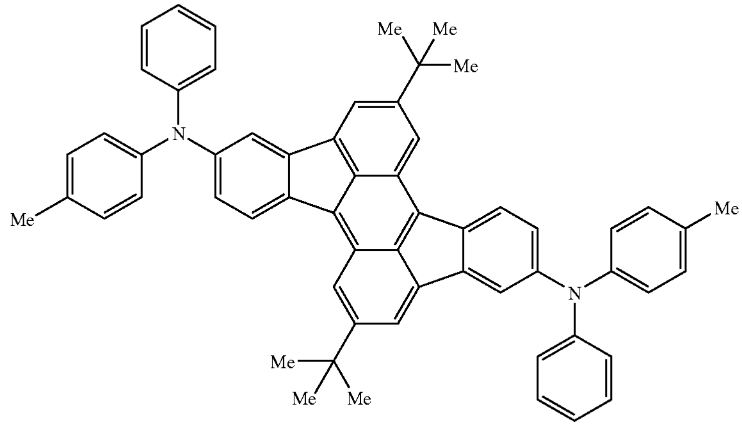
(A)-146
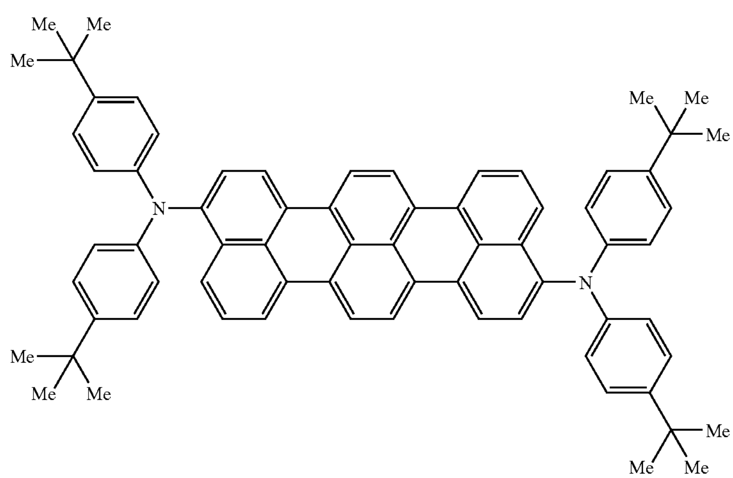

-continued
(A)-147
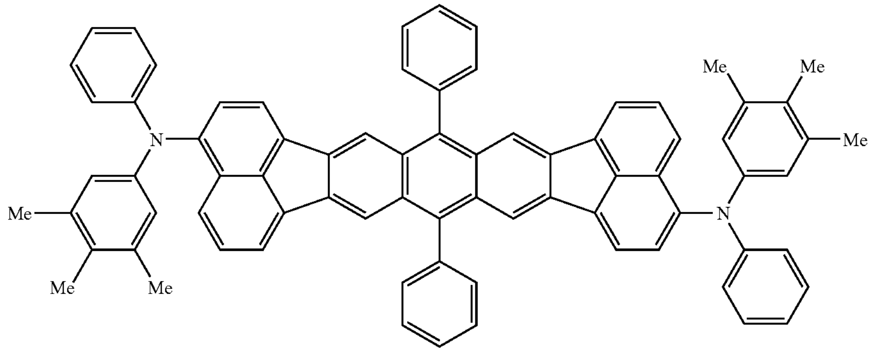
[Chemical Formula 129]
(A)-148
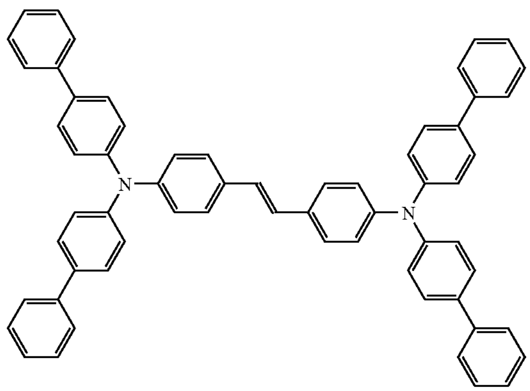
(A)-149
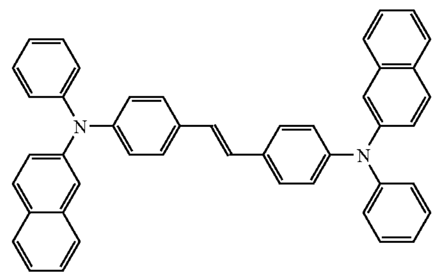
(A)-150
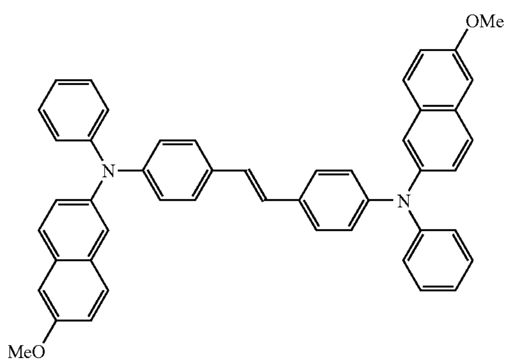
(A)-151
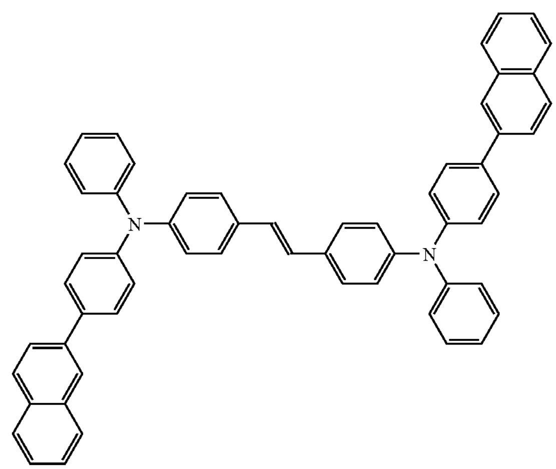
(A)-152
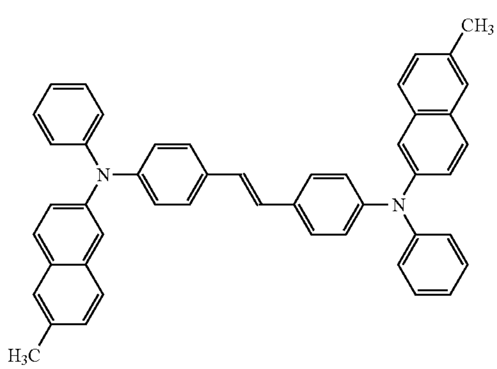
(A)-153
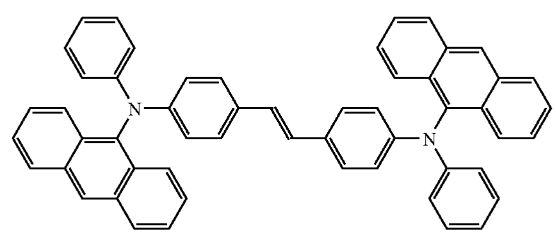

-continued
(A)-154
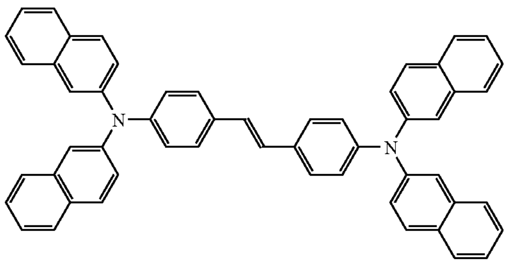
(A)-155
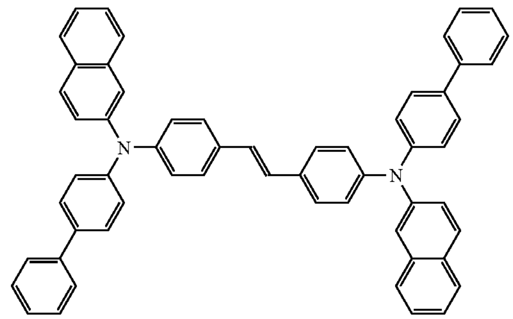
(A)-156
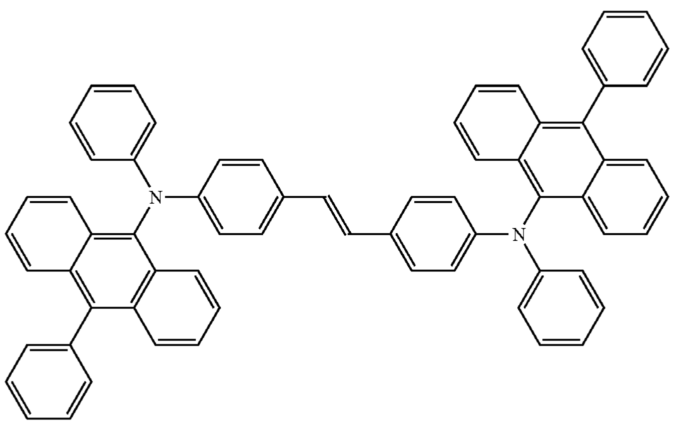
[Chemical Formula 130]
(A)-157
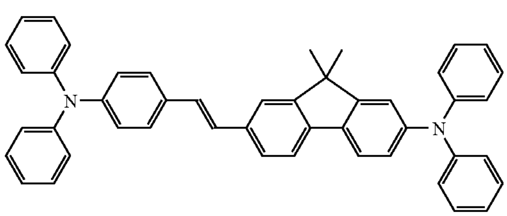
(A)-158
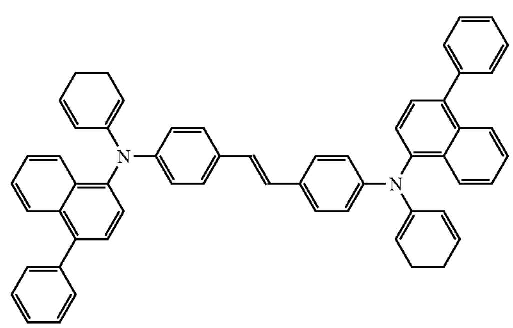
(A)-160
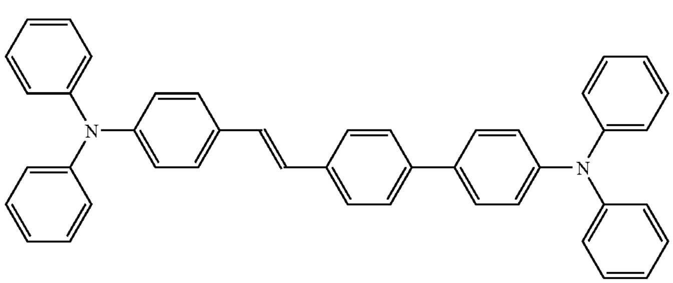

-continued
(A)-161
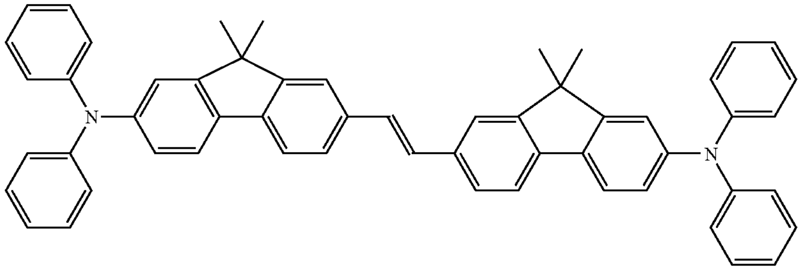
(A)-162
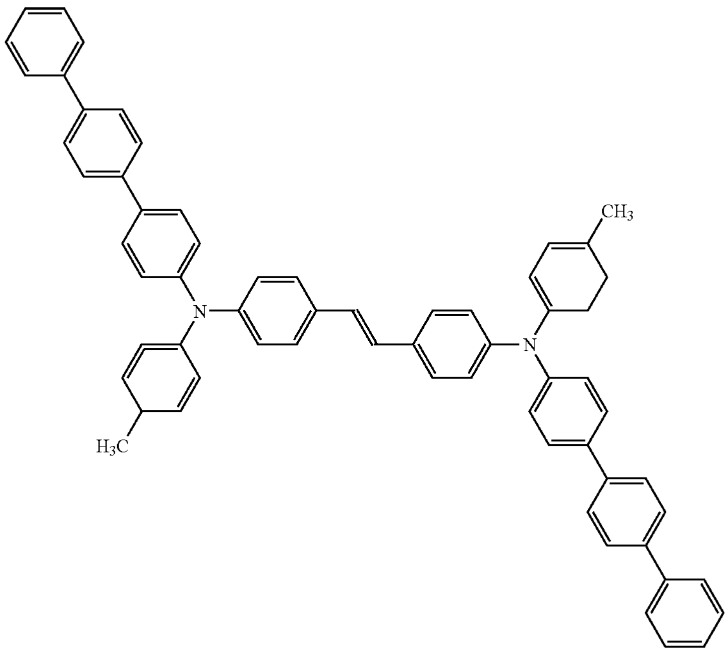
(A)-163
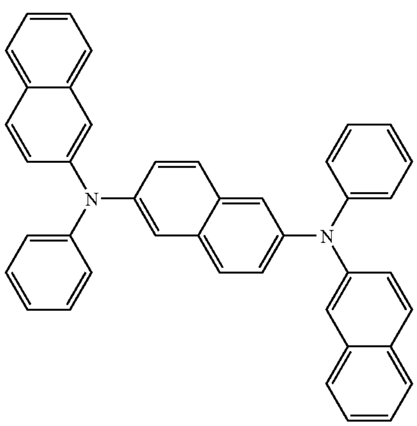
[Chemical Formula 131]
(A)-166
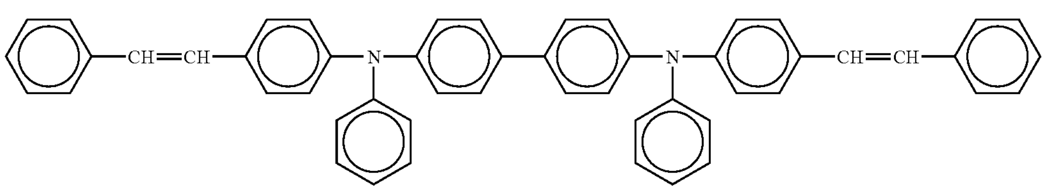
EM32

-continued
(A)-167
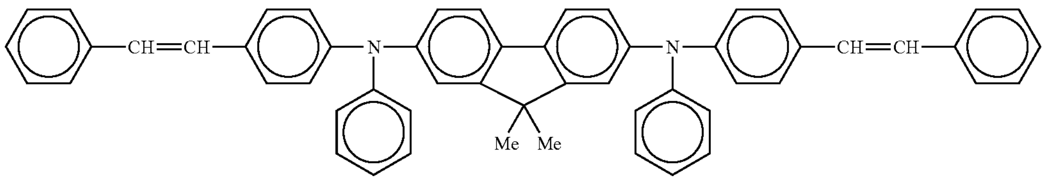
EM32
(A)-168
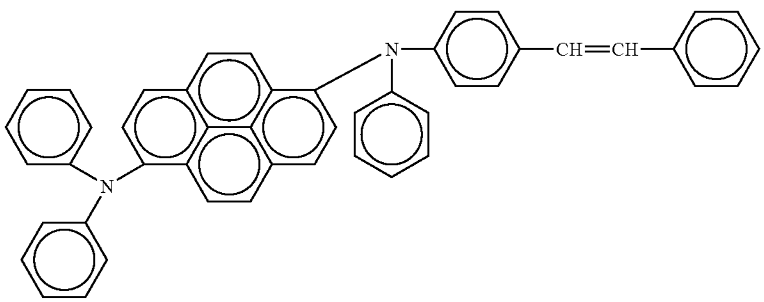
EM34
(A)-169
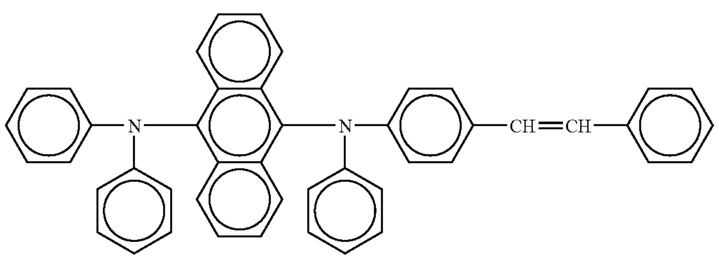
EM35
(A)-170
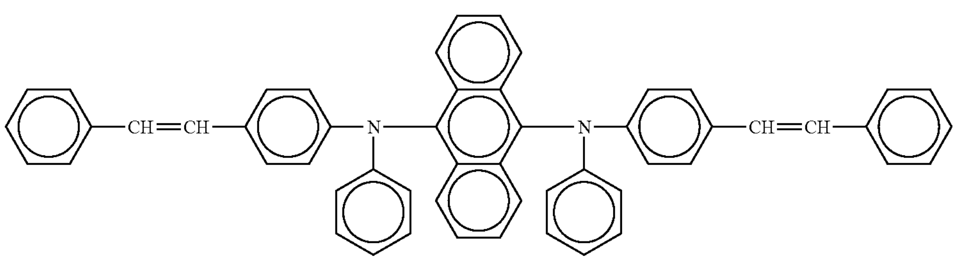
EM36
[Chemical Formula 132]
(A)-171
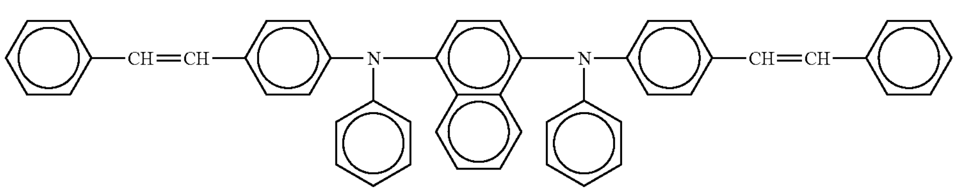
EM41

-continued
(A-172
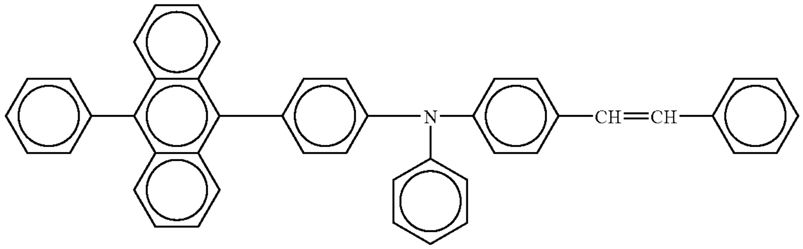
EM42
(A)-173
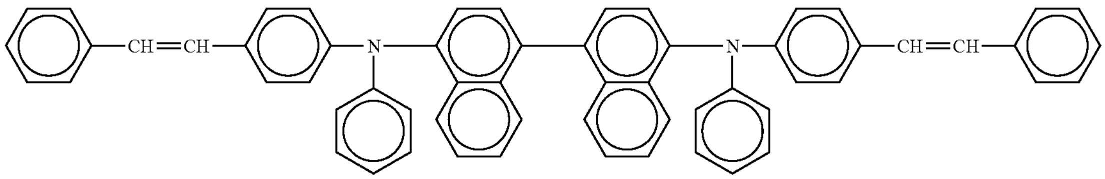
EM43
(A)-174
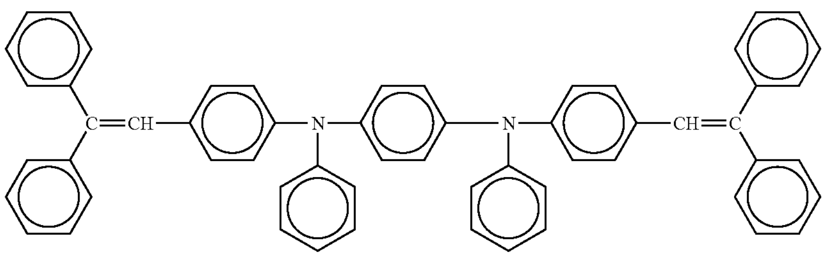
EM44
(A)-175
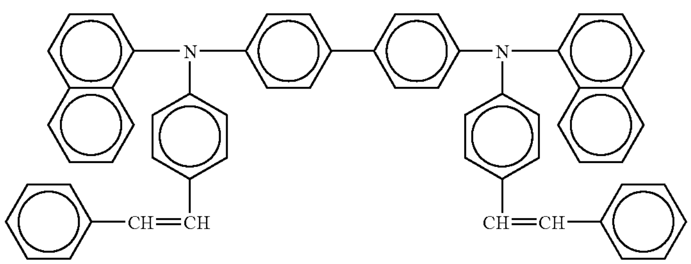
EM45
[Chemical Formula 133]
(A)-176
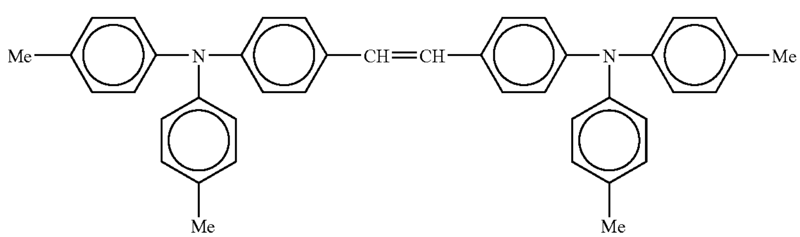
EM46
(A)-177
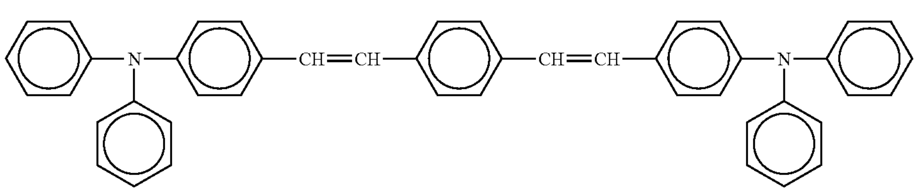
EM47

-continued
(A)-178
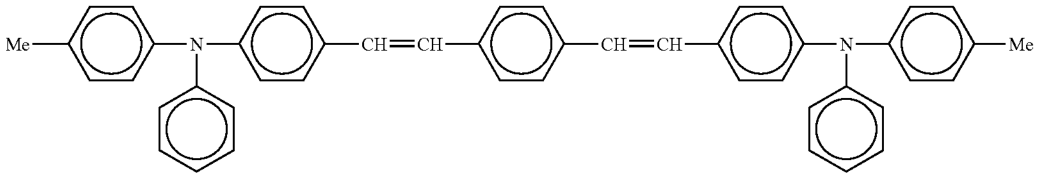
EM48
(A)-179
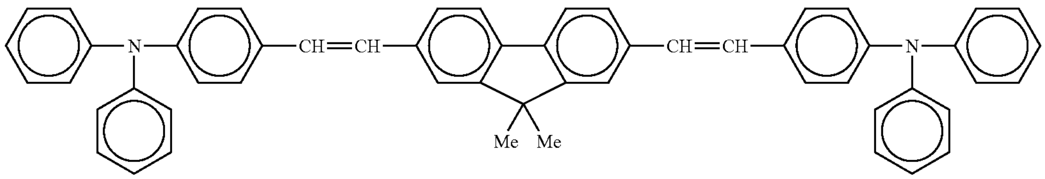
EM49
(A)-180
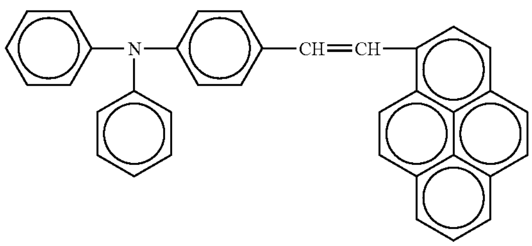
EM50
[Chemical Formula 134]
(A)-181
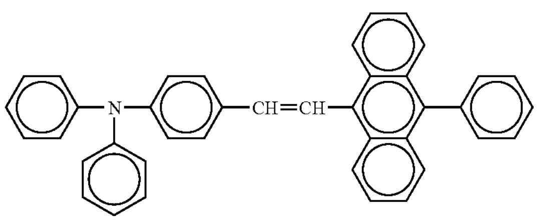
EM51
(A)-182
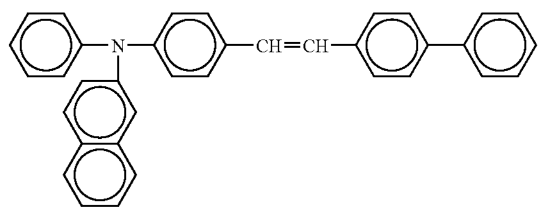
EM52
(A)-183
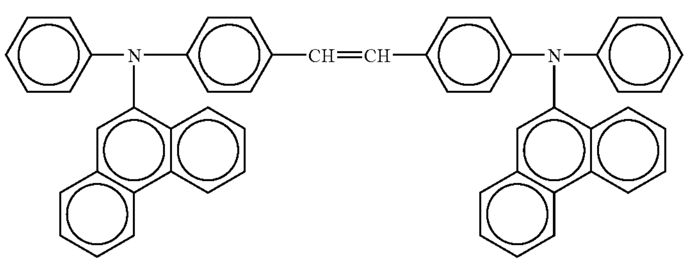
EM53
(A)-184
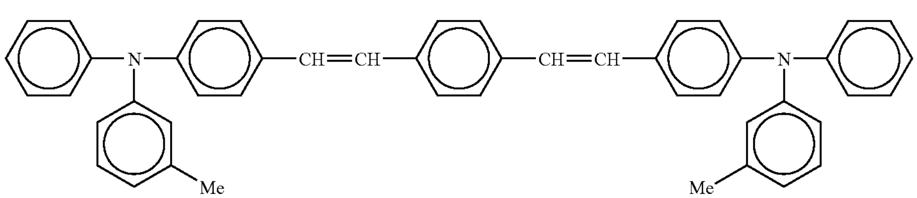
EM54

-continued
(A)-185
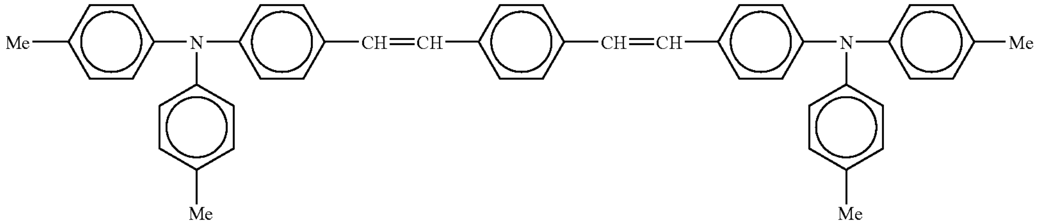
EM55
[Chemical Formula 135]
(A)-186
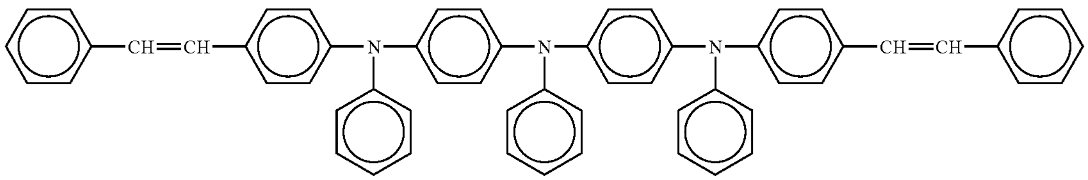
EM56
(A)-187
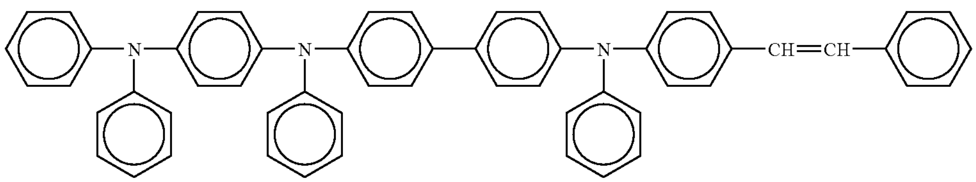
EM57
(A)-188
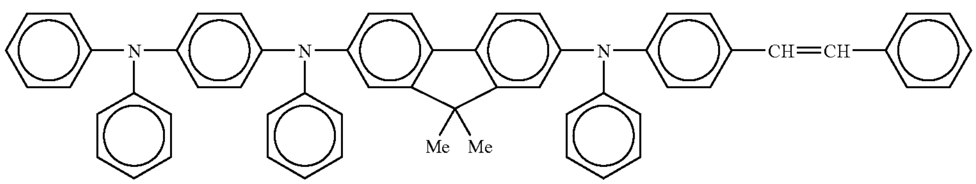
EM58
(A)-189
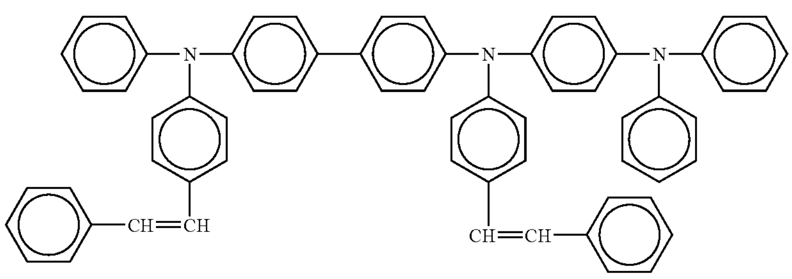
EM59
(A)-190
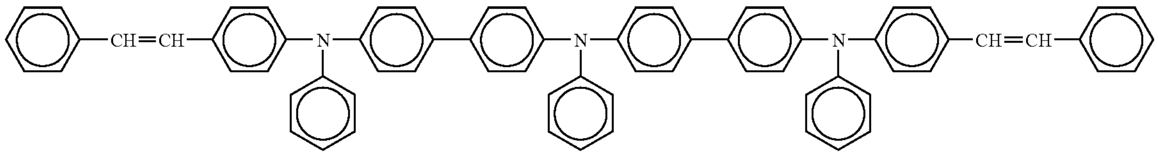
EM60

-continued
(A)-191
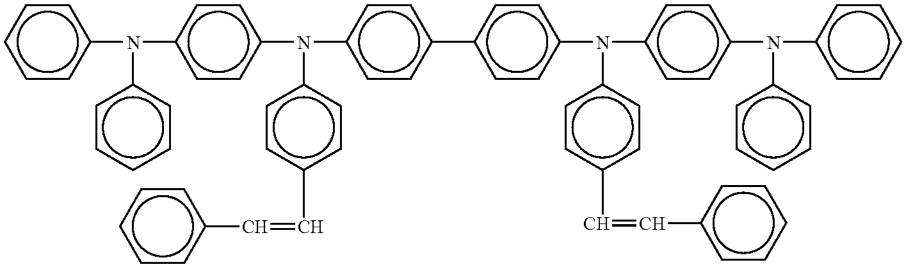
EM61
(A)-192
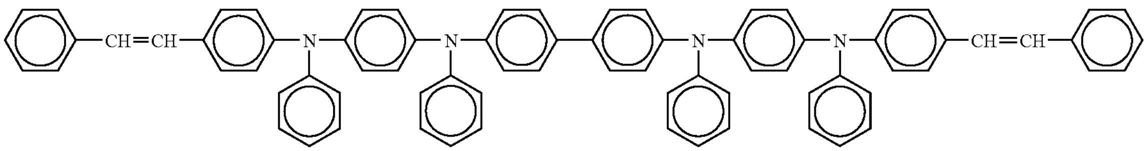
EM62
[Chemical Formula 136]
(A)-193
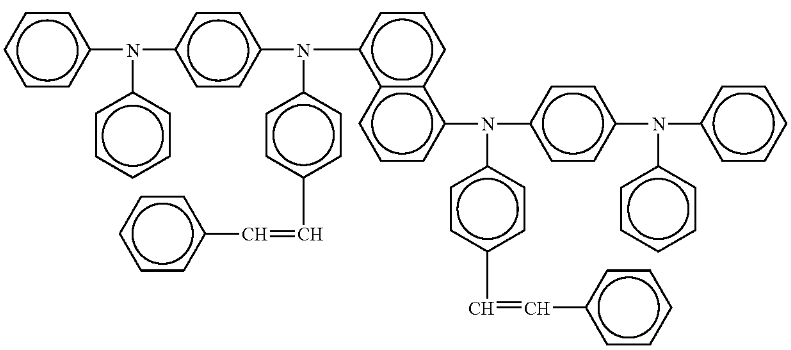
EM63
(A)-194
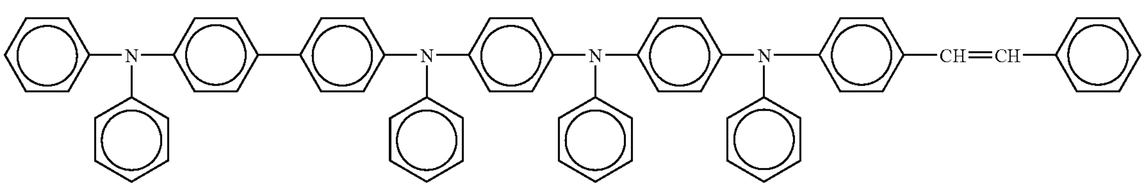
EM64

-continued
(A)-195
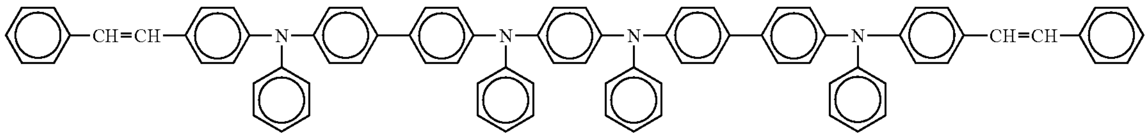
EM65
[Chemical Formula 137]
(A)-196
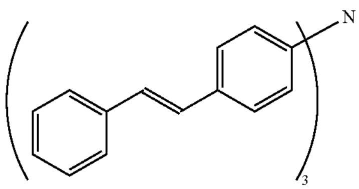
(A)-197
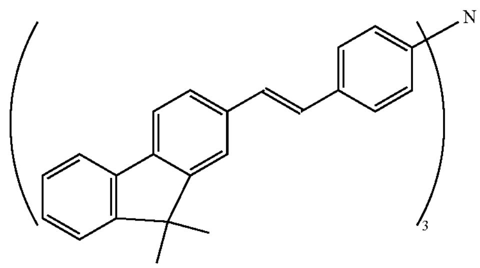
(A)-198
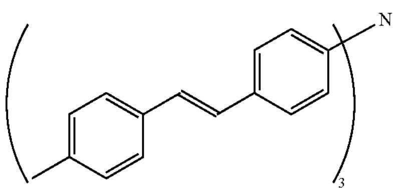
(A)-199
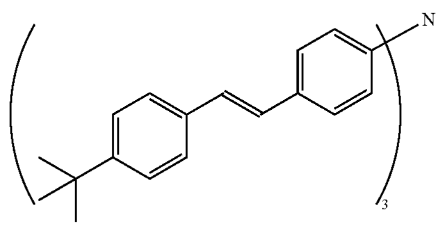
(A)-201
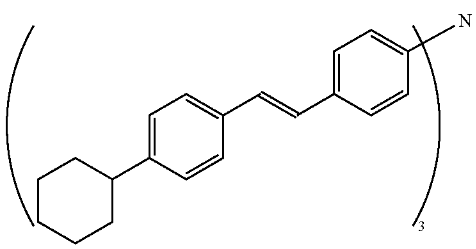
(A)-202
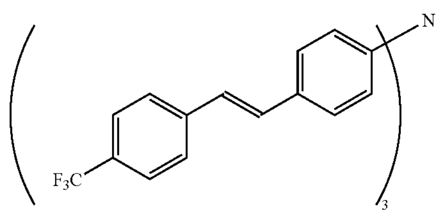
(A)-203
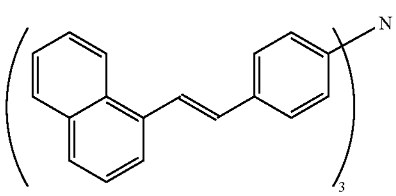
(A)-204
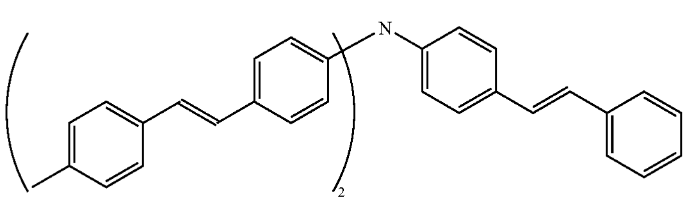

Compounds containing a carbazole group such as those shown below may be used.

[Chemical Formula 138]

(A)-163

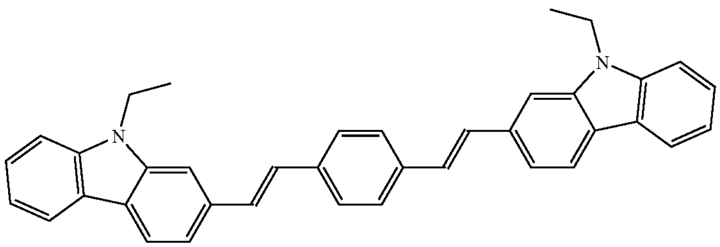

(A)-164

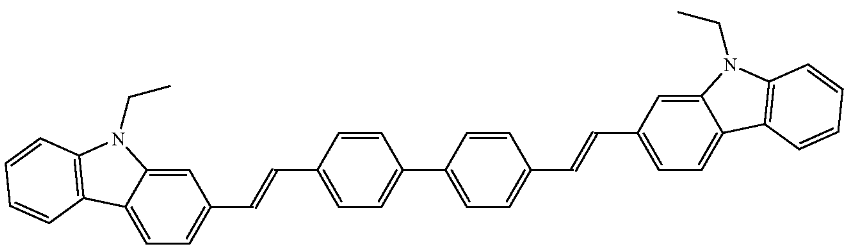

In the aspect of the invention, the fluorescent dopant is preferably a fluoranthene derivative represented by any one of the following formulae (21) to (24).

[Chemical Formula 139]

(21)

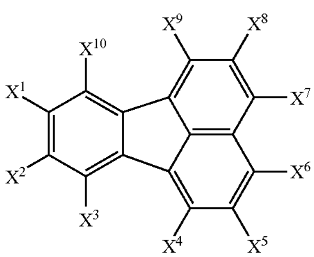

(22)

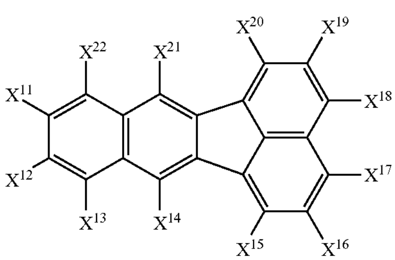

(23)

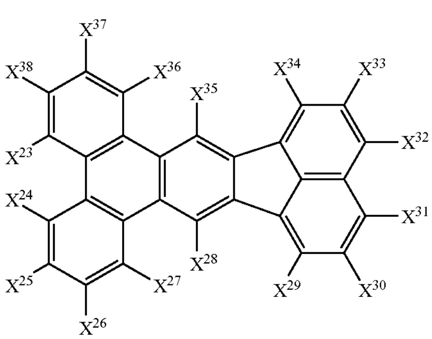

-continued (24)

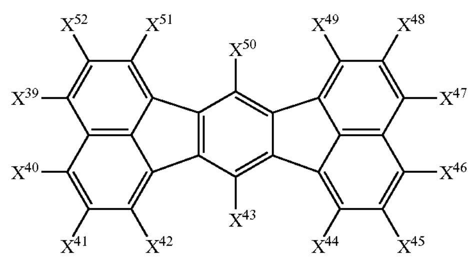

In the formulae (21) to (24), $X^1$ to $X^{52}$ each independently represent a hydrogen atom, halogen atom, substituted or unsubstituted liner, branched or cyclic alkyl group having 1 to 30 carbon atoms, substituted or unsubstituted liner, branched or cyclic alkoxy group having 1 to 30 carbon atoms, substituted or unsubstituted liner, branched or cyclic alkylthio group having 1 to 30 carbon atoms, substituted or unsubstituted liner, branched or cyclic alkenyl group having 2 to 30 carbon atoms, substituted or unsubstituted liner, branched or cyclic alkenyloxy group having 2 to 30 carbon atoms, substituted or unsubstituted liner, branched or cyclic alkenylthio group having 2 to 30 carbon atoms, substituted or unsubstituted aralkyl group having 7 to 30 carbon atoms, substituted or unsubstituted aralkyloxy group having 7 to 30 carbon atoms, substituted or unsubstituted aralkylthio group having 7 to 30 carbon atoms, substituted or unsubstituted aryl group having 6 to 20 carbon atoms, substituted or unsubstituted aryloxy group having 6 to 20 carbon atoms, substituted or unsubstituted arylthio having 6 to 20 carbon atoms, substituted or unsubstituted amino group having 2 to 30 carbon atoms, cyano group, silyl group, hydroxyl group, —COOR$^{1e}$ group wherein R$^{1e}$ represents a hydrogen atom, substituted or unsubstituted linear, branched or cyclic alkyl group having 1 to 30 carbon atoms, substituted or unsubstituted linear, branched or cyclic alkenyl group having 2 to 30 carbon atoms, substituted or unsubstituted aralkyl group having 7 to 30 carbon atoms or substituted or unsubstituted aryl group having 6 to 30 carbon atoms, —$COR^{2e}$ group wherein $R^{2e}$ represents a hydrogen atom, substituted or unsubstituted linear, branched or cyclic alkyl group having 1 to 30 carbon atoms, substituted or unsubstituted linear, branched or cyclic alkenyl group having 2 to 30 carbon atoms, substituted or unsubstituted aralkyl group having 7 to 30 carbon atoms, substituted or unsubstituted aryl group having 6 to 30 carbon atoms or amino group, or —$OCOR^{3e}$ group wherein $R^{3e}$ represents a substituted or unsubstituted linear, branched or cyclic alkyl group having 1 to 30 carbon atoms, substituted or unsubstituted linear, branched or cyclic alkenyl group having 2 to 30 carbon atoms, substituted or unsubstituted aralkyl group having 7 to 30 carbon atoms, or substituted or unsubstituted aryl group having 6 to 30 carbon atoms; an adjacent set of groups of $X^1$ to $X^{52}$ and an adjacent set of substituents of $X^1$ to $X^{52}$ are allowed be bonded together to form a substituted or unsubstituted carbocycle.

Examples of the fluoranthene derivative are those represented by the following formulae.

[Chemical Formula 140]

1-1

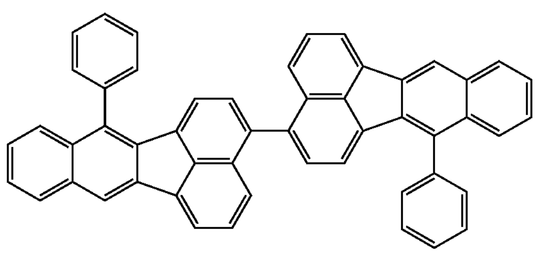

1-2

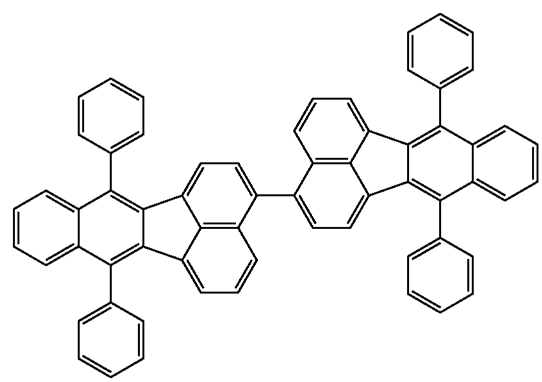

1-3

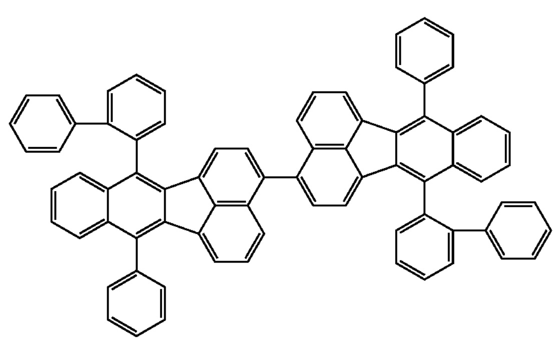

1-4

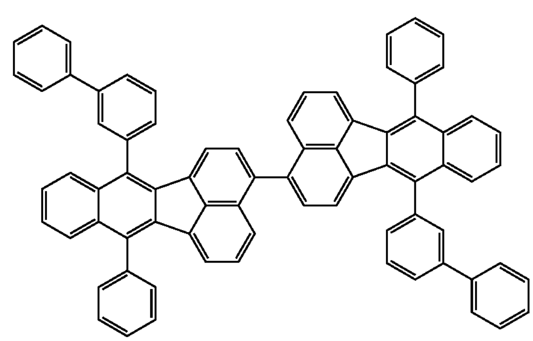

1-5

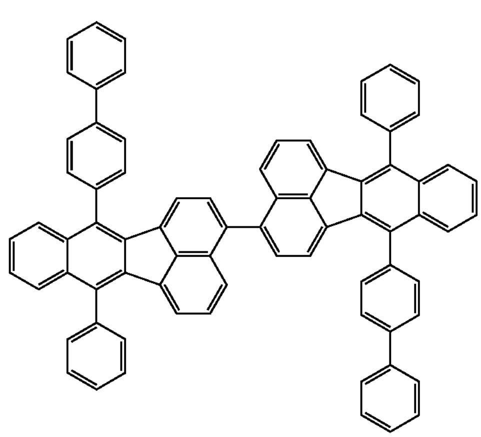

1-6

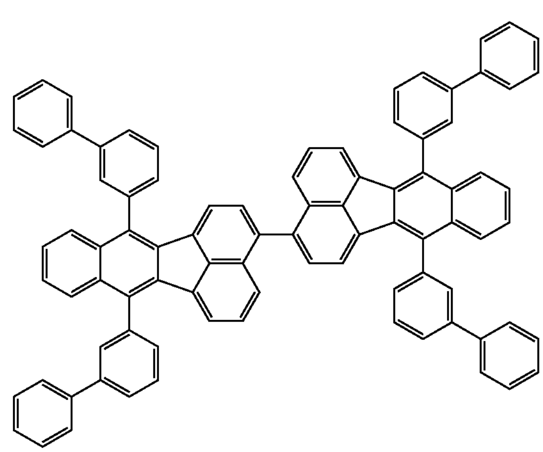

-continued
1-7
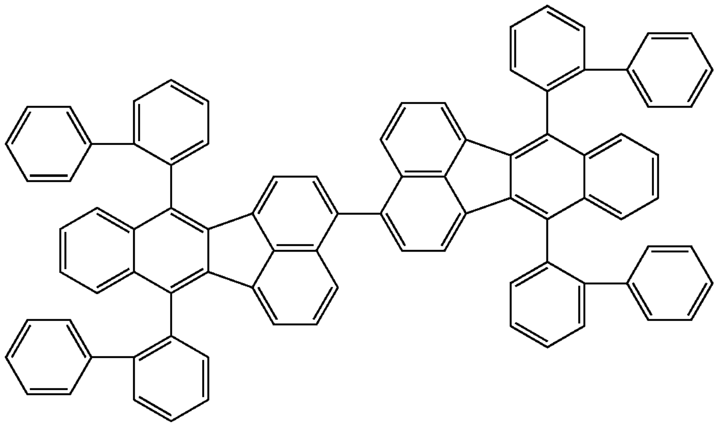
1-8
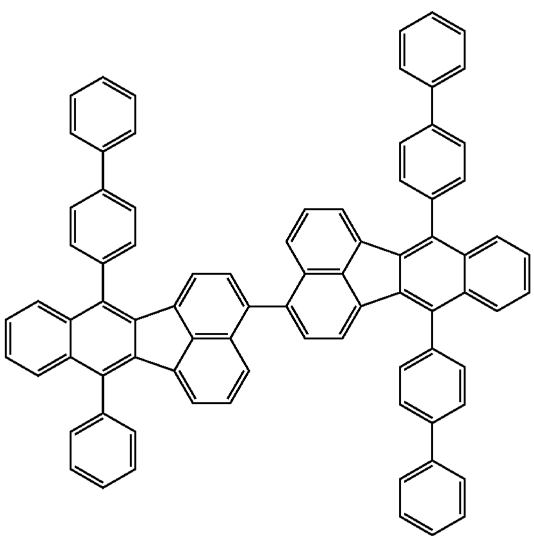
1-9
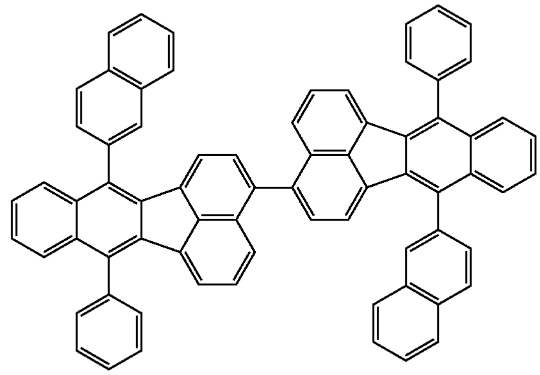
[Chemical Formula 141]
1-10
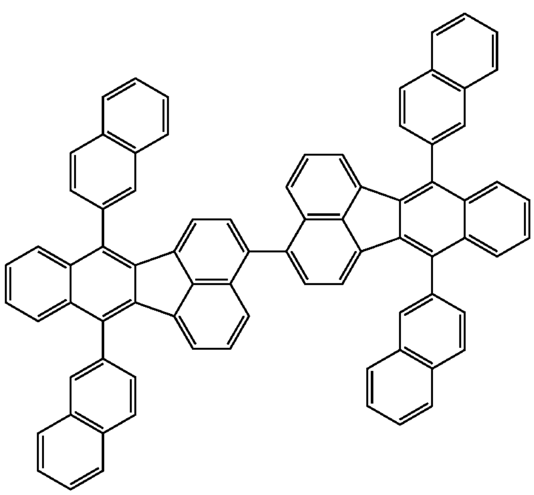
1-11
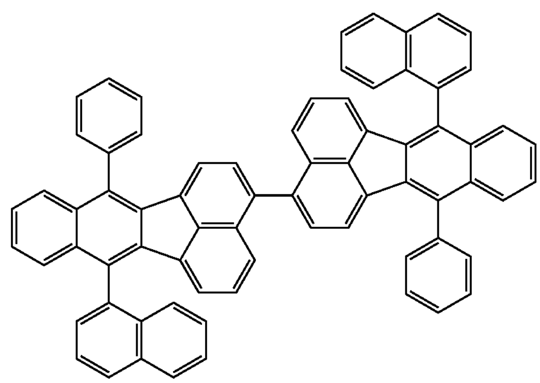

-continued
1-12
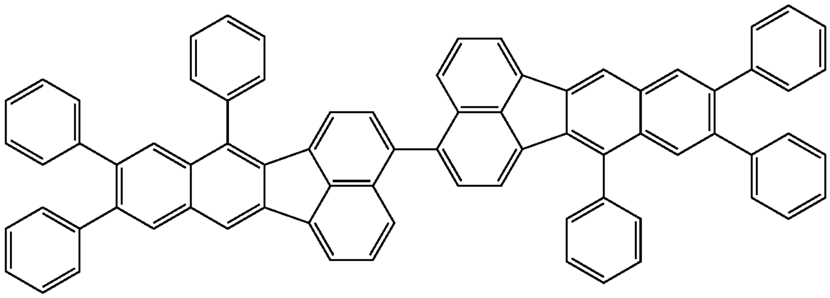
1-13
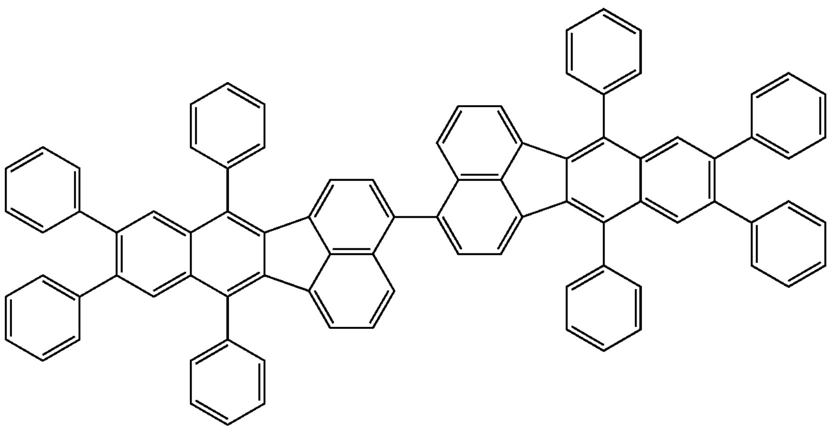
1-14
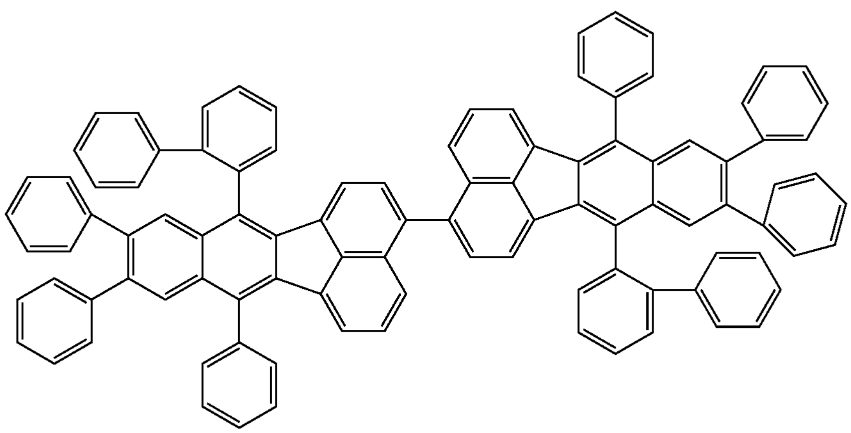
1-15
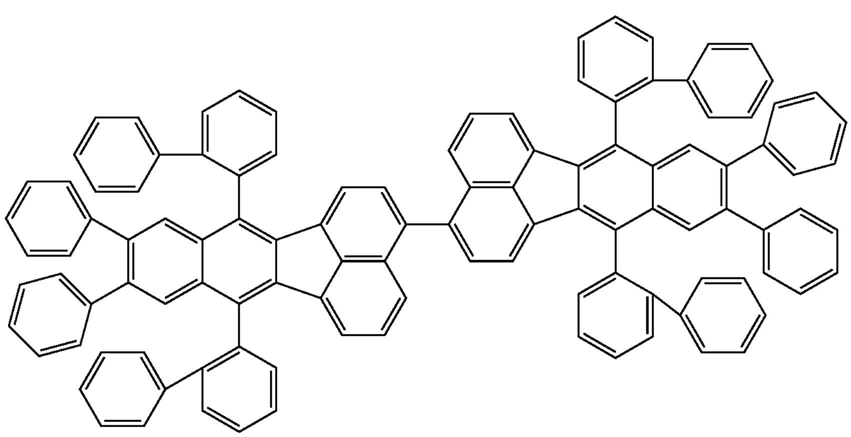

-continued
1-16
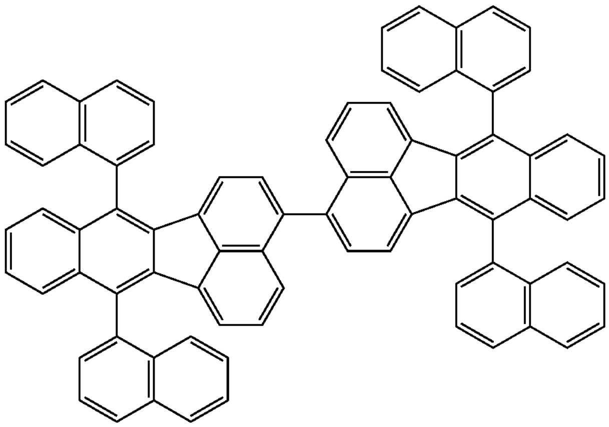
1-17
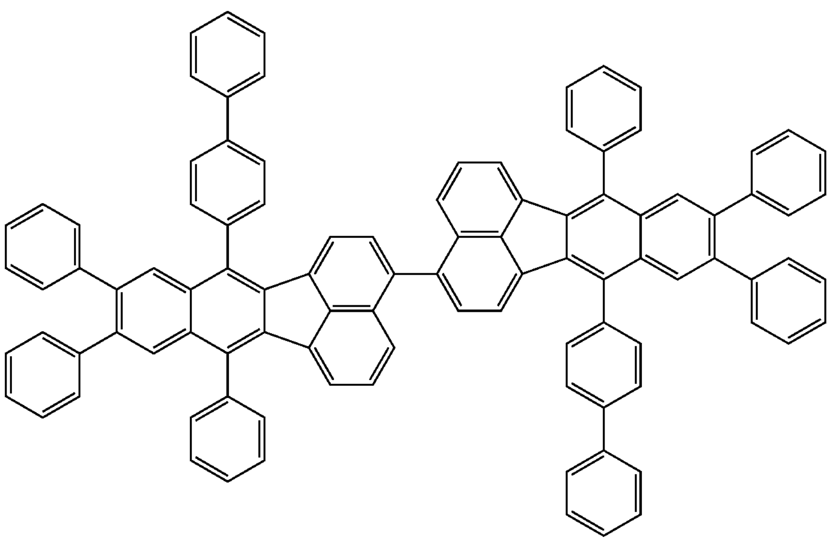
1-18
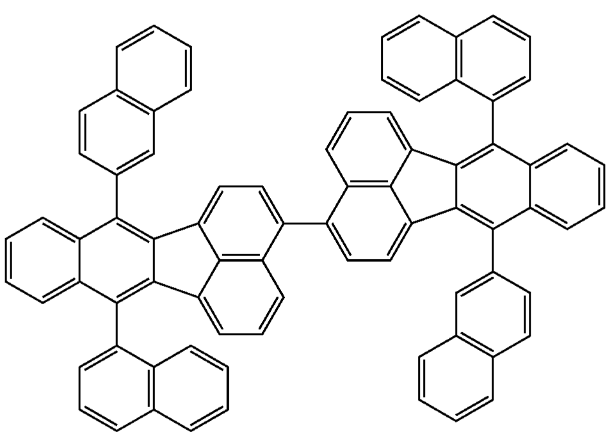

-continued
Chemical Formula 142]
1-19
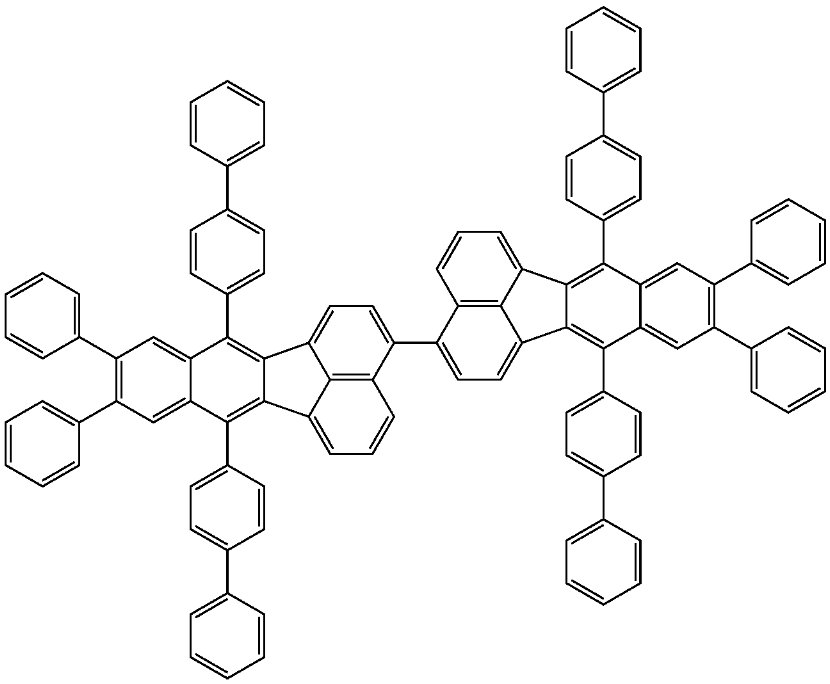
1-20
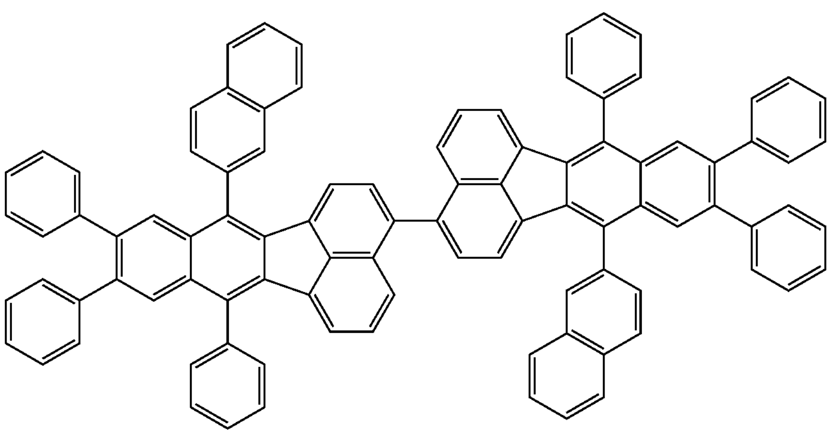
1-21
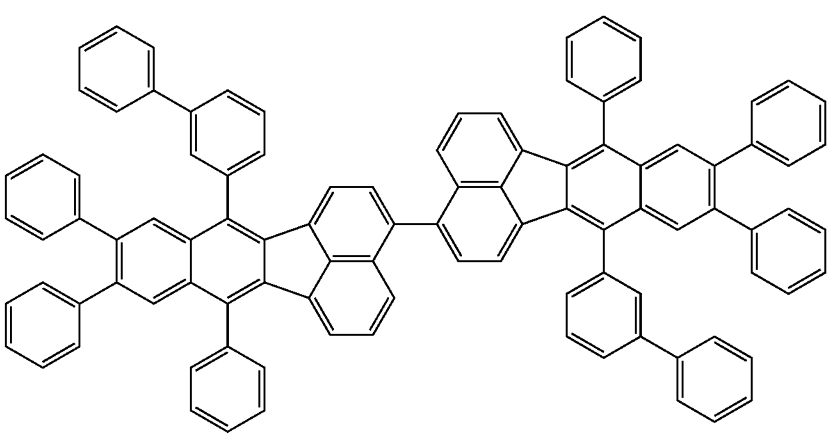

-continued
1-22
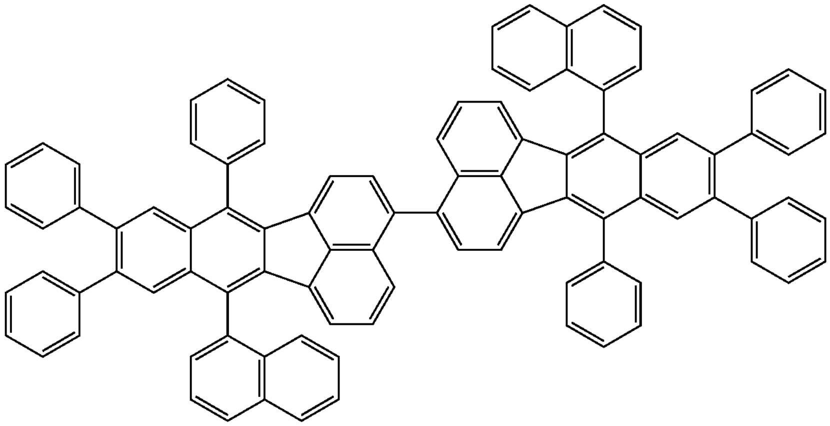
1-23
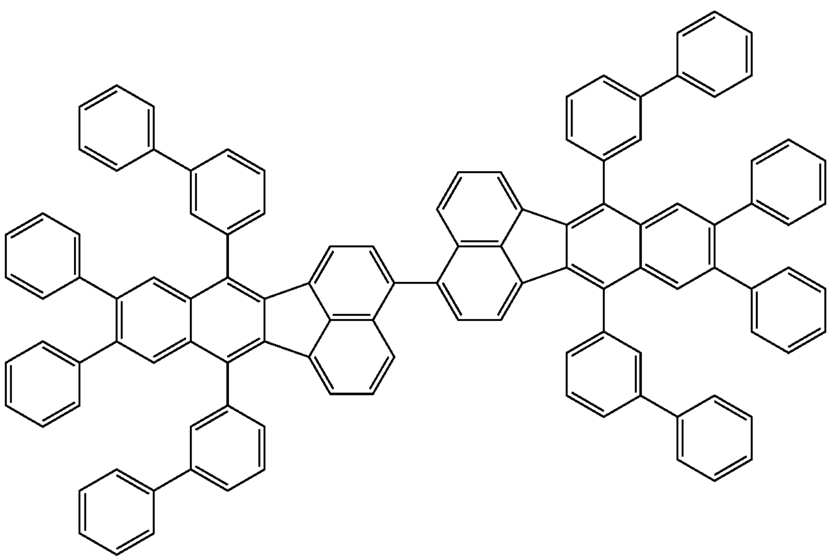
1-24
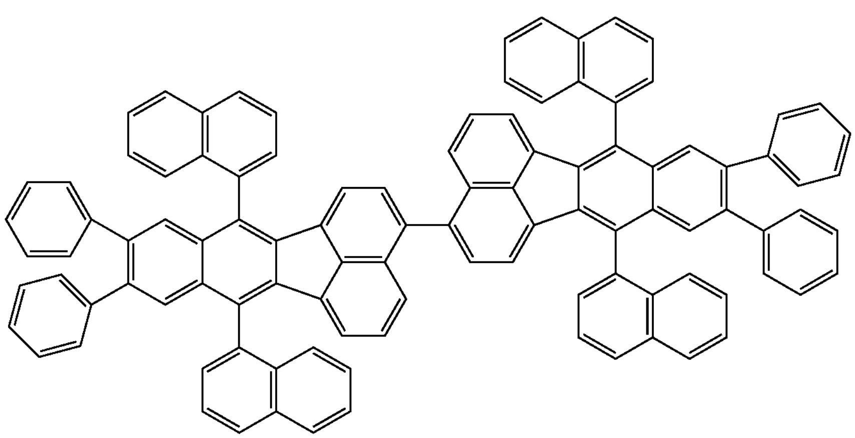

-continued
1-25
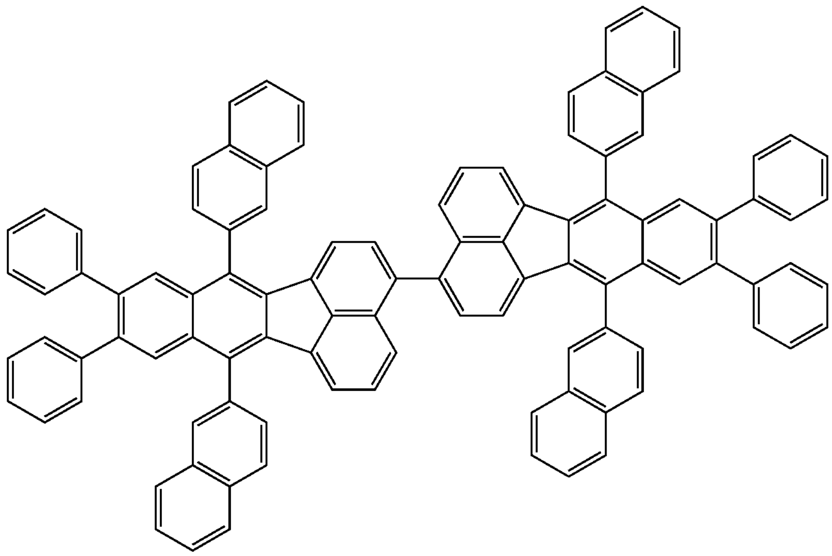
1-26
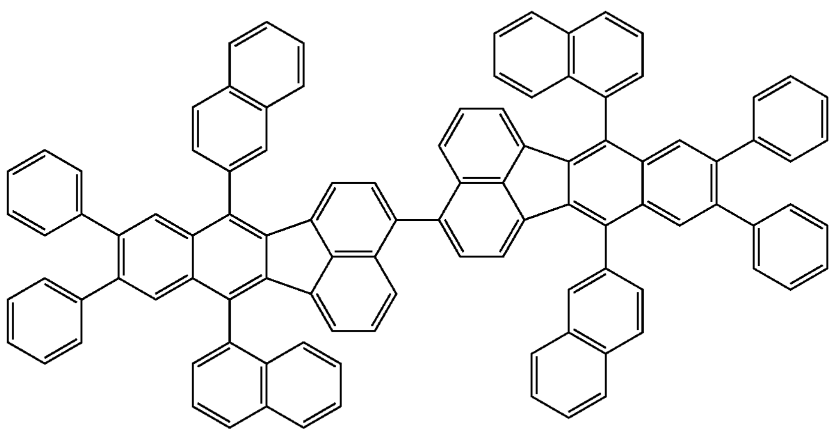
[Chemical Formula 143]
1-27
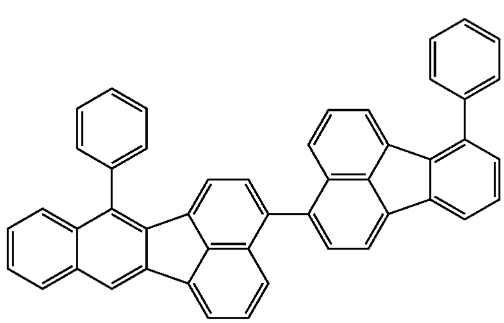
1-28
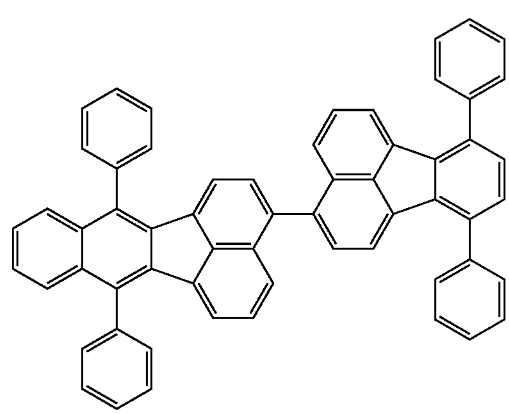

-continued
1-29
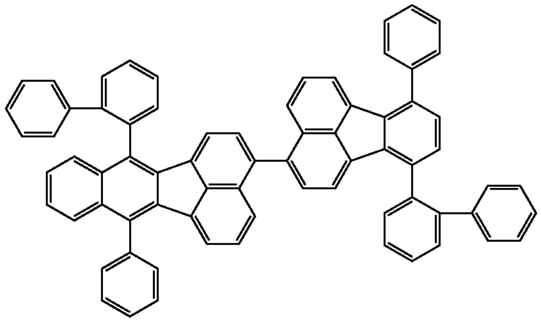
1-30
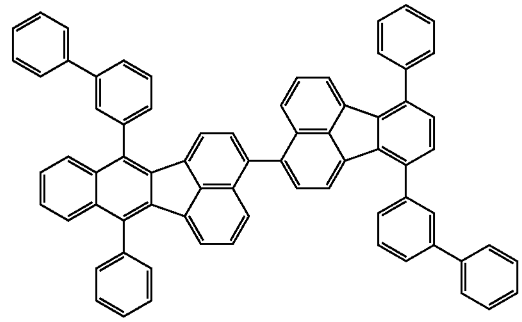
1-31
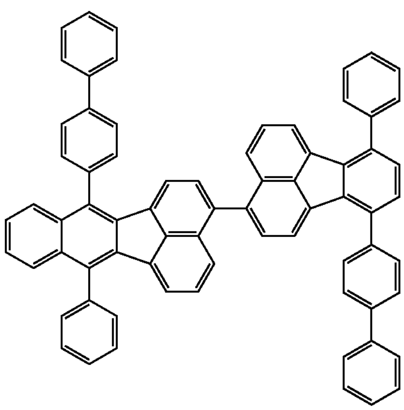
1-32
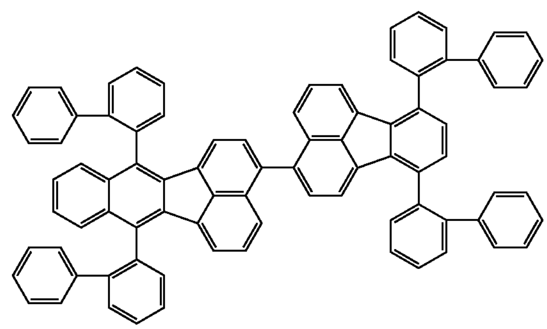
1-33
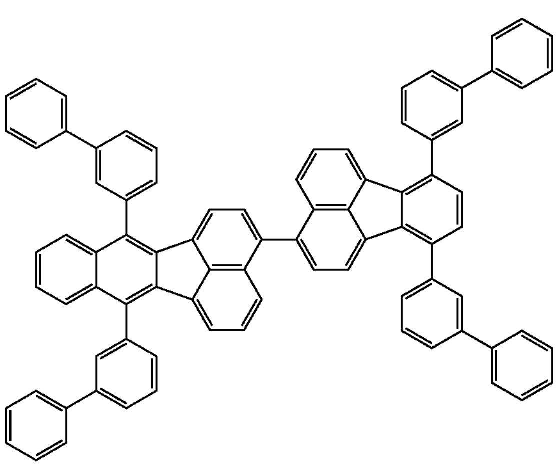
1-34
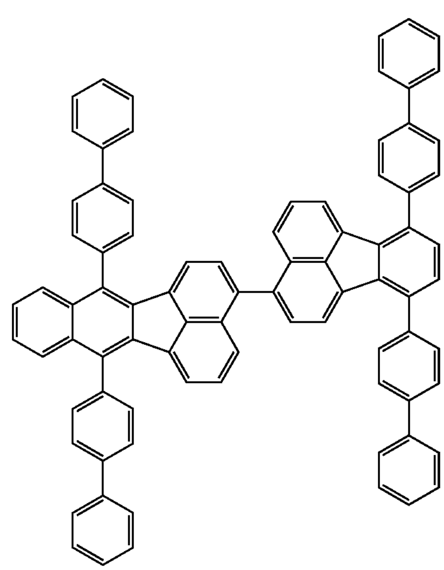

-continued
1-35
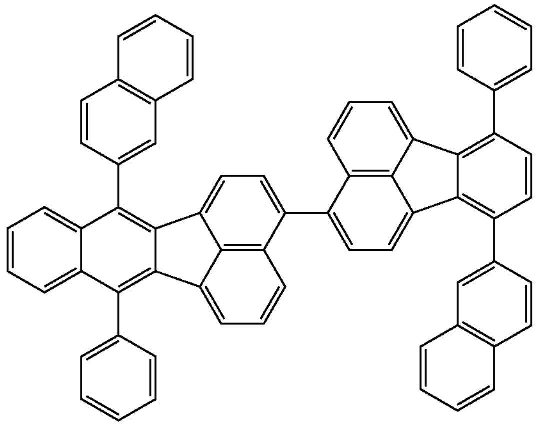
[Chemical Formula 144]
1-36
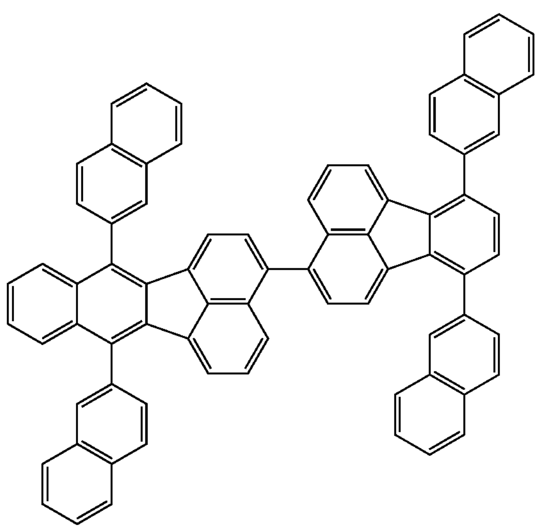
1-37
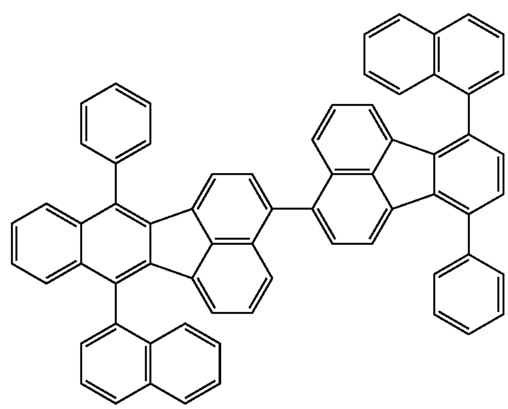
1-38
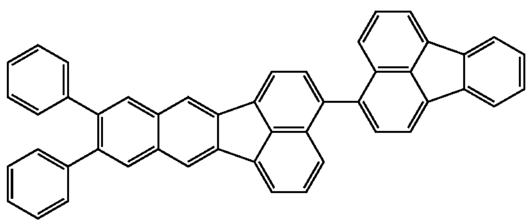
1-39
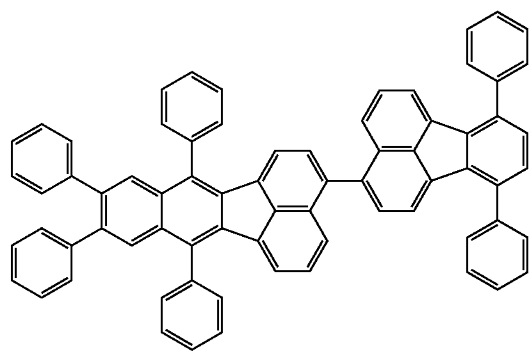

-continued
1-40
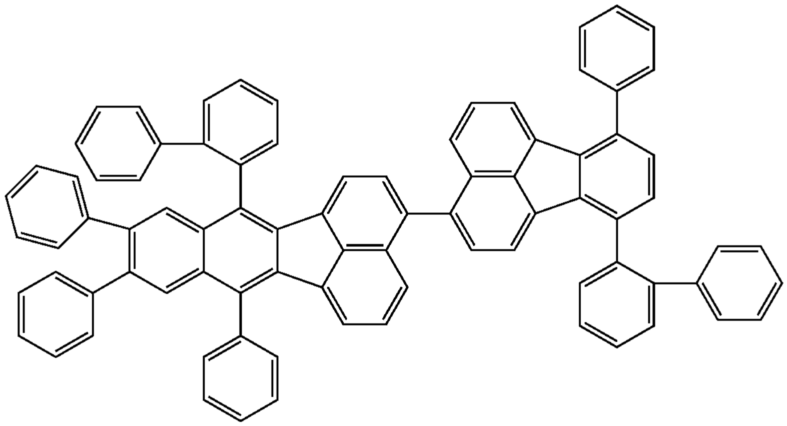
1-41
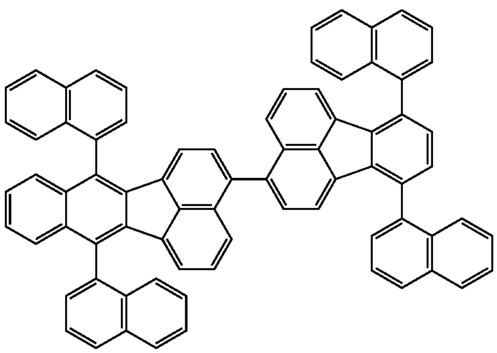
1-42
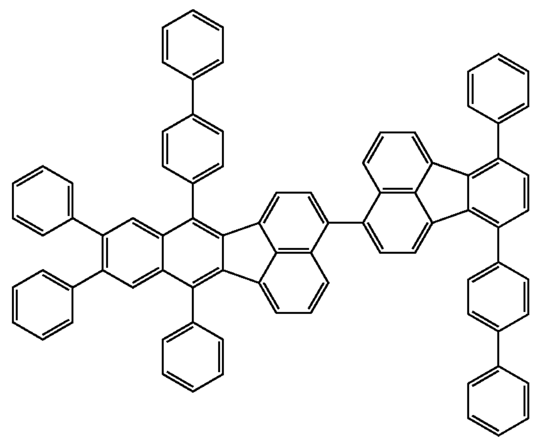
1-43
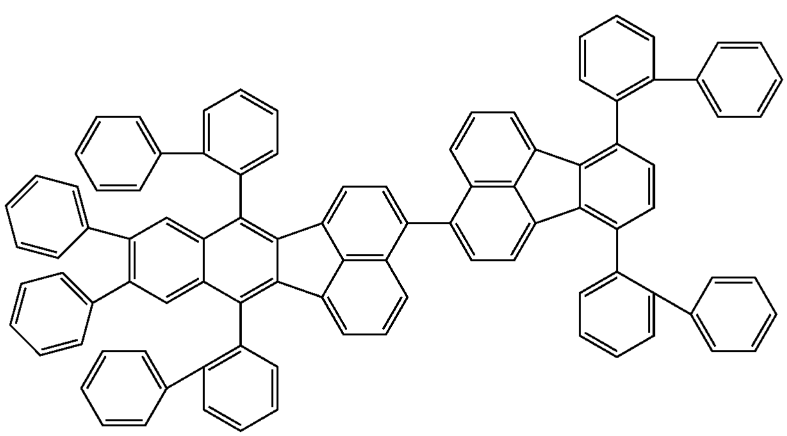

-continued
1-44
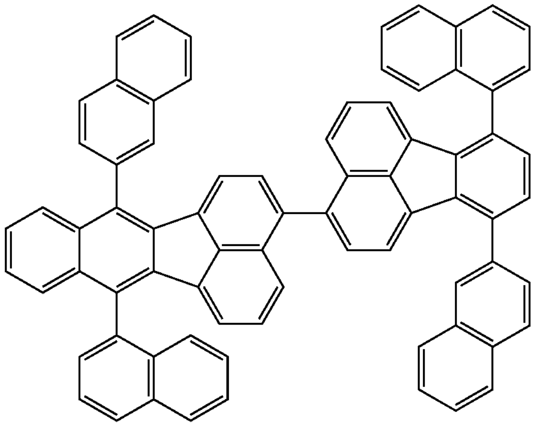
[Chemical Formula 145]
1-45
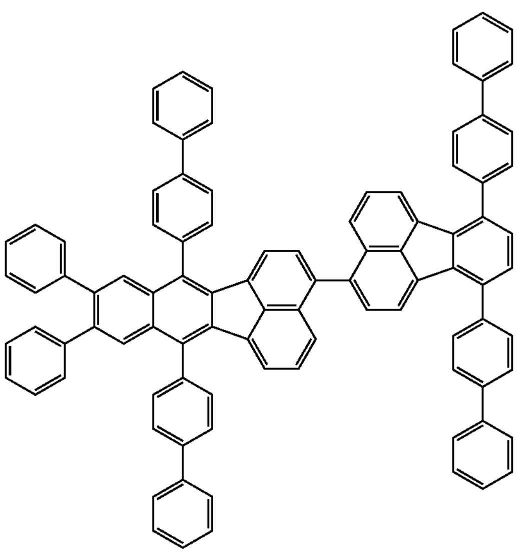
1-46
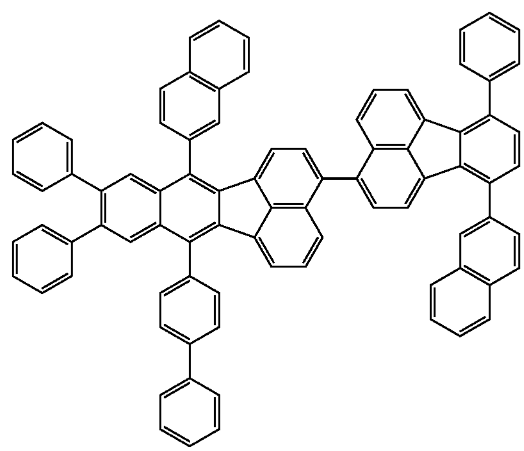
1-47
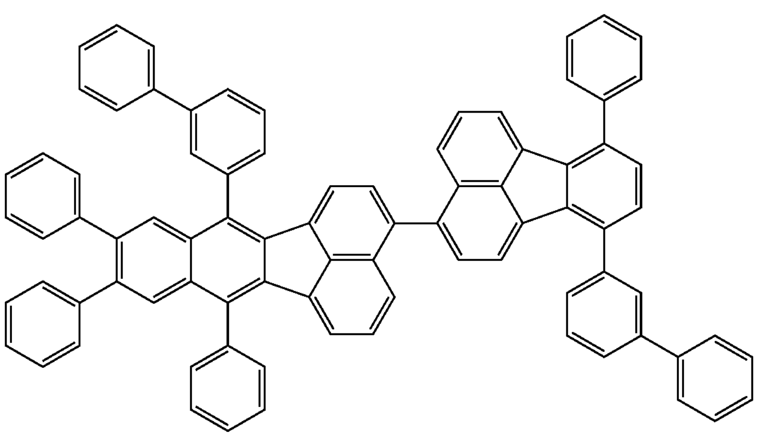

-continued
1-48
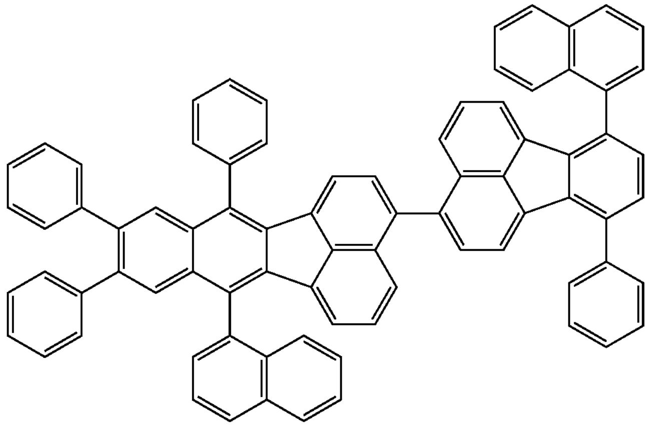
1-49
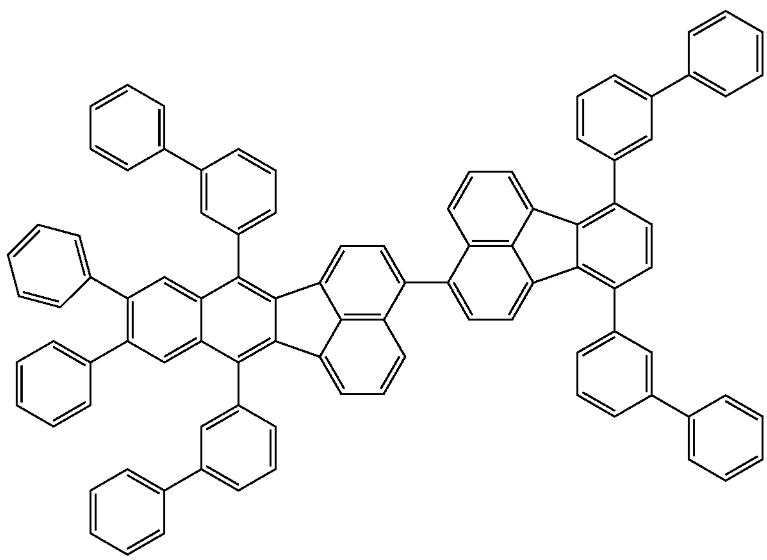
1-50
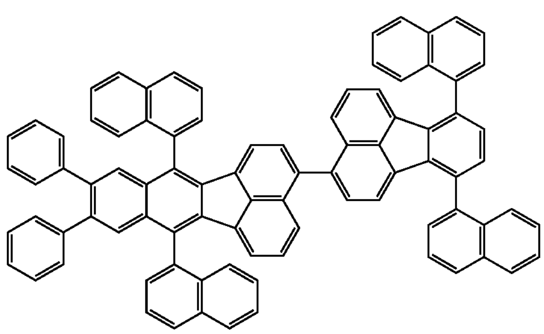
1-51
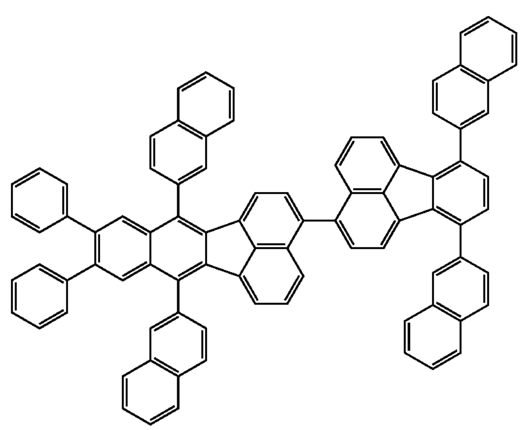

-continued
1-52
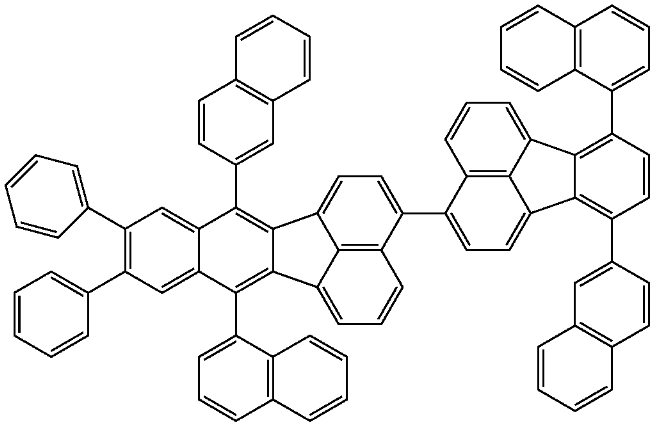
[Chemical Formula 146]
1-53
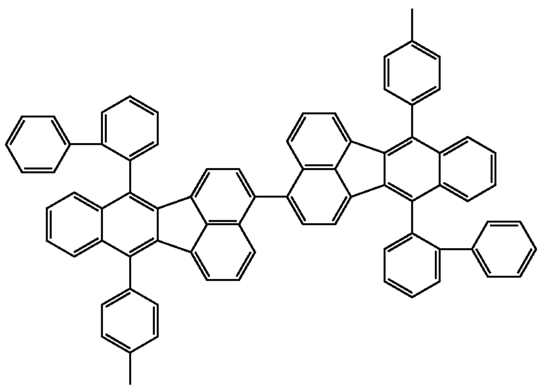
1-54
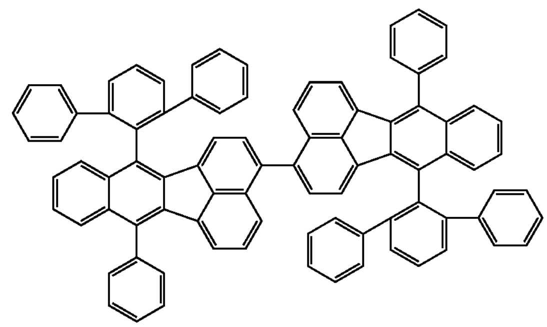
1-55
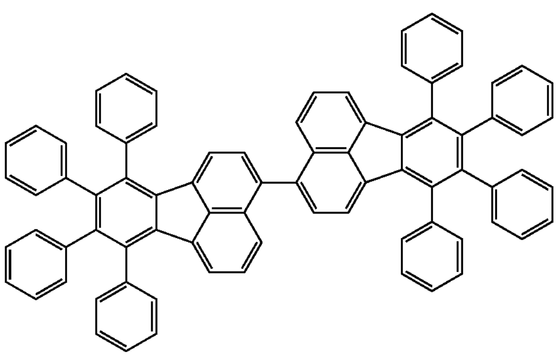
1-56
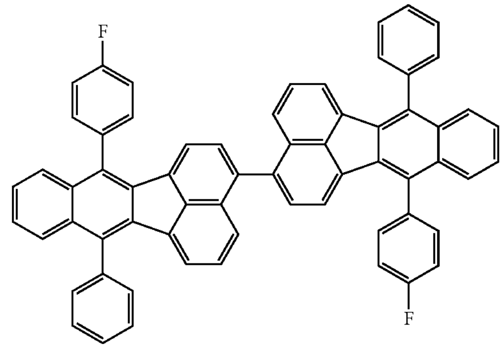
1-57
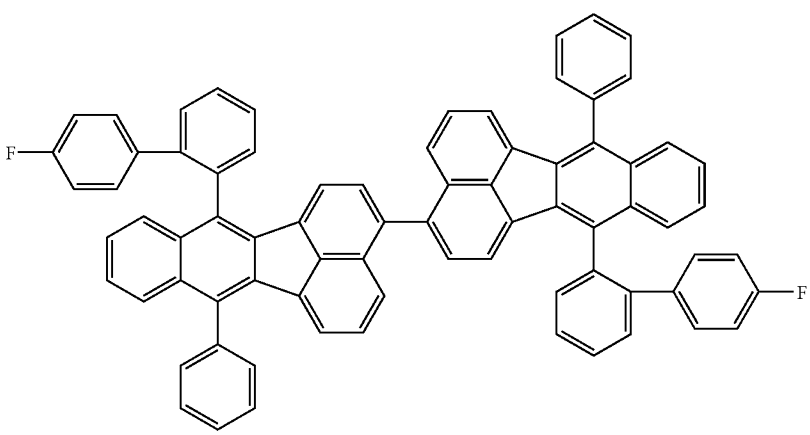

-continued
1-58
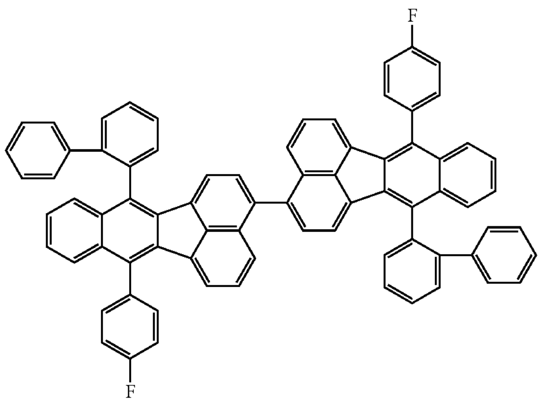
1-59
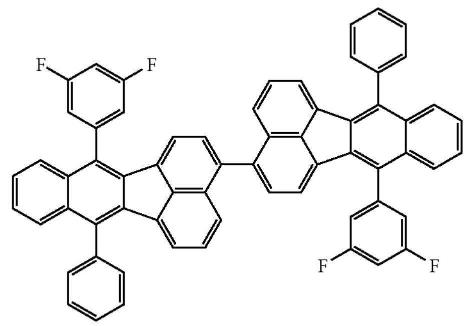
1-60
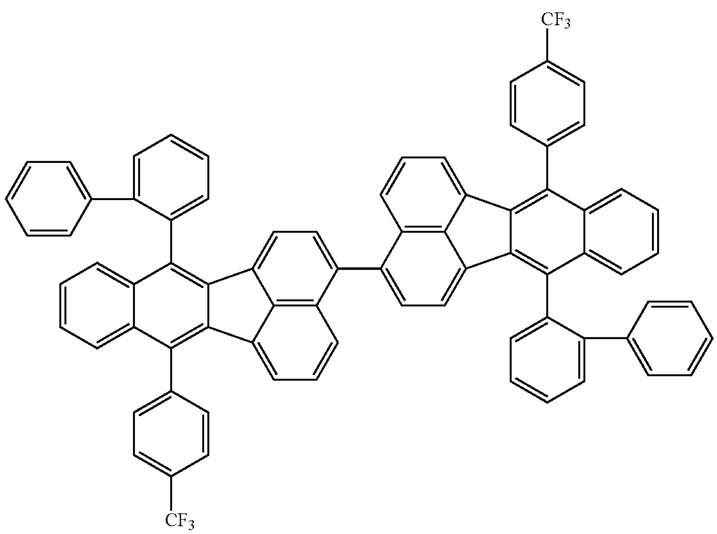
[Chemical Formula 147]
1-61
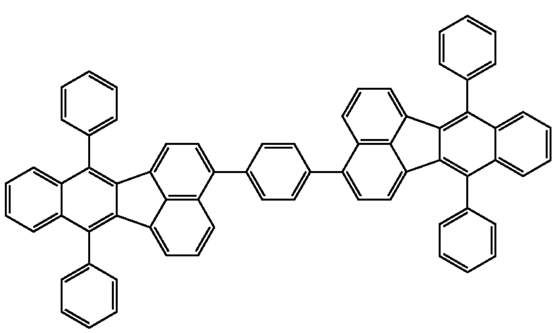
1-62
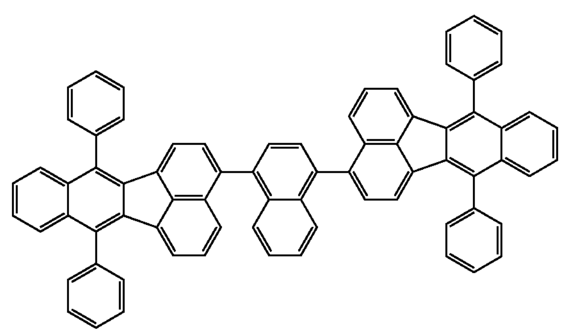

-continued
1-63
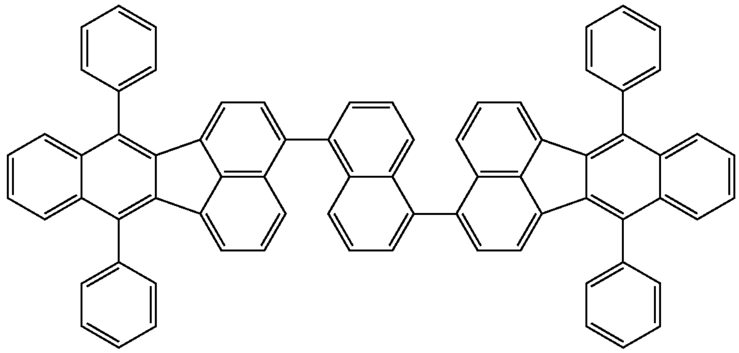
1-64
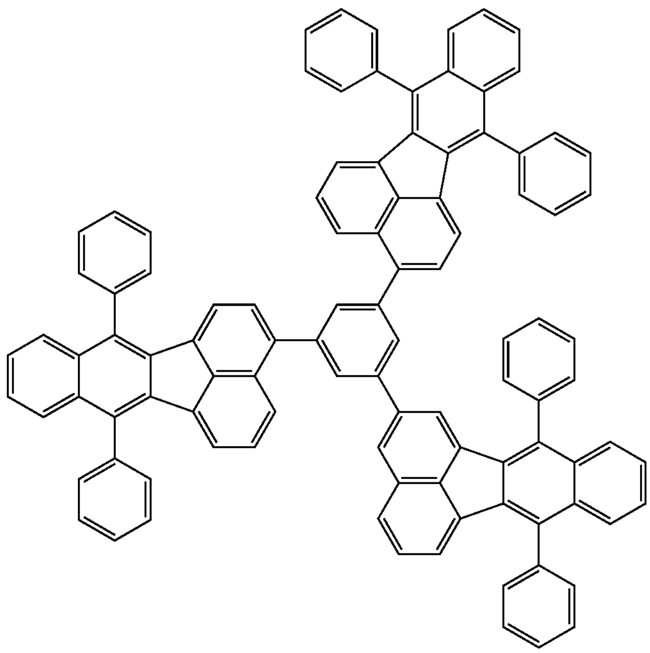
1-65
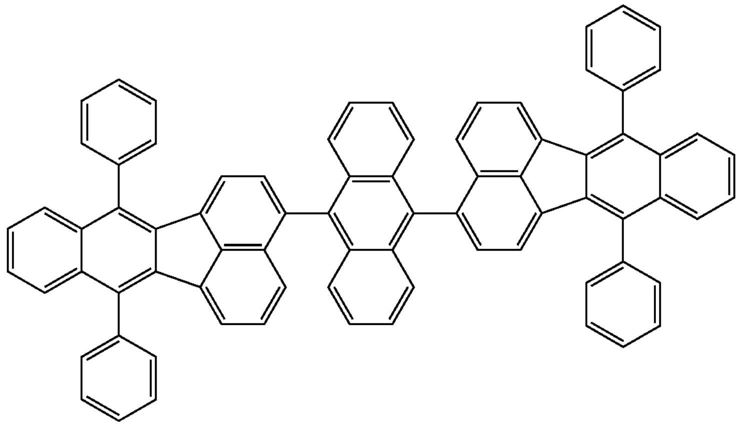

-continued
1-66
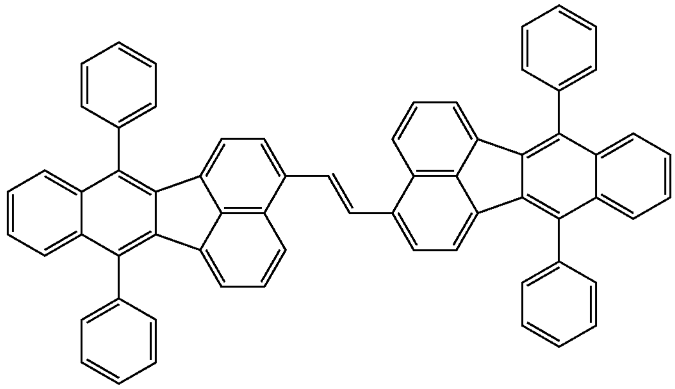
1-67
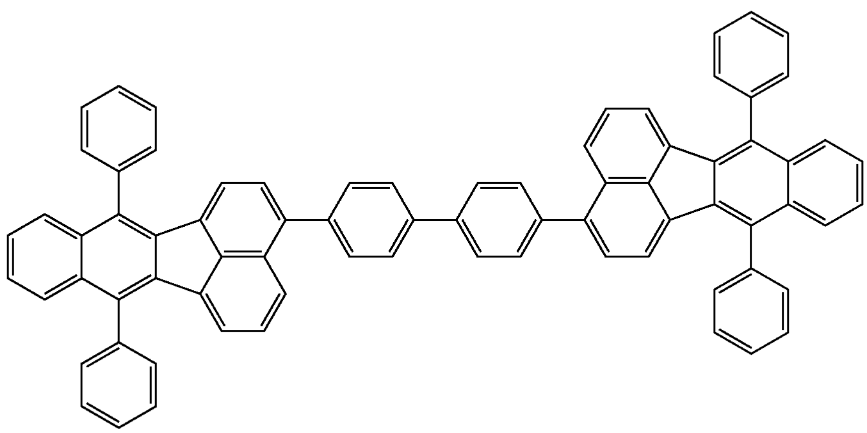
1-68
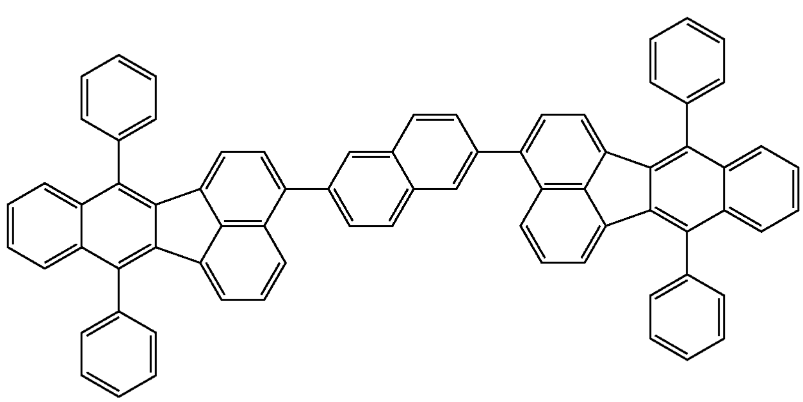

-continued
1-69
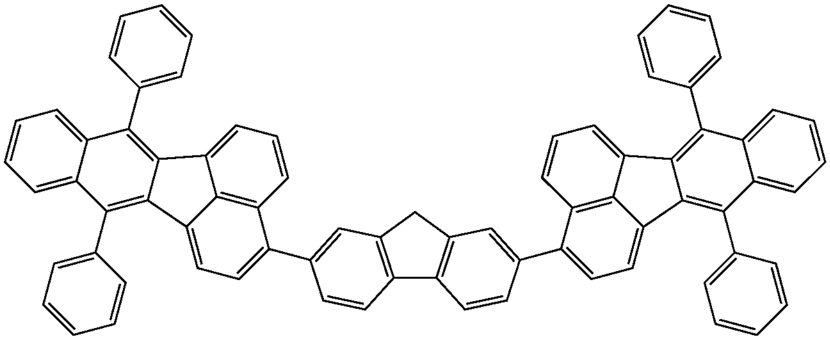
[Chemical Formula 148]
1-70
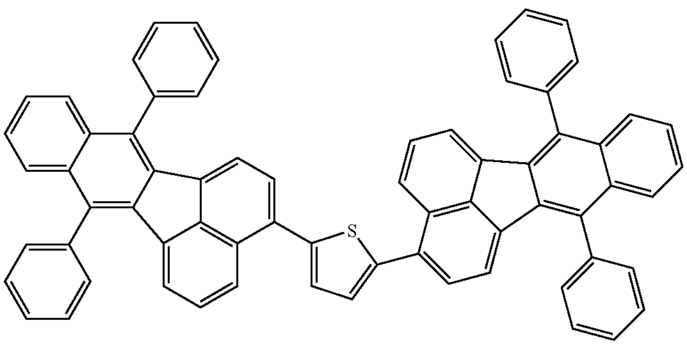
1-71
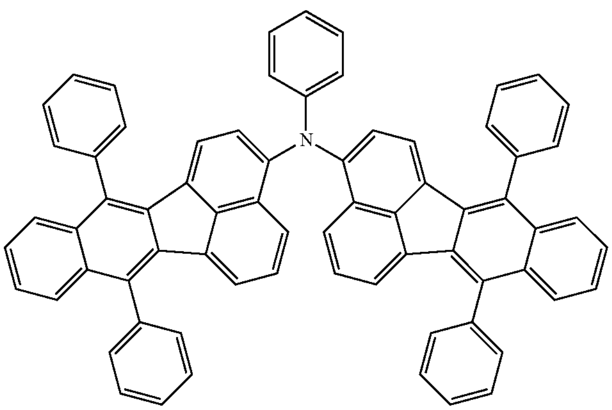
1-72
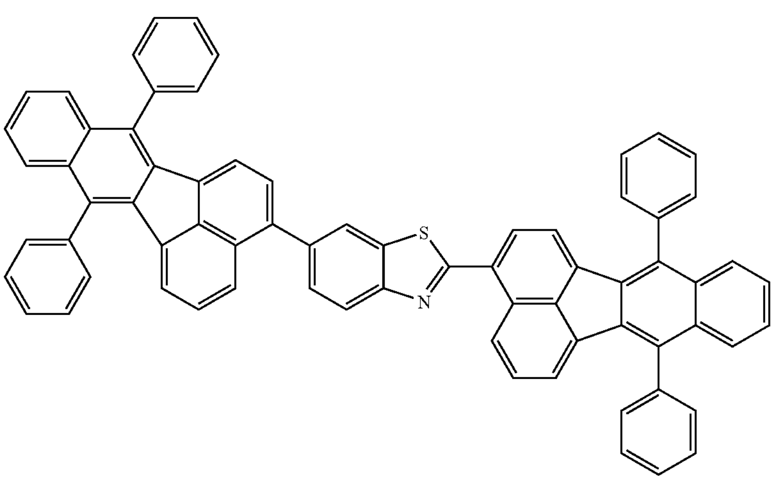

-continued
1-73
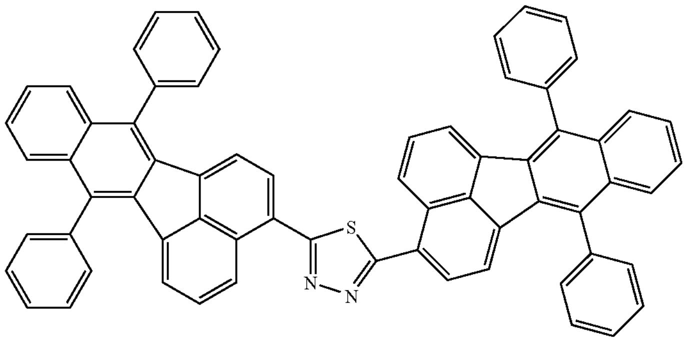
1-74
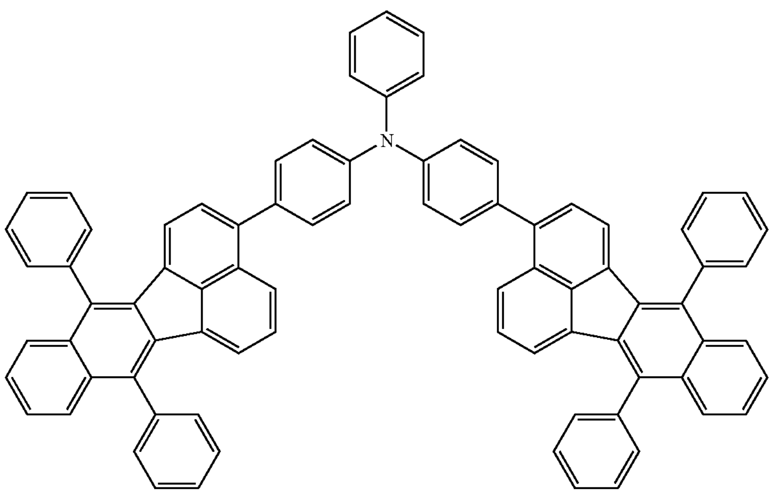
1-75
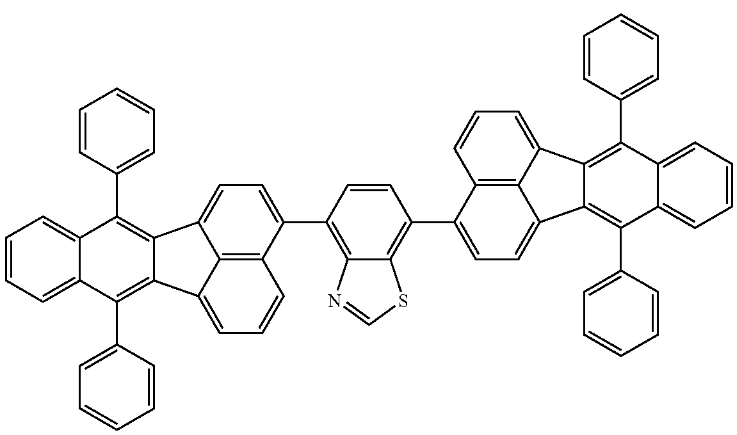

-continued
1-76
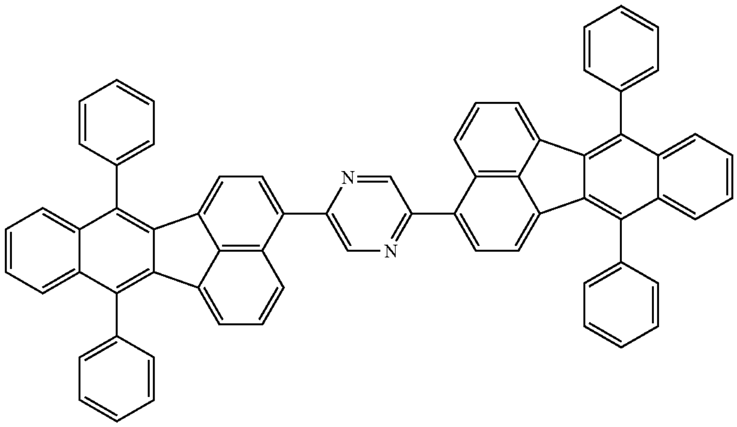
1-77
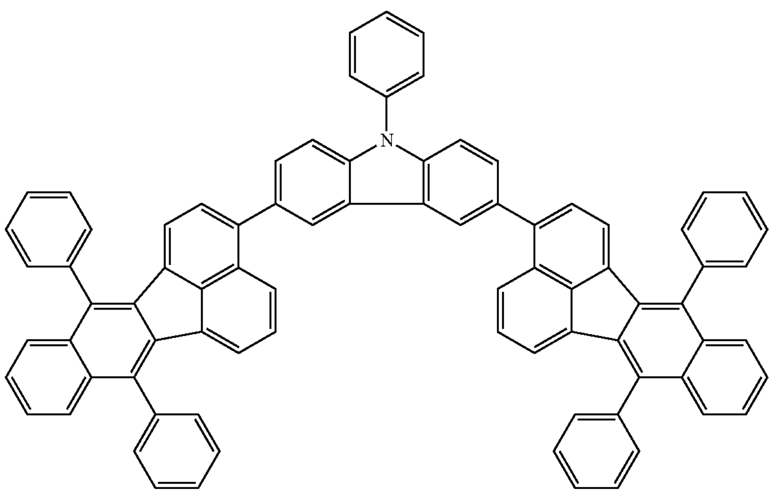
1-78
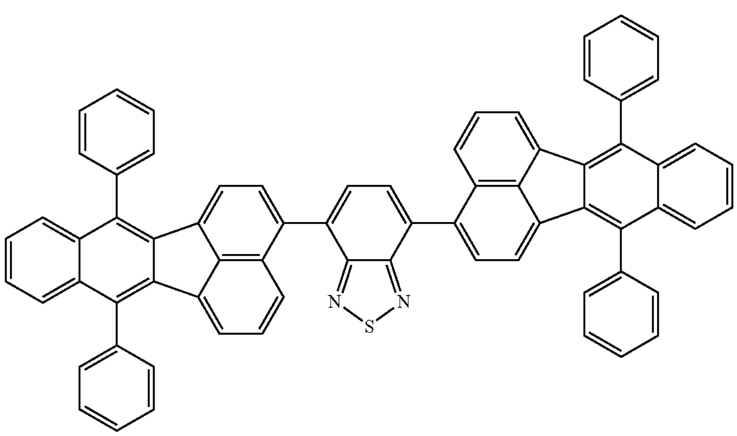

-continued
[Chemical Formula 149]
1-79
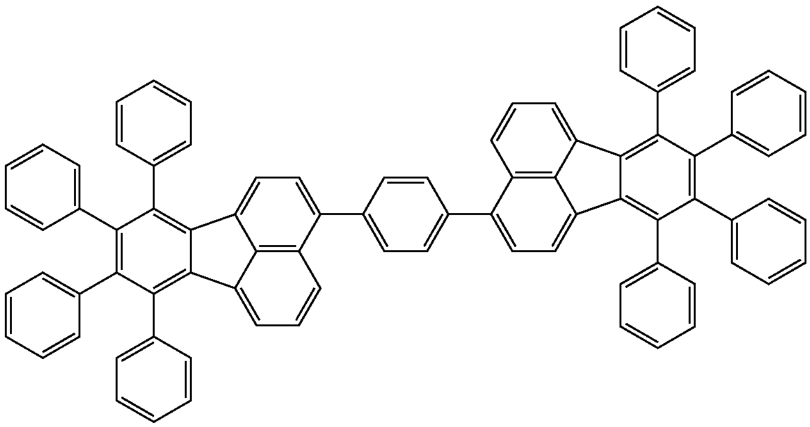
1-80
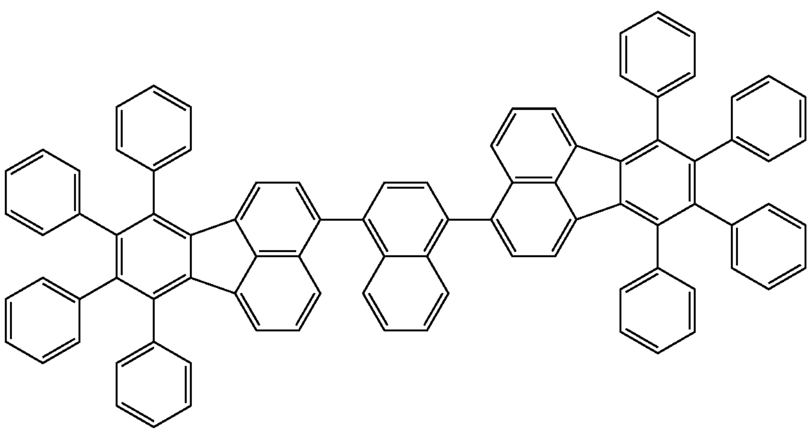
1-81
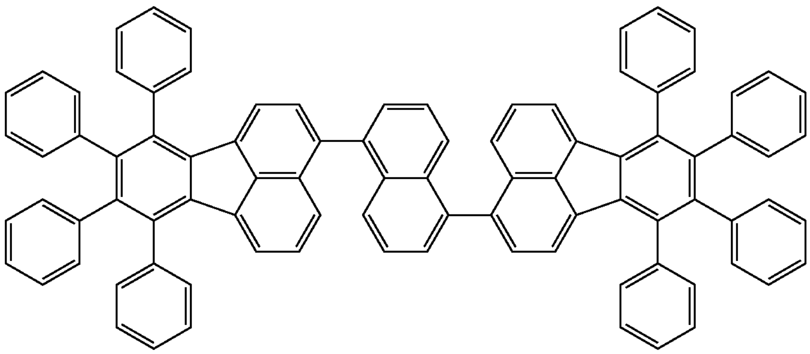

-continued
1-82
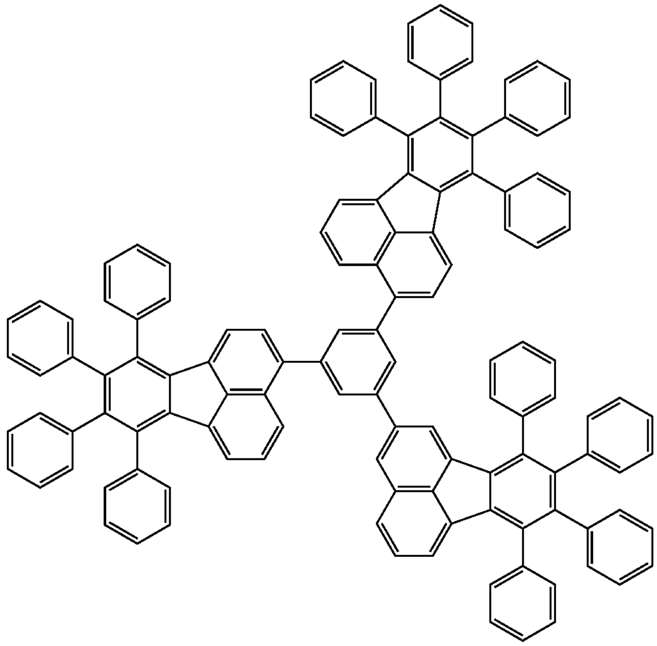
1-83
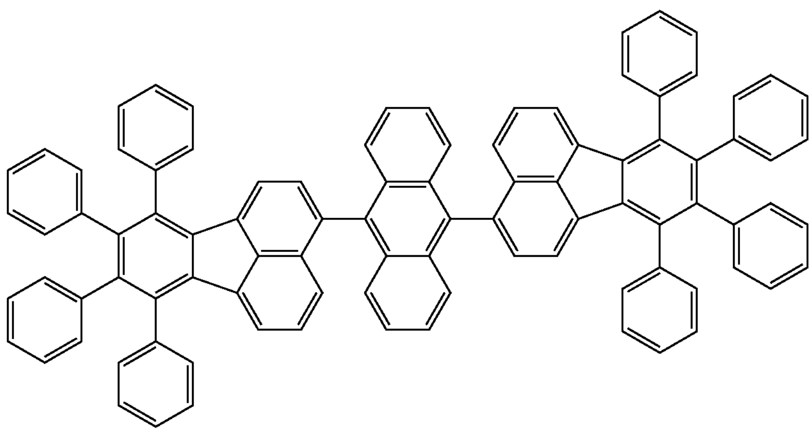
1-84
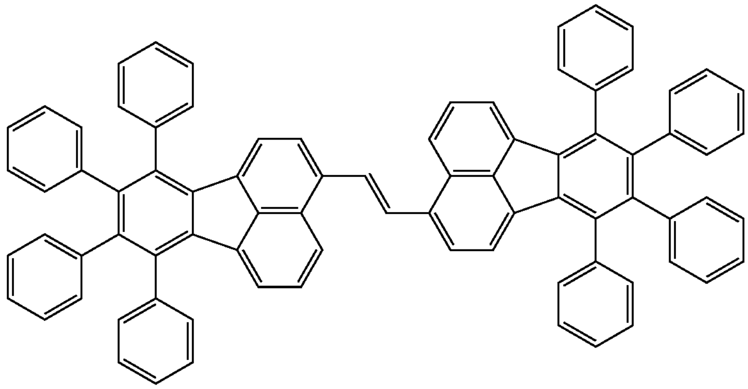

-continued
1-85
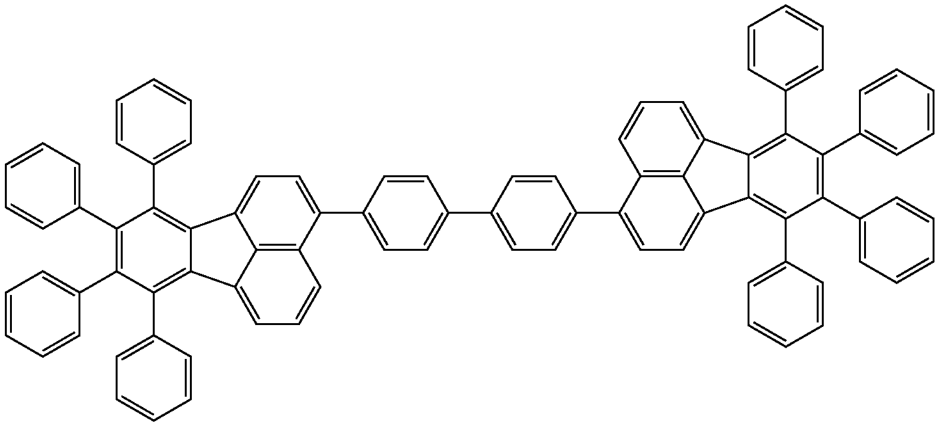
1-86
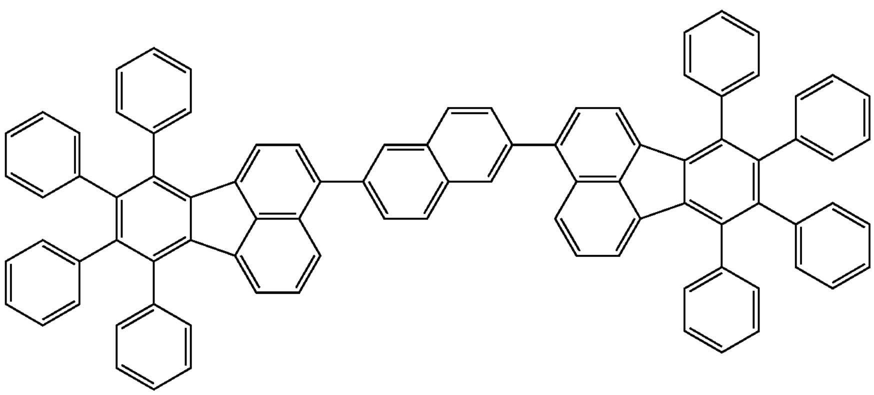
1-87
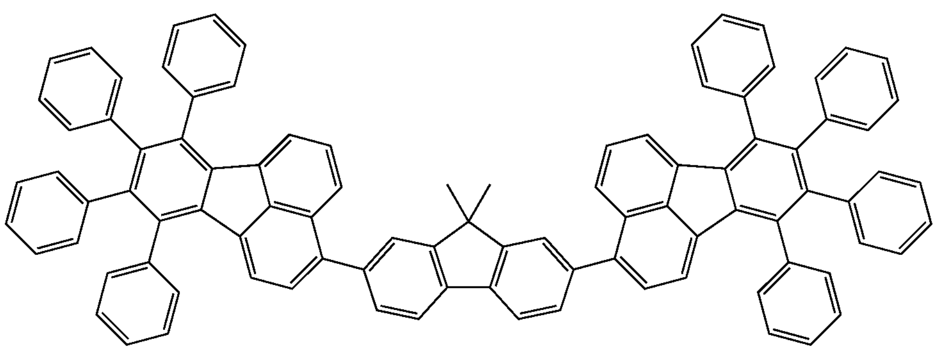
[Chemical Formula 150]
1-88
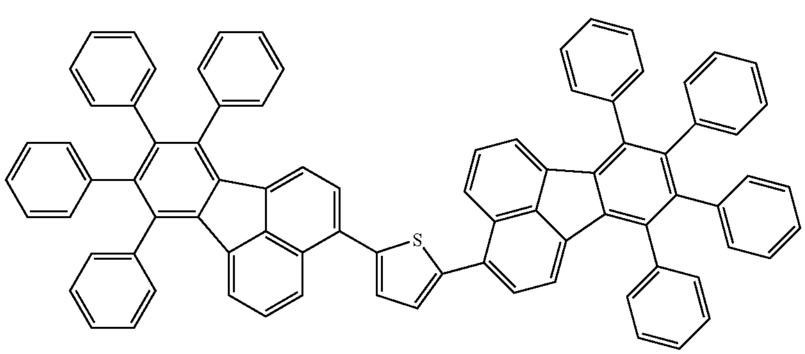

-continued
1-89
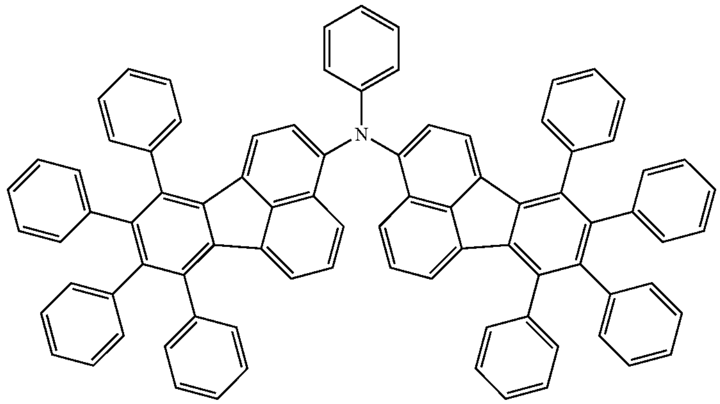
1-90
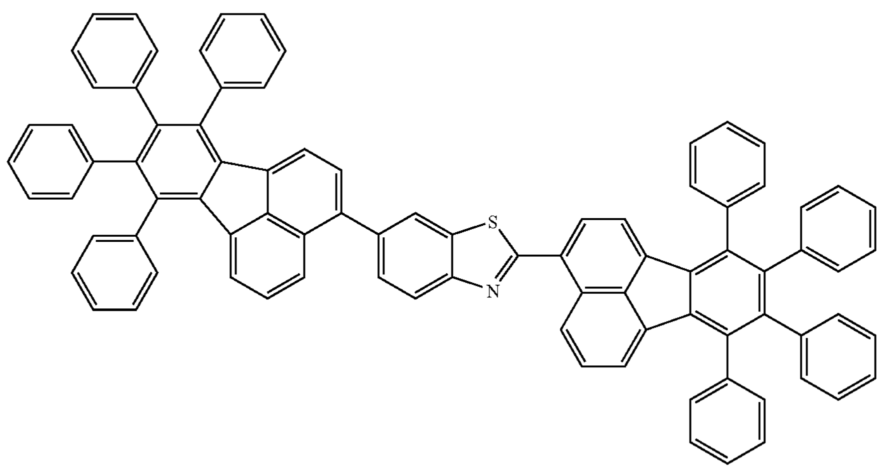
1-91
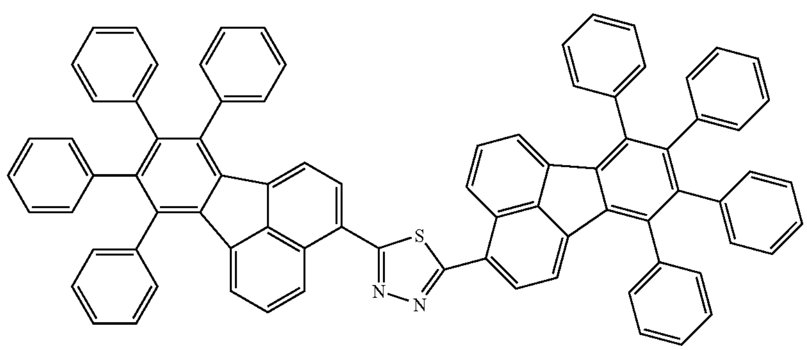

-continued
1-92
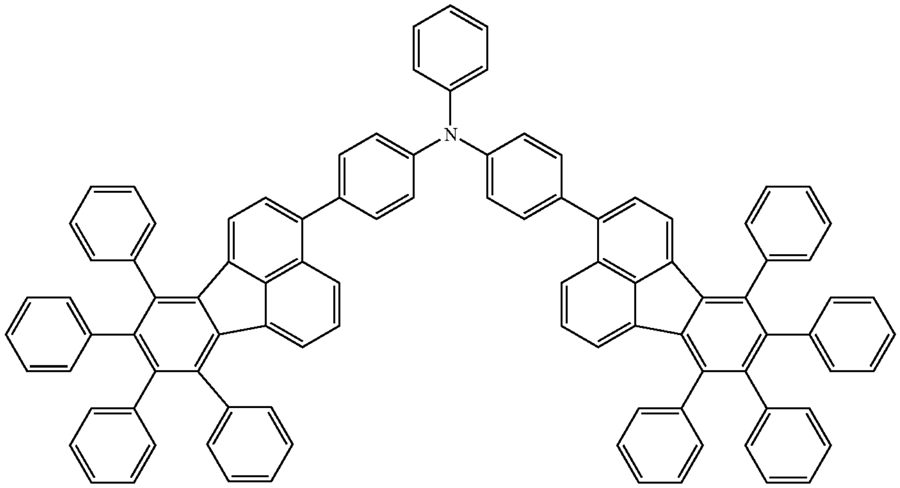
1-93
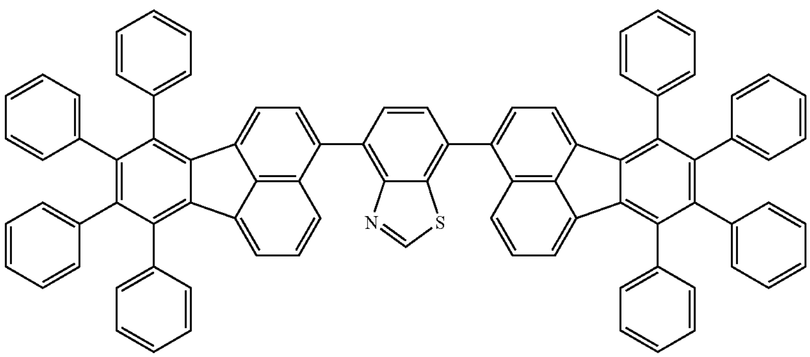
1-94
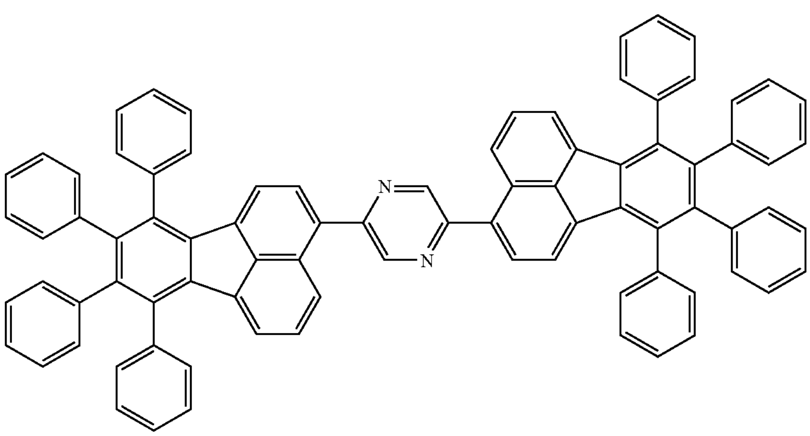

-continued
1-95
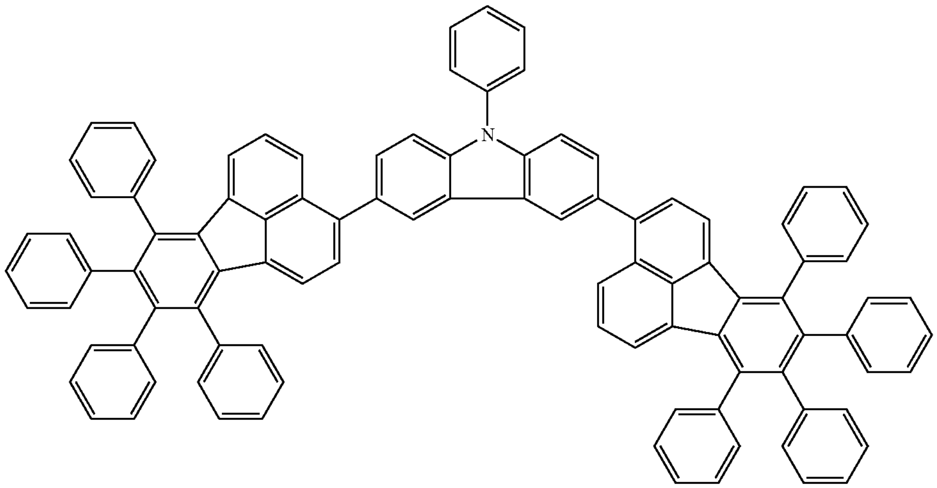
1-96
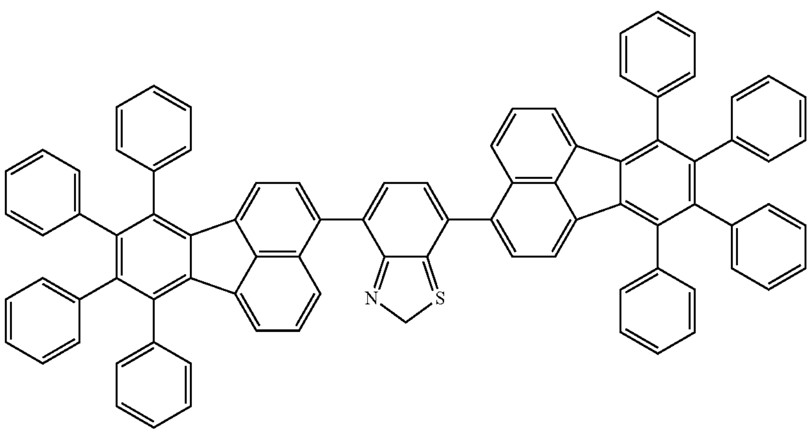
[Chemical Formula 151]
1-97
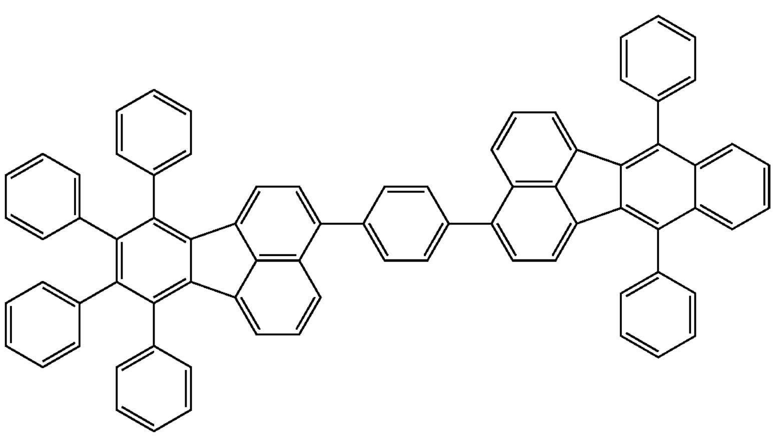

-continued
1-98
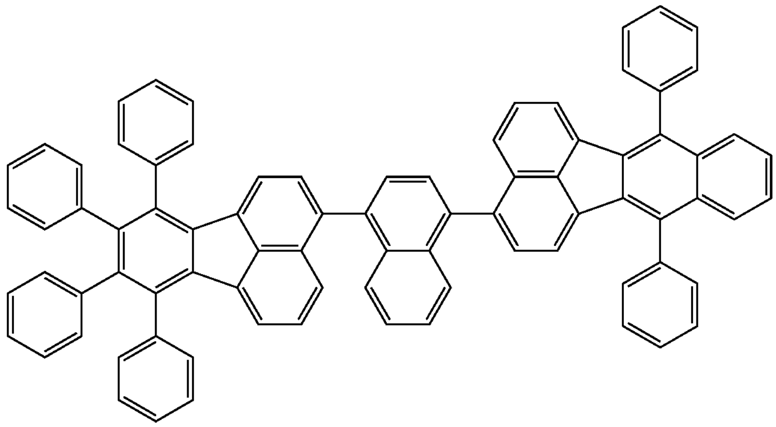
1-99
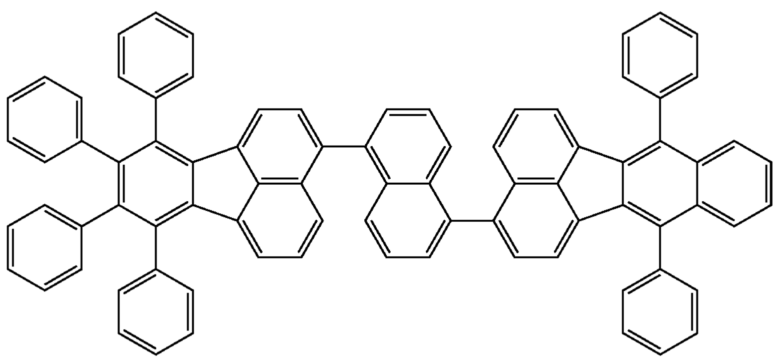
1-100
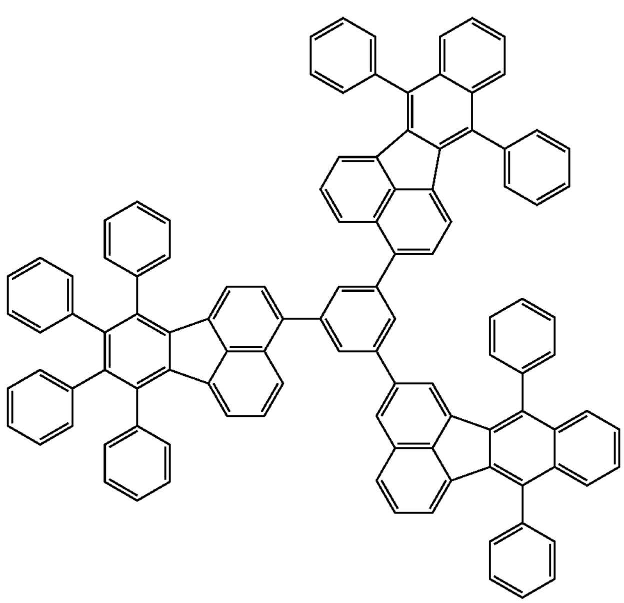

-continued
1-101
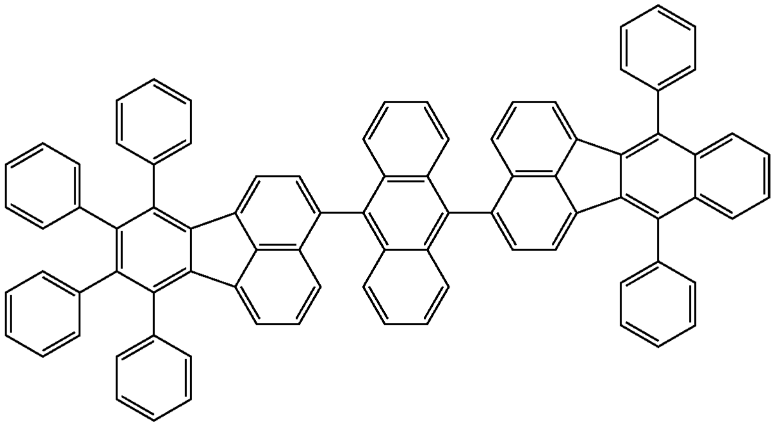
1-102
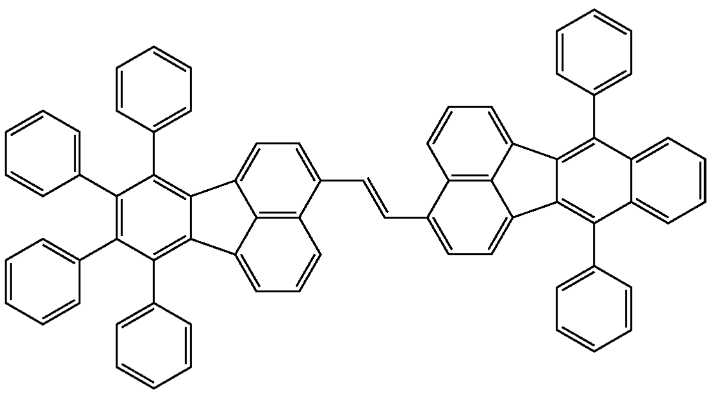
1-103
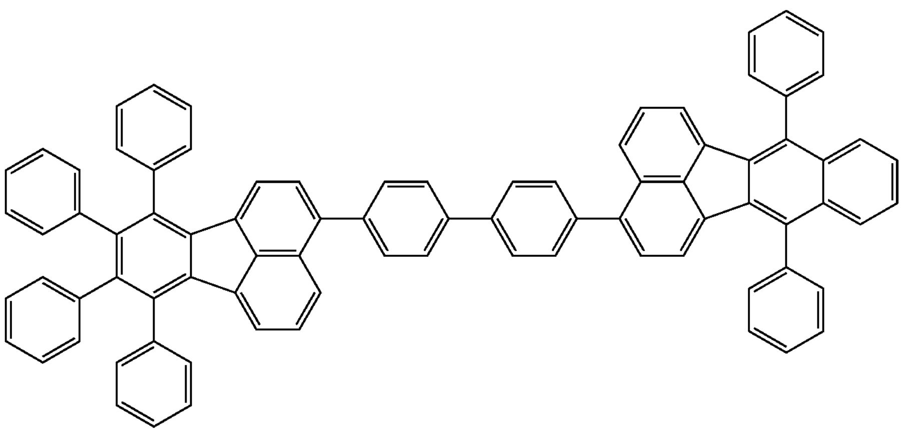
1-104
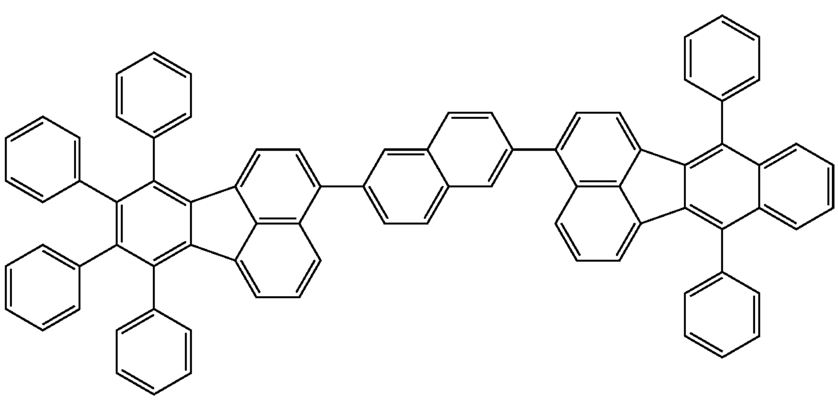

-continued
1-105
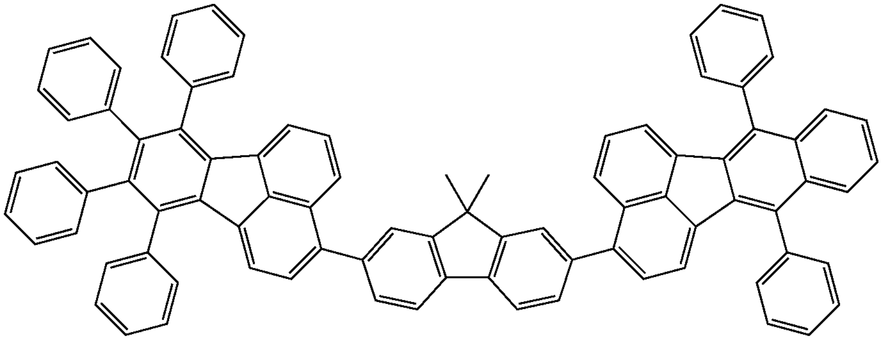
[Chemical Formula 152]
1-106
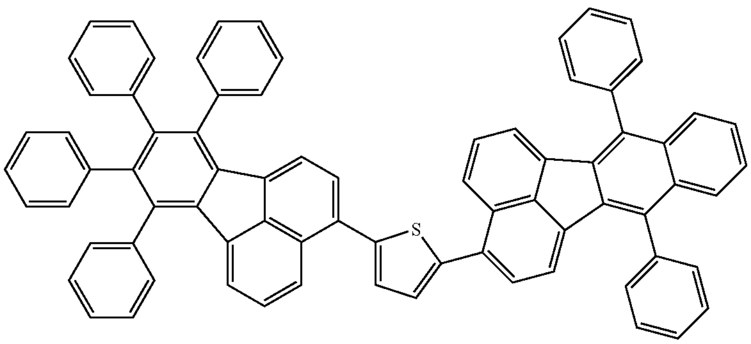
1-107
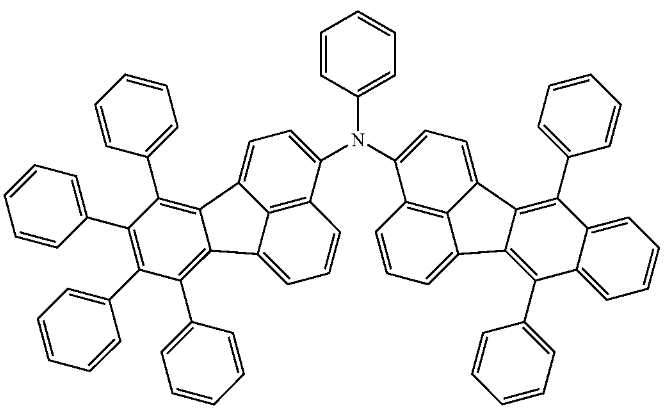
1-108
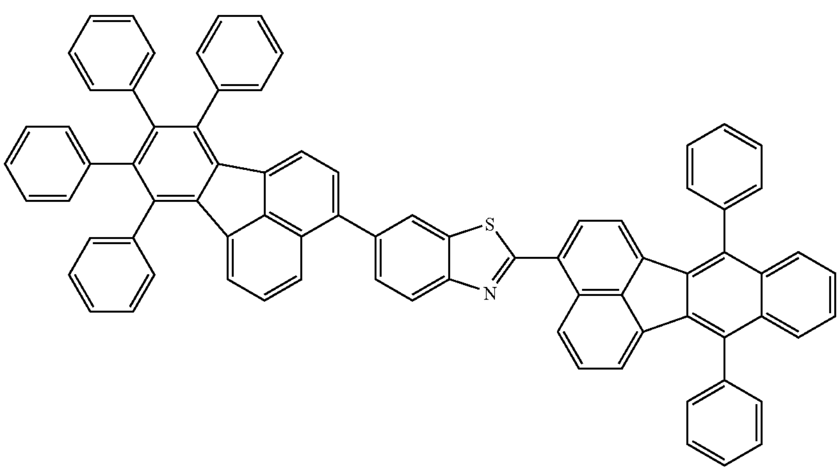

-continued
1-109
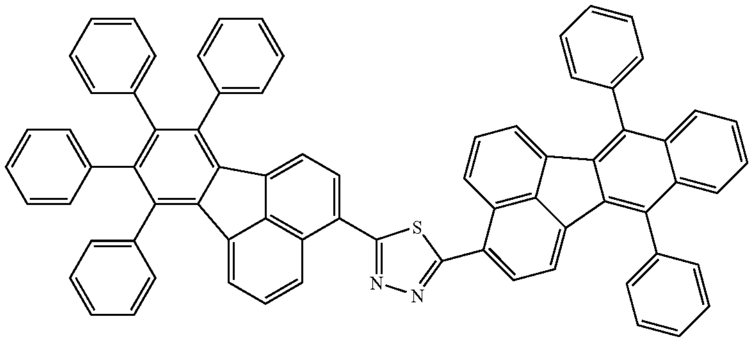
1-110
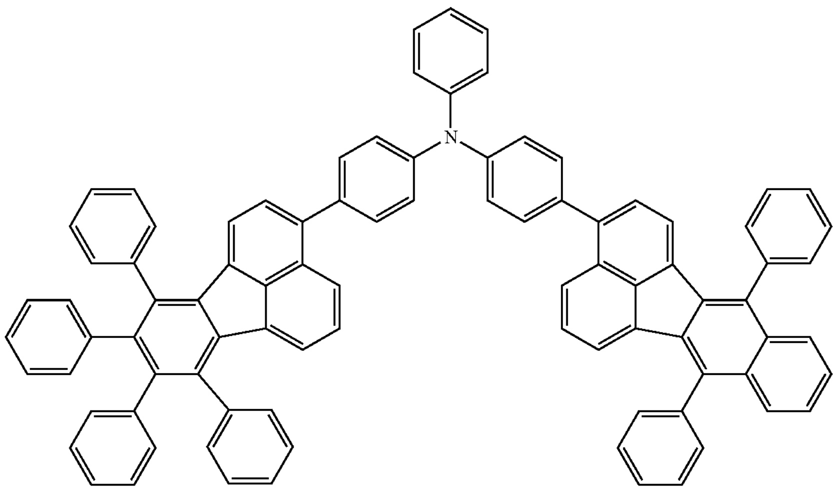
1-111
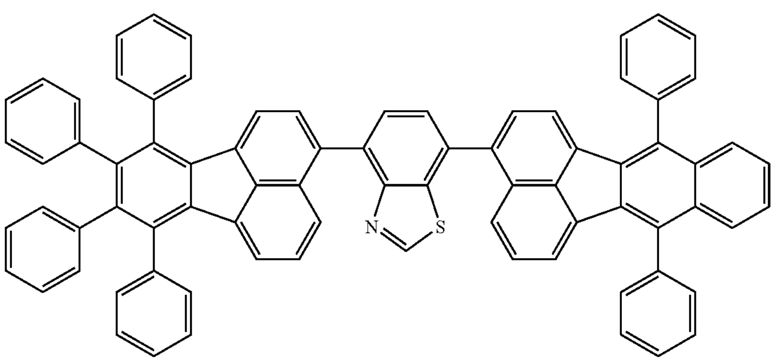
1-112
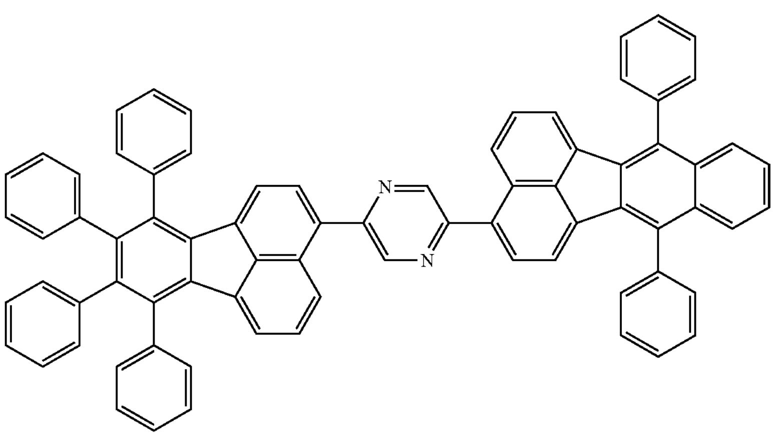

-continued
1-113
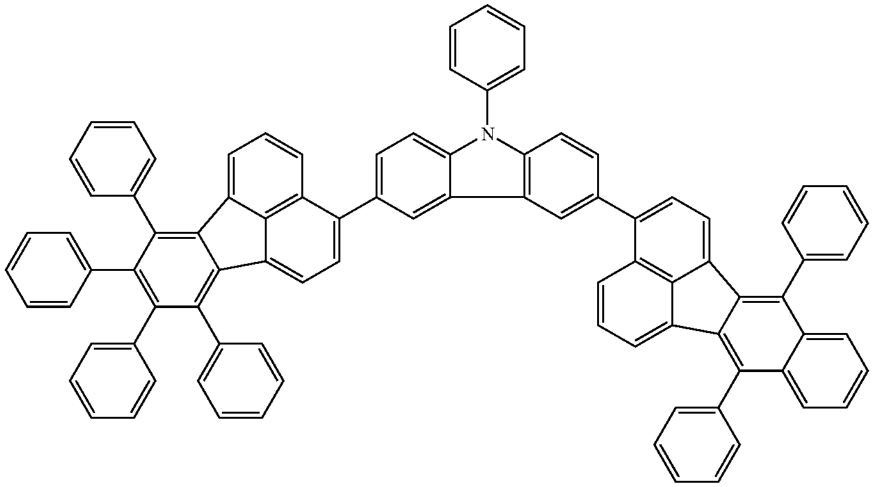
1-114
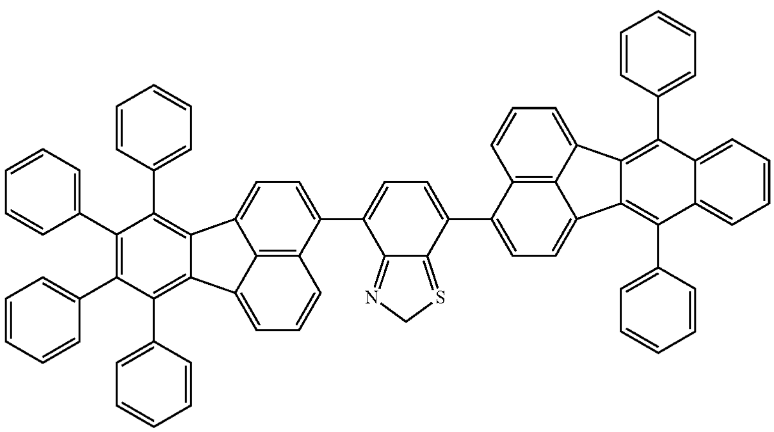
[Chemical Formula 153]
2-1
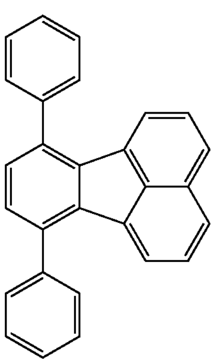
2-2
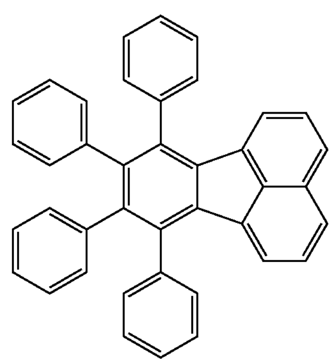

-continued
2-3
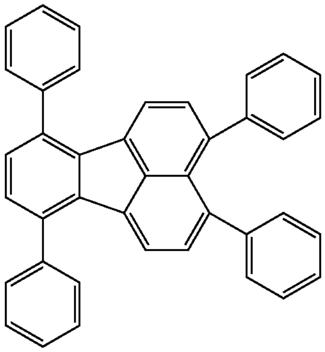
2-4
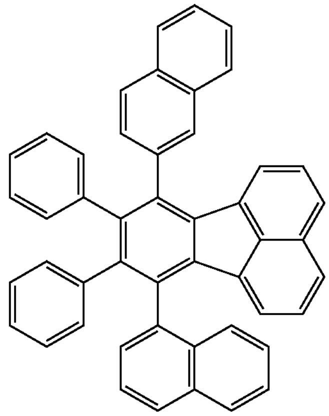
2-5
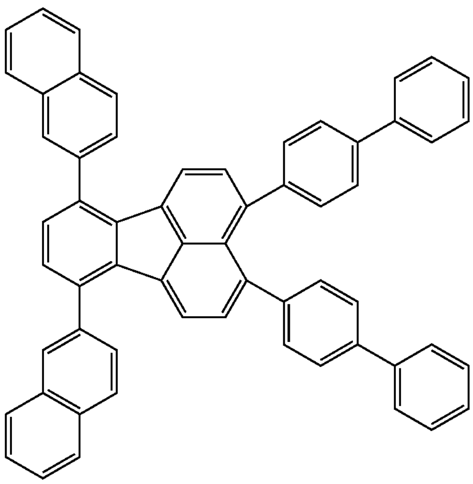
2-6
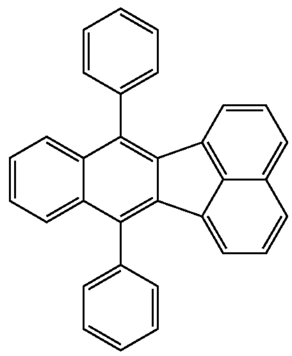
2-7
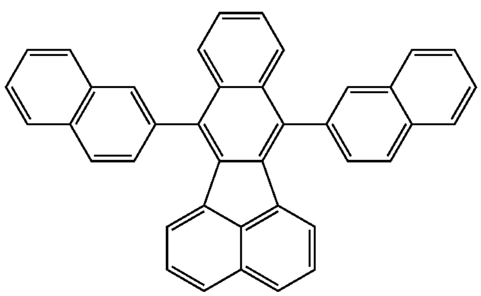
2-8
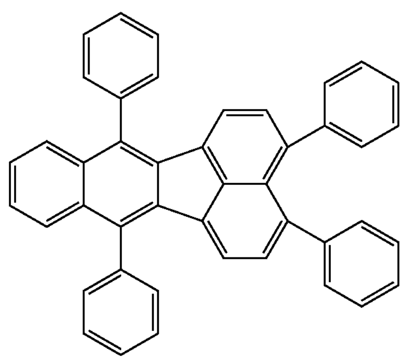
2-9
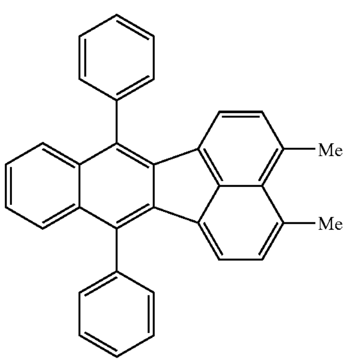
2-10
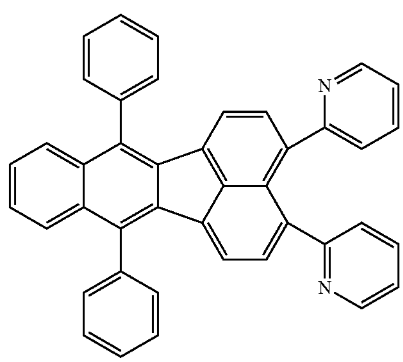

-continued
2-11
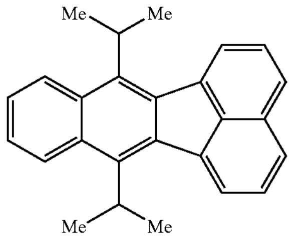
2-12
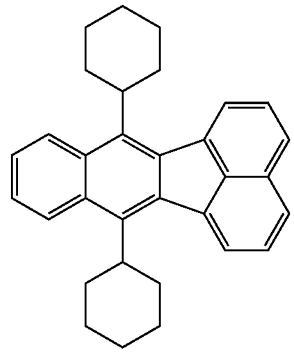
2-13
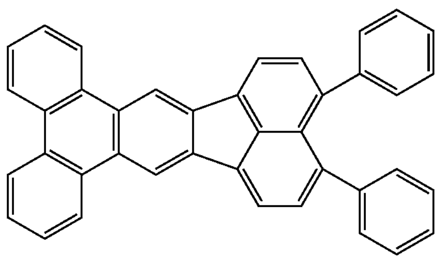
2-14
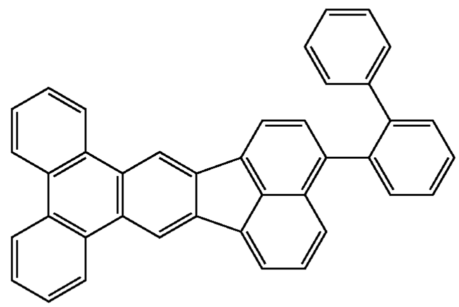
2-15
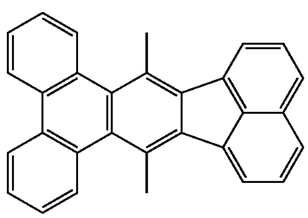
2-16
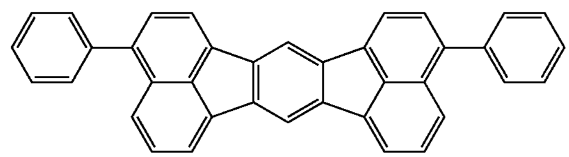
2-17
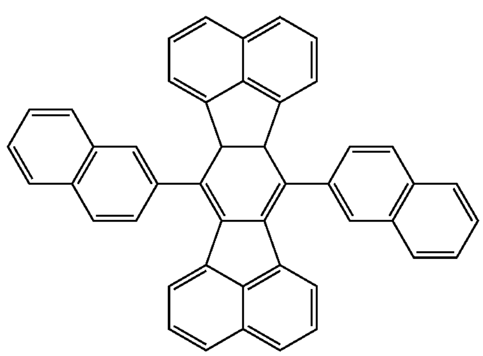
2-18
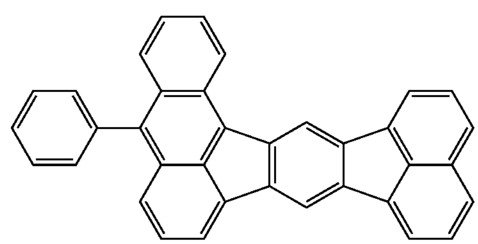
2-19
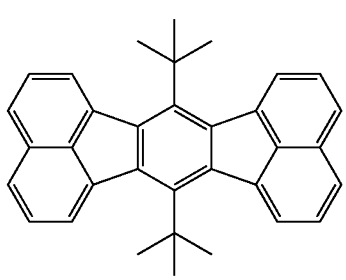

-continued
[Chemical Formula 154]
2-20
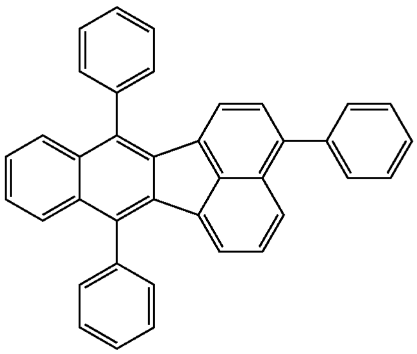
2-21
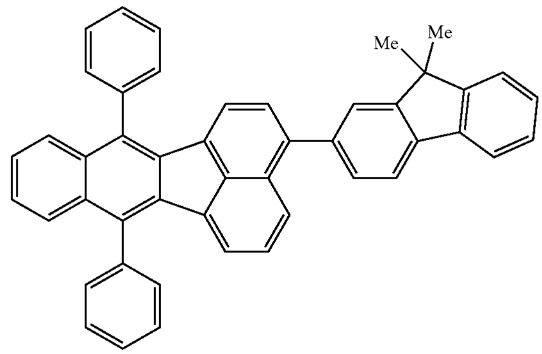
2-22
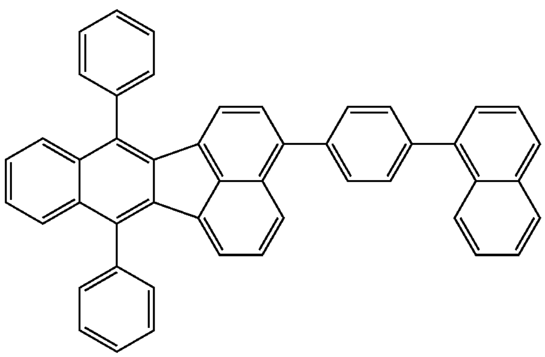
2-23
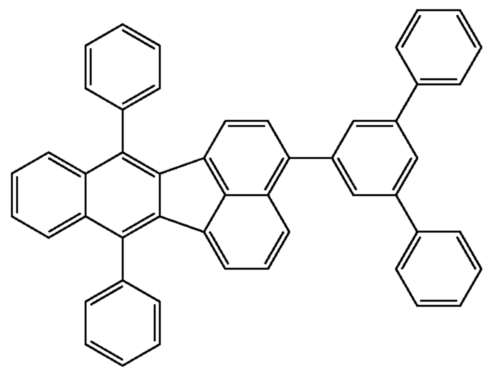
2-24
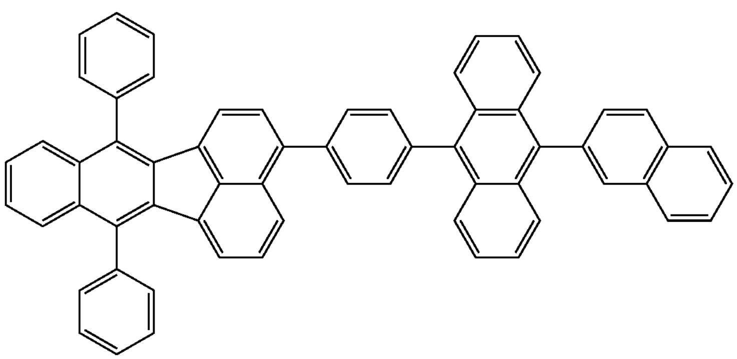
2-25
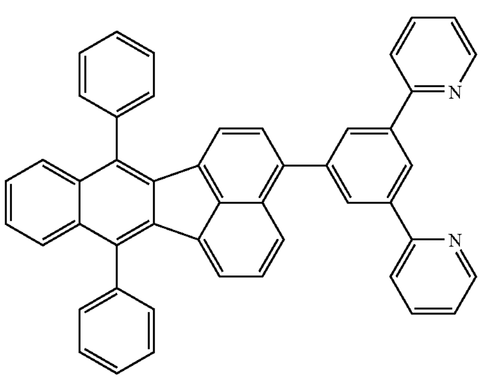
2-26
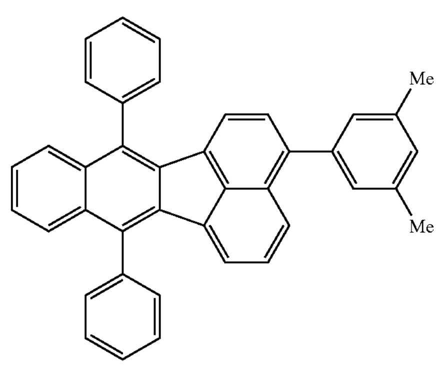

-continued
2-27
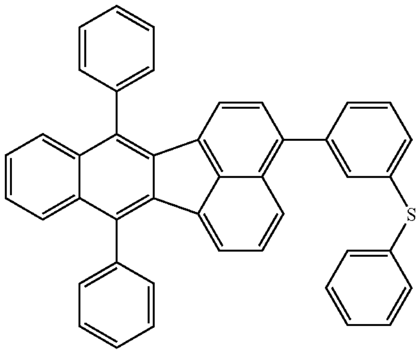
2-28
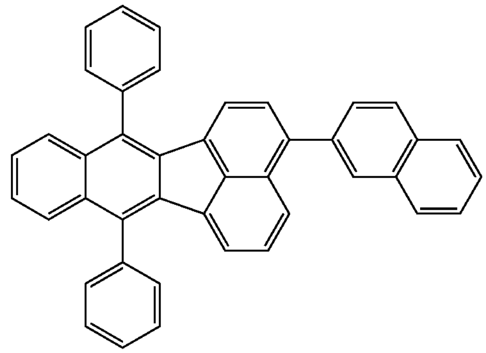
2-29
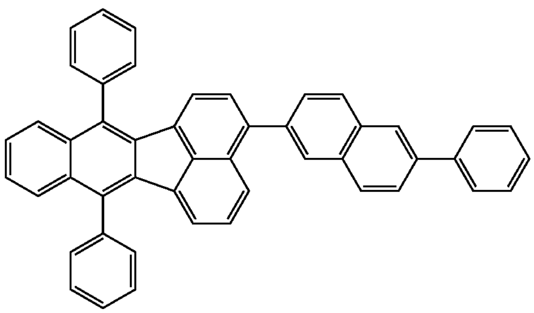
2-30
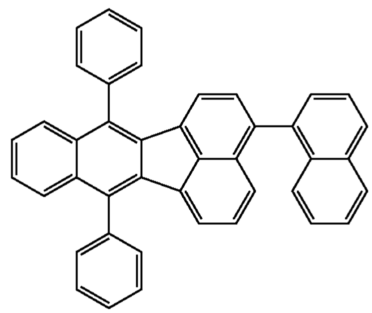
2-31
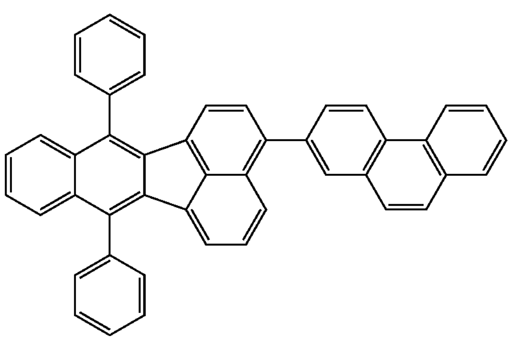
2-32
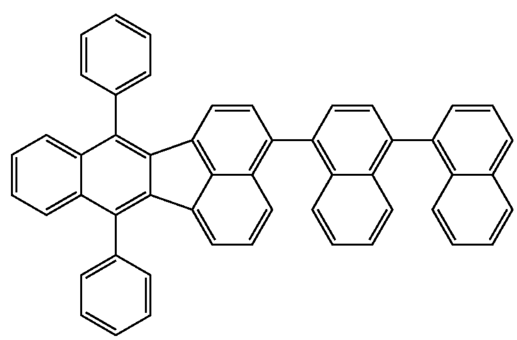
2-33
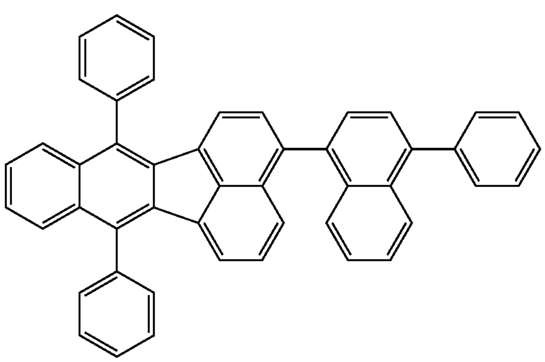

-continued
2-34
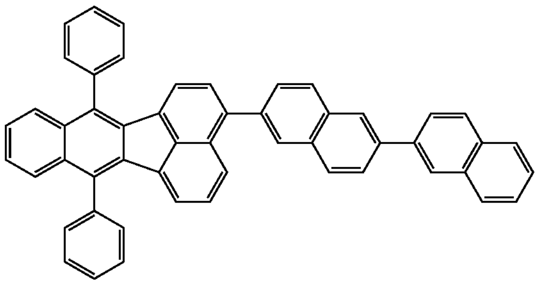
2-35
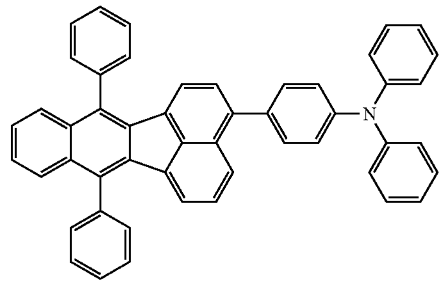
[Chemical Formula 155]
2-36
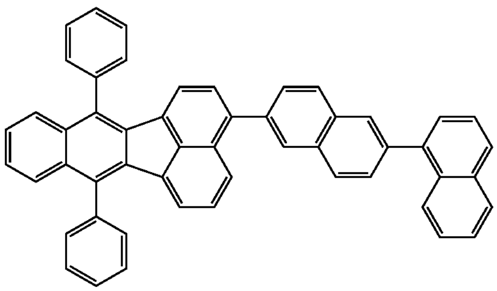
2-37
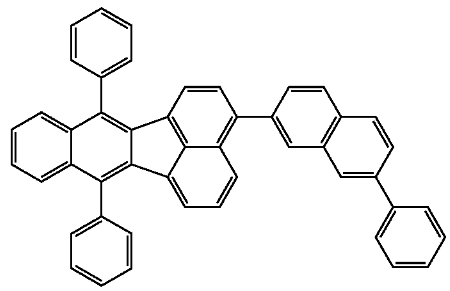
2-38
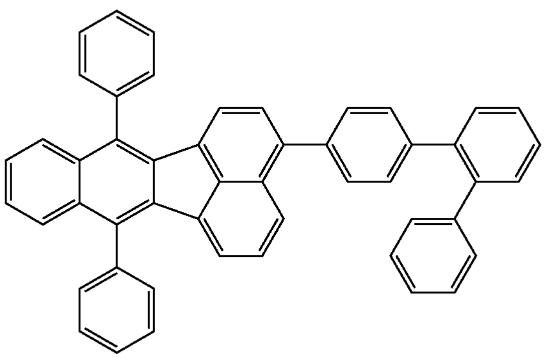
2-39
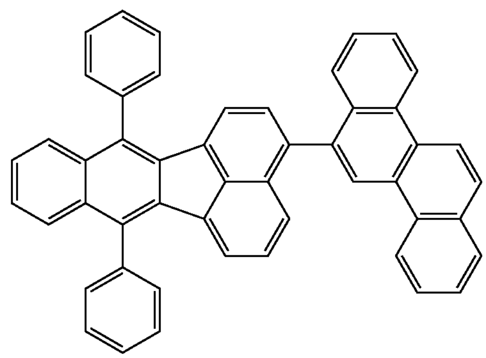
2-40
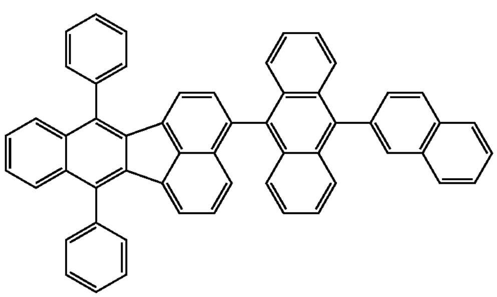
2-41
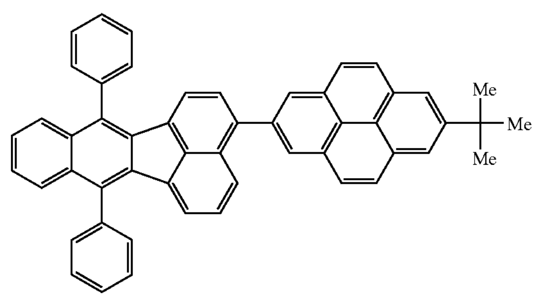
2-42
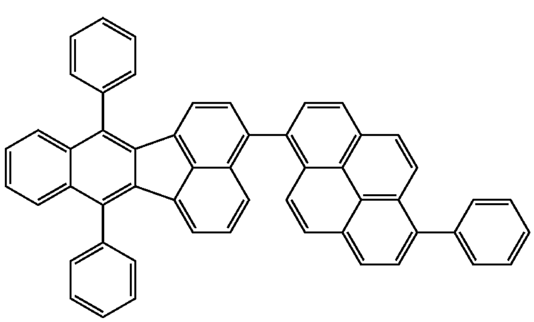
2-43
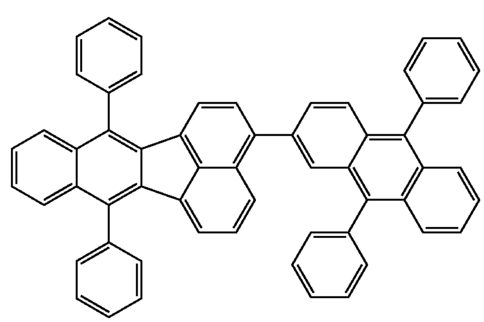

-continued
2-44
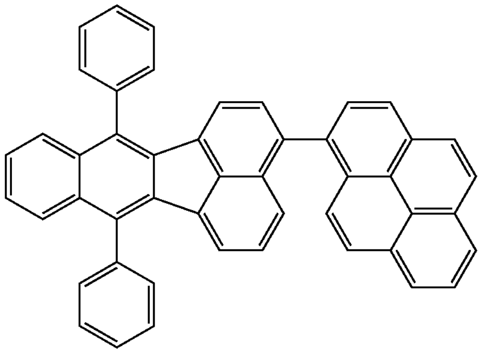
2-45
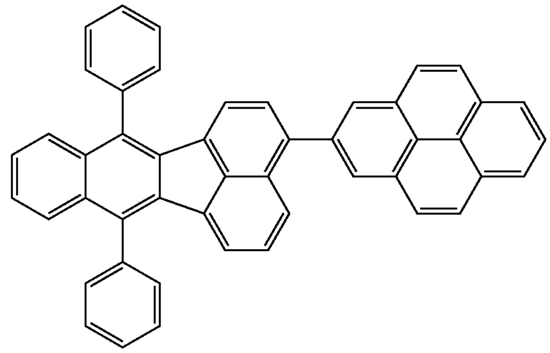
2-46
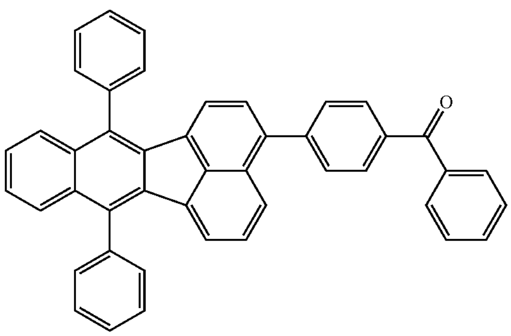
2-47
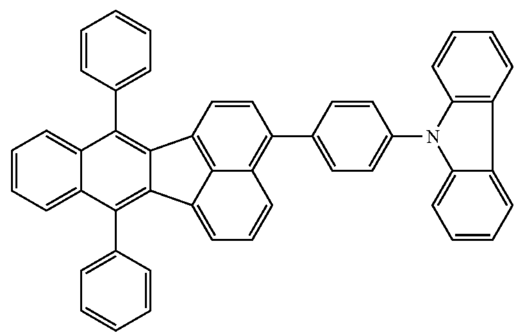
2-48
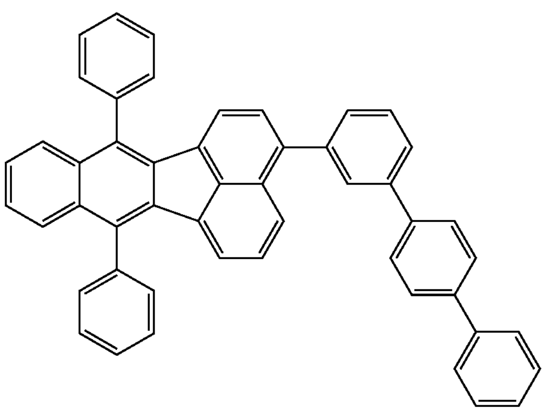
2-49
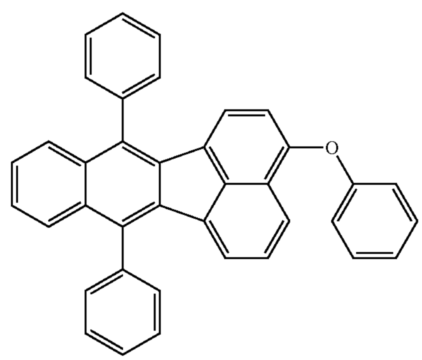
2-50
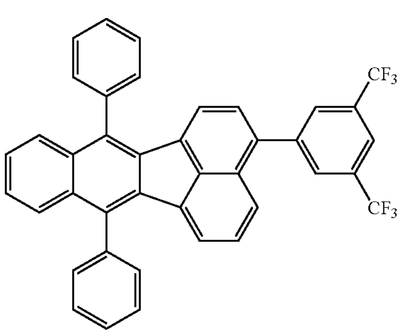
2-51
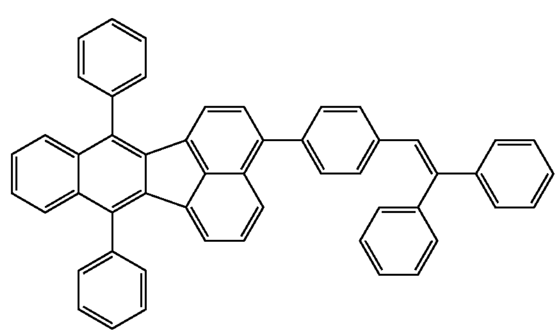

-continued
[Chemical Formula 156]
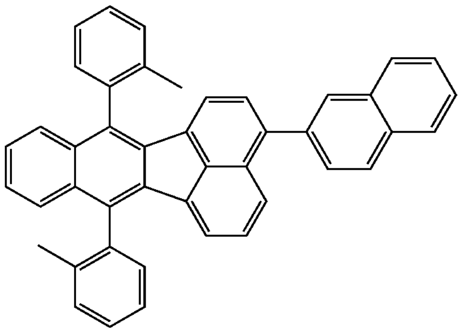
2-52
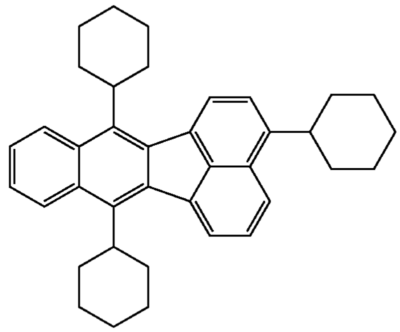
2-53
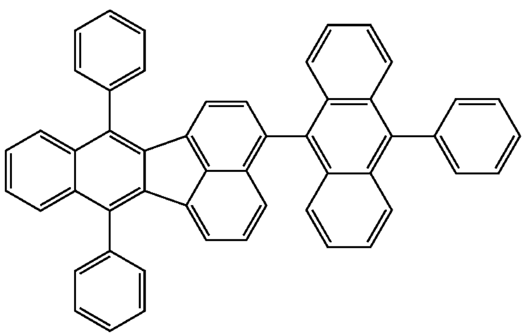
2-54
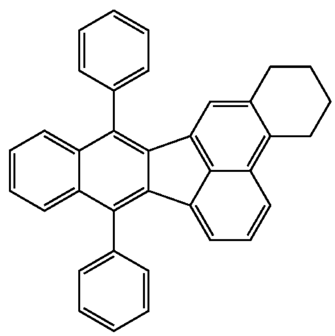
2-55
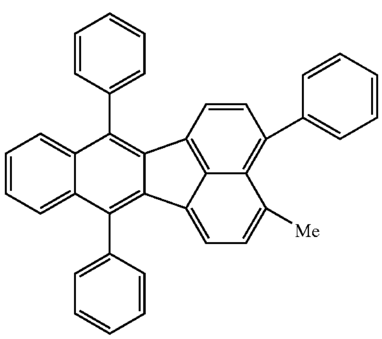
2-56
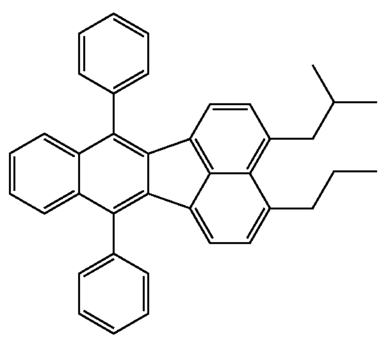
2-57
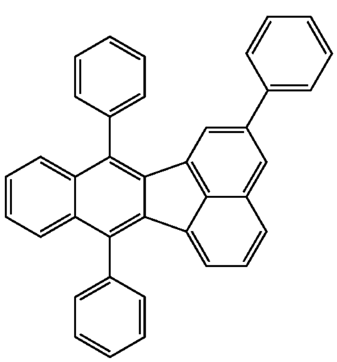
2-58
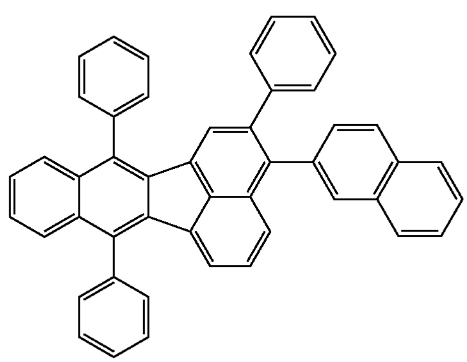
2-59

-continued
2-60
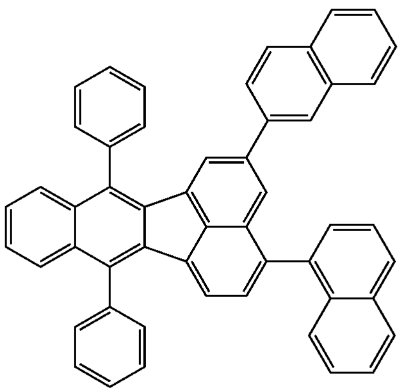
2-61
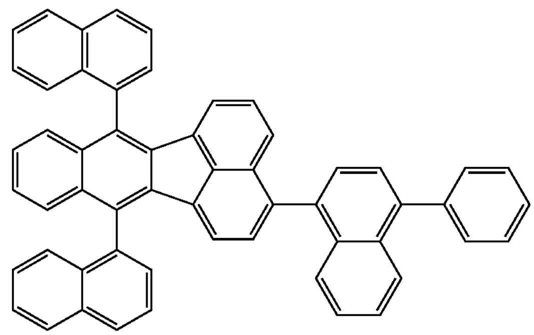
2-62
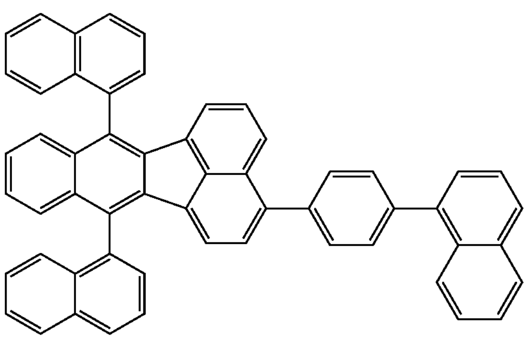
2-63
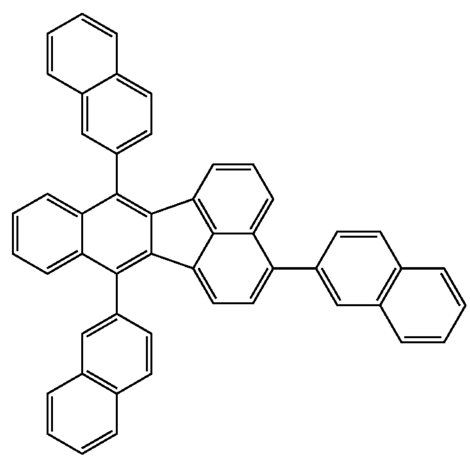
2-64
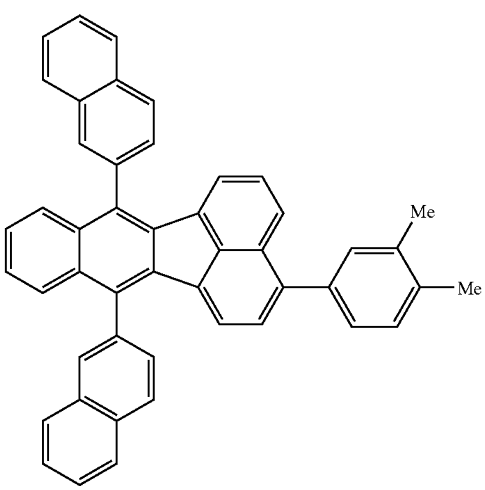
2-65
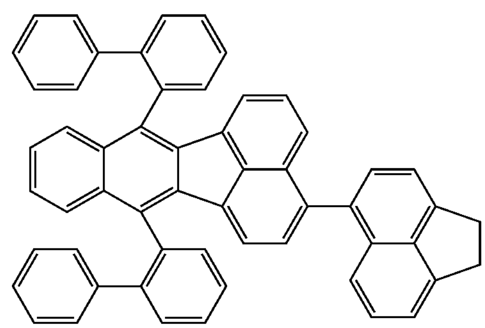

-continued
2-66
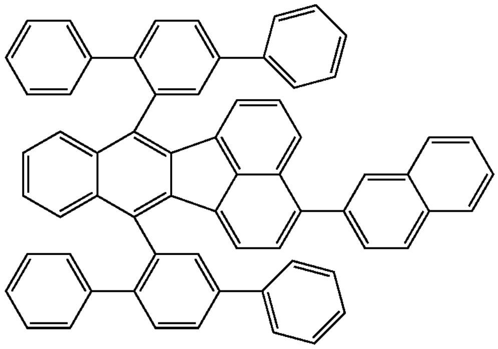
2-67
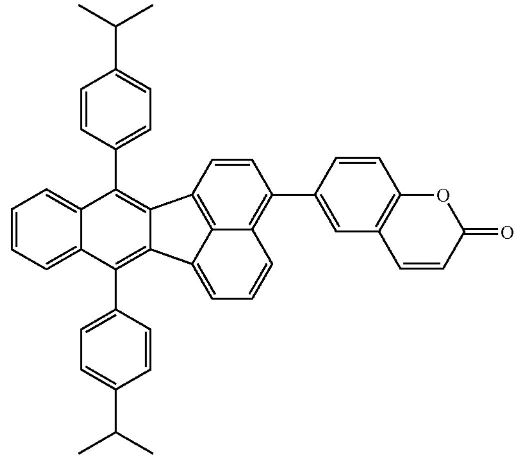
2-68
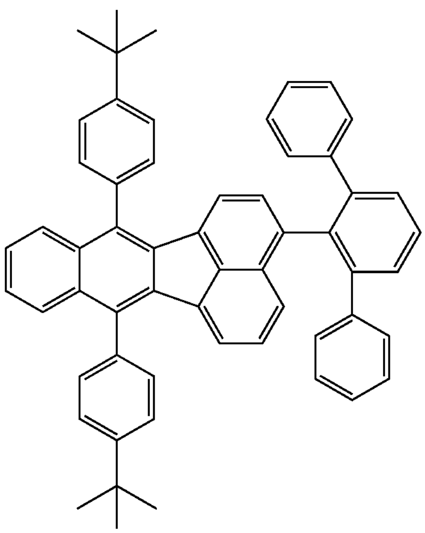
[Chemical Formula 157]
2-69
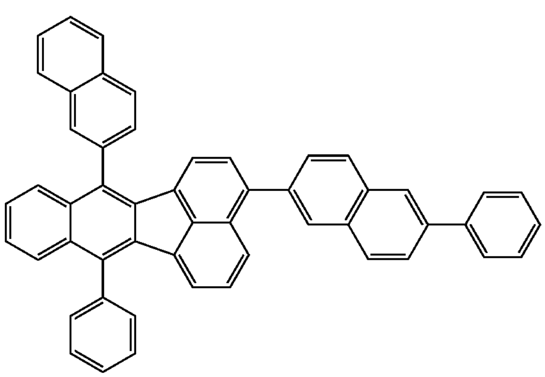
2-70
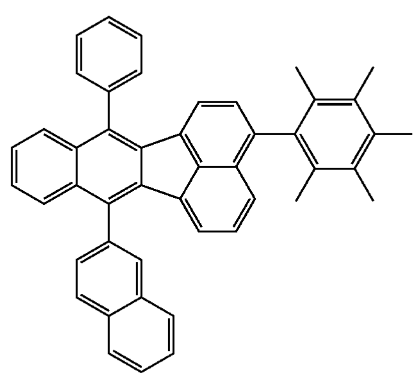

-continued
2-71
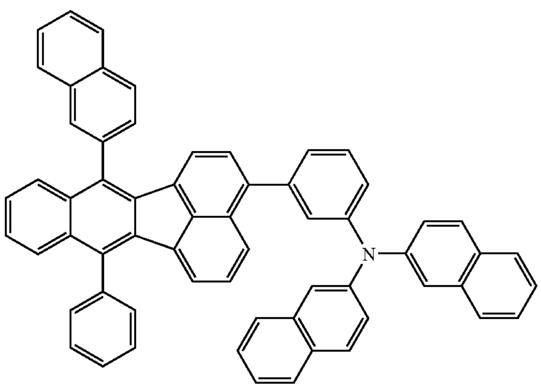
2-72
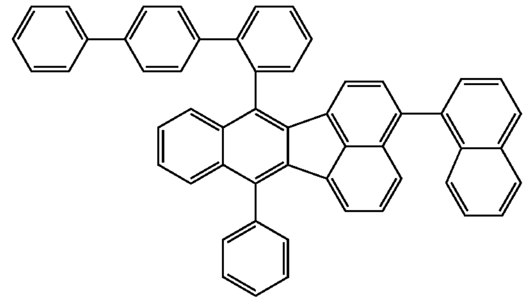
2-73
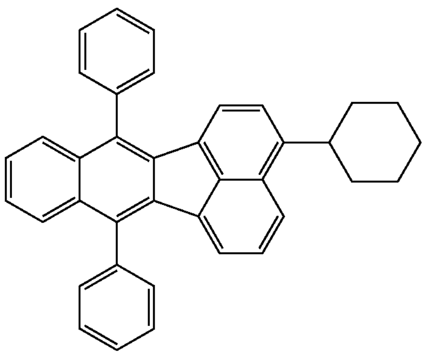
2-74
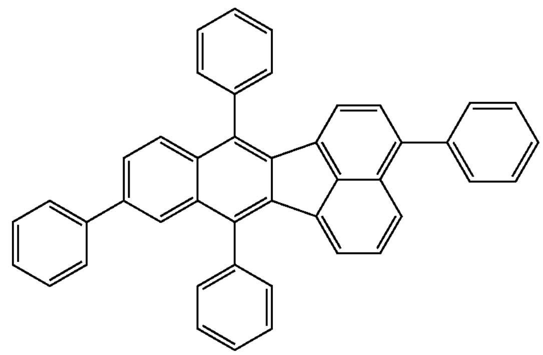
2-75
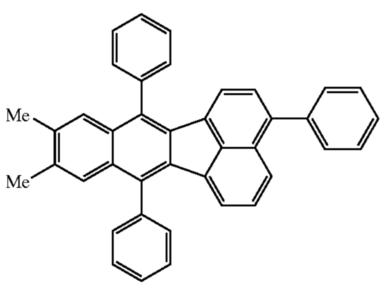
2-76
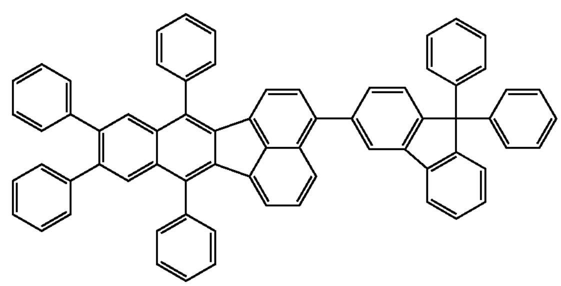
2-77
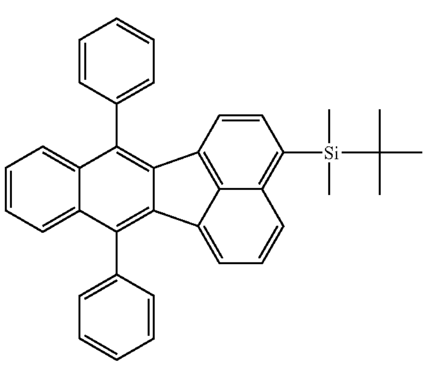
2-78
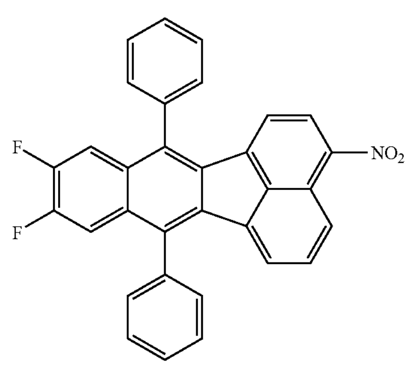

-continued
2-79
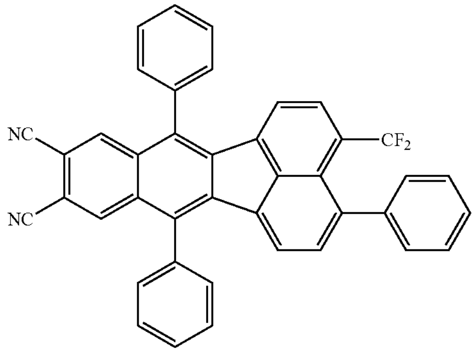
2-80
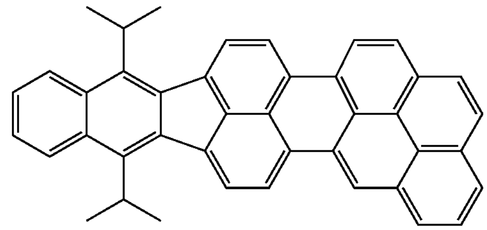
2-81
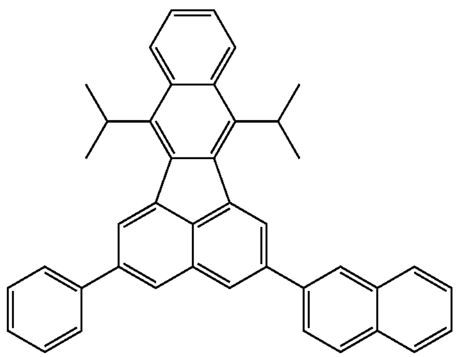
2-82
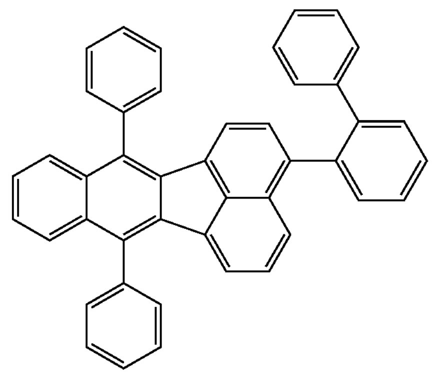
2-83
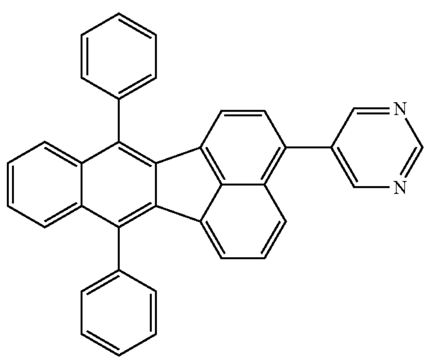
2-84
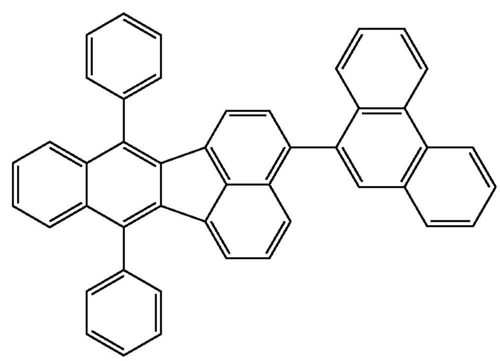
2-85
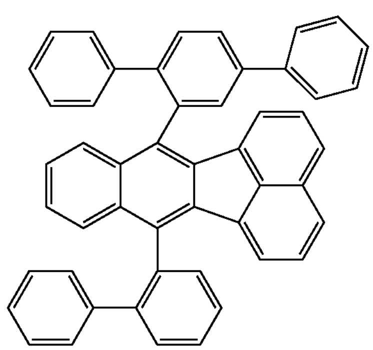
2-86
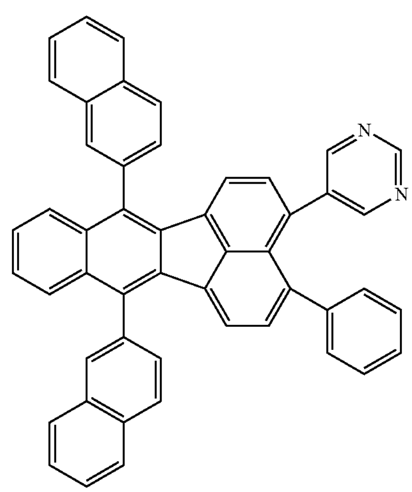

The fluorescent dopant according to the aspect of the invention may be represented by a formula (25) below.

[Chemical Formula 158]

(25)

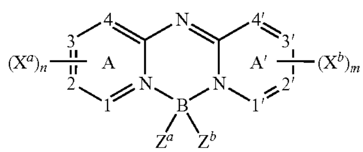

In the formula (25), A and A' each represent an independent azine ring system corresponding to a six-membered aromatic ring containing more than one nitrogen. $X^a$ and $X^b$ represent independently-selected substituents capable of being bonded together to form a fused ring with respect to A or A'. m and n each independently represent 0 to 4. $Z^a$ and $Z^b$ represent independently-selected substituents. 1, 2, 3, 4, 1', 2', 3' and 4' are each independently selected from a carbon atom and nitrogen atom.

The azine ring is preferably a quinolinyl ring or isoquinolinyl ring such that: all of 1, 2, 3, 4, 1', 2', 3' and 4' are carbon atoms; m and n each are 2 or more; and $X^a$ and $X^b$ represent 2 or more carbon-substituted groups bonded to form an aromatic ring. $Z^a$ and $Z^b$ are preferably fluorine atoms.

A fluorescent dopant of one preferable embodiment is structured such that: the two fused ring systems are quinoline or isoquinoline systems; aryl or heteroaryl substituents are phenyl groups; at least two $X^a$ groups and two $X^b$ groups are present to form 6-6 fused rings by bonding together; the fused ring systems each are fused in 1-2 position, 3-4 position, 1'-2' position or 3'-4' position; and at least either one of the fused rings is substituted by a phenyl group. The fluorescent dopant is represented by the following formula (91), (92) or (93).

[Chemical Formula 159]

(91)

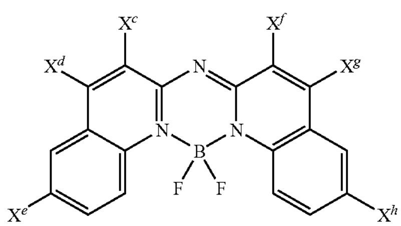

(92)

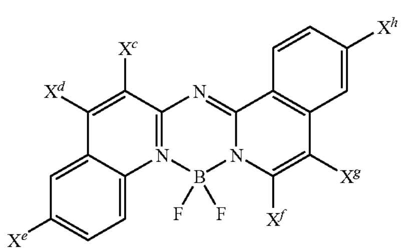

(93)

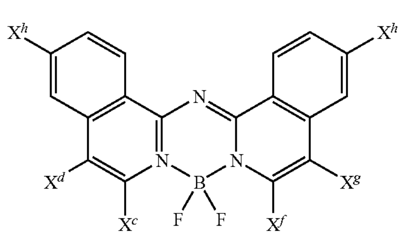

In the formulae (91) to (93), each of $X^c$, $X^d$, $X^e$, $X^f$, $X^g$ and $X^h$ represents a hydrogen atom or an independently-selected substituent. One of them must be an aryl group or heteroaryl group.

The azine ring is preferably a quinolinyl ring or isoquinolinyl ring such that: all of 1, 2, 3, 4, 1', 2', 3' and 4' are carbon atoms; m and n each are 2 or more; and $X^a$ and $X^b$ represent 2 or more carbon-substituted groups bonded to form an aromatic ring, one of the carbon-substituted groups being an aryl group or a substituted aryl group. $Z^a$ and $Z^b$ are preferably fluorine atoms.

A boron compound usable in the aspect of the invention will be exemplified below. The boron compound is complexated by two ring nitrogen atoms of deprotonated bis(azinyl) amine ligand, and the two ring nitrogen atoms are parts of different 6,6 fused ring systems. At least either one of the 6,6 fused ring systems contains an aryl or heteroaryl substituent.

[Chemical Formula 160

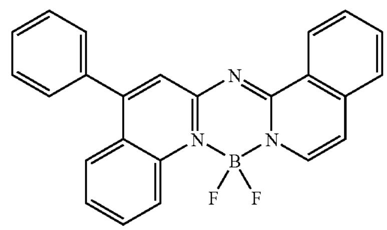

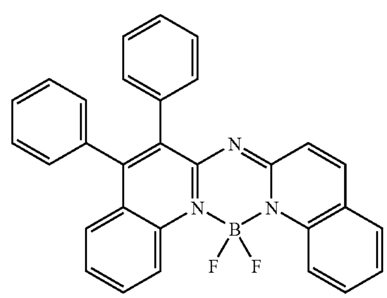

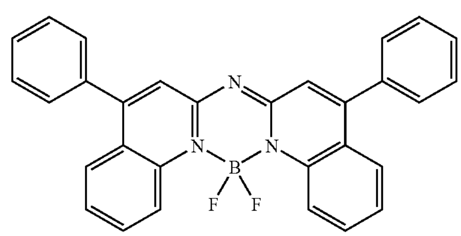

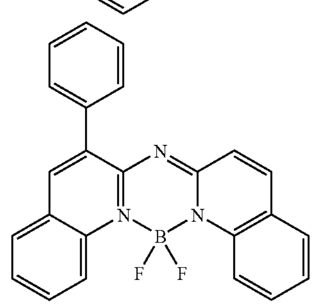

-continued

[Chemical Formula 161]

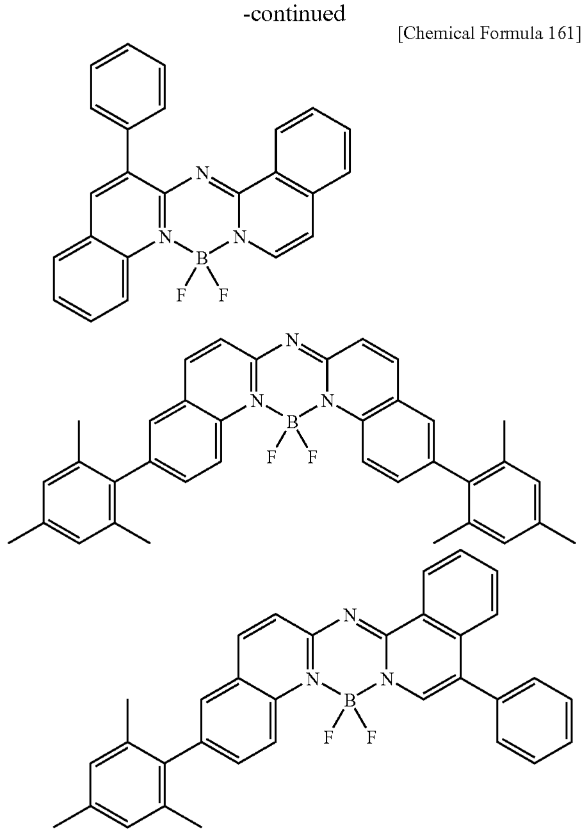

Preferably in the aspect of the invention, the organic thin-film layer includes an electron injecting/transporting layer provided between the cathode and the fluorescent-emitting layer, and the electron injecting/transporting layer contains a nitrogen-containing heterocyclic derivative.

With use of the nitrogen-containing heterocyclic derivative having high electron performance in the electron injecting/transporting layer, the driving voltage can be lowered.

Particularly, in the aspect of the invention, the emitting layer (fluorescent emitting layer) is formed of a host having a wider gap than a typical host (e.g., an anthracene derivative) of a fluorescent-emitting layer. Accordingly, the charge injection barrier may be easily increased, thereby possibly increasing the driving voltage.

In this respect, since the electron transporting layer exhibiting a high electron transporting capability is included, increase in the driving voltage can be avoided.

The electron injecting layer or the electron transporting layer, which aids injection of the electrons into the emitting layer, has a high electron mobility. The electron injecting layer is provided for adjusting energy level, by which, for instance, sudden changes of the energy level can be reduced. As a material for the electron injecting layer or the electron transporting layer, 8-hydroxyquinoline or a metal complex of its derivative, an oxadiazole derivative and a nitrogen-containing heterocyclic derivative are preferable. An example of the 8-hydroxyquinoline or the metal complex of its derivative is a metal chelate oxinoid compound containing a chelate of oxine (typically 8-quinolinol or 8-hydroxyquinoline). For instance, tris(8-quinolinol) aluminum can be used. Examples of the oxadiazole derivative are as follows.

[Chemical Formula 162]

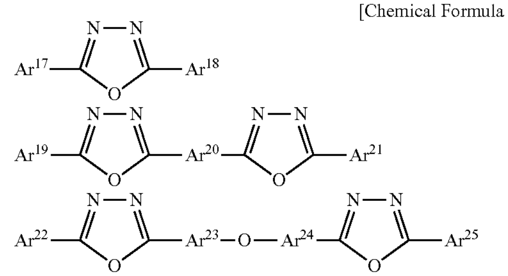

In the formula, $Ar^{17}$, $Ar^{18}$, $Ar^{19}$, $Ar^{21}$, $Ar^{22}$ and $Ar^{25}$ each represent a substituted or unsubstituted arylene group. $Ar^{17}$, $Ar^{19}$ and $Ar^{22}$ may be the same as or different from $Ar^{18}$, $Ar^{21}$ and $Ar^{25}$ respectively. $Ar^{20}$, $Ar^{23}$ and $Ar^{24}$ each represent a substituted or unsubstituted arylene group. $Ar^{23}$ and $Ar^{24}$ may be mutually the same or different.

Examples of the aryl group in the general formulae are a phenyl group, biphenyl group, anthranil group, perylenyl group and pyrenyl group. Examples of the arylene group are a phenylene group, naphthylene group, biphenylene group, anthranylene group, perylenylene group and pyrenylene group. Examples of the substituent therefor are an alkyl group having 1 to 10 carbon atoms, alkoxy group having 1 to 10 carbon atoms and cyano group. Such an electron transport compound is preferably an electron transport compound that can be favorably formed into a thin film(s). Examples of the electron transport compounds are as follows.

[Chemical Formula 163]

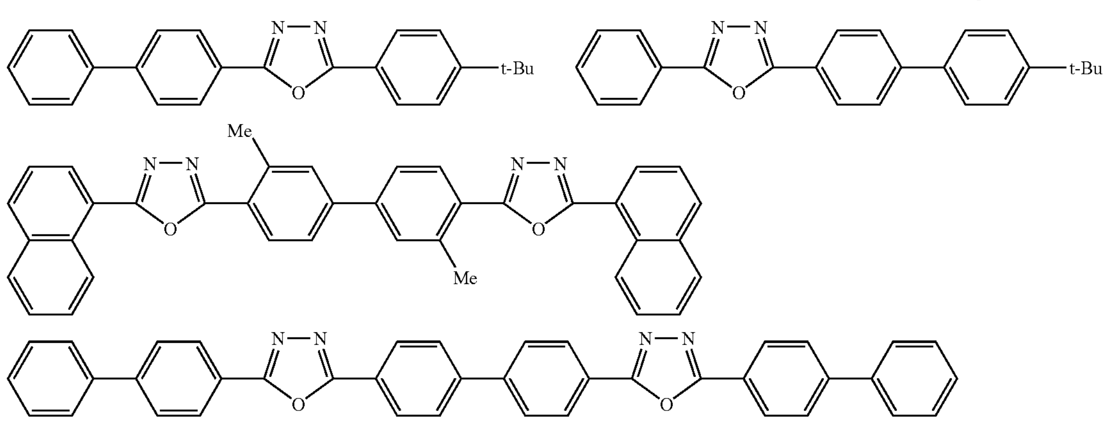

-continued

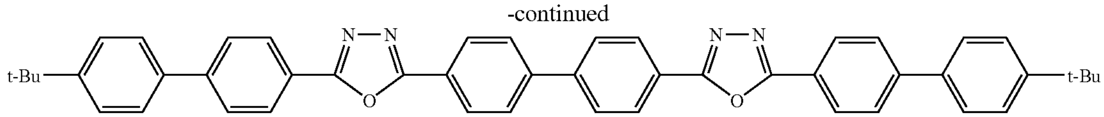

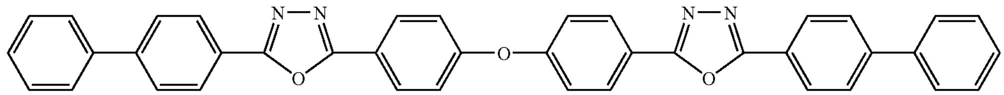

An example of the nitrogen-containing heterocyclic derivative is a nitrogen-containing compound that is not a metal complex, the derivative being formed of an organic compound represented by one of the following general formulae. Examples of the nitrogen-containing heterocyclic derivative are five-membered ring or six-membered ring derivative having a skeleton represented by the formula (A) and a derivative having a structure represented by the formula (B).

[Chemical Formula 164]

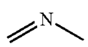
(A)

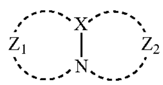
(B)

In the formula, X represents a carbon atom or a nitrogen atom. $Z_1$ and $Z_2$ each independently represent an atom group capable of forming a nitrogen-containing heterocycle.

In the formula (B), X represents a carbon atom or nitrogen atom. $Z_i$ and $Z_2$ each independently represent an atom group capable of forming a nitrogen-containing heterocycle.

[Chemical Formula 165]

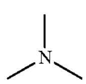
(C)

The nitrogen-containing heterocyclic derivative is preferably an organic compound having a nitrogen-containing five-membered or six-membered aromatic polycyclic group. When the number of the nitrogen atoms is plural, the nitrogen atoms bonded to the skeleton thereof in non-adjacent positions. When the nitrogen-containing heterocyclic derivative includes such nitrogen-containing aromatic polycyclic series having plural nitrogen atoms, the nitrogen-containing heterocyclic derivative may be a nitrogen-containing aromatic polycyclic organic compound having a skeleton formed by a combination of the skeletons respectively represented by the formulae (A) and (B), or by a combination of the skeletons respectively represented by the formulae (A) and (C).

A nitrogen-containing group of the nitrogen-containing organic compound is selected from nitrogen-containing heterocyclic groups respectively represented by the following general formulae.

[Chemical Formula 166]

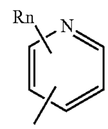
(2)

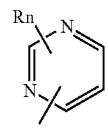
(3)

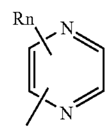
(4)

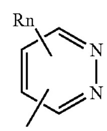
(5)

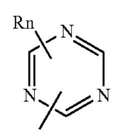
(6)

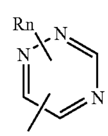
(7)

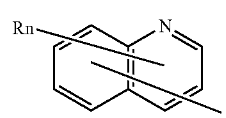
(8)

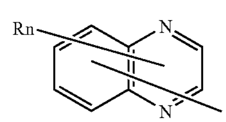
(9)

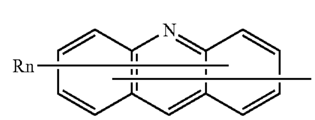
(10)

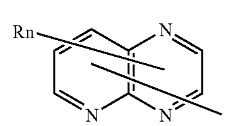
(11)

-continued (12)

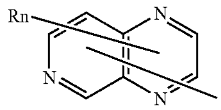

(13)

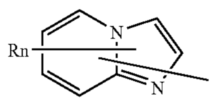

(14)

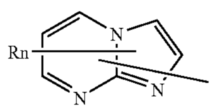

(15)

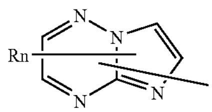

(16)

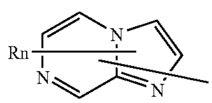

(17)

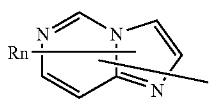

(18)

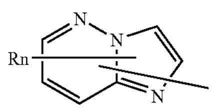

(19)

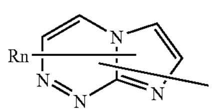

(20)

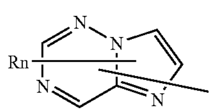

(21)

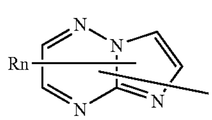

(22)

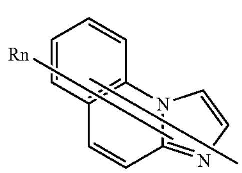

(23)

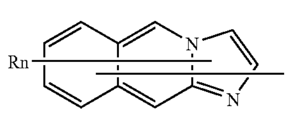

(24)

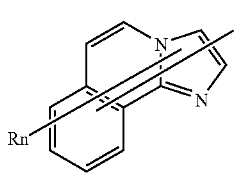

In the formulae (2) to (24): R represents an aryl group having 6 to 40 carbon atoms, a heteroaryl group having 3 to 40 carbon atoms, an alkyl group having 1 to 20 carbon atoms or an alkoxy group having 1 to 20 carbon atoms; and n represents an integer of 0 to 5. When n is an integer of 2 or more, the plurality of R may be mutually the same or different.

A preferable specific compound is a nitrogen-containing heterocyclic derivative represented by the following formula.

[Chemical Formula 167]

$$HAr\text{-}L^1\text{-}Ar^1\text{—}Ar^2$$

In the formula, HAr represents a substituted or unsubstituted nitrogen-containing heterocycle having 3 to 40 carbon atoms; $L^1$ represents a single bond, substituted or unsubstituted arylene group having 6 to 40 carbon atoms or substituted or unsubstituted heteroarylene group having 3 to 40 carbon atoms; $Ar^1$ represents a substituted or unsubstituted divalent aromatic hydrocarbon group having 6 to 40 carbon atoms; and $Ar^2$ represents a substituted or unsubstituted aryl group having 6 to 40 carbon atoms or substituted or unsubstituted heteroaryl group having 3 to 40 carbon atoms.

HAr is exemplarily selected from the following group.

[Chemical Formula 168]

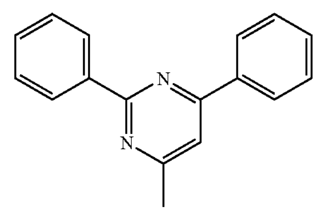

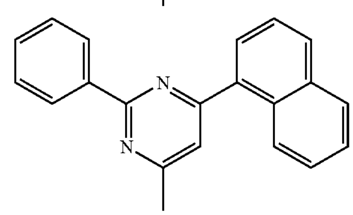

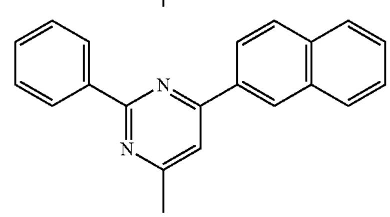

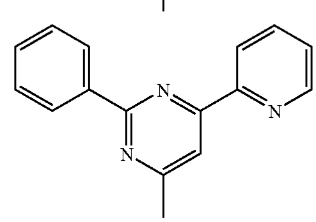

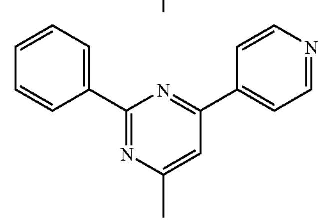

-continued
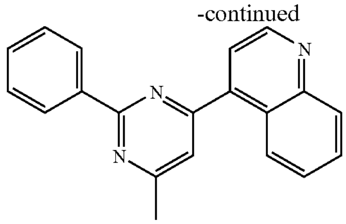
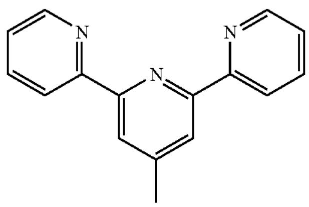
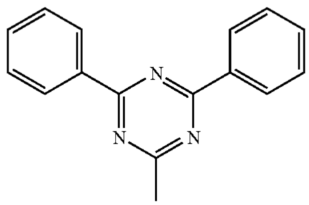
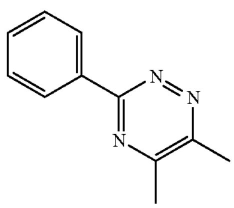
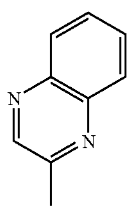
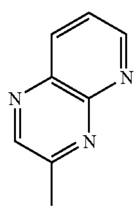
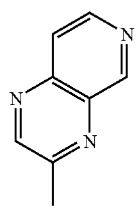
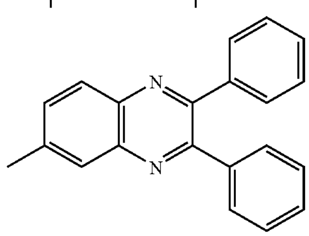
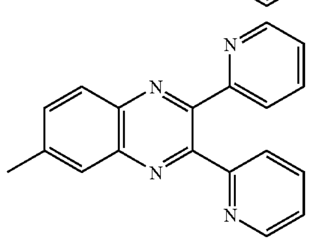
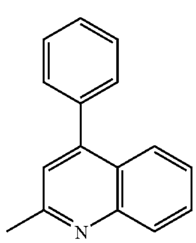
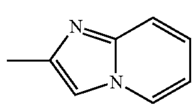
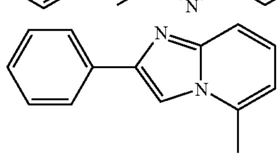
-continued
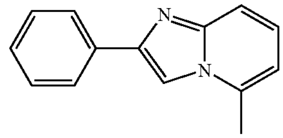
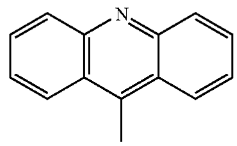
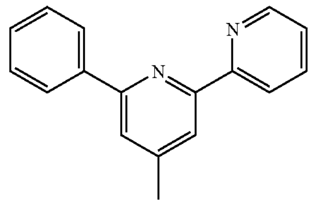
L1 is exemplarily selected from the following group.
[Chemical Formula 169]
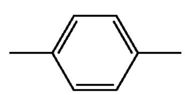
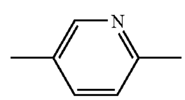
Ar2 is exemplarily selected from the following group.
[Chemical Formula 170]
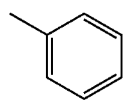
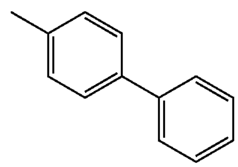
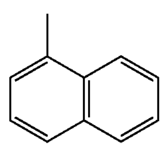
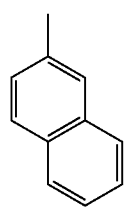
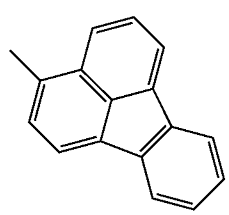
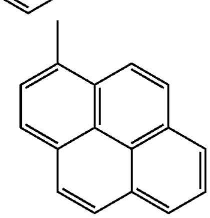
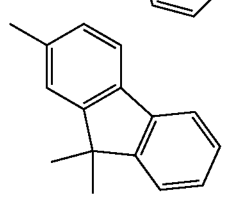
Ar[1] is exemplarily selected from the following arylanthranil groups.

[Chemical Formula 171]

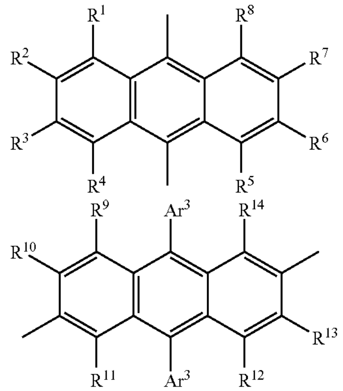

In the formula, $R^1$ to $R^{14}$ each independently represent a hydrogen atom, a halogen atom, an alkyl group having 1 to 20 carbon atoms, an alkoxy group having 1 to 20 carbon atoms, an aryloxy group having 6 to 40 carbon atoms, a substituted or unsubstituted aryl group having 6 to 40 carbon atoms, or a heteroaryl group having 3 to 40 carbon atoms. $Ar^3$ represents a substituted or unsubstituted aryl group having 6 to 40 carbon atoms, or a heteroaryl group having 3 to 40 carbon atoms.

The nitrogen-containing heterocyclic derivative may be a nitrogen-containing heterocyclic derivative in which $R^1$ to $R^8$ in the structure of $Ar^1$ represented by the above formula each represent a hydrogen atom.

Other than the above, the following compound (see JP-A-9-3448) can be favorably used.

[Chemical Formula 172]

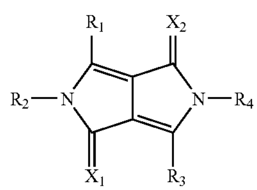

In the formula, $R_1$ to $R_4$ each independently represent a hydrogen atom, a substituted or unsubstituted aliphatic group, a substituted or unsubstituted alicyclic group, a substituted or unsubstituted carbocyclic aromatic ring group, or substituted or unsubstituted heterocyclic group. $X_1$ and $X_2$ each independently represent an oxygen atom, a sulfur atom or a dicyanomethylene group.

Alternatively, the following compound (see JP-A-2000-173774) can also be favorably used.

[Chemical Formula 173]

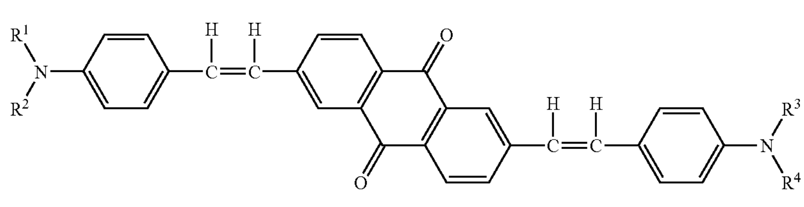

In the formula, $R^1$, $R^2$, $R^3$ and $R^4$, which may be mutually the same or different, each represent an aryl group represented by the following formula.

[Chemical Formula 174]

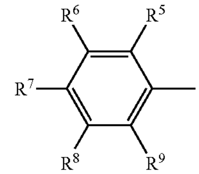

In the formula, $R^5$, $R^6$, $R^7$, $R^8$ and $R^9$, which may be mutually the same or different, each represent a hydrogen atom, a saturated or unsaturated alkoxyl group, an alkyl group, an amino group or an alkylamino group. At least one of $R^5$, $R^6$, $R^7$, $R^8$ and $R^9$ represents a saturated or unsaturated alkoxyl group, an alkyl group, an amino group or an alkylamino group.

A polymer compound containing the nitrogen-containing heterocyclic group or a nitrogen-containing heterocyclic derivative may be used.

Although thickness of the electron injecting layer or the electron transporting layer is not specifically limited, the thickness is preferably 1 to 100 nm.

In the organic EL device according to the aspect of the invention, a reduction-causing dopant may be preferably contained in an interfacial region between the cathode and the organic thin-film layer.

With this arrangement, the organic EL device can emit light with enhanced luminance intensity and have a longer lifetime.

The reduction-causing dopant is defined as a substance capable of reducing an electron-transporting compound. Accordingly, various materials are utilized as far as the material possesses proper reduction-causing property. For example, at least one material selected from a group of alkali metal, alkali earth metal, rare earth metal, oxide of alkali metal, halogenide of alkali metal, oxide of alkali earth metal, halogenide of alkali earth metal, oxide of rare earth metal, halogenide of rare earth metal, organic complexes of alkali metal, organic complexes of alkali earth metal, and organic complexes of rare earth metal may suitably be utilized.

Specifically, a preferable reduction-causing dopant is at least one alkali metal selected from a group of Li (work function: 2.9 eV), Na (work function: 2.36 eV), K (work function: 2.28 eV), Rb (work function: 2.16 eV) and Cs (work function: 1.95 eV), or at least one alkali earth metal selected from a group of Ca (work function: 2.9 eV), Sr (work function: 2.0 to 2.5 eV) and Ba (work function: 2.52 eV). The reduction-causing dopant having work function of 2.9 eV or less is particularly preferable. Among the above, a more preferable reduction-causing dopant is at least one alkali metal selected from a group of K, Rb and Cs. A further more preferable reduction-causing dopant is Rb or Cs. The most preferable reduction-causing dopant is Cs. Since the above alkali metals have particularly high reducibility, addition of a relatively small amount of these alkali metals to an electron injecting zone can enhance luminance intensity and lifetime of the organic EL device. As a reduction-causing dopant having work function of 2.9 eV or less, a combination of two or more of the alkali metals is also preferable. Particularly, a combination including Cs (e.g., Cs and Na, Cs and K, Cs and Rb, or Cs, Na and K) is preferable. A reduction-causing dopant containing Cs in a combining manner can efficiently exhibit reducibility. Addition of the reduction-causing dopant to the electron injecting zone can enhance luminance intensity and lifetime of the organic EL device.

The organic EL device according to the aspect of the invention can be provided with the intermediate layer as described above. As the intermediate layer, an electron blocking layer and a hole blocking layer can be provided as described above or below.

In an exemplary embodiment in which the phosphorescent-emitting layer is located closer to the anode than the fluorescent-emitting layer, a hole transporting material and CBP are preferably usable as the intermediate layer. On the other hand, in an exemplary embodiment in which the phosphorescent-emitting layer is located closer to the cathode than the fluorescent-emitting layer, a polycyclic fused aromatic compound and the like are usable as the intermediate layer.

BRIEF DESCRIPTION OF DRAWINGS

FIG. 1 shows an arrangement of an organic EL device according to an exemplary embodiment.

BEST MODE FOR CARRYING OUT THE INVENTION

Exemplary preferable embodiment(s) of the invention will be described below.

[Organic EL Device]

An organic EL device 1 according to this exemplary embodiment includes an anode 3 provided on a transparent substrate 2, a cathode 4 and an organic thin-film layer 5 interposed between the anode 3 and the cathode 4 as shown in FIG. 1.

The organic thin-film layer 5 includes a fluorescent-emitting layer 51 and a phosphorescent-emitting layer 52.

A hole injecting/transporting layer 53 and the like may be interposed between the phosphorescent-emitting layer 52 and the anode 3. An electron injecting/transporting layer 54 and the like may be interposed between the fluorescent-emitting layer 51 and the cathode 4.

In addition, an electron blocking layer may be provided to the fluorescent-emitting layer 51 adjacently to the anode 3 while a hole blocking layer may be provided to the fluorescent-emitting layer 51 adjacently to the cathode 4. With this arrangement, electrons and holes can be trapped in the fluorescent-emitting layer 51, thereby enhancing probability of exciton generation in the fluorescent-emitting layer 51.

The phosphorescent-emitting layer 52 includes a first phosphorescent host and a first phosphorescent dopant. The arrangement of the phosphorescent-emitting layer 52 is not limited to this, but the phosphorescent-emitting layer 52 may include a plurality of phosphorescent dopants, e.g., a first phosphorescent host or a first and second phosphorescent dopants.

The phosphorescent-emitting layer 52 may include a plurality of phosphorescent-emitting layers, e.g., a first and second phosphorescent-emitting layers. The phosphorescent-emitting layer may include the first phosphorescent host and the first phosphorescent dopant. The second phosphorescent-emitting layer may include a second phosphorescent host and the second phosphorescent dopant.

EXAMPLES

Next, the invention will be described in further detail by exemplifying

Example(s) and Comparative(s). However, the invention is not limited by the description of Example(s).

Note that solid-property values of each material, which are shown in the Table 2 below, were measured in the following manner.

Triplet energy gap Eg was defined based on phosphorescence spectrum.

Specifically, each material was dissolved in an EPA solvent (diethylether:isopentane:ethanol=5:5:2 in volume ratio) at a concentration of 10 mmol/L, thereby forming a sample for phosphorescence measurement.

Then, the sample for phosphorescence measurement was put into a quartz cell, cooled to 77K and irradiated with exciting light, so that a wavelength of phosphorescence radiated therefrom was measured.

A tangent line was drawn to be tangent to a rising section adjacent to short-wavelength of the obtained phosphorescence spectrum, a wavelength value at an intersection of the tangent line and a base line (zero absorption) was converted into energy value, and the converted energy value was defined as the triplet energy gap Eg(T).

For the measurement, a commercially-available measuring machine F-4500 (manufactured by Hitachi) was used.

Herein, the affinity level Ea (electron affinity) means energy emitted or absorbed when an electron is fed to a molecule of a material. The affinity level is defined as "positive" when energy is emitted while being defined as "negative" when energy is absorbed.

The affinity level Ea is defined as follows, with use of ionization potential Ip and optical energy gap Eg(S).

$$Af=Ip-Eg(S)$$

The ionization potential Ip means energy required for removing electron(s) from a compound of each material (i.e., energy required for ionization). The ionization potential is, for instance, a value measured by an ultraviolet-ray photoelectron spectrometer (AC-3, manufactured by Riken Keiki Co., Ltd.).

The optical energy gap Eg(S) is a difference between a conduction level and a valence level. For instance, the optical energy gap was obtained by converting into energy a wavelength value at an intersection of a long-wavelength-side tangent line in an absorbing spectrum of a toluene-diluted solution of each material and a base line in the absorbing spectrum (zero absorption).

Example 1

A glass substrate (size: 25 mm×75 mm×1.1 mm thick) having an ITO transparent electrode (manufactured by Geomatec Co., Ltd.) was ultrasonic-cleaned in isopropyl alcohol for five minutes, and then UV/ozone-cleaned for 30 minutes.

After the glass substrate having the transparent electrode line was cleaned, the glass substrate was mounted on of a substrate holder of a vacuum deposition apparatus. Then, 55-nm thick film of 4,4'-bis[N-(1-naphthyl)-N-phenylamino] biphenyl (hereinafter abbreviated as "NPD film") was initially formed by resistance heating deposition onto a surface of the glass substrate where the transparent electrode line was provided in a manner of covering the transparent electrode. The NPD film served as the hole injecting/transporting layer.

A 30-nm thick film of the following compound (FH1), which was used as the first phosphorescent host, was formed on the NPD film by resistance heating deposition. At the same time, the following compound (PD), which was used as the first phosphorescent dopant, was deposited to be contained at a content of 1% (mass ratio) of the compound (FH1). This film served as the first phosphorescent-emitting layer.

Next, a 10-nm thick film of the compound (FH1), which was used as the fluorescent host, was formed on the first phosphorescent-emitting layer by resistance heating deposition. At the same time, NPD, which was used as the fluorescent dopant, was deposited to be contained at a content of 2% (mass ratio) of the compound (FH1). This film served as the fluorescent-emitting layer.

A 10-nm thick film of the following compound (FIB) was formed on this film. This film served as a hole blocking layer.

Further, a 30-nm thick film of tris(8-quinolynol) aluminum (Alq) complex was formed on this film. This film served as an electron injecting layer.

Subsequently, LiF was formed into a 0.5-nm thick film. Metal (Al) was deposited on the LiF film to form a 150-nm thick metal cathode, thereby providing the organic EL device.

[Chemical Formula 175]

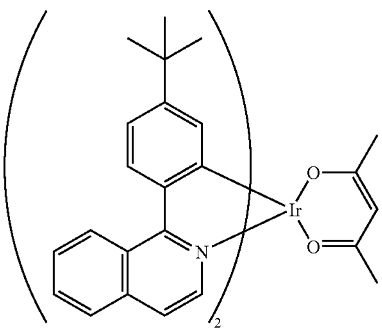

(PD)

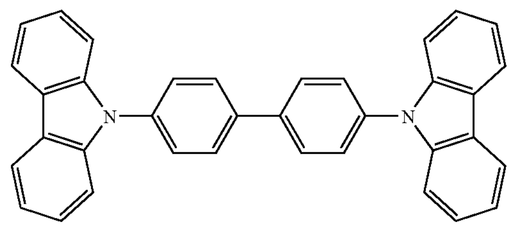

CBP

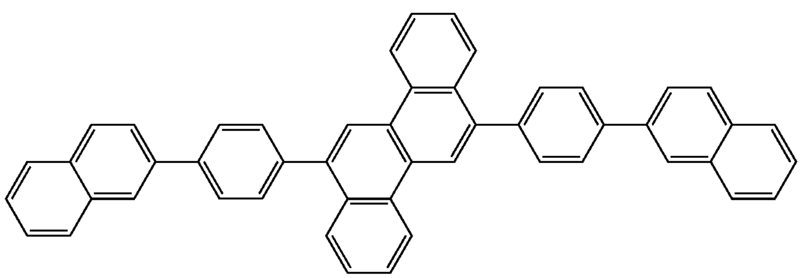

(FH1)

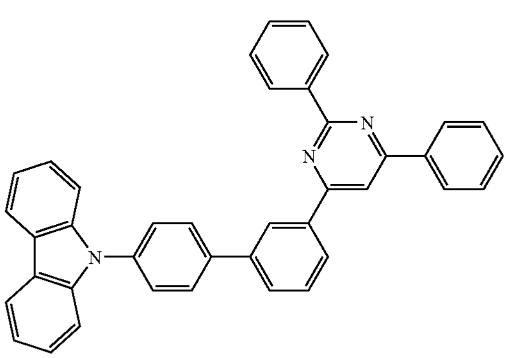

(HB)

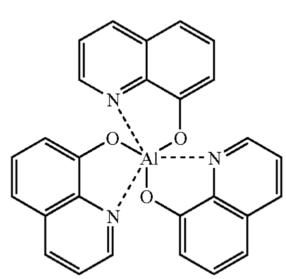

Alq

Example 2

The organic EL device of Example 2 was manufactured in the same manner as the Example 1 except that the following compound (FH2) was used as the fluorescent host in place of the compound (FH1).

[Chemical Formula 176]

(FH2)

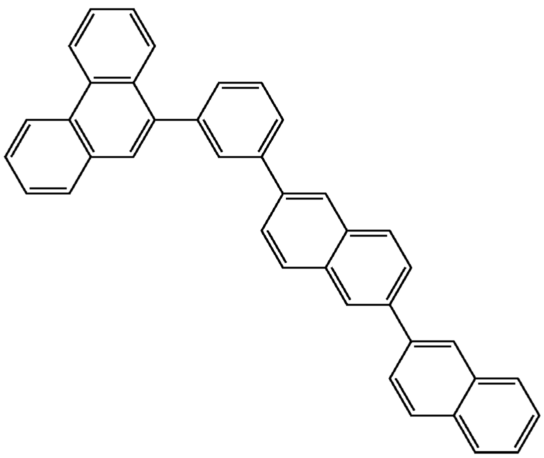

Example 3

The organic EL device of the Example 3 was manufactured in the same manner as the Example 1 except that a non-doped layer formed of only the compound (FH1) was provided between the first phosphorescent-emitting layer the fluorescent-emitting layer.

Example 4

The organic EL device of Example 4 was manufactured in the same manner as the Example 1 except that CBP was used as the first phosphorescent host in place of the compound (FH1).

Examples 5 to 8

The organic EL devices of the Examples 5 to 8 were manufactured in the same manner as the Examples 1 to 4 except that the first phosphorescent-emitting layer and the fluorescent-emitting layer were layered in reverse order so that the anode, hole injecting/transporting layer, fluorescent-emitting layer, first phosphorescent-emitting layer, hole blocking layer, electron injecting layer and cathode were arranged in this order.

Example 9

The organic EL device of Example 9 was manufactured in the same manner as the Example 5 except that BCzVBi(4,4'-bis(9-ethyl-3-carbazovinylene)-1,1'-biphenyl) was used as the fluorescent dopant in place of NPD.

Example 10

The organic EL device of Example 10 was manufactured in the same manner as the Example 6 except that the compound (FH2) was used as the first phosphorescent host in place of the compound (FH1).

Example 11

The organic EL device of Example 11 was manufactured in the same manner as the Example 1 except that the following compound (FH3) was used as the fluorescent host in place of the compound (FH1).

[Chemical Formula 177]

(FH3)

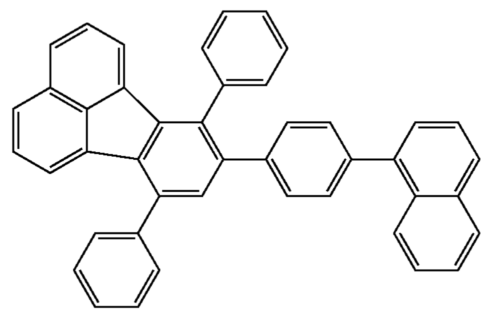

Example 12

The organic EL device of Example 12 was manufactured in the same manner as Example 5 except that the following compound (GD), which was used as a green fluorescent dopant, was deposited in addition to the fluorescent dopant when forming the fluorescent-emitting layer, so that the compound (GD) was contained at a content of 0.5% (mass ratio) of the compound (FH1).

[Chemical Formula 178]

(GD)

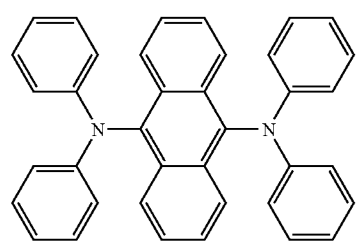

Example 13

The organic EL device of Example 13 was manufactured in the same manner as the Example 5 except that the following compound (E) was used as the electron injecting material in place of Alq.

[Chemical Formula 179]

(E)

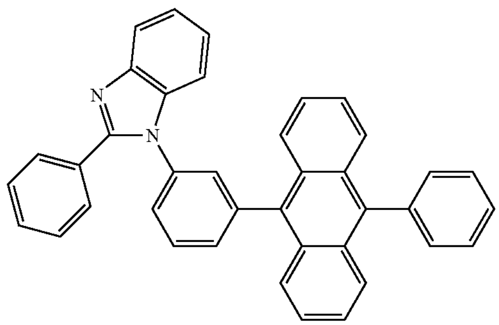

Example 14

The organic EL device of Example 14 was manufactured in the same manner as the Example 5 except that the following compound (BD) was used as the fluorescent dopant in place of NPD.

[Chemical Formula 180]

(BD)

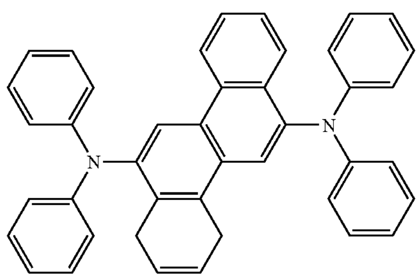

Example 15

The organic EL device of Example 15 was manufactured in the same manner as the Example 10 except that the compound (FH1) and BAlq were used respectively as the fluorescent host and the first phosphorescent host in place of the compound (FH2) and that the hole blocking layer was not provided.

Example 16

The organic EL device of Example 16 was manufactured in the same manner as Example 1 except that the anode, hole injecting/transporting layer, first phosphorescent-emitting layer, second phosphorescent-emitting layer, carrier blocking layer, fluorescent-emitting layer, electron injecting layer and cathode were layered in this order and that the second phosphorescent-emitting layer, the carrier blocking layer and the fluorescent-emitting layer were differently structured.

The compound (I-1) was used as the second phosphorescent host of the second phosphorescent-emitting layer. The compound Ir(Ph-ppy)$_3$ was used as the second phosphorescent dopant that emitted green light and contained at a content of 5% (mass ratio) of the compound (I-1). A thickness of the second phosphorescent-emitting layer was 5 nm.

The carrier blocking layer was made of the compound (HT) and formed to be 6 nm thick.

The compound (I-1) was used as the fluorescent host of the fluorescent-emitting layer. The compound (BD) was used as the fluorescent dopant that emitted blue light and contained at a content of 2% (mass ratio) of the compound (I-1). A thickness of the fluorescent-emitting layer was 10 nm.

The compound (PD), which was the first phosphorescent dopant of the first phosphorescent-emitting layer, emitted red light.

[Chemical Formula 181]

(I-1)

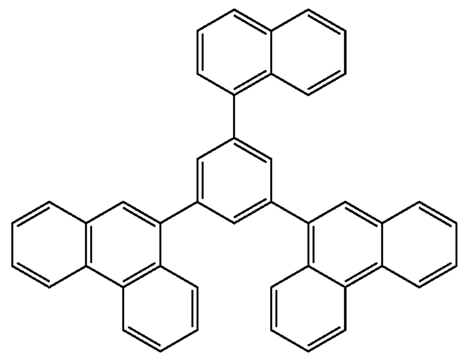

(HT)

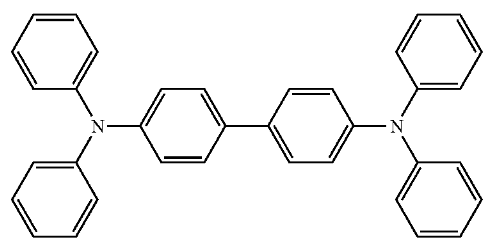

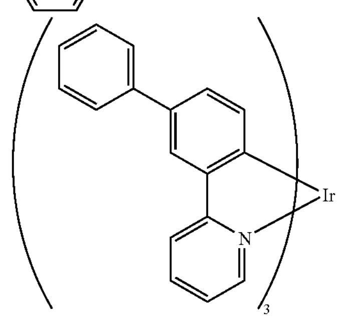

(Ir(Ph-ppy)$_3$)

Example 17

The organic EL device of Example 17 was manufactured in the same manner as Example 1 except that the anode, hole injecting/transporting layer, fluorescent-emitting layer, hole blocking layer, second phosphorescent-emitting layer, first phosphorescent-emitting layer, electron injecting layer and cathode were layered in this order and that the fluorescent-emitting layer, the hole blocking layer, the second phosphorescent-emitting layer and the first phosphorescent-emitting layer were differently structured.

The compound (I-2) was used as the fluorescent host of the fluorescent-emitting layer. The compound HT was used as the fluorescent dopant that emitted blue light and contained at a content of 2% (mass ratio) of the compound (I-2). A thickness of the fluorescent-emitting layer was 10 nm.

The hole blocking layer was made of the compound (HB) and formed to be 5 nm thick.

The compound (I-2) was used as the second phosphorescent host of the second phosphorescent-emitting layer. The compound Ir(Ph-ppy)$_3$ was used as the second phosphorescent dopant that emitted green light and contained at a content of 5% (mass ratio) of the compound (I-2). A thickness of the second phosphorescent-emitting layer was 5 nm.

The compound (FH2) was used as the first phosphorescent host of the first phosphorescent-emitting layer. The compound (PD) was used as the first phosphorescent dopant that emitted red light and contained at a content of 1% (mass ratio) of the compound (FH2). A thickness of the first phosphorescent-emitting layer was 10 nm.

[Chemical Formula 182]

(I-2)

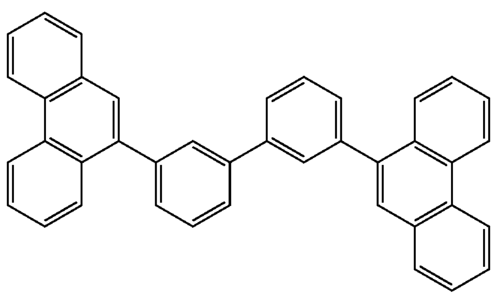

Example 18

The organic EL device of Example 18 was manufactured in the same manner as Example 1 except that the anode, hole injecting/transporting layer, first phosphorescent-emitting layer, hole blocking layer, fluorescent-emitting layer, electron injecting layer and cathode were layered in this order and that the first phosphorescent-emitting layer, the hole blocking layer and the fluorescent-emitting layer were differently structured.

The first phosphorescent-emitting layer contained the first phosphorescent host and the first and second phosphorescent dopants. The compound (I-3) was used as the first phosphorescent host. The compound (PD) was used as the first phosphorescent dopant that emitted red light and contained at a content of 1% (mass ratio) of the compound (I-3). The compound Ir(Ph-ppy)$_3$ was used as the second phosphorescent dopant that emitted green light and contained at a content of 20% (mass ratio) of the compound (I-3). A thickness of the first phosphorescent-emitting layer was 20 nm.

The hole blocking layer was made of the compound (HT2) in place of the compound (BB) and formed to be 5 nm thick.

The compound (I-3) was used as the fluorescent host of the fluorescent-emitting layer. The compound (FH13) was used as the fluorescent dopant that emitted blue light and contained at a content of 2% (mass ratio) of the compound (I-3). A thickness of the first phosphorescent-emitting layer was 20 nm.

[Chemical Formula 183]

(I-3)

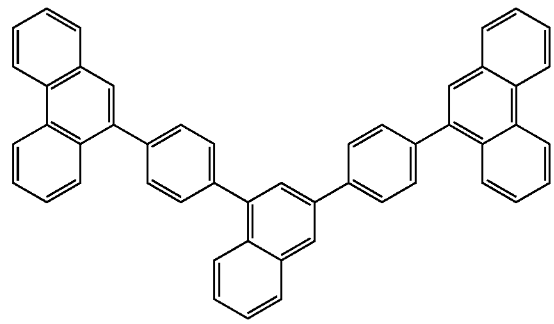

(HT2)

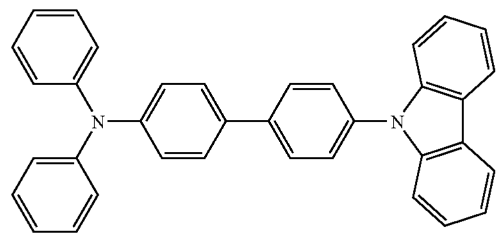

Example 19

The organic EL device of Example 19 was manufactured in the same manner as Example 1 except that the anode, hole injecting/transporting layer, first phosphorescent-emitting layer, first hole blocking layer, fluorescent-emitting layer, second hole blocking layer, electron injecting layer and cathode were layered in this order and that the first phosphorescent-emitting layer, the first hole blocking layer, the fluorescent-emitting layer and the cathode were differently structured.

The first phosphorescent-emitting layer contained a first phosphorescent host and a first and second phosphorescent dopants. The compound (I-2) was used as the first phosphorescent host. The compound (PD) was used as the first phosphorescent dopant that emitted red light and contained at a content of 0.1% (mass ratio) of the compound (I-2). The compound Ir(Ph-ppy)$_3$ was used as the second phosphorescent dopant that emitted green light and contained at a content of 5% (mass ratio) of the compound (I-2). A thickness of the first phosphorescent-emitting layer was 20 nm.

The first hole blocking layer was made of the compound (HT2) and formed to be 5 nm thick.

The compound (I-2) was used as the fluorescent host of the fluorescent-emitting layer. The compound (FH3) was used as the fluorescent dopant that emitted blue light and contained at a content of 2% (mass ratio) of the compound (I-3). A thickness of the first phosphorescent-emitting layer was 10 nm.

The second hole blocking layer, which was structured in the same manner as the hole blocking layer of Example 1, was made of the compound (HB) and formed to be 10 nm thick.

The cathode was formed by depositing metal (Al) on a 0.5-mm thick LiF film to be 80 nm thick.

Comparative 1

The organic EL device of Comparative 1 was manufactured in the same manner as the Example 9 except that CBP was used as the fluorescent host and the first phosphorescent host in place of the compound (FH1).

Comparative 2

The organic EL device of Comparative 2 was manufactured in the same manner as Comparative 1 except that TBADN(2-tert-butyl-9,10-bis-(β-naphthyl)-anthracene) was used as the fluorescent host in place of CBP. A triplet energy gap of TBACN was 2.0 eV or less.

[Evaluation of Organic EL Device]

The organic EL devices each manufactured as described above were driven by direct-current electricity of 1 $mA/cm^2$ to emit light, so that emission chromaticity, luminance (L) and voltage were measured. Based on the measurement, the external quantum efficiency (EQE:%) was obtained. In addition, by conducting a direct-current continuous current test with the initial luminance intensity being set at 1000 $cd/m^2$ for each organic EL device, time elapsed until the initial luminance intensity was reduced to the half (i.e., time until half-life) was measured for each organic EL device.

The results of the evaluation are shown in the Table 1 below. Ionization potential (Ip), affinity level (Ea), singlet energy gap (Eg(S)) and triplet energy gap (Eg(T)) of each compound are shown in the Table 2 below.

TABLE 1

| | EQE | Time until Half-Life T50@ 1000 | Chromaticity (CIE Color System) | |
|---|---|---|---|---|
| | (%) | $cd/m^2$(h) | x | y |
| Example 1 | 15.1 | 3000 | 0.617 | 0.286 |
| Example 2 | 15.7 | 3300 | 0.633 | 0.292 |
| Example 3 | 13.1 | 300 | 0.599 | 0.284 |
| Example 4 | 15.5 | 550 | 0.640 | 0.299 |
| Example 5 | 15.7 | 1000 | 0.377 | 0.169 |
| Example 6 | 17.0 | 700 | 0.424 | 0.185 |
| Example 7 | 9.1 | 300 | 0.267 | 0.134 |
| Example 8 | 6.3 | 200 | 0.205 | 0.145 |
| Example 9 | 16.0 | 1200 | 0.388 | 0.180 |
| Example 10 | 16.4 | 450 | 0.416 | 0.181 |
| Example 11 | 12.8 | 500 | 0.385 | 0.177 |
| Example 12 | 15.5 | 1200 | 0.335 | 0.258 |
| Example 13 | 16.1 | 1000 | 0.382 | 0.166 |
| Example 14 | 15.8 | 1200 | 0.377 | 0.184 |
| Example 15 | 11.5 | 400 | 0.581 | 0.293 |
| Example 16 | 15.3 | 2000 | 0.328 | 0.351 |
| Example 17 | 14.8 | 1500 | 0.389 | 0.412 |
| Example 18 | 16.2 | 2500 | 0.312 | 0.331 |
| Example 19 | 14.8 | 2200 | 0.361 | 0.425 |
| Comparative 1 | 12.3 | 150 | 0.569 | 0.288 |
| Comparative 2 | 5.0 | 1000 | 0.242 | 0.165 |

TABLE 2

| Material | IP (eV) | Ea (eV) | Eg (S) (eV) | Eg (T) (eV) |
|---|---|---|---|---|
| FH1 | 5.88 | 2.64 | 3.24 | 2.38 |
| FH2 | 6.04 | 2.55 | 3.49 | 2.44 |
| FH3 | 5.87 | 2.88 | 2.99 | 2.22 |
| GD | 5.50 | 3.00 | 2.50 | — |
| BD | 5.47 | 2.67 | 2.80 | — |
| PD | — | — | — | 2.03 |
| CBP | 6.06 | 2.50 | 3.56 | 2.81 |
| I-1 | 6.00 | 2.70 | 3.30 | 2.60 |

TABLE 2-continued

| Material | IP (eV) | Ea (eV) | Eg (S) (eV) | Eg (T) (eV) |
|---|---|---|---|---|
| I-2 | 6.10 | 2.80 | 3.30 | 2.60 |
| I-3 | 6.00 | 2.70 | 3.30 | 2.60 |
| $Ir(Ph\text{-}ppy)_3$ | — | — | — | 2.52 |

As appreciated from Table 1, the organic EL devices of Examples 1 to 19, in which the polycyclic fused ring compound according to the aspect of the invention was used as the fluorescent host, exhibited long lifetime and high efficiency.

In Example 16, the carrier blocking layer was layered on the first and second phosphorescent-emitting layer adjacently to the anode, which inhibited transfer of electrons toward the first and second phosphorescent-emitting layers. The organic EL device of Example 16 emitted white light having improved color rendering property.

In Example 17, the hole blocking layer was layered on the first and second phosphorescent-emitting layer adjacently to the anode, which inhibited transfer of holes toward the first and second phosphorescent-emitting layers. The organic EL device of Example 17 emitted white light having improved color rendering property.

In Examples 18 and 19, the first phosphorescent-emitting layer contained the first and second phosphorescent dopants, which improved luminous efficiency of red emission.

On the other hand, Comparative 1, where CBP (a material conventionally used for a fluorescent host) was used, exhibited a short time until half-life. In Comparative 2, triplet energy was not transferred and phosphorescent emission was not obtained although time until half-life was relatively long. Thus, luminous efficiency was low.

It should be noted that a "fluorescent host" and a "phosphorescent host" herein respectively mean a host combined with a fluorescent dopant and a host combined with a phosphorescent dopant, and that a distinction between the fluorescent host and phosphorescent host is not unambiguously derived only from a molecular structure of the host in a limited manner.

In other words, the fluorescent host herein means a material for forming a fluorescent-emitting layer containing a fluorescent dopant, and does not mean a host that is only usable as a host of a fluorescent material.

Likewise, the phosphorescent host herein means a material for forming a phosphorescent-emitting layer containing a phosphorescent dopant, and does not mean a host that is only usable as a host of a phosphorescent material.

The invention claimed is:

1. An organic EL device, comprising:

an anode;

a cathode; and an organic thin-film layer provided between the anode and the cathode, wherein the organic thin-film layer comprises:

a fluorescent-emitting layer comprising a fluorescent host and a fluorescent dopant; and a first phosphorescent-emitting layer comprising a first phosphorescent host and a first phosphorescent dopant, a triplet energy gap $Eg_H$ of the fluorescent host is larger than a triplet energy gap $Eg_{pD}$ of the first phosphorescent dopant, and the fluorescent host is a compound having a substituted or unsubstituted polycyclic fused aromatic skeleton, wherein the fluorescent host has a triplet energy gap of 2.10 eV to 3.00 eV.

2. The organic EL device according to claim 1, wherein the polycyclic fused aromatic skeleton is present as a divalent or multivalent group in a chemical structure formula.

3. The organic EL device according to claim 2, wherein the polycyclic fused aromatic skeleton is selected from the group consisting of substituted or unsubstituted naphthalene-diyl, phenanthrene-diyl, chrysene-diyl, fluoranthene-diyl and triphenylene-diyl.

4. The organic EL device according to claim 3, wherein the polycyclic fused aromatic skeleton is substituted by a group comprising naphthalene, phenanthrene, chrysene, fluoranthene or triphenylene.

5. The organic EL device according to claim 2, wherein the fluorescent host has a triplet energy gap of 2.10 eV to 2.70 eV; and the polycyclic fused aromatic skeleton has 14 to 30 ring atoms.

6. The organic EL device according to claim 5, wherein the polycyclic fused aromatic skeleton has no substituent having a carbazole skeleton.

7. The organic EL device according to claim 1, wherein the polycyclic fused aromatic skeleton has a substituent, and the substituent is a substituted or unsubstituted aryl group or heteroaryl group.

8. The organic EL device according to claim 1, wherein the polycyclic fused aromatic skeleton is represented by any one of formulae (1) to (4) below, (1)

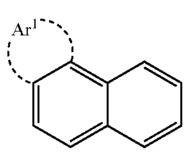

(2)

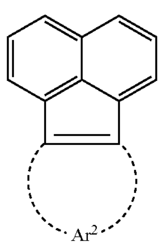

(3)

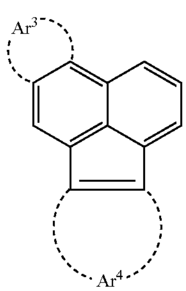

(4)

$Ar^5$—Np—$Ar^6$ where: in the formulae (1) to (3): $Ar^1$ to $Ar^4$ each represent a substituted or unsubstituted fused cyclic structure having 4 to 10 ring carbon atoms; and in the formula (4): Np represents substituted or unsubstituted naphthalene; $Ar^5$ and $Ar^6$ each independently represent a substituent formed solely of a substituted or unsubstituted aryl group having 5 to 14 carbon atoms or a substituent formed of a combination of a plurality thereof; and $Ar^5$ or $Ar^6$ is not anthracene.

9. The organic EL device according to claim 1, wherein the organic thin-film layer comprises a second phosphorescent-emitting layer which comprises a second phosphorescent host and a second phosphorescent dopant.

10. The organic EL device according to claim 9, wherein one of the first and second phosphorescent-emitting layers is layered on the fluorescent-emitting layer adjacently to the anode; and the other one of the first and second phosphorescent-emitting layers is layered on the fluorescent-emitting layer adjacently to the cathode.

11. The organic EL device according to claim 10, wherein one of the first and second phosphorescent-emitting layers is a red emitting layer; and the other one of the first and second phosphorescent-emitting layers is a green emitting layer.

12. The organic EL device according to claim 9, wherein the first phosphorescent-emitting layer is a red emitting layer;

the second phosphorescent-emitting layer is a green emitting layer; and the fluorescent-emitting layer, the second phosphorescent-emitting layer and the first phosphorescent-emitting layer are layered in this order to provide the organic thin-film layer.

13. The organic EL device according to claim 9, wherein a triplet energy gap of the second phosphorescent host is different from a triplet energy gap of the first phosphorescent host.

14. The organic EL device according to claim 9, wherein a triplet energy gap of the fluorescent host is larger than a triplet energy gap of the second phosphorescent host.

15. The organic EL device according to claim 9, wherein a triplet energy gap of the first or second phosphorescent dopant is 2.65 eV or less.

16. The organic EL device according to claim 9, wherein a triplet energy gap of the fluorescent host is 2.70 eV or less.

17. The organic EL device according to claim 9, wherein the first and second phosphorescent dopants comprise a metal complex comprising a metal selected from the group consisting of Ir, Pt, Os, Au, Cu, Re and Ru; and a ligand.

18. The organic EL device according to claim 9, wherein the first and second phosphorescent dopants have maximum emission luminance of which wavelength is 480 nm to 650 nm.

19. The organic EL device according to claim 1, wherein the first phosphorescent-emitting layer comprises the second phosphorescent dopant.

20. The organic EL device according to claim 1, wherein the fluorescent dopant is an amine compound represented by a formula (20) below, (20)

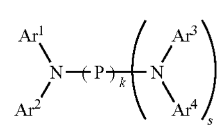

where: P represents a substituted or unsubstituted aromatic hydrocarbon group having 6 to 40 ring carbon atoms, a substituted or unsubstituted heterocyclic group having 3 to 40 ring atoms, or a substituted or unsubstituted styryl group; k is an integer of 1 to 3;

$Ar^1$ to $Ar^4$ each independently represent a substituted or unsubstituted aromatic hydrocarbon group having 6 to 40 ring carbon atoms or a substituted or unsubstituted heterocyclic group having 3 to 40 ring atoms; and s is an integer of 0 to 4.

21. The organic EL device according to claim 1, wherein the fluorescent dopant is a fluoranthene derivative represented by any one of formulae (21) to (24) below, (21)

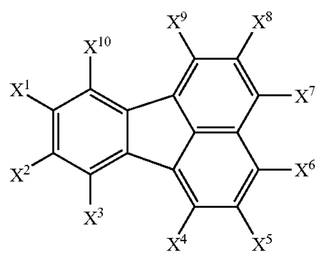

(22)

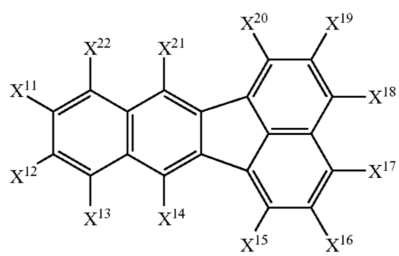

(23)

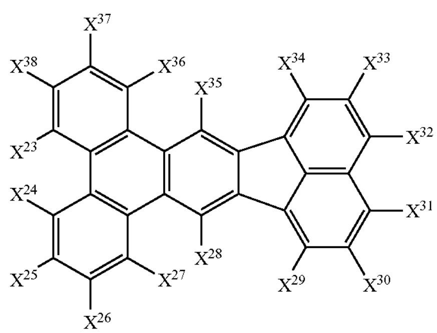

(24)

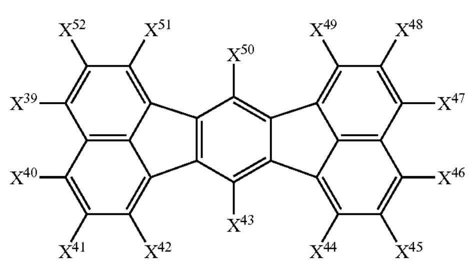

where: $X^1$ to $X^{52}$ each independently represent a hydrogen atom; halogen atom; substituted or unsubstituted liner, branched or cyclic alkyl group having 1 to 30 carbon atoms; substituted or unsubstituted liner, branched or cyclic alkoxy group having 1 to 30 carbon atoms;

substituted or unsubstituted liner, branched or cyclic alkylthio group having 1 to 30 carbon atoms; substituted or unsubstituted liner, branched or cyclic alkenyl group having 2 to 30 carbon atoms; substituted or unsubstituted liner, branched or cyclic alkenyloxy group having 2 to 30 carbon atoms; substituted or unsubstituted liner, branched or cyclic alkenylthio group having 2 to 30 carbon atoms; substituted or unsubstituted aralkyl group having 7 to 30 carbon atoms; substituted or unsubstituted aralkyloxy group having 7 to 30 carbon atoms; substituted or unsubstituted aralkylthio group having 7 to 30 carbon atoms; substituted or unsubstituted aryl group having 6 to 20 carbon atoms; substituted or unsubstituted aryloxy group having 6 to 20 carbon atoms; substituted or unsubstituted arylthio having 6 to 20 carbon atoms;

substituted or unsubstituted amino group having 2 to 30 carbon atoms; cyano group; silyl group; hydroxyl group; —$COOR_{1e}$ group wherein $R_{1e}$ represents a hydrogen atom; substituted or unsubstituted linear, branched or cyclic alkyl group having 1 to 30 carbon atoms;

substituted or unsubstituted linear, branched or cyclic alkenyl group having 2 to 30 carbon atoms; substituted or unsubstituted aralkyl group having 7 to 30 carbon atoms or substituted or unsubstituted aryl group having 6 to 30 carbon atoms; —$COR_{2e}$ group wherein $R_{2e}$ represents a hydrogen atom; substituted or unsubstituted linear, branched or cyclic alkyl group having 1 to 30 carbon atoms; substituted or unsubstituted linear, branched or cyclic alkenyl group having 2 to 30 carbon atoms; substituted or unsubstituted aralkyl group having 7 to 30 carbon atoms; substituted or unsubstituted aryl group having 6 to 30 carbon atoms or amino group; or —$OCOR_{3e}$ group wherein $R_{3e}$ represents a substituted or unsubstituted linear, branched or cyclic alkyl group having 1 to 30 carbon atoms; substituted or unsubstituted linear, branched or cyclic alkenyl group having 2 to 30 carbon atoms; substituted or unsubstituted aralkyl group having 7 to 30 carbon atoms; or substituted or unsubstituted aryl group having 6 to 30 carbon atoms; and an adjacent set of groups of $X^1$ to $X^{52}$ and an adjacent set of substituents of $X^1$ to $X^{52}$ are allowed be bonded together to form a substituted or unsubstituted carbocycle.

22. The organic EL device according to claim 1, wherein the fluorescent dopant is represented by a formula (25) below, (25)

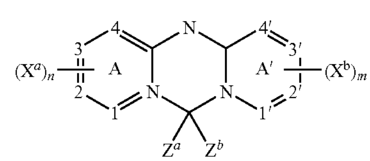

where: A and A' each represent an independent azine ring system corresponding to a six-membered aromatic ring comprising one nitrogen or more;

$X^a$ and $X^b$ represent independently-selected substituents capable of being bonded together to form a fused ring with respect to A or A';

m and n each independently represent an integer of 0 to 4;

$Z^a$ and $Z^b$ represent independently-selected substituents; and 1, 2, 3, 4, 1', 2', 3' and 4' are each independently selected from the group consisting of a carbon atom and nitrogen atom.

23. The organic EL device according to claim 1, wherein the organic thin-film layer comprises an electron injecting/transporting layer provided between the cathode and the fluorescent-emitting layer, and the electron injecting/transporting layer comprises a nitrogen-containing heterocyclic derivative.

* * * * *